US012807865B2

(12) United States Patent
Tasaki et al.

(10) Patent No.: US 12,807,865 B2
(45) Date of Patent: Nov. 24, 2026

(54) ORGANIC ELECTROLUMINESCENT ELEMENT, ORGANIC ELECTROLUMINESCENT LIGHT EMITTING APPARATUS, AND ELECTRONIC DEVICE

(71) Applicant: IDEMITSU KOSAN CO., LTD., Tokyo (JP)

(72) Inventors: Satomi Tasaki, Tokyo (JP); Emiko Kambe, Tokyo (JP); Tetsuya Masuda, Tokyo (JP); Kazuki Nishimura, Tokyo (JP)

(73) Assignee: Idemitsu Kosan Co., Ltd., Tokyo (JP)

(*) Notice: Subject to any disclaimer, the term of this patent is extended or adjusted under 35 U.S.C. 154(b) by 861 days.

(21) Appl. No.: 18/037,432

(22) PCT Filed: Nov. 26, 2021

(86) PCT No.: PCT/JP2021/043499
§ 371 (c)(1),
(2) Date: May 17, 2023

(87) PCT Pub. No.: WO2022/114156
PCT Pub. Date: Jun. 2, 2022

(65) Prior Publication Data

US 2024/0023426 A1 Jan. 18, 2024

(30) Foreign Application Priority Data

Nov. 26, 2020 (JP) ................................ 2020-196398
Nov. 26, 2020 (JP) ................................ 2020-196415

(51) Int. Cl.

| | |
|---|---|
| ***H10K 50/11*** | (2023.01) |
| ***C09K 11/02*** | (2006.01) |
| ***H10K 85/60*** | (2023.01) |
| *H10K 101/00* | (2023.01) |
| *H10K 101/40* | (2023.01) |

(52) U.S. Cl.
CPC ............ *C09K 11/02* (2013.01); *H10K 85/615* (2023.02); *H10K 85/622* (2023.02); *H10K 85/623* (2023.02); *H10K 85/626* (2023.02); *H10K 85/636* (2023.02); *H10K 85/6574* (2023.02); *H10K 50/11* (2023.02); *H10K 85/6572* (2023.02); *H10K 85/658* (2023.02); *H10K 2101/00* (2023.02); *H10K 2101/40* (2023.02); *H10K 2101/90* (2023.02)

(58) Field of Classification Search
None
See application file for complete search history.

(56) References Cited

U.S. PATENT DOCUMENTS 10,418,580 B2 * 9/2019 Heo .................... H10K 50/131
2010/0295444 A1 11/2010 Kuma et al.
2010/0301318 A1 12/2010 Kuma et al.
2013/0092913 A1 4/2013 Nishimura et al.
2013/0256637 A1 10/2013 Seo et al.
2013/0270539 A1 10/2013 Kuma et al.
2015/0188074 A1 7/2015 Heo et al.
2015/0285969 A1 * 10/2015 Kim ...................... G02B 5/201 359/891
2017/0194388 A1 7/2017 Kim
2019/0280209 A1 9/2019 Fujita
2020/0152902 A1 5/2020 Lim et al.
2021/0083193 A1 * 3/2021 Tasaki .................... C09K 11/06
2022/0059786 A1 * 2/2022 Seo ...................... H10K 85/342

FOREIGN PATENT DOCUMENTS

JP 2007096023 A 4/2007
JP 2013157552 A 8/2013
JP 2013200939 A 10/2013
JP 2013229322 A 11/2013
JP 2015128065 A 7/2015
JP 2019161218 A 9/2019
(Continued)

OTHER PUBLICATIONS

Kumar, Manish, and Luiz Pereira. "Effect of the host on deep-blue organic light-emitting diodes based on a TADF emitter for roll-off suppressing." Nanomaterials 9.9 (2019): 1307. (Year: 2019).*
Lee, Bo Mi, et al. "Highly efficient blue organic light-emitting diodes using dual emissive layers with host-dopant system." Journal of Photonics for Energy 3.1 (2013): 033598-033598. (Year: 2013).*
International Search Report issued Jan. 25, 2022 in PCT/JP2021/043499 (with English translation), 7 pages.
English translation of the International Preliminary Report on Patentability and Written Opinion issued May 30, 2023 in PCT/JP2021/043499, 4 pages.

*Primary Examiner* — Robert S Loewe
(74) *Attorney, Agent, or Firm* — Element IP, PLC

(57) ABSTRACT

An organic EL device includes an anode, an emitting layer of first and second emitting layers, and a cathode. The first emitting layer contains a first host material and a first emitting material. The second emitting layer contains a second host material and a second emitting material. The first and second emitting materials emit light having a maximum peak wavelength of 500 nm or less. The triplet energy of the first host material $T_1(H1)$ and the triplet energy of the second host material $T_1(H2)$ satisfy $T_1(H1)>T_1(H2)$. The maximum peak wavelength λ1 and FWHM1 of a first film provided by adding the first emitting material to the first host material, and the maximum peak wavelength λ2 and FWHM2 of a second film provided by adding the second emitting material to the second host material satisfy $|\lambda1-\lambda2|\leq3$ nm and $|FWHM1-FWHM2|\leq2$ nm.

31 Claims, 6 Drawing Sheets

(56) References Cited

FOREIGN PATENT DOCUMENTS

Figure 1:
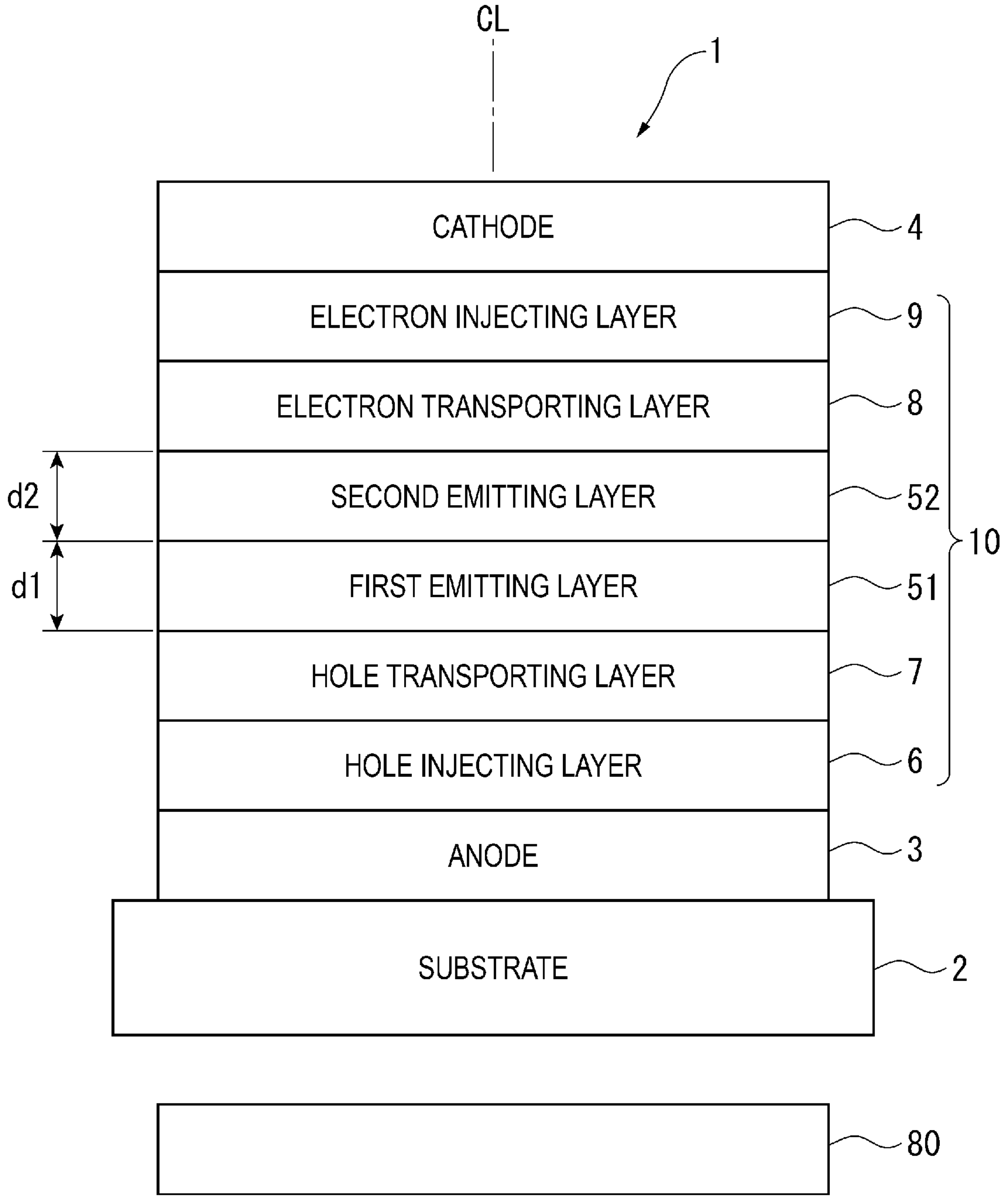

| | | | |
|---|---|---|---|
| JP | 2020077628 | A | 5/2020 |
| WO | WO-2010134350 | A1 | 11/2010 |

* cited by examiner

ORGANIC ELECTROLUMINESCENT ELEMENT, ORGANIC ELECTROLUMINESCENT LIGHT EMITTING APPARATUS, AND ELECTRONIC DEVICE

TECHNICAL FIELD

The present invention relates to an organic electroluminescence device, an organic electroluminescence apparatus, and an electronic device.

BACKGROUND ART

An organic electroluminescence device (hereinafter, occasionally referred to as "organic EL device") has found its application in a full-color display for mobile phones, televisions and the like. When voltage is applied to an organic EL device, holes are injected from an anode and electrons are injected from a cathode into an emitting layer. The injected holes and electrons are recombined in the emitting layer to form excitons. Specifically, according to the electron spin statistics theory, singlet excitons and triplet excitons are generated at a ratio of 25%:75%.

In order to enhance performance of an organic EL device, for instance, Patent Literature 1 describes an organic electroluminescent device in which an emitting layer contains an anthracene compound and a pyrene compound and further contains a dopant material.

In order to enhance performance of an organic EL device, Patent Literature 2 describes a phenomenon in which a singlet exciton is generated by collision and fusion of two triplet excitons (hereinafter, occasionally referred to as a Triplet-Triplet Fusion (TTF) phenomenon).

The performance of the organic EL device is evaluable in terms of, for instance, luminance, emission wavelength, chromaticity, luminous efficiency, drive voltage, and lifetime.

CITATION LIST

Patent Literature(s)

Patent Literature 1: JP 2019-161218 A
Patent Literature 2: International Publication WO 2010/134350

SUMMARY OF THE INVENTION

Problems to be Solved by the Invention

An object of the invention is to provide an organic electroluminescence device excellent in performance. Another aspect of the invention is to provide an organic electroluminescence device excellent in luminous efficiency, provide an organic electroluminescence apparatus including the organic electroluminescence device, and provide an electronic device including the organic electroluminescence device.

Means for Solving the Problem(s)

According to an aspect of the invention, there is provided an organic electroluminescence device, including:

an anode; an emitting layer; and a cathode, in which the emitting layer includes a first emitting layer and a second emitting layer, the first emitting layer contains a first host material and a first emitting material that emits light having a maximum peak wavelength of 500 nm or less, the second emitting layer contains a second host material and a second emitting material that emits light having a maximum peak wavelength of 500 nm or less, the first host material and the second host material are mutually different, the first emitting material and the second emitting material are mutually the same or different, a triplet energy of the first host material $T_1(H1)$ and a triplet energy of the second host material $T_1$ (H2) satisfy a relationship of a numerical formula (Numerical Formula 1) below, and a maximum peak wavelength λ1 and a full width at half maximum FWHM1 of a photoluminescence spectrum of a first film provided by adding the first emitting material to the first host material, and a maximum peak wavelength λ2 and a full width at half maximum FWHM2 of a photoluminescence spectrum of a second film provided by adding the second emitting material to the second host material satisfy numerical formulae (Numerical Formula 20 and Numerical Formula 30) below.

$$T_1(H1)>T_1(H2) \quad \text{(Numerical Formula 1)}$$

$$|\lambda1-\lambda2|\leq 3\ \text{nm} \quad \text{(Numerical Formula 20)}$$

$$|\text{FWHM1}-\text{FWHM2}|\leq 2\ \text{nm} \quad \text{(Numerical Formula 30)}$$

According to another aspect of the invention, there is provided an organic electroluminescence device, including:

an anode; an emitting layer; and a cathode, in which the emitting layer includes a first emitting layer and a second emitting layer, the first emitting layer contains a first host material and a first emitting material that emits light having a maximum peak wavelength of 500 nm or less, the second emitting layer contains a second host material and a second emitting material that emits light having a maximum peak wavelength of 500 nm or less, the first host material and the second host material are mutually different, the first emitting material and the second emitting material are mutually the same or different, a triplet energy of the first host material $T_1(H1)$ and a triplet energy of the second host material $T_1$ (H2) satisfy a relationship of a numerical formula (Numerical Formula 1) below, and for a photoluminescence spectrum in a range from 400 nm to 600 nm of a first film provided by adding the first emitting material to the first host material and a photoluminescence spectrum in a range from 400 nm to 600 nm of a second film provided by adding the second emitting material to the second host material, an overlap integral of normalized photoluminescence spectra obtained by normalizing the photoluminescence spectrum of the first film and the photoluminescence spectrum of the second film is 99.0% or more.

$$T_1(H1)>T_1(H2) \quad \text{(Numerical Formula 1)}$$

According to still another aspect of the invention, there is provided an organic electroluminescence device, including a first electrode, a hole transporting zone, an emitting layer, an electron transporting zone, and a second electrode that is semi-transmissive in this order, in which the emitting layer includes a first emitting layer and a second emitting layer, the first emitting layer contains a first host material and a first emitting material that emits light having a maximum peak wavelength of 500 nm or less, the second emitting layer contains a second host material and a second emitting material that emits light having a maximum peak wavelength of 500 nm or less, the first host material and the second host material are mutually different, the first emitting material and the second emitting material are mutually the same or different, a triplet energy of the first host material $T_1(H1)$ and a triplet energy of the second host material $T_1$ (H2) satisfy a relationship of a numerical formula (Numerical Formula 1) below, and a maximum peak wavelength λ1 and a full width at half maximum FWHM1 of a photoluminescence spectrum of a first film provided by adding the first emitting material to the first host material, and a maximum peak wavelength λ2 and a full width at half maximum FWHM2 of a photoluminescence spectrum of a second film provided by adding the second emitting material to the second host material satisfy numerical formulae (Numerical Formula 20 and Numerical Formula 30) below.

$$T_1(H1)>T_1(H2) \quad \text{(Numerical Formula 1)}$$

$$|\lambda1-\lambda2|\leq 3 \text{ nm} \quad \text{(Numerical Formula 20)}$$

$$|FWHM1-FWHM2|\leq 2 \text{ nm} \quad \text{(Numerical Formula 30)}$$

According to a further aspect of the invention, there is provided an organic electroluminescence device, including a first electrode, a hole transporting zone, an emitting layer, an electron transporting zone, and a second electrode that is semi-transmissive in this order, in which the emitting layer includes a first emitting layer and a second emitting layer, the first emitting layer contains a first host material and a first emitting material that emits light having a maximum peak wavelength of 500 nm or less, the second emitting layer contains a second host material and a second emitting material that emits light having a maximum peak wavelength of 500 nm or less, the first host material and the second host material are mutually different, the first emitting material and the second emitting material are mutually the same or different, a triplet energy of the first host material $T_1(H1)$ and a triplet energy of the second host material $T_1$ (H2) satisfy a relationship of a numerical formula (Numerical Formula 1) below, and for a photoluminescence spectrum in a range from 400 nm to 600 nm of a first film provided by adding the first emitting material to the first host material and a photoluminescence spectrum in a range from 400 nm to 600 nm of a second film provided by adding the second emitting material to the second host material, an overlap integral of normalized photoluminescence spectra obtained by normalizing the photoluminescence spectrum of the first film and the photoluminescence spectrum of the second film is 99.0% or more.

$$T_1(H1)>T_1(H2) \quad \text{(Numerical Formula 1)}$$

According to a still further aspect of the invention, there is provided an organic electroluminescence apparatus, including: a first device that is the organic electroluminescence device according to the aspect of the invention; and a second device that is an organic electroluminescence device different from the first device.

According to a still further aspect of the invention, there is provided an electronic device including the organic electroluminescence apparatus according to the still further aspect of the invention.

According to a still further aspect of the invention, there is provided an electronic device including the organic electroluminescence device according to the aspect of the invention.

According to the aspect of the invention, an organic electroluminescence device excellent in performance can be provided. According to the aspect of the invention, an organic electroluminescence device excellent in luminous efficiency can be provided. According to the aspect of the invention, an organic electroluminescence apparatus including the organic electroluminescence device can be provided. According to the aspect of the invention, an electronic device including the organic electroluminescence device can be provided.

BRIEF EXPLANATION OF DRAWING(S)

FIG. 1 schematically shows an exemplary arrangement of an organic electroluminescence device according to an exemplary embodiment of the invention.

Figure 2:
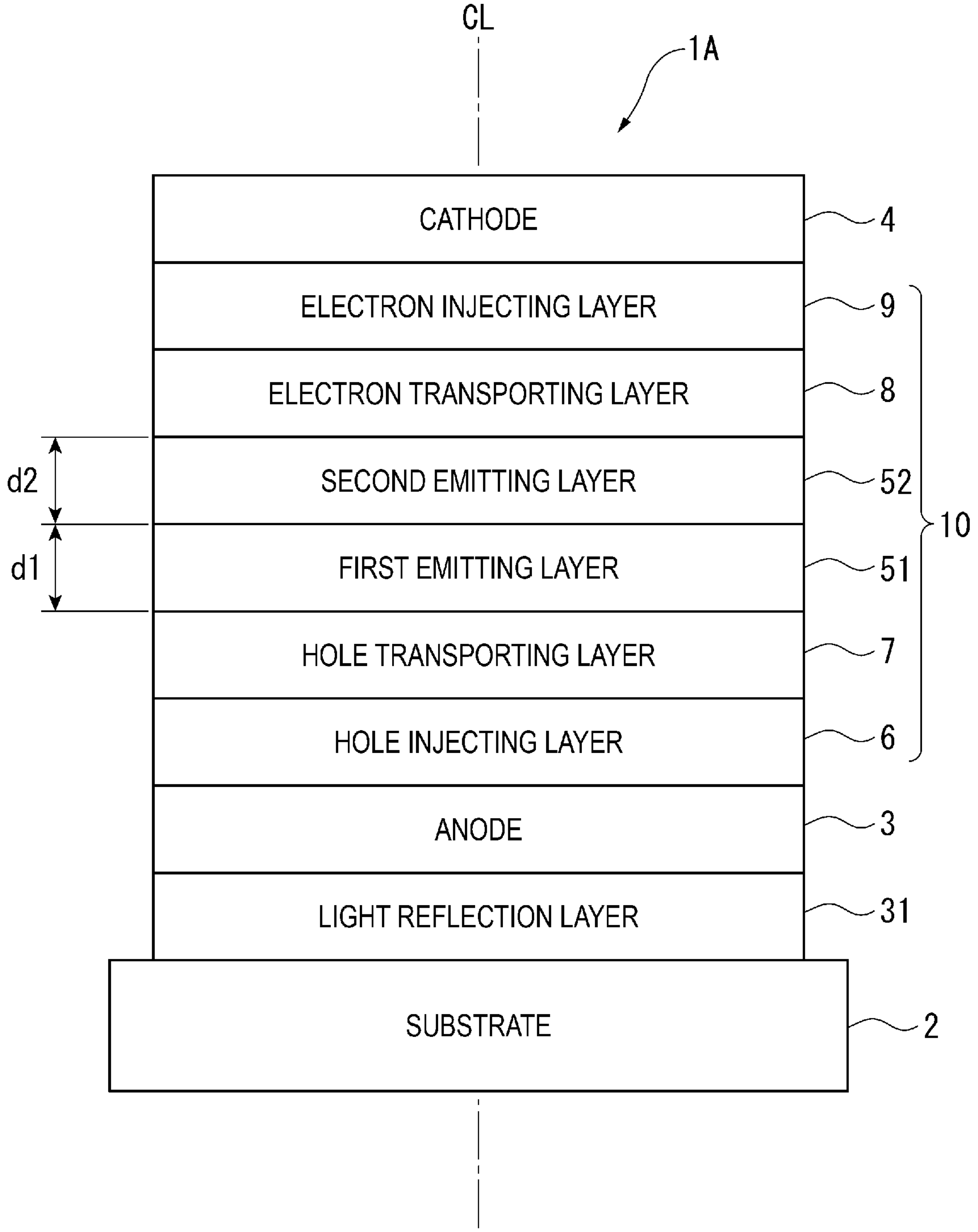

FIG. 2 schematically shows an exemplary arrangement of an organic electroluminescence device according to another exemplary embodiment of the invention.

Figure 3:
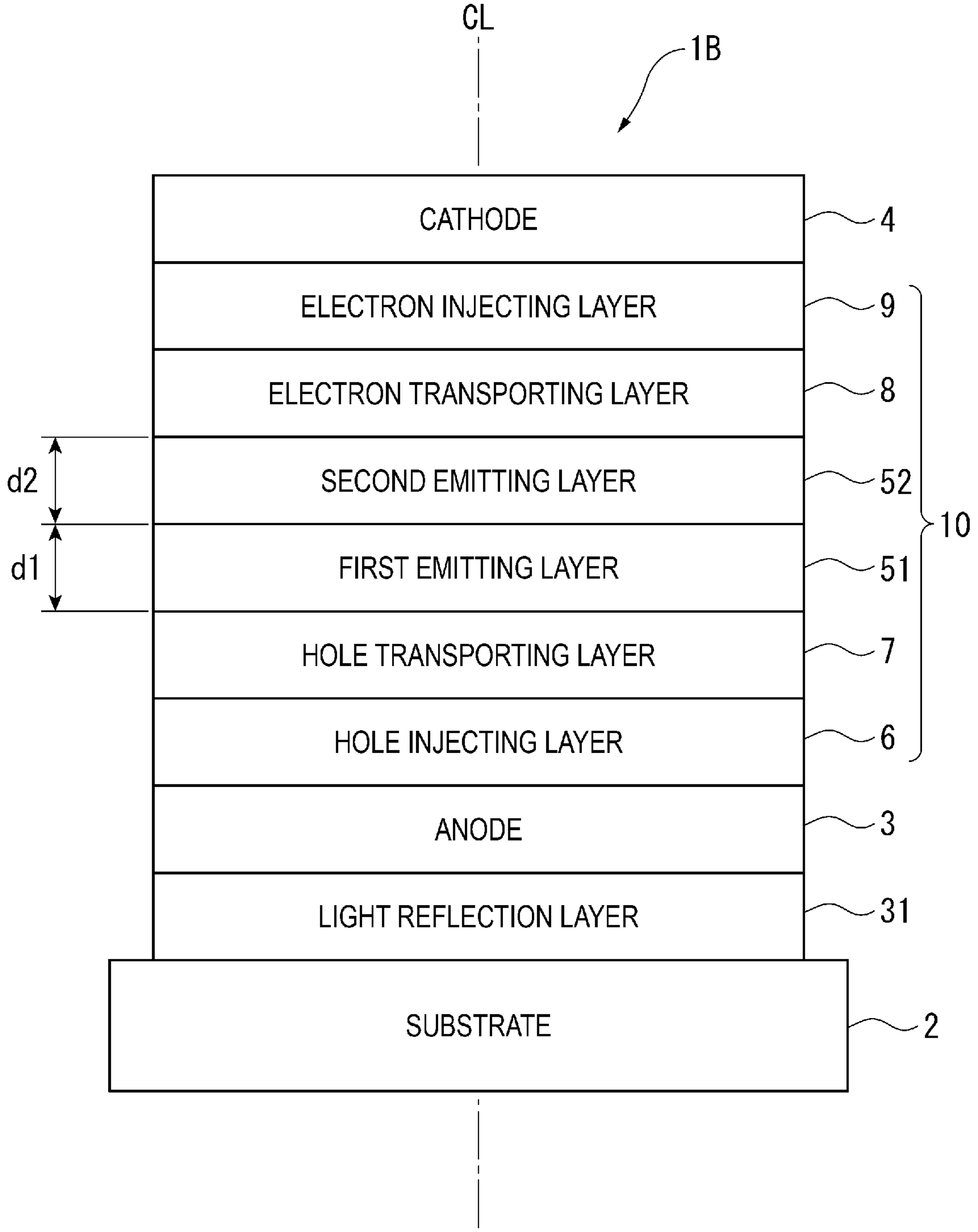

FIG. 3 schematically shows an exemplary arrangement of an organic electroluminescence device according to still another exemplary embodiment of the invention.

Figure 4:
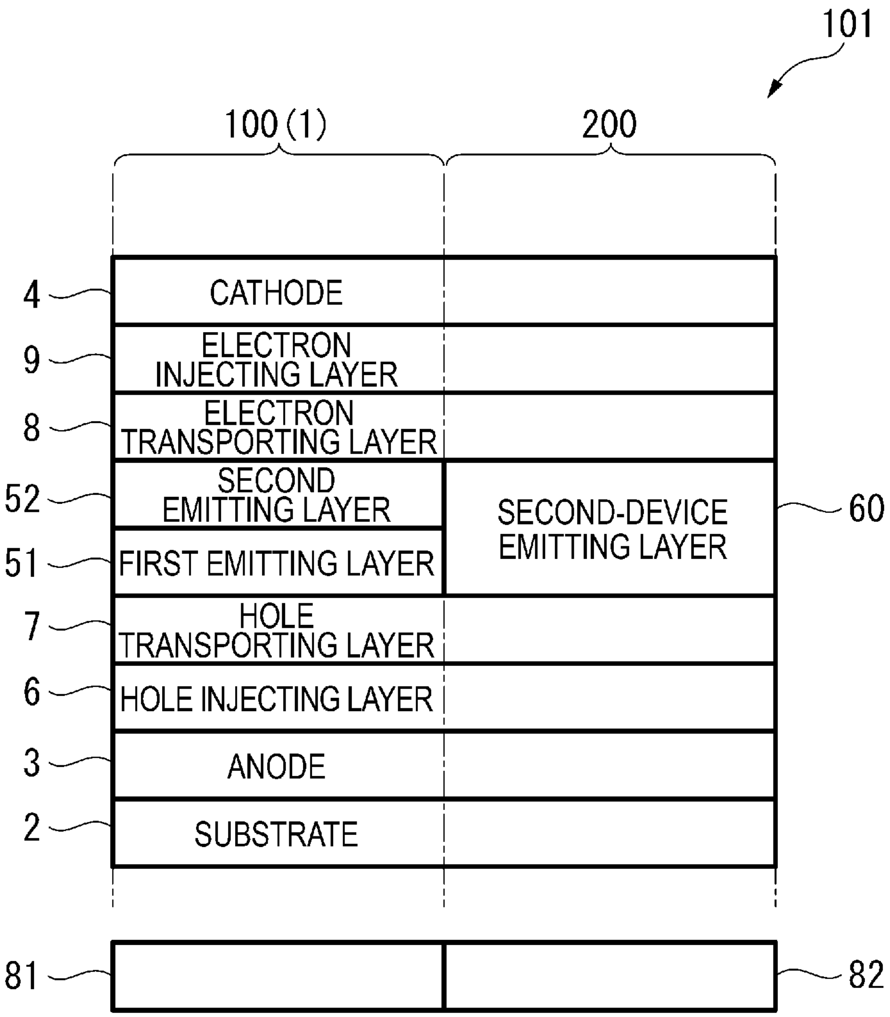

FIG. 4 schematically shows an exemplary arrangement of an organic electroluminescence apparatus according to an exemplary embodiment of the invention.

Figure 5:
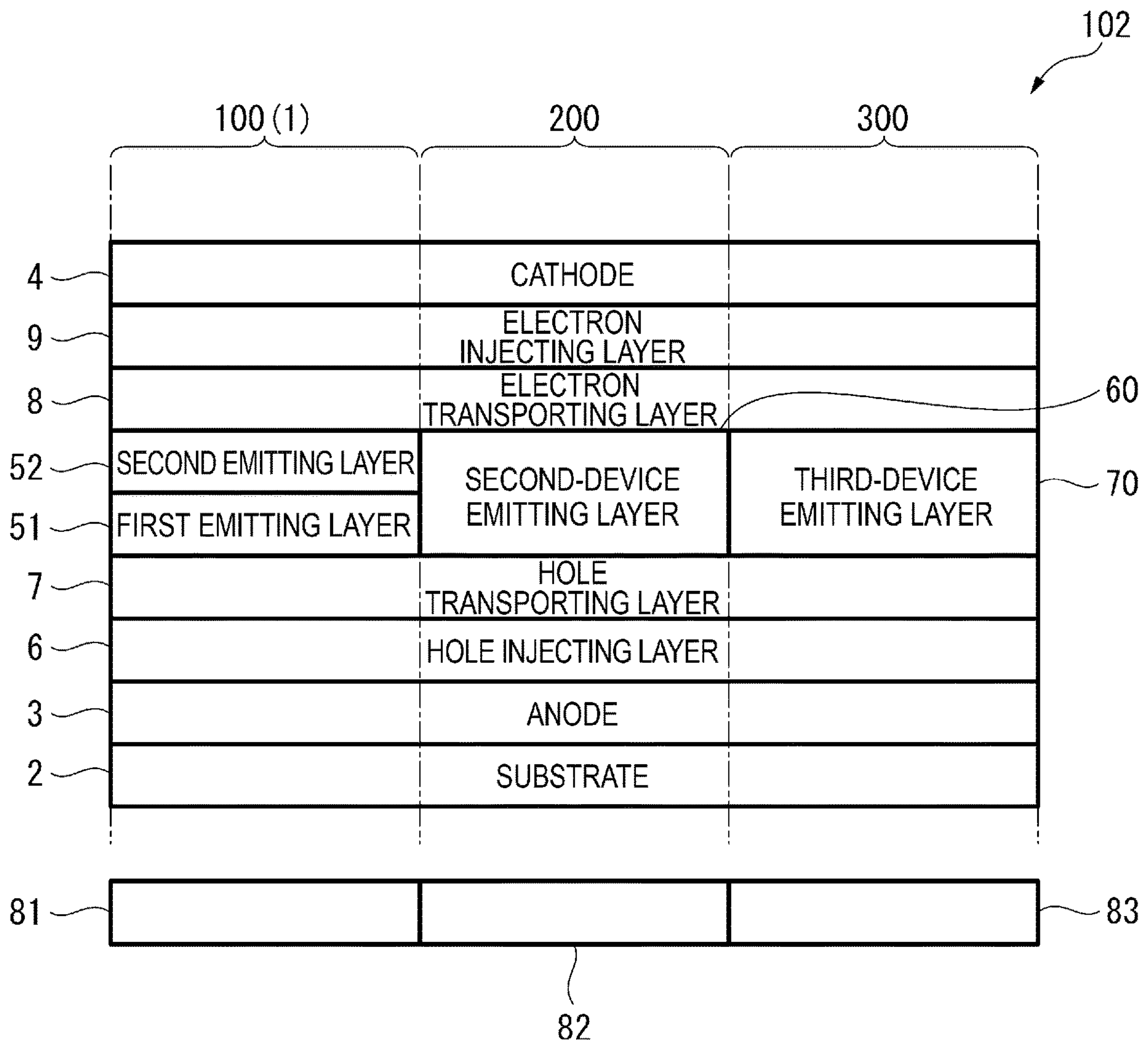

FIG. 5 schematically shows an exemplary arrangement of an organic electroluminescence apparatus according to another exemplary embodiment of the invention.

Figure 6:
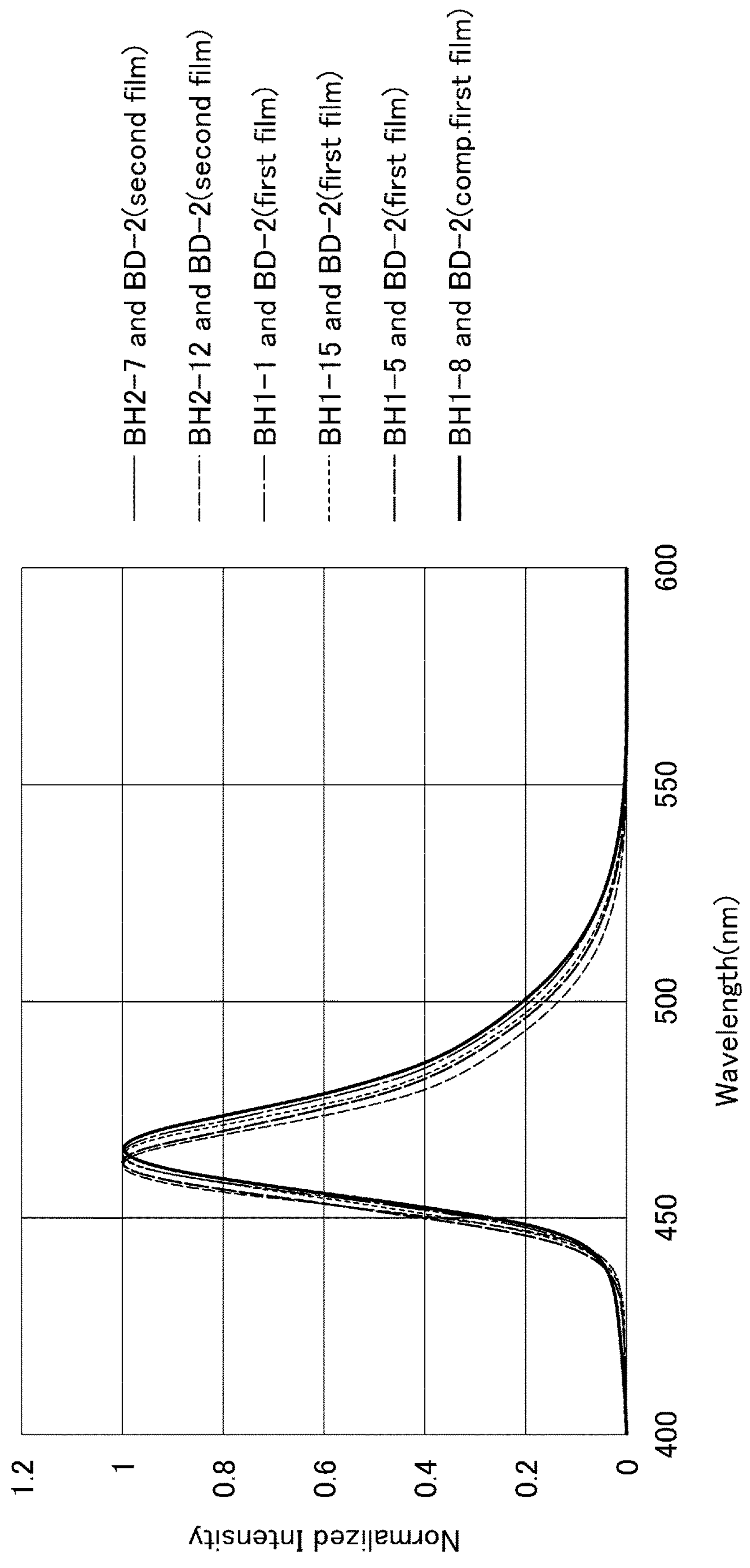

FIG. 6 shows photoluminescence spectra of a first film and a second film each having the same arrangement as that of an emitting layer used in Example or the like.

DESCRIPTION OF EMBODIMENT(S)

Definitions

Herein, a hydrogen atom includes isotope having different numbers of neutrons, specifically, protium, deuterium and tritium.

In chemical formulae herein, it is assumed that a hydrogen atom (i.e. protium, deuterium or tritium) is bonded to each of bondable positions that are not annexed with signs "R" or the like or "D" representing a deuterium.

Herein, the ring carbon atoms refer to the number of carbon atoms among atoms forming a ring of a compound (e.g., a monocyclic compound, fused-ring compound, cross-linking compound, carbon ring compound, and heterocyclic compound) in which the atoms are bonded to each other to form the ring. When the ring is substituted by a substituent(s), carbon atom(s) contained in the substituent(s) is not counted in the ring carbon atoms. Unless otherwise specified, the same applies to the "ring carbon atoms" described later. For instance, a benzene ring has 6 ring carbon atoms, a naphthalene ring has 10 ring carbon atoms, a pyridine ring has 5 ring carbon atoms, and a furan ring has 4 ring carbon atoms. Further, for instance, 9,9-diphenylfluorenyl group has 13 ring carbon atoms and 9,9'-spirobifluorenyl group has 25 ring carbon atoms.

When a benzene ring is substituted by a substituent in a form of, for instance, an alkyl group, the number of carbon atoms of the alkyl group is not counted in the number of the ring carbon atoms of the benzene ring. Accordingly, the benzene ring substituted by an alkyl group has 6 ring carbon atoms. When a naphthalene ring is substituted by a substituent in a form of, for instance, an alkyl group, the number of carbon atoms of the alkyl group is not counted in the number of the ring carbon atoms of the naphthalene ring. Accordingly, the naphthalene ring substituted by an alkyl group has 10 ring carbon atoms.

Herein, the ring atoms refer to the number of atoms forming a ring of a compound (e.g., a monocyclic compound, fused-ring compound, cross-linking compound, carbon ring compound, and heterocyclic compound) in which the atoms are bonded to each other to form the ring (e.g., monocyclic ring, fused ring, and ring assembly). Atom(s) not forming the ring (e.g., hydrogen atom(s) for saturating the valence of the atom which forms the ring) and atom(s) in a substituent by which the ring is substituted are not counted as the ring atoms. Unless otherwise specified, the same applies to the "ring atoms" described later. For instance, a pyridine ring has 6 ring atoms, a quinazoline ring has 10 ring atoms, and a furan ring has 5 ring atoms. For instance, the number of hydrogen atom(s) bonded to a pyridine ring or the number of atoms forming a substituent are not counted as the pyridine ring atoms. Accordingly, a pyridine ring bonded to a hydrogen atom(s) or a substituent(s) has 6 ring atoms. For instance, the hydrogen atom(s) bonded to carbon atom(s) of a quinazoline ring or the atoms forming a substituent are not counted as the quinazoline ring atoms. Accordingly, a quinazoline ring bonded to hydrogen atom(s) or a substituent(s) has 10 ring atoms.

Herein, "XX to YY carbon atoms" in the description of "substituted or unsubstituted ZZ group having XX to YY carbon atoms" represent carbon atoms of an unsubstituted ZZ group and do not include carbon atoms of a substituent(s) of the substituted ZZ group. Herein, "YY" is larger than "XX," "XX" representing an integer of 1 or more and "YY" representing an integer of 2 or more.

Herein, "XX to YY atoms" in the description of "substituted or unsubstituted ZZ group having XX to YY atoms" represent atoms of an unsubstituted ZZ group and does not include atoms of a substituent(s) of the substituted ZZ group. Herein, "YY" is larger than "XX," "XX" representing an integer of 1 or more and "YY" representing an integer of 2 or more.

Herein, an unsubstituted ZZ group refers to an "unsubstituted ZZ group" in a "substituted or unsubstituted ZZ group," and a substituted ZZ group refers to a "substituted ZZ group" in a "substituted or unsubstituted ZZ group."

Herein, the term "unsubstituted" used in a "substituted or unsubstituted ZZ group" means that a hydrogen atom(s) in the ZZ group is not substituted with a substituent(s). The hydrogen atom(s) in the "unsubstituted ZZ group" is protium, deuterium, or tritium.

Herein, the term "substituted" used in a "substituted or unsubstituted ZZ group" means that at least one hydrogen atom in the ZZ group is substituted with a substituent. Similarly, the term "substituted" used in a "BB group substituted by AA group" means that at least one hydrogen atom in the BB group is substituted with the AA group.

Substituents Mentioned Herein

Substituents mentioned herein will be described below.

An "unsubstituted aryl group" mentioned herein has, unless otherwise specified herein, 6 to 50, preferably 6 to 30, more preferably 6 to 18 ring carbon atoms.

An "unsubstituted heterocyclic group" mentioned herein has, unless otherwise specified herein, 5 to 50, preferably 5 to 30, more preferably 5 to 18 ring atoms.

An "unsubstituted alkyl group" mentioned herein has, unless otherwise specified herein, 1 to 50, preferably 1 to 20, more preferably 1 to 6 carbon atoms.

An "unsubstituted alkenyl group" mentioned herein has, unless otherwise specified herein, 2 to 50, preferably 2 to 20, more preferably 2 to 6 carbon atoms.

An "unsubstituted alkynyl group" mentioned herein has, unless otherwise specified herein, 2 to 50, preferably 2 to 20, more preferably 2 to 6 carbon atoms.

An "unsubstituted cycloalkyl group" mentioned herein has, unless otherwise specified herein, 3 to 50, preferably 3 to 20, more preferably 3 to 6 ring carbon atoms.

An "unsubstituted arylene group" mentioned herein has, unless otherwise specified herein, 6 to 50, preferably 6 to 30, more preferably 6 to 18 ring carbon atoms.

An "unsubstituted divalent heterocyclic group" mentioned herein has, unless otherwise specified herein, 5 to 50, preferably 5 to 30, more preferably 5 to 18 ring atoms.

An "unsubstituted alkylene group" mentioned herein has, unless otherwise specified herein, 1 to 50, preferably 1 to 20, more preferably 1 to 6 carbon atoms.

Substituted or Unsubstituted Aryl Group

Specific examples (specific example group G1) of the "substituted or unsubstituted aryl group" mentioned herein include unsubstituted aryl groups (specific example group G1A) below and substituted aryl groups (specific example group G1B). Herein, an unsubstituted aryl group refers to an "unsubstituted aryl group" in a "substituted or unsubstituted aryl group," and a substituted aryl group refers to a "substituted aryl group" in a "substituted or unsubstituted aryl group." A simply termed "aryl group" herein includes both of an "unsubstituted aryl group" and a "substituted aryl group".

The "substituted aryl group" refers to a group derived by substituting at least one hydrogen atom in an "unsubstituted aryl group" with a substituent. Examples of the "substituted aryl group" include a group derived by substituting at least one hydrogen atom in the "unsubstituted aryl group" in the specific example group G1A below with a substituent, and examples of the substituted aryl group in the specific example group G1B below. It should be noted that the examples of the "unsubstituted aryl group" and the "substituted aryl group" mentioned herein are merely exemplary, and the "substituted aryl group" mentioned herein includes a group derived by further substituting a hydrogen atom bonded to a carbon atom of a skeleton of a "substituted aryl group" in the specific example group G1B below, and a group derived by further substituting a hydrogen atom of a substituent of the "substituted aryl group" in the specific example group G1B below.

Unsubstituted Aryl Group (Specific Example Group G1A):

a phenyl group, p-biphenyl group, m-biphenyl group, o-biphenyl group, p-terphenyl-4-yl group, p-terphenyl-3-yl group, p-terphenyl-2-yl group, m-terphenyl-4-yl group, m-terphenyl-3-yl group, m-terphenyl-2-yl group, o-terphenyl-4-yl group, o-terphenyl-3-yl group, o-terphenyl-2-yl group, 1-naphthyl group, 2-naphthyl group, anthryl group, benzanthryl group, phenanthryl group, benzophenanthryl group, phenalenyl group, pyrenyl group, chrysenyl group, benzochrysenyl group, triphenylenyl group, benzotriphenylenyl group, tetracenyl group, pentacenyl group, fluorenyl group, 9,9'-spirobifluorenyl group, benzofluorenyl group, dibenzofluorenyl group, fluoranthenyl group, benzofluoranthenyl group, perylenyl group, and monovalent aryl group derived by removing one hydrogen atom from cyclic structures represented by formulae (TEMP-1) to (TEMP-15) below.

[Formula 1]

(TEMP-1)

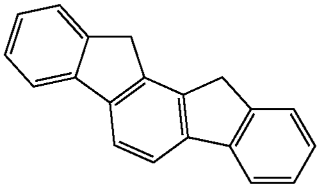

(TEMP-2)

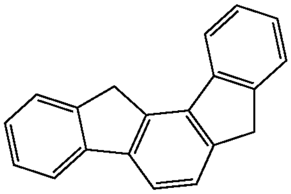

(TEMP-3)

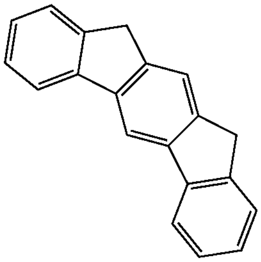

(TEMP-4)

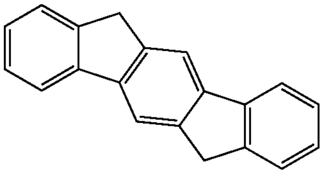

(TEMP-5)

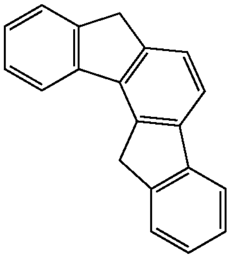

(TEMP-6)

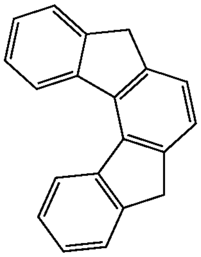

-continued (TEMP-7)

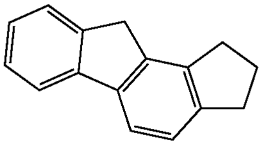

(TEMP-8)

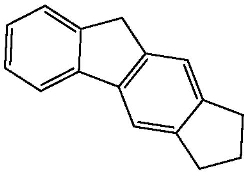

(TEMP-9)

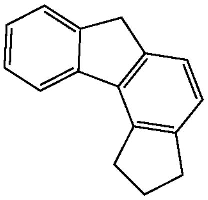

[Formula 2]

(TEMP-10)

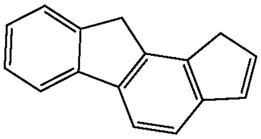

(TEMP-11)

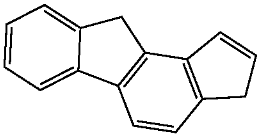

(TEMP-12)

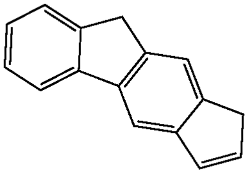

(TEMP-13)

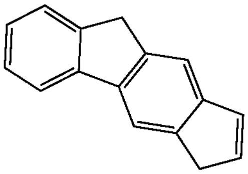

(TEMP-14)

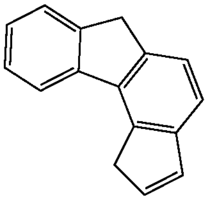

-continued (TEMP-15)

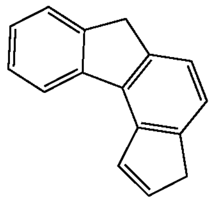

Substituted Aryl Group (Specific Example Group G1B):

an o-tolyl group, m-tolyl group, p-tolyl group, para-xylyl group, meta-xylyl group, ortho-xylyl group, para-isopropylphenyl group, meta-isopropylphenyl group, ortho-isopropylphenyl group, para-t-butylphenyl group, meta-t-butylphenyl group, ortho-t-butylphenyl group, 3,4,5-trimethylphenyl group, 9,9-dimethylfluorenyl group, 9,9-diphenylfluorenyl group, 9,9-bis(4-methylphenyl)fluorenyl group, 9,9-bis(4-isopropylphenyl)fluorenyl group, 9,9-bis(4-t-butylphenyl)fluorenyl group, cyanophenyl group, triphenylsilylphenyl group, trimethylsilylphenyl group, phenylnaphthyl group, naphthylphenyl group, and group derived by substituting at least one hydrogen atom of a monovalent group derived from one of the cyclic structures represented by the formulae (TEMP-1) to (TEMP-15) with a substituent.

Substituted or Unsubstituted Heterocyclic Group

The "heterocyclic group" mentioned herein refers to a cyclic group having at least one hetero atom in the ring atoms. Specific examples of the hetero atom include a nitrogen atom, oxygen atom, sulfur atom, silicon atom, phosphorus atom, and boron atom.

The "heterocyclic group" mentioned herein is a monocyclic group or a fused-ring group.

The "heterocyclic group" mentioned herein is an aromatic heterocyclic group or a non-aromatic heterocyclic group.

Specific examples (specific example group G2) of the "substituted or unsubstituted heterocyclic group" mentioned herein include unsubstituted heterocyclic groups (specific example group G2A) and substituted heterocyclic groups (specific example group G2B). Herein, an unsubstituted heterocyclic group refers to an "unsubstituted heterocyclic group" in a "substituted or unsubstituted heterocyclic group," and a substituted heterocyclic group refers to a "substituted heterocyclic group" in a "substituted or unsubstituted heterocyclic group". A simply termed "heterocyclic group" herein includes both of an "unsubstituted heterocyclic group" and a "substituted heterocyclic group."

The "substituted heterocyclic group" refers to a group derived by substituting at least one hydrogen atom in an "unsubstituted heterocyclic group" with a substituent. Specific examples of the "substituted heterocyclic group" include a group derived by substituting at least one hydrogen atom in the "unsubstituted heterocyclic group" in the specific example group G2A below with a substituent, and examples of the substituted heterocyclic group in the specific example group G2B below. It should be noted that the examples of the "unsubstituted heterocyclic group" and the "substituted heterocyclic group" mentioned herein are merely exemplary, and the "substituted heterocyclic group" mentioned herein includes a group derived by further substituting a hydrogen atom bonded to a ring atom of a skeleton of a "substituted heterocyclic group" in the specific example group G2B below, and a group derived by further substituting a hydrogen atom of a substituent of the "substituted heterocyclic group" in the specific example group G2B below.

The specific example group G2A includes, for instance, unsubstituted heterocyclic groups including a nitrogen atom (specific example group G2A1) below, unsubstituted heterocyclic groups including an oxygen atom (specific example group G2A2) below, unsubstituted heterocyclic groups including a sulfur atom (specific example group G2A3) below, and monovalent heterocyclic groups (specific example group G2A4) derived by removing a hydrogen atom from cyclic structures represented by formulae (TEMP-16) to (TEMP-33) below.

The specific example group G2B includes, for instance, substituted heterocyclic groups including a nitrogen atom (specific example group G2B1) below, substituted heterocyclic groups including an oxygen atom (specific example group G2B2) below, substituted heterocyclic groups including a sulfur atom (specific example group G2B3) below, and groups derived by substituting at least one hydrogen atom of the monovalent heterocyclic groups (specific example group G2B4) derived from the cyclic structures represented by formulae (TEMP-16) to (TEMP-33) below.

Unsubstituted Heterocyclic Groups Including Nitrogen Atom (Specific Example Group G2A1):

a pyrrolyl group, imidazolyl group, pyrazolyl group, triazolyl group, tetrazolyl group, oxazolyl group, isoxazolyl group, oxadiazolyl group, thiazolyl group, isothiazolyl group, thiadiazolyl group, pyridyl group, pyridazynyl group, pyrimidinyl group, pyrazinyl group, triazinyl group, indolyl group, isoindolyl group, indolizinyl group, quinolizinyl group, quinolyl group, isoquinolyl group, cinnolyl group, phthalazinyl group, quinazolinyl group, quinoxalinyl group, benzimidazolyl group, indazolyl group, phenanthrolinyl group, phenanthridinyl group, acridinyl group, phenazinyl group, carbazolyl group, benzocarbazolyl group, morpholino group, phenoxazinyl group, phenothiazinyl group, azacarbazolyl group, and diazacarbazolyl group.

Unsubstituted Heterocyclic Groups Including Oxygen Atom (Specific Example Group G2A2):

a furyl group, oxazolyl group, isoxazolyl group, oxadiazolyl group, xanthenyl group, benzofuranyl group, isobenzofuranyl group, dibenzofuranyl group, naphthobenzofuranyl group, benzoxazolyl group, benzisoxazolyl group, phenoxazinyl group, morpholino group, dinaphthofuranyl group, azadibenzofuranyl group, diazadibenzofuranyl group, azanaphthobenzofuranyl group, and diazanaphthobenzofuranyl group.

Unsubstituted Heterocyclic Groups Including Sulfur Atom (Specific Example Group G2A3):

a thienyl group, thiazolyl group, isothiazolyl group, thiadiazolyl group, benzothiophenyl group (benzothienyl group), isobenzothiophenyl group (isobenzothienyl group), dibenzothiophenyl group (dibenzothienyl group), naphthobenzothiophenyl group (nahthobenzothienyl group), benzothiazolyl group, benzisothiazolyl group, phenothiazinyl group, dinaphthothiophenyl group (dinaphthothienyl group), azadibenzothiophenyl group (azadibenzothienyl group), diazadibenzothiophenyl group (diazadibenzothienyl group), azanaphthobenzothiophenyl group (azanaphthobenzothienyl group), and diazanaphthobenzothiophenyl group (diazanaphthobenzothienyl group).

Monovalent Heterocyclic Groups Derived by Removing One Hydrogen Atom from Cyclic Structures Represented by Formulae (TEMP-16) to (TEMP-33) (Specific Example Group G2A4):
[Formula 3]
(TEMP-16)
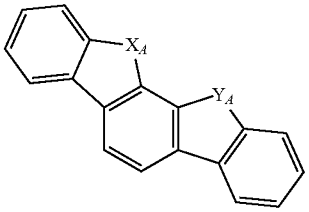
(TEMP-17)
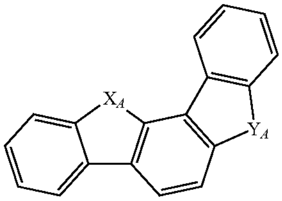
(TEMP-18)
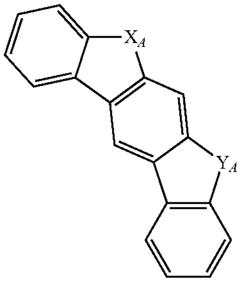
(TEMP-19)
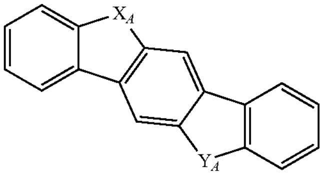
(TEMP-20)
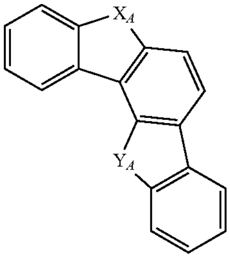
(TEMP-21)
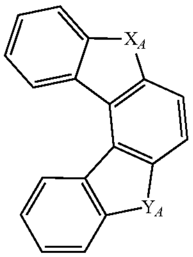
-continued
(TEMP-22)
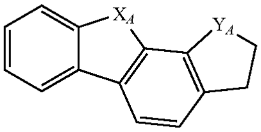
(TEMP-23)
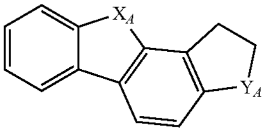
(TEMP-24)
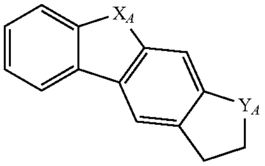
[Formula 4]
(TEMP-25)
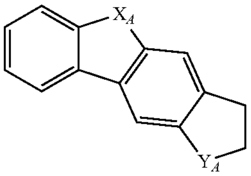
(TEMP-26)
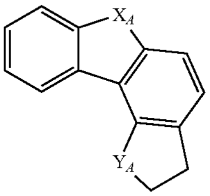
(TEMP-27)
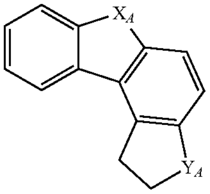
(TEMP-28)
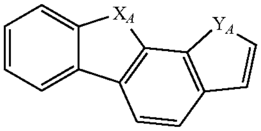
(TEMP-29)
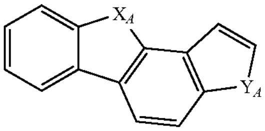
(TEMP-30)
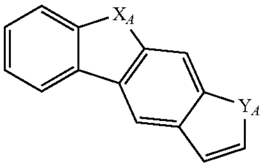

-continued (TEMP-31)

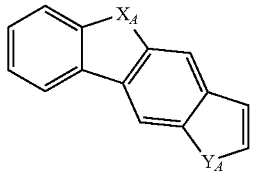

(TEMP-32)

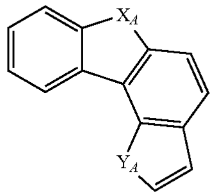

(TEMP-33)

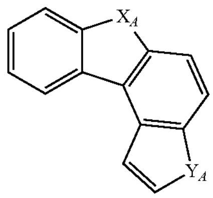

In the formulae (TEMP-16) to (TEMP-33), $X_A$ and $Y_A$ are each independently an oxygen atom, a sulfur atom, NH or $CH_2$, with a proviso that at least one of $X_A$ or $Y_A$ is an oxygen atom, a sulfur atom, or NH.

When at least one of $X_A$ or $Y_A$ in the formulae (TEMP-16) to (TEMP-33) is NH or $CH_2$, the monovalent heterocyclic groups derived from the cyclic structures represented by the formulae (TEMP-16) to (TEMP-33) include a monovalent group derived by removing one hydrogen atom from NH or $CH_2$.

Substituted Heterocyclic Groups Including Nitrogen Atom (Specific Example Group G2B1):

(9-phenyl)carbazolyl group, (9-biphenylyl)carbazolyl group, (9-phenyl)phenylcarbazolyl group, (9-naphthyl) carbazolyl group, diphenylcarbazole-9-yl group, phenylcarbazole-9-yl group, methylbenzimidazolyl group, ethylbenzimidazolyl group, phenyltriazinyl group, biphenylyltriazinyl group, diphenyltriazinyl group, phenylquinazolinyl group, and biphenylquinazolinyl group.

Substituted Heterocyclic Groups Including Oxygen Atom (Specific Example Group G2B2):

a phenyldibenzofuranyl group, methyldibenzofuranyl group, t-butyldibenzofuranyl group, and monovalent residue of spiro[9H-xanthene-9,9'-[9H]fluorene].

Substituted Heterocyclic Groups Including Sulfur Atom (Specific Example Group G2B3):

a phenyldibenzothiophenyl group, methyldibenzothiophenyl group, t-butyldibenzothiophenyl group, and monovalent residue of spiro[9H-thioxanthene-9,9'-[9H]fluorene].

Groups Obtained by Substituting at Least One Hydrogen Atom of Monovalent Heterocyclic Group Derived from Cyclic Structures Represented by Formulae (TEMP-16) to (TEMP-33) with Substituent (Specific Example Group G2B4):

The "at least one hydrogen atom of a monovalent heterocyclic group" means at least one hydrogen atom selected from a hydrogen atom bonded to a ring carbon atom of the monovalent heterocyclic group, a hydrogen atom bonded to a nitrogen atom of at least one of $X_A$ or $Y_A$ in a form of NH, and a hydrogen atom of one of $X_A$ and $Y_A$ in a form of a methylene group ($CH_2$).

Substituted or Unsubstituted Alkyl Group

Specific examples (specific example group G3) of the "substituted or unsubstituted alkyl group" mentioned herein include unsubstituted alkyl groups (specific example group G3A) and substituted alkyl groups (specific example group G3B) below. Herein, an unsubstituted alkyl group refers to an "unsubstituted alkyl group" in a "substituted or unsubstituted alkyl group," and a substituted alkyl group refers to a "substituted alkyl group" in a "substituted or unsubstituted alkyl group." A simply termed "alkyl group" herein includes both of an "unsubstituted alkyl group" and a "substituted alkyl group".

The "substituted alkyl group" refers to a group derived by substituting at least one hydrogen atom in an "unsubstituted alkyl group" with a substituent. Specific examples of the "substituted alkyl group" include a group derived by substituting at least one hydrogen atom of an "unsubstituted alkyl group" (specific example group G3A) below with a substituent, and examples of the substituted alkyl group (specific example group G3B) below. Herein, the alkyl group for the "unsubstituted alkyl group" refers to a chain alkyl group. Accordingly, the "unsubstituted alkyl group" include linear "unsubstituted alkyl group" and branched "unsubstituted alkyl group." It should be noted that the examples of the "unsubstituted alkyl group" and the "substituted alkyl group" mentioned herein are merely exemplary, and the "substituted alkyl group" mentioned herein includes a group derived by further substituting a hydrogen atom of a skeleton of the "substituted alkyl group" in the specific example group G3B, and a group derived by further substituting a hydrogen atom of a substituent of the "substituted alkyl group" in the specific example group G3B.

Unsubstituted Alkyl Group (Specific Example Group G3A):

a methyl group, ethyl group, n-propyl group, isopropyl group, n-butyl group, isobutyl group, s-butyl group, and t-butyl group.

Substituted Alkyl Group (Specific Example Group G3B):

a heptafluoropropyl group (including isomer thereof), pentafluoroethyl group, 2,2,2-trifluoroethyl group, and trifluoromethyl group.

Substituted or Unsubstituted Alkenyl Group

Specific examples (specific example group G4) of the "substituted or unsubstituted alkenyl group" mentioned herein include unsubstituted alkenyl groups (specific example group G4A) and substituted alkenyl groups (specific example group G4B). Herein, an unsubstituted alkenyl group refers to an "unsubstituted alkenyl group" in a "substituted or unsubstituted alkenyl group," and a substituted alkenyl group refers to a "substituted alkenyl group" in a "substituted or unsubstituted alkenyl group". A simply termed "alkenyl group" herein includes both of an "unsubstituted alkenyl group" and a "substituted alkenyl group".

The "substituted alkenyl group" refers to a group derived by substituting at least one hydrogen atom in an "unsubstituted alkenyl group" with a substituent. Specific examples of the "substituted alkenyl group" include an "unsubstituted alkenyl group" (specific example group G4A) substituted by a substituent, and examples of the substituted alkenyl group (specific example group G4B) below. It should be noted that the examples of the "unsubstituted alkenyl group" and the "substituted alkenyl group" mentioned herein are merely exemplary, and the "substituted alkenyl group" mentioned herein includes a group derived by further substituting a hydrogen atom of a skeleton of the "substituted alkenyl group" in the specific example group G4B with a substituent, and a group derived by further substituting a hydrogen atom of a substituent of the "substituted alkenyl group" in the specific example group G4B with a substituent.

Unsubstituted Alkenyl Group (Specific Example Group G4A):

a vinyl group, allyl group, 1-butenyl group, 2-butenyl group, and 3-butenyl group.

Substituted Alkenyl Group (Specific Example Group G4B):

a 1,3-butanedienyl group, 1-methylvinyl group, 1-methylallyl group, 1,1-dimethylallyl group, 2-methylallyl group, and 1,2-dimethylallyl group.

Substituted or Unsubstituted Alkynyl Group

Specific examples (specific example group G5) of the "substituted or unsubstituted alkynyl group" mentioned herein include unsubstituted alkynyl groups (specific example group G5A) below. Herein, an unsubstituted alkynyl group refers to an "unsubstituted alkynyl group" in a "substituted or unsubstituted alkynyl group". A simply termed "alkynyl group" herein includes both of "unsubstituted alkynyl group" and "substituted alkynyl group".

The "substituted alkynyl group" refers to a group derived by substituting at least one hydrogen atom in an "unsubstituted alkynyl group" with a substituent. Specific examples of the "substituted alkynyl group" include a group derived by substituting at least one hydrogen atom of the "unsubstituted alkynyl group" (specific example group G5A) below with a substituent.

Unsubstituted Alkynyl Group (Specific Example Group G5A): an ethynyl group.

Substituted or Unsubstituted Cycloalkyl Group

Specific examples (specific example group G6) of the "substituted or unsubstituted cycloalkyl group" mentioned herein include unsubstituted cycloalkyl groups (specific example group G6A) and substituted cycloalkyl groups (specific example group G6B). Herein, an unsubstituted cycloalkyl group refers to an "unsubstituted cycloalkyl group" in a "substituted or unsubstituted cycloalkyl group," and a substituted cycloalkyl group refers to a "substituted cycloalkyl group" in a "substituted or unsubstituted cycloalkyl group". A simply termed "cycloalkyl group" herein includes both of "unsubstituted cycloalkyl group" and "substituted cycloalkyl group".

The "substituted cycloalkyl group" refers to a group derived by substituting at least one hydrogen atom of an "unsubstituted cycloalkyl group" with a substituent. Specific examples of the "substituted cycloalkyl group" include a group derived by substituting at least one hydrogen atom of the "unsubstituted cycloalkyl group" (specific example group G6A) below with a substituent, and examples of the substituted cycloalkyl group (specific example group G6B) below. It should be noted that the examples of the "unsubstituted cycloalkyl group" and the "substituted cycloalkyl group" mentioned herein are merely exemplary, and the "substituted cycloalkyl group" mentioned herein includes a group derived by substituting at least one hydrogen atom bonded to a carbon atom of a skeleton of the "substituted cycloalkyl group" in the specific example group G6B with a substituent, and a group derived by further substituting a hydrogen atom of a substituent of the "substituted cycloalkyl group" in the specific example group G6B with a substituent.

Unsubstituted Cycloalkyl Group (Specific Example Group G6A):

a cyclopropyl group, cyclobutyl group, cyclopentyl group, cyclohexyl group, 1-adamantyl group, 2-adamantyl group, 1-norbornyl group, and 2-norbornyl group.

Substituted Cycloalkyl Group (Specific Example Group G6B):

a 4-methylcyclohexyl group.

Group Represented by —Si($R_{901}$)($R_{902}$)($R_{903}$)

Specific examples (specific example group G7) of the group represented herein by —Si($R_{901}$)($R_{902}$)($R_{903}$) include: —Si(G1)(G1)(G1); —Si(G1)(G2)(G2); —Si(G1)(G1)(G2); —Si(G2)(G2)(G2); —Si(G3)(G3)(G3); and —Si(G6)(G6)(G6); where:

G1 represents a "substituted or unsubstituted aryl group" in the specific example group G1;

G2 represents a "substituted or unsubstituted heterocyclic group" in the specific example group G2;

G3 represents a "substituted or unsubstituted alkyl group" in the specific example group G3;

G6 represents a "substituted or unsubstituted cycloalkyl group" in the specific example group G6;

a plurality of G1 in —Si(G1)(G1)(G1) are mutually the same or different;

a plurality of G2 in —Si(G1)(G2)(G2) are mutually the same or different;

a plurality of G1 in —Si(G1)(G1)(G2) are mutually the same or different;

a plurality of G2 in —Si(G2)(G2)(G2) are mutually the same or different;

a plurality of G3 in —Si(G3)(G3)(G3) are mutually the same or different; and a plurality of G6 in —Si(G6)(G6)(G6) are mutually the same or different.

Group Represented by —O—($R_{904}$)

Specific examples (specific example group G8) of a group represented by —O—($R_{904}$) herein include: —O(G1); —O(G2); —O(G3); and —O(G6);

where:

G1 represents a "substituted or unsubstituted aryl group" in the specific example group G1;

G2 represents a "substituted or unsubstituted heterocyclic group" in the specific example group G2;

G3 represents a "substituted or unsubstituted alkyl group" in the specific example group G3; and G6 represents a "substituted or unsubstituted cycloalkyl group" in the specific example group G6.

Group Represented by —S—($R_{905}$)

Specific examples (specific example group G9) of a group represented herein by —S—($R_{905}$) include: —S(G1); —S(G2); —S(G3); and —S(G6);

where:

G1 represents a "substituted or unsubstituted aryl group" in the specific example group G1;

G2 represents a "substituted or unsubstituted heterocyclic group" in the specific example group G2;

G3 represents a "substituted or unsubstituted alkyl group" in the specific example group G3; and G6 represents a "substituted or unsubstituted cycloalkyl group" in the specific example group G6.

Group Represented by —N($R_{906}$)($R_{907}$)

Specific examples (specific example group G10) of a group represented herein by —N($R_{906}$)($R_{907}$) include: —N(G1)(G1); —N(G2)(G2); —N(G1)(G2); —N(G3)(G3); and —N(G6)(G6), where:

G1 represents a "substituted or unsubstituted aryl group" in the specific example group G1;

G2 represents a "substituted or unsubstituted heterocyclic group" in the specific example group G2;

G3 represents a "substituted or unsubstituted alkyl group" in the specific example group G3;

G6 represents a "substituted or unsubstituted cycloalkyl group" in the specific example group G6;

a plurality of G1 in —N(G1)(G1) are mutually the same or different;

a plurality of G2 in —N(G2)(G2) are mutually the same or different;

a plurality of G3 in —N(G3)(G3) are mutually the same or different; and a plurality of G6 in —N(G6)(G6) are mutually the same or different.

Halogen Atom

Specific examples (specific example group G11) of "halogen atom" mentioned herein include a fluorine atom, chlorine atom, bromine atom, and iodine atom.

Substituted or Unsubstituted Fluoroalkyl Group

The "substituted or unsubstituted fluoroalkyl group" mentioned herein refers to a group derived by substituting at least one hydrogen atom bonded to at least one of carbon atoms forming an alkyl group in the "substituted or unsubstituted alkyl group" with a fluorine atom, and also includes a group (perfluoro group) derived by substituting all of hydrogen atoms bonded to carbon atoms forming the alkyl group in the "substituted or unsubstituted alkyl group" with fluorine atoms. An "unsubstituted fluoroalkyl group" has, unless otherwise specified herein, 1 to 50, preferably 1 to 30, more preferably 1 to 18 carbon atoms. The "substituted fluoroalkyl group" refers to a group derived by substituting at least one hydrogen atom in a "fluoroalkyl group" with a substituent. It should be noted that the examples of the "substituted fluoroalkyl group" mentioned herein include a group derived by further substituting at least one hydrogen atom bonded to a carbon atom of an alkyl chain of a "substituted fluoroalkyl group" with a substituent, and a group derived by further substituting at least one hydrogen atom of a substituent of the "substituted fluoroalkyl group" with a substituent. Specific examples of the "substituted fluoroalkyl group" include a group derived by substituting at least one hydrogen atom of the "alkyl group" (specific example group G3) with a fluorine atom.

Substituted or Unsubstituted Haloalkyl Group

The "substituted or unsubstituted haloalkyl group" mentioned herein refers to a group derived by substituting at least one hydrogen atom bonded to carbon atoms forming the alkyl group in the "substituted or unsubstituted alkyl group" with a halogen atom, and also includes a group derived by substituting all hydrogen atoms bonded to carbon atoms forming the alkyl group in the "substituted or unsubstituted alkyl group" with halogen atoms. An "unsubstituted haloalkyl group" has, unless otherwise specified herein, 1 to 50, preferably 1 to 30, and more preferably 1 to 18 carbon atoms. The "substituted haloalkyl group" refers to a group derived by substituting at least one hydrogen atom in a "haloalkyl group" with a substituent. It should be noted that the examples of the "substituted haloalkyl group" mentioned herein include a group derived by further substituting at least one hydrogen atom bonded to a carbon atom of an alkyl chain of a "substituted haloalkyl group" with a substituent, and a group derived by further substituting at least one hydrogen atom of a substituent of the "substituted haloalkyl group" with a substituent. Specific examples of the "substituted haloalkyl group" include a group derived by substituting at least one hydrogen atom of the "alkyl group" (specific example group G3) with a halogen atom. The haloalkyl group is sometimes referred to as a halogenated alkyl group.

Substituted or Unsubstituted Alkoxy Group

Specific examples of a "substituted or unsubstituted alkoxy group" mentioned herein include a group represented by —O(G3), G3 being the "substituted or unsubstituted alkyl group" in the specific example group G3. An "unsubstituted alkoxy group" has, unless otherwise specified herein, 1 to 50, preferably 1 to 30, more preferably 1 to 18 carbon atoms.

Substituted or Unsubstituted Alkylthio Group

Specific examples of a "substituted or unsubstituted alkylthio group" mentioned herein include a group represented by —S(G3), G3 being the "substituted or unsubstituted alkyl group" in the specific example group G3. An "unsubstituted alkylthio group" has, unless otherwise specified herein, 1 to 50, preferably 1 to 30, more preferably 1 to 18 carbon atoms.

Substituted or Unsubstituted Aryloxy Group

Specific examples of a "substituted or unsubstituted aryloxy group" mentioned herein include a group represented by —O(G1), G1 being the "substituted or unsubstituted aryl group" in the specific example group G1. An "unsubstituted aryloxy group" has, unless otherwise specified herein, 6 to 50, preferably 6 to 30, more preferably 6 to 18 ring carbon atoms.

Substituted or Unsubstituted Arylthio Group

Specific examples of a "substituted or unsubstituted arylthio group" mentioned herein include a group represented by —S(G1), G1 being the "substituted or unsubstituted aryl group" in the specific example group G1. An "unsubstituted arylthio group" has, unless otherwise specified herein, 6 to 50, preferably 6 to 30, more preferably 6 to 18 ring carbon atoms.

Substituted or Unsubstituted Trialkylsilyl Group

Specific examples of a "trialkylsilyl group" mentioned herein include a group represented by —Si(G3)(G3)(G3), G3 being the "substituted or unsubstituted alkyl group" in the specific example group G3. The plurality of G3 in —Si(G3)(G3)(G3) are mutually the same or different. Each of the alkyl groups in the "trialkylsilyl group" has, unless otherwise specified herein, 1 to 50, preferably 1 to 20, more preferably 1 to 6 carbon atoms.

Substituted or Unsubstituted Aralkyl Group

Specific examples of a "substituted or unsubstituted aralkyl group" mentioned herein include a group represented by (G3)-(G1), G3 being the "substituted or unsubstituted alkyl group" in the specific example group G3, G1 being the "substituted or unsubstituted aryl group" in the specific example group G1. Accordingly, the "aralkyl group" is a group derived by substituting a hydrogen atom of the "alkyl group" with a substituent in a form of the "aryl group," which is an example of the "substituted alkyl group." An "unsubstituted aralkyl group," which is an "unsubstituted alkyl group" substituted by an "unsubstituted aryl group," has, unless otherwise specified herein, 7 to 50 carbon atoms, preferably 7 to 30 carbon atoms, more preferably 7 to 18 carbon atoms.

Specific examples of the "substituted or unsubstituted aralkyl group" include a benzyl group, 1-phenylethyl group, 2-phenylethyl group, 1-phenylisopropyl group, 2-phenylisopropyl group, phenyl-t-butyl group, α-naphthylmethyl group, 1-α-naphthylethyl group, 2-α-naphthylethyl group, 1-α-naphthylisopropyl group, 2-α-naphthylisopropyl group, 8-naphthylmethyl group, 1-β-naphthylethyl group, 2-β-naphthylethyl group, 1-β-naphthylisopropyl group, and 2-β-naphthylisopropyl group.

Preferable examples of the substituted or unsubstituted aryl group mentioned herein include, unless otherwise specified herein, a phenyl group, p-biphenyl group, m-biphenyl group, o-biphenyl group, p-terphenyl-4-yl group, p-terphenyl-3-yl group, p-terphenyl-2-yl group, m-terphenyl-4-yl group, m-terphenyl-3-yl group, m-terphenyl-2-yl group, o-terphenyl-4-yl group, o-terphenyl-3-yl group, o-terphenyl-2-yl group, 1-naphthyl group, 2-naphthyl group, anthryl group, phenanthryl group, pyrenyl group, chrysenyl group, triphenylenyl group, fluorenyl group, 9,9'-spirobifluorenyl group, 9,9-dimethylfluorenyl group, and 9,9-diphenylfluorenyl group.

Preferable examples of the substituted or unsubstituted heterocyclic group mentioned herein include, unless otherwise specified herein, a pyridyl group, pyrimidinyl group, triazinyl group, quinolyl group, isoquinolyl group, quinazolinyl group, benzimidazolyl group, phenanthrolinyl group, carbazolyl group (1-carbazolyl group, 2-carbazolyl group, 3-carbazolyl group, 4-carbazolyl group, or 9-carbazolyl group), benzocarbazolyl group, azacarbazolyl group, diazacarbazolyl group, dibenzofuranyl group, naphthobenzofuranyl group, azadibenzofuranyl group, diazadibenzofuranyl group, dibenzothiophenyl group, naphthobenzothiophenyl group, azadibenzothiophenyl group, diazadibenzothiophenyl group, (9-phenyl)carbazolyl group ((9-phenyl)carbazole-1-yl group, (9-phenyl)carbazole-2-yl group, (9-phenyl)carbazole-3-yl group, or (9-phenyl)carbazole-4-yl group), (9-biphenylyl)carbazolyl group, (9-phenyl)phenylcarbazolyl group, diphenylcarbazole-9-yl group, phenylcarbazole-9-yl group, phenyltriazinyl group, biphenylyltriazinyl group, diphenyltriazinyl group, phenyldibenzofuranyl group, and phenyldibenzothiophenyl group.

The carbazolyl group mentioned herein is, unless otherwise specified herein, specifically a group represented by one of formulae below.

[Formula 5]

(TEMP-Cz1)

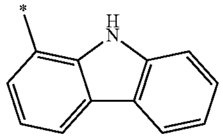

(TEMP-Cz2)

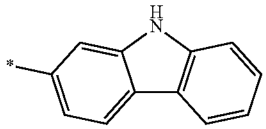

(TEMP-Cz3)

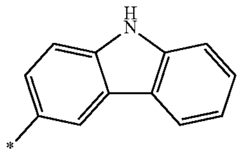

(TEMP-Cz4)

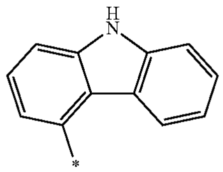

-continued (TEMP-Cz5)

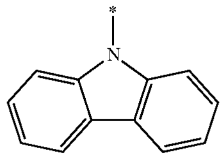

The (9-phenyl)carbazolyl group mentioned herein is, unless otherwise specified herein, specifically a group represented by one of formulae below.

[Formula 6]

(TEMP-Cz6)

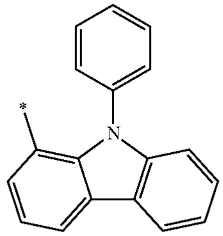

(TEMP-Cz7)

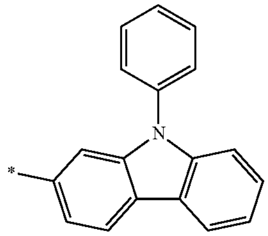

(TEMP-Cz8)

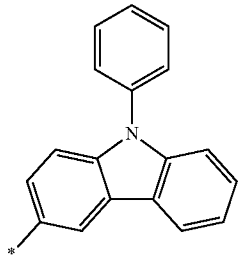

(TEMP-Cz9)

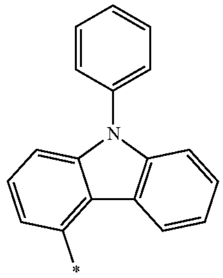

In the formulae (TEMP-Cz1) to (TEMP-Cz9), * represents a bonding position.

The dibenzofuranyl group and dibenzothiophenyl group mentioned herein are, unless otherwise specified herein, each specifically represented by one of formulae below.

[Formula 7]

(TEMP-34)

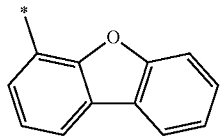

(TEMP-35)

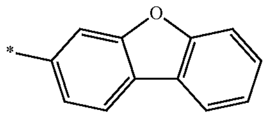

(TEMP-36)

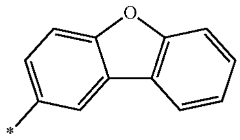

(TEMP-37)

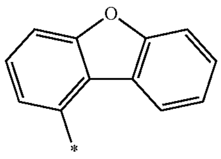

(TEMP-38)

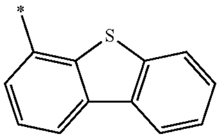

(TEMP-39)

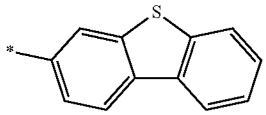

(TEMP-40)

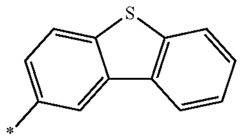

(TEMP-41)

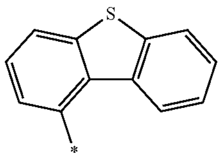

In the formulae (TEMP-34) to (TEMP-41), * represents a bonding position. Preferable examples of the substituted or unsubstituted alkyl group mentioned herein include, unless otherwise specified herein, a methyl group, ethyl group, propyl group, isopropyl group, n-butyl group, isobutyl group, and t-butyl group.

Substituted or Unsubstituted Arylene Group

The "substituted or unsubstituted arylene group" mentioned herein is, unless otherwise specified herein, a divalent group derived by removing one hydrogen atom on an aryl ring of the "substituted or unsubstituted aryl group." Specific examples of the "substituted or unsubstituted arylene group" (specific example group G12) include a divalent group derived by removing one hydrogen atom on an aryl ring of the "substituted or unsubstituted aryl group" in the specific example group G1.

Substituted or Unsubstituted Divalent Heterocyclic Group

The "substituted or unsubstituted divalent heterocyclic group" mentioned herein is, unless otherwise specified herein, a divalent group derived by removing one hydrogen atom on a heterocycle of the "substituted or unsubstituted heterocyclic group." Specific examples of the "substituted or unsubstituted divalent heterocyclic group" (specific example group G13) include a divalent group derived by removing one hydrogen atom on a heterocyclic ring of the "substituted or unsubstituted heterocyclic group" in the specific example group G2.

Substituted or Unsubstituted Alkylene Group

The "substituted or unsubstituted alkylene group" mentioned herein is, unless otherwise specified herein, a divalent group derived by removing one hydrogen atom on an alkyl chain of the "substituted or unsubstituted alkyl group." Specific examples of the "substituted or unsubstituted alkylene group" (specific example group G14) include a divalent group derived by removing one hydrogen atom on an alkyl chain of the "substituted or unsubstituted alkyl group" in the specific example group G3.

The substituted or unsubstituted arylene group mentioned herein is, unless otherwise specified herein, preferably any one of groups represented by formulae (TEMP-42) to (TEMP-68) below.

[Formula 8]

(TEMP-42)

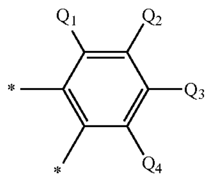

(TEMP-43)

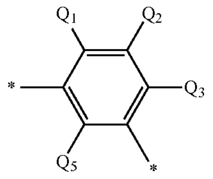

(TEMP-44)

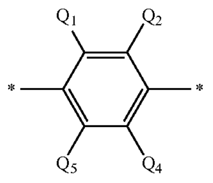

(TEMP-45)

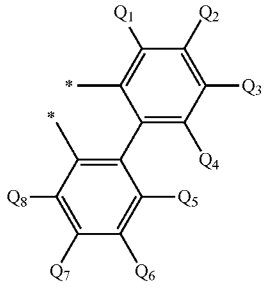

-continued
(TEMP-46)
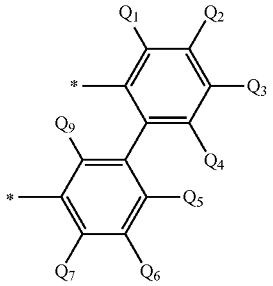
(TEMP-47)
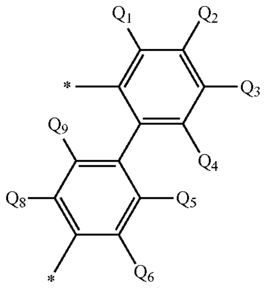
[Formula 9]
(TEMP-48)
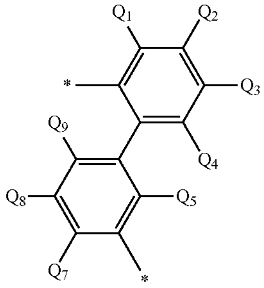
(TEMP-49)
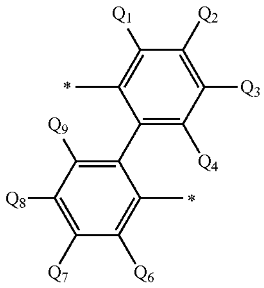
(TEMP-50)
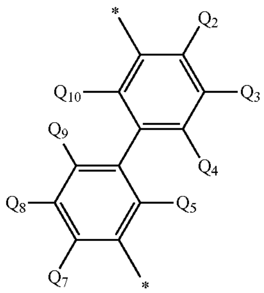
-continued
(TEMP-51)
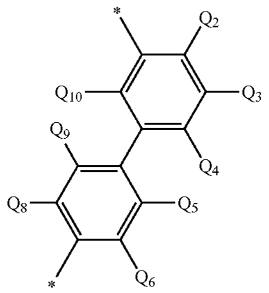
(TEMP-52)
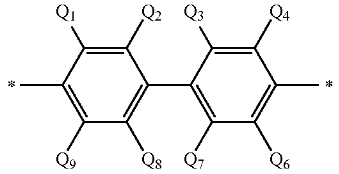
In the formulae (TEMP-42) to (TEMP-52), $Q_1$ to $Q_{10}$ are each independently a hydrogen atom or a substituent.
In the formulae (TEMP-42) to (TEMP-52), * represents a bonding position.
[Formula 10]
(TEMP-53)
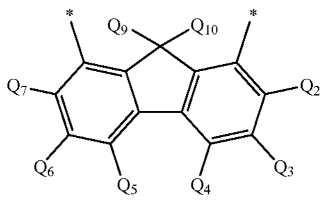
(TEMP-54)
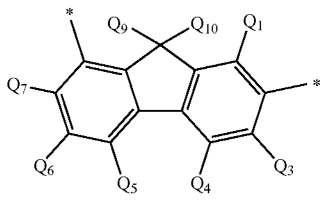
(TEMP-55)
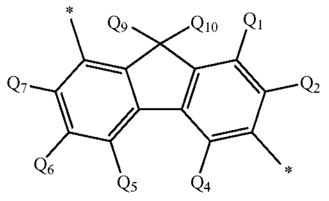
(TEMP-56)
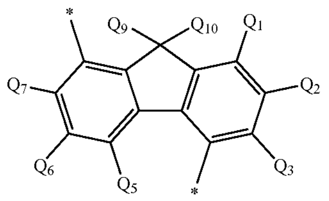

-continued (TEMP-57)

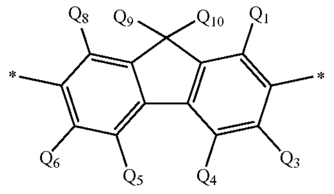

(TEMP-58)

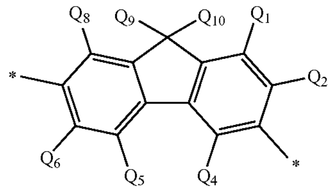

(TEMP-59)

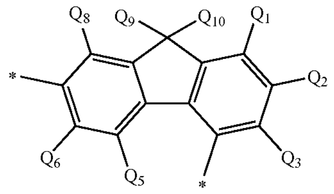

(TEMP-60)

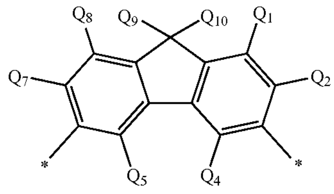

(TEMP-61)

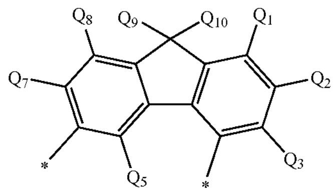

(TEMP-62)

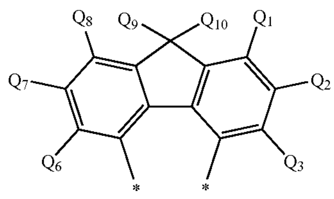

In the formulae (TEMP-53) to (TEMP-62), $Q_1$ to $Q_{10}$ are each independently a hydrogen atom or a substituent.

In the formulae, $Q_9$ and $Q_{10}$ may be mutually bonded through a single bond to forma ring.

In the formulae (TEMP-53) to (TEMP-62), * represents a bonding position.

[Formula 11]

(TEMP-63)

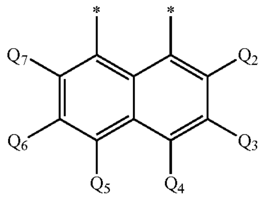

(TEMP-64)

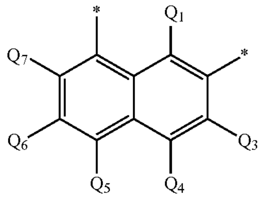

(TEMP-65)

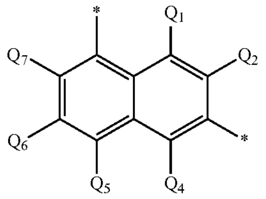

(TEMP-66)

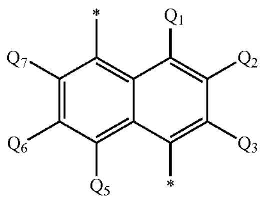

(TEMP-67)

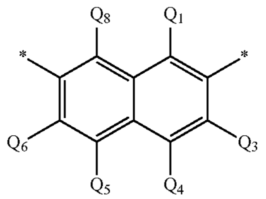

(TEMP-68)

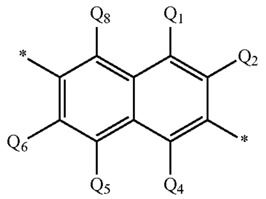

In the formulae (TEMP-63) to (TEMP-68), $Q_1$ to $Q_8$ are each independently a hydrogen atom or a substituent.

In the formulae (TEMP-63) to (TEMP-68), * represents a bonding position.

The substituted or unsubstituted divalent heterocyclic group mentioned herein is, unless otherwise specified herein, preferably a group represented by any one of formulae (TEMP-69) to (TEMP-102) below.

[Formula 12]
(TEMP-69)
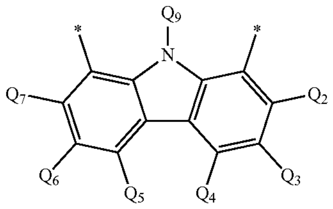
(TEMP-70)
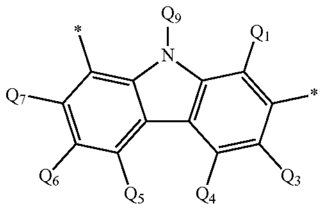
(TEMP-71)
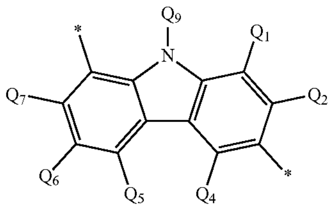
(TEMP-72)
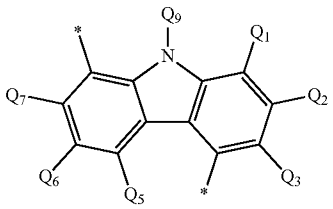
(TEMP-73)
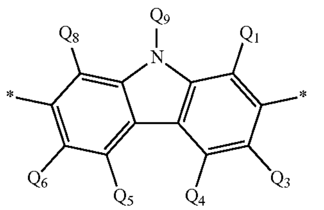
(TEMP-74)
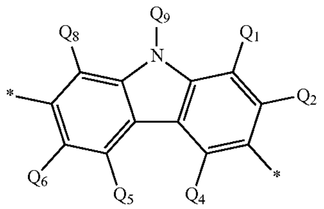
[Formula 13]
(TEMP-75)
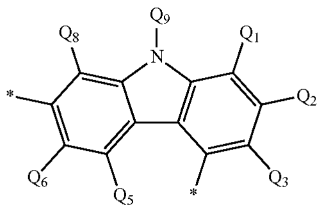
-continued
(TEMP-76)
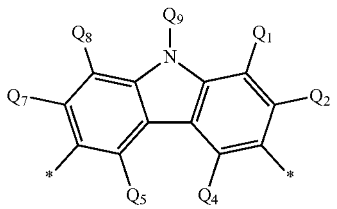
(TEMP-77)
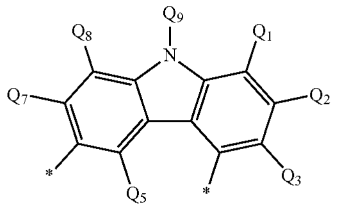
(TEMP-78)
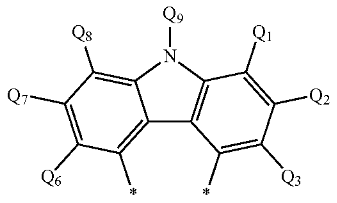
(TEMP-79)
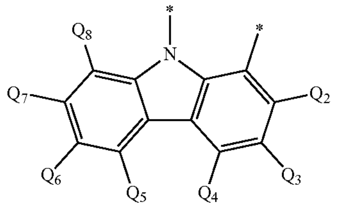
(TEMP-80)
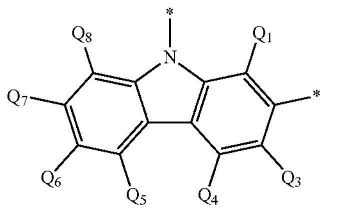
[Formula 14]
(TEMP-81)
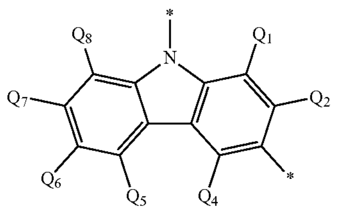
(TEMP-82)
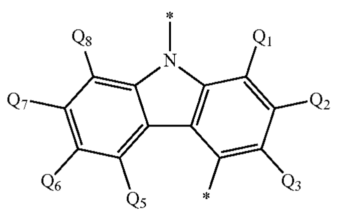
In the formulae (TEMP-69) to (TEMP-82), $Q_1$ to $Q_9$ are each independently a hydrogen atom or a substituent.

[Formula 15]
(TEMP-83)
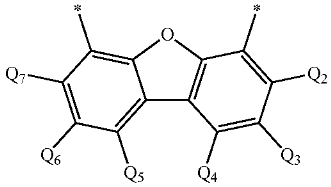
(TEMP-84)
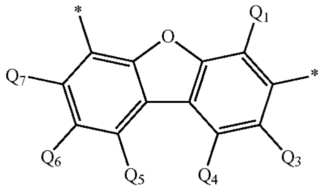
(TEMP-85)
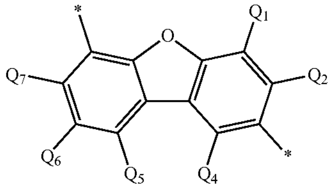
(TEMP-86)
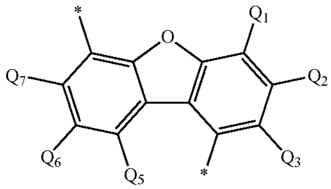
(TEMP-87)
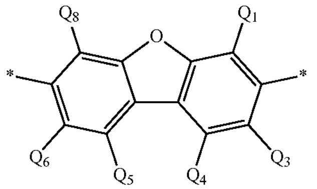
(TEMP-88)
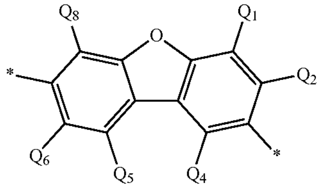
[Formula 16]
(TEMP-89)
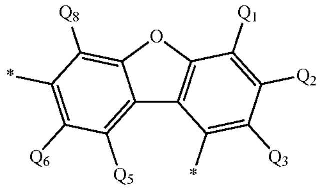
-continued
(TEMP-90)
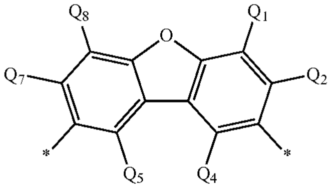
(TEMP-91)
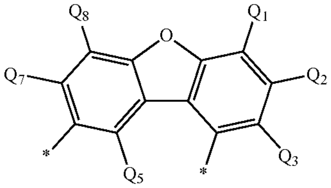
(TEMP-92)
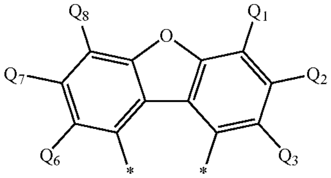
[Formula 17]
(TEMP-93)
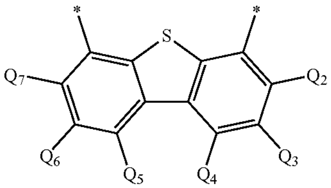
(TEMP-94)
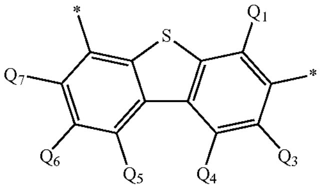
(TEMP-95)
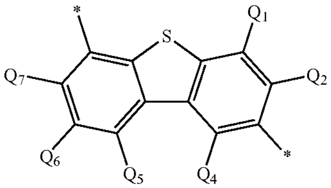
(TEMP-96)
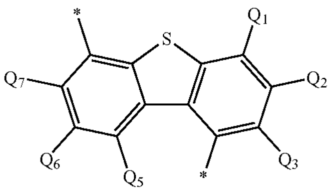
(TEMP-97)
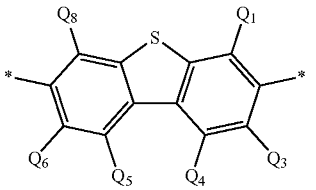

-continued (TEMP-98)

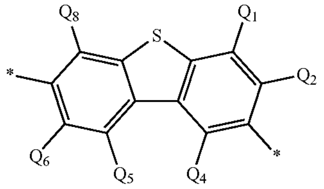

[Formula 18]

(TEMP-99)

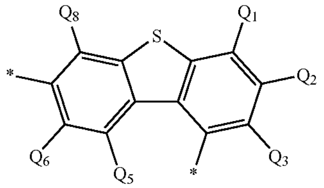

(TEMP-100)

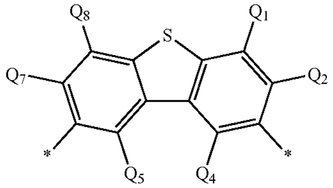

(TEMP-101)

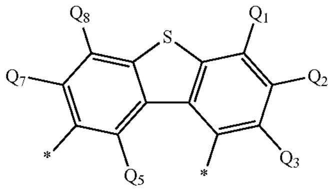

(TEMP-102)

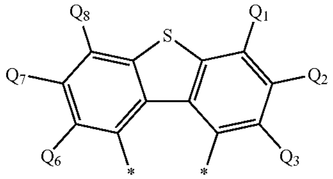

In the formulae (TEMP-83) to (TEMP-102), $Q_1$ to $Q_8$ are each independently a hydrogen atom or a substituent.

The substituent mentioned herein has been described above.

Instance of "Bonded to Form Ring"

Instances where "at least one combination of adjacent two or more (of . . . ) are mutually bonded to form a substituted or unsubstituted monocyclic ring, mutually bonded to form a substituted or unsubstituted fused ring, or not mutually bonded" mentioned herein refer to instances where "at least one combination of adjacent two or more (of . . . ) are mutually bonded to form a substituted or unsubstituted monocyclic ring, "at least one combination of adjacent two or more (of . . . ) are mutually bonded to form a substituted or unsubstituted fused ring," and "at least one combination of adjacent two or more (of . . . ) are not mutually bonded."

Instances where "at least one combination of adjacent two or more (of . . . ) are mutually bonded to form a substituted or unsubstituted monocyclic ring" and "at least one combination of adjacent two or more (of . . . ) are mutually bonded to form a substituted or unsubstituted fused ring" mentioned herein (these instances will be sometimes collectively referred to as an instance of "bonded to form a ring" hereinafter) will be described below. An anthracene compound having a basic skeleton in a form of an anthracene ring and represented by a formula (TEMP-103) below will be used as an example for the description.

[Formula 19]

(TEMP-103)

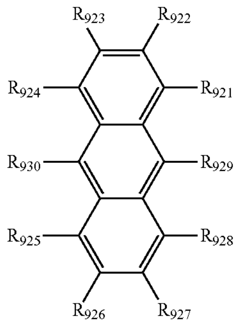

For instance, when "at least one combination of adjacent two or more of $R_{921}$ to $R_{930}$ are mutually bonded to form a ring," the combination of adjacent ones of $R_{921}$ to $R_{930}$ (i.e. the combination at issue) is a combination of $R_{921}$ and $R_{922}$, a combination of $R_{922}$ and $R_{923}$, a combination of $R_{923}$ and $R_{924}$, a combination of $R_{924}$ and $R_{930}$, a combination of $R_{930}$ and $R_{925}$, a combination of $R_{925}$ and $R_{926}$, a combination of $R_{926}$ and $R_{927}$, a combination of $R_{927}$ and $R_{928}$, a combination of $R_{928}$ and $R_{929}$, or a combination of $R_{929}$ and $R_{921}$.

The term "at least one combination" means that two or more of the above combinations of adjacent two or more of $R_{921}$ to $R_{930}$ may simultaneously form rings. For instance, when $R_{921}$ and $R_{922}$ are mutually bonded to form a ring $Q_A$ and $R_{925}$ and $R_{926}$ are simultaneously mutually bonded to form a ring $Q_B$, the anthracene compound represented by the formula (TEMP-103) is represented by a formula (TEMP-104) below.

[Formula 20]

(TEMP-104)

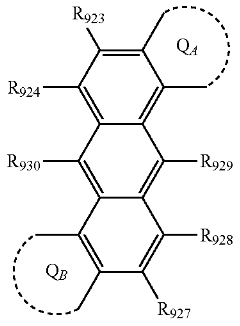

The instance where the "combination of adjacent two or more" form a ring means not only an instance where the "two" adjacent components are bonded but also an instance where adjacent "three or more" are bonded. For instance, $R_{921}$ and $R_{922}$ are mutually bonded to form a ring $Q_A$ and $R_{922}$ and $R_{923}$ are mutually bonded to form a ring Qc, and mutually adjacent three components ($R_{921}$, $R_{922}$ and $R_{923}$) are mutually bonded to form a ring fused to the anthracene basic skeleton. In this case, the anthracene compound represented by the formula (TEMP-103) is represented by a formula (TEMP-105) below. In the formula (TEMP-105) below, the ring $Q_A$ and the ring Qc share $R_{922}$.

[Formula 21]

(TEMP-105)

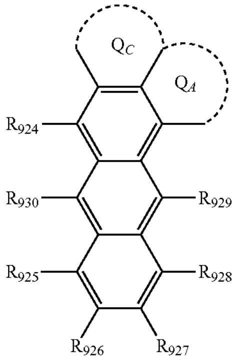

The formed "monocyclic ring" or "fused ring" may be, in terms of the formed ring in itself, a saturated ring or an unsaturated ring. When the "combination of adjacent two" form a "monocyclic ring" or a "fused ring," the "monocyclic ring" or "fused ring" may be a saturated ring or an unsaturated ring. For instance, the ring $Q_A$ and the ring $Q_B$ formed in the formula (TEMP-104) are each independently a "monocyclic ring" or a "fused ring." Further, the ring $Q_A$ and the ring Qc formed in the formula (TEMP-105) are each a "fused ring." The ring $Q_A$ and the ring Qc in the formula (TEMP-105) are fused to form a fused ring. When the ring $Q_A$ in the formula (TEMP-104) is a benzene ring, the ring $Q_A$ is a monocyclic ring. When the ring $Q_A$ in the formula (TEMP-104) is a naphthalene ring, the ring $Q_A$ is a fused ring.

The "unsaturated ring" represents an aromatic hydrocarbon ring or an aromatic heterocycle. The "saturated ring" represents an aliphatic hydrocarbon ring or a non-aromatic heterocycle.

Specific examples of the aromatic hydrocarbon ring include a ring formed by terminating a bond of a group in the specific example of the specific example group G1 with a hydrogen atom.

Specific examples of the aromatic heterocycle include a ring formed by terminating a bond of an aromatic heterocyclic group in the specific example of the specific example group G2 with a hydrogen atom.

Specific examples of the aliphatic hydrocarbon ring include a ring formed by terminating a bond of a group in the specific example of the specific example group G6 with a hydrogen atom.

The phrase "to form a ring" herein means that a ring is formed only by a plurality of atoms of a basic skeleton, or by a combination of a plurality of atoms of the basic skeleton and one or more optional atoms. For instance, the ring $Q_A$ formed by mutually bonding $R_{921}$ and $R_{922}$ shown in the formula (TEMP-104) is a ring formed by a carbon atom of the anthracene skeleton bonded to $R_{921}$, a carbon atom of the anthracene skeleton bonded to $R_{922}$, and one or more optional atoms. Specifically, when the ring $Q_A$ is a monocyclic unsaturated ring formed by $R_{921}$ and $R_{922}$, the ring formed by a carbon atom of the anthracene skeleton bonded to $R_{921}$, a carbon atom of the anthracene skeleton bonded to $R_{922}$, and four carbon atoms is a benzene ring.

The "optional atom" is, unless otherwise specified herein, preferably at least one atom selected from the group consisting of a carbon atom, nitrogen atom, oxygen atom, and sulfur atom. A bond of the optional atom (e.g. a carbon atom and a nitrogen atom) not forming a ring may be terminated by a hydrogen atom or the like or may be substituted by an "optional substituent" described later. When the ring includes an optional element other than carbon atom, the resultant ring is a heterocycle.

The number of "one or more optional atoms" forming the monocyclic ring or fused ring is, unless otherwise specified herein, preferably in a range from 2 to 15, more preferably in a range from 3 to 12, further preferably in a range from 3 to 5.

Unless otherwise specified herein, the ring, which may be a "monocyclic ring" or "fused ring," is preferably a "monocyclic ring."

Unless otherwise specified herein, the ring, which may be a "saturated ring" or "unsaturated ring," is preferably an "unsaturated ring."

Unless otherwise specified herein, the "monocyclic ring" is preferably a benzene ring.

Unless otherwise specified herein, the "unsaturated ring" is preferably a benzene ring.

When "at least one combination of adjacent two or more" (of . . . ) are "mutually bonded to form a substituted or unsubstituted monocyclic ring" or "mutually bonded to form a substituted or unsubstituted fused ring," unless otherwise specified herein, at least one combination of adjacent two or more of components are preferably mutually bonded to form a substituted or unsubstituted "unsaturated ring" formed of a plurality of atoms of the basic skeleton, and 1 to 15 atoms of at least one element selected from the group consisting of carbon, nitrogen, oxygen and sulfur.

When the "monocyclic ring" or the "fused ring" has a substituent, the substituent is the substituent described in later-described "optional substituent." When the "monocyclic ring" or the "fused ring" has a substituent, specific examples of the substituent are the substituents described in the above under the subtitle "Substituent Mentioned Herein."

When the "saturated ring" or the "unsaturated ring" has a substituent, the substituent is the substituent described in later-described "optional substituent." When the "monocyclic ring" or the "fused ring" has a substituent, specific examples of the substituent are the substituents described in the above under the subtitle "Substituent Mentioned Herein."

The above is the description for the instances where "at least one combination of adjacent two or more (of . . . ) are mutually bonded to form a substituted or unsubstituted monocyclic ring" and "at least one combination of adjacent two or more (of . . . ) are mutually bonded to form a substituted or unsubstituted fused ring" mentioned herein (sometimes referred to as an instance of "bonded to form a ring").

Substituent for Substituted or Unsubstituted Group

In an exemplary embodiment herein, a substituent for the substituted or unsubstituted group (sometimes referred to as an "optional substituent" hereinafter) is, for instance, a group selected from the group consisting of an unsubstituted alkyl group having 1 to 50 carbon atoms, an unsubstituted alkenyl group having 2 to 50 carbon atoms, an unsubstituted alkynyl group having 2 to 50 carbon atoms, an unsubstituted cycloalkyl group having 3 to 50 ring carbon atoms, —Si$(R_{901})(R_{902})(R_{903})$, —O—$(R_{904})$, —S—$(R_{905})$, —N$(R_{906})(R_{907})$, a halogen atom, a cyano group, a nitro group, an unsubstituted aryl group having 6 to 50 ring carbon atoms, and an unsubstituted heterocyclic group having 5 to 50 ring atoms;

$R_{901}$ to $R_{907}$ are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms;

when two or more $R_{901}$ are present, the two or more $R_{901}$ are mutually the same or different;

when two or more $R_{902}$ are present, the two or more $R_{902}$ are mutually the same or different;

when two or more $R_{903}$ are present, the two or more $R_{903}$ are mutually the same or different;

when two or more $R_{904}$ are present, the two or more $R_{904}$ are mutually the same or different;

when two or more $R_{905}$ are present, the two or more $R_{905}$ are mutually the same or different;

when two or more $R_{906}$ are present, the two or more $R_{906}$ are mutually the same or different; and when two or more $R_{907}$ are present, the two or more $R_{907}$ are mutually the same or different.

In an exemplary embodiment, the substituent for the substituted or unsubstituted group is selected from the group consisting of an alkyl group having 1 to 50 carbon atoms, an aryl group having 6 to 50 ring carbon atoms, and a heterocyclic group having 5 to 50 ring atoms.

In an exemplary embodiment, the substituent for the substituted or unsubstituted group is selected from the group consisting of an alkyl group having 1 to 18 carbon atoms, an aryl group having 6 to 18 ring carbon atoms, and a heterocyclic group having 5 to 18 ring atoms.

Specific examples of the above optional substituent are the same as the specific examples of the substituent described in the above under the subtitle "Substituent Mentioned Herein."

Unless otherwise specified herein, adjacent ones of the optional substituents may form a "saturated ring" or an "unsaturated ring," preferably a substituted or unsubstituted saturated five-membered ring, a substituted or unsubstituted saturated six-membered ring, a substituted or unsubstituted unsaturated five-membered ring, or a substituted or unsubstituted unsaturated six-membered ring, more preferably a benzene ring.

Unless otherwise specified herein, the optional substituent may further include a substituent. Examples of the substituent for the optional substituent are the same as the examples of the optional substituent.

Herein, numerical ranges represented by "AA to BB" represent a range whose lower limit is the value (AA) recited before "to" and whose upper limit is the value (BB) recited after "to."

First Exemplary Embodiment

Organic Electroluminescence Device

An organic EL device according to a first exemplary embodiment is an organic electroluminescence device that includes an anode, an emitting layer, and a cathode, in which the emitting layer includes a first emitting layer and a second emitting layer, the first emitting layer contains a first host material and a first emitting material that emits light having a maximum peak wavelength of 500 nm or less, the second emitting layer contains a second host material and a second emitting material that emits light having a maximum peak wavelength of 500 nm or less, the first host material and the second host material are mutually different, the first emitting material and the second emitting material are mutually the same or different, a triplet energy of the first host material $T_1(H1)$ and a triplet energy of the second host material $T_1(H2)$ satisfy a relationship of a numerical formula (Numerical Formula 1) below, and a maximum peak wavelength λ1 and a full width at half maximum FWHM1 of a photoluminescence spectrum of a first film provided by adding the first emitting material to the first host material, and a maximum peak wavelength λ2 and a full width at half maximum FWHM2 of a photoluminescence spectrum of a second film provided by adding the second emitting material to the second host material satisfy numerical formulae (Numerical Formula 20 and Numerical Formula 30) below.

$$T_1(H1)>T_1(H2) \quad \text{(Numerical Formula 1)}$$

$$|\lambda 1-\lambda 2|\leq 3 \text{ nm} \quad \text{(Numerical Formula 20)}$$

$$|\mathrm{FWHM1}-\mathrm{FWHM2}|\leq 2 \text{ nm} \quad \text{(Numerical Formula 30)}$$

The inventors have found out that luminous efficiency is improbable by including the emitting layers (first emitting layer and second emitting layer) that contain the host materials satisfying the numerical formula (Numerical Formula 1) and that have the same arrangements as those of the two films (first film and second film) satisfying the above formulae (Numerical Formula 20 and Numerical Formula 30). Presumably, the reason thereof is as below.

First, Tripret-Tripret-Annhilation (occasionally referred to as TTA), known as the technology for enhancing the luminous efficiency of the organic EL device, will be described.

Conventionally, there is known Tripret-Tripret-Annhilation (occasionally referred to as TTA) as the technology for enhancing the luminous efficiency of the organic electroluminescence device. TTA is a mechanism in which triplet excitons collide with one another to generate singlet excitons. The TTA mechanism is also referred to as a TTF mechanism as described in Patent Literature 2.

The TTF phenomenon will be described. Holes injected from an anode and electrons injected from a cathode are recombined in an emitting layer to generate excitons. As for the spin state, as is conventionally known, singlet excitons account for 25% and triplet excitons account for 75%. In a conventionally known fluorescent device, light is emitted when singlet excitons of 25% are relaxed to the ground state. The remaining triplet excitons of 75% are returned to the ground state without emitting light through a thermal deactivation process. Accordingly, the theoretical limit value of the internal quantum efficiency of the conventional fluorescent device is believed to be 25%.

The behavior of triplet excitons generated within an organic substance has been theoretically examined. According to S. M. Bachilo et al. (J. Phys. Chem. A, 104, 7711 (2000)), assuming that high-order excitons such as quintet excitons are quickly returned to triplet excitons, triplet excitons (hereinafter abbreviated as 3 A") collide with one another with an increase in density thereof, whereby a reaction shown by the following formula occurs. In the formula, $^1A$ represents the ground state and $^1A^*$ represents the lowest singlet excitons.

$$^3A^*+^3A^*\rightarrow(4/9)^1A+(1/9)^1A^*+(13/9)^3A^*$$

In other words, $5^3A^*\rightarrow 4^1A+1A^*$ is satisfied, and it is expected that, among triplet excitons initially generated, which account for 75%, one fifth thereof (i.e., 20%) is changed to singlet excitons. Accordingly, the amount of singlet excitons which contribute to emission is 40%, which is a value obtained by adding 15% (75%×(1/5)=15%) to 25%, which is the amount ratio of initially generated singlet excitons. At this time, a ratio of luminous intensity derived from TTF (TTF ratio) relative to the total luminous intensity is 15/40, i.e., 37.5%. Assuming that singlet excitons are generated by collision of initially generated triplet excitons accounting for 75% (i.e., one singlet exciton is generated from two triplet excitons), a significantly high internal quantum efficiency of 62.5% is obtained, which is a value obtained by adding 37.5% (75%×(1/2)=37.5%) to 25% (the amount ratio of initially generated singlet excitons). At this time, the TTF ratio is 37.5/62.5=60%.

Subsequently, the significance that the triplet energy of the first host material $T_1$(H1) in the first emitting layer and the triplet energy of the second host material $T_1$(H2) in the second emitting layer satisfy the relationship of the numerical formula (Numerical Formula 1) in the organic EL device of the first exemplary embodiment is explained below.

In the organic EL device according to the first exemplary embodiment, it is considered that since the relationship of the numerical formula (Numerical Formula 1) is satisfied, triplet excitons generated by recombination of holes and electrons in the first emitting layer and present on an interface between the first emitting layer and organic layer(s) in direct contact therewith are not likely to be quenched even under the presence of excessive carriers on the interface between the first emitting layer and the organic layer(s). For instance, the presence of a recombination region locally on an interface between the first emitting layer and a hole transporting layer or an electron blocking layer is considered to cause quenching by excessive electrons. Meanwhile, the presence of a recombination region locally on an interface between the first emitting layer and an electron transporting layer or a hole blocking layer is considered to cause quenching by excessive holes.

In the organic EL device according to the first exemplary embodiment, by including the first emitting layer and the second emitting layer so as to satisfy the relationship of the numerical formula (Numerical Formula 1), triplet excitons generated in the first emitting layer can transfer to the second emitting layer without being quenched by excessive carriers and be inhibited from back-transferring from the second emitting layer to the first emitting layer. Consequently, the second emitting layer exhibits the TTF mechanism to effectively generate singlet excitons, thereby improving the luminous efficiency.

Accordingly, the organic EL device includes, as different regions, the first emitting layer mainly generating triplet excitons and the second emitting layer mainly exhibiting the TTF mechanism using triplet excitons having transferred from the first emitting layer, and has a difference in triplet energy provided by using a compound having a smaller triplet energy than that of the first host material in the first emitting layer as the second host material in the second emitting layer. The luminous efficiency is thus improved.

Subsequently, the significance that the relationship of the numerical formulae (Numerical Formula 20 and Numerical Formula 30) is satisfied in the organic EL device of the first exemplary embodiment is explained below.

As described above, in order to improve the luminous efficiency, the organic EL device of the first exemplary embodiment is designed by layering the emitting layers and using the first host material and the second host material that satisfy the numerical formula (Numerical Formula 1).

However, for some organic EL devices including layered emitting layers, there is found a problem in which even with the layered emitting layers, an organic EL device including a color conversion portion on a side of the organic EL device through which light is extracted and a top emission type organic EL device cannot have improved luminous efficiency to the same extent as that of a bottom emission type organic EL device including no color conversion portion on a side of the organic EL device through which light is extracted.

In the organic EL device of the first exemplary embodiment, the host materials contained in the first emitting layer and the second emitting layer are mutually different. Thus, the first and second emitting layers are different in the degree of interaction between the host material and the emitting material, making it difficult to provide a large overlap between the emission spectrum of the first emitting layer and the emission spectrum of the second emitting layer. The overlap of the emission spectra is smaller, for instance, in a case where the peak wavelength of the emission spectrum of each of the first emitting layer and the second emitting layer is shifted or the full width at half maximum of the emission spectrum is enlarged. Presumably, the ratio of a region having any other wavelength than a specific wavelength in each emission spectrum is larger as the overlap of emission spectra is smaller.

The inventors have focused on reduction of light extraction loss by utilizing light caused by a region having any other wavelength than the specific wavelength in each emission spectrum.

The organic EL device of the first exemplary embodiment includes emitting layers (first emitting layer and second emitting layer) having the same arrangements as those of two films (first film and second film) in which a difference between a maximum peak wavelength of a photoluminescence spectrum of the first film provided by adding the first emitting material to the first host material and a maximum peak wavelength of a photoluminescence spectrum of the second film provided by adding the second emitting material to the second host material is 3 nm or less (Numerical Formula 20) and a difference between a full width at half maximum of the photoluminescence spectrum of the first film and a full width at half maximum of the photoluminescence spectrum of the second film is 2 nm or less (Numerical Formula 30).

That is, in the organic EL device of the first exemplary embodiment, the first film formed from the component of the first emitting layer and the second film formed from the component of the second emitting layer are combined so that the difference in the respective photoluminescence spectra is small, thus reducing loss that may otherwise be caused when light is extracted from an upper electrode (cathode) or a lower electrode (anode). The luminous efficiency is thus improved.

The organic EL device of the first exemplary embodiment is more suitably used for a top emission type organic EL device and an organic EL device including a color conversion portion on a side of the organic EL device through which light is extracted.

In the organic EL device according to the first exemplary embodiment, the maximum peak wavelength λ1 of the photoluminescence spectrum of the first film and the maximum peak wavelength λ2 of the photoluminescence spectrum of the second film preferably satisfy a numerical formula (Numerical Formula 20A), more preferably satisfy a numerical formula (Numerical Formula 20B).

$|\lambda 1-\lambda 2|\leq 2$ nm (Numerical Formula 20A)

$|\lambda 1-\lambda 2|1$ nm (Numerical Formula 20B)

In the organic EL device according to the first exemplary embodiment, the full width at half maximum FWHM1 of the photoluminescence spectrum of the first film and the full width at half maximum FWHM2 of the photoluminescence spectrum of the second film preferably satisfy a numerical formula (Numerical Formula 30A).

$|FWHM1-FWHM2|\leq 1$ nm (Numerical Formula 30A)

The maximum peak wavelength λ1 and the full width at half maximum FWHM1 of the photoluminescence spectrum of the first film and the maximum peak wavelength λ2 and the full width at half maximum FWHM2 of the photoluminescence spectrum of the second film can be measured by a method below.

First, a measurement sample for the first film is prepared to have the same arrangement as that of the first emitting layer, as described below. A measurement sample for the second film is prepared to have the same arrangement as that of the second emitting layer, as described below.

The wording "the same arrangement as that of the first emitting layer" means that the same material is used for the first film and the first emitting layer. Specifically, when the first emitting layer is formed from the first host material and the first emitting material, a mass ratio of the first emitting material to the first host material in the first emitting layer (first emitting material/first host material) is identical to a mass ratio of the first emitting material to the first host material in the first film (first emitting material/first host material).

The same applies to the wording "the same arrangement as that of the second emitting layer".

The method of producing the measurement sample for the first film and the measurement sample for the second film is as follows.

The first host material (BH1) and the first emitting material (BD1) are co-deposited on a quartz substrate (25×25 mm) so that the mass ratio of the first emitting material to the first host material in the first film (first emitting material/first host material) is same as that of the first emitting layer, forming the measurement sample for the first film having a film thickness of 50 nm. On the formed sample, a sealing glass (external dimension: 17×17 mm, internal dimension: 13×13 mm, dig depth: 0.5 mm) coated with a coating-type drying agent (OleDry-P2 produced by Futaba Corporation) is placed, and sealed with an ultraviolet-curing resin (TB3124N(IE) produced by ThreeBond Fine Chemical Co., Ltd). The measurement sample for the second film is produced similarly.

For photoluminescence spectrum measurement, a fluorescence spectrometer (spectrophotofluorometer F-7000 produced by Hitachi High-Tech Science Corporation) is used.

The measurement conditions are as follows.

The maximum peak wavelength A (unit: nm) and the full width at half maximum FWHM (unit: nm) of the film are calculated from the photoluminescence spectrum obtained by exciting the measurement sample for the film with a specific wavelength (a value of wavelength that is shorter by 30 nm than a maximum peak wavelength of an absorption spectrum).

FIG. 1 schematically shows an exemplary arrangement of an organic EL device according to the first exemplary embodiment. An organic EL device 1 shown in FIG. 1 is a bottom emission type organic EL device in which light is extracted at a side of the organic EL device 1 close to an anode 3.

The organic EL device 1 includes a light-transmissive substrate 2, the anode 3, a cathode 4, and organic layers 10 provided between the anode 3 and the cathode 4. The organic layers 10 include a hole injecting layer 6, a hole transporting layer 7, a first emitting layer 51, a second emitting layer 52, an electron transporting layer 8, and an electron injecting layer 9 that are layered on the anode 3 in this order. The organic EL device 1 further includes a color conversion portion 80 that transmits light emitted from the first emitting layer 51 and the second emitting layer 52. In a case of FIG. 1, the color conversion portion, which is a color filter, is disposed near the anode 3, that is, at the side of the organic EL device 1 through which light is extracted. The organic EL device 1 includes the first emitting layer 51 and the second emitting layer 52 that contain the host materials satisfying the numerical formula (Numerical Formula 1). The first emitting layer 51 has the same arrangement as that of the first film satisfying the numerical formula (Numerical Formula 20) and the numerical formula (Numerical Formula 30). The second emitting layer 52 has the same arrangement as that of the second film satisfying the numerical formula (Numerical Formula 20) and the numerical formula (Numerical Formula 30).

The organic EL device 1 according to the first exemplary embodiment may have any arrangement without being limited to the arrangement of the organic EL device 1 shown in FIG. 1. As another arrangement of the organic EL device, for instance, the organic layers include the hole injecting layer, the hole transporting layer, the second emitting layer, the first emitting layer, the electron transporting layer, and the electron injecting layer that are layered on the anode in this order.

Further, the color conversion portion 80 may be disposed between the substrate 2 and the anode 3.

A film thickness d1 of the first emitting layer 51 is measured as follows.

A central portion (CL in FIG. 1) of the organic EL device 1 is cut in a perpendicular direction to a plane where the first emitting layer 51 is formed (a thickness d1 direction of the first emitting layer 51). The cut surface of the central portion is observed with a transmission electron microscope (TEM) to determine the film thickness.

It should be noted that the central portion of the organic EL device 1 means a central portion of a shape of the organic EL device 1 projected through the cathode 4. When the projected shape is, for instance, rectangular, the central portion of the organic EL device 1 means an intersection of the diagonal lines of the rectangle.

The same measurement method applies to a film thickness d2 of the second emitting layer 52.

Second Exemplary Embodiment

Organic Electroluminescence Device

An organic EL device according to a second exemplary embodiment is an organic electroluminescence device that includes an anode, an emitting layer, and a cathode, in which the emitting layer includes a first emitting layer and a second emitting layer, the first emitting layer contains a first host material and a first emitting material that emits light having a maximum peak wavelength of 500 nm or less, the second emitting layer contains a second host material and a second emitting material that emits light having a maximum peak wavelength of 500 nm or less, the first host material and the second host material are mutually different, the first emitting material and the second emitting material are mutually the same or different, a triplet energy of the first host material $T_1$ (H1) and a triplet energy of the second host material $T_1$(H2) satisfy a relationship of a numerical formula (Numerical Formula 1) below, and for a photoluminescence spectrum in a range from 400 nm to 600 nm of the first film provided by adding the first emitting material to the first host material and a photoluminescence spectrum in a range from 400 nm to 600 nm of the second film provided by adding the second emitting material to the second host material, an overlap integral of normalized photoluminescence spectra obtained by normalizing the photoluminescence spectrum of the first film and the photoluminescence spectrum of the second film is 99.0% or more.

$$T_1(H1)>T_1(H2) \quad \text{(Numerical Formula 1)}$$

The inventors have found out that luminous efficiency is improbable by including the emitting layers (first emitting layer and second emitting layer) that contain the host materials satisfying the numerical formula (Numerical Formula 1) and that have the same arrangements as those of the two films (first film and second film) with an overlap integral of the photoluminescence spectra of 99.0% or more.

Herein, the wording "an overlap integral of the photoluminescence spectra of 99.0% or more" means that the photoluminescence spectrum of the first film substantially overlaps with the photoluminescence spectrum of the second film. That is, in the second exemplary embodiment, the first film formed by the component of the first emitting layer and the second film formed by the component of the second emitting layer are combined so that the difference in the respective photoluminescence spectra is small.

In the organic EL device of the second exemplary embodiment, when light is extracted through the color conversion portion, light loss is reducible for the same reason as the first exemplary embodiment. The luminous efficiency thereof is thus improved.

Overlap Integral of Photoluminescence Spectra

The overlap integral of photoluminescence spectra is explained.

For the overlap integral of photoluminescence spectra, the photoluminescence spectrum in a range from 400 nm to 600 nm of the first film provided by adding the first emitting material to the first host material and the photoluminescence spectrum in a range from 400 nm to 600 nm of the second film provided by adding the second emitting material to the second host material are normalized respectively.

For instance, when the photoluminescence spectrum in a range from 400 nm to 600 nm of the first film provided by adding the first emitting material to the first host material and the photoluminescence spectrum in a range from 400 nm to 600 nm of the second film provided by adding the second emitting material to the second host material are respectively generalized to be calculated as vectors, and are represented by a mode $E_1$ (mode of the photoluminescence spectrum of the first film) and a mode $E_2$ (mode of the photoluminescence spectrum of the second film), an overlap integral (POI: Power Overlap Integral) of the modes $E_1$ and $E_2$ is represented by a formula (100) below.

Numerical Formura 1

$$POI = \frac{\left|\int\int \vec{E}_1(x, y)\cdot\vec{E}_2(x, y)dxdy\right|^2}{\int|\vec{E}_1|dxdy\int|\vec{E}_2|^2dxdy} \quad (100)$$

In the formula (100), if $E_1=E_2$, then POI=1, indicating the normalization. In physical meanings, the overlap integral normalized represents a degree of overlap of the photoluminescence spectrum of the first film with the photoluminescence spectrum of the second film.

In the organic EL device according to the second exemplary embodiment, for the photoluminescence spectrum in a range from 400 nm to 600 nm of the first film and the photoluminescence spectrum in a range from 400 nm to 600 nm of the second film, the overlap integral of normalized photoluminescence spectra obtained by normalizing the photoluminescence spectrum of the first film and the photoluminescence spectrum of the second film is preferably 99.5% or more.

The organic EL device of the second exemplary embodiment is the same in arrangement as the organic EL device of the first exemplary embodiment, except that the first and second emitting layers satisfying relationships of Numerical Formula 1, Numerical Formula 20, and Numerical Formula 30 in the first exemplary embodiment are replaced with the first and second emitting layers satisfying the relationship of Numerical Formula 1 and the requirement "an overlap integral of the photoluminescence spectra of 99.0% or more".

An exemplary arrangement of the organic EL device of the second exemplary embodiment includes a substrate, an anode, a cathode, organic layers between the anode and the cathode, and a color conversion portion, as shown in FIG. 1. The organic layers may include the hole injecting layer, the hole transporting layer, the first emitting layer, the second emitting layer, the electron transporting layer, and the electron injecting layer that are layered on the anode in this order. Or, the organic layers may include the hole injecting layer, the hole transporting layer, the second emitting layer, the first emitting layer, the electron transporting layer, and the electron injecting layer that are layered on the anode in this order. Further, the color conversion portion may be disposed between the substrate and the anode.

Third Exemplary Embodiment

Organic Electroluminescence Device

An organic EL device of a third exemplary embodiment is an exemplary arrangement of the first exemplary embodiment or the second exemplary embodiment.

FIG. 2 schematically shows an exemplary arrangement of the organic EL device according to the third exemplary embodiment. An organic EL device 1A shown in FIG. 2 is a top emission type organic EL device.

The organic EL device 1A includes a substrate 2, an anode 3, a cathode 4, organic layers 10 between the anode 3 and the cathode 4, and a light reflection layer 31. The organic layers 10 include a hole injecting layer 6, a hole transporting layer 7, a first emitting layer 51, a second emitting layer 52, an electron transporting layer 8, and an electron injecting layer 9 that are layered on the anode 3 in this order. In FIG. 2, the anode 3 is a transparent electrode and the light reflection layer 31 is disposed between the anode 3 and the substrate 2. The light reflection layer 31 may be disposed on a side of the substrate 2 on which the anode 3 is not provided.

As another arrangement of the organic EL device 1A of the third exemplary embodiment, for instance, the organic layers include the hole injecting layer, the hole transporting layer, the second emitting layer, the first emitting layer, the electron transporting layer, and the electron injecting layer that are layered on the anode in this order. Further, a color conversion portion may be disposed on the cathode.

In the organic EL device 1A of the third exemplary embodiment, when light is extracted through the upper electrode (cathode), light loss is reducible for the same reason as the first exemplary embodiment. The luminous efficiency thereof is thus improved.

Fourth Exemplary Embodiment

Organic Electroluminescence Device

An organic EL device according to a fourth exemplary embodiment is an organic electroluminescence device that includes a first electrode, a hole transporting zone, an emitting layer, an electron transporting zone, and a second electrode that is semi-transmissive in this order, in which the emitting layer includes a first emitting layer and a second emitting layer, the first emitting layer contains a first host material and a first emitting material that emits light having a maximum peak wavelength of 500 nm or less, the second emitting layer contains a second host material and a second emitting material that emits light having a maximum peak wavelength of 500 nm or less, the first host material and the second host material are mutually different, the first emitting material and the second emitting material are mutually the same or different, a triplet energy of the first host material $T_1(H1)$ and a triplet energy of the second host material $T_1(H2)$ satisfy a relationship of a numerical formula (Numerical Formula 1) below, and a maximum peak wavelength λ1 and a full width at half maximum FWHM1 of a photoluminescence spectrum of a first film provided by adding the first emitting material to the first host material, and a maximum peak wavelength λ2 and a full width at half maximum FWHM2 of a photoluminescence spectrum of a second film provided by adding the second emitting material to the second host material satisfy numerical formulae (Numerical Formula 20 and Numerical Formula below.

$$T_1(H1)>T_1(H2) \quad \text{(Numerical Formula 1)}$$

$$|\lambda1-\lambda2|\leq 3\text{ nm} \quad \text{(Numerical Formula 20)}$$

$$|\text{FWHM1}-\text{FWHM2}|\leq 2\text{ nm} \quad \text{(Numerical Formula 30)}$$

The inventors have found out that luminous efficiency is improbable by including the emitting layers (first emitting layer and second emitting layer) that contain the host materials satisfying the numerical formula (Numerical Formula 1) and that have the same arrangements as those of the two films (first film and second film) satisfying the above formulae (Numerical Formula 20 and Numerical Formula 30). The reason thereof is similar to that explained in the first exemplary embodiment.

In the organic EL device according to the fourth exemplary embodiment, the maximum peak wavelength λ1 of the photoluminescence spectrum of the first film and the maximum peak wavelength λ2 of the photoluminescence spectrum of the second film preferably satisfy the numerical formula (Numerical Formula 20A), more preferably satisfy the numerical formula (Numerical Formula 20B).

In the organic EL device according to the fourth exemplary embodiment, the full width at half maximum FWHM1 of the photoluminescence spectrum of the first film and the full width at half maximum FWHM2 of the photoluminescence spectrum of the second film preferably satisfy the numerical formula (Numerical Formula 30A).

The maximum peak wavelength λ1 and the full width at half maximum FWHM1 of the photoluminescence spectrum of the first film and the maximum peak wavelength λ2 and the full width at half maximum FWHM2 of the photoluminescence spectrum of the second film can be measured by a method similar to that explained in the first exemplary embodiment.

FIG. 3 schematically shows an exemplary arrangement of the organic EL device according to the fourth exemplary embodiment. The organic EL device shown in FIG. 3 is a top emission type organic EL device.

An organic EL device 1B includes a substrate 2, a light reflection layer 31, an anode 3 as a first electrode, a cathode 4 as a second electrode, and organic layers between the anode 3 and the cathode 4. The organic layers 10 include a hole injecting layer 6, a hole transporting layer 7, a first emitting layer 51, a second emitting layer 52, an electron transporting layer 8, and an electron injecting layer 9 that are layered on the anode 3 in this order. In a case of FIG. 3, the anode 3 is a transparent electrode. The light reflection layer 31 is disposed between the anode 3 and the substrate 2.

The organic EL device 1B includes the first emitting layer 51 and the second emitting layer 52 that contain the host materials satisfying the numerical formula (Numerical Formula 1). The first emitting layer 51 has the same arrangement as that of the first film satisfying the numerical formula (Numerical Formula 20) and the numerical formula (Numerical Formula 30). The second emitting layer 52 has the same arrangement as that of the second film satisfying the numerical formula (Numerical Formula 20) and the numerical formula (Numerical Formula 30).

The organic EL device 1B according to the first exemplary embodiment is not limited to the arrangement of the organic EL device 1B shown in FIG. 3. As another arrangement of the organic EL device, for instance, the organic layers include the hole injecting layer, the hole transporting layer, the second emitting layer, the first emitting layer, the electron transporting layer, and the electron injecting layer that are layered on the anode in this order. Further, a color conversion portion (e.g., a color filter and a quantum dot) may be disposed on the cathode.

Further, the light reflection layer may be disposed on a side of the substrate on which the anode is not provided. Although the substrate, the light reflection layer, and the anode are provided in this order in the organic EL device 1B shown in FIG. 3, they may be provided in the order of the light reflection layer, the substrate, and the anode.

A method of measuring the film thickness d1 of the first emitting layer 51 and the film thickness d2 of the second emitting layer 52 is as described in the first exemplary embodiment.

Fifth Exemplary Embodiment

Organic Electroluminescence Device

An organic EL device according to a fifth exemplary embodiment is an organic electroluminescence device that includes a first electrode, a hole transporting zone, an emitting layer, an electron transporting zone, and a second electrode that is semi-transmissive in this order, in which the emitting layer includes a first emitting layer and a second emitting layer, the first emitting layer contains a first host material and a first emitting material that emits light having a maximum peak wavelength of 500 nm or less, the second emitting layer contains a second host material and a second emitting material that emits light having a maximum peak wavelength of 500 nm or less, the first host material and the second host material are mutually different, the first emitting material and the second emitting material are mutually the same or different, a triplet energy of the first host material $T_1$(H1) and a triplet energy of the second host material $T_1$ (H2) satisfy a relationship of a numerical formula (Numerical Formula 1) below, and for a photoluminescence spectrum in a range from 400 nm to 600 nm of the first film provided by adding the first emitting material to the first host material and a photoluminescence spectrum in a range from 400 nm to 600 nm of the second film provided by adding the second emitting material to the second host material, an overlap integral of normalized photoluminescence spectra obtained by normalizing the photoluminescence spectrum of the first film and the photoluminescence spectrum of the second film is 99.0% or more.

$$T_1(H1)>T_1(H2) \quad \text{(Numerical Formula 1)}$$

The inventors have found out that luminous efficiency is improbable by including the emitting layers (first emitting layer and second emitting layer) that contain the host materials satisfying the numerical formula (Numerical Formula 1) and that have the same arrangements as those of the two films (first film and second film) with an overlap integral of the photoluminescence spectra of 99.0% or more.

The definition and explanation for the overlap integral of photoluminescence spectra are as described in the first exemplary embodiment.

In the fifth exemplary embodiment, the first film formed by the component of the first emitting layer and the second film formed by the component of the second emitting layer are combined so that the difference in the respective photoluminescence spectra is small.

In the top emission type device of the fifth exemplary embodiment, when light is extracted through the upper electrode (second electrode), light loss is reducible for the same reason as the fourth exemplary embodiment. The luminous efficiency thereof is thus improved.

In the organic EL device according to the fifth exemplary embodiment, for the photoluminescence spectrum in a range from 400 nm to 600 nm of the first film and the photoluminescence spectrum in a range from 400 nm to 600 nm of the second film, the overlap integral of normalized photoluminescence spectra obtained by normalizing the photoluminescence spectrum of the first film and the photoluminescence spectrum of the second film is preferably 99.5% or more.

The organic EL device of the fifth exemplary embodiment is the same in arrangement as the organic EL device of the fourth exemplary embodiment, except that the first and second emitting layers satisfying Numerical Formula 1, Numerical Formula 20, and Numerical Formula 30 in the fourth exemplary embodiment are replaced with the first and second emitting layers satisfying the relationship of Numerical Formula 1 and the requirement "an overlap integral of the photoluminescence spectra of 99.0% or more".

As shown in FIG. 3, an exemplary arrangement of the organic EL device of the fifth exemplary embodiment includes a substrate, an anode as the first electrode, a cathode as the second electrode, and organic layers between the anode and the cathode. The organic layers may include the hole injecting layer, the hole transporting layer, the first emitting layer, the second emitting layer, the electron transporting layer, and the electron injecting layer that are layered on the anode in this order. Or, the organic layers may include the hole injecting layer, the hole transporting layer, the second emitting layer, the first emitting layer, the electron transporting layer, and the electron injecting layer that are layered on the anode in this order.

Arrangements Common in Exemplary Embodiments

Subsequently, preferable arrangements common in the organic EL devices according to the first to third exemplary embodiments and preferable arrangements common in the organic EL devices according to the fourth and fifth exemplary embodiments are explained. It should be noted that the reference numerals are occasionally omitted below.

Herein, the arrangements common in the organic EL devices according to the first to fifth exemplary embodiments are occasionally referred to as "the organic EL device according to the above exemplary embodiment".

In the organic EL devices according to the first to third exemplary embodiments, the color conversion portion is preferably provided on a side of the organic EL device through which light is extracted. The color conversion portion, which is not particularly limited, may be a color filter, a quantum dot, or the like. The side of the organic EL device through which light is extracted may be a side close to the anode or a side close to the cathode.

Preferably, the organic EL device according to the fourth or fifth exemplary embodiment further includes the light reflection layer and the first electrode is the transparent electrode.

The light reflection layer is preferably disposed on a side of the first electrode on which the emitting layer is not provided. The light reflection layer is preferably disposed on a side close to the anode (first electrode).

The organic EL device according to the fourth or fifth exemplary embodiment preferably includes the light reflection layer, the transparent electrode as the first electrode, the hole transporting zone, the emitting layer, the electron transporting zone, and the second electrode that is semi-transmissive in this order.

The first electrode may be a reflective electrode. In this arrangement, the first electrode is preferably formed by a light reflection layer and a transparent conductive layer. The transparent conductive layer is preferably disposed between the light reflection layer and the emitting layer.

In the organic EL device according to the exemplary embodiment, a mass ratio of the first emitting material to the first host material in the first emitting film (first emitting material/first host material) is preferably identical to a mass ratio of the first emitting material to the first host material in the first emitting layer (first emitting material/first host material).

In the organic EL device according to the exemplary embodiment, a mass ratio of the second emitting material to the second host material in the second film (second emitting material/second host material) is preferably identical to a mass ratio of the second emitting material to the second host material in the second emitting layer (second emitting material/second host material).

In the organic EL device according to the exemplary embodiment, a content ratio of the first emitting material with respect to the total mass of the first host material in the first emitting layer (first emitting material/first host material) is preferably in a range from 0.5 mass % to 6 mass %, more preferably in a range from 1 mass % to 4 mass %.

In the organic EL device according to the exemplary embodiment, a content ratio of the first emitting material with respect to the total mass of the first host material in the first film (first emitting material/first host material) is preferably in a range from mass % to 6 mass %, more preferably in a range from 1 mass % to 4 mass %.

In the organic EL device according to the exemplary embodiment, a content ratio of the second emitting material with respect to the total mass of the second host material in the second emitting layer (second emitting material/second host material) is preferably in a range from 0.5 mass % to 6 mass %, more preferably in a range from 1 mass % to 4 mass %.

In the organic EL device according to the exemplary embodiment, a content ratio of the second emitting material with respect to the total mass of the second host material in the second film (second emitting material/second host material) is preferably in a range from 0.5 mass % to 6 mass %, more preferably in a range from 1 mass % to 4 mass %.

In the organic EL device according to the exemplary embodiment, when the first emitting layer and the second emitting layer are layered in this order from a side on which the anode is provided, an electron mobility of the first host material $\mu_{E1}$, a hole mobility of the first host material $\mu_{H1}$, an electron mobility of the second host material $\mu_{E2}$, and a hole mobility of the second host material pH2 preferably satisfy a formula (Numerical Formula 15) below.

$$(\mu_{E2}/\mu_{H2})>(\mu_{E1}/\mu_{H1}) \quad \text{(Numerical Formula 15)}$$

In the organic EL device according to the exemplary embodiment, when the first emitting layer and the second emitting layer are layered in this order from a side on which the anode is provided, the electron mobility of the first host material $\mu_{E1}$ and the electron mobility of the second host material $\mu_{E2}$ preferably satisfy a formula (Numerical Formula 16) below.

When the first host material and the second host material satisfy a relationship of the numerical formula (Numerical Formula 16), a recombination ability between holes and electrons in the first emitting layer is improved.

$$\mu E_2>\mu_{E1} \quad \text{(Numerical Formula 16)}$$

The electron mobility can be measured according to impedance spectroscopy.

A measurement target layer having a thickness in a range from 100 nm to 200 nm is held between the anode and the cathode, to which a small alternating voltage of 100 mV or less is applied while a bias DC voltage is applied. A value of an alternating current (absolute value and phase) which flows at this time is measured. This measurement is performed while changing a frequency of the alternating voltage, and complex impedance (Z) is calculated from the current value and the voltage value. A frequency dependency of the imaginary part (ImM) of the modulus M=iωZ (i: imaginary unit, ω: angular frequency) is obtained. The reciprocal number of a frequency ω at which the ImM becomes the maximum is defined as a response time of electrons carried in the measurement target layer. The electron mobility is calculated by the following equation.

$$\text{Electron Mobility}=(\text{Film Thickness of Measurement Target Layer})^2/(\text{Response Time}\cdot\text{Voltage})$$

The hole mobility can be measured according to impedance spectroscopy in a similar manner to the electron mobility.

The hole mobility is calculated by the following equation.

$$\text{Hole Mobility}=(\text{Film Thickness of Measurement Target Layer})^2/(\text{Response Time}\cdot\text{Voltage})$$

In the organic EL device according to the exemplary embodiment, the triplet energy of the first host material $T_1(H1)$ and the triplet energy of the second host material $T_1(H2)$ preferably satisfy a relationship of a numerical formula (Numerical Formula 5) below.

$$T_1(H1)-T_1(H2)>0.03\ \text{eV} \quad \text{(Numerical Formula 5)}$$

Herein, the "host material" refers to, for instance, a material that accounts for "50 mass % or more of the layer". That is, for instance, the first emitting layer contains mass % or more of the first host material with respect to the total mass of the first emitting layer. For instance, the second emitting layer contains 50 mass % or more of the second host material with respect to the total mass of the second emitting layer.

In the organic EL device according to the exemplary embodiment, the "first emitting material that emits light having a maximum peak wavelength of 500 nm or less" is preferably a material having a singlet energy $S_1$ smaller than a singlet energy $S_1$ of the first host material.

In the organic EL device according to the exemplary embodiment, the "second emitting material that emits light having a maximum peak wavelength of 500 nm or less" is preferably a material having a singlet energy $S_1$ smaller than a singlet energy $S_1$ of the second host material.

Emission Wavelength of Organic EL Device

The organic electroluminescence device of the exemplary embodiment preferably emits, when being driven, light whose maximum peak wavelength is 500 nm or less.

The organic electroluminescence device of the exemplary embodiment more preferably emits, when being driven, light whose maximum peak wavelength is in a range from 430 nm to 480 nm.

The maximum peak wavelength of the light emitted from the organic EL device when being driven is measured as follows. Voltage is applied to the organic EL device such that a current density becomes 10 mA/cm$^2$, where spectral radiance spectrum is measured by a spectroradiometer CS-2000 (produced by Konica Minolta, Inc.). A peak wavelength of an emission spectrum, at which the luminous intensity of the resultant spectral radiance spectrum is at the maximum, is measured and defined as a maximum peak wavelength (unit: nm).

First Emitting Layer

The first emitting layer contains the first host material and the first emitting material that emits light having a maximum peak wavelength of 500 nm or less. The first host material is a compound different from the second host material contained in the second emitting layer. The first emitting material contained in the first emitting layer is preferably a compound that emits fluorescence having a maximum peak wavelength of 500 nm or less.

In the organic EL device according to the exemplary embodiment, the first emitting material is preferably a compound containing no azine ring structure in a molecule thereof.

In the organic EL device according to the exemplary embodiment, the first emitting material is preferably not a boron-containing complex, more preferably not a complex.

In the organic EL device according to the exemplary embodiment, the first emitting layer preferably does not contain a metal complex. In the organic EL device according to the exemplary embodiment, the first emitting layer also preferably does not contain a boron-containing complex.

In the organic EL device according to the exemplary embodiment, the first emitting layer preferably does not contain a phosphorescent material (dopant material).

Further, the first emitting layer preferably does not contain a heavy-metal complex and a phosphorescent rare earth metal complex. Examples of the heavy-metal complex herein include iridium complex, osmium complex, and platinum complex.

A method of measuring the maximum peak wavelength of the compound (emitting material) is as follows. A toluene solution of a measurement target compound at a concentration of 5 μmol/L is prepared and put in a quartz cell. An emission spectrum (ordinate axis: luminous intensity, abscissa axis: wavelength) of this sample is measured at a normal temperature (300K). The emission spectrum can be measured using a spectrophotometer (machine name: F-7000) produced by Hitachi High-Tech Science Corporation. It should be noted that the machine for measuring the emission spectrum is not limited to the machine used herein.

A peak wavelength of the emission spectrum exhibiting a maximum luminous intensity is defined as the maximum peak wavelength.

In an emission spectrum of the compound, where a peak exhibiting the maximum luminous intensity is defined as a maximum peak and a height of the maximum peak is defined as 1, heights of other peaks appearing in the emission spectrum are preferably less than 0.6. It should be noted that the peaks in the emission spectrum are defined as local maximum values.

Moreover, in the emission spectrum of the compound, the number of peaks is preferably less than three.

The organic EL device of the exemplary embodiment preferably emits, when being driven, light whose maximum peak wavelength is 500 nm or less.

The maximum peak wavelength of the light emitted from the emitting layer when the device is driven is measured as follows.

Maximum Peak Wavelength λp of Light Emitted from Emitting Layer when Organic EL Device is Driven For a maximum peak wavelength $\lambda p_1$ of light emitted from the first emitting layer when the organic EL device is driven, the organic EL device is produced by using the material of the first emitting layer for the first emitting layer and the second emitting layer, and voltage is applied to the organic EL device so that a current density becomes 10 $mA/cm^2$, where spectral radiance spectrum is measured by a spectroradiometer CS-2000 (produced by Konica Minolta, Inc.). The maximum peak wavelength $\lambda p_1$ (unit: nm) is calculated from the obtained spectral radiance spectrum.

For a maximum peak wavelength $\lambda p_2$ of light emitted from the second emitting layer when the organic EL device is driven, the organic EL device is produced by using the same material of the second emitting layer for the first emitting layer and the second emitting layer, and voltage is applied to the organic EL device so that a current density becomes 10 $mA/cm^2$, where spectral radiance spectrum is measured by a spectroradiometer CS-2000 (produced by Konica Minolta, Inc.). The maximum peak wavelength $\lambda p_2$ (unit: nm) is calculated from the obtained spectral radiance spectrum.

In the organic EL device of the exemplary embodiment, a singlet energy of the first host material $S_1(H1)$ and a singlet energy of the first emitting material $S_1(D1)$ preferably satisfy a relationship of a numerical formula (Numerical Formula 2) below.

$$S_1(H1) > S_1(D1) \quad \text{(Numerical Formula 2)}$$

The singlet energy $S_1$ means an energy difference between the lowest singlet state and the ground state.

When the first host material and the first emitting material satisfy the relationship of the numerical formula (Numerical Formula 2), singlet excitons generated on the first host material easily transfer from the first host material to the first emitting material, thereby contributing to emission (preferably fluorescence) of the first emitting material.

In the organic EL device of the exemplary embodiment, the triplet energy of the first host material $T_1(H1)$ and a triplet energy of the first emitting material $T_1(D1)$ preferably satisfy a relationship of a numerical formula (Numerical Formula 2A) below.

$$T_1(D1) > T_1(H1) \quad \text{(Numerical Formula 2A)}$$

When the first host material and the first emitting material satisfy the relationship of the numerical formula (Numerical Formula 2A), triplet excitons generated in the first emitting layer transfer not onto the first emitting material having higher triplet energy but onto the first host material, thereby easily transferring to the second emitting layer.

The organic EL device of the exemplary embodiment preferably satisfies a numerical formula (Numerical Formula 2B) below.

$$T_1(D1) > T_1(H1) > T_1(H2) \quad \text{(Numerical Formula 2B)}$$

Triplet Energy $T_1$

A method of measuring a triplet energy $T_1$ is exemplified by a method below.

A measurement target compound is dissolved in EPA (diethylether:isopentane:ethanol=5:5:2 in volume ratio) so as to fall within a range from $10^{-5}$ mol/L to $10^{-4}$ mol/L, and the obtained solution is encapsulated in a quartz cell to provide a measurement sample. A phosphorescence spectrum (ordinate axis: phosphorescent luminous intensity, abscissa axis: wavelength) of the measurement sample is measured at a low temperature (77K). A tangent is drawn to the rise of the phosphorescence spectrum close to the short-wavelength region. An energy amount is calculated by a conversion equation (F1) below on a basis of a wavelength value fledge [nm] at an intersection of the tangent and the abscissa axis. The calculated energy amount is defined as triplet energy $T_1$.

$$T_1\,[\text{eV}] = 1239.85/\lambda_{edge} \quad \text{Conversion Equation (F1):}$$

The tangent to the rise of the phosphorescence spectrum close to the short-wavelength region is drawn as follows. While moving on a curve of the phosphorescence spectrum from the short-wavelength region to the local maximum value closest to the short-wavelength region among the local maximum values of the phosphorescence spectrum, a tangent is checked at each point on the curve toward the long-wavelength of the phosphorescence spectrum. An inclination of the tangent is increased along the rise of the curve (i.e., a value of the ordinate axis is increased). A tangent drawn at a point of the local maximum inclination (i.e., a tangent at an inflection point) is defined as the tangent to the rise of the phosphorescence spectrum close to the short-wavelength region.

A local maximum point where a peak intensity is 15% or less of the maximum peak intensity of the spectrum is not counted as the above-mentioned local maximum peak intensity closest to the short-wavelength region. The tangent drawn at a point that is closest to the local maximum peak intensity closest to the short-wavelength region and where the inclination of the curve is the local maximum is defined as a tangent to the rise of the phosphorescence spectrum close to the short-wavelength region.

For phosphorescence measurement, a spectrophotofluorometer body F-4500 (manufactured by Hitachi High-Technologies Corporation) is usable. Any device for phosphorescence measurement is usable. A combination of a cooling unit, a low temperature container, an excitation light source and a light-receiving unit may be used for phosphorescence measurement.

Singlet Energy $S_1$

A method of measuring the singlet energy $S_1$ with use of a solution (occasionally referred to as a solution method) is exemplified by a method below.

A toluene solution of a measurement target compound at a concentration ranging from 10-5 mol/L to $10^{-4}$ mol/L is prepared and put in a quartz cell. An absorption spectrum (ordinate axis: absorption intensity, abscissa axis: wavelength) of the thus-obtained sample is measured at a normal temperature (300K). A tangent is drawn to the fall of the absorption spectrum close to the long-wavelength region, and a wavelength value fledge (nm) at an intersection of the tangent and the abscissa axis is assigned to a conversion equation (F2) below to calculate the singlet energy.

$$S_1\ [\text{eV}]=1239.8/\lambda_{edge} \qquad \text{Conversion Equation (F2):}$$

Any device for measuring absorption spectrum is usable. For instance, a spectrophotometer (U3310 manufactured by Hitachi, Ltd.) is usable.

The tangent to the fall of the absorption spectrum close to the long-wavelength region is drawn as follows. While moving on a curve of the absorption spectrum from the local maximum value closest to the long-wavelength region, among the local maximum values of the absorption spectrum, in a long-wavelength direction, a tangent at each point on the curve is checked. An inclination of the tangent is decreased and increased in a repeated manner as the curve falls (i.e., a value of the ordinate axis is decreased). A tangent drawn at a point where the inclination of the curve is the local minimum closest to the long-wavelength region (except when absorbance is 0.1 or less) is defined as the tangent to the fall of the absorption spectrum close to the long-wavelength region.

The local maximum absorbance of 0.2 or less is not counted as the above-mentioned local maximum absorbance closest to the long-wavelength region.

In the organic EL device of the exemplary embodiment, the first emitting material is preferably contained at more than 1.1 mass % in the first emitting layer. Specifically, the first emitting layer preferably contains the first emitting material at more than 1.1 mass % with respect to the total mass of the first emitting layer, more preferably at 1.2 mass % or more with respect to the total mass of the first emitting layer, and still more preferably at 1.5 mass % or more with respect to the total mass of the first emitting layer.

The first emitting layer preferably contains the first emitting material at 10 mass % or less with respect to the total mass of the first emitting layer, more preferably at 7 mass % or less with respect to the total mass of the first emitting layer, and still more preferably at 5 mass % or less with respect to the total mass of the first emitting layer.

In the organic EL device of the exemplary embodiment, the first emitting layer preferably contains a first compound as the first host material at 60 mass % or more, more preferably at 70 mass % or more, still more preferably at 80 mass % or more, still further more preferably at 90 mass % or more, and yet still further more preferably at 95 mass % or more, with respect to the total mass of the first emitting layer. The first emitting layer preferably contains the first host material at 99 mass % or less with respect to the total mass of the first emitting layer.

The upper limit of a total of the content ratios of the first host material and the first emitting material is 100 mass %.

In the exemplary embodiment, the first emitting layer may further contain any other material than the first host material and the first emitting material.

The first emitting layer may contain a single type of the first host material or may contain two or more types of the first host material. The first emitting layer may contain a single type of the first emitting material or may contain two or more types of the first emitting material.

In the organic EL device according to the exemplary embodiment, the film thickness of the first emitting layer is preferably 3 nm or more, more preferably 5 nm or more. A film thickness of the first emitting layer of 3 nm or more is sufficient for causing recombination of holes and electrons in the first emitting layer.

In the organic EL device according to the exemplary embodiment, the film thickness of the first emitting layer is preferably 15 nm or less, more preferably 10 nm or less. A film thickness of the first emitting layer of 15 nm or less is thin enough for transfer of triplet excitons to the second emitting layer.

In the organic EL device according to the exemplary embodiment, the film thickness of the first emitting layer is more preferably in a range from 3 nm to 15 nm.

Second Emitting Layer

The second emitting layer contains the second host material and the second emitting material that emits light having a maximum peak wavelength of 500 nm or less. The second host material is a compound different from the first host material contained in the first emitting layer. The second emitting material contained in the second emitting layer is preferably a compound that emits fluorescence having a maximum peak wavelength of 500 nm or less.

In the organic EL device of the exemplary embodiment, the second emitting layer preferably emits, when the device is driven, light whose maximum peak wavelength is 500 nm or less.

In the organic EL device according to the exemplary embodiment, the second emitting material preferably has a full width at half maximum in a range from 1 nm to 20 nm at a maximum peak.

In the organic EL device according to the exemplary embodiment, a Stokes shift of the second emitting material preferably exceeds 7 nm.

When the Stokes shift of the second emitting material exceeds 7 nm, a decrease in the luminous efficiency due to self-absorption is easily inhibited.

The self-absorption is a phenomenon in which emitted light is absorbed by the same compound to reduce luminous efficiency. The self-absorption is notably observed in a compound having a small Stokes shift (i.e., a large overlap between an absorption spectrum and a fluorescence spectrum). Accordingly, in order to reduce the self-absorption, it is preferable to use a compound having a large Stokes shift (i.e., a small overlap between the absorption spectrum and the fluorescence spectrum). The Stokes shift can be measured by a method described in Examples.

In the organic EL device according to the exemplary embodiment, a triplet energy of the second emitting material $T_1(D2)$ and the triplet energy of the second host material $T_1(H2)$ preferably satisfy a relationship of a numerical formula (Numerical Formula 3) below.

$$T_1(D2)>T_1(H2) \qquad \text{(Numerical Formula 3)}$$

In the organic EL device according to the exemplary embodiment, when the second emitting material and the second host material satisfy the relationship of the numerical formula (Numerical Formula 3), in transfer of triplet excitons generated in the first emitting layer to the second emitting layer, the triplet excitons energy-transfer not onto the second emitting material having higher triplet energy but onto molecules of the second host material. In addition, triplet excitons generated by recombination of holes and electrons on the second host material do not transfer to the second emitting material having higher triplet energy. Triplet excitons generated by recombination on molecules of the second emitting material quickly energy-transfer to molecules of the second host material.

In the organic EL device of the exemplary embodiment, a singlet energy of the second host material $S_1$ (H2) and a singlet energy of the second emitting material $S_1$(D2) preferably satisfy a relationship of a numerical formula (Numerical Formula 4) below.

$$S_1(H2)>S_1(D2) \quad \text{(Numerical Formula 4)}$$

In the organic EL device according to the exemplary embodiment, when the second emitting material and the second host material satisfy the relationship of the numerical formula (Numerical formula 4), due to the singlet energy of the second emitting material being smaller than the singlet energy of the second host material, singlet excitons generated by the TTF phenomenon energy-transfer from the second host material to the second emitting material, thereby contributing to emission (preferably fluorescence) of the second emitting material.

In the organic EL device according to the exemplary embodiment, the second emitting material is preferably a compound containing no azine ring structure in a molecule thereof.

In the organic EL device according to the exemplary embodiment, the second emitting material is preferably not a boron-containing complex, more preferably not a complex.

In the organic EL device according to the exemplary embodiment, the second emitting layer preferably does not contain a metal complex. In the organic EL device according to the exemplary embodiment, the second emitting layer also preferably does not contain a boron-containing complex.

In the organic EL device according to the exemplary embodiment, the second emitting layer preferably does not contain a phosphorescent material (dopant material).

Further, the second emitting layer preferably does not contain a heavy-metal complex and a phosphorescent rare earth metal complex. Examples of the heavy-metal complex herein include iridium complex, osmium complex, and platinum complex.

In the organic EL device of the exemplary embodiment, the second emitting material is preferably contained at more than 1.1 mass % in the second emitting layer. Specifically, the second emitting layer preferably contains the second emitting material at more than 1.1 mass % with respect to the total mass of the second emitting layer, more preferably at 1.2 mass % or more with respect to the total mass of the second emitting layer, and still more preferably at 1.5 mass % or more with respect to the total mass of the second emitting layer.

The second emitting layer preferably contains the second emitting material at 10 mass % or less with respect to the total mass of the second emitting layer, more preferably at 7 mass % or less with respect to the total mass of the second emitting layer, and still more preferably at 5 mass % or less with respect to the total mass of the second emitting layer.

The second emitting layer contains a second compound as the second host material preferably at 60 mass % or more, more preferably at 70 mass % or more, still more preferably at 80 mass % or more, still further more preferably at 90 mass % or more, and yet still further more preferably at 95 mass % or more, with respect to the total mass of the second emitting layer.

The second emitting layer preferably contains the second host material at 99 mass % or less with respect to the total mass of the second emitting layer.

The upper limit of a total of the content ratios of the second host material and the second emitting material is 100 mass %.

In the exemplary embodiment, the second emitting layer may further contain any other material than the second host material and the second emitting material. The second emitting layer may contain a single type of the second host material or may contain two or more types of the second host material. The second emitting layer may contain a single type of the second emitting material or may contain two or more types of the second emitting material.

In the organic EL device according to the exemplary embodiment, the film thickness of the second emitting layer is preferably 5 nm or more, more preferably 15 nm or more. When the film thickness of the second emitting layer is 5 nm or more, it is easy to inhibit triplet excitons having transferred from the first emitting layer to the second emitting layer from returning to the first emitting layer. Further, when the film thickness of the second emitting layer is 5 nm or more, triplet excitons can be sufficiently separated from the recombination portion in the first emitting layer.

In the organic EL device according to the exemplary embodiment, the film thickness of the second emitting layer is preferably 20 nm or less. When the film thickness of the second emitting layer is 20 nm or less, a density of the triplet excitons in the second emitting layer is improved to cause the TTF phenomenon more easily.

In the organic EL device according to the exemplary embodiment, the film thickness of the second emitting layer is preferably in a range from 5 nm to 20 nm.

In the organic EL device according to the exemplary embodiment, a triplet energy of the first emitting material contained in the first emitting layer or the second emitting material contained in the second emitting layer $T_1$(DX) and the triplet energy of the first host material $T_1$(H1) preferably satisfy a relationship of a numerical formula (Numerical Formula 11) below.

$$\text{eV}<T_1(DX)-T_1(H1)<0.6\ \text{eV} \quad \text{(Numerical Formula 11)}$$

The triplet energy of the first emitting material $T_1$(D1) preferably satisfies a relationship of a numerical formula (Numerical Formula 11A) below.

$$\text{eV}<T_1(D1)-T_1(H1)<0.6\ \text{eV} \quad \text{(Numerical Formula 11A)}$$

The triplet energy of the second emitting material $T_1$(D2) preferably satisfies a relationship of a numerical formula (Numerical Formula 11B) below.

$$0\ \text{eV}<T_1(D2)-T_1(H2)<0.8\ \text{eV} \quad \text{(Numerical Formula 11B)}$$

In the organic EL device of the exemplary embodiment, the triplet energy of the first host material $T_1$(H1) preferably satisfies a relationship of a numerical formula (Numerical Formula 12) below.

$$T_1(H1)>2.0\ \text{eV} \quad \text{(Numerical Formula 12)}$$

In the organic EL device according to the exemplary embodiment, the triplet energy of the first host material $T_1(H1)$ also preferably satisfies a relationship of a numerical formula (Numerical Formula 12A) below, or also preferably satisfies a relationship of a numerical formula (Numerical Formula 12B) below.

$$T_1(H1)>2.10\ \text{eV} \quad \text{(Numerical Formula 12A)}$$

$$T_1(H1)>2.15\ \text{eV} \quad \text{(Numerical Formula 12B)}$$

In the organic EL device according to the exemplary embodiment, when the triplet energy of the first host material $T_1(H1)$ satisfies the relationship of the numerical formula (Numerical Formula 12A) or the numerical formula (Numerical Formula 12B), triplet excitons generated in the first emitting layer easily transfer to the second emitting layer, and also are easily inhibited from back-transferring from the second emitting layer to the first emitting layer. Consequently, singlet excitons are efficiently generated in the second emitting layer, thereby improving luminous efficiency.

In the organic EL device according to the exemplary embodiment, the triplet energy of the first host material $T_1(H1)$ also preferably satisfies a relationship of a numerical formula (Numerical Formula 12C) below, or also preferably satisfies a relationship of a numerical formula (Numerical Formula 12D) below.

$$2.08\ \text{eV}>(H1)>1.87\ \text{eV} \quad \text{(Numerical Formula 12C)}$$

$$2.05\ \text{eV}>(H1)>1.90\ \text{eV} \quad \text{(Numerical Formula 12D)}$$

In the organic EL device according to the exemplary embodiment, when the triplet energy of the first host material $T_1(H1)$ satisfies the relationship of the numerical formula (Numerical Formula 12C) or the numerical formula (Numerical Formula 12D), energy of the triplet excitons generated in the first emitting layer is reduced, so that the organic EL device is expected to have a long lifetime.

In the organic EL device of the exemplary embodiment, the triplet energy of the second host material $T_1(H2)$ preferably satisfies a relationship of a numerical formula (Numerical Formula 13) below.

$$T_1(H2)\geq 1.9\ \text{eV} \quad \text{(Numerical Formula 13).}$$

Preferable Combinations Between First Host Material, First Emitting Material, Second Host Material, and Second Emitting Material In the organic EL device according to the exemplary embodiment, any combination between the first host material, the first emitting material, the second host material, and the second emitting material is usable, provided that the combination is a combination (a) in which the materials satisfy the relationships of Numerical Formula 1, Numerical Formula 20, and Numerical Formula 30 or a combination (b) in which the materials satisfy the relationship of Numerical Formula 1 and the requirement "an overlap integral of the photoluminescence spectra of 99.0% or more". For instance, combinations shown Tables 1 to 7 below are suitably usable.

TABLE 1
| BH1 | BD1 | BH2 | BD2 | ΔFWHM | Δpeak |
|---|---|---|---|---|---|
| 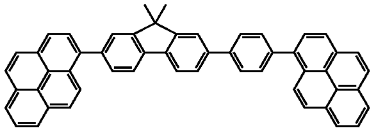 | 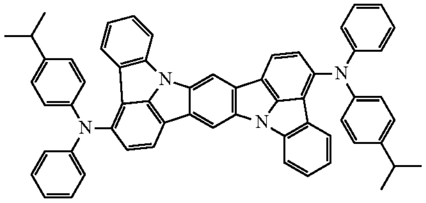 | 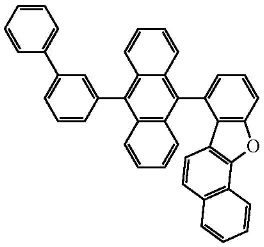 | 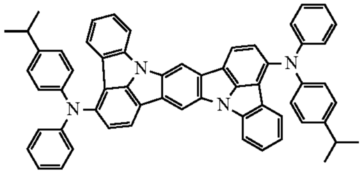 | 2 | 3 |
| 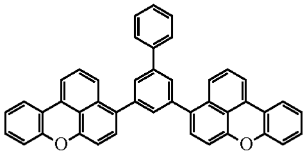 | 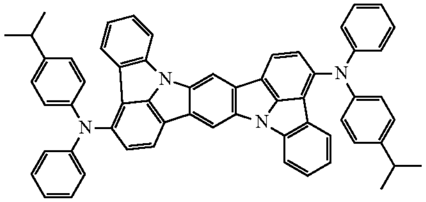 | 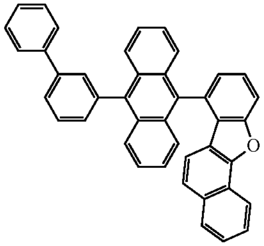 | 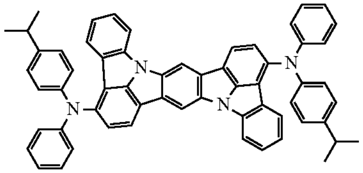 | 2 | 2 |
| 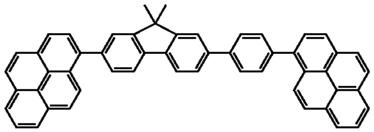 | 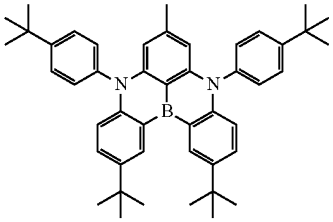 | 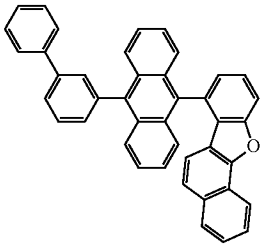 | 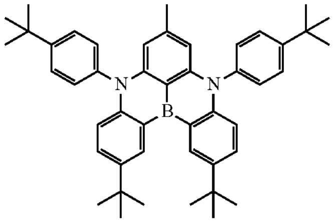 | 2 | 2 |

TABLE 1-continued
| BH1 | BD1 | BH2 | BD2 | ΔFWHM | Δpeak |
|---|---|---|---|---|---|
| 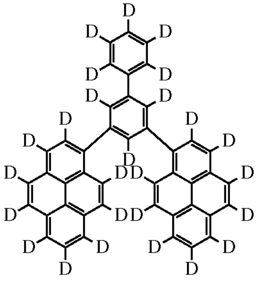 | 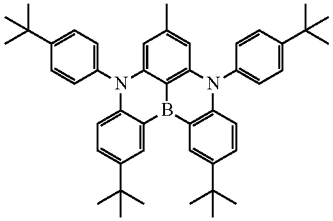 | 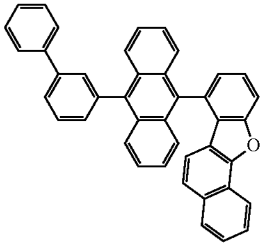 | 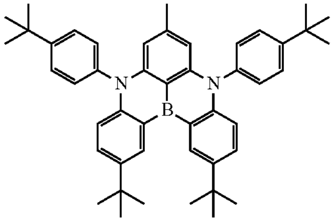 | 1 | 2 |
| 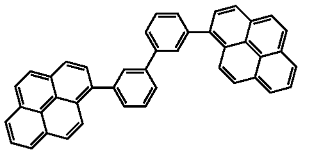 | 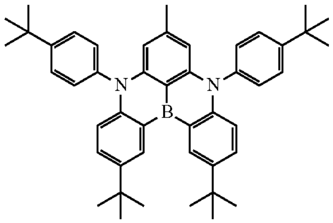 | 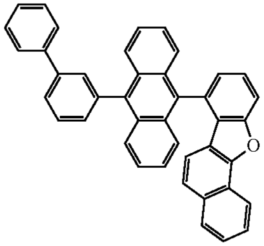 | 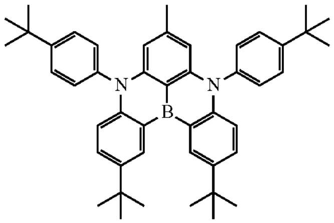 | 1 | 1 |
| 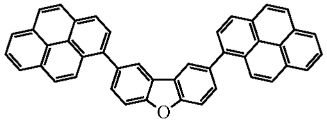 | 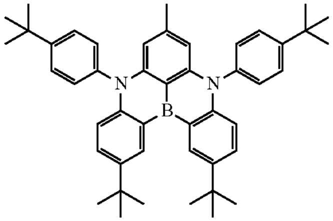 | 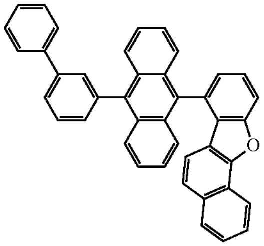 | 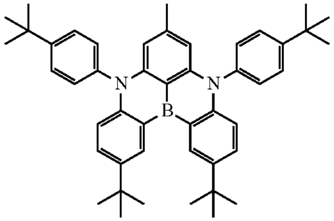 | 2 | 1 |
| 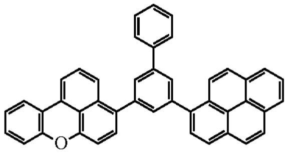 | 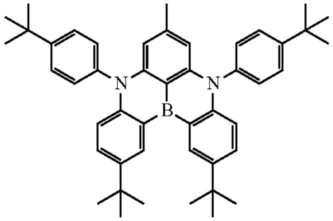 | 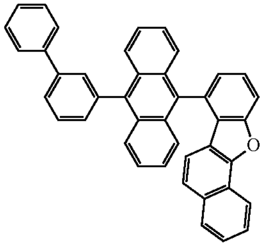 | 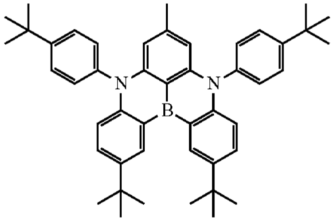 | 1 | 0 |

TABLE 1-continued
| BH1 | BD1 | BH2 | BD2 | ΔFWHM | Δpeak |
|---|---|---|---|---|---|
| 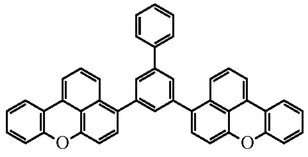 | 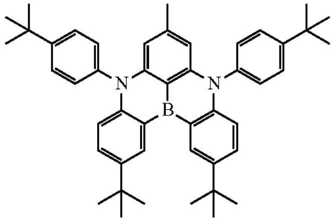 | 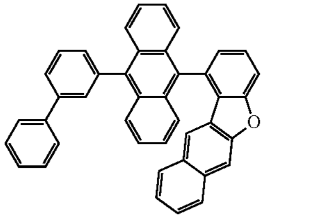 | 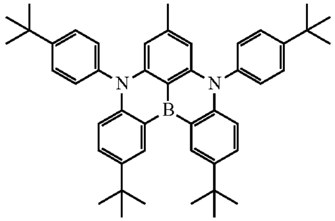 | 1 | 0 |
| 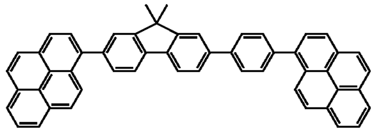 | 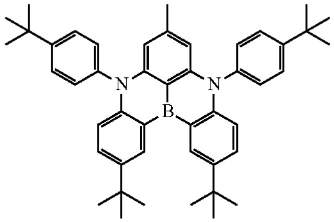 | 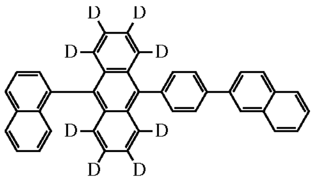 | 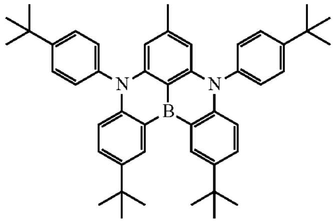 | 2 | 1 |

TABLE 2
| BH1 | BD1 |
|---|---|
| 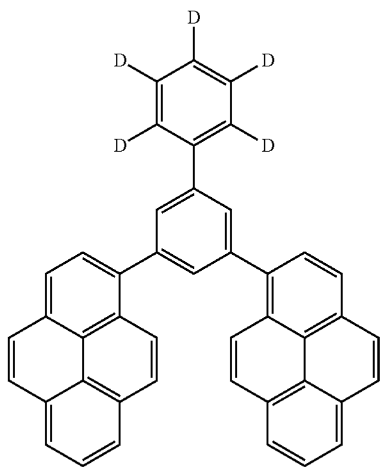 | 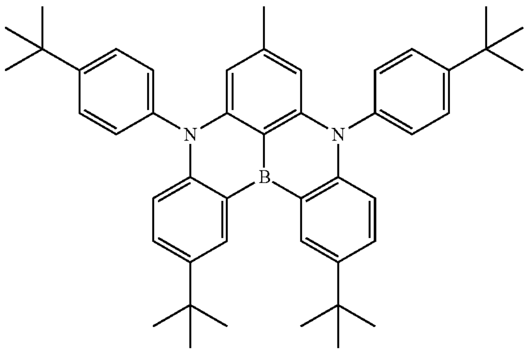 |
| 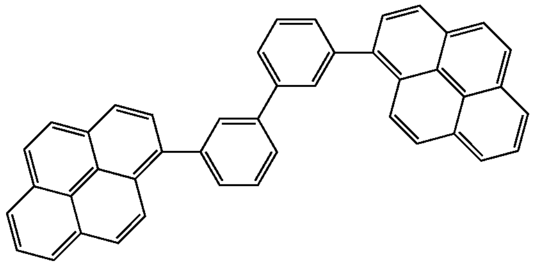 | 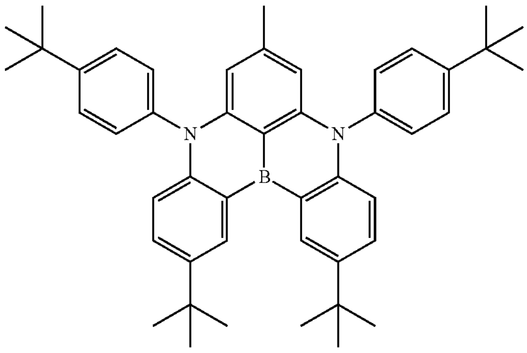 |
| 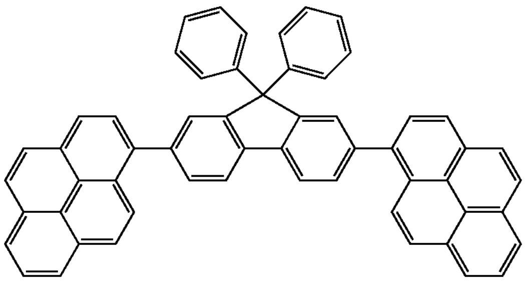 | 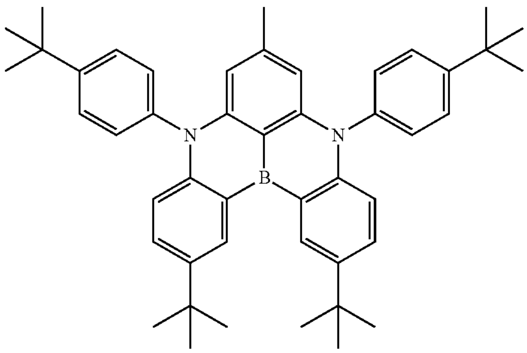 |
| 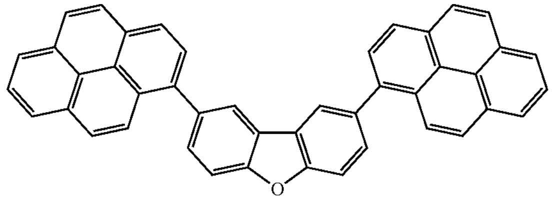 | 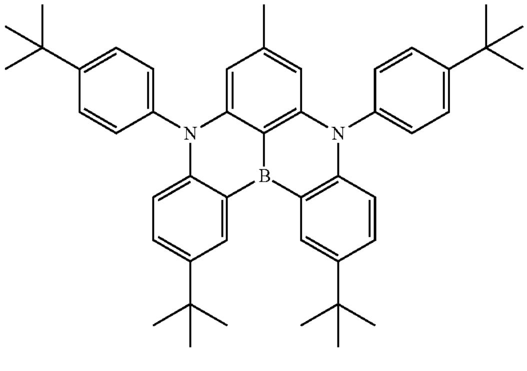 |

TABLE 2-continued
| | |
|---|---|
| 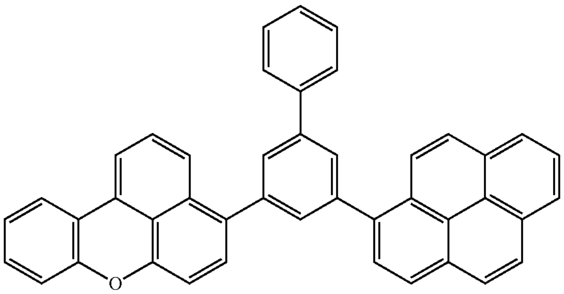 | 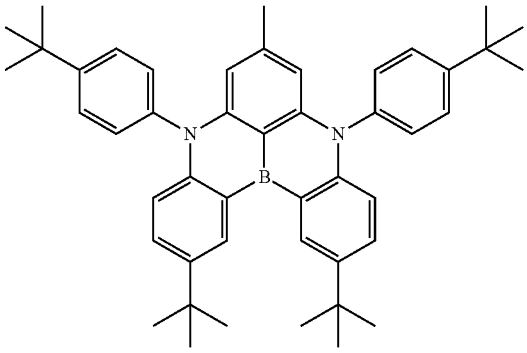 |
| 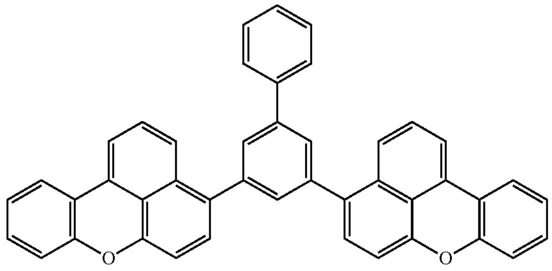 | 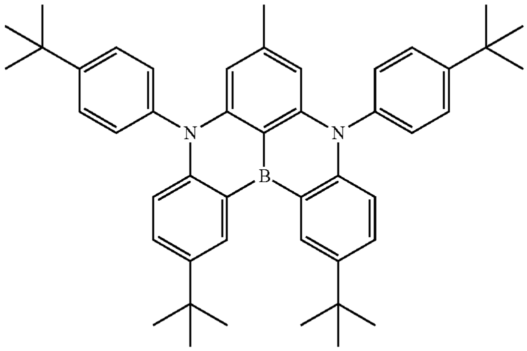 |
| 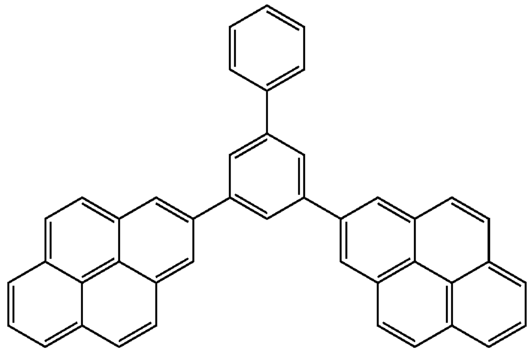 | 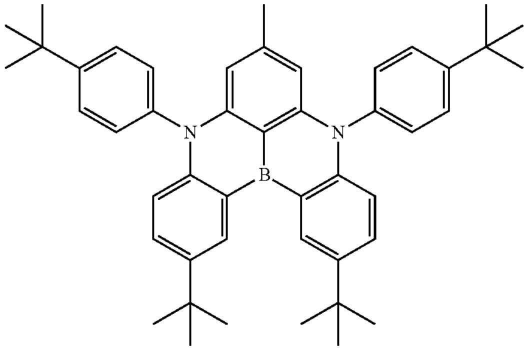 |
| 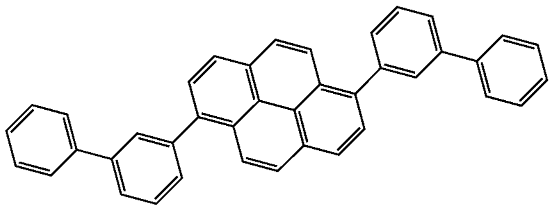 | 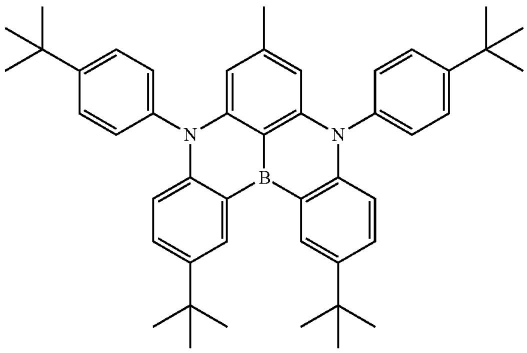 |

TABLE 2-continued
| | |
|---|---|
| 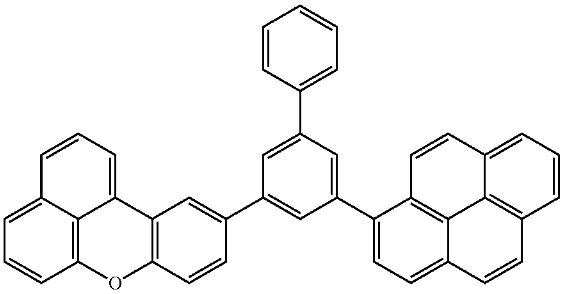 | 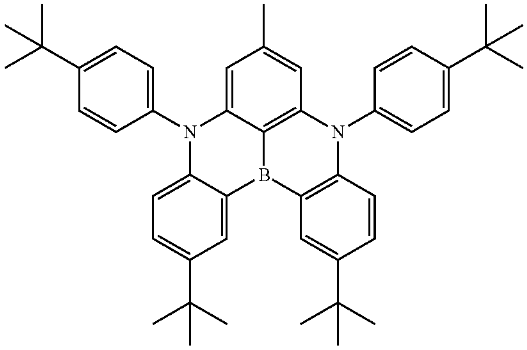 |
| BH2 | BD2 | ΔFWHM | Δpeak |
|---|---|---|---|
| 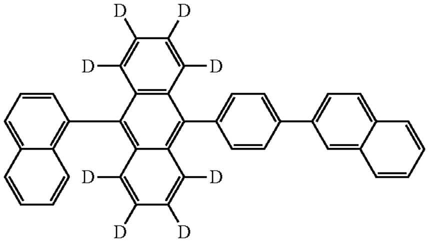 | 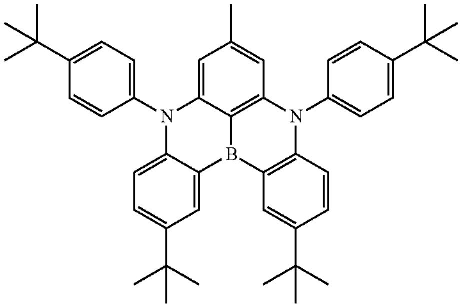 | 2 | 0 |
| 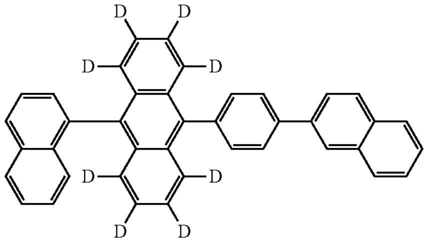 | 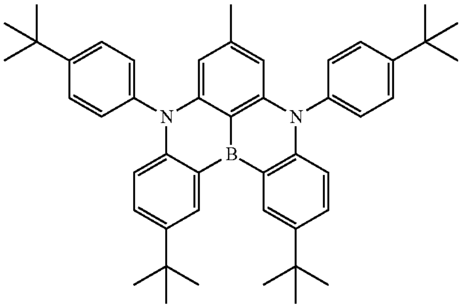 | 1 | 0 |
| 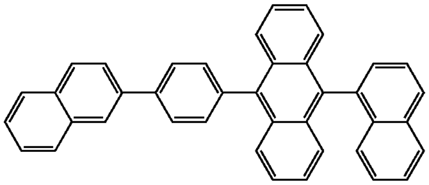 | 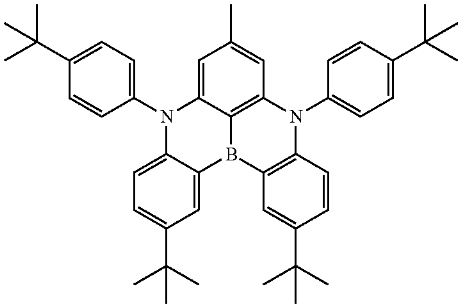 | 2 | 3 |
| 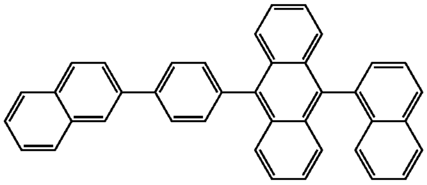 | 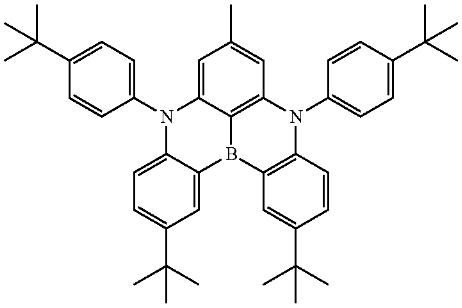 | 2 | 0 |

TABLE 2-continued
| | | | |
|---|---|---|---|
| 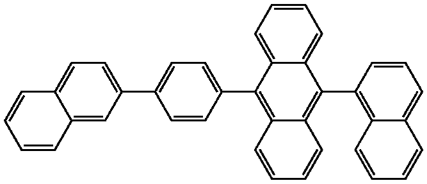 | 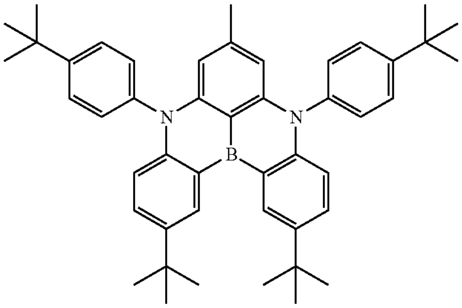 | 1 | 1 |
| 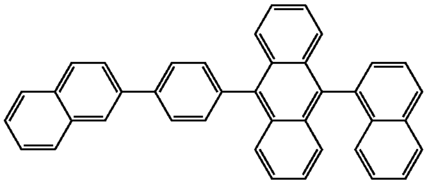 | 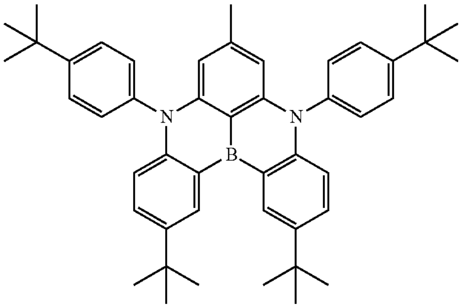 | 1 | 1 |
| 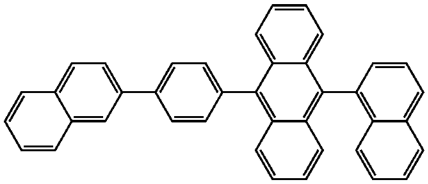 | 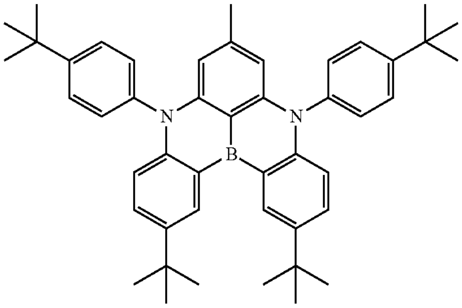 | 1 | 0 |
| 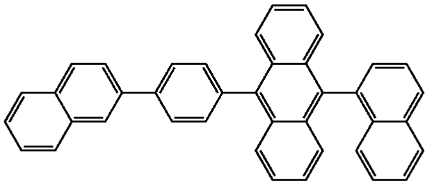 | 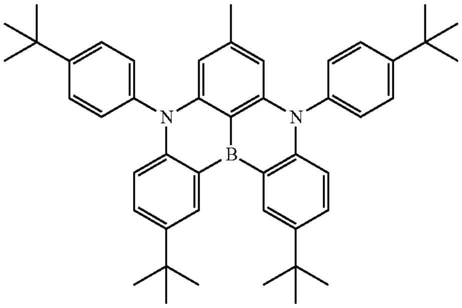 | 0 | 1 |
| 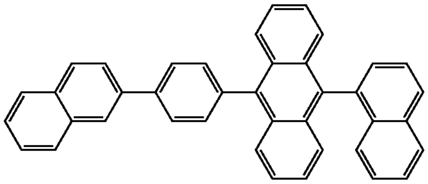 | 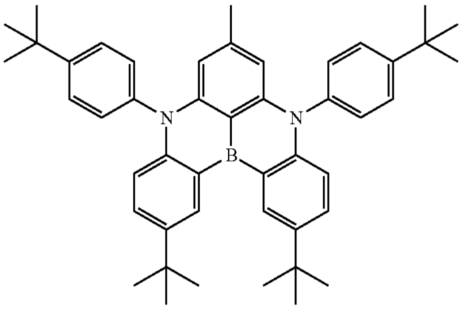 | 1 | 1 |

TABLE 3
| BH1 | BD1 | BH2 |
|---|---|---|
| 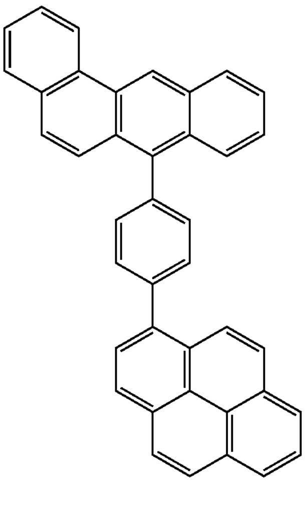 | 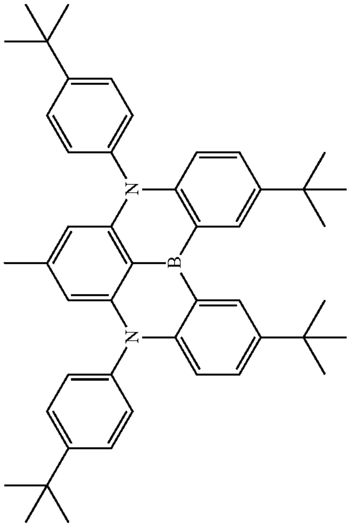 | 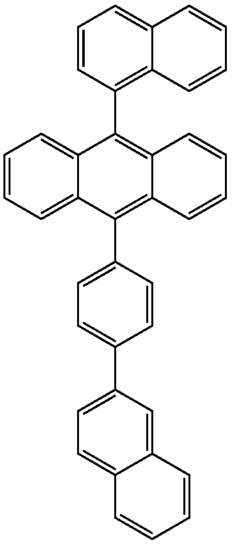 |
| 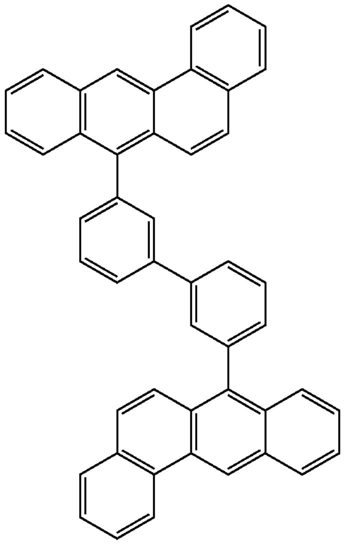 | 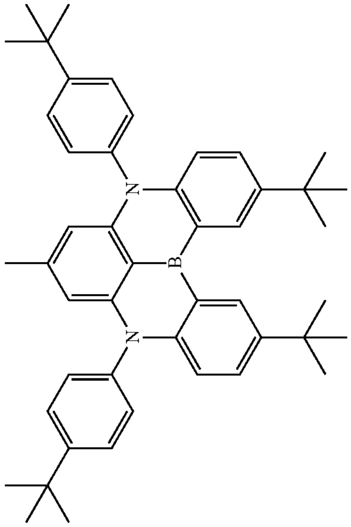 | 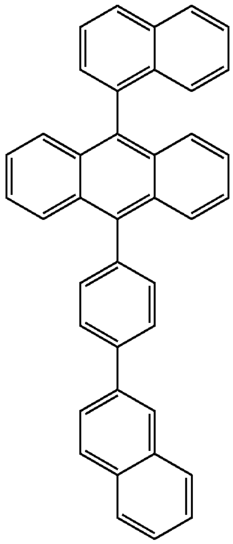 |

TABLE 3-continued
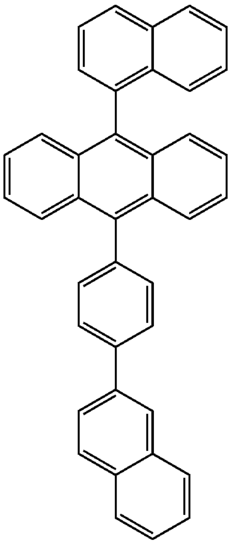
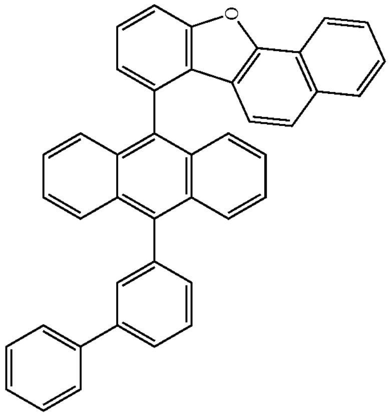
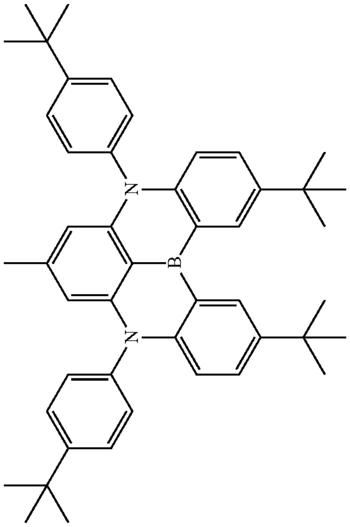
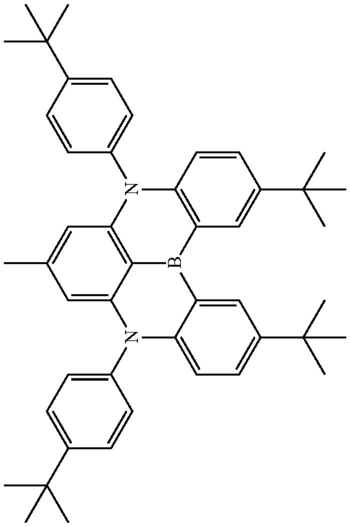
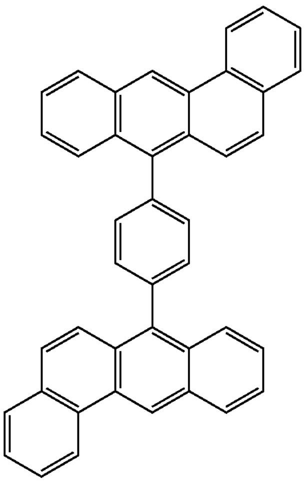
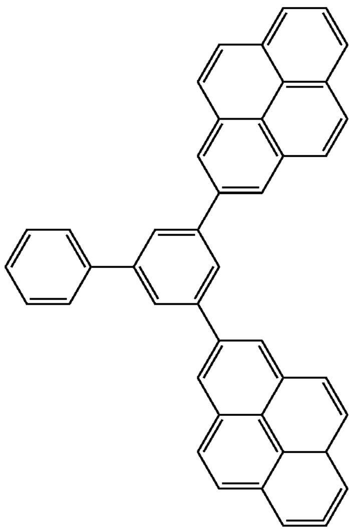

TABLE 3-continued
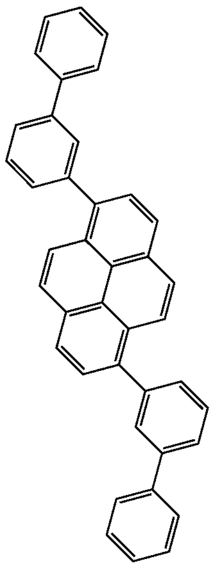
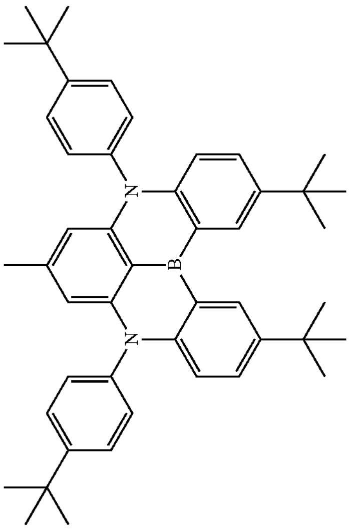
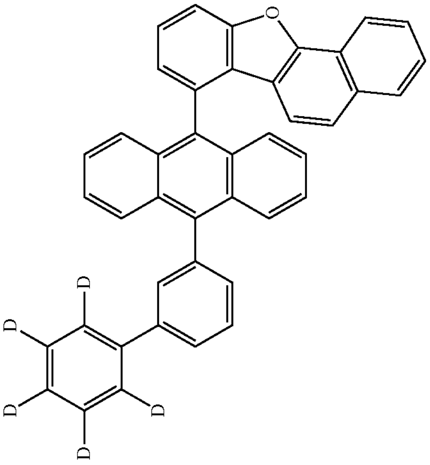
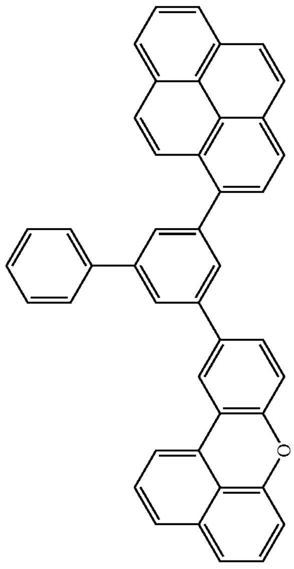
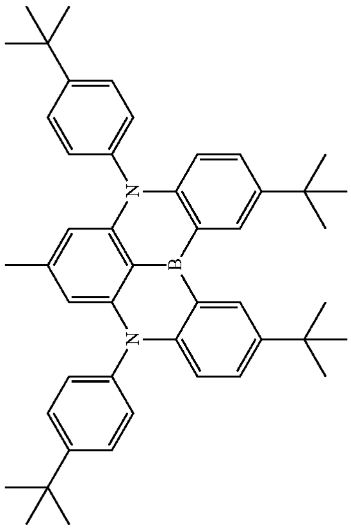
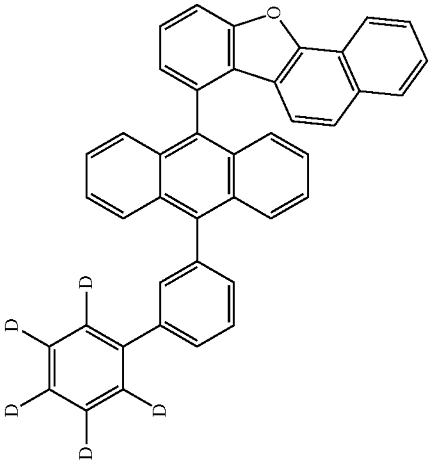

TABLE 3-continued
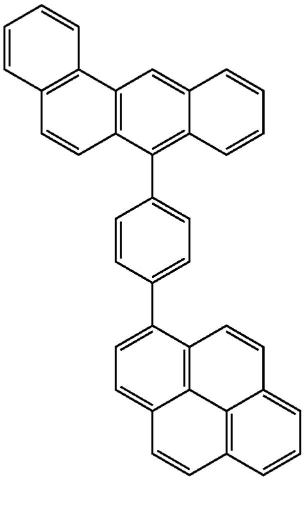
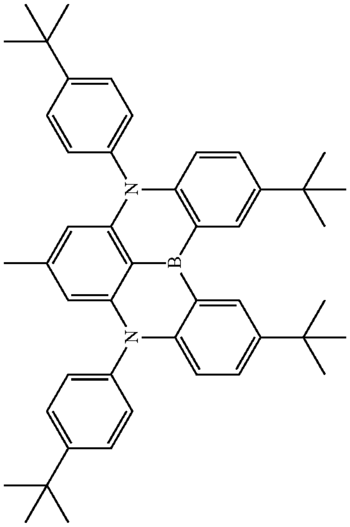
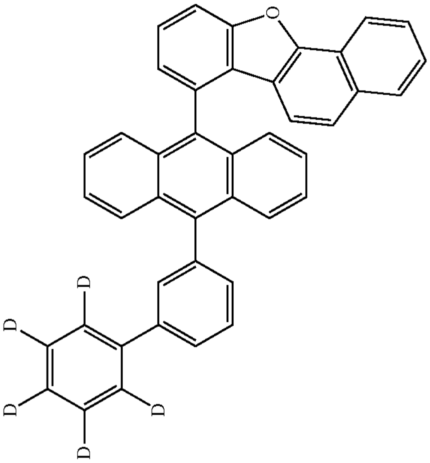
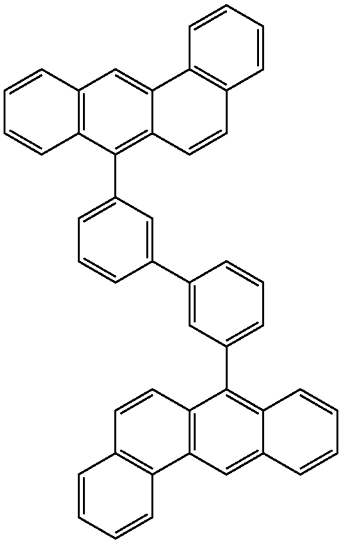
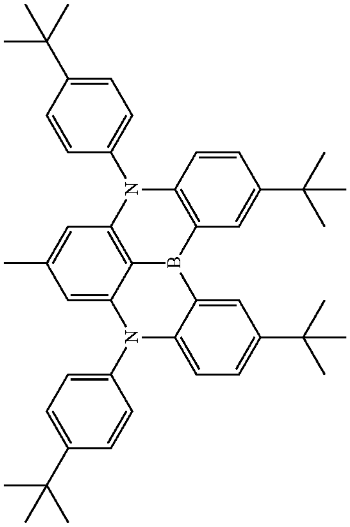
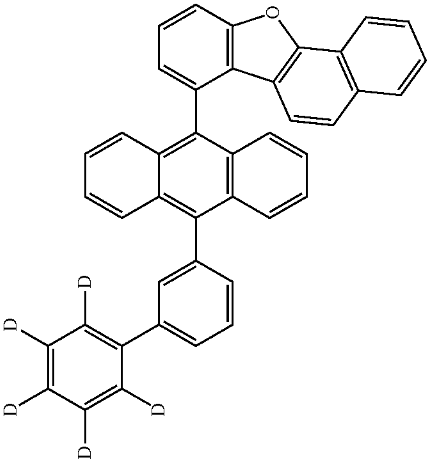

TABLE 3-continued
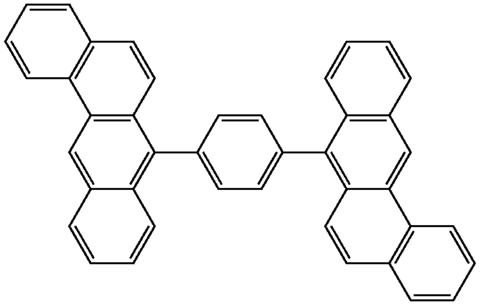 [SMILES: c1ccc2c(-c3ccc(-c4c5ccccc5cc5c4ccc4ccccc45)cc3)c3ccc4ccccc4c3cc2c1] 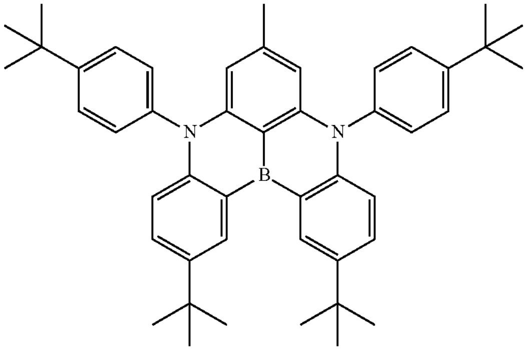 [SMILES: Cc1cc2c3c(c1)N(c1ccc(C(C)(C)C)cc1)c1ccc(C(C)(C)C)cc1B3c1cc(C(C)(C)C)ccc1N2c1ccc(C(C)(C)C)cc1] 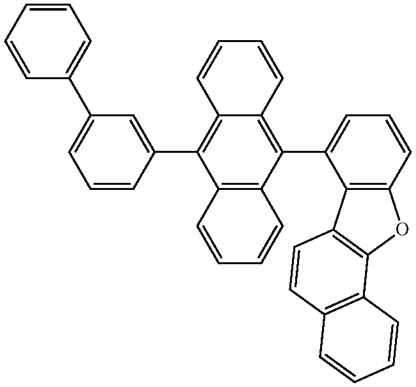 [SMILES: c1ccc(-c2cccc(-c3c4ccccc4c(-c4cccc5oc6c7ccccc7ccc6c45)c4ccccc34)c2)cc1]
| | BD2 | ΔFWHM | Δpeak |
|---|---|---|---|
| | 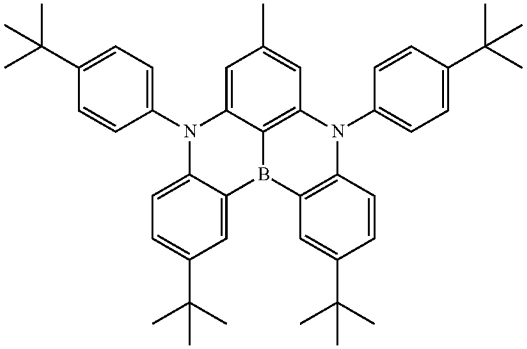 | 1 | 0 |

TABLE 3-continued
| | | |
|---|---|---|
| 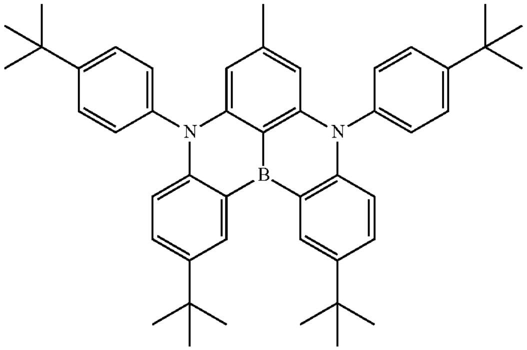 | 1 | 0 |
| 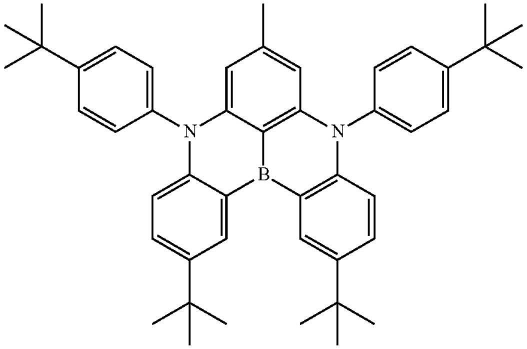 | 1 | 1 |
| 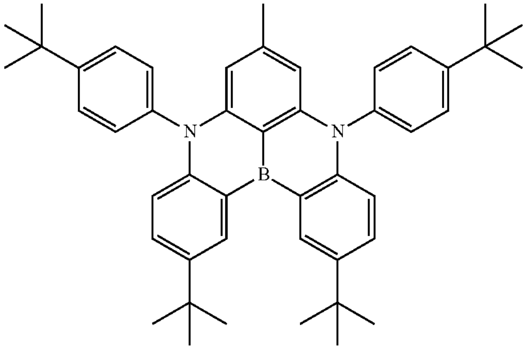 | 1 | 1 |

TABLE 3-continued
| | | |
|---|---|---|
| 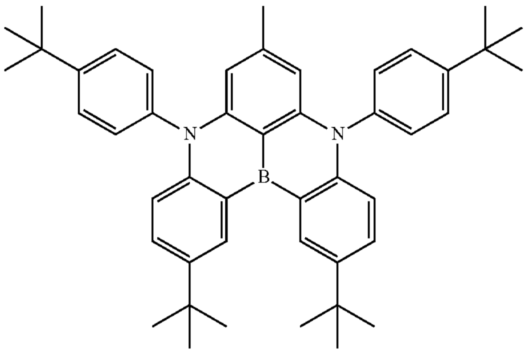 | 0 | 0 |
| 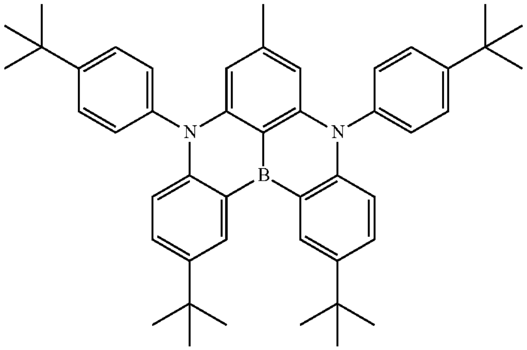 | 1 | 0 |
| 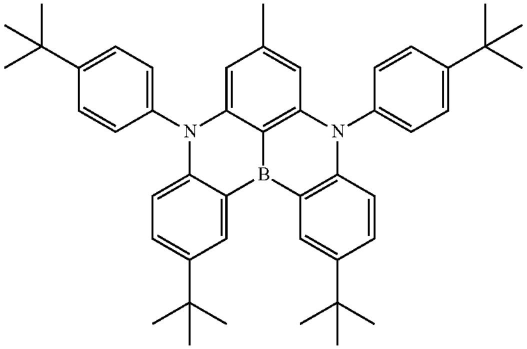 | 1 | 1 |

TABLE 3-continued
| | | |
|---|---|---|
| 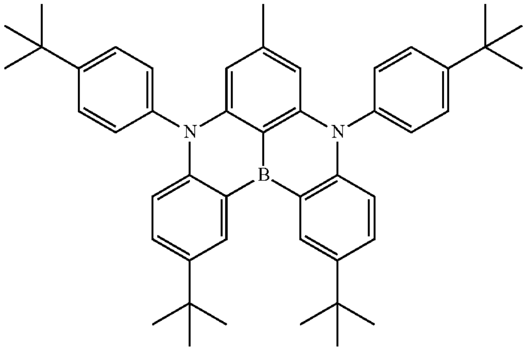 | 1 | 1 |
| 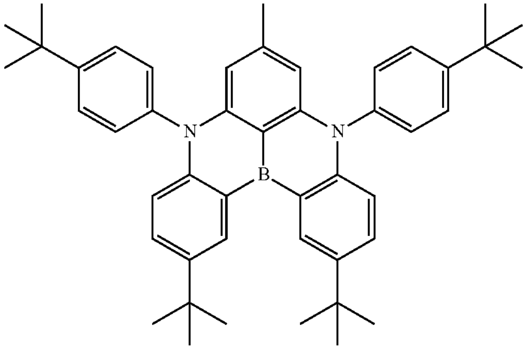 | 1 | 2 |

TABLE 4
| | |
|---|---|
| BD1 | 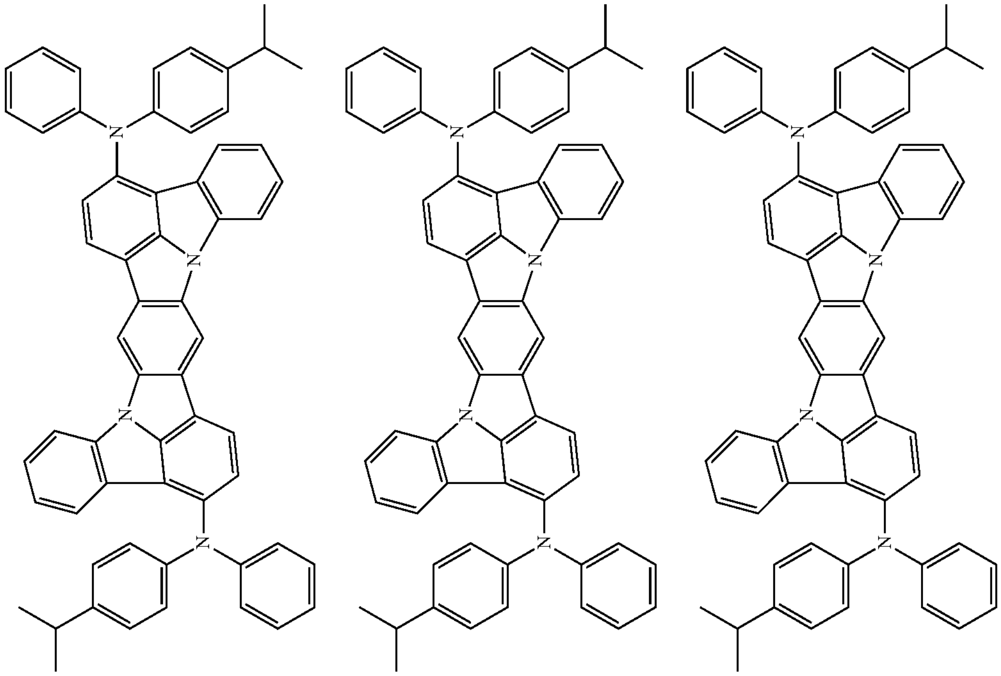 |
| BH1 | 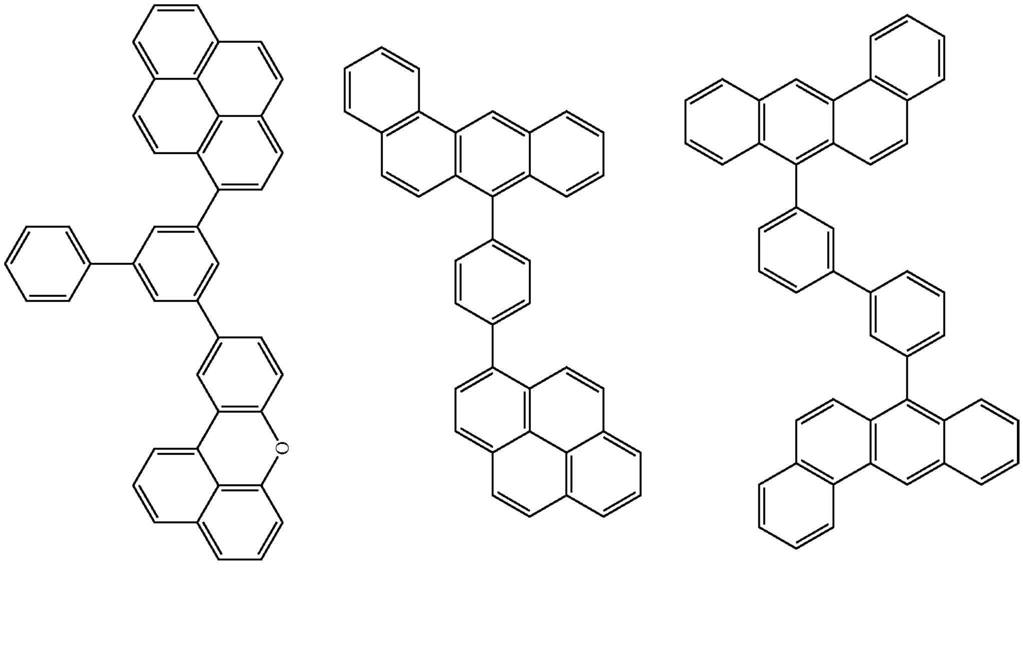 |

TABLE 4-continued
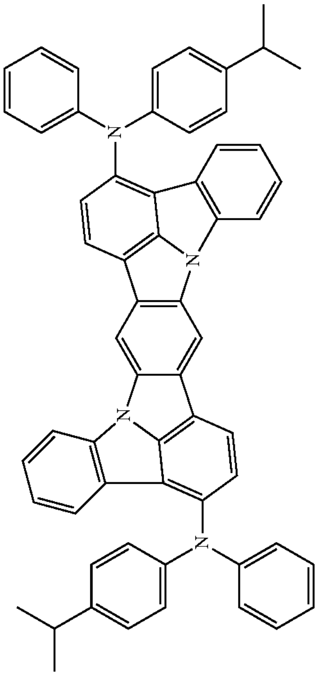
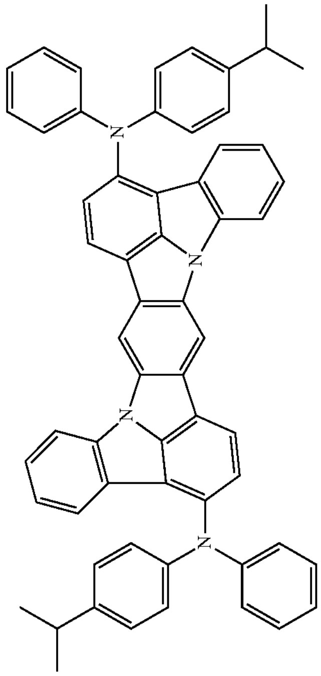
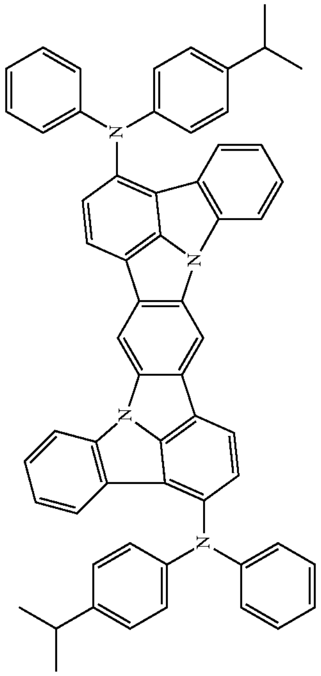
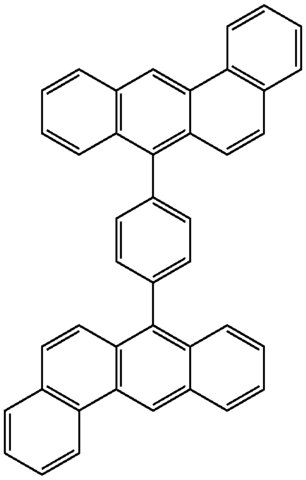
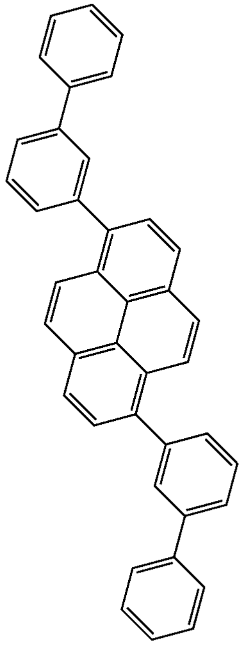
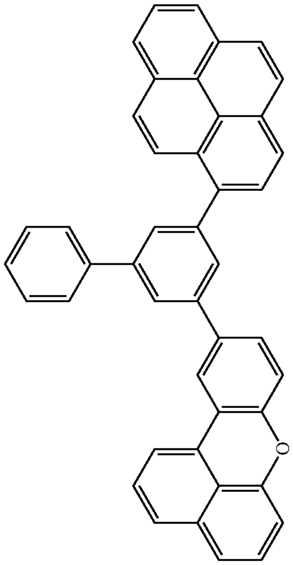

TABLE 4-continued
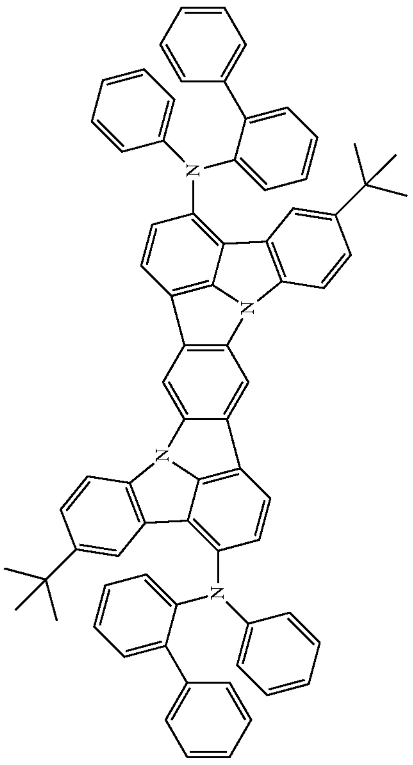
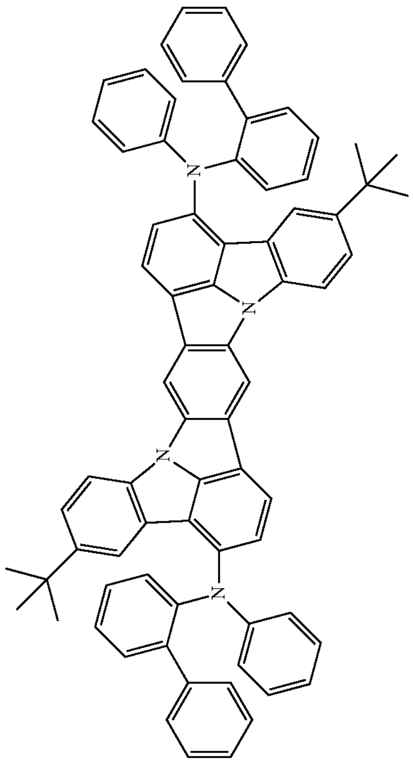
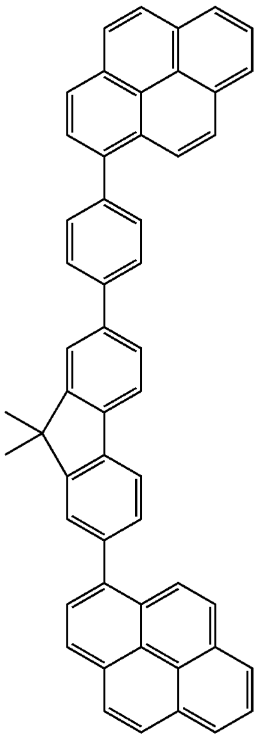
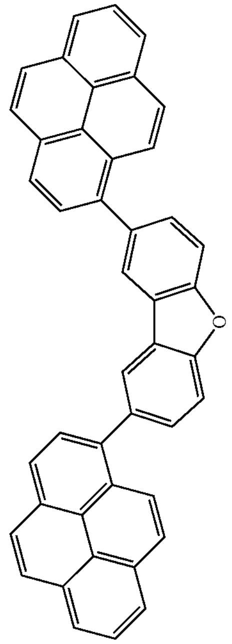

TABLE 4-continued
| | |
|---|---|
| 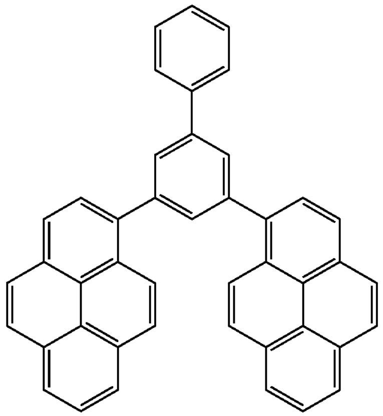 | 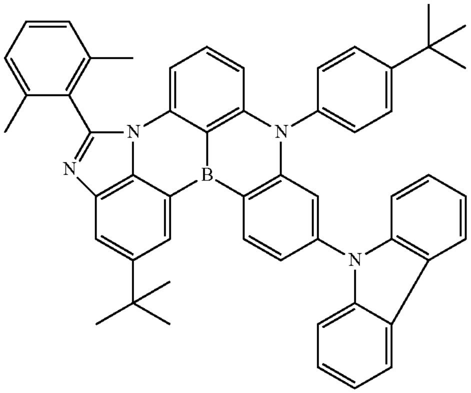 [SMILES: Cc1cccc(C)c1-c1nc2cc(C(C)(C)C)cc3c2n1-c1cccc2c1B3c1ccc(-n3c4ccccc4c4ccccc43)cc1N2c1ccc(C(C)(C)C)cc1] |
| BH2 | BD2 |
| 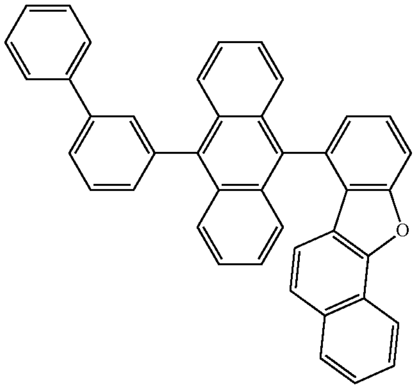 | 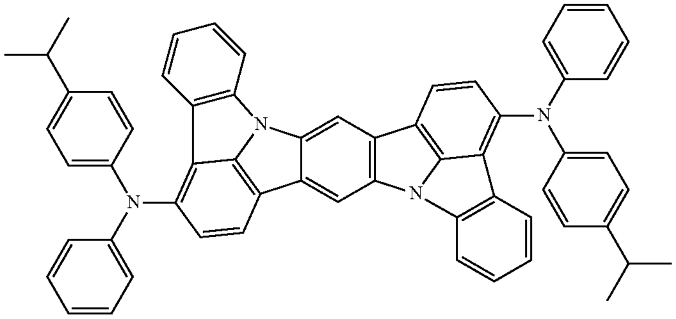 [SMILES: CC(C)c1ccc(N(c2ccccc2)c2ccc3c4cc5c(cc4n4c6ccccc6c2c34)c2ccc(N(c3ccccc3)c3ccc(C(C)C)cc3)c3c4ccccc4n5c23)cc1] |

TABLE 4-continued
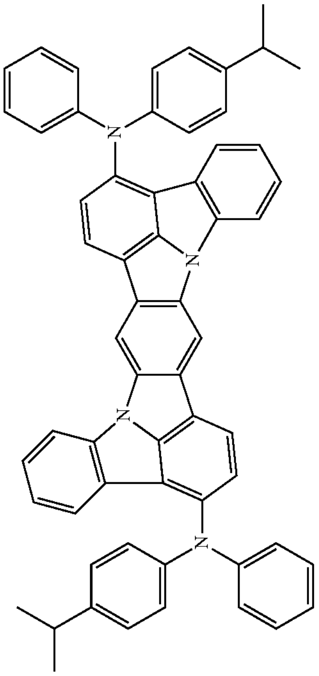
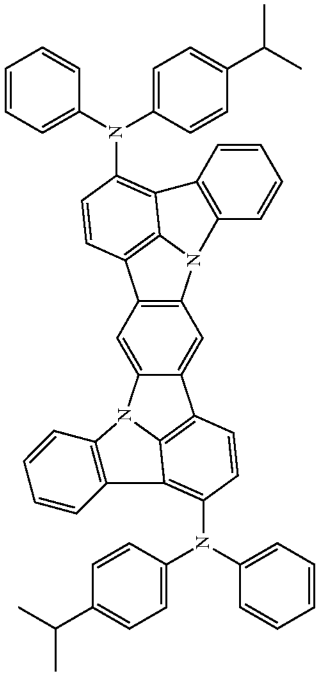
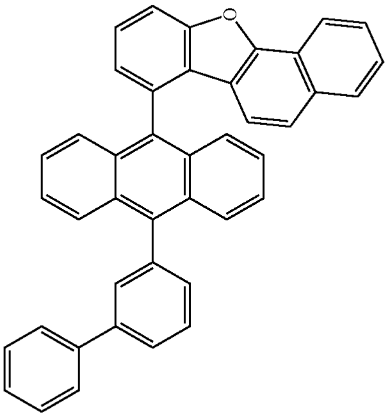
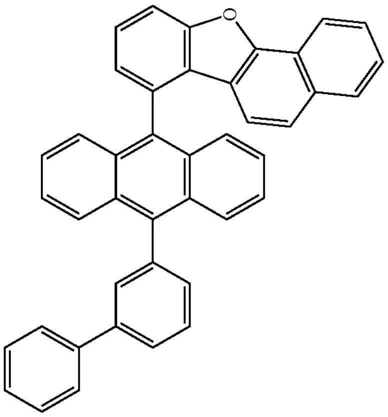

TABLE 4-continued
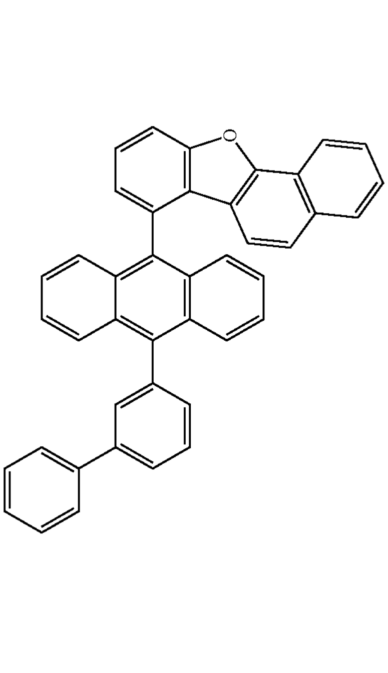
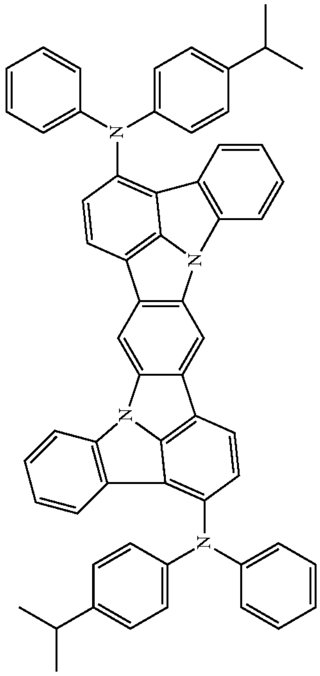
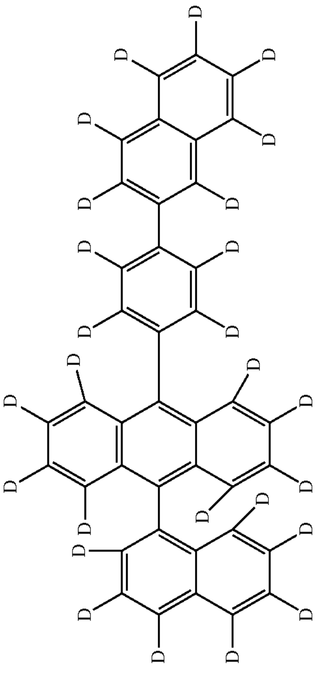
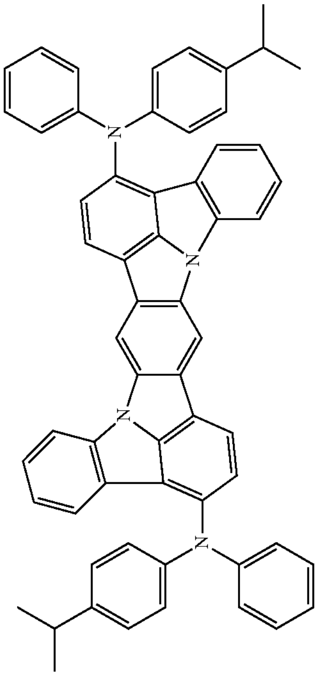
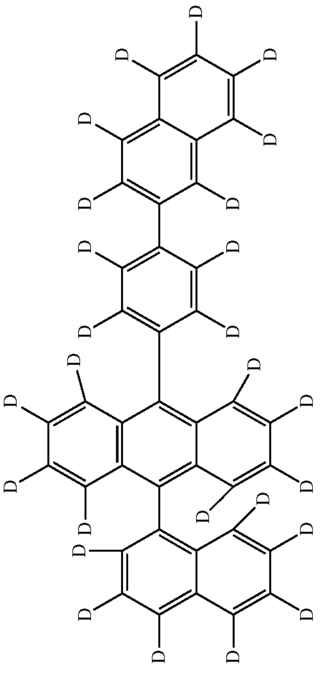
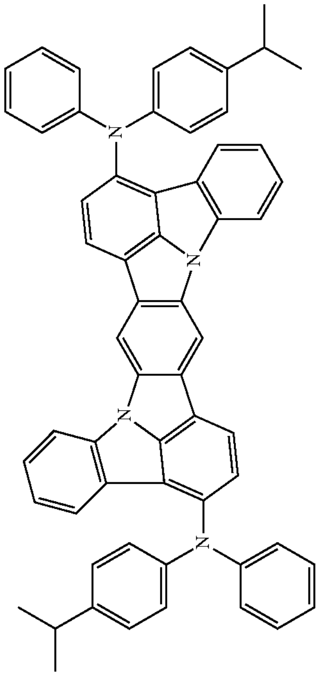

TABLE 4-continued
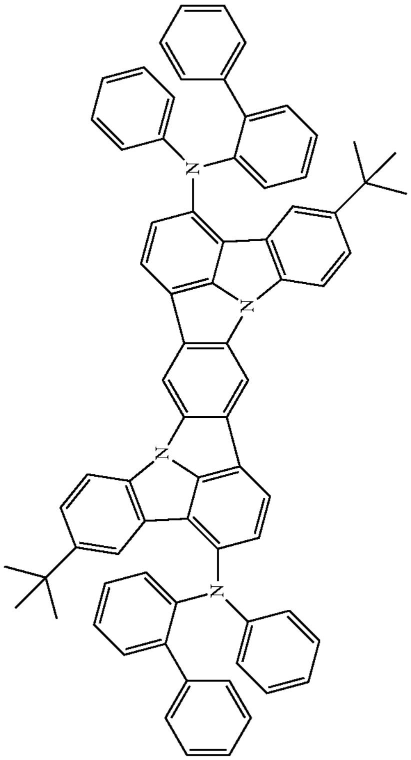
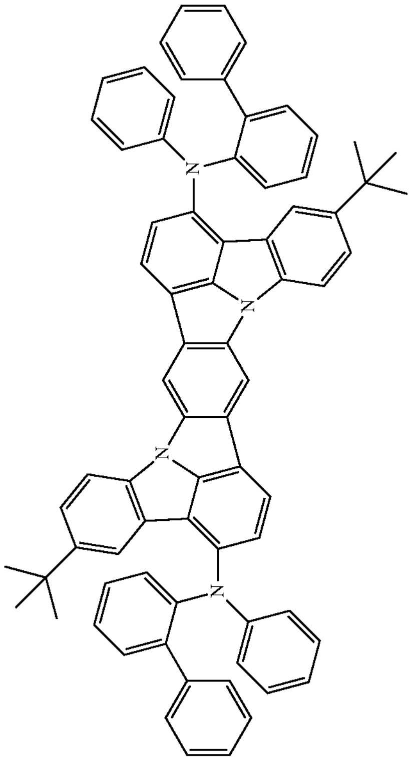
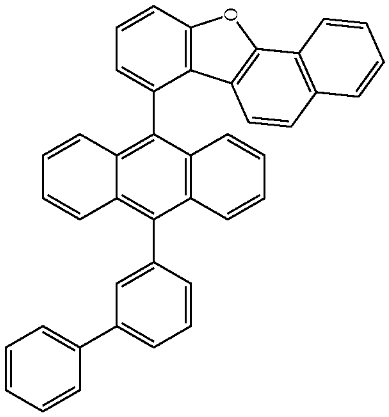
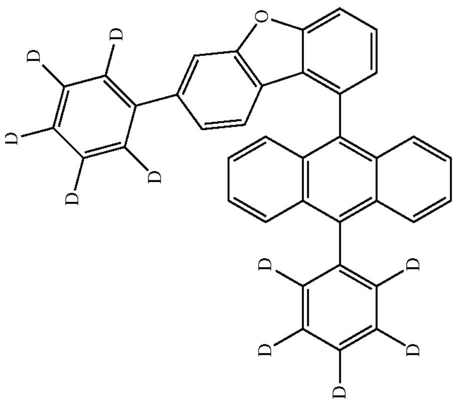

TABLE 4-continued
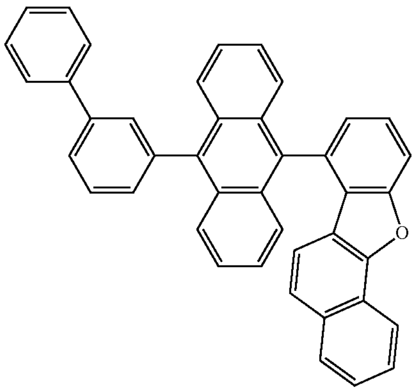 [SMILES: c1ccc(-c2cccc(-c3c4ccccc4c(-c4cccc5oc6c7ccccc7ccc6c45)c4ccccc34)c2)cc1]
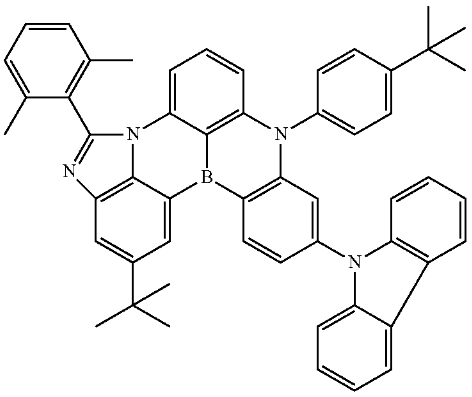 [SMILES: Cc1cccc(C)c1-c1nc2cc(C(C)(C)C)cc3c2n1-c1cccc2c1B3c1ccc(-n3c4ccccc4c4ccccc43)cc1N2c1ccc(C(C)(C)C)cc1]
| ΔFWHM | Δpeak |
|---|---|
| 1 | 2 |
| 2 | 3 |
| 2 | 3 |
| 2 | 3 |
| 2 | 2 |
| 2 | 1 |
| 2 | 3 |
| 2 | 3 |
| 1 | 2 |

TABLE 5
| BH1 | BD1 |
|---|---|
| 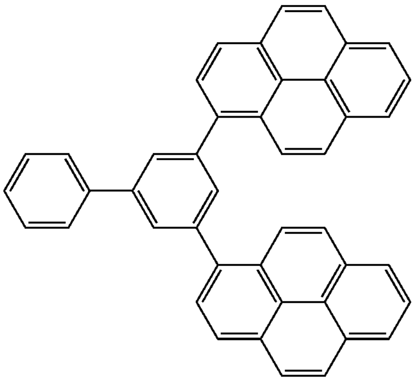 | 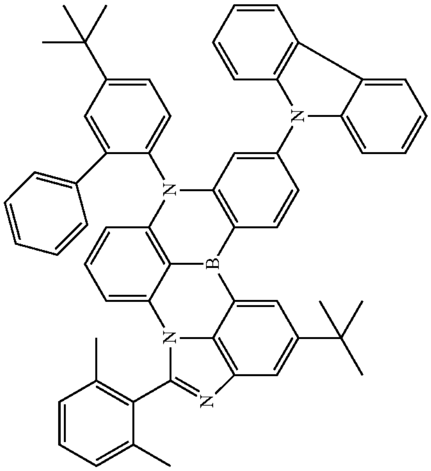 |
| 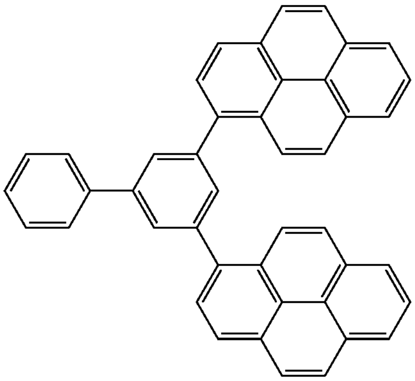 | 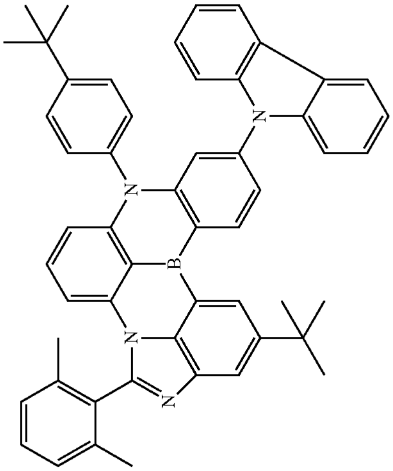 |

TABLE 5-continued
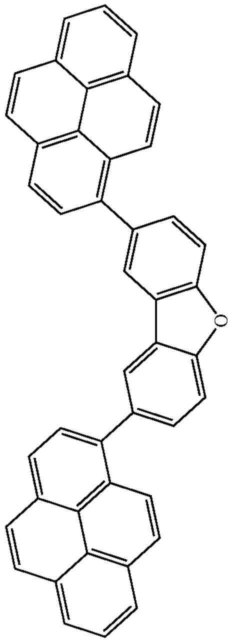
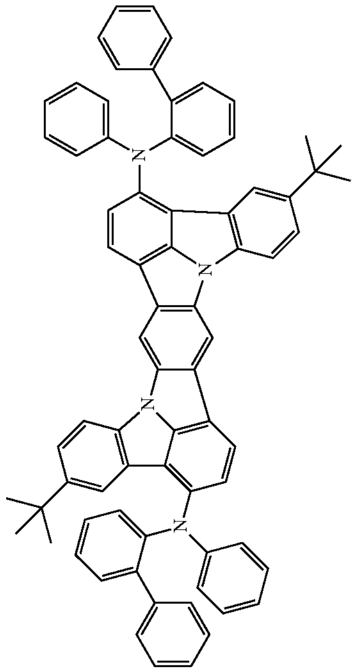
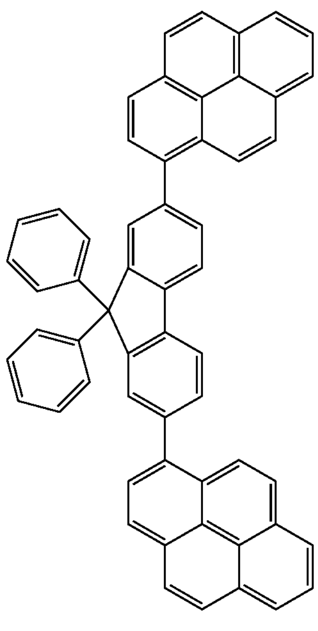
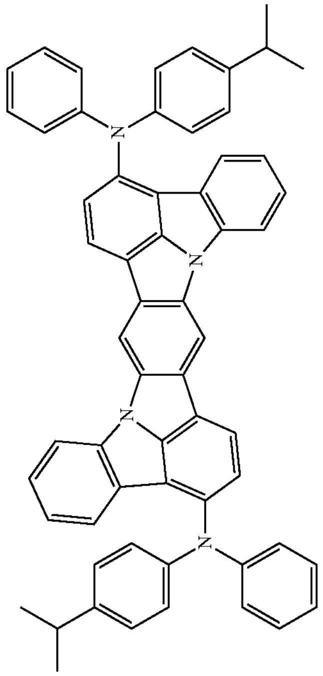

TABLE 5-continued
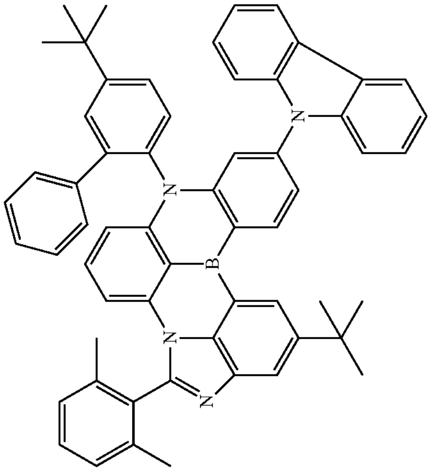
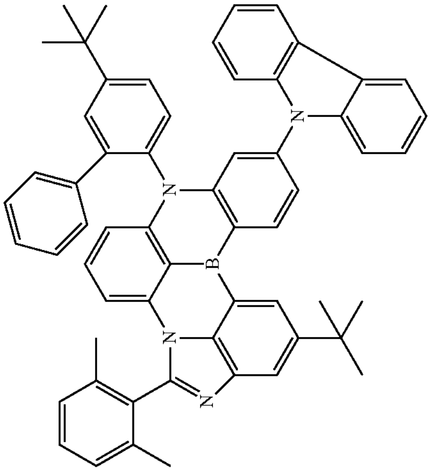
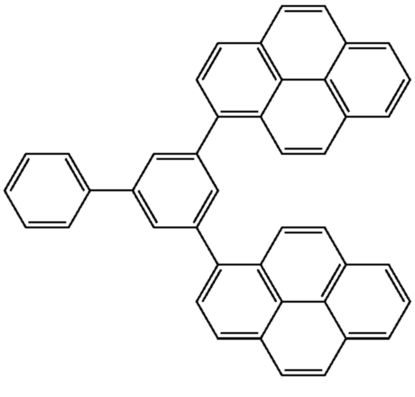
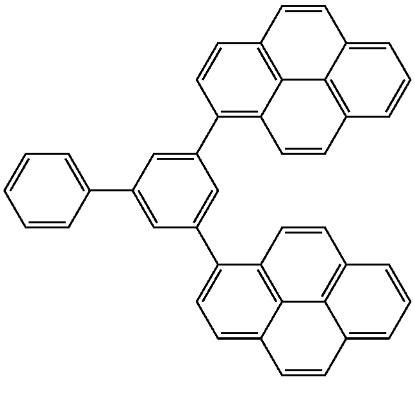

TABLE 5-continued
| | |
|---|---|
| 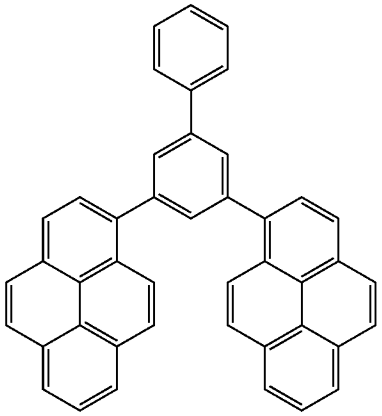 | 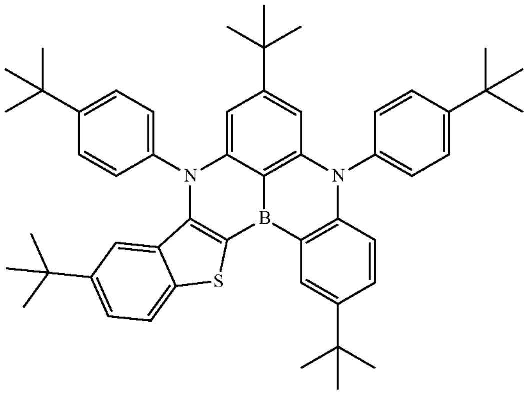 |
| BH2 | BD2 |
| 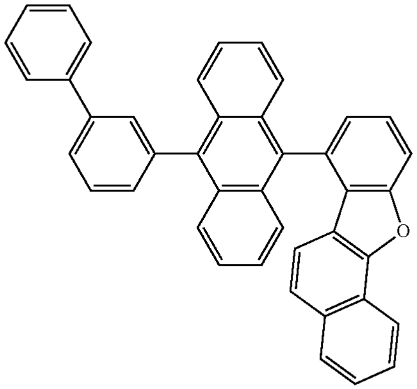 | 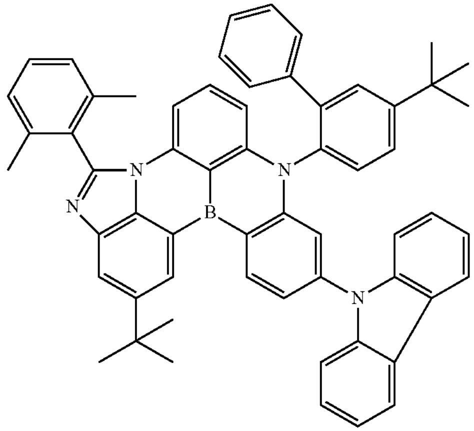 |

TABLE 5-continued
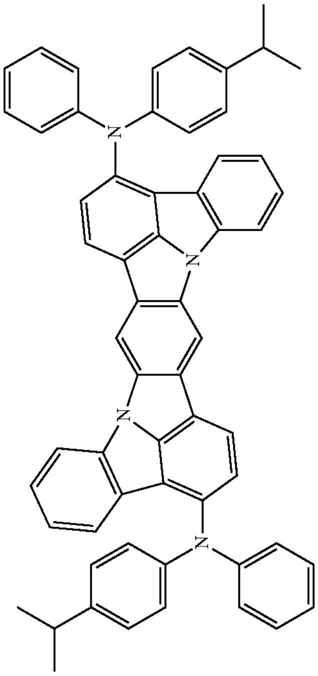
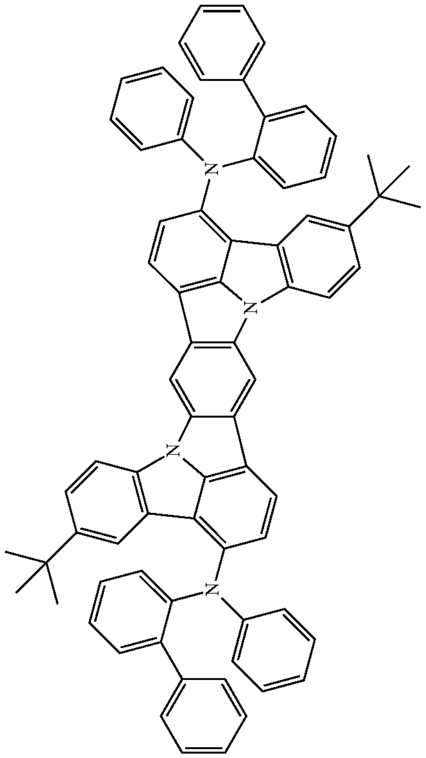
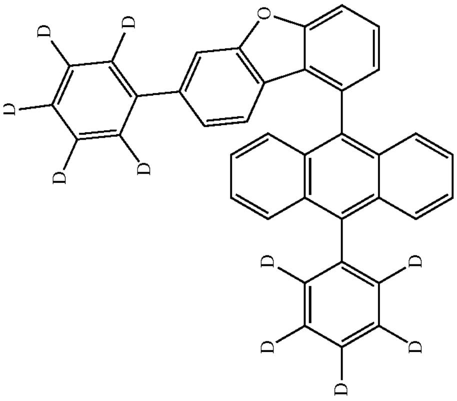
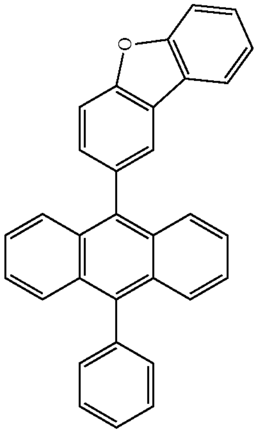

TABLE 5-continued
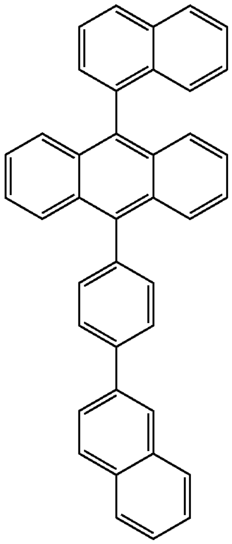
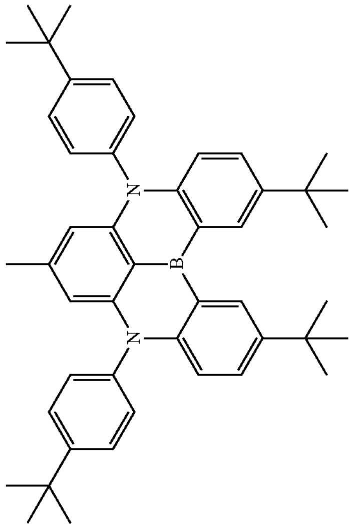
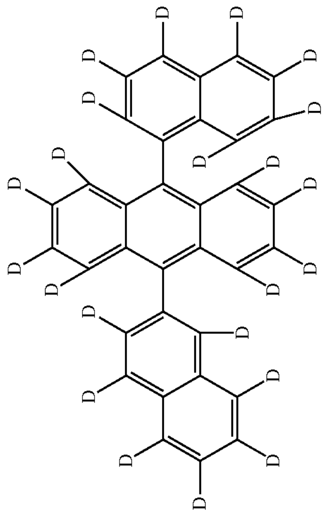
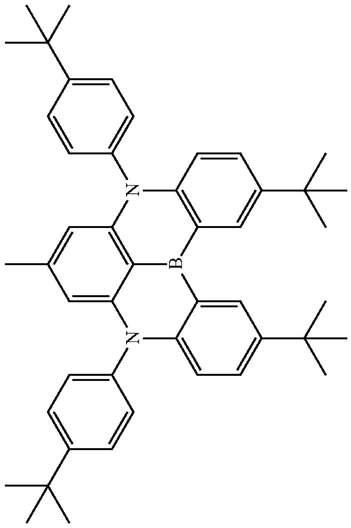
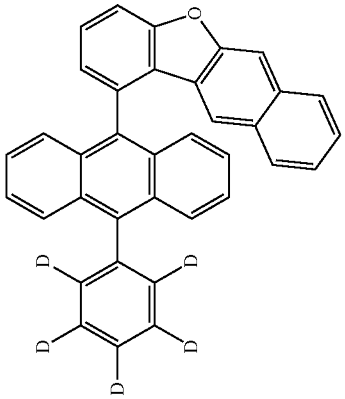

TABLE 5-continued
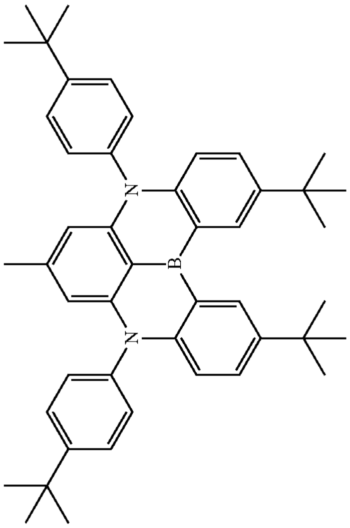
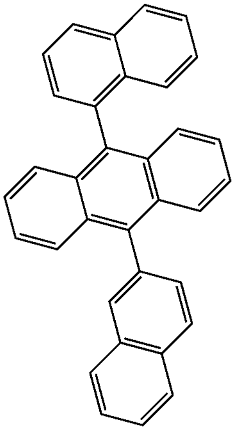
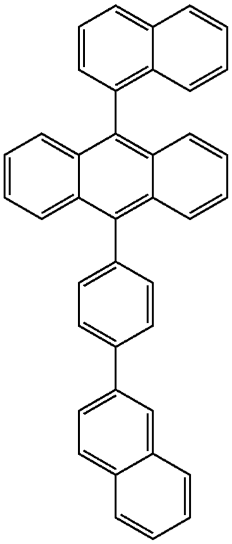

TABLE 5-continued
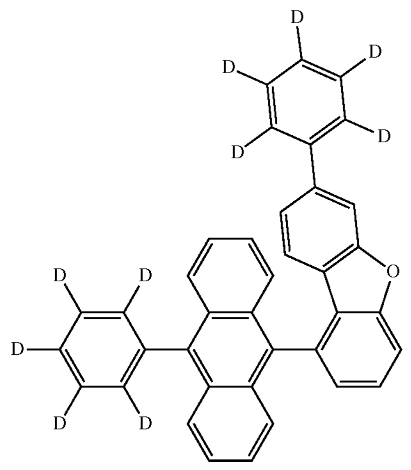 [SMILES: [2H]c1c([2H])c([2H])c(-c2ccc3c(c2)oc2cccc(-c4c5ccccc5c(-c5c([2H])c([2H])c([2H])c([2H])c5[2H])c5ccccc45)c23)c([2H])c1[2H]]
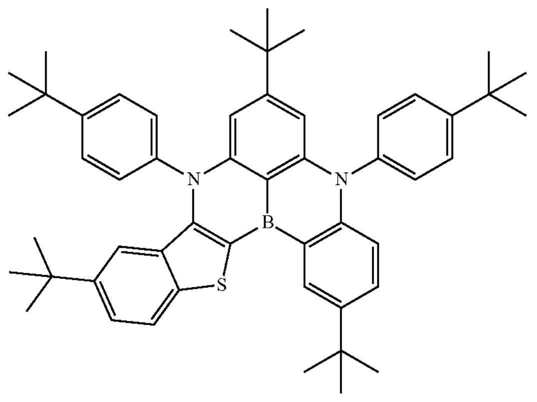 [SMILES: CC(C)(C)c1ccc(N2c3ccc(C(C)(C)C)cc3B3c4sc5ccc(C(C)(C)C)cc5c4N(c4ccc(C(C)(C)C)cc4)c4cc(C(C)(C)C)cc2c43)cc1]
| | ΔFWHM | Δpeak |
| --- | --- | --- |
| | 2 | 2 |
| | 1 | 1 |
| | 2 | 0 |
| | 0 | 0 |
| | 2 | 1 |
| | 2 | 1 |
| | 1 | 2 |

TABLE 6
| BH1 | BD1 | BH2 |
| --- | --- | --- |
| 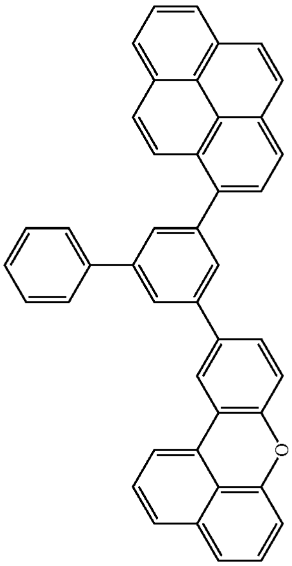 | 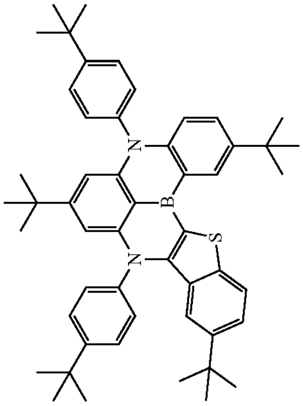 | 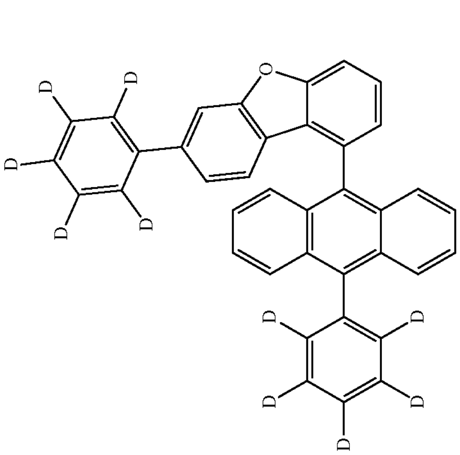 |
| 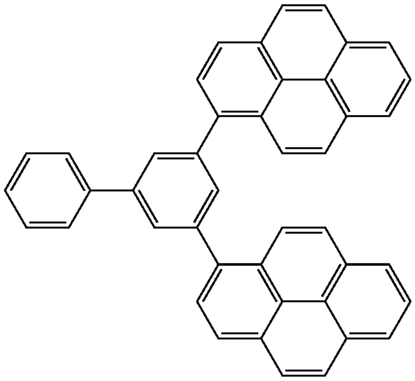 | 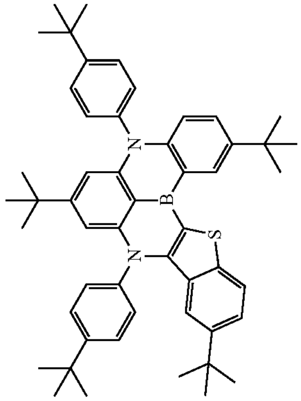 | 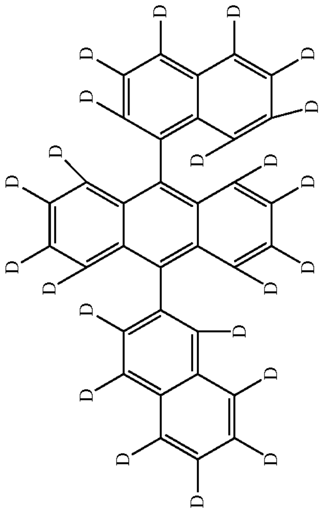 |

TABLE 6-continued
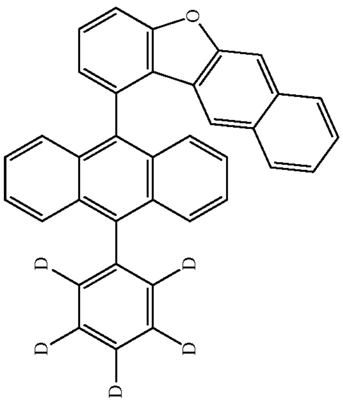
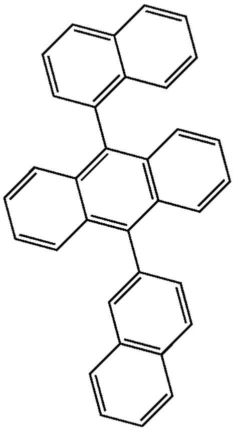
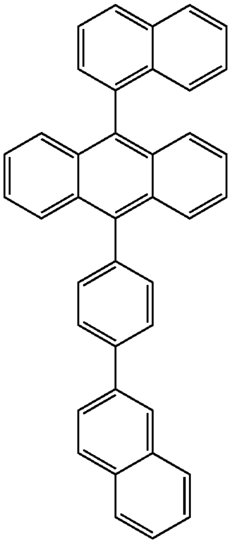
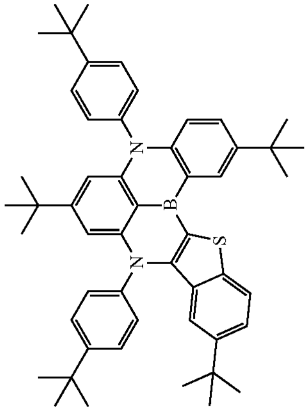
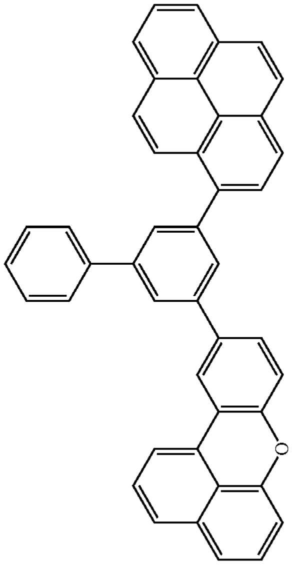

TABLE 6-continued
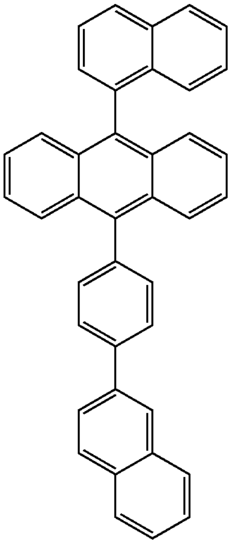
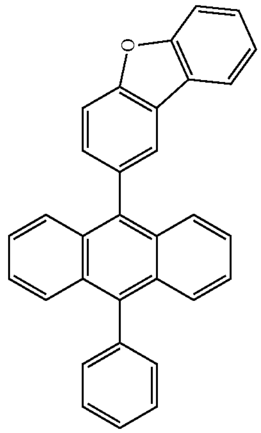
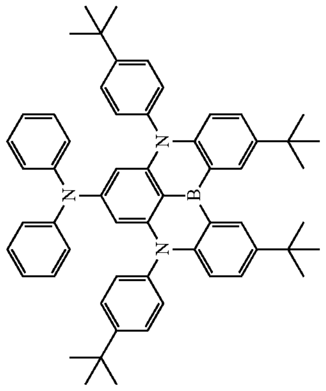
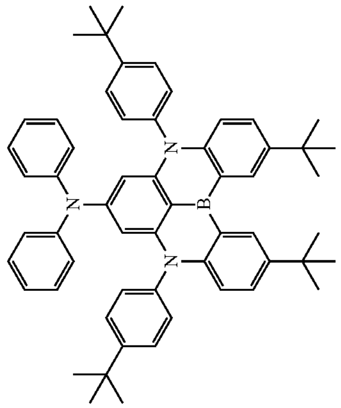
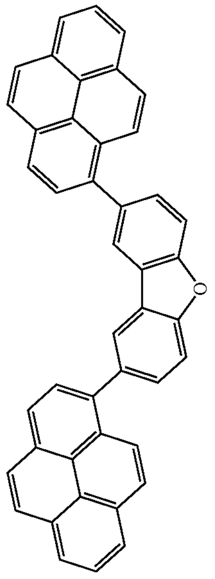
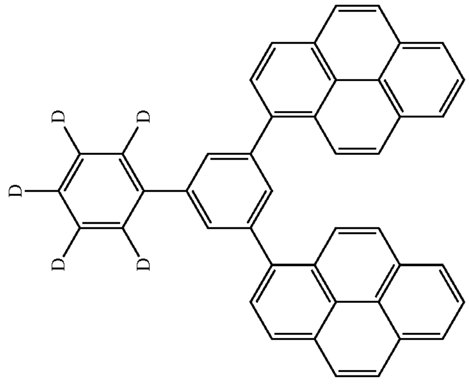

TABLE 6-continued
| BD2 | ΔFWHM | Δpeak |
| --- | --- | --- |
| 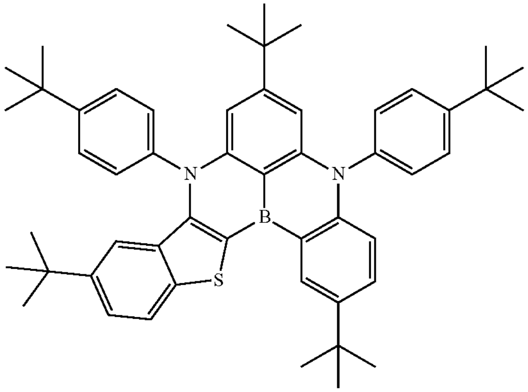 | 1 | 1 |
| 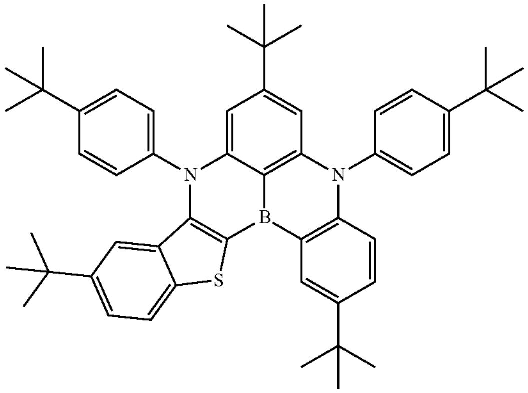 | 2 | 2 |

TABLE 6-continued
| | | |
|---|---|---|
| 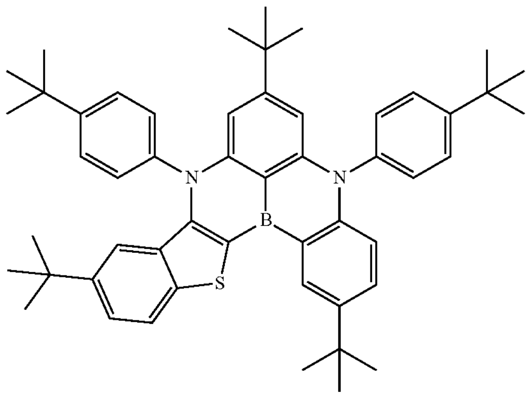 | 1 | 1 |
| 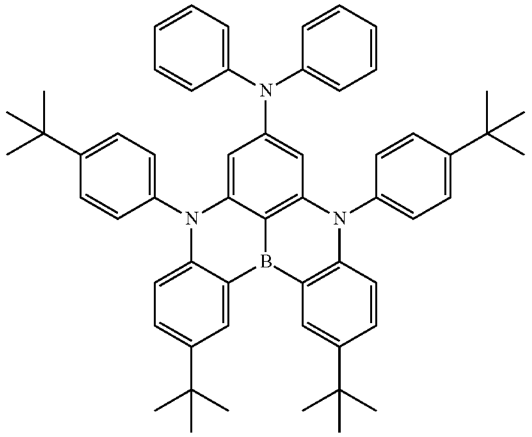 | 2 | 0 |

TABLE 6-continued
| | | |
|---|---|---|
| 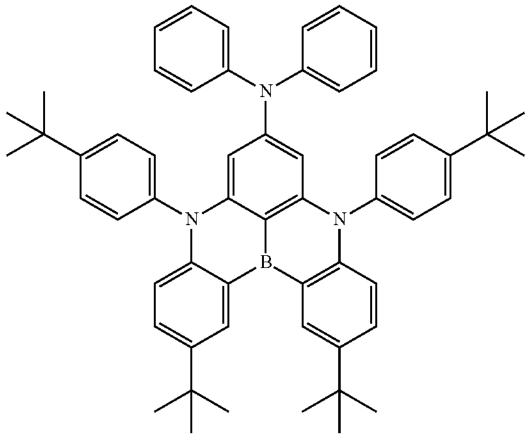 | 2 | 0 |

TABLE 7
| BH1 | BD1 | BH2 |
|---|---|---|
| 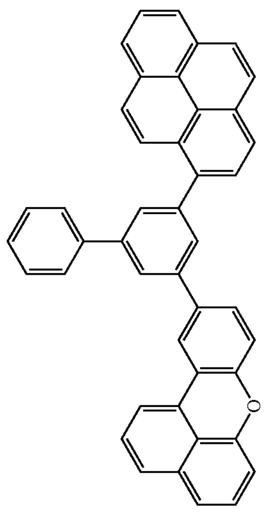 | 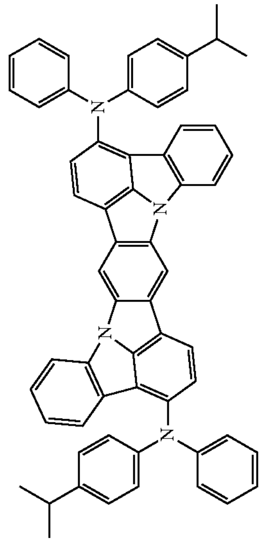 | 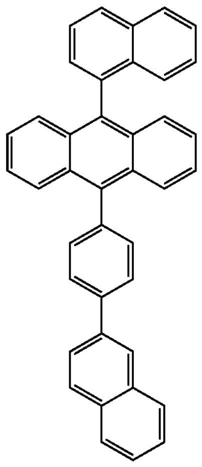 |
| 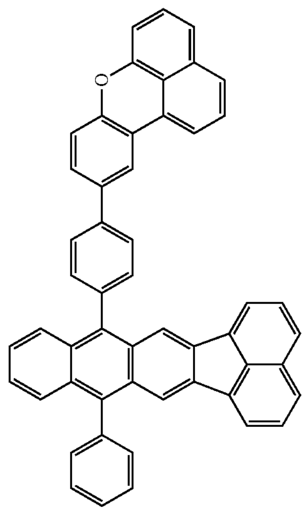 | 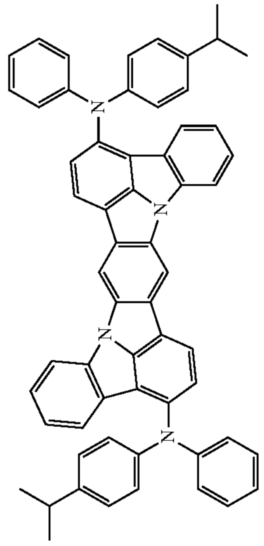 | 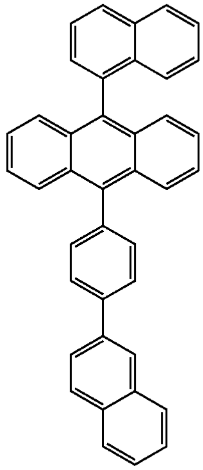 |
| 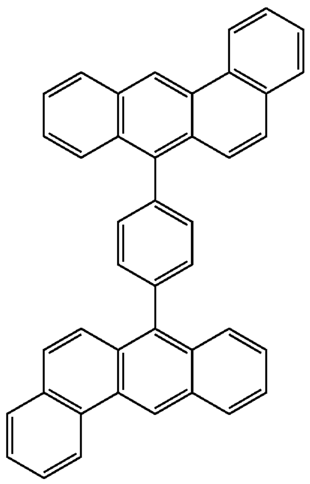 | 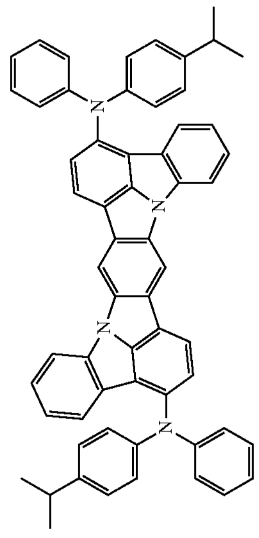 | 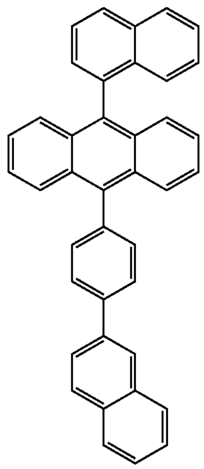 |

TABLE 7-continued
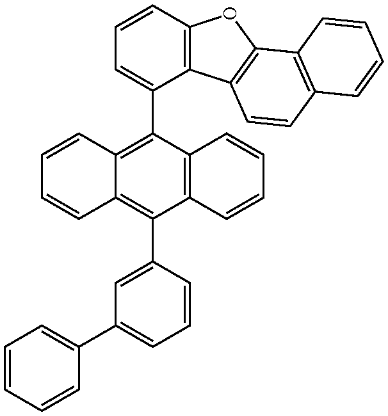
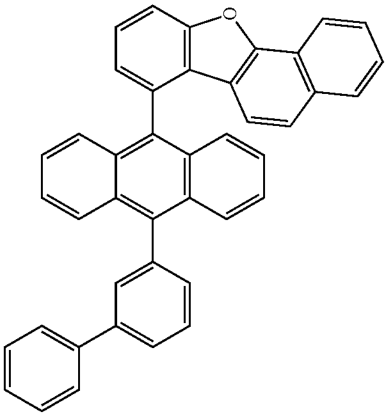
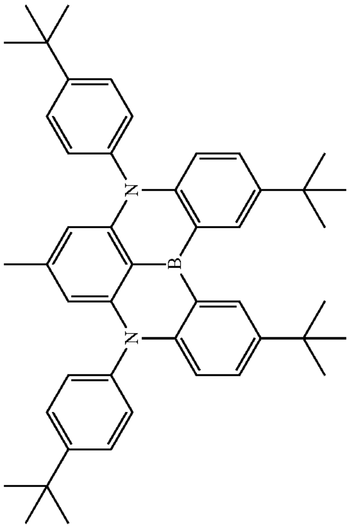
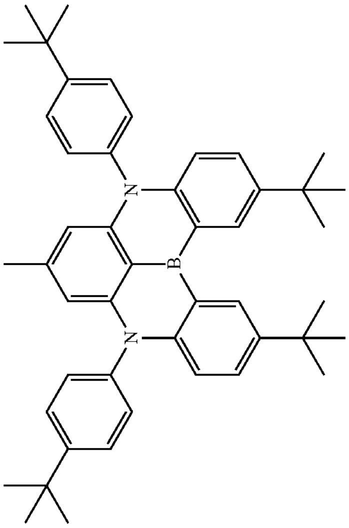
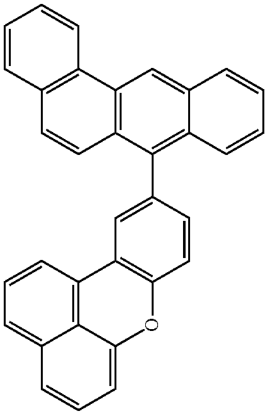
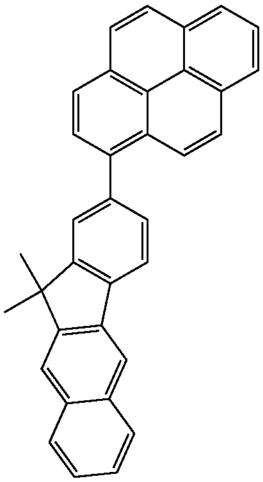

TABLE 7-continued
| BD2 | ΔFWHM | Δpeak |
| --- | --- | --- |
| 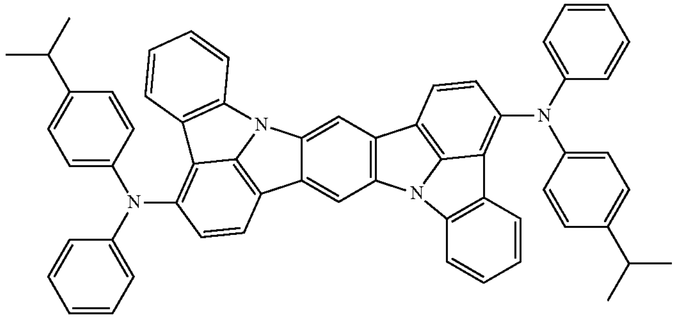 | 2 | 1 |
| 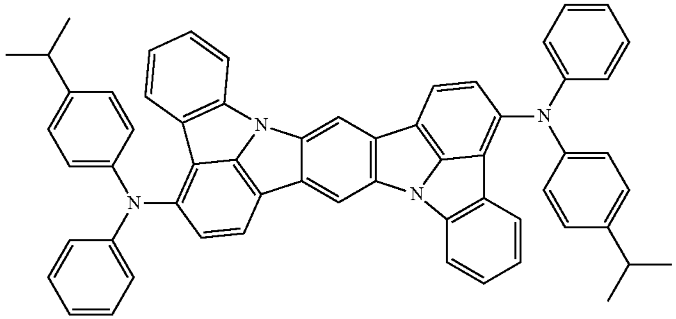 | 2 | 0 |
| 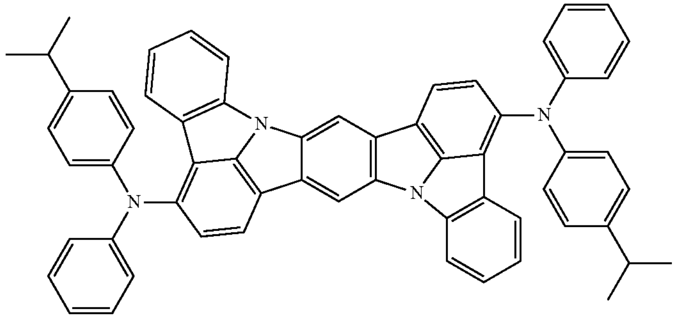 | 2 | 0 |

TABLE 7-continued
| | | |
|---|---|---|
| 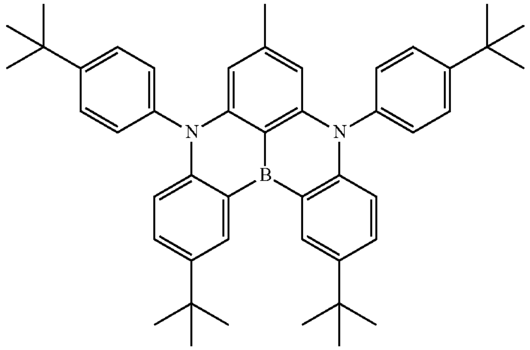 | 1 | 1 |
| 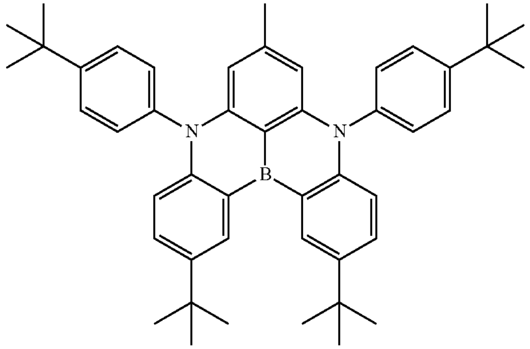 | 1 | 0 |

Explanation for Tables 1 to 7

Each BH1 column represents the first host material.
Each BH2 column represents the second host material.
Each BD1 column represents the first emitting material.
Each BD2 column represents the second emitting material.
D represents a deuterium atom.
Δλ represents |λ1−λ2| (unit: nm).
ΔFWHM represents |FWHM1−FWHM2| (unit: nm).

In the above tables, in cases where two compounds are included in a single BH2 cell, it means that two compounds are contained as BH2 in the second emitting layer.

Additional Layers of Organic EL Device

In addition to the first emitting layer and the second emitting layer, the organic EL device according to the exemplary embodiment may include one or more organic layers. Examples of the organic layer include at least one layer selected from the group consisting of a hole injecting layer, a hole transporting layer, an emitting layer, an electron injecting layer, an electron transporting layer, a hole blocking layer, and an electron blocking layer.

In the organic EL device according to the exemplary embodiment, the organic layers may consist of the first emitting layer and the second emitting layer. Alternatively, the organic layers may further include, for instance, at least one layer selected from the group consisting of a hole injecting layer, a hole transporting layer, an electron injecting layer, an electron transporting layer, a hole blocking layer, and an electron blocking layer.

In the organic EL device according to the exemplary embodiment, the anode, the first emitting layer, the second emitting layer, and the cathode may be provided in this order. Alternatively, the anode, the second emitting layer, the first emitting layer, and the cathode may be provided in this order. In the organic EL device according to the fourth or fifth exemplary embodiment, the anode as the first electrode, the first emitting layer, the second emitting layer, and the cathode as the second electrode may be provided in this order. Alternatively, the anode as the first electrode, the second emitting layer, the first emitting layer, and the cathode as the second electrode may be provided in this order.

All of the above arrangements are expected to exhibit the effect obtained by layering the emitting layers when a combination of materials satisfying the relationship of the numerical formula (Numerical Formula 1) is selected.

Hole Transporting Layer

Preferably, the organic EL device according to the exemplary embodiment includes the hole transporting layer between the first emitting layer and the anode.

That is, it is preferable that the hole transporting zone includes the hole transporting layer between the first emitting layer and the first electrode.

Electron Transporting Layer

Preferably, the organic EL device according to the exemplary embodiment includes the electron transporting layer between the second emitting layer and the cathode.

That is, it is preferable that the electron transporting zone includes an electron transporting layer between the second emitting layer and the second electrode.

Third Emitting Layer

The organic EL device according to the exemplary embodiment may further include a third emitting layer.

The third emitting layer contains a third host material and a third emitting material that emits light having a maximum peak wavelength of 500 nm or less. The first host material, the second host material, and the third host material are mutually different. The first emitting material, the second emitting material, and the third emitting material are mutually the same or different. The third emitting material contained in the third emitting layer is preferably a compound that emits fluorescence having a maximum peak wavelength of 500 nm or less. A method of measuring the maximum peak wavelength of the emitting material is as follows.

Preferably, the triplet energy of the first host material $T_1$(H1) and a triplet energy of the third host material $T_1$(H3) satisfy a relationship of a numerical formula (Numerical Formula 1A) below.

$$T_1(H1)>T_1(H3) \quad \text{(Numerical Formula 1A)}$$

When the organic EL device according to the exemplary embodiment includes the third emitting layer, the triplet energy of the second host material $T_1$(H2) and the triplet energy of the third host material $T_1$(H3) preferably satisfy a relationship of a numerical formula (Numerical Formula 1B) below.

$$T_1(H2)>T_1(H3) \quad \text{(Numerical Formula 1B)}$$

In the organic EL device of the exemplary embodiment, the first emitting layer and the second emitting layer are preferably in direct contact with each other.

In the organic EL device of the exemplary embodiment, the first emitting layer and the second emitting layer are preferably in direct contact with each other.

In the organic EL device according to the exemplary embodiment, a layer arrangement in which "the first emitting layer and the second emitting layer are in direct contact with each other" may include one of embodiments (LS1), (LS2), and (LS3) below.

(LS1) An embodiment in which a region containing both the first host material and the second host material is generated in a process of vapor-depositing the compound of the first emitting layer and vapor-depositing the compound of the second emitting layer, and is present on the interface between the first emitting layer and the second emitting layer.

(LS2) An embodiment in which in a case of containing an emitting compound (emitting material) in the first emitting layer and the second emitting layer, a region containing the first host material, the second host material and the emitting compound is generated in a process of vapor-depositing the compound of the first emitting layer and vapor-depositing the compound of the second emitting layer, and is present on the interface between the first emitting layer and the second emitting layer.

(LS3) An embodiment in which in a case of containing an emitting compound in the first emitting layer and the second emitting layer, a region containing the emitting compound, a region containing the first host material or a region containing the second host material is generated in a process of vapor-depositing the compound of the first emitting layer and vapor-depositing the compound of the second emitting layer, and is present on the interface between the first emitting layer and the second emitting layer.

When the organic EL device according to the exemplary embodiment includes the third emitting layer, it is preferable that the first emitting layer and the second emitting layer are in direct contact with each other and the second emitting layer and the third emitting layer are in direct contact with each other.

Herein, a layer arrangement in which the second emitting layer and the third emitting layer are in direct contact with each other may include one of embodiments (LS4), (LS5) and (LS6) below.

(LS4) An embodiment in which a region containing both the second host material and the third host material is generated in a process of vapor-depositing the compound of the second emitting layer and vapor-depositing the compound of the third emitting layer, and is present on the interface between the second emitting layer and the third emitting layer.

(LS5) An embodiment in which in a case of containing an emitting compound in the second emitting layer and the third emitting layer, a region containing the second host material, the third host material and the emitting compound is generated in a process of vapor-depositing the compound of the second emitting layer and vapor-depositing the compound of the third emitting layer, and is present on the interface between the second emitting layer and the third emitting layer.

(LS6) An embodiment in which in a case of containing an emitting compound in the second emitting layer and the third emitting layer, a region containing the emitting compound, a region containing the second host material or a region containing the third host material is generated in a process of vapor-depositing the compound of the second emitting layer and vapor-depositing the compound of the third emitting layer, and is present on the interface between the second emitting layer and the third emitting layer.

The organic EL device according to the exemplary embodiment may further include a diffusion layer.

The diffusion layer is provided for smoothly transferring triplet excitons from the first emitting layer to the second emitting layer. The diffusion layer contains a diffusion layer material. The diffusion layer material may be any material that satisfies a relationship of a numerical formula (Numerical Formula 23) below.

That is, when the organic EL device according to the exemplary embodiment further includes a diffusion layer, the triplet energy of the first host material $T_1$ (H1), a triplet energy of at least one diffusion layer material $T_1$ (diffusion layer material), and the triplet energy of the second host material $T_1$ (H2) preferably satisfy the relationship of the numerical formula (Numerical Formula 23).

$$T_1(H1)>T_1\text{ (diffusion layer material)}>T_1(H2) \quad \text{(Numerical Formula 23)}$$

The excitation lifetime of triplet excitons is expected to be long by providing the diffusion layer for the organic EL device according to the exemplary embodiment.

The diffusion rate of triplet excitons is expected to improve by providing the diffusion layer for the organic EL device according to the exemplary embodiment.

The diffusion layer is capable of containing a diffusion layer material at 60 mass % or more, 70 mass % or more, or 80 mass % or more, with respect to the total mass of the diffusion layer.

The diffusion layer may contain a single type of the diffusion layer material or may contain two or more types of the diffusion layer material.

The diffusion layer included in the organic EL device according to the exemplary embodiment is preferably provided between the first emitting layer and the second emitting layer.

The arrangement of the organic EL device will be further described below. It should be noted that the reference numerals are occasionally omitted below.

Substrate

The substrate is used as a support for the organic EL device. For instance, glass, quartz, plastics and the like are usable for the substrate. A flexible substrate is also usable. The flexible substrate is a bendable substrate, which is exemplified by a plastic substrate. Examples of the material for the plastic substrate include polycarbonate, polyarylate, polyethersulfone, polypropylene, polyester, polyvinyl fluoride, polyvinyl chloride, polyimide, and polyethylene naphthalate. Moreover, an inorganic vapor deposition film is also usable.

Anode

Metal, an alloy, an electrically conductive compound, a mixture thereof, or the like having a large work function (specifically, 4.0 eV or more) is preferably used as the anode formed on the substrate. Specific examples of the material include ITO (Indium Tin Oxide), indium oxide-tin oxide containing silicon or silicon oxide, indium oxide-zinc oxide, indium oxide containing tungsten oxide and zinc oxide, and graphene. In addition, gold (Au), platinum (Pt), nickel (Ni), tungsten (W), chrome (Cr), molybdenum (Mo), iron (Fe), cobalt (Co), copper (Cu), palladium (Pd), titanium ($T_1$), and nitrides of a metal material (e.g., titanium nitride) are usable.

The material is typically formed into a film by a sputtering method. For instance, the indium oxide-zinc oxide can be formed into a film by the sputtering method using a target in which zinc oxide in a range from 1 mass % to 10 mass % is added to indium oxide. Moreover, for instance, the indium oxide containing tungsten oxide and zinc oxide can be formed by the sputtering method using a target in which tungsten oxide in a range from 0.5 mass % to 5 mass % and zinc oxide in a range from 0.1 mass % to 1 mass % are added to indium oxide. In addition, the anode may be formed by a vacuum deposition method, a coating method, an inkjet method, a spin coating method or the like.

Among the organic layers formed on the anode, since the hole injecting layer adjacent to the anode is formed of a composite material into which holes are easily injectable irrespective of the work function of the anode, a material usable as an electrode material (e.g., metal, an alloy, an electroconductive compound, a mixture thereof, and the elements belonging to the group 1 or 2 of the periodic table) is also usable for the anode.

A material having a small work function such as elements belonging to Groups 1 and 2 in the periodic table of the elements, specifically, an alkali metal such as lithium (Li) and cesium (Cs), an alkaline earth metal such as magnesium (Mg), calcium (Ca) and strontium (Sr), alloys (e.g., MgAg and AlLi) including the alkali metal or the alkaline earth metal, a rare earth metal such as europium (Eu) and ytterbium (Yb), alloys including the rare earth metal are also usable for the anode. It should be noted that the vacuum deposition method and the sputtering method are usable for forming the anode using the alkali metal, alkaline earth metal and the alloy thereof. Further, when a silver paste is used for the anode, the coating method and the inkjet method are usable.

When the organic EL device according to the exemplary embodiment is of a top emission type, the anode is preferably a transparent electrode. In the organic EL device according to the fourth or fifth exemplary embodiment, the first electrode is preferably an anode. As the transparent electrode, a conductive layer described later is usable.

The anode may include a light reflection layer. The light reflection layer is preferably formed from a metallic material having light reflectivity. The light reflectivity means a property of reflecting 50% or more (preferably 80% or more) of light emitted from the emitting layer.

Examples of the metallic material include single materials such as Al, Ag, Ta, Zn, Mo, W, Ni and Cr, or alloy materials containing these metals as main components (preferably 50 mass % or more of the whole), amorphous alloys such as NiP, NiB, CrP, and CrB, and microcrystalline alloys such as NiAl and silver alloys.

Also, as the metallic material, APC (silver, palladium and copper alloy), ARA (silver, rubidium and gold alloy), MoCr (molybdenum and chromium alloy), NiCr (nickel and chromium alloy) and the like are usable.

The light reflection layer may be provided by a single layer or a plurality of layers.

The anode may have a multilayer structure having the light reflection layer and the conductive layer as the transparent electrode. When the anode includes the light reflection layer and the conductive layer, the conductive layer is preferably provided between the light reflection layer and the hole transporting zone. Alternatively, the anode may have a multilayer structure in which the light reflection layer is provided between two conductive layers (first conductive layer and second conductive layer). In such a multilayer structure, the first and second conductive layers may be formed from the same material or mutually different materials.

Metal, an alloy, an electrically conductive compound, a mixture thereof, or the like having a large work function (specifically, 4.0 eV or more) is preferably used as the conductive layer as the transparent electrode.

The above material having a small work function such as elements belonging to Groups 1 and 2 in the periodic table of the elements, specifically, an alkali metal such as lithium (Li) and cesium (Cs), an alkaline earth metal such as magnesium (Mg), calcium (Ca) and strontium (Sr), alloys (e.g., MgAg and AlLi) including the alkali metal or the alkaline earth metal, a rare earth metal such as europium (Eu) and ytterbium (Yb), alloys including the rare earth metal are also usable for the conductive layer.

Cathode

It is preferable to use metal, an alloy, an electroconductive compound, a mixture thereof, or the like having a small work function (specifically, 3.8 eV or less) for the cathode. Examples of the material for the cathode include elements belonging to Groups 1 and 2 in the periodic table of the elements, specifically, the alkali metal such as lithium (Li) and cesium (Cs), the alkaline earth metal such as magnesium (Mg), calcium (Ca) and strontium (Sr), alloys (e.g., MgAg and AlLi) including the alkali metal or the alkaline earth metal, the rare earth metal such as europium (Eu) and ytterbium (Yb), and alloys including the rare earth metal.

It should be noted that the vacuum deposition method and the sputtering method are usable for forming the cathode using the alkali metal, alkaline earth metal and the alloy thereof. Further, when a silver paste is used for the cathode, the coating method and the inkjet method are usable.

By providing the electron injecting layer, various conductive materials such as Al, Mg, Ag, ITO, graphene, and indium oxide-tin oxide containing silicon or silicon oxide may be used for forming the cathode regardless of the work function. The conductive materials can be formed into a film using the sputtering method, inkjet method, spin coating method and the like.

When the organic EL device according to the exemplary embodiment is of a top emission type, the cathode is preferably formed of a light-transmissive or semi-transmissive metallic material that transmits light from the emitting layer. In the organic EL device according to the fourth or fifth exemplary embodiment, the second electrode is preferably a cathode. The light-transmissive or semi-transmissive property means a property of allowing transmissivity of 50% or more (preferably 80% or more) of the light emitted from the emitting layer.

Preferably, metal, an alloy, an electrically conductive compound, a mixture thereof, or the like having a small work function (specifically, 3.8 eV or less) as described above is used for the cathode.

Hole Injecting Layer

The hole injecting layer is a layer containing a substance exhibiting a high hole injectability. Examples of the substance exhibiting a high hole injectability include molybdenum oxide, titanium oxide, vanadium oxide, rhenium oxide, ruthenium oxide, chrome oxide, zirconium oxide, hafnium oxide, tantalum oxide, silver oxide, tungsten oxide, and manganese oxide.

In addition, the examples of the highly hole-injectable substance include: an aromatic amine compound, which is a low-molecule organic compound, such that 4,4',4"-tris(N,N-diphenylamino)triphenylamine (abbreviation: TDATA), 4,4',4"-tris[N-(3-methylphenyl)-N-phenylamino]triphenylamine (abbreviation: MTDATA), 4,4'-bis[N-(4-diphenylaminophenyl)-N-phenylamino]biphenyl(abbreviation: DPAB), 4,4'-bis(N-{4-[N'-(3-methylphenyl)-N'-phenylamino]phenyl}-N-phenylamino)biphenyl (abbreviation: DNTPD), 1,3,5-tris[N-(4-diphenylaminophenyl)-N-phenylamino]benzene (abbreviation: DPA3B), 3-[N-(9-phenylcarbazole-3-yl)-N-phenylamino]-9-phenylcarbazole (abbreviation: PCzPCA1), 3,6-bis[N-(9-phenylcarbazole-3-yl)-N-phenylamino]-9-phenylcarbazole (abbreviation: PCzPCA2), and 3-[N-(1-naphthyl)-N-(9-phenylcarbazole-3-yl)amino]-9-phenylcarbazole (abbreviation: PCzPCN1); and dipyrazino[2,34:20,30-h]quinoxaline-2,3,6,7,10,11-hexacarbonitrile (HAT-CN).

In addition, a high polymer compound (e.g., oligomer, dendrimer and polymer) is usable as the substance exhibiting a high hole injectability. Examples of the high-molecule compound include poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl)methacrylamide] (abbreviation: PTPDMA), and poly[N, N'-bis(4-butylphenyl)-N, N'-bis(phenyl)benzidine] (abbreviation: Poly-TPD). Moreover, an acid-added high polymer compound such as poly(3,4-ethylenedioxythiophene)/poly(styrene sulfonic acid) (PEDOT/PSS) and polyaniline/poly(styrene sulfonic acid) (PAni/PSS) are also usable.

Hole Transporting Layer

The hole transporting layer is a layer containing a highly hole-transporting substance. An aromatic amine compound, carbazole derivative, anthracene derivative and the like are usable for the hole transporting layer. Specific examples of a material for the hole transporting layer include 4,4'-bis[N-(1-naphthyl)-N-phenylamino]biphenyl (abbreviation: NPB), N,N'-bis(3-methylphenyl)-N,N'-diphenyl-[1,1'-biphenyl]-4,4'-diamine (abbreviation: TPD), 4-phenyl-4'-(9-phenylfluorene-9-yl)triphenylamine (abbreviation: BAFLP), 4,4'-bis[N-(9,9-dimethylfluorene-2-yl)-N-phenylamino]biphenyl (abbreviation: DFLDPBi), 4,4',4"-tris(N, N-diphenylamino)triphenylamine (abbreviation: TDATA), 4,4',4"-tris[N-(3-methylphenyl)-N-phenylamino]triphenylamine (abbreviation: MTDATA), and 4,4'-bis[N-(spiro-9,9'-bifluorene-2-yl)-N-phenylamino]biphenyl (abbreviation: BSPB). The above-described substances mostly have a hole mobility of $10^{-6}$ $cm^2/(V \cdot s)$ or more.

For the hole transporting layer, a carbazole derivative such as CBP, 9-[4-(N-carbazolyl)]phenyl-10-phenylanthracene (CzPA), and 9-phenyl-3-[4-(10-phenyl-9-anthryl)phenyl]-9H-carbazole (PCzPA) and an anthracene derivative such as t-BuDNA, DNA, and DPAnth may be used. A high polymer compound such as poly(N-vinylcarbazole) (abbreviation: PVK) and poly(4-vinyltriphenylamine) (abbreviation: PVTPA) is also usable.

However, in addition to the above substances, any substance exhibiting a higher hole transportability than an electron transportability may be used. It should be noted that the layer containing the substance exhibiting a high hole transportability may be not only a single layer but also a laminate of two or more layers formed of the above substance(s).

Electron Transporting Layer

The electron transporting layer is a layer containing a highly electron-transporting substance. For the electron transporting layer, 1) a metal complex such as an aluminum complex, beryllium complex, and zinc complex, 2) a hetero aromatic compound such as imidazole derivative, benzimidazole derivative, azine derivative, carbazole derivative, and phenanthroline derivative, and 3) a high polymer compound are usable. Specifically, as a low-molecule organic compound, a metal complex such as Alq, tris(4-methyl-8-quinolinato)aluminum (abbreviation: $Almq_3$), bis(10-hydroxybenzo[h]quinolinato)beryllium (abbreviation: $BeBq_2$), BAlq, Znq, ZnPBO and ZnBTZ is usable. In addition to the metal complex, a heteroaromatic compound such as 2-(4-biphenylyl)-5-(4-tert-butylphenyl)-1,3,4-oxadiazole (abbreviation: PBD), 1,3-bis[5-(ptert-butylphenyl)-1,3,4-oxadiazole-2-yl]benzene (abbreviation: OXD-7), 3-(4-tert-butylphenyl)-4-phenyl-5-(4-biphenylyl)-1,2,4-triazole (abbreviation: TAZ), 3-(4-tert-butylphenyl)-4-(4-ethylphenyl)-5-(4-biphenylyl)-1,2,4-triazole (abbreviation: p-EtTAZ), bathophenanthroline (abbreviation: BPhen), bathocuproine (abbreviation: BCP), and 4,4'-bis(5-methylbenzoxazole-2-yl)stilbene (abbreviation: BzOs) is usable. In the present exemplary embodiment, a benzimidazole compound is preferably usable. The above-described substances mostly have an electron mobility of $10^{-6}$ $cm^2/(V·s)$ or more. It should be noted that any substance other than the above substance may be used for the electron transporting layer as long as the substance exhibits a higher electron transportability than the hole transportability. The electron transporting layer may be provided in the form of a single layer or a laminate of two or more layers of the above substance(s).

Further, a high polymer compound is usable for the electron transporting layer. For instance, poly[(9,9-dihexylfluorene-2,7-diyl)-co-(pyridine-3,5-diyl)] (abbreviation: PF-Py), poly[(9,9-dioctylfluorene-2,7-diyl)-co-(2,2'-bipyridine-6,6'-diyl)] (abbreviation: PF-BPy) and the like are usable.

Electron Injecting Layer

The electron injecting layer is a layer containing a highly electron-injectable substance. Examples of a material for the electron injecting layer include an alkali metal, alkaline earth metal and a compound thereof, examples of which include lithium (Li), cesium (Cs), calcium (Ca), lithium fluoride (LiF), cesium fluoride (CsF), calcium fluoride ($CaF_2$), and lithium oxide (LiOx). In addition, the alkali metal, alkaline earth metal or the compound thereof may be added to the substance exhibiting the electron transportability in use. Specifically, for instance, magnesium (Mg) added to Alq may be used. In this case, the electrons can be more efficiently injected from the cathode.

Alternatively, the electron injecting layer may be provided by a composite material in a form of a mixture of the organic compound and the electron donor. Such a composite material exhibits excellent electron injectability and electron transportability since electrons are generated in the organic compound by the electron donor. In this case, the organic compound is preferably a material excellent in transporting the generated electrons. Specifically, the above examples (e.g., the metal complex and the hetero aromatic compound) of the substance forming the electron transporting layer are usable. As the electron donor, any substance exhibiting electron donating property to the organic compound is usable. Specifically, the electron donor is preferably alkali metal, alkaline earth metal and rare earth metal such as lithium, cesium, magnesium, calcium, erbium and ytterbium. The electron donor is also preferably alkali metal oxide and alkaline earth metal oxide such as lithium oxide, calcium oxide, and barium oxide. Moreover, a Lewis base such as magnesium oxide is usable. Further, the organic compound such as tetrathiafulvalene (abbreviation: TTF) is usable.

Capping Layer

Preferably, the organic EL device of a top emission type according to the exemplary embodiment has a capping layer on the top of the cathode.

As the capping layer, for instance, a high polymer compound, metal oxide, metal fluoride, metal boride, silicon nitride, and silicon compound (silicon oxide or the like) are usable.

Further, an aromatic amine derivative, an anthracene derivative, a pyrene derivative, a fluorene derivative, or a dibenzofuran derivative is usable for the capping layer.

Furthermore, a laminate obtained by layering layers containing these substances is also usable as the capping layer.

Color Conversion Portion

The color conversion portion is provided on a side of the organic EL device through which light is extracted, and serves as converting the light extracted through the side through which light is extracted to light with a desired color.

The color conversion portion is preferably disposed on an electrode (transparent electrode) that is either the anode or the cathode, which is provided on the side through which light is extracted.

The color conversion portion is exemplified by a color filter and a material including a quantum dot.

Color Filter

A material for the color filter is exemplified by the following dyes only and the dyes in a solid state in which the dyes are dissolved or dispersed in a binder resin.

Red (R) Dye

One or a mixture of at least two or more of a perylene pigment, lake pigment, azo pigment, quinacridone pigment, anthraquinone pigment, anthracene pigment, isoindoline pigment, isoindolinone pigment and the like are usable.

Green (G) Dye

One or a mixture of at least two or more of a halogen polysubstituted phthalocyanine pigment, halogen polysubstituted copper phthalocyanine pigment, triphenylmethane basic dyes, isoindoline pigment, isoindolinone pigment and the like are usable.

Blue (B) Dye

One or a mixture of at least two or more of a copper phthalocyanine pigment, indanthrone pigment, indophenol pigment, cyanine pigment, dioxazine pigment and the like are usable.

The binder resin used as the material for the color filter is preferably a transparent material. For instance, a material having a transmittance of 50% or more in a visible light region is preferably used.

Examples of the binder resin used as the material for the color filter include a transparent resin (polymer) such as polymethyl methacrylate, polyacrylate, polycarbonate, polyvinyl alcohol, polyvinyl pyrrolidone, hydroxyethyl cellulose, and carboxymethyl cellulose, among which one or a mixture of two or more thereof are usable.

Quantum Dot

A material including the quantum dot is exemplified by a material in which quantum dots are dispersed in a resin. CdSe, ZnSe, CdS, CdSeS/ZnS, InP, InP/ZnS, CdS/CdSe, CdS/ZnS, PbS, CdTe and the like are usable as the quantum dot.

The color filter and the material including the quantum dot may be used in combination for the color conversion portion.

Layer Formation Method

A method for forming each layer of the organic EL device in the exemplary embodiment is subject to no limitation except for the above particular description. However, known methods of dry film-forming such as vacuum deposition, sputtering, plasma or ion plating and wet film-forming such as spin coating, dipping, flow coating or ink-jet are applicable.

Film Thickness

The film thickness of each of the organic layers of the organic EL device according to the exemplary embodiment is not limited unless otherwise specified in the above. In general, the thickness preferably ranges from several nanometers to 1 μm because an excessively small film thickness is likely to cause defects (e.g. pin holes) and an excessively large thickness leads to the necessity of applying high voltage and consequent reduction in efficiency.

First Host Material and Second Host Material

In the organic EL device according to the exemplary embodiment, the first host material and the second host material are not particularly limited, provided that the host materials satisfy (a) relationships of Numerical Formulae 1, 20, and 30 or (b) the relationship of Numerical Formula 1 and the requirement "an overlap integral of the photoluminescence spectra of 99.0% or more".

In the organic EL device according to the exemplary embodiment, examples of the first host material and the second host material include the first compound represented by a formula (1), (1X), (12X), (13X), (14X), (15X), or (16X) below and the second compound represented by a formula (2) below. Further, the first compound is also usable as the first host material and the second host material. In this case, the compound represented by the formula (1), (1X), (12X), (13X), (14X), (15X), or (16X) that is used as the second host material is occasionally referred to as the second compound for convenience.

The third host material is not particularly limited. For instance, the first compound represented by the formula (1), (1X), (12X), (13X), (14X), (15X), or (16X) or the second compound represented by the formula (2) is usable as the third host material.

First Compound

[Formula 22]

(1)

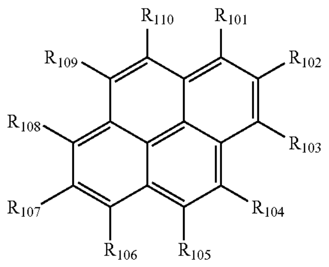

(11)

$*-(L_{101})_{mx}-Ar_{101}$

In the formula (1):

$R_{101}$ to $R_{110}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by $-Si(R_{901})(R_{902})(R_{903})$, a group represented by $-O-(R_{904})$, a group represented by $-S-(R_{905})$, a substituted or unsubstituted aralkyl group having 7 to 50 carbon atoms, a group represented by $-C(=O)R_{801}$, a group represented by $-COOR_{802}$, a halogen atom, a cyano group, a nitro group, a substituted or unsubstituted aryl group having 6 to 50 ring carbon atoms, a substituted or unsubstituted heterocyclic group having 5 to 50 ring atoms, or a group represented by the formula (11);

at least one of $R_{101}$ to $R_{110}$ is a group represented by the formula (11);

when a plurality of groups represented by the formula (11) are present, the plurality of groups represented by the formula (11) are mutually the same or different;

$L_{101}$ is a single bond, a substituted or unsubstituted arylene group having 6 to 50 ring carbon atoms, or a substituted or unsubstituted divalent heterocyclic group having 5 to 50 ring atoms;

$Ar_{101}$ is a substituted or unsubstituted aryl group having 6 to 50 ring carbon atoms, or a substituted or unsubstituted heterocyclic group having 5 to 50 ring atoms;

mx is 0, 1, 2, 3, 4, or 5; and when two or more $L_{101}$ are present, the two or more $L_{101}$ are mutually the same or different;

when two or more $Ar_{101}$ are present, the two or more $Ar_{101}$ are mutually the same or different; and

* in the formula (11) represents a bonding position to a pyrene ring in the formula (1).

In the first compound according to the exemplary embodiment: $R_{901}$, $R_{902}$, $R_{903}$, $R_{904}$, $R_{905}$, $R_{906}$, $R_{907}$, $R_{801}$, and $R_{802}$ are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms;

when a plurality of $R_{901}$ are present, the plurality of $R_{901}$ are mutually the same or different;

when a plurality of $R_{902}$ are present, the plurality of $R_{902}$ are mutually the same or different;

when a plurality of $R_{903}$ are present, the plurality of $R_{903}$ are mutually the same or different;

when a plurality of $R_{904}$ are present, the plurality of $R_{904}$ are mutually the same or different;

when a plurality of $R_{905}$ are present, the plurality of $R_{905}$ are mutually the same or different;

when a plurality of $R_{906}$ are present, the plurality of $R_{906}$ are mutually the same or different;

when a plurality of $R_{907}$ are present, the plurality of $R_{907}$ are mutually the same or different;

when a plurality of $R_{801}$ are present, the plurality of $R_{801}$ are mutually the same or different; and when a plurality of $R_{802}$ are present, the plurality of $R_{802}$ are mutually the same or different.

In the organic EL device according to the exemplary embodiment, the group represented by the formula (11) is preferably a group represented by a formula (111) below.

[Formula 23]

(111)

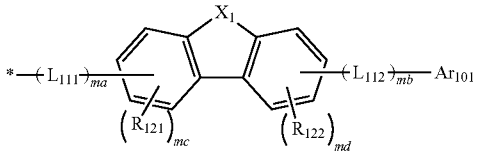

In the formula (111):

$X_1$ is $CR_{123}R_{124}$, an oxygen atom, a sulfur atom, or $NR_{125}$;

$L_{111}$ and $L_{112}$ are each independently a single bond, a substituted or unsubstituted arylene group having 6 to 50 ring carbon atoms, or a substituted or unsubstituted divalent heterocyclic group having 5 to 50 ring atoms;

ma is 0, 1, 2, 3, or 4;

mb is 0, 1, 2, 3, or 4;

ma+mb is 0, 1, 2, 3, or 4;

$Ar_{101}$ represents the same as $Ar_{101}$ in the formula (11);

$R_{121}$, $R_{122}$, $R_{123}$, $R_{124}$ and $R_{125}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si$(R_{901})(R_{902})(R_{903})$, a group represented by —O—$(R_{904})$, a group represented by —S—$(R_{905})$, a substituted or unsubstituted aralkyl group having 7 to 50 carbon atoms, a group represented by —C(═O)$R_{801}$, a group represented by —$COOR_{802}$, a halogen atom, a cyano group, a nitro group, a substituted or unsubstituted aryl group having 6 to 50 ring carbon atoms, or a substituted or unsubstituted heterocyclic group having 5 to ring atoms;

mc is 3;

three $R_{121}$ are mutually the same or different;

md is 3; and three $R_{122}$ are mutually the same or different.

Among positions *1 to *8 of carbon atoms in a cyclic structure represented by a formula (111a) below in the group represented by the formula (111), $L_{111}$ is bonded to one of the positions *1 to *4, $R_{121}$ is bonded to each of three positions of the rest of *1 to *4, $L_{112}$ is bonded to one of the positions *5 to *8, and $R_{122}$ is bonded to each of three positions of the rest of *5 to *8.

[Formula 24]

(111a)

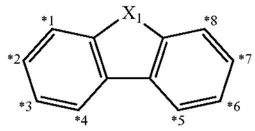

For instance, in the group represented by the formula (111), when $L_{111}$ is bonded to a carbon atom at a position *2 in the cyclic structure represented by the formula (111a) and $L_{112}$ is bonded to a carbon atom at a position *7 in the cyclic structure represented by the formula (111a), the group represented by the formula (111) is represented by a formula (111b) below.

[Formula 25]

(111b)

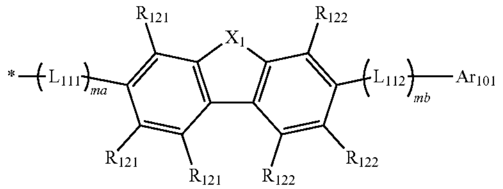

In the formula (111b):

$X_1$, $L_{111}$, $L_{112}$, ma, mb, $Ar_{101}$, $R_{121}$, $R_{122}$, $R_{123}$, $R_{124}$, and $R_{125}$ each independently represent the same as $X_1$, $L_{111}$, $L_{112}$, ma, mb, $Ar_{101}$, $R_{121}$, $R_{122}$, $R_{123}$, $R_{124}$, and $R_{125}$ in the formula (111);

a plurality of $R_{121}$ are mutually the same or different; and a plurality of $R_{122}$ are mutually the same or different.

In the organic EL device according to the exemplary embodiment, the group represented by the formula (111) is preferably a group represented by the formula (111b).

In the organic EL device according to the exemplary embodiment, it is preferable that ma is 0, 1, or 2, and mb is 0, 1, or 2.

In the organic EL device according to the exemplary embodiment, it is preferable that ma is 0 or 1, and mb is 0 or 1.

In the organic EL device according to the exemplary embodiment, $Ar_{101}$ is preferably a substituted or unsubstituted aryl group having 6 to 50 ring carbon atoms.

In the organic EL device according to the exemplary embodiment, it is preferable that $Ar_{101}$ is a substituted or unsubstituted phenyl group, a substituted or unsubstituted naphthyl group, a substituted or unsubstituted biphenyl group, a substituted or unsubstituted terphenyl group, a substituted or unsubstituted pyrenyl group, a substituted or unsubstituted phenanthryl group, or a substituted or unsubstituted fluorenyl group.

In the organic EL device according to the exemplary embodiment, $Ar_{101}$ is also preferably a group represented by a formula (12), a formula (13), or a formula (14) below.

[Formula 26]

(12)

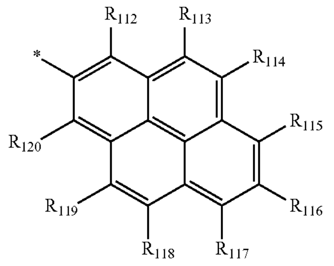

-continued (13)

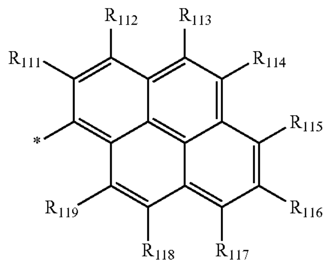

(14)

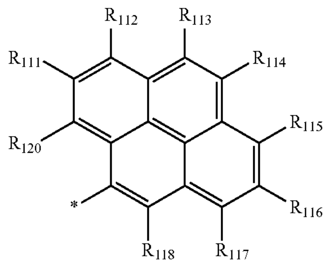

In the formulae (12), (13), and (14):

$R_{111}$ to $R_{120}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —$Si(R_{901})(R_{902})(R_{903})$, a group represented by —O—$(R_{904})$, a group represented by —S—$(R_{905})$, a group represented by —$N(R_{906})(R_{907})$, a substituted or unsubstituted aralkyl group having 7 to 50 carbon atoms, a group represented by —C(=O)$R_{124}$, a group represented by —$COOR_{125}$ a halogen atom, a cyano group, a nitro group, a substituted or unsubstituted aryl group having 6 to 50 ring carbon atoms, or a substituted or unsubstituted heterocyclic group having 5 to 50 ring atoms; and

* in the formulae (12), (13) and (14) represents a bonding position to $L_{101}$ in the formula (11), or a bonding position to $L_{112}$ in the formula (111) or (111b).

In the organic EL device according to the exemplary embodiment, the first compound is preferably represented by a formula (101) below.

[Formula 27]

(101)

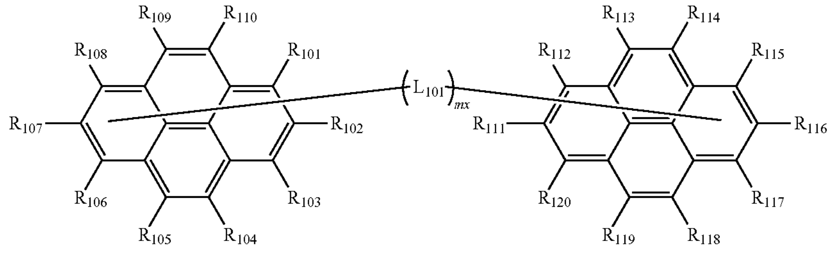

In the formula (101):

$R_{101}$ to $R_{120}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —$Si(R_{901})(R_{902})(R_{903})$, a group represented by —O—$(R_{904})$, a group represented by —S—$(R_{905})$, a substituted or unsubstituted aralkyl group having 7 to 50 carbon atoms, a group represented by —C(=O)$R_{801}$, a group represented by —$COOR_{802}$, a halogen atom, a cyano group, a nitro group, a substituted or unsubstituted aryl group having 6 to 50 ring carbon atoms, or a substituted or unsubstituted heterocyclic group having 5 to 50 ring atoms;

one of $R_{101}$ to $R_{110}$ represents a bonding position to $L_{101}$, and one of $R_{111}$ to $R_{120}$ represents a bonding position to $L_{101}$;

$L_{101}$ is a single bond, a substituted or unsubstituted arylene group having 6 to 50 ring carbon atoms, or a substituted or unsubstituted divalent heterocyclic group having 5 to 50 ring atoms;

mx is 0, 1, 2, 3, 4, or 5; and when two or more $L_{101}$ are present, the two or more $L_{101}$ are mutually the same or different.

In the organic EL device according to the exemplary embodiment, $L_{101}$ is preferably a single bond or a substituted or unsubstituted arylene group having 6 to ring carbon atoms.

In the organic EL device according to the exemplary embodiment, the first compound is preferably represented by a formula (102) below.

[Formula 28]

(102)

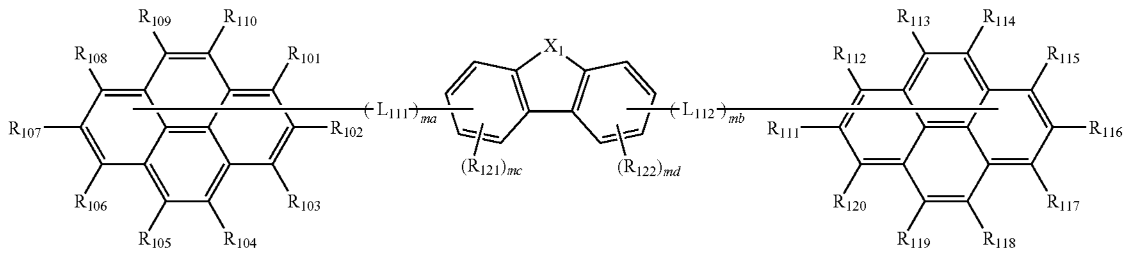

In the formula (102):

$R_{101}$ to $R_{120}$ each independently represent the same as $R_{101}$ to $R_{120}$ in the formula (101);

one of $R_{101}$ to Rim represents a bonding position to $L_{111}$, and one of $R_{111}$ to $R_{120}$ represents a bonding position to $L_{112}$, $X_1$ is $CR_{123}R_{124}$, an oxygen atom, a sulfur atom, or $NR_{125}$;

$L_{111}$ and $L_{112}$ are each independently a single bond, a substituted or unsubstituted arylene group having 6 to 50 ring carbon atoms, or a substituted or unsubstituted divalent heterocyclic group having 5 to 50 ring atoms;

ma is 0, 1, 2, 3, or 4;

mb is 0, 1, 2, 3, or 4;

ma+mb is 0, 1, 2, 3, or 4;

$R_{121}$, $R_{122}$, $R_{123}$, $R_{124}$ and $R_{125}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a substituted or unsubstituted aralkyl group having 7 to 50 carbon atoms, a group represented by —C(=O)$R_{801}$, a group represented by —COO$R_{802}$, a halogen atom, a cyano group, a nitro group, a substituted or unsubstituted aryl group having 6 to 50 ring carbon atoms, or a substituted or unsubstituted heterocyclic group having 5 to ring atoms;

mc is 3;

three $R_{121}$ are mutually the same or different;

and is 3; and three $R_{122}$ are mutually the same or different.

In the compound represented by the formula (102), it is preferable that: ma is 0, 1, or 2, and mb is 0, 1, or 2.

In the compound represented by the formula (102), it is preferable that: ma is 0 or 1, and mb is 0 or 1.

In the organic EL device according to the exemplary embodiment, it is preferable that two or more of $R_{101}$ to $R_{110}$ are each a group represented by the formula (11).

In the organic EL device according to the exemplary embodiment, it is preferable that two or more of $R_{101}$ to $R_{110}$ are each a group represented by the formula (11) and $Ar_{101}$ is a substituted or unsubstituted aryl group having 6 to 50 ring carbon atoms.

In the organic EL device according to the exemplary embodiment, it is preferable that $Ar_{101}$ is not a substituted or unsubstituted pyrenyl group, $L_{101}$ is not a substituted or unsubstituted pyrenylene group, and the substituted or unsubstituted aryl group having 6 to 50 ring carbon atoms for $R_{101}$ to $R_{110}$ not being the group represented by the formula (11) is not a substituted or unsubstituted pyrenyl group.

In the organic EL device according to the exemplary embodiment, it is preferable that $R_{101}$ to $R_{110}$ not being the group represented by the formula (11) are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to ring atoms.

In the organic EL device according to the exemplary embodiment, it is preferable that $R_{101}$ to $R_{110}$ not being the group represented by the formula (11) are each independently a hydrogen atom, a substituted or unsubstituted alkyl group having 1 to 50 carbon atoms, or a substituted or unsubstituted cycloalkyl group having 3 to 50 ring carbon atoms.

In the organic EL device according to the exemplary embodiment, $R_{101}$ to $R_{110}$ not being the group represented by the formula (11) are each preferably a hydrogen atom.

Compound Represented by Formula (1X)

In the organic EL device according to the exemplary embodiment, the first compound is also preferably a compound represented by a formula (1X) below.

[Formula 29]

(1X)

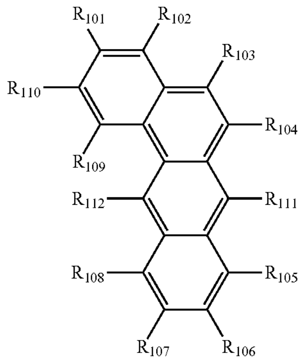

(11X)

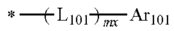

In the formula (1X):

$R_{101}$ to $R_{112}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a substituted or unsubstituted aralkyl group having 7 to 50 carbon atoms, a group represented by —C(═O)$R_{801}$, a group represented by —COOR$_{802}$, a halogen atom, a cyano group, a nitro group, a substituted or unsubstituted aryl group having 6 to 50 ring carbon atoms, a substituted or unsubstituted heterocyclic group having 5 to 50 ring atoms, or a group represented by the formula (11X);

at least one of $R_{101}$ to $R_{112}$ is a group represented by the formula (11X);

when a plurality of groups represented by the formula (11X) are present, the plurality of groups represented by the formula (11X) are mutually the same or different;

$L_{101}$ is a single bond, a substituted or unsubstituted arylene group having 6 to 50 ring carbon atoms, or a substituted or unsubstituted divalent heterocyclic group having 5 to 50 ring atoms;

$Ar_{101}$ is a substituted or unsubstituted aryl group having 6 to 50 ring carbon atoms, or a substituted or unsubstituted heterocyclic group having 5 to 50 ring atoms;

mx is 1, 2, 3, 4, or 5; and when two or more $L_{101}$ are present, the two or more $L_{101}$ are mutually the same or different;

when two or more $Ar_{101}$ are present, the two or more $Ar_{101}$ are mutually the same or different; and

* in the formula (11X) represents a bonding position to a benz[a]anthracene ring in the formula (1X).

In the organic EL device according to the exemplary embodiment, the group represented by the formula (11X) is preferably a group represented by a formula (111X) below.

[Formula 30]

(111X)

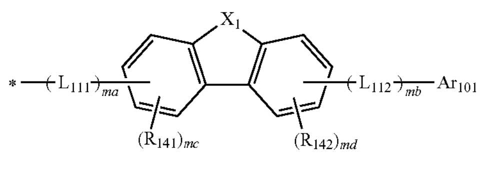

In the formula (111X):

$X_1$ is $CR_{143}R_{144}$, an oxygen atom, a sulfur atom, or $NR_{145}$;

$L_{111}$ and $L_{112}$ are each independently a single bond, a substituted or unsubstituted arylene group having 6 to 50 ring carbon atoms, or a substituted or unsubstituted divalent heterocyclic group having 5 to 50 ring atoms;

ma is 1, 2, 3, or 4;

mb is 1, 2, 3, or 4;

ma+mb is 2, 3, or 4;

$Ar_{101}$ represents the same as $Ar_{101}$ in the formula (11);

$R_{141}$, $R_{142}$, $R_{143}$, $R_{144}$, and $R_{145}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a substituted or unsubstituted aralkyl group having 7 to 50 carbon atoms, a group represented by —C(═O)$R_{801}$, a group represented by —COOR$_{802}$, a halogen atom, a cyano group, a nitro group, a substituted or unsubstituted aryl group having 6 to 50 ring carbon atoms, or a substituted or unsubstituted heterocyclic group having 5 to ring atoms;

mc is 3;

three $R_{141}$ are mutually the same or different;

and is 3; and three $R_{142}$ are mutually the same or different.

Among positions *1 to *8 of carbon atoms in a cyclic structure represented by a formula (111aX) below in the group represented by the formula (111X), $L_{111}$ is bonded to one of the positions *1 to *4, $R_{141}$ is bonded to each of three positions of the rest of *1 to *4, $L_{112}$ is bonded to one of the positions *5 to *8, and $R_{142}$ is bonded to each of three positions of the rest of *5 to *8.

[Formula 31]

(111aX)

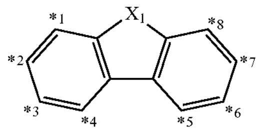

For instance, in the group represented by the formula (111X), when $L_{111}$ is bonded to a carbon atom at *2 in the cyclic structure represented by the formula (111aX) and $L_{112}$ is bonded to a carbon atom at *7 in the cyclic structure represented by the formula (111aX), the group represented by the formula (111X) is represented by a formula (111bX) below.

[Formula 32]

(111bX)

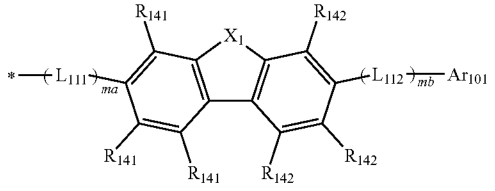

In the formula (111bX):

$X_1$, $L_{111}$, $L_{112}$, ma, mb, $Ar_{101}$, $R_{141}$, $R_{142}$, $R_{143}$, $R_{144}$ and $R_{145}$ each independently represent the same as $X_1$, $L_{111}$, $L_{112}$, ma, mb, $Ar_{101}$, $R_{141}$, $R_{142}$, $R_{143}$, $R_{144}$ and $R_{145}$ in the formula (111X);

a plurality of $R_{141}$ are mutually the same or different; and a plurality of $R_{142}$ are mutually the same or different.

In the organic EL device according to the exemplary embodiment, the group represented by the formula (111X) is preferably a group represented by the formula (111bX).

In the compound represented by the formula (1X), preferably, ma is 1 or 2 and mb is 1 or 2.

In the compound represented by the formula (1X), preferably, ma is 1 and mb is 1.

In the compound represented by the formula (1X), $Ar_{101}$ is preferably a substituted or unsubstituted aryl group having 6 to 50 ring carbon atoms.

In the compound represented by the formula (1X), $Ar_{101}$ is preferably a substituted or unsubstituted phenyl group, a substituted or unsubstituted naphthyl group, a substituted or unsubstituted biphenyl group, a substituted or unsubstituted terphenyl group, a substituted or unsubstituted benz[a]anthryl group; a substituted or unsubstituted pyrenyl group, a substituted or unsubstituted phenanthryl group, or a substituted or unsubstituted fluorenyl group.

The compound represented by the formula (1X) is also preferably represented by a formula (101X) below.

[Formula 33]

(101X)

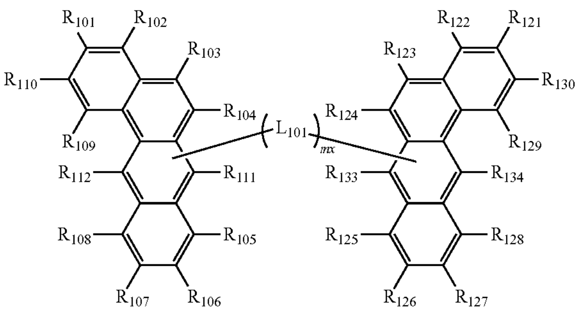

In the formula (101X):

one of $R_{111}$ and $R_{112}$ represents a bonding position to $L_{101}$ and one of $R_{133}$ and $R_{134}$ represents a bonding position to $L_{101}$;

$R_{101}$ to $R_{110}$, $R_{121}$ to $R_{130}$, $R_{111}$ or $R_{112}$ not being the bonding position to $L_{101}$, and $R_{133}$ or $R_{134}$ not being the bonding position to $L_{101}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a substituted or unsubstituted aralkyl group having 7 to 50 carbon atoms, a group represented by —C(=O)$R_{801}$, a group represented by —COO$R_{802}$, a halogen atom, a cyano group, a nitro group, a substituted or unsubstituted aryl group having 6 to 50 ring carbon atoms, or a substituted or unsubstituted heterocyclic group having 5 to ring atoms;

$L_{101}$ is a single bond, a substituted or unsubstituted arylene group having 6 to 50 ring carbon atoms, or a substituted or unsubstituted divalent heterocyclic group having 5 to 50 ring atoms;

mx is 1, 2, 3, 4, or 5; and when two or more $L_{101}$ are present, the two or more $L_{101}$ are mutually the same or different.

In the compound represented by the formula (1X), $L_{101}$ is preferably a single bond, or a substituted or unsubstituted arylene group having 6 to 50 ring carbon atoms.

The compound represented by the formula (1X) is also preferably represented by a formula (102X) below.

[Formula 34]

(102X)

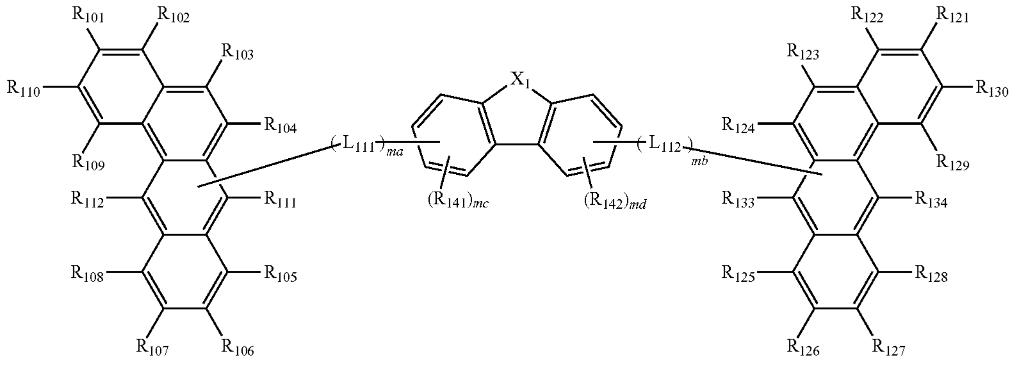

In the formula (102X):

one of $R_{111}$ and $R_{112}$ represents a bonding position to $L_{111}$ and one of $R_{133}$ and $R_{134}$ represents a bonding position to $L_{112}$, $R_{101}$ to $R_{110}$, $R_{121}$ to $R_{130}$, $R_{111}$ or $R_{112}$ not being the bonding position to $L_{111}$, and $R_{133}$ or $R_{134}$ not being the bonding position to $L_{112}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a substituted or unsubstituted aralkyl group having 7 to 50 carbon atoms, a group represented by —C(═O)$R_{801}$, a group represented by —COO$R_{802}$, a halogen atom, a cyano group, a nitro group, a substituted or unsubstituted aryl group having 6 to 50 ring carbon atoms, or a substituted or unsubstituted heterocyclic group having 5 to ring atoms; and $X_1$ is $CR_{143}R_{144}$, an oxygen atom, a sulfur atom, or $NR_{145}$;

$L_{111}$ and $L_{112}$ are each independently a single bond, a substituted or unsubstituted arylene group having 6 to 50 ring carbon atoms, or a substituted or unsubstituted divalent heterocyclic group having 5 to 50 ring atoms;

ma is 1, 2, 3, or 4;

mb is 1, 2, 3, or 4;

ma+mb is 2, 3, 4, or 5;

$R_{141}$, $R_{142}$, $R_{143}$, $R_{144}$, and $R_{145}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a substituted or unsubstituted aralkyl group having 7 to 50 carbon atoms, a group represented by —C(═O)$R_{801}$, a group represented by —COO$R_{802}$, a halogen atom, a cyano group, a nitro group, a substituted or unsubstituted aryl group having 6 to 50 ring carbon atoms, or a substituted or unsubstituted heterocyclic group having 5 to ring atoms;

mc is 3;

three $R_{141}$ are mutually the same or different;

md is 3; and three $R_{142}$ are mutually the same or different.

In the compound represented by the formula (1X), preferably, ma is 1 or 2 and mb is 1 or 2 in the formula (102X).

In the compound represented by the formula (1X), preferably, ma is 1 and mb is 1 in the formula (102X).

In the compound represented by the formula (1X), the group represented by the formula (11X) is also preferably a group represented by a formula (11AX) or a group represented by a formula (11BX) below.

[Formula 35]

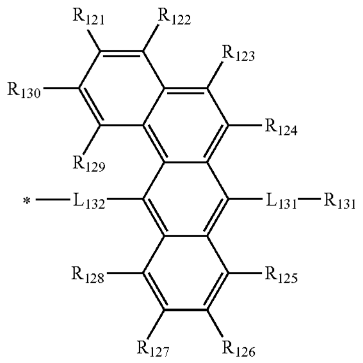

(11AX)

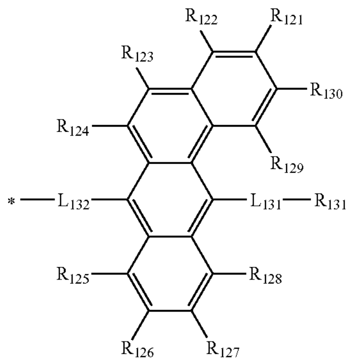

(11BX)

In the formulae (11AX) and (11BX):

$R_{121}$ to $R_{131}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a substituted or unsubstituted aralkyl group having 7 to 50 carbon atoms, a group represented by —C(═O)$R_{801}$, a group represented by —COO$R_{802}$, a halogen atom, a cyano group, a nitro group, a substituted or unsubstituted aryl group having 6 to 50 ring carbon atoms, or a substituted or unsubstituted heterocyclic group having 5 to 50 ring atoms;

when a plurality of groups represented by the formula (11AX) are present, the plurality of groups represented by the formula (11AX) are mutually the same or different;

when a plurality of groups represented by the formula (11BX) are present, the plurality of groups represented by the formula (11BX) are mutually the same or different;

$L_{131}$ and $L_{132}$ are each independently a single bond, a substituted or unsubstituted arylene group having 6 to 50 ring carbon atoms, or a substituted or unsubstituted divalent heterocyclic group having 5 to 50 ring atoms; and

* in each of the formulae (11AX) and (11BX) represents a bonding position to a benz[a]anthracene ring in the formula (1X).

The compound represented by the formula (1X) is also preferably represented by a formula (103X) below.

[Formula 36]

(103X)

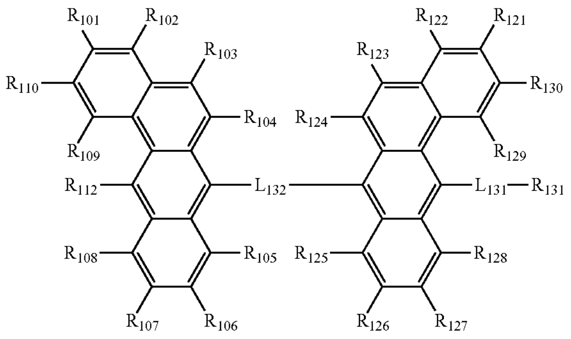

In the formula (103X):

$R_{101}$ to $R_{110}$ and $R_{112}$ respectively represent the same as $R_{101}$ to $R_{110}$ and $R_{112}$ in the formula (1X); and $R_{121}$ to $R_{131}$, $L_{131}$, and $L_{132}$ respectively represent the same as $R_{121}$ to $R_{131}$, $L_{131}$, and $L_{132}$ in the formula (11BX).

In the compound represented by the formula (1X), $L_{131}$ is also preferably a substituted or unsubstituted arylene group having 6 to 50 ring carbon atoms.

In the compound represented by the formula (1X), $L_{132}$ is also preferably a substituted or unsubstituted arylene group having 6 to 50 ring carbon atoms.

In the compound represented by the formula (1X), two or more of $R_{101}$ to $R_{112}$ are each also preferably a group represented by the formula (11X).

In the compound represented by the formula (1X), it is preferable that two or more of $R_{101}$ to $R_{112}$ are each a group represented by the formula (11X) and $Ar_{101}$ in the formula (11X) is a substituted or unsubstituted aryl group having 6 to 50 ring carbon atoms.

In the compound represented by the formula (1X): it is also preferable that $Ar_{101}$ is not a substituted or unsubstituted benz[a]anthryl group, $L_{101}$ is not a substituted or unsubstituted benz[a]anthrylene group, and the substituted or unsubstituted aryl group having 6 to 50 ring carbon atoms for $R_{101}$ to $R_{110}$ not being the group represented by the formula (11X) is not a substituted or unsubstituted benz[a]anthryl group.

In the compound represented by the formula (1X), $R_{101}$ to $R_{112}$ not being the group represented by the formula (11X) are preferably each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms.

In the compound represented by the formula (1X), $R_{101}$ to $R_{112}$ not being the group represented by the formula (11X) are each preferably a hydrogen atom, a substituted or unsubstituted alkyl group having 1 to 50 carbon atoms, or a substituted or unsubstituted cycloalkyl group having 3 to 50 ring carbon atoms.

In the compound represented by the formula (1X), $R_{101}$ to $R_{112}$ not being the group represented by the formula (11X) are each preferably a hydrogen atom.

Compound Represented by Formula (12X)

In the organic EL device according to the exemplary embodiment, the first compound is also preferably a compound represented by the formula (12X) below.

[Formula 37]

(12X)

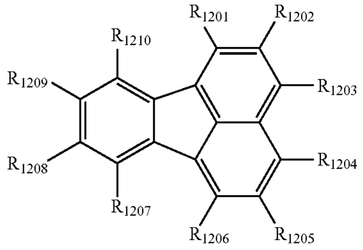

(121)

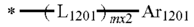

In the formula (12X):

at least one combination of adjacent two or more of $R_{1201}$ to $R_{1210}$ are mutually bonded to form a substituted or unsubstituted monocyclic ring, or mutually bonded to form a substituted or unsubstituted fused ring;

$R_{1201}$ to $R_{1210}$ forming neither the substituted or unsubstituted monocyclic ring nor the substituted or unsubstituted fused ring are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by $—Si(R_{901})(R_{902})(R_{903})$, a group represented by $—O—(R_{904})$, a group represented by $—S—(R_{905})$, a substituted or unsubstituted aralkyl group having 7 to 50 carbon atoms, a group represented by $—C(=O)R_{801}$, a group represented by $—COOR_{802}$, a halogen atom, a cyano group, a nitro group, a substituted or unsubstituted aryl group having 6 to 50 ring carbon atoms, a substituted or unsubstituted heterocyclic group having 5 to 50 ring atoms, or a group represented by the formula (121);

at least one of a substituent, if present, for the substituted or unsubstituted monocyclic ring, a substituent, if present, for the substituted or unsubstituted fused ring, or $R_{1201}$ to $R_{1210}$ is a group represented by the formula (121);

when a plurality of groups represented by the formula (121) are present, the plurality of groups represented by the formula (121) are mutually the same or different;

$L_{1201}$ is a single bond, a substituted or unsubstituted arylene group having 6 to 50 ring carbon atoms, or a substituted or unsubstituted divalent heterocyclic group having 5 to 50 ring atoms;

$Ar_{1201}$ is a substituted or unsubstituted aryl group having 6 to 50 ring carbon atoms, or a substituted or unsubstituted heterocyclic group having 5 to 50 ring atoms;

mx2 is 0, 1, 2, 3, 4, or 5;

when two or more $L_{1201}$ are present, the two or more $L_{1201}$ are mutually the same or different;

when two or more $Ar_{1201}$ are present, the two or more $Ar_{1201}$ are mutually the same or different; and

* in the formula (121) represents a bonding position to a ring represented by the formula (12X).

In the formula (12X), combinations of adjacent two of $R_{1201}$ to $R_{1210}$ refer to a combination of $R_{1201}$ and $R_{1202}$, a combination of $R_{1202}$ and $R_{1203}$, a combination of $R_{1203}$ and $R_{1204}$, a combination of $R_{1204}$ and $R_{1205}$, a combination of $R_{1205}$ and $R_{1206}$, a combination of $R_{1207}$ and $R_{1208}$, a combination of $R_{1208}$ and $R_{1209}$, and a combination of $R_{1209}$ and $R_{1210}$.

Compound Represented by Formula (13X)

In the organic EL device according to the exemplary embodiment, the first compound is also preferably a compound represented by the formula (13X) below.

[Formula 38]

(13X)

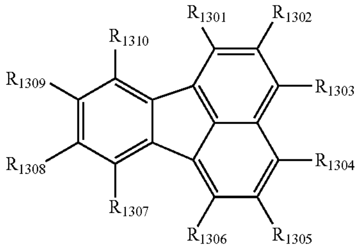

(131)

$$* \!-\!\!\left(L_{1301}\right)_{mx3}\!-\! Ar_{1301}$$

In the formula (13X):

$R_{1301}$ to $R_{1310}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by $—Si(R_{901})(R_{902})(R_{903})$, a group represented by $—O—(R_{904})$, a group represented by $—S—(R_{905})$, a substituted or unsubstituted aralkyl group having 7 to 50 carbon atoms, a group represented by $—C(=O)R_{801}$, a group represented by $—COOR_{802}$, a halogen atom, a cyano group, a nitro group, a substituted or unsubstituted aryl group having 6 to 50 ring carbon atoms, a substituted or unsubstituted heterocyclic group having 5 to 50 ring atoms, or a group represented by the formula (131), at least one of $R_{1301}$ to $R_{1310}$ is a group represented by the formula (131);

when a plurality of groups represented by the formula (131) are present, the plurality of groups represented by the formula (131) are mutually the same or different;

$L_{1301}$ is a single bond, a substituted or unsubstituted arylene group having 6 to 50 ring carbon atoms, or a substituted or unsubstituted divalent heterocyclic group having 5 to 50 ring atoms;

$Ar_{1301}$ is a substituted or unsubstituted aryl group having 6 to 50 ring carbon atoms, or a substituted or unsubstituted heterocyclic group having 5 to 50 ring atoms;

mx3 is 0, 1, 2, 3, 4, or 5;

when two or more $L_{1301}$ are present, the two or more $L_{1301}$ are mutually the same or different;

when two or more $Ar_{1301}$ are present, the two or more $Ar_{1301}$ are mutually the same or different; and

* in the formula (131) represents a bonding position to a fluoranthene ring represented by the formula (13X).

In the organic EL device of the exemplary embodiment, none of combinations of adjacent two or more of $R_{1301}$ to $R_{1310}$ not being the group represented by the formula (131) are bonded to each other. Combinations of adjacent two of $R_{1301}$ to $R_{1310}$ in the formula (13X) refer to a combination of $R_{1301}$ and $R_{1302}$, a combination of $R_{1302}$ and $R_{1303}$, a combination of $R_{1303}$ and $R_{1304}$, a combination of $R_{1304}$ and $R_{1305}$, a combination of $R_{1305}$ and $R_{1306}$, a combination of $R_{1307}$ and $R_{1308}$, a combination of $R_{1308}$ and $R_{1309}$, and a combination of $R_{1309}$ and $R_{1310}$.

Compound Represented by Formula (14X)

In the organic EL device of the exemplary embodiment, the first compound is also preferably a compound represented by the formula (14X) below.

[Formula 39]

(14X)

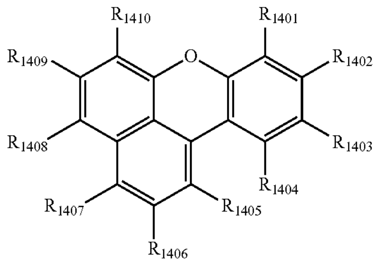

(141)

$$* \!-\!\!\left(L_{1401}\right)_{mx4}\!-\! Ar_{1401}$$

In the formula (14X):

$R_{1401}$ to $R_{1410}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by $—Si(R_{901})(R_{902})(R_{903})$, a group represented by $—O—(R_{904})$, a group represented by $—S—(R_{905})$, a substituted or unsubstituted aralkyl group having 7 to 50 carbon atoms, a group represented by $—C(=O)R_{801}$, a group represented by $—COOR_{802}$, a halogen atom, a cyano group, a nitro group, a substituted or unsubstituted aryl group having 6 to 50 ring carbon atoms, a substituted or unsubstituted heterocyclic group having 5 to 50 ring atoms, or a group represented by the formula (141);

at least one of $R_{1401}$ to $R_{1410}$ is a group represented by the formula (141);

when a plurality of groups represented by the formula (141) are present, the plurality of groups represented by the formula (141) are mutually the same or different;

$L_{1401}$ is a single bond, a substituted or unsubstituted arylene group having 6 to 50 ring carbon atoms, or a substituted or unsubstituted divalent heterocyclic group having 5 to 50 ring atoms;

$Ar_{1401}$ is a substituted or unsubstituted aryl group having 6 to 50 ring carbon atoms, or a substituted or unsubstituted heterocyclic group having 5 to 50 ring atoms;

mx4 is 0, 1, 2, 3, 4 or 5;

when two or more $L_{1401}$ are present, the two or more $L_{1401}$ are mutually the same or different;

when two or more $Ar_{1401}$ are present, the two or more $Ar_{1401}$ are mutually the same or different; and

* in the formula (141) represents a bonding position to a ring represented by the formula (14X).

Compound Represented by Formula (15X)

In the organic EL device of the exemplary embodiment, the first compound is also preferably a compound represented by the formula (15X) below.

[Formula 40]

(15X)

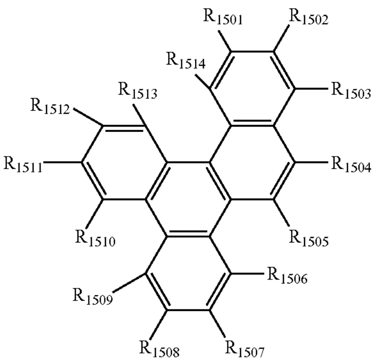

(151)

$* \text{—}(L_{1501})_{mx5}\text{—}Ar_{1501}$

In the formula (15X):

$R_{1501}$ to $R_{1514}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —$Si(R_{901})(R_{902})(R_{903})$, a group represented by —O—$(R_{904})$, a group represented by —S—$(R_{905})$, a substituted or unsubstituted aralkyl group having 7 to 50 carbon atoms, a group represented by —$C(=O)R_{801}$, a group represented by —$COOR_{802}$, a halogen atom, a cyano group, a nitro group, a substituted or unsubstituted aryl group having 6 to 50 ring carbon atoms, a substituted or unsubstituted heterocyclic group having 5 to 50 ring atoms, or a group represented by the formula (151);

at least one of $R_{1501}$ to $R_{1514}$ is a group represented by the formula (151);

when a plurality of groups represented by the formula (151) are present, the plurality of groups represented by the formula (151) are mutually the same or different;

$L_{1501}$ is a single bond, a substituted or unsubstituted arylene group having 6 to 50 ring carbon atoms, or a substituted or unsubstituted divalent heterocyclic group having 5 to 50 ring atoms;

$Ar_{1501}$ is a substituted or unsubstituted aryl group having 6 to 50 ring carbon atoms, or a substituted or unsubstituted heterocyclic group having 5 to 50 ring atoms;

mx5 is 0, 1, 2, 3, 4, or 5;

when two or more $L_{1501}$ are present, the two or more $L_{1501}$ are mutually the same or different;

when two or more $Ar_{1501}$ are present, the two or more $Ar_{1501}$ are mutually the same or different; and

* in the formula (151) represents a bonding position to a ring represented by the formula (15X).

Compound Represented by Formula (16X)

In the organic EL device according to the exemplary embodiment, the first compound is also preferably a compound represented by the formula (16X) below.

[Formula 41]

(16X)

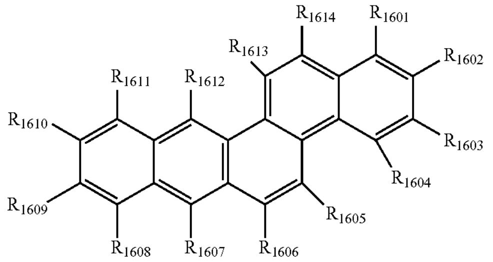

(161)

$* \text{—}(L_{1601})_{mx6}\text{—}Ar_{1601}$

In the formula (16X):

$R_{1601}$ to $R_{1614}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —$Si(R_{901})(R_{902})(R_{903})$, a group represented by —O—$(R_{904})$, a group represented by —S—$(R_{905})$, a substituted or unsubstituted aralkyl group having 7 to 50 carbon atoms, a group represented by —$C(=O)R_{801}$, a group represented by —$COOR_{802}$, a halogen atom, a cyano group, a nitro group, a substituted or unsubstituted aryl group having 6 to 50 ring carbon atoms, a substituted or unsubstituted heterocyclic group having 5 to 50 ring atoms, or a group represented by the formula (161);

at least one of $R_{1601}$ to $R_{1614}$ is a group represented by the formula (161);

when a plurality of groups represented by the formula (161) are present, the plurality of groups represented by the formula (161) are mutually the same or different;

$L_{1601}$ is a single bond, a substituted or unsubstituted arylene group having 6 to 50 ring carbon atoms, or a substituted or unsubstituted divalent heterocyclic group having 5 to 50 ring atoms;

$Ar_{1601}$ is a substituted or unsubstituted aryl group having 6 to 50 ring carbon atoms, or a substituted or unsubstituted heterocyclic group having 5 to 50 ring atoms;

mx6 is 0, 1, 2, 3, 4, or 5;

when two or more $L_{1601}$ are present, the two or more $L_{1601}$ are mutually the same or different;

when two or more $Ar_{1601}$ are present, the two or more $Ar_{1601}$ are mutually the same or different; and

* in the formula (161) represents a bonding position to a ring represented by the formula (16X).

In the organic EL device according to the exemplary embodiment, also preferably, the first host material has, in a molecule, a linking structure including a benzene ring and a naphthalene ring linked to each other with a single bond, in which the benzene ring and the naphthalene ring in the linking structure are each independently fused or not fused with a further monocyclic ring or fused ring, and the benzene ring and the naphthalene ring in the linking structure are further linked to each other by cross-linking at at least one site other than the single bond.

When the first host material has the linking structure including such cross-linking, deterioration in the chromaticity of the organic EL device is expected to be inhibited.

The first host material in the above case is only required to have a linking structure as the minimum unit in a molecule, the linking structure including a benzene ring and a naphthalene ring linked to each other with a single bond (occasionally referred to as a benzene-naphthalene linking structure), the linking structure being as represented by a formula (X1) or a formula (X2) below. Further, the benzene ring may be fused with a monocyclic ring or fused ring, and the naphthalene ring may be fused with a monocyclic ring or fused ring. For instance, also in a case where the first host material has, in a molecule, a linking structure including a naphthalene ring and a naphthalene ring linked to each other with a single bond (occasionally referred to as a naphthalene-naphthalene linking structure) and being as represented by a formula (X3), a formula (X4), or a formula (X5) below, the naphthalene-naphthalene linking structure is regarded as including the benzene-naphthalene linking structure since one of the naphthalene rings includes a benzene ring.

[Formula 42]

(X1)

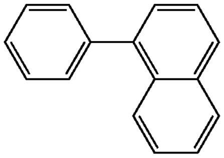

(X2)

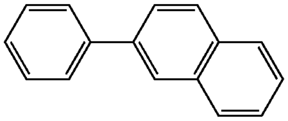

(X3)

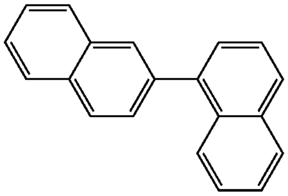

(X4)

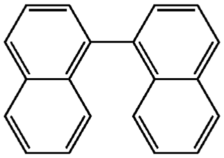

(X5)

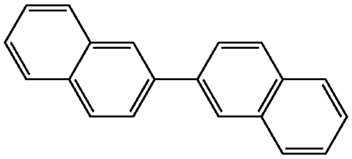

In the organic EL device according to the exemplary embodiment, the cross-linking also preferably includes a double bond. Specifically, the first host material also preferably has a structure in which the benzene ring and the naphthalene ring are further linked to each other at any other site than the single bond by the cross-linking structure including a double bond.

Assuming that the benzene ring and the naphthalene ring in the benzene-naphthalene linking structure are further linked to each other at at least one site other than the single bond by cross-linking, for instance, a linking structure (fused ring) represented by a formula (X11) below is obtained in a case of the formula (X1), and a linking structure (fused ring) represented by a formula (X31) below is obtained in a case of the formula (X3).

Assuming that the benzene ring and the naphthalene ring in the benzene-naphthalene linking structure are further linked to each other at any other site than the single bond by cross-linking including a double bond, for instance, a linking structure (fused ring) represented by a formula (X12) below is obtained in a case of the formula (X1), a linking structure (fused ring) represented by a formula (X21) or formula (X22) below is obtained in a case of the formula (X2), a linking structure (fused ring) represented by a formula (X41) below is obtained in a case of the formula (X4), and a linking structure (fused ring) represented by a formula (X51) below is obtained in a case of the formula (X5).

Assuming that the benzene ring and the naphthalene ring in the benzene-naphthalene linking structure are further linked to each other at at least one site other than the single bond by cross-linking including a hetero atom (e.g., an oxygen atom), for instance, a linking structure (fused ring) represented by a formula (X13) below is obtained in a case of the formula (X1).

[Formula 43]

(X11)

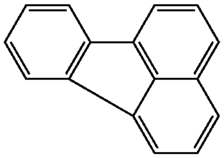

(X12)

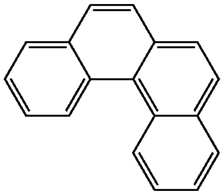

(X13)

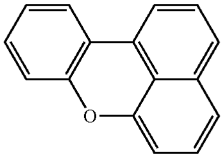

(X21)

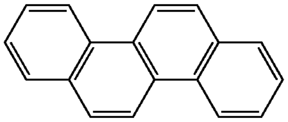

-continued (X22)

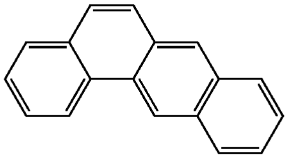

(X31)

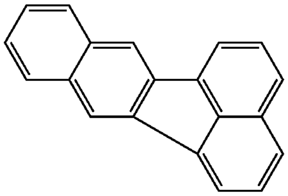

(X41)

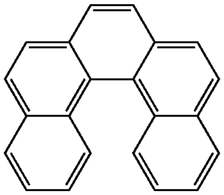

(X51)

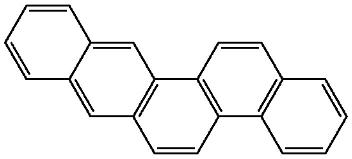

In the organic EL device according to the exemplary embodiment, also preferably, the first host material has, in a molecule, a biphenyl structure including a first benzene ring and a second benzene ring linked to each other with a single bond, and the first benzene ring and the second benzene ring in the biphenyl structure are further linked to each other by cross-linking at at least one site other than the single bond.

In the organic EL device according to the exemplary embodiment, also preferably, the first benzene ring and the second benzene ring in the biphenyl structure are further linked to each other by the cross-linking at one site other than the single bond. When the first host material has the biphenyl structure including such cross-linking, deterioration in the chromaticity of the organic EL device is expected to be inhibited.

In the organic EL device according to the exemplary embodiment, the cross-linking also preferably includes a double bond.

In the organic EL device according to the exemplary embodiment, the cross-linking also preferably includes no double bond.

Also preferably, the first benzene ring and the second benzene ring in the biphenyl structure are further linked to each other by the cross-linking at two sites other than the single bond.

In the organic EL device according to the exemplary embodiment, also preferably, the first benzene ring and the second benzene ring in the biphenyl structure are further linked to each other by the cross-linking at two sites other than the single bond, and the cross-linking includes no double bond. When the first host material has the biphenyl structure including such cross-linking, deterioration in the chromaticity of the organic EL device is expected to be inhibited.

For instance, assuming that the first benzene ring and the second benzene ring in the biphenyl structure represented by a formula (BP1) below are further linked to each other by cross-linking at at least one site other than the single bond, the biphenyl structure is exemplified by linking structures (fused rings) represented by formulae (BP11) to (BP15) below.

[Formula 44]

(BP1)

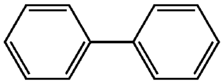

(BP11)

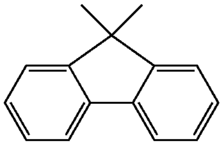

(BP12)

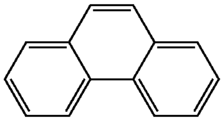

(BP13)

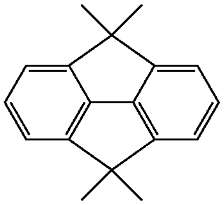

(BP14)

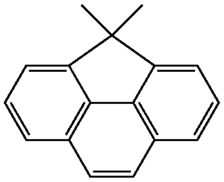

(BP15)

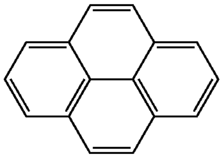

The formula (BP11) represents a linking structure in which the first benzene ring and the second benzene ring are linked to each other at one site other than the single bond by cross-linking including no double bond.

The formula (BP12) represents a linking structure in which the first benzene ring and the second benzene ring are linked to each other at one site other than the single bond by cross-linking including a double bond.

The formula (BP13) represents a linking structure in which the first benzene ring and the second benzene ring are linked to each other at two sites other than the single bond by cross-linking including no double bond.

The formula (BP14) represents a linking structure in which the first benzene ring and the second benzene ring are linked to each other by cross-linking including no double bond at one of two sites other than the single bond, and the first benzene ring and the second benzene ring are linked to each other by cross-linking including a double bond at the other of the two sites other than the single bond.

The formula (BP15) represents a linking structure in which the first benzene ring and the second benzene ring are linked to each other at two sites other than the single bond by cross-linking including a double bond.

In the first compound and the second compound, the groups specified to be "substituted or unsubstituted" are each preferably an "unsubstituted" group.

Method of Producing First Compound

The first compound can be produced by a known method. The first compound can also be produced based on a known method through a known alternative reaction using a known material(s) tailored for the target compound.

Specific Examples of First Compound

Specific examples of the first compound include the following compounds. It should however be noted that the invention is not limited to the specific examples of the first compound.

In the specific examples of the compound herein, D represents a deuterium atom, Me represents a methyl group, and tBu represents a tert-butyl group.

[Formula 45]

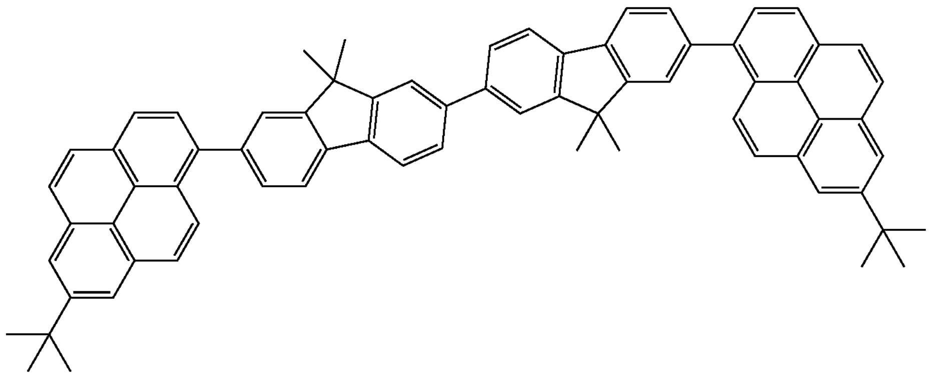

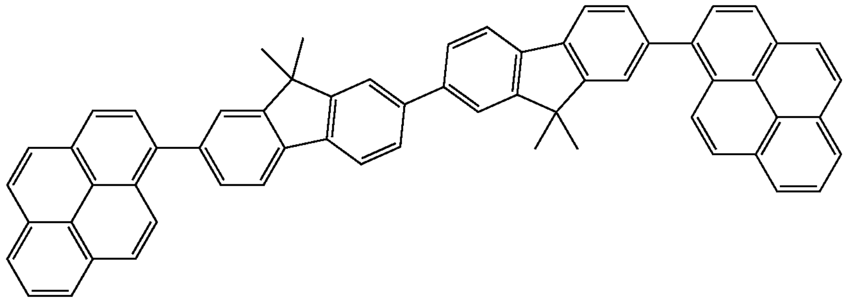

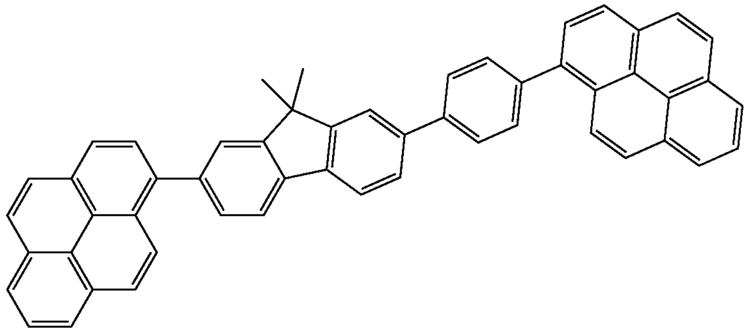

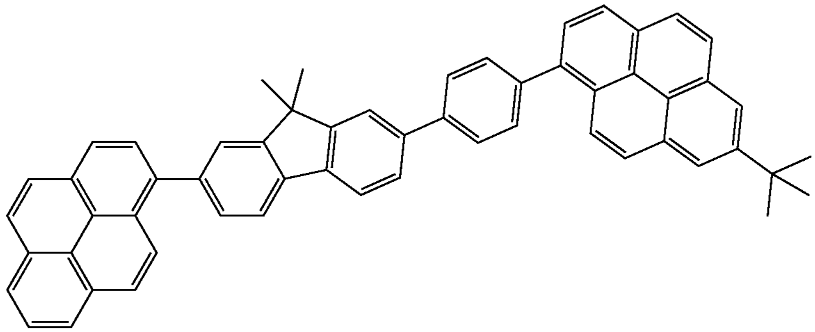

-continued
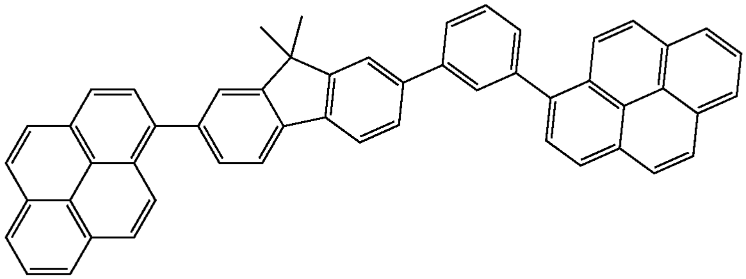
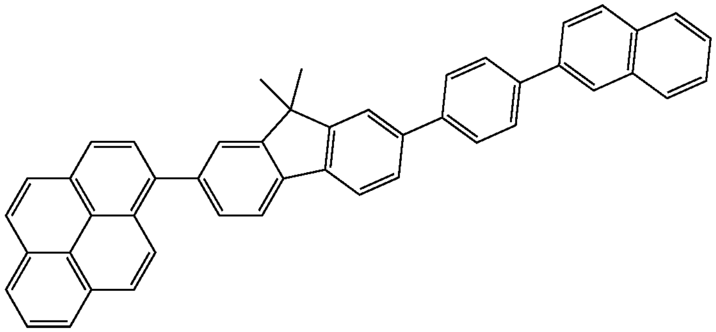
[Formula 46]
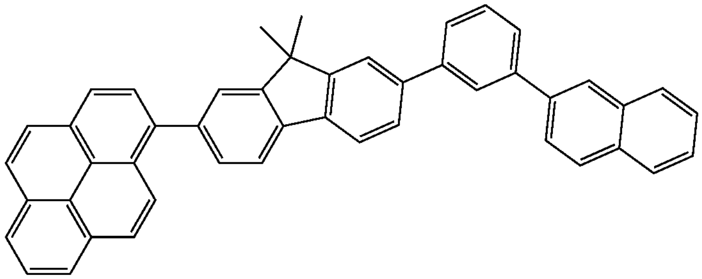
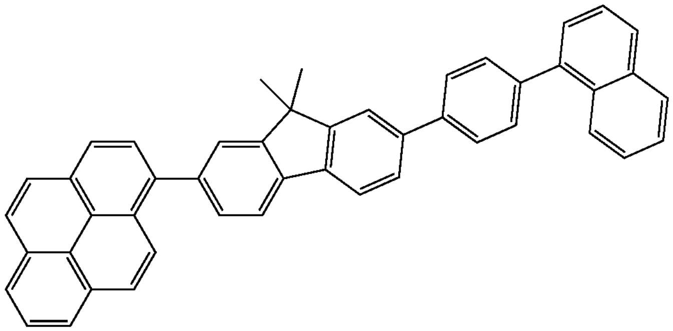
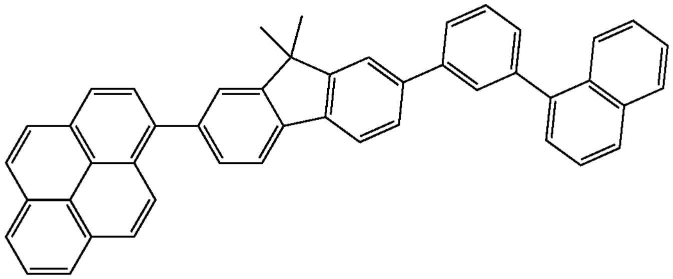

-continued
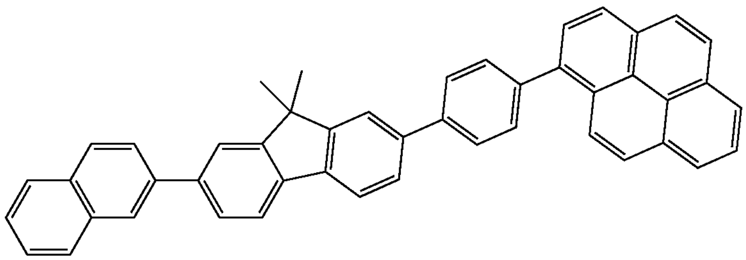
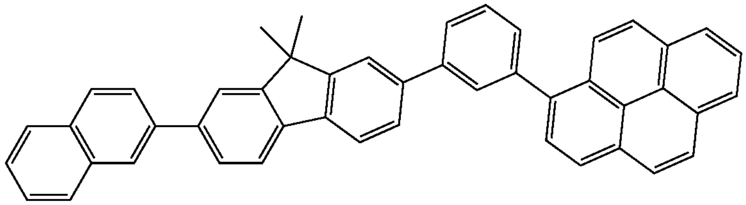
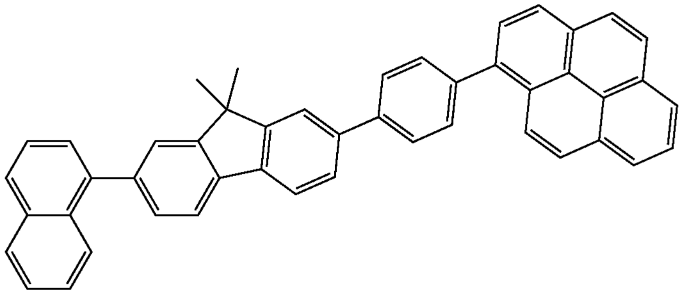
[Formula 47]
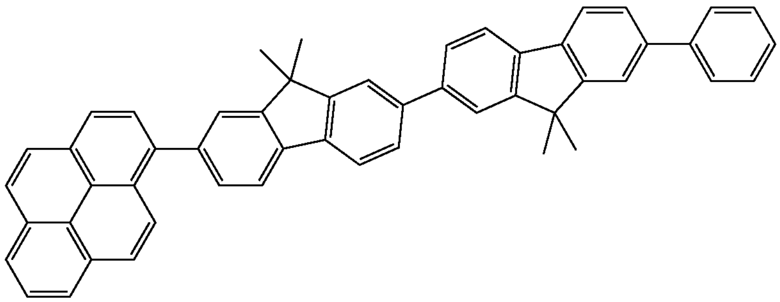
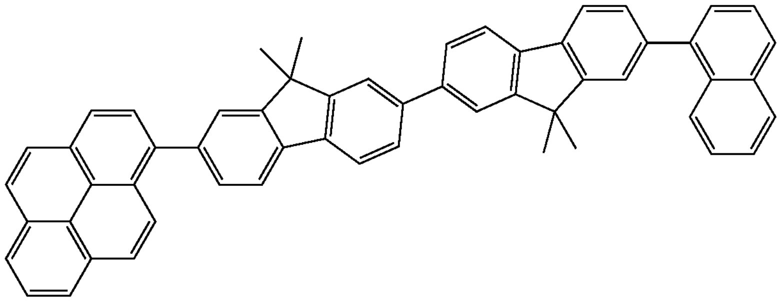
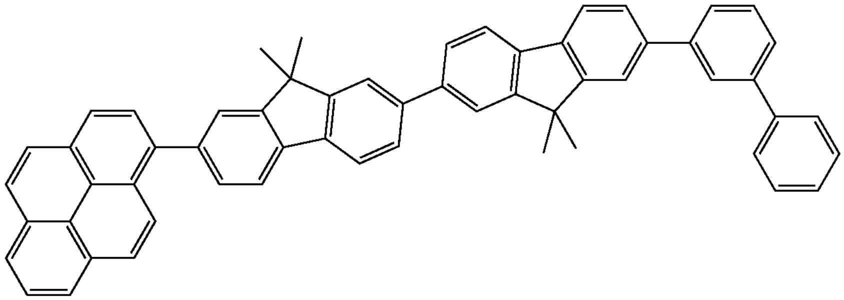

-continued
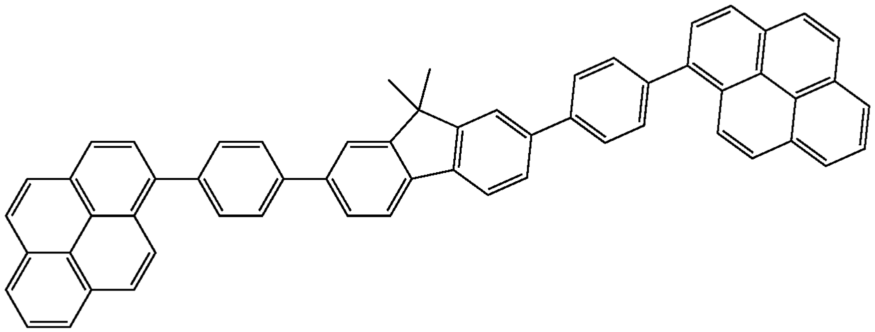
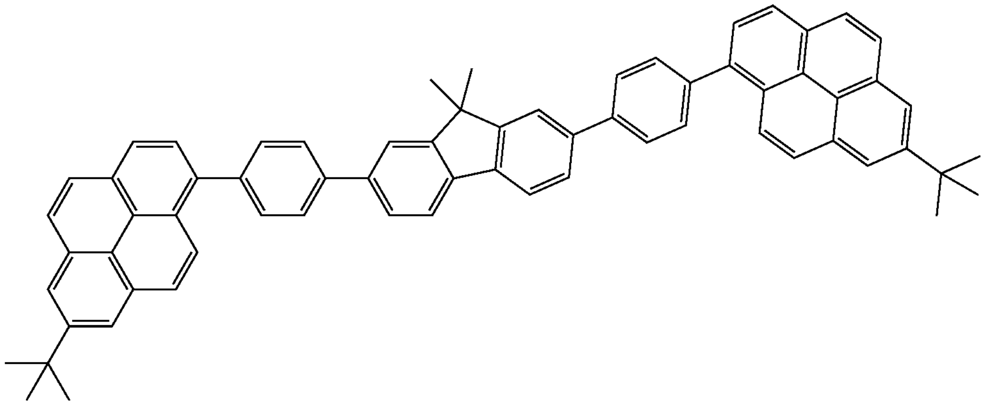
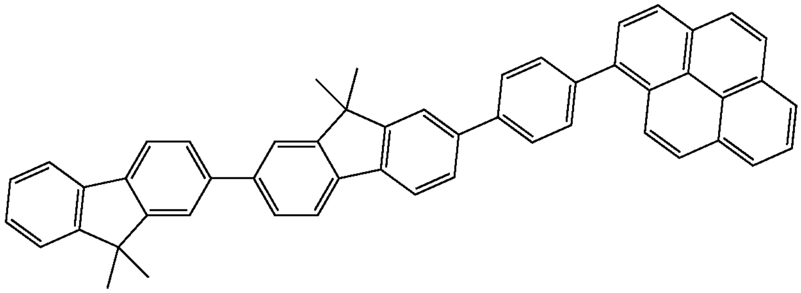
[Formula 48]
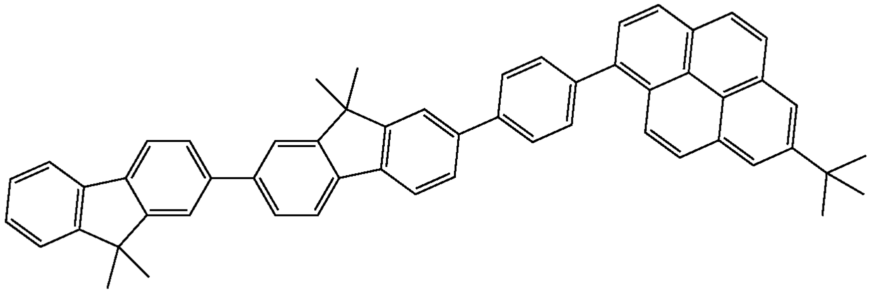
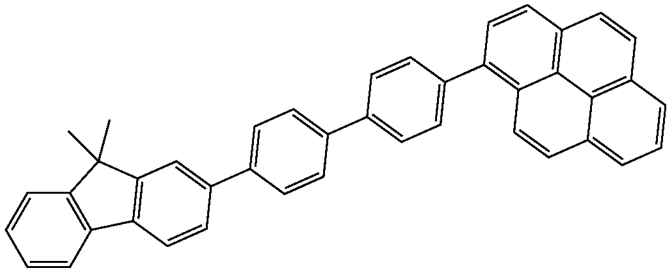

-continued
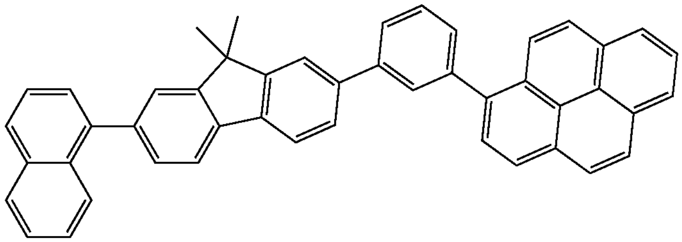
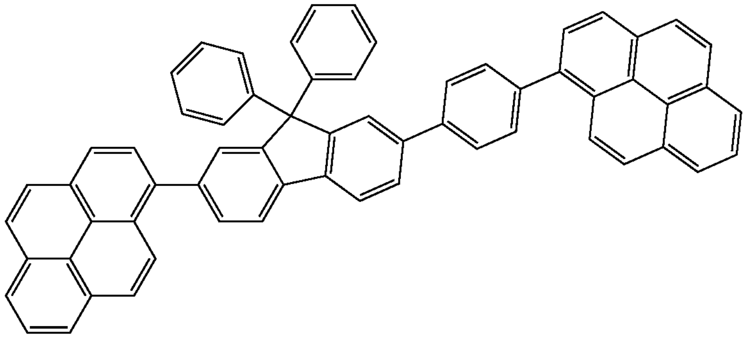
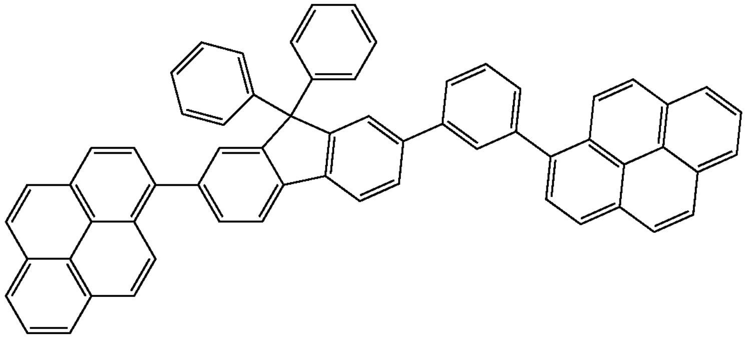
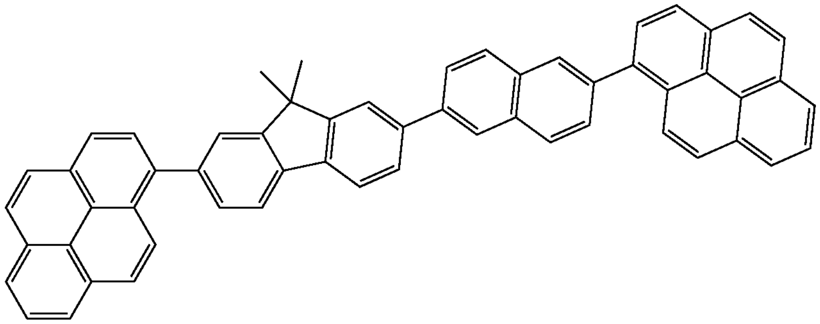
[Formula 49]
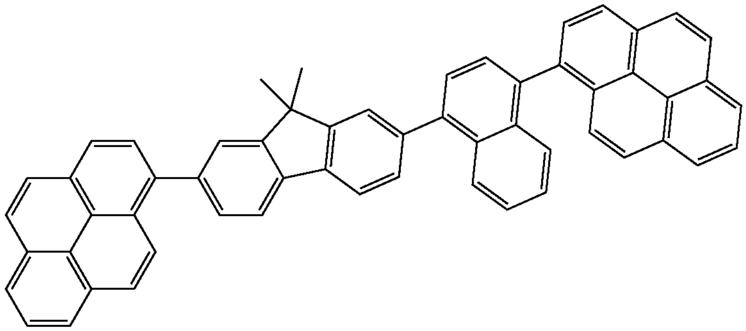

-continued
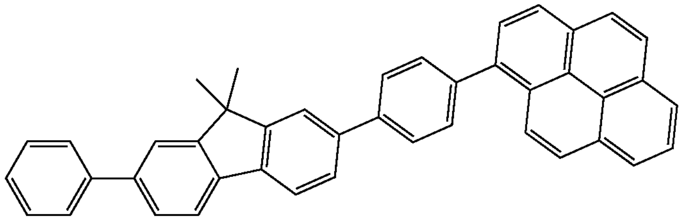
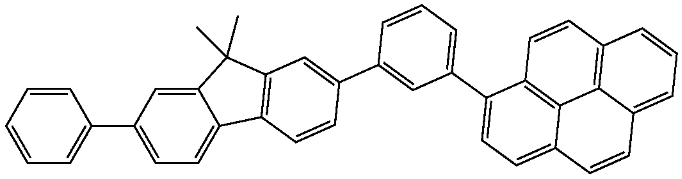
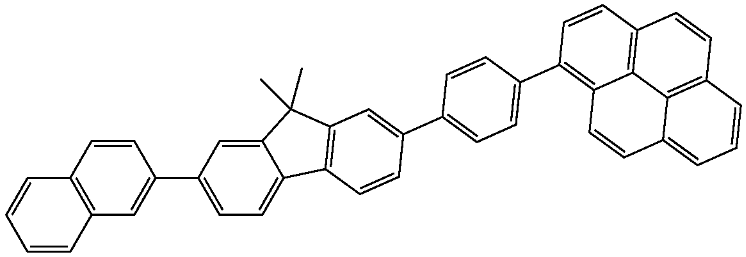
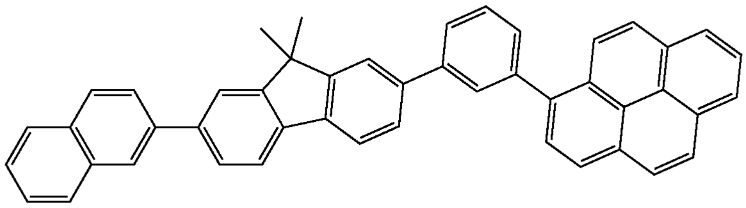
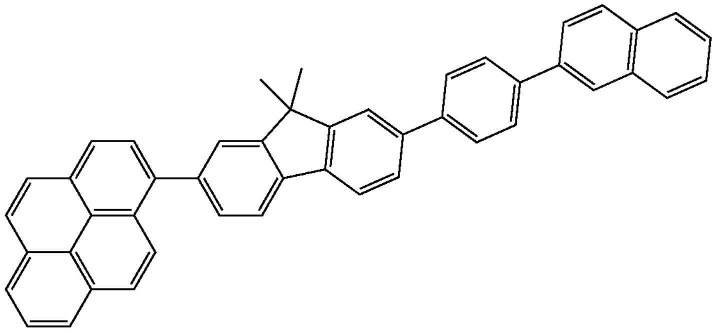
[Formula 50]
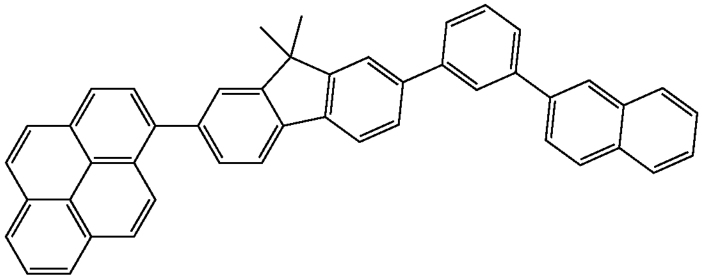

-continued
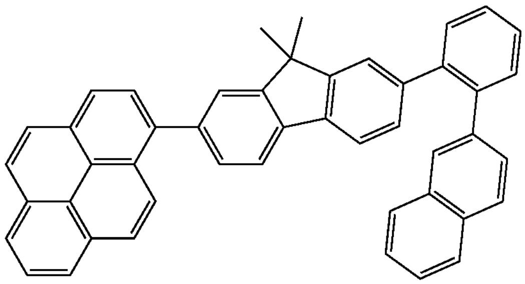
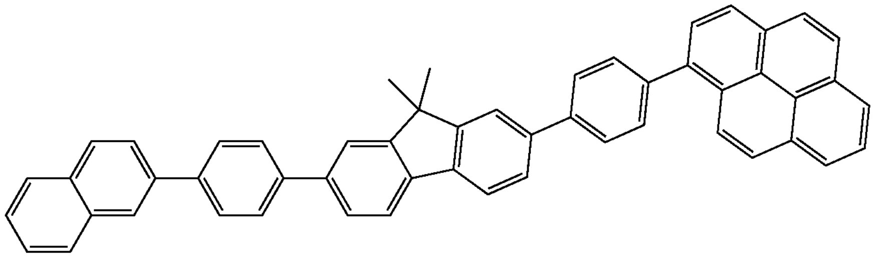
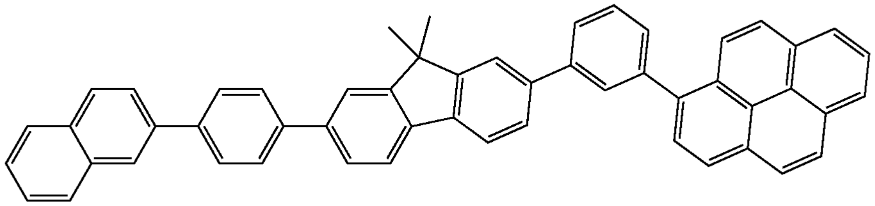
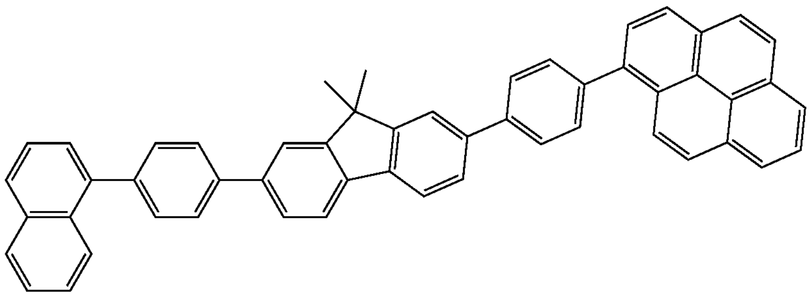
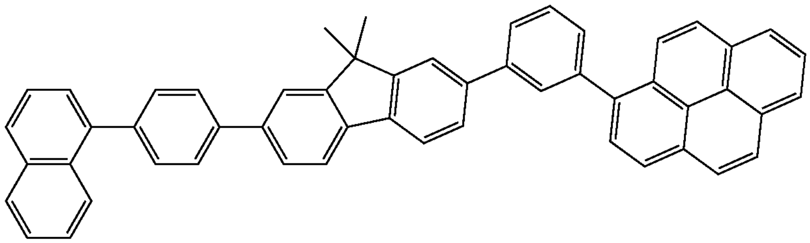
[Formula 51]
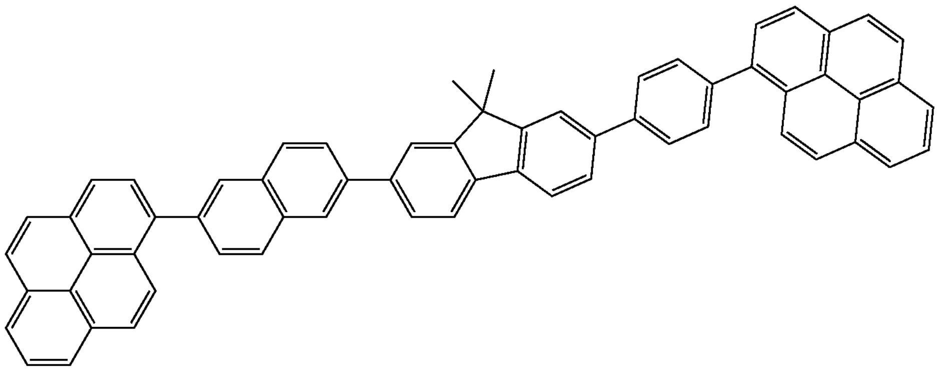

-continued
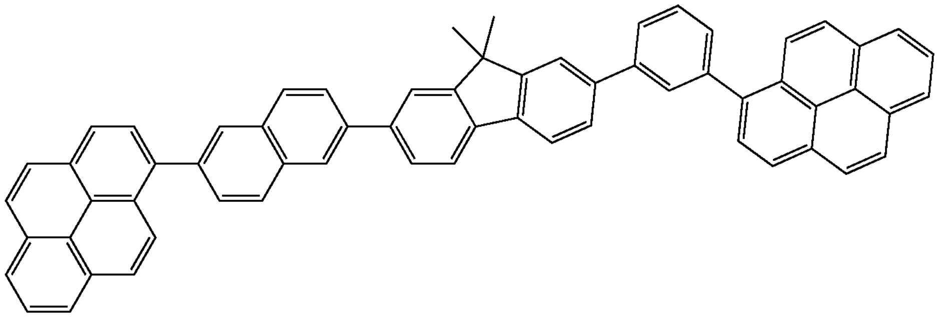
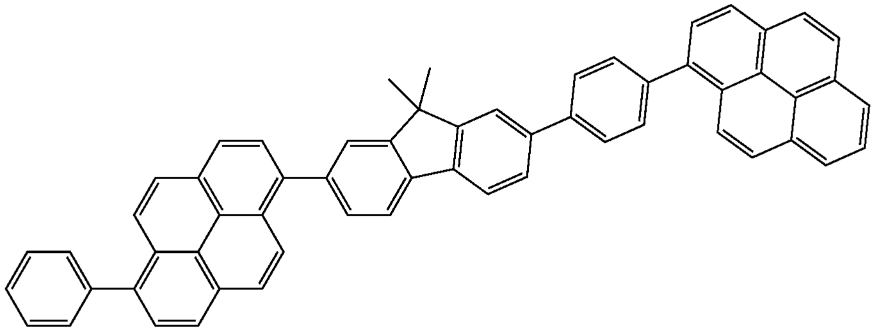
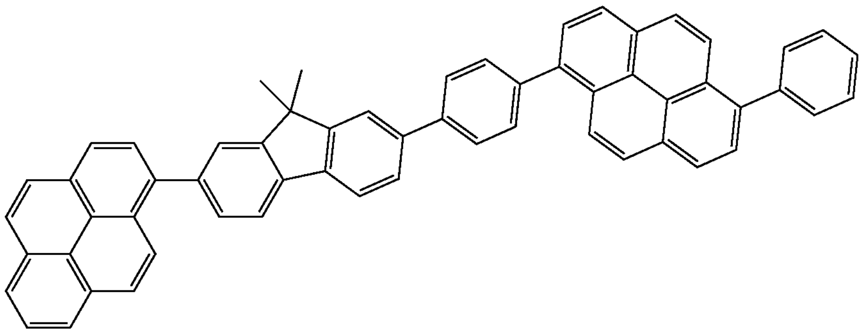
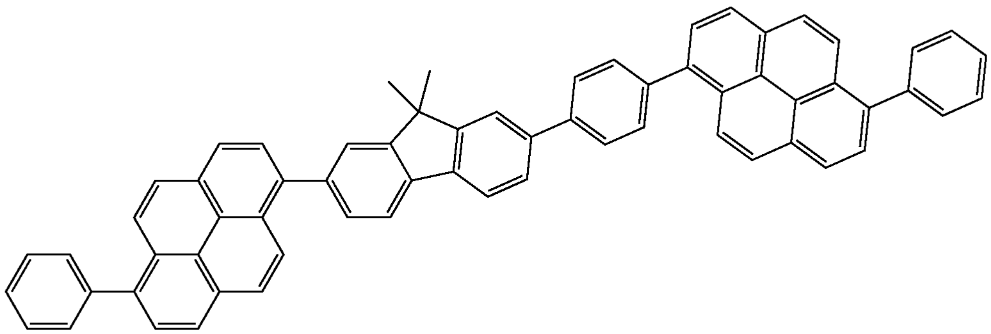
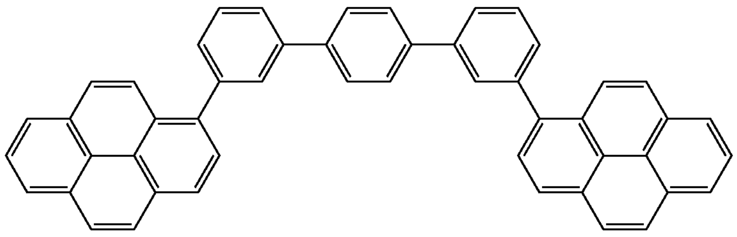

-continued
[Formula 52]
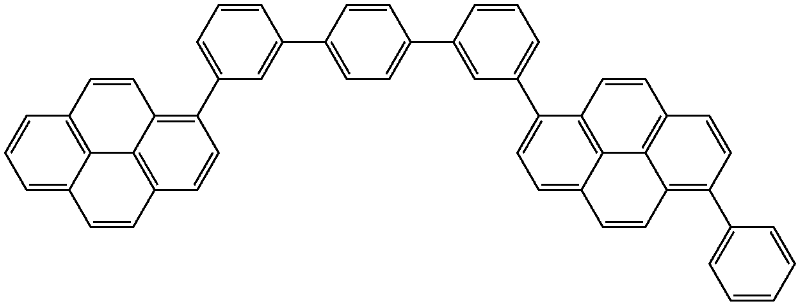
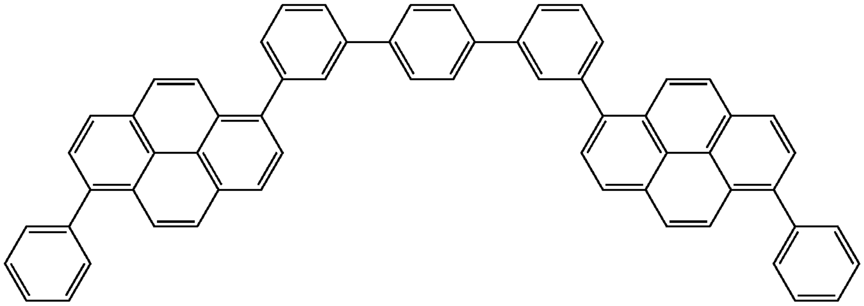
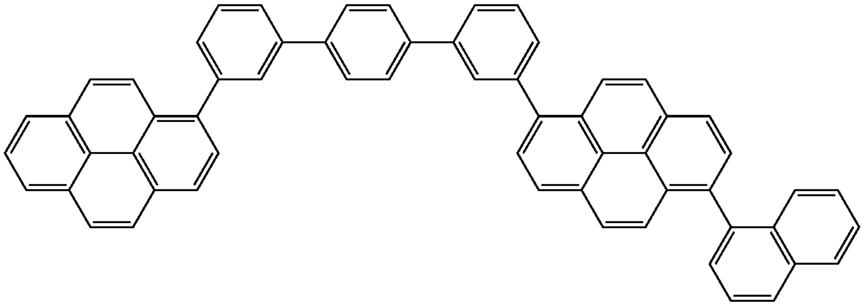
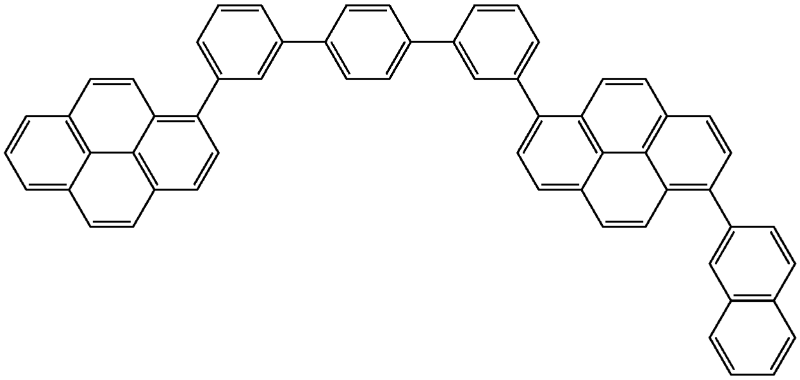
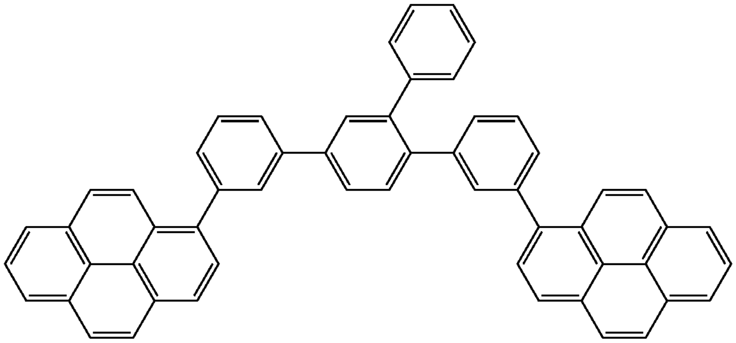

-continued
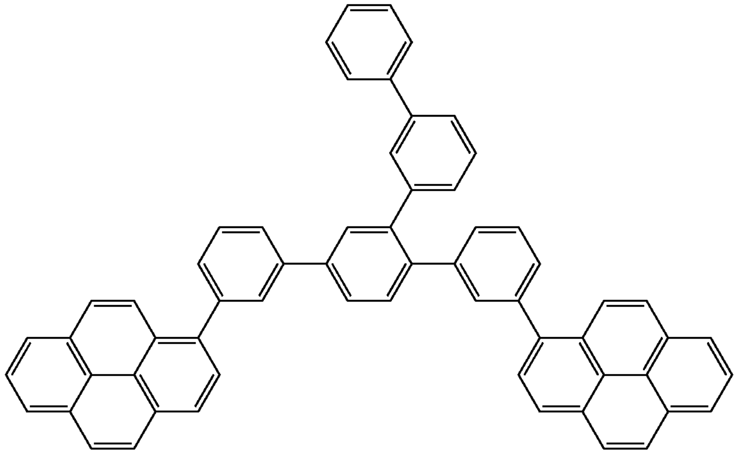
[Formula 53]
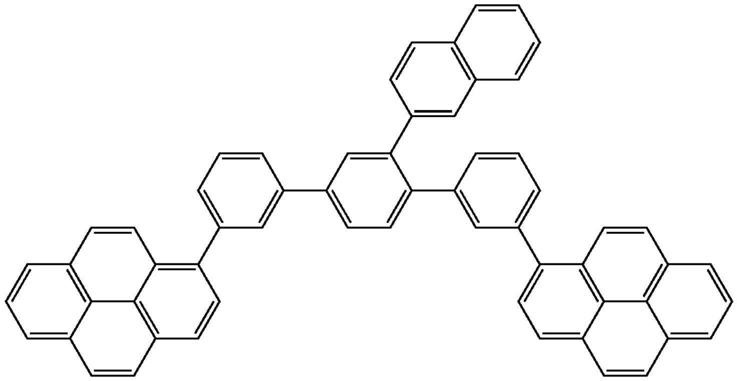
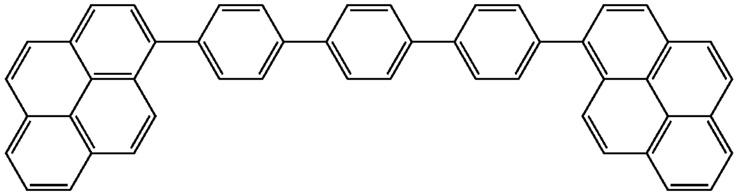
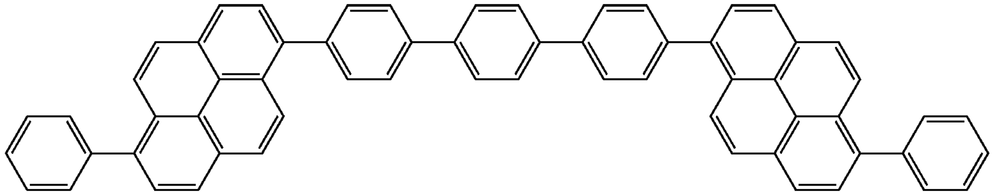
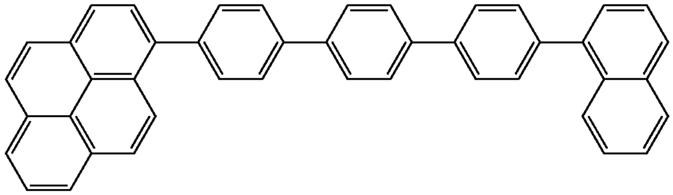
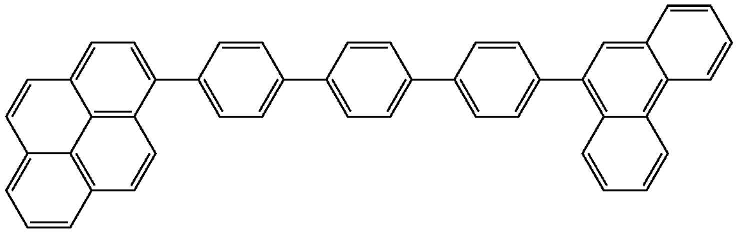

-continued
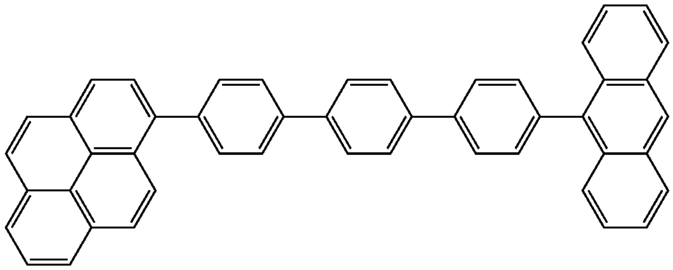
[Formula 54]
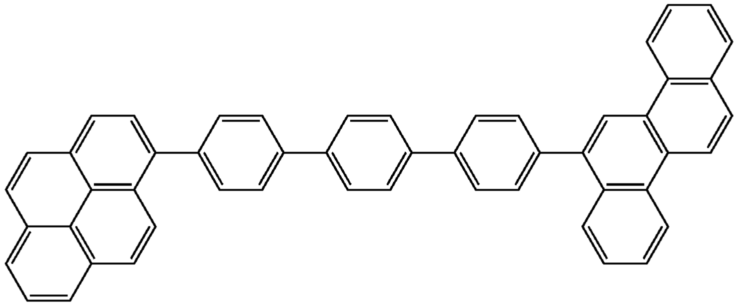
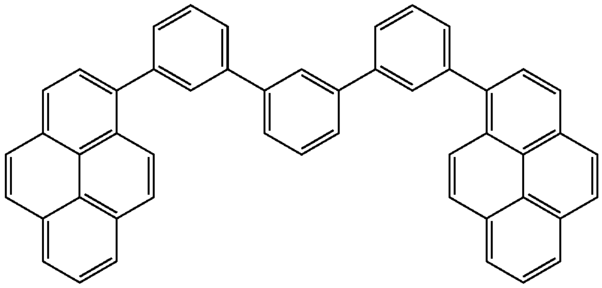
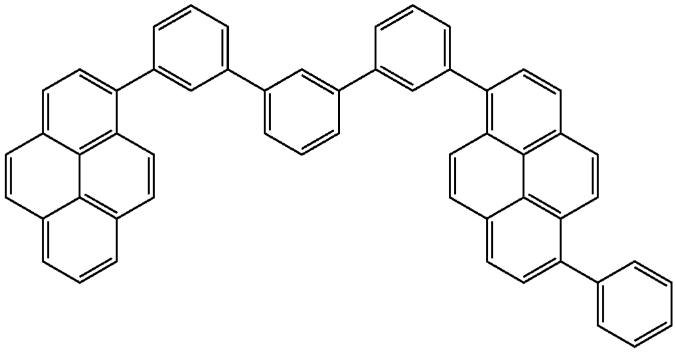
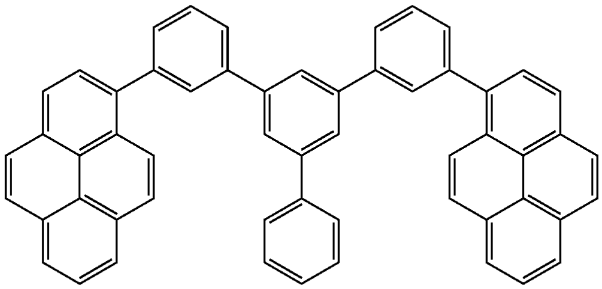

-continued
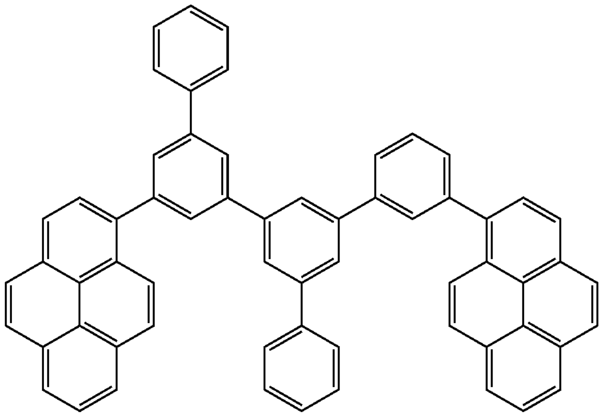
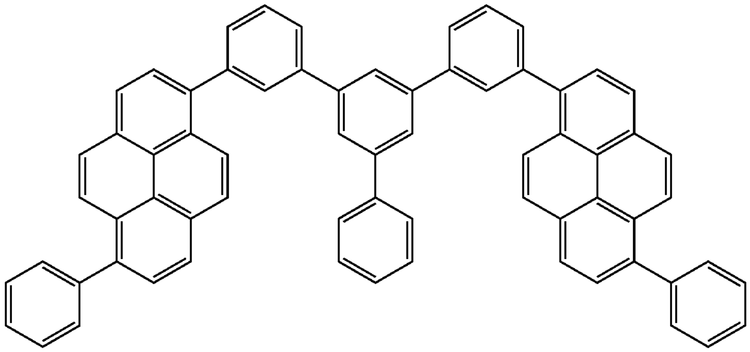
[Formula 55]
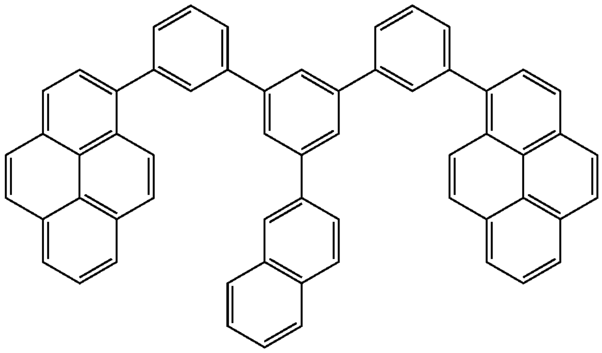
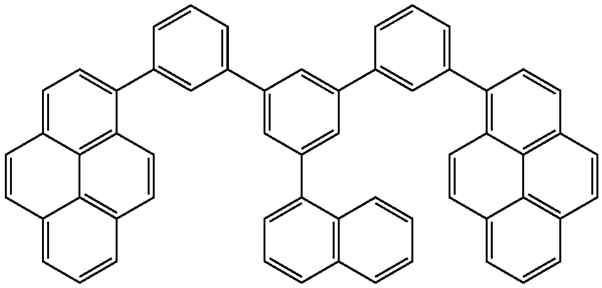
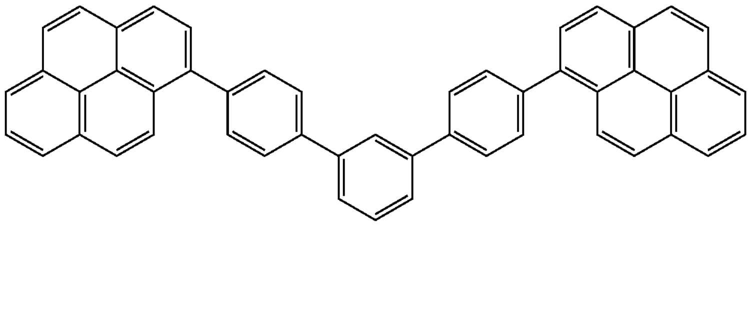

-continued
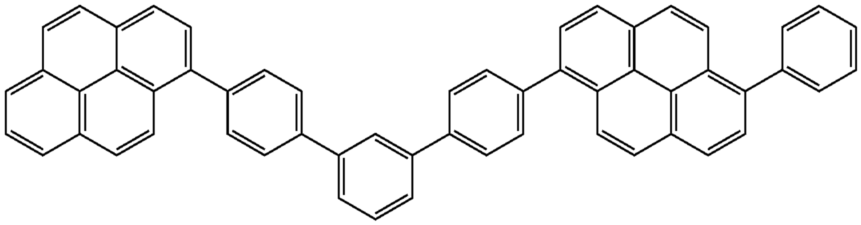
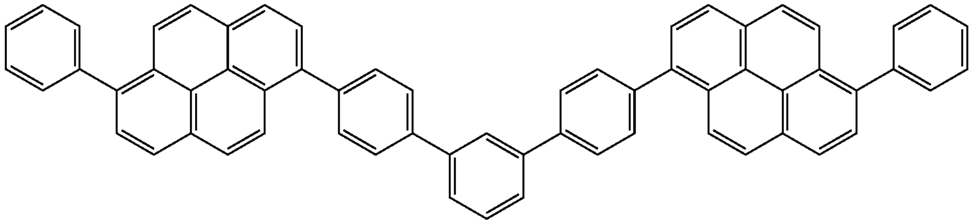
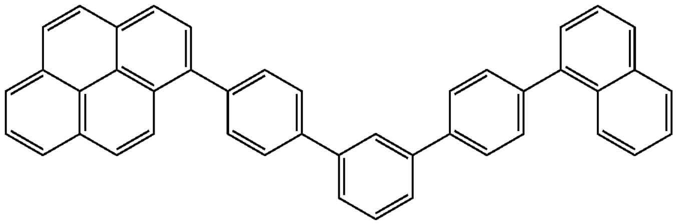
Formula 56]
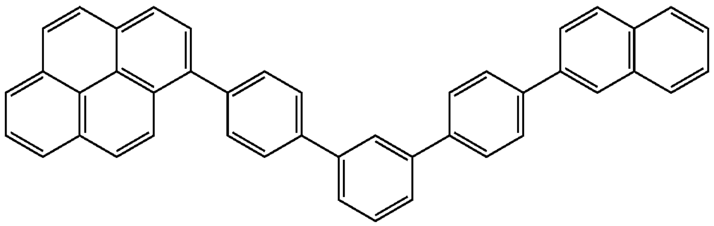
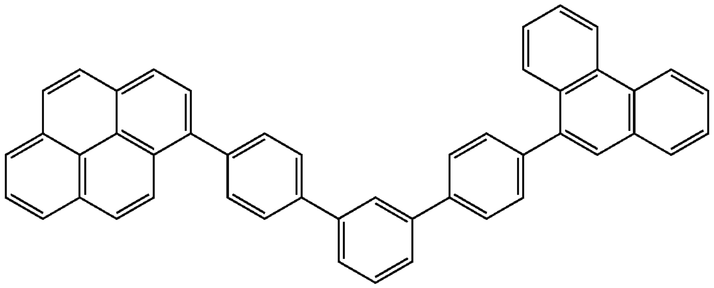
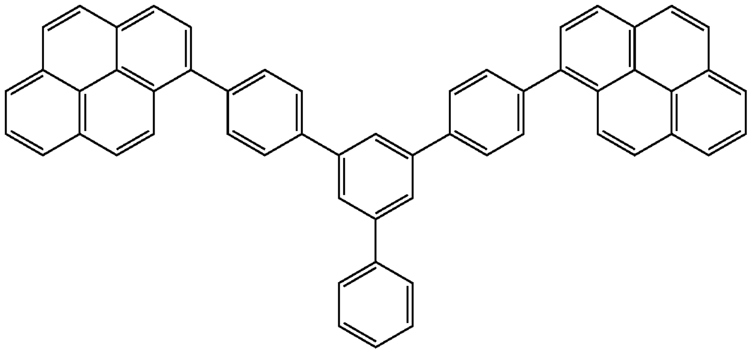

-continued
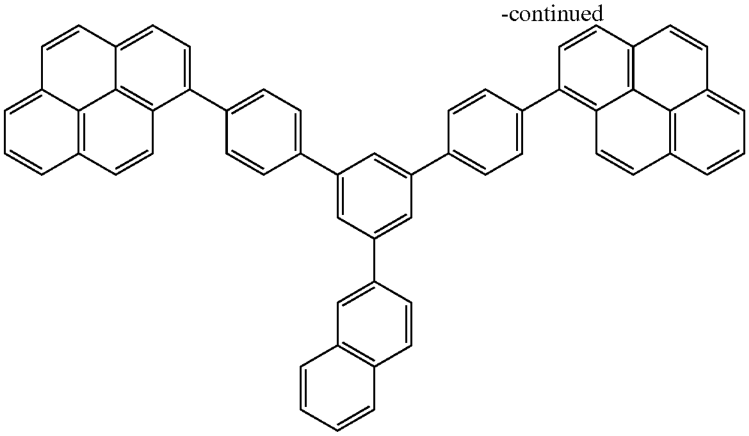
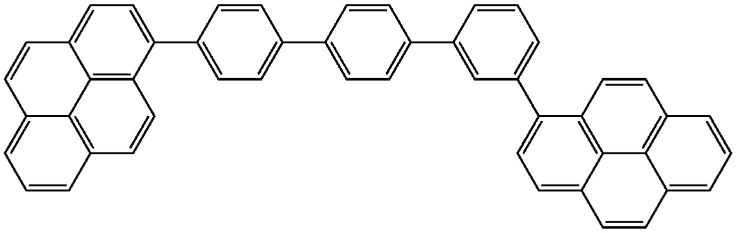
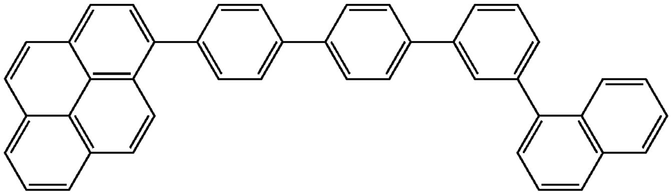
[Formula 57]
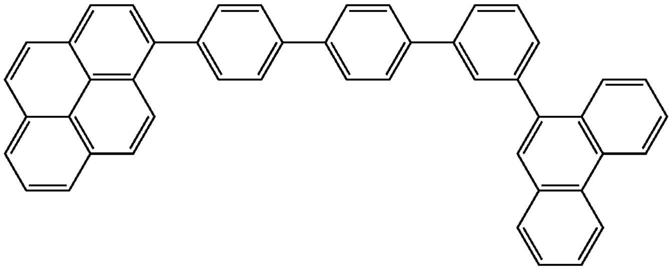
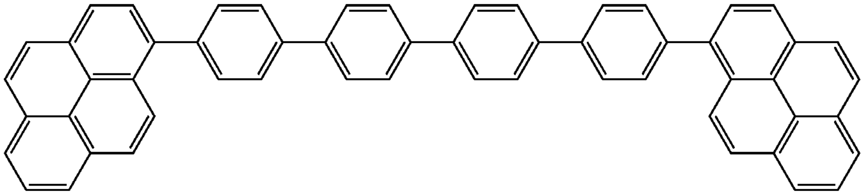
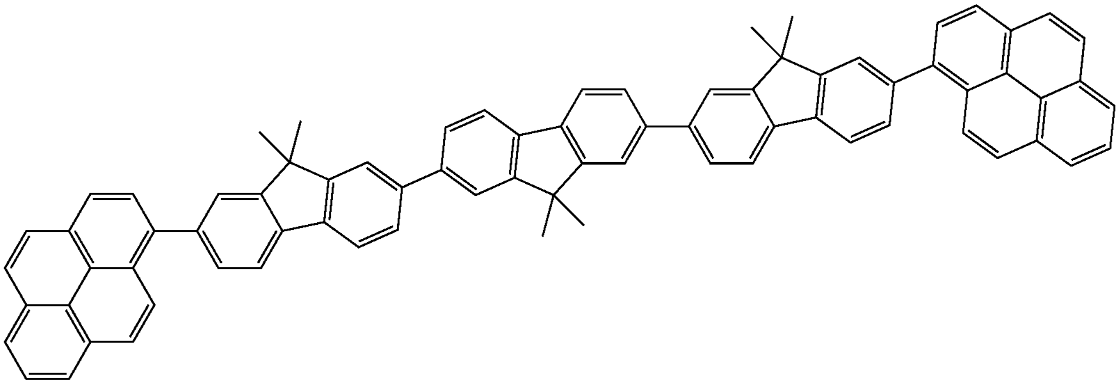

-continued
[Formula 58]
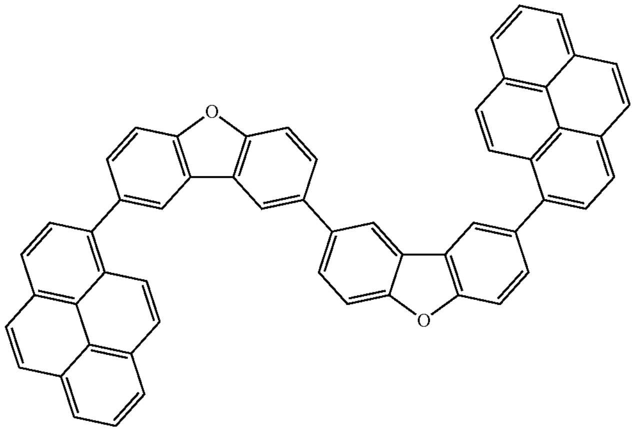
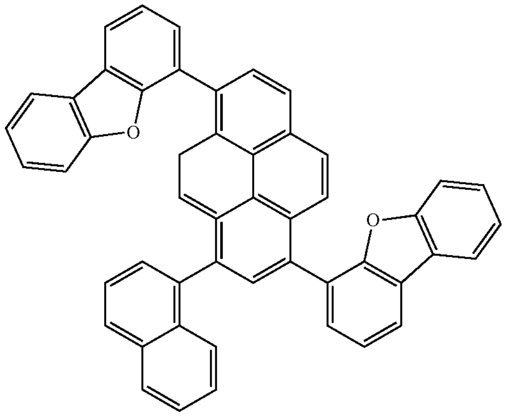
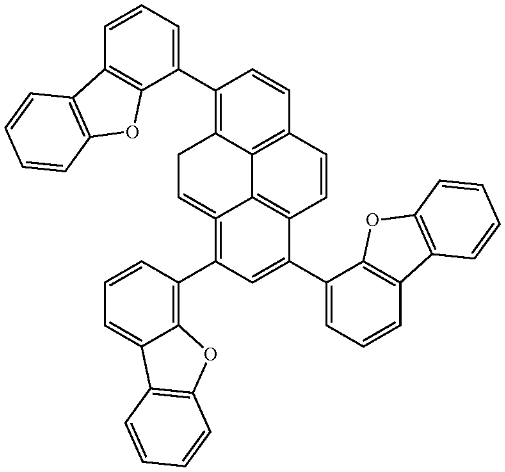
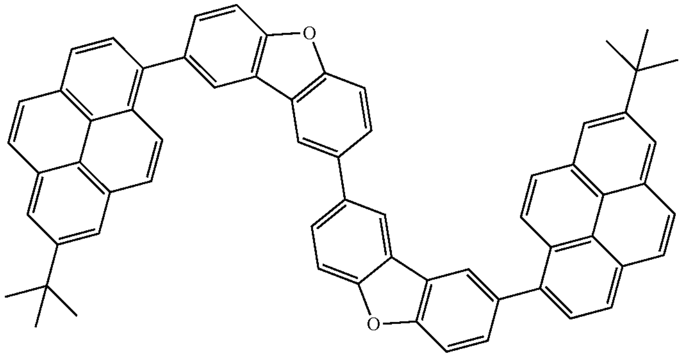
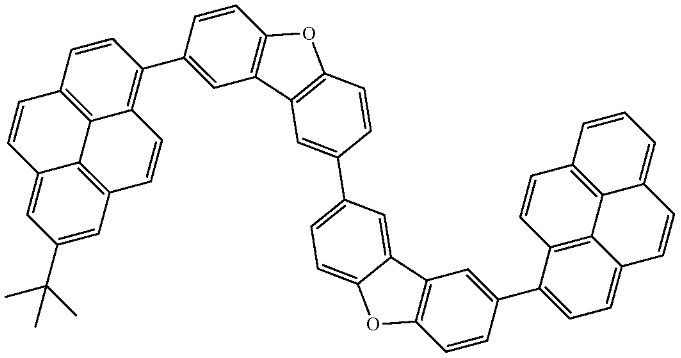

-continued
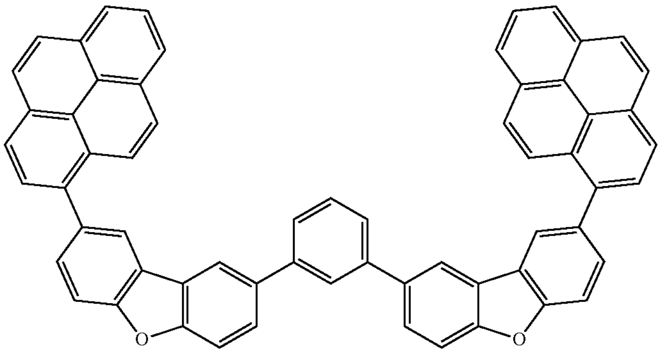
[Formula 59]
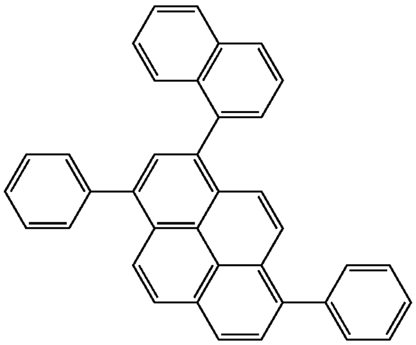
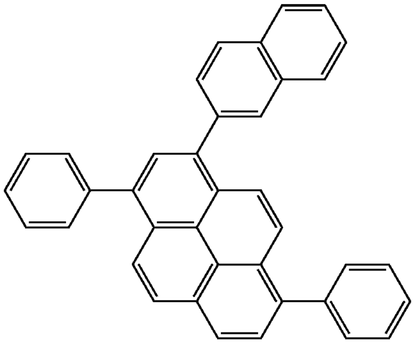
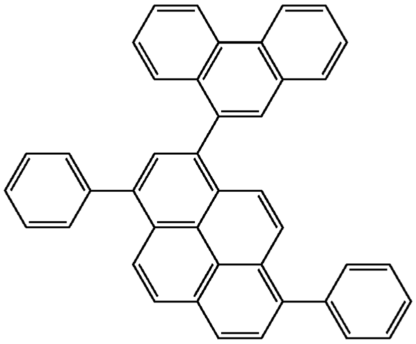
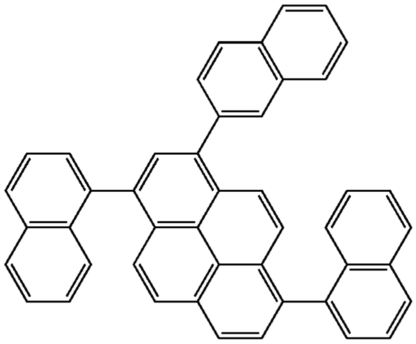
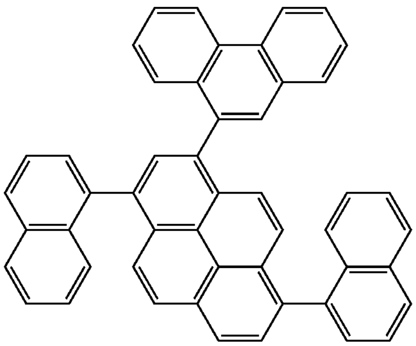
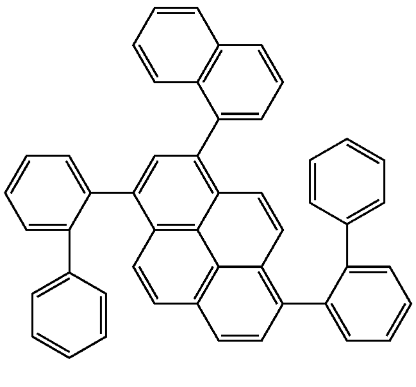

-continued
[Formula 60]
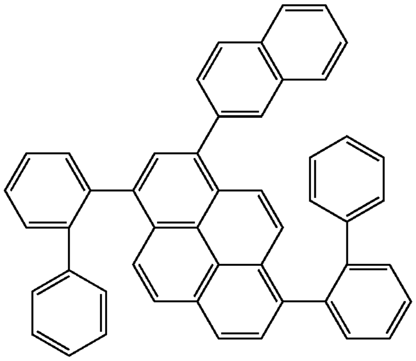
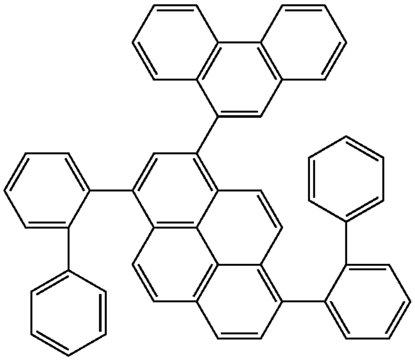
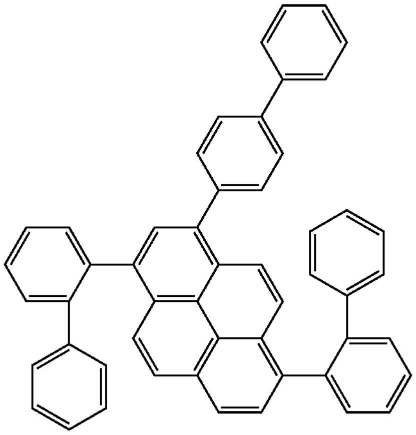
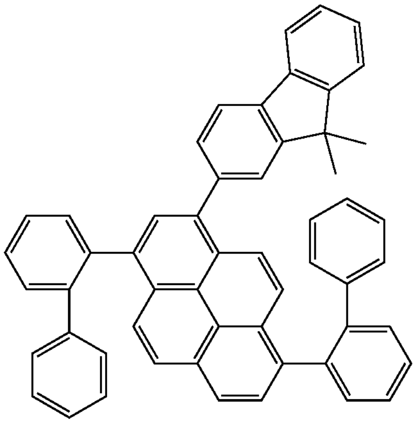
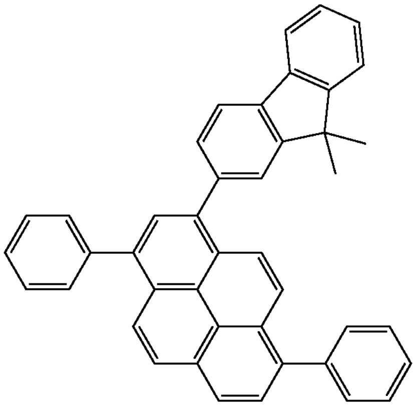
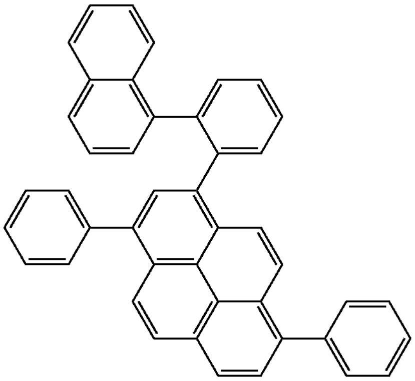
[Formula 61]
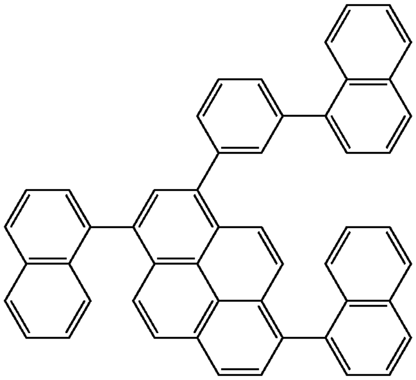
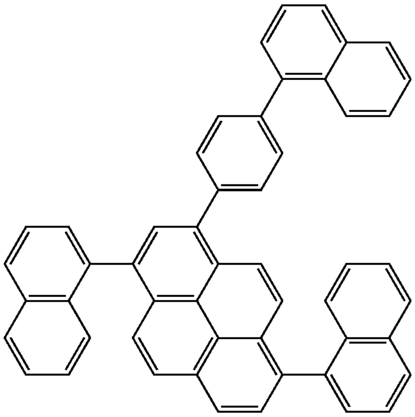

-continued
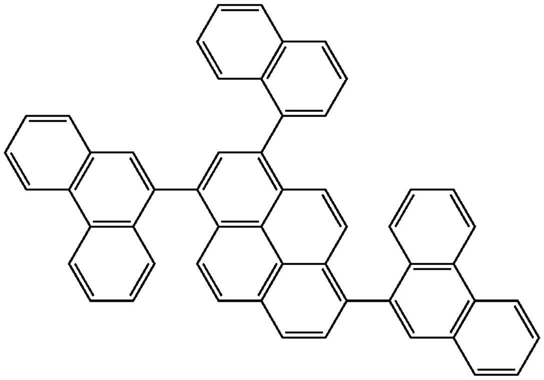
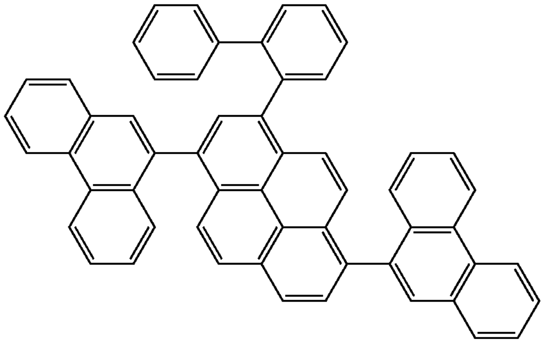
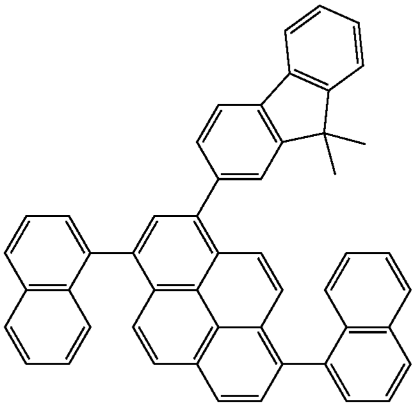
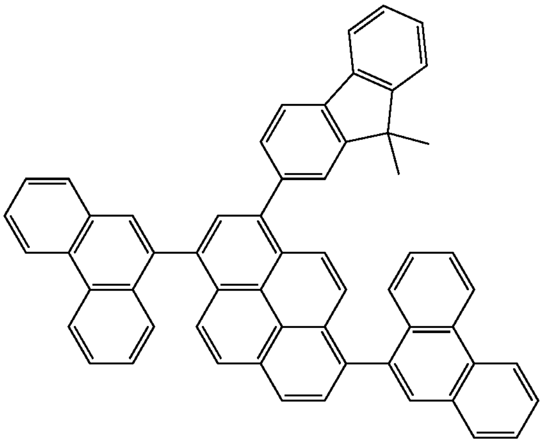
[Formula 62]
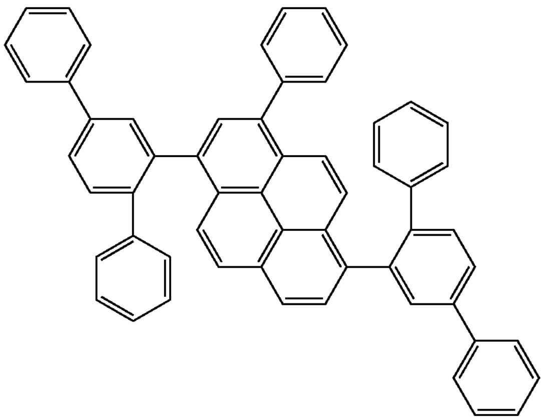
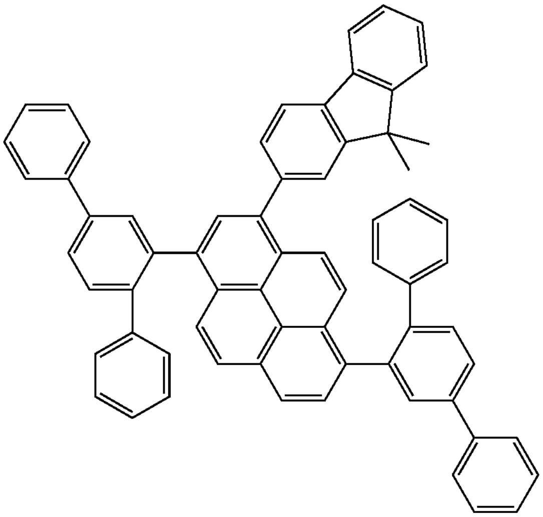

-continued
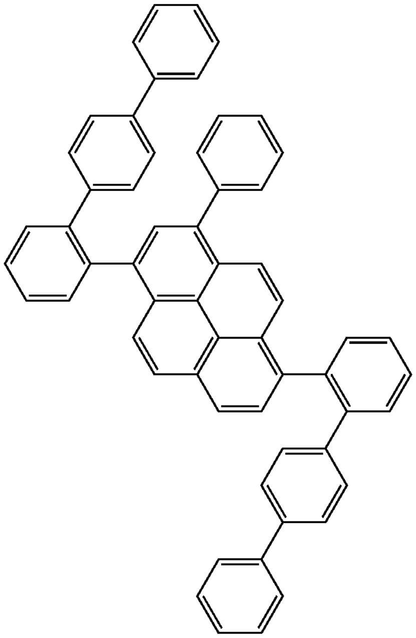
[Formula 63]
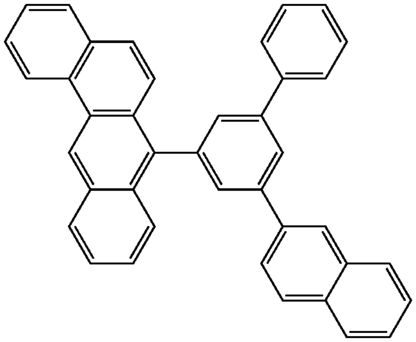
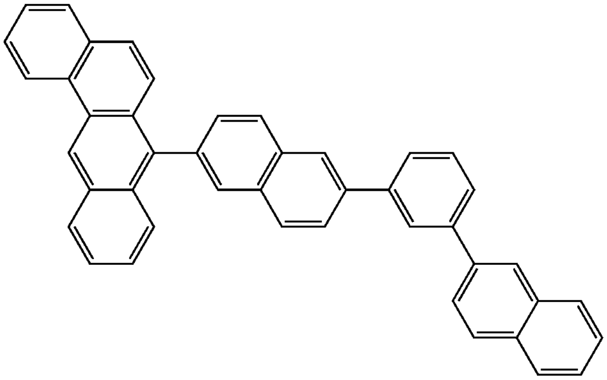
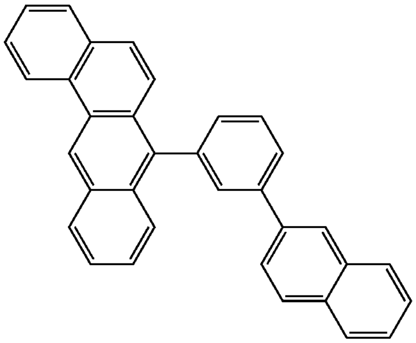
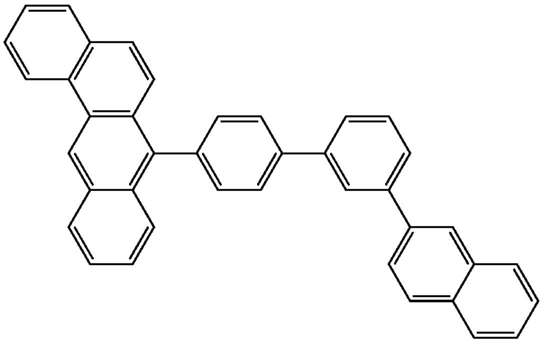

-continued
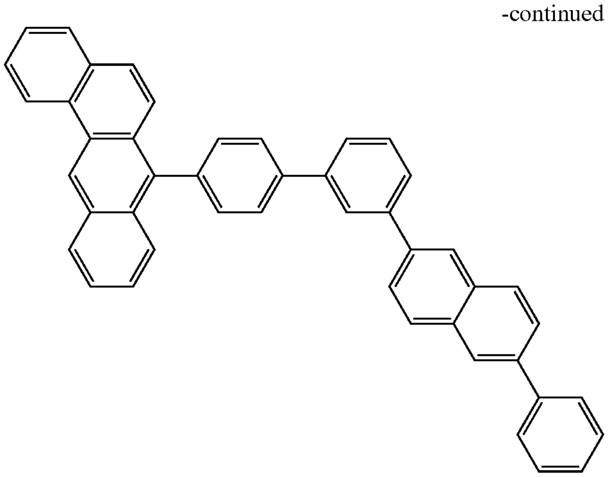
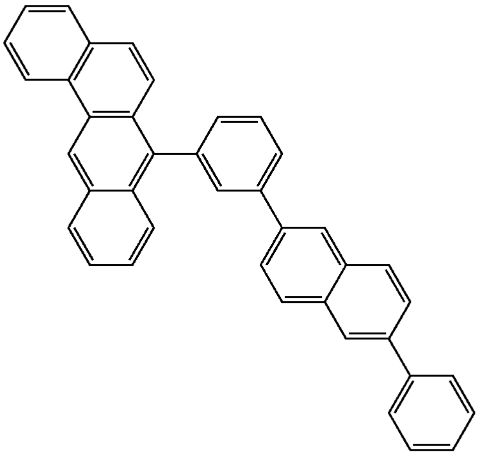
[Formula 64]
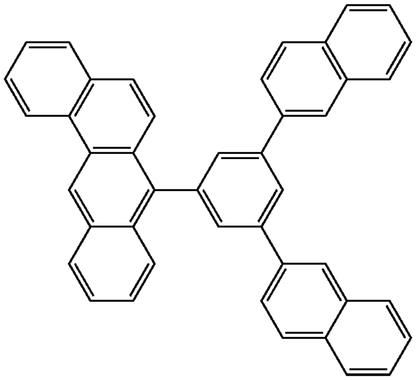
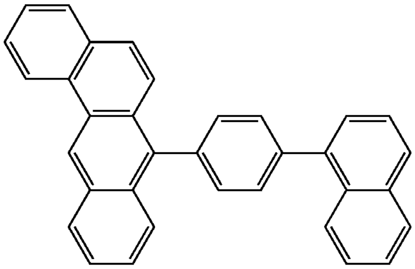
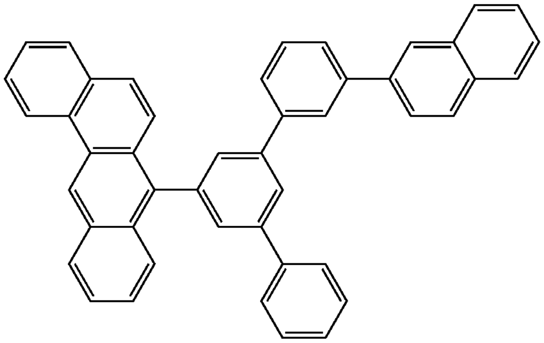
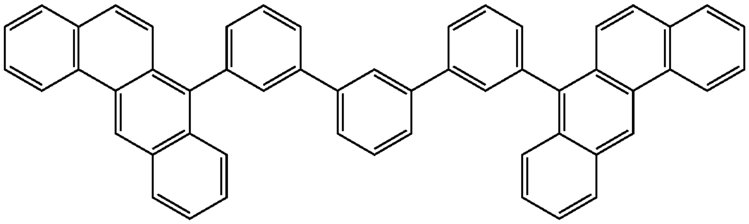
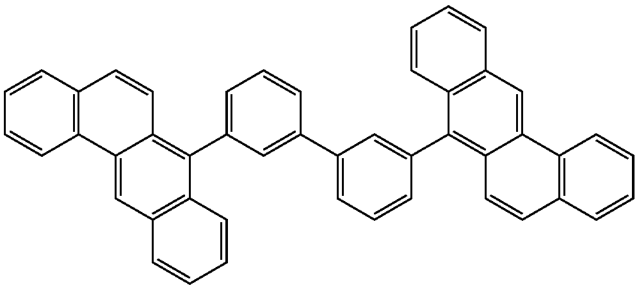

-continued
[Formula 65]
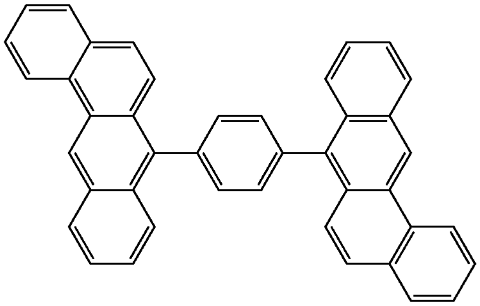
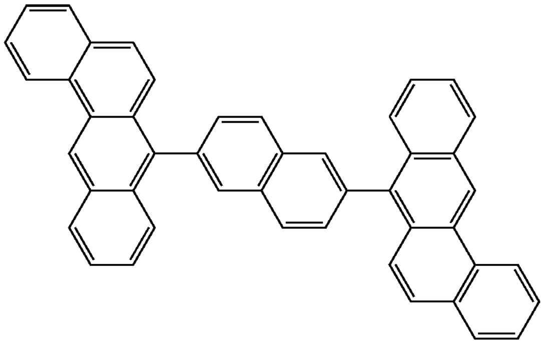
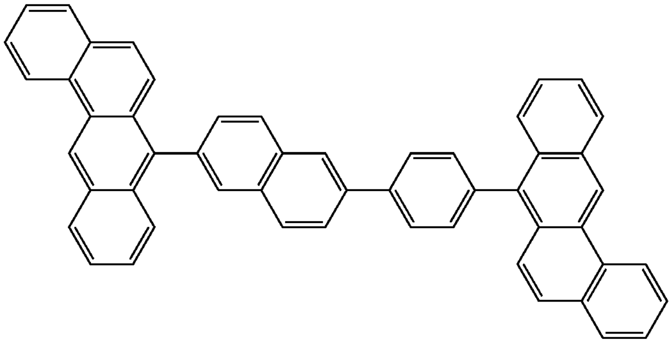
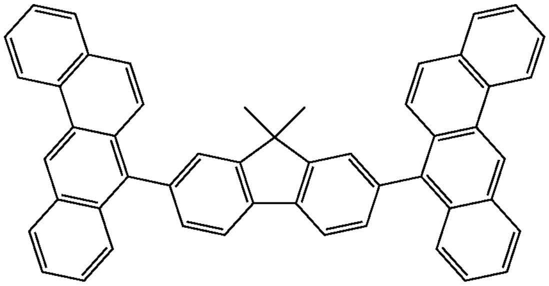
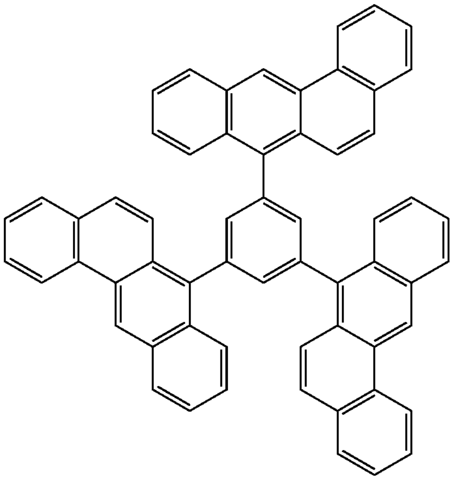
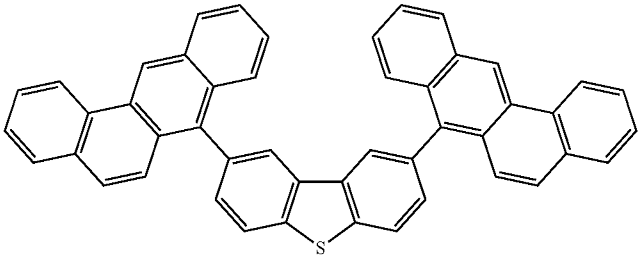

-continued
[Formula 66]
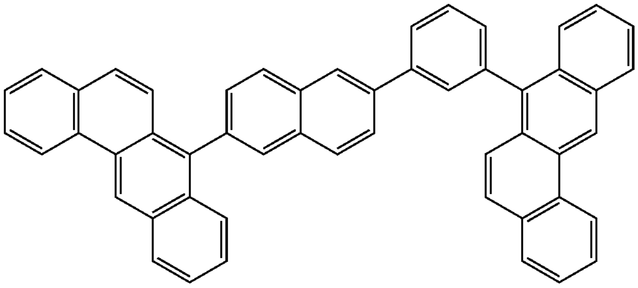
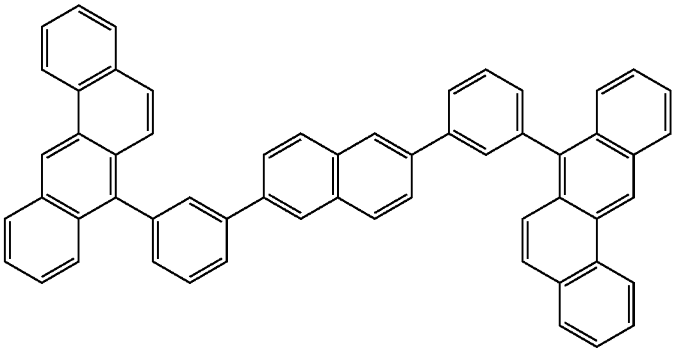
[Formula 67]
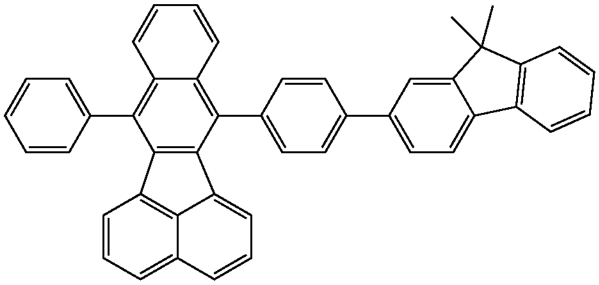
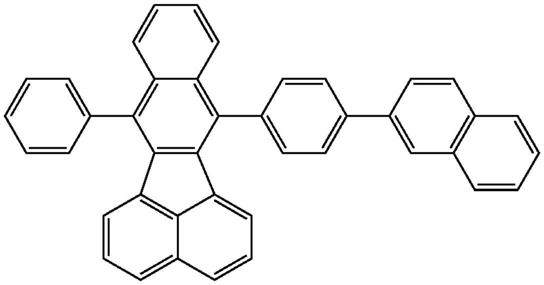
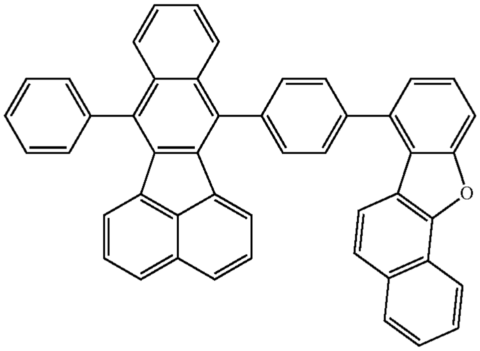
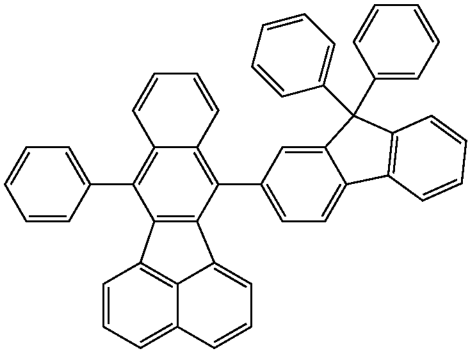
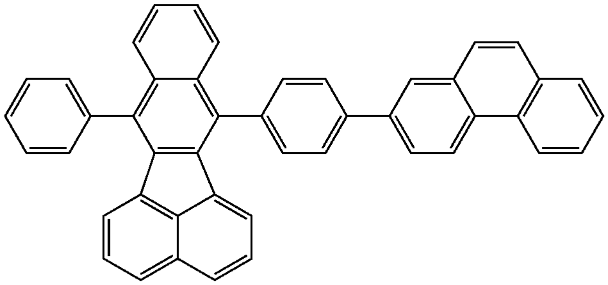

-continued
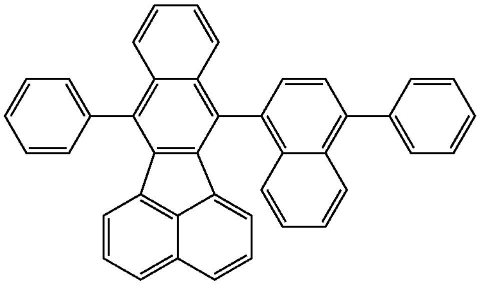
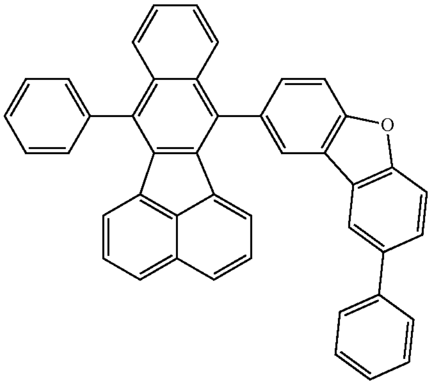
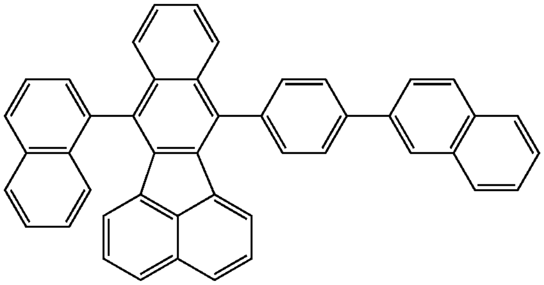
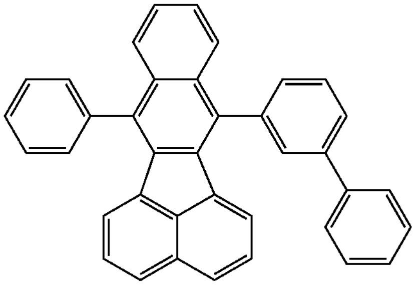
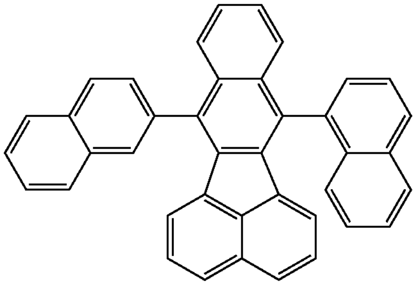
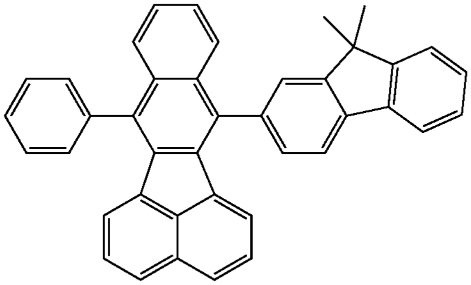
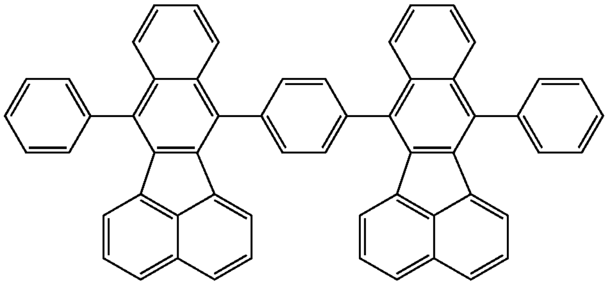
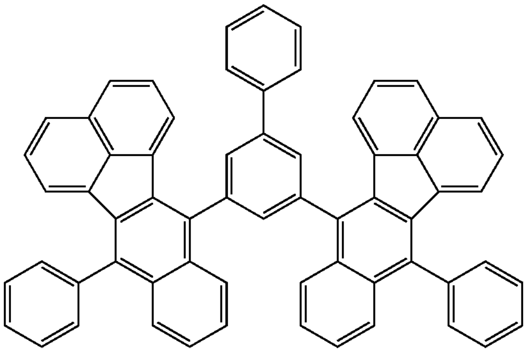
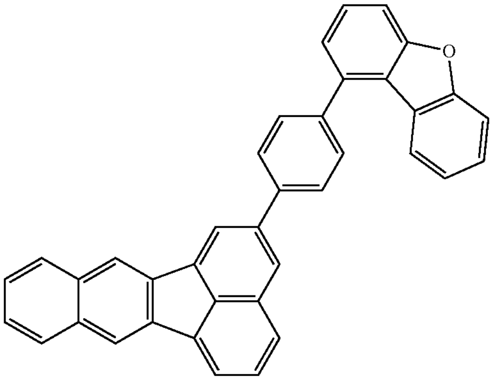

-continued
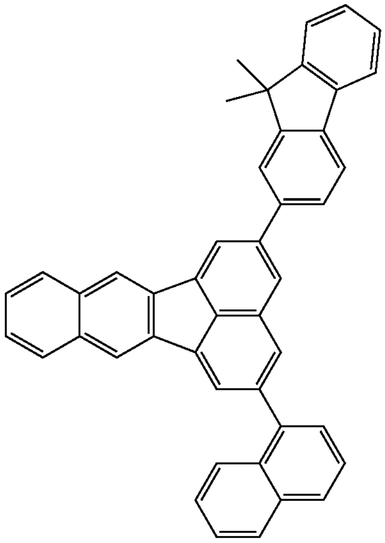
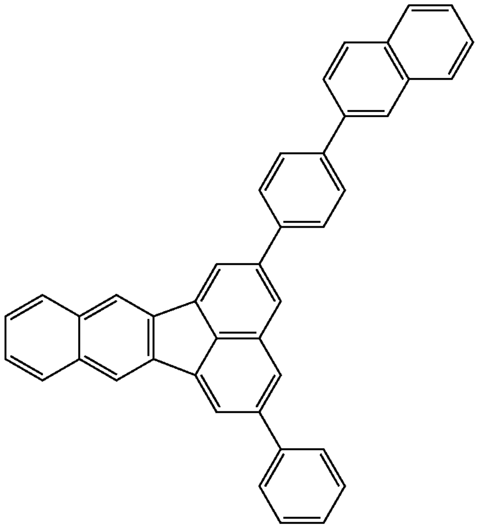
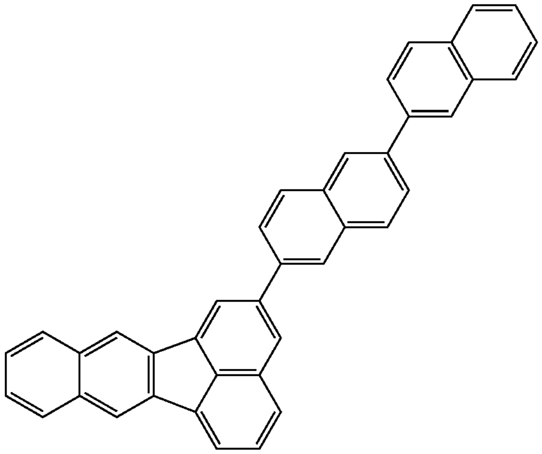
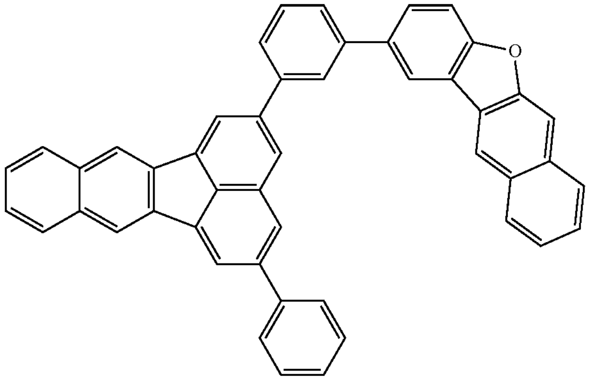
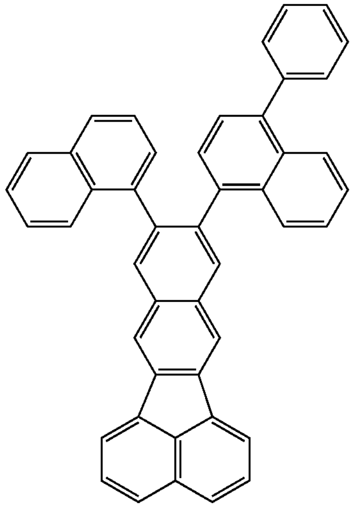

-continued
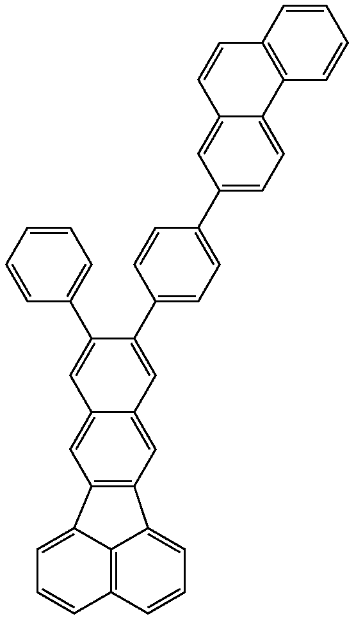
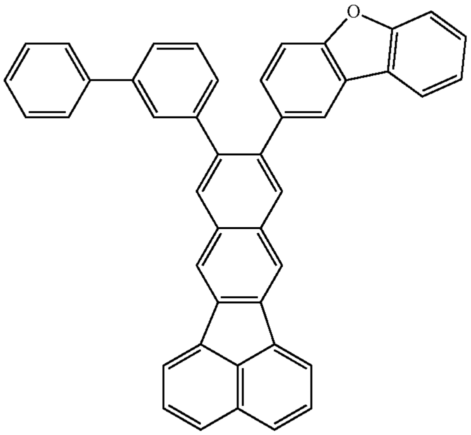
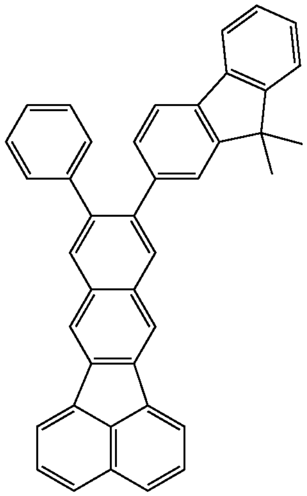
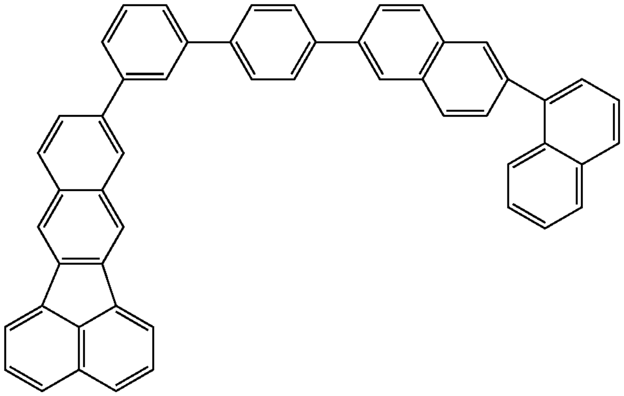
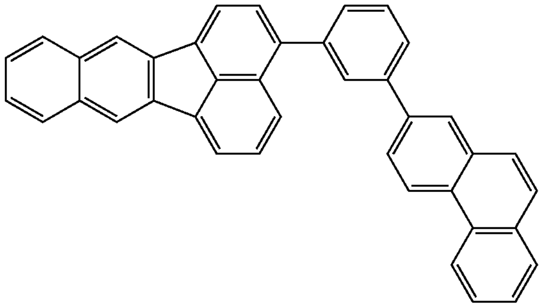
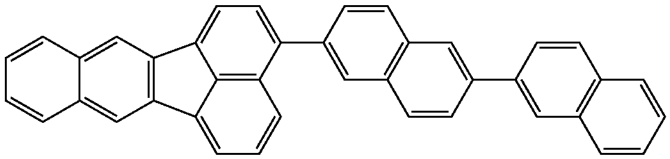

-continued
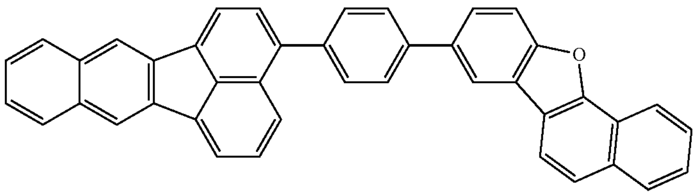
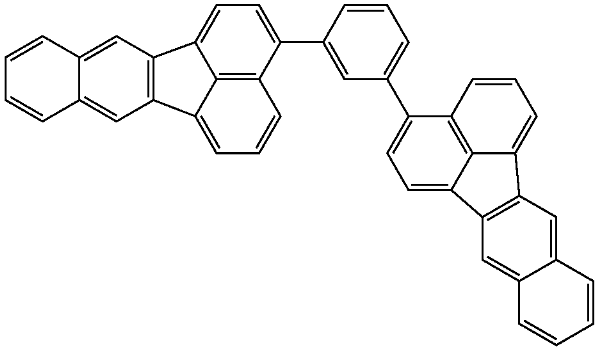
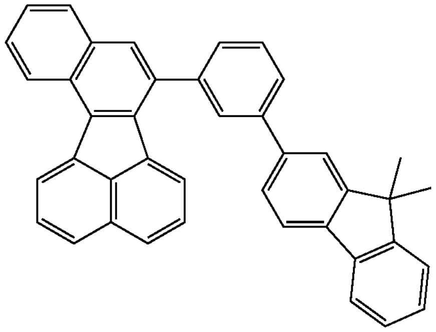
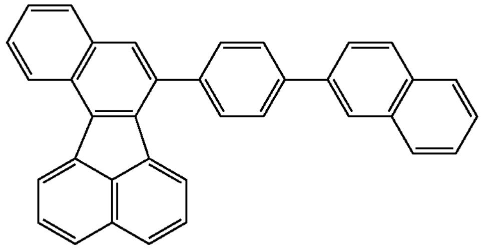
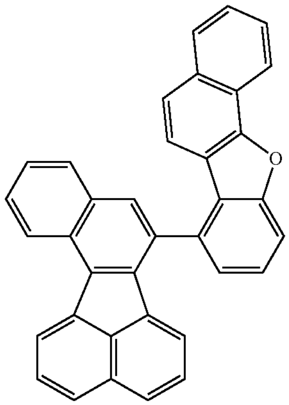
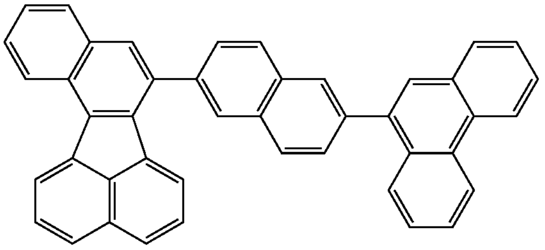
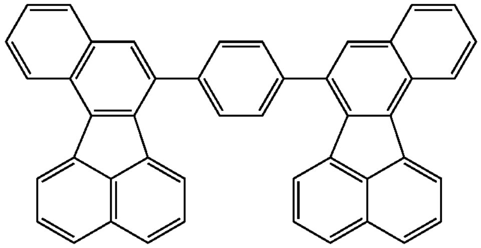
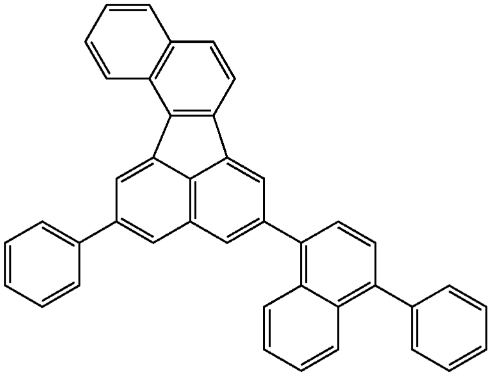

-continued
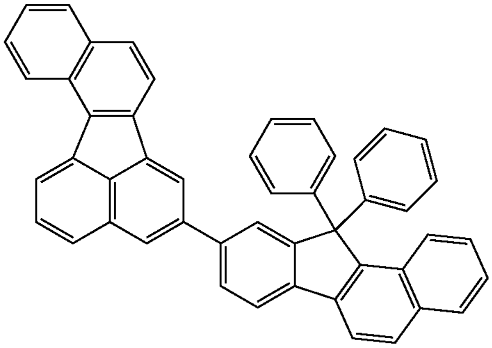
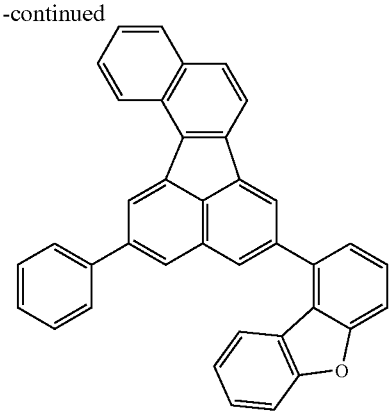
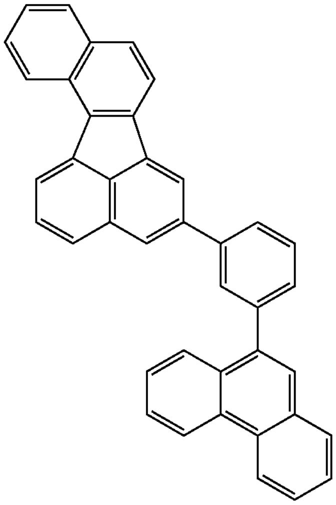
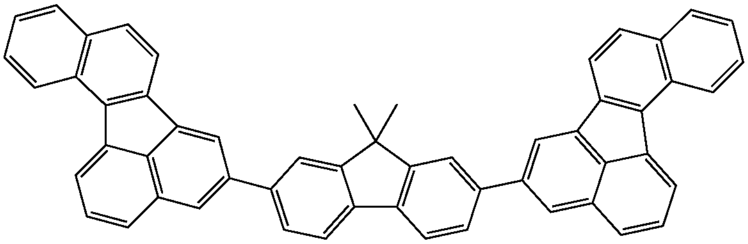
[Formula 68]
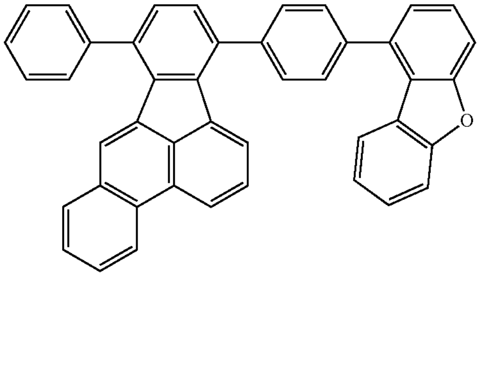
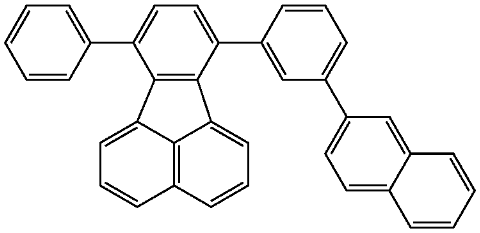
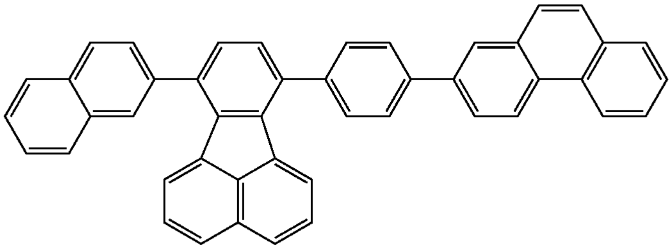

-continued
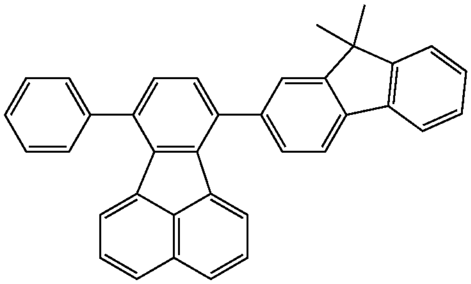
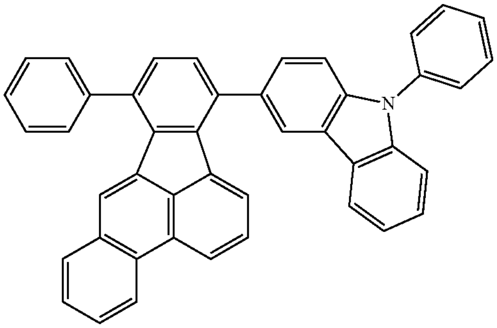
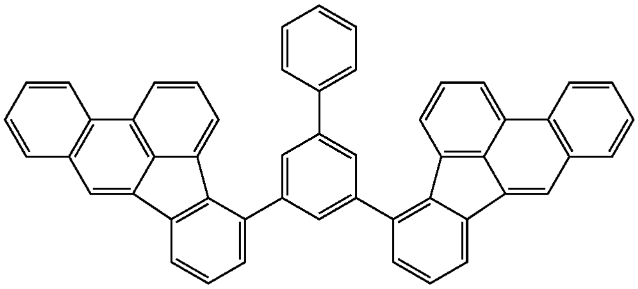
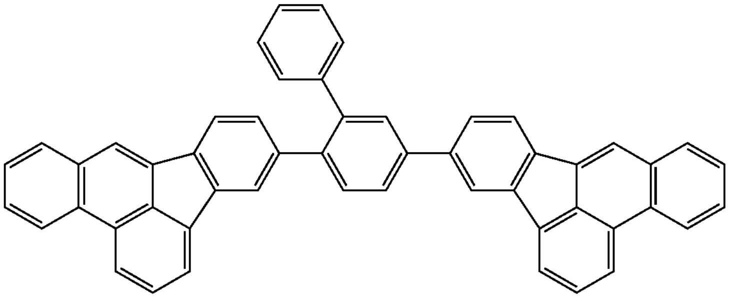
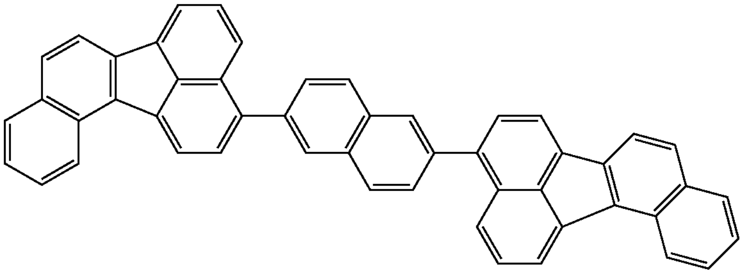
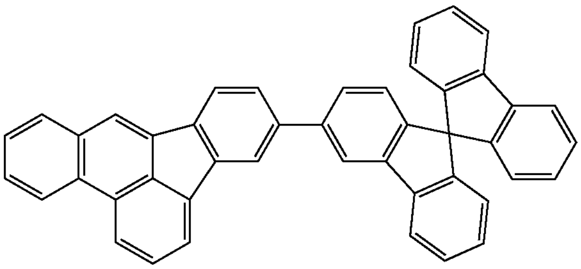
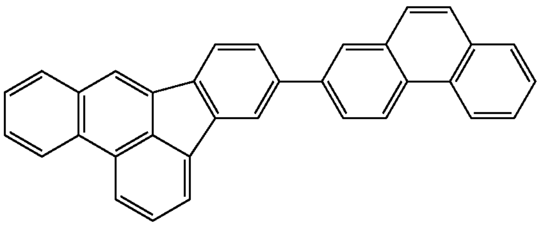

-continued
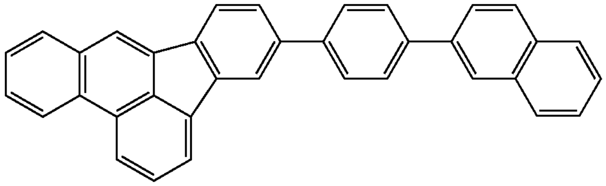
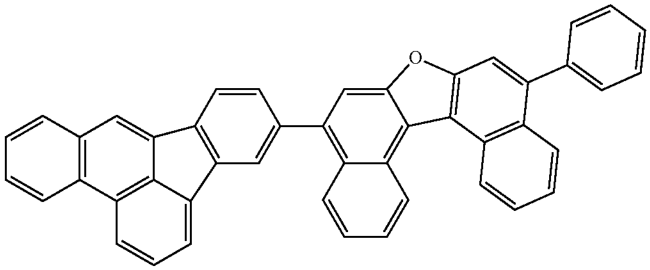
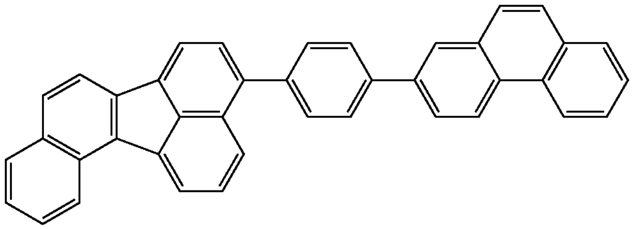
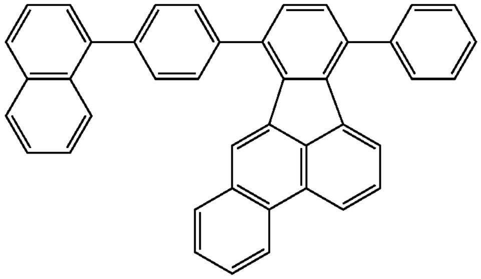
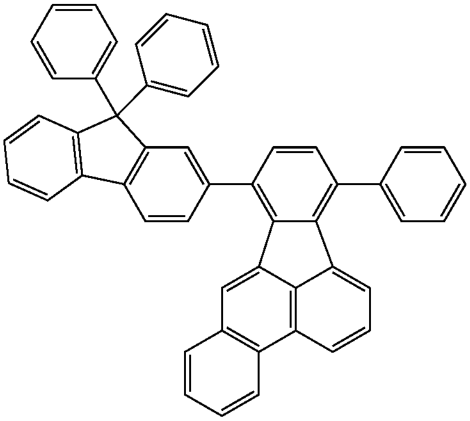
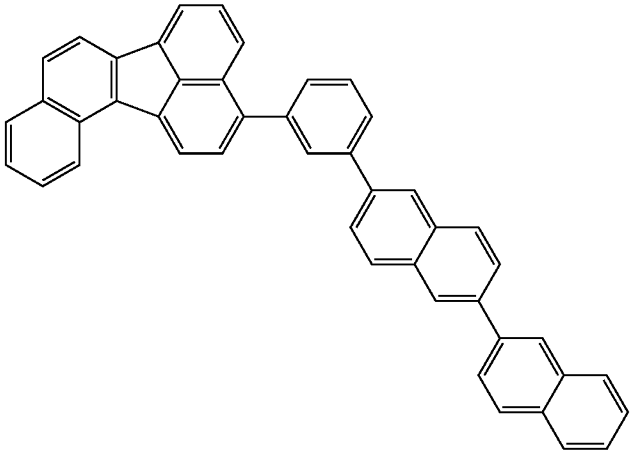

-continued
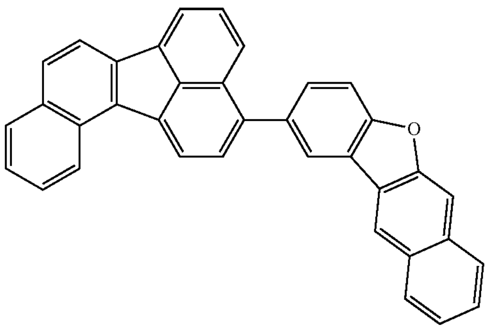
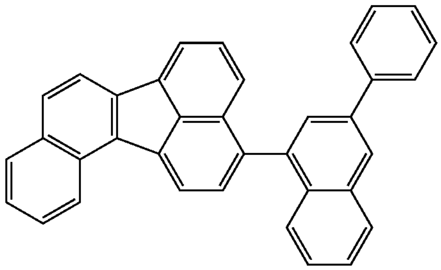
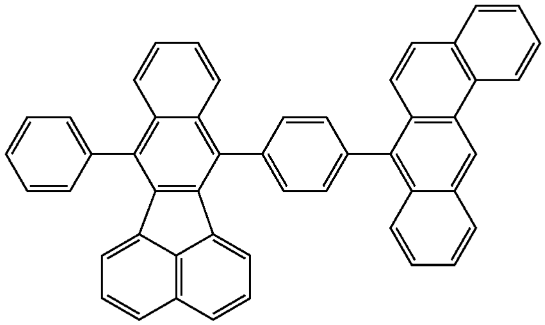
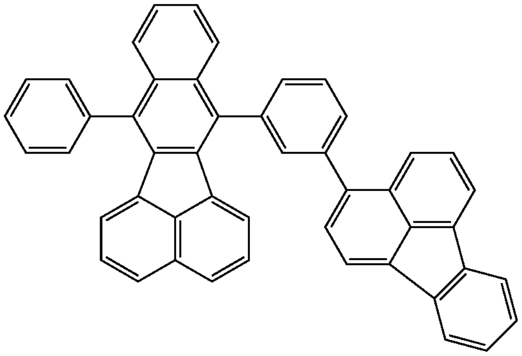
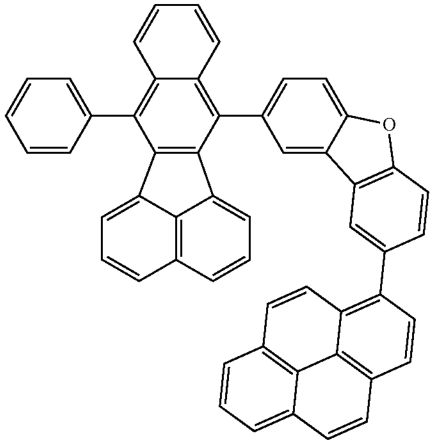
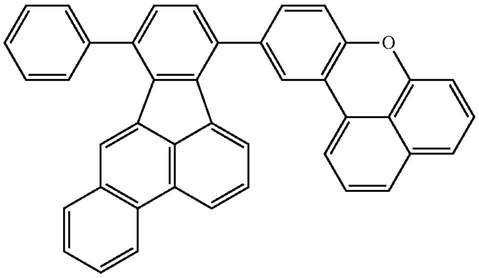
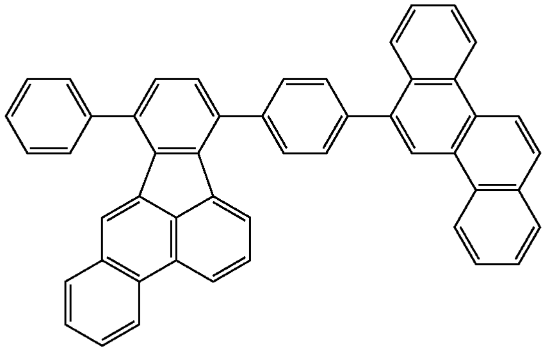

-continued
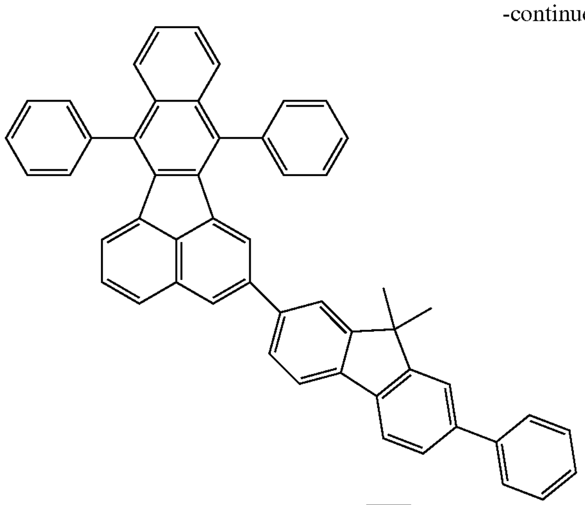
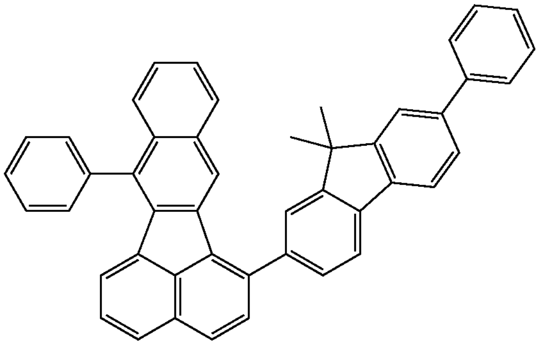
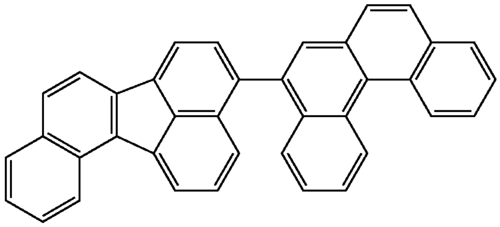
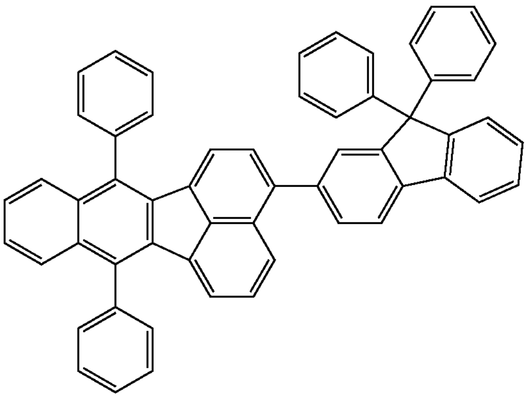
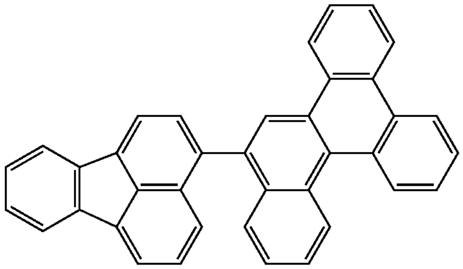
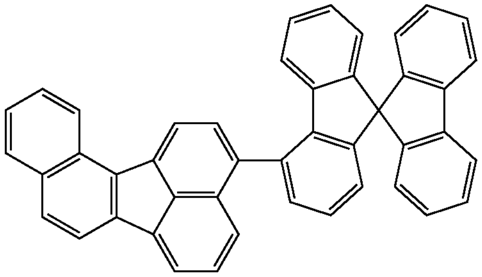
[Formula 69]
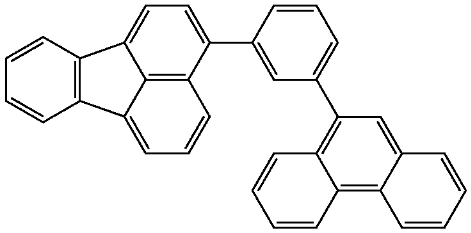
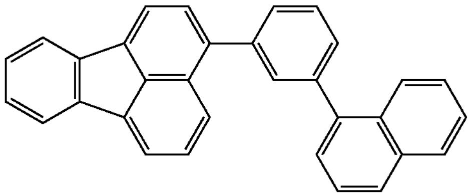
-continued
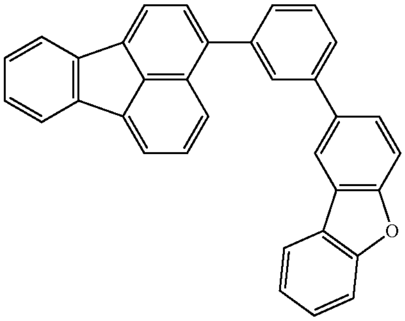

-continued
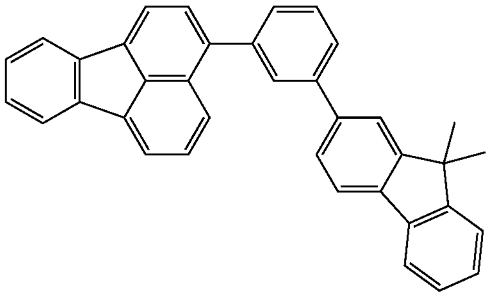
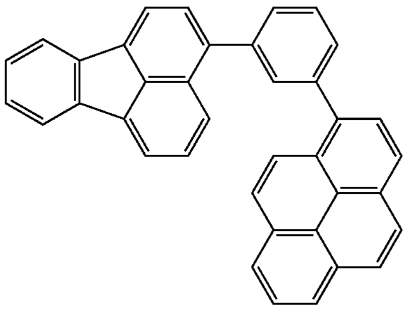
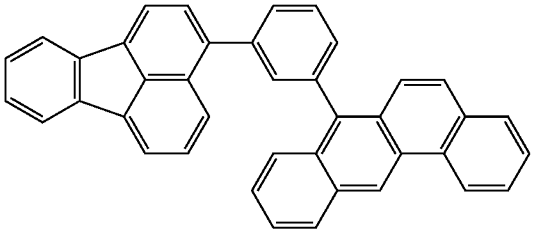
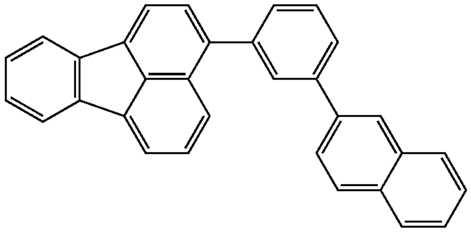
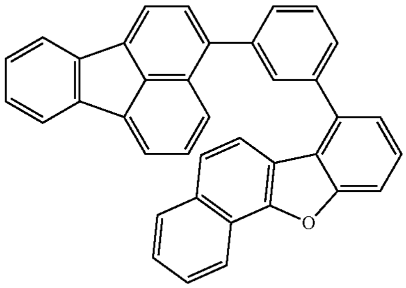
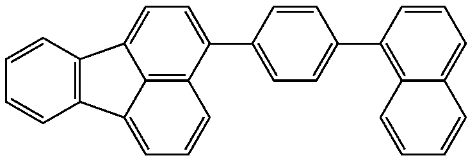
-continued
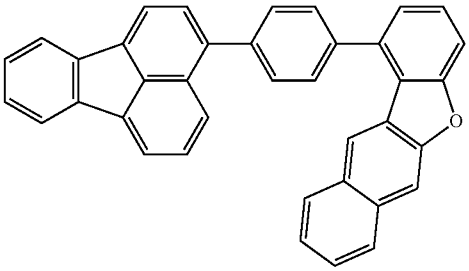
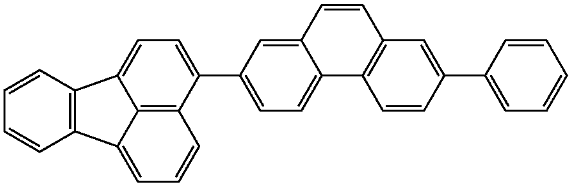
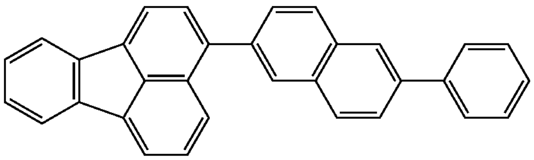
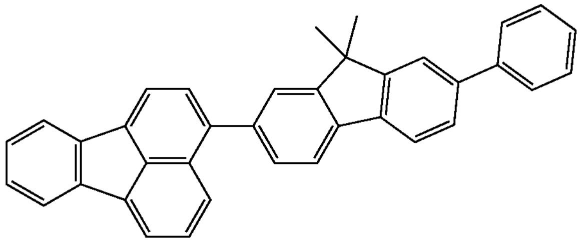
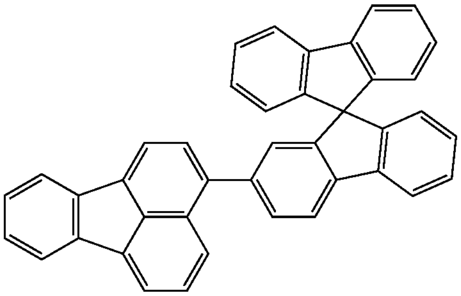
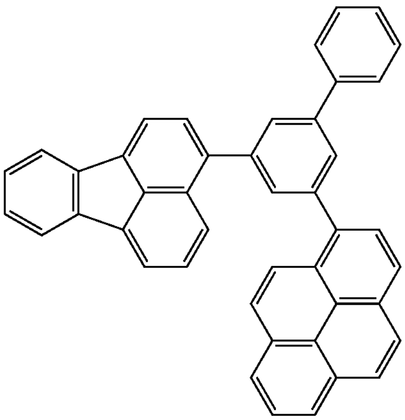

-continued
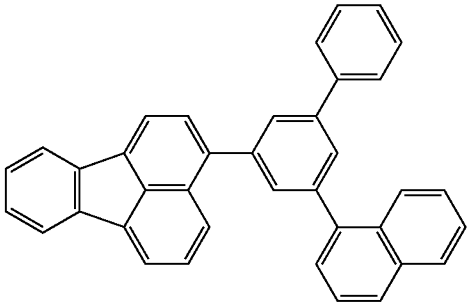
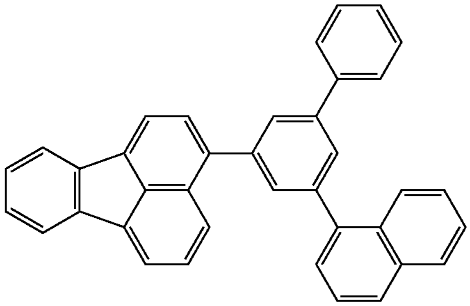
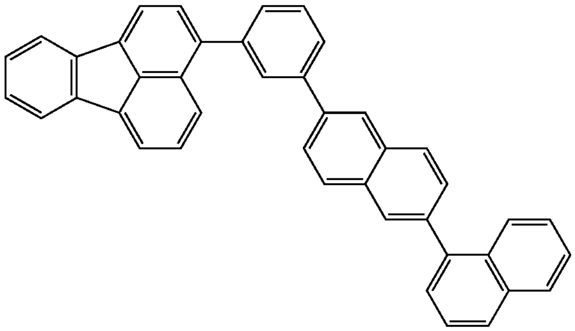
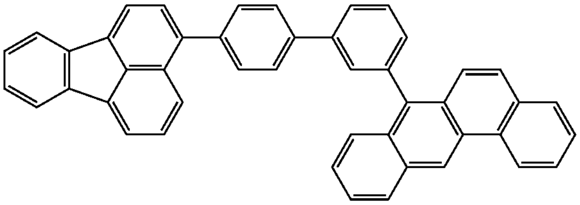
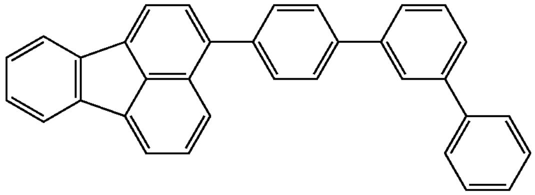
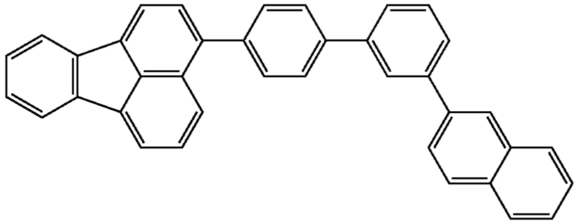
-continued
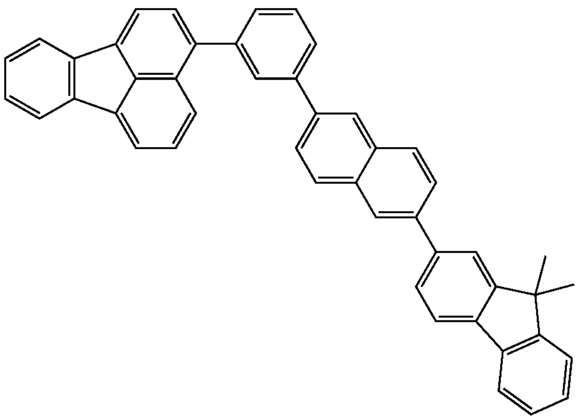
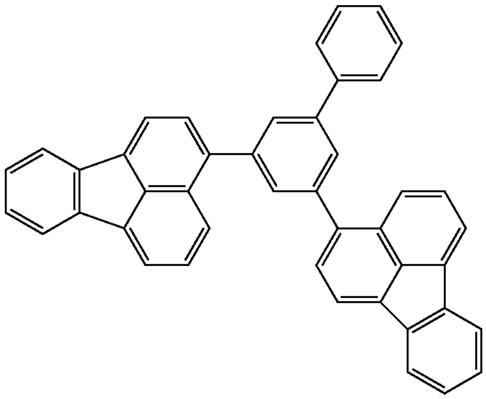
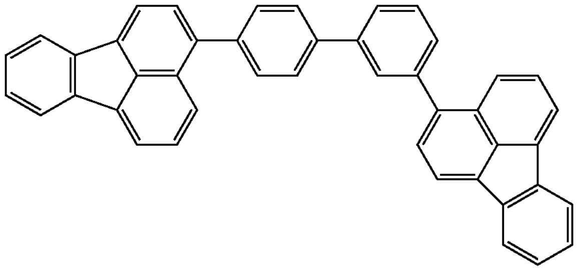
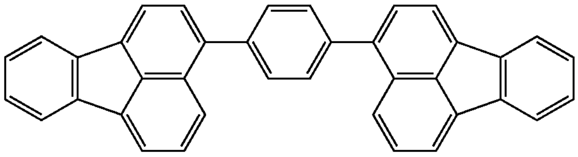
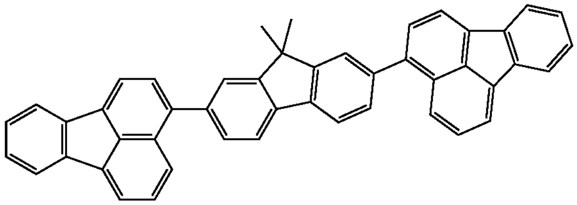
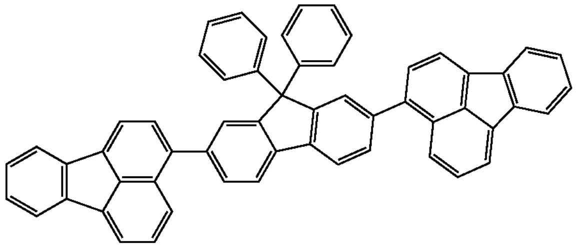

-continued
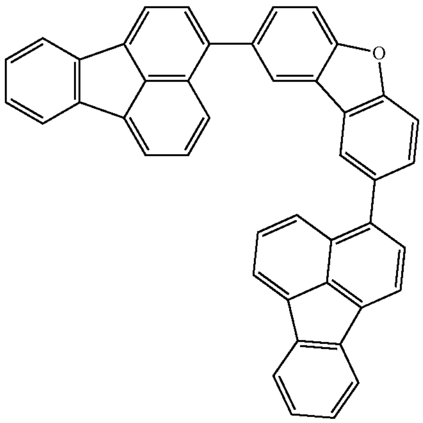
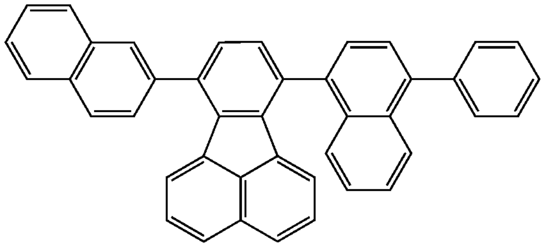
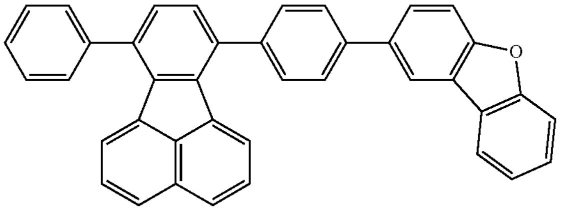
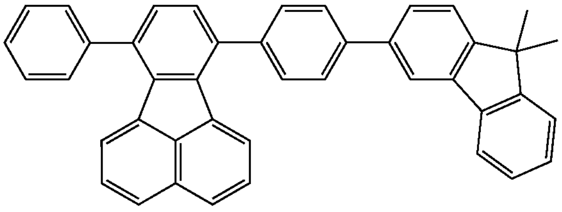
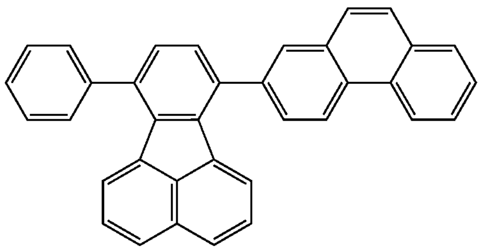
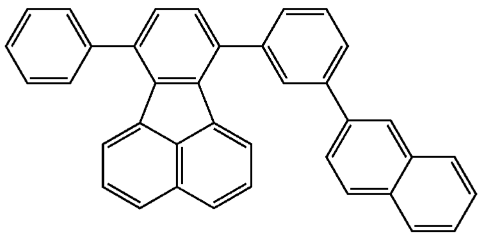
-continued
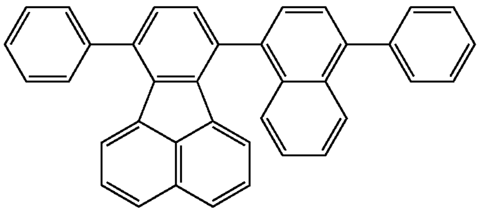
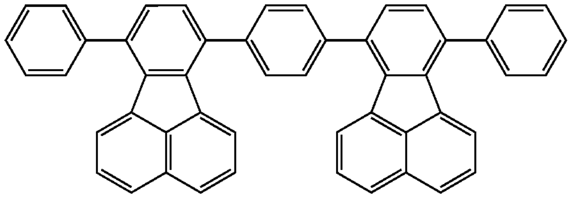
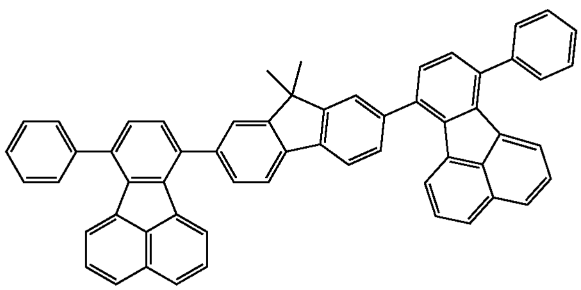
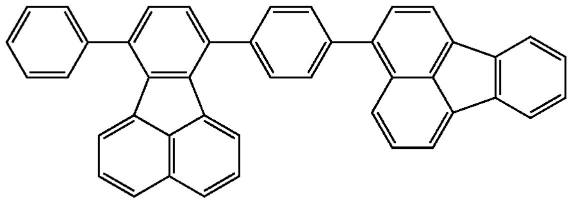
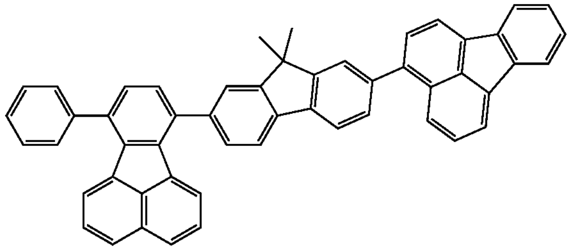
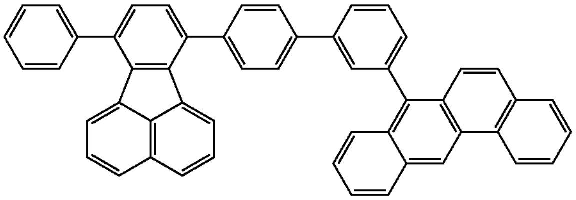
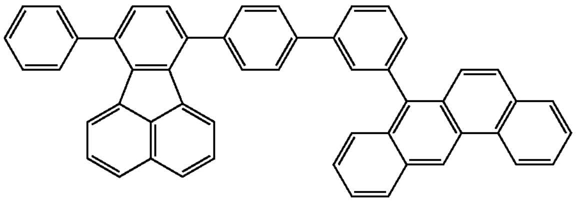

-continued
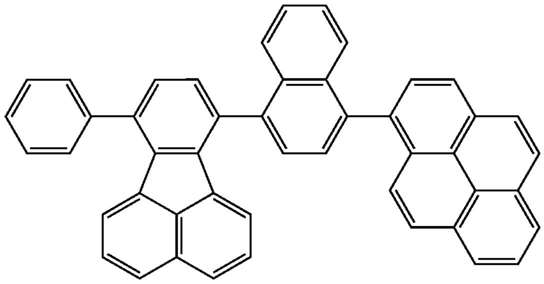
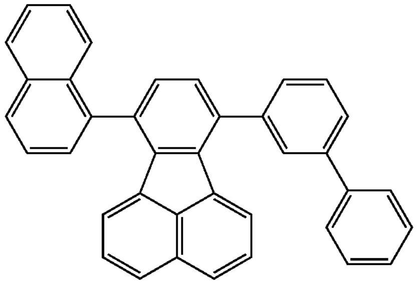
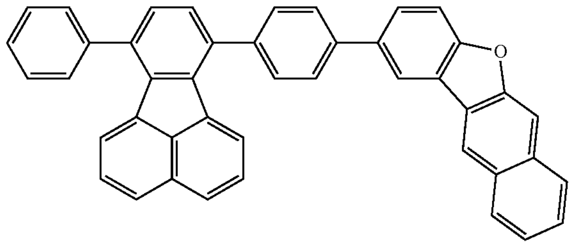
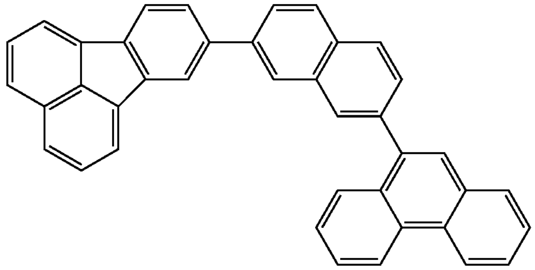
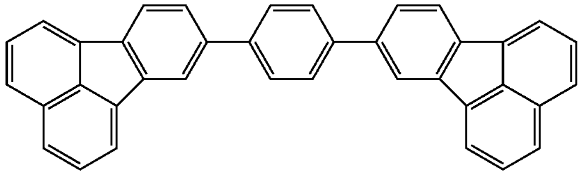
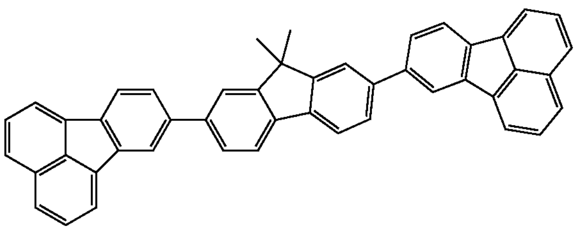
-continued
[Formula 70]
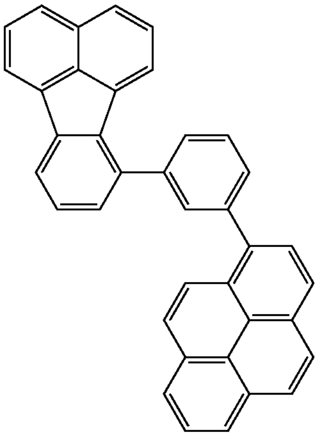
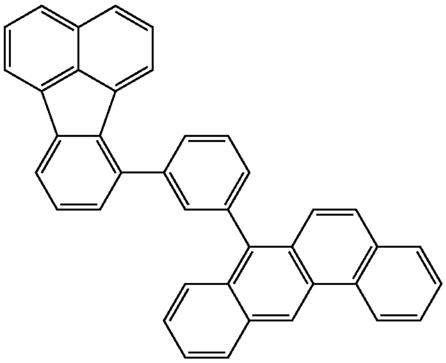
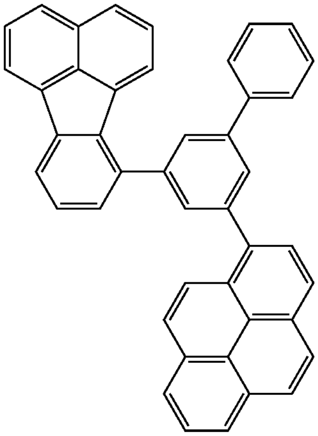
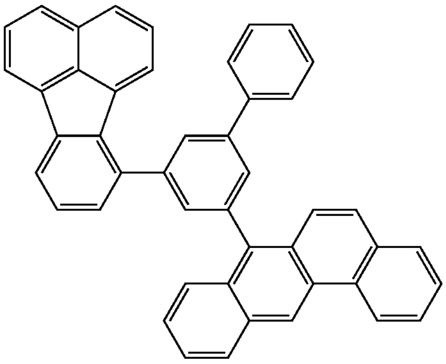

-continued
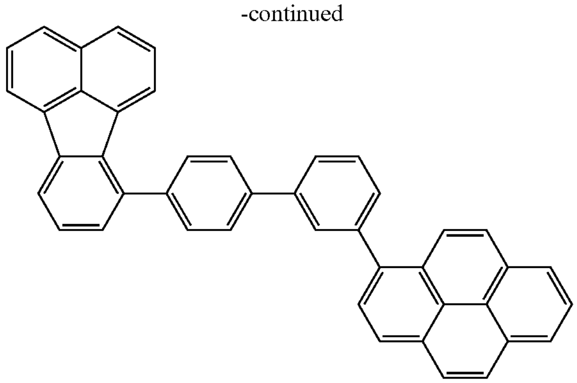
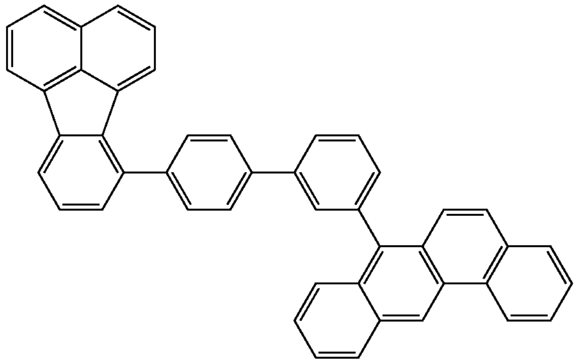
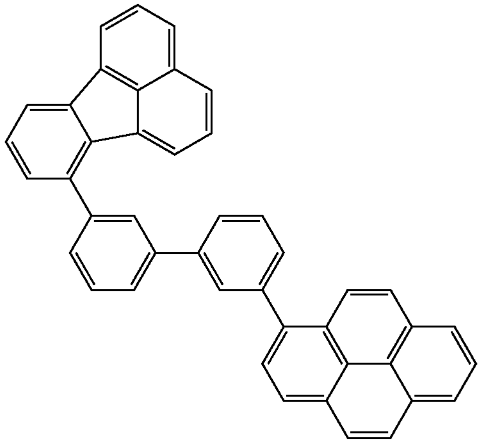
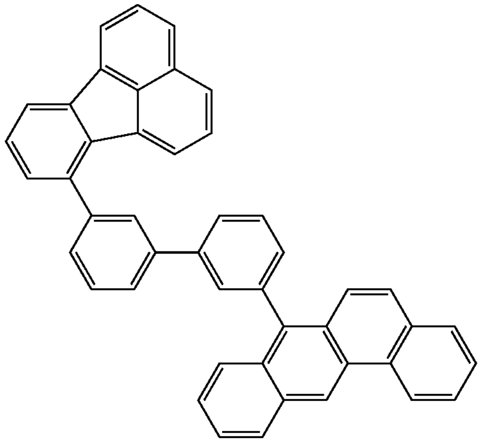
-continued
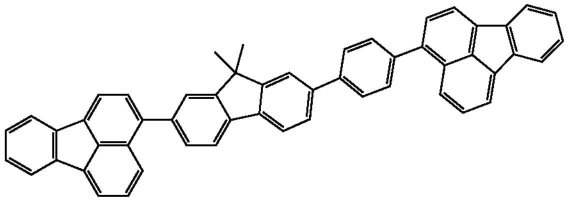
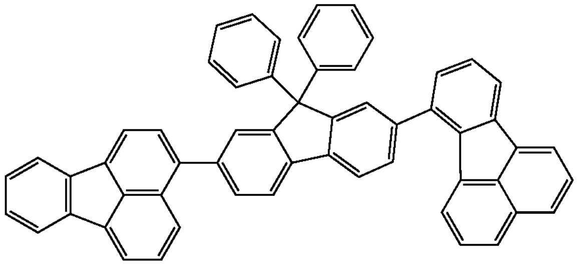
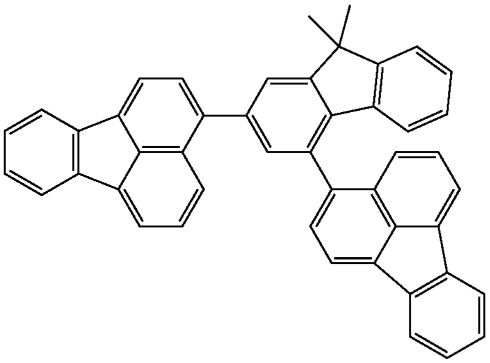
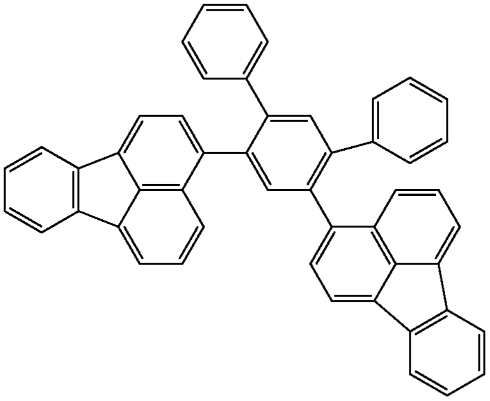
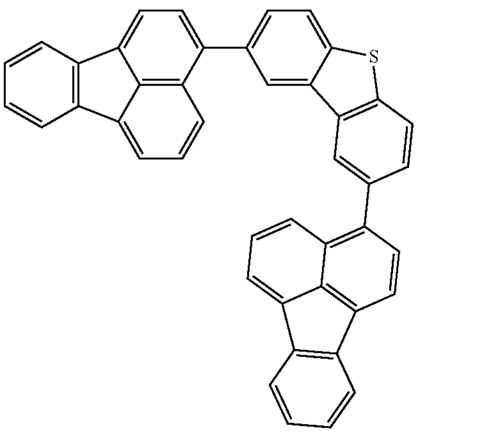

-continued
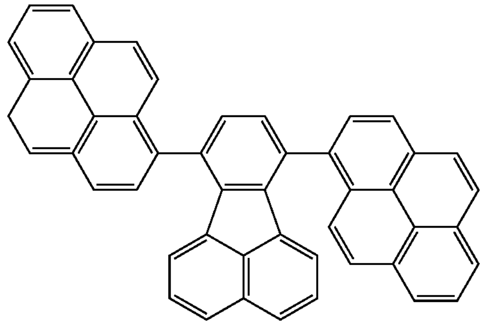
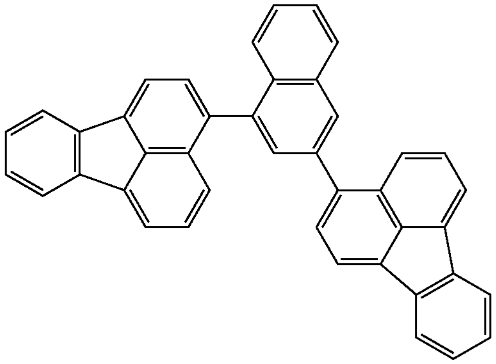
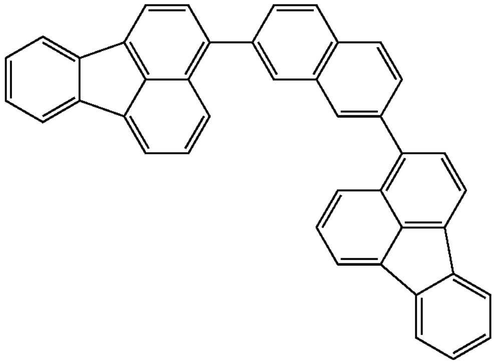
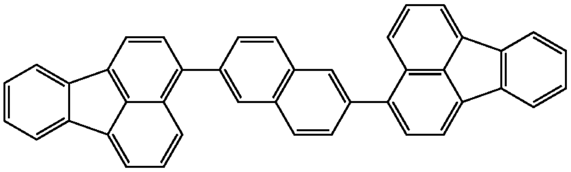 [SMILES: c1ccc2c(c1)-c1cccc3c(-c4ccc5cc(-c6ccc7c8c(cccc68)-c6ccccc6-7)ccc5c4)ccc-2c13]
[Formula 71]
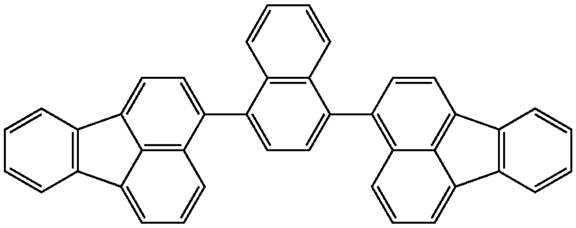
-continued
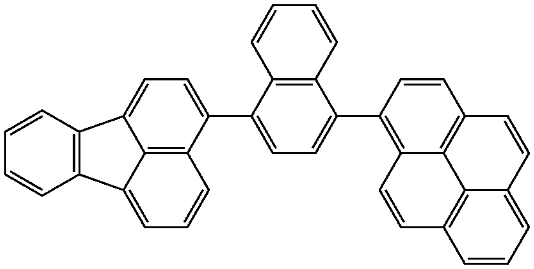
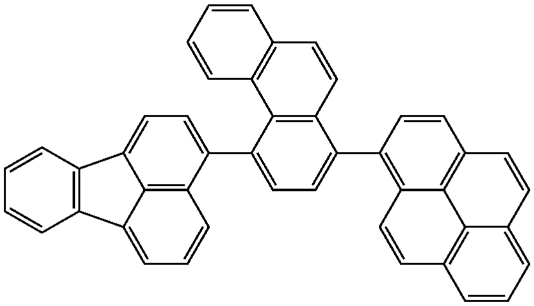
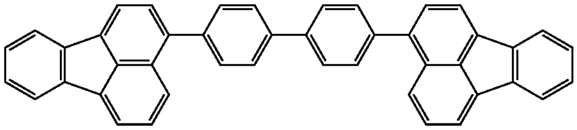
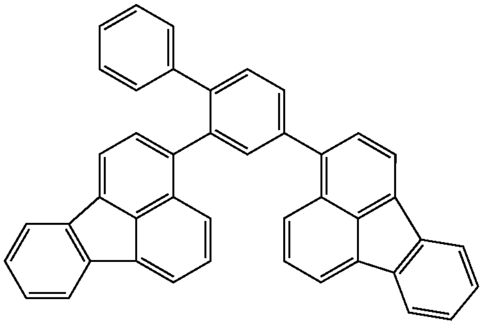
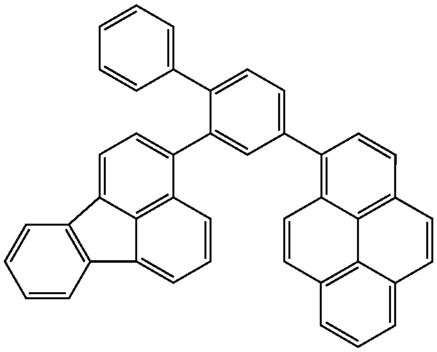
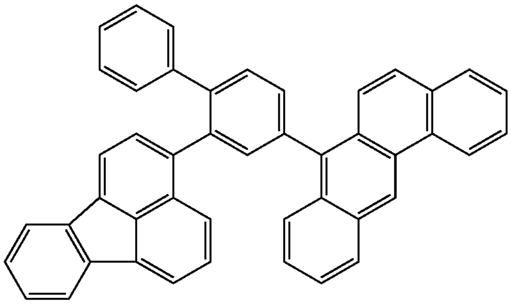

-continued
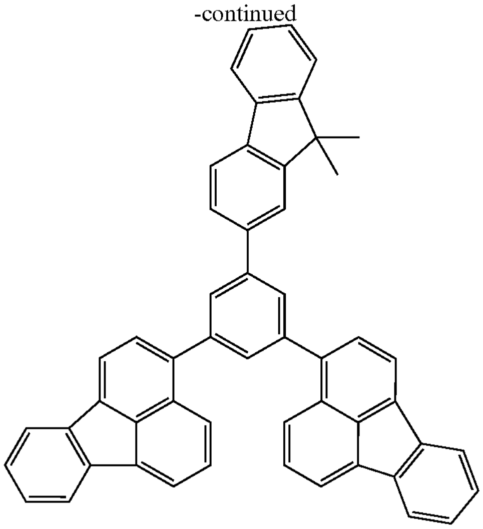
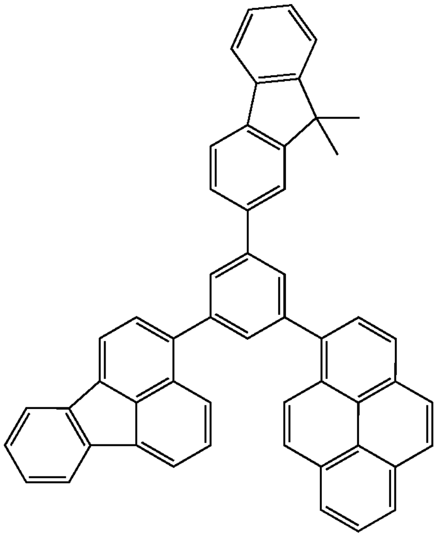
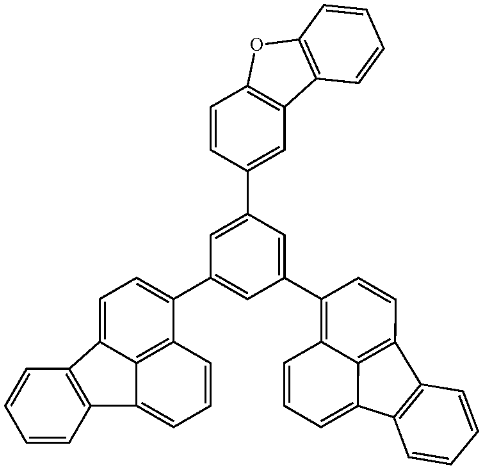
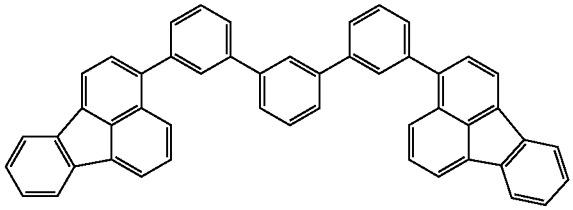
-continued
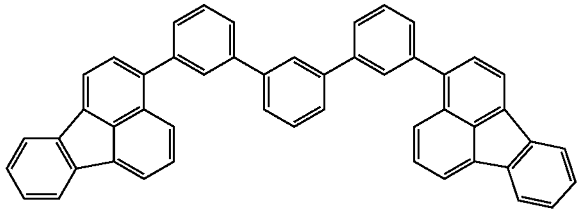
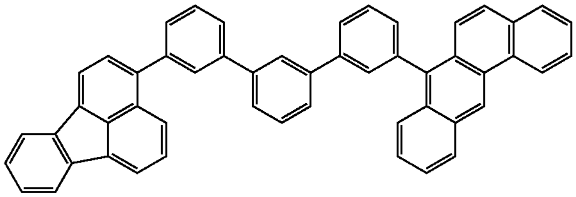
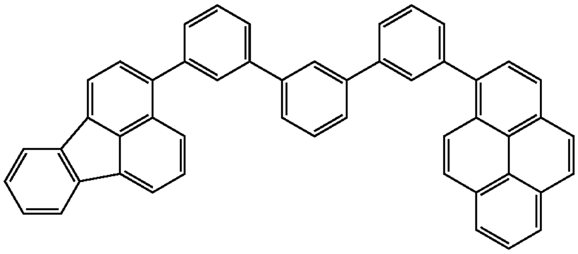
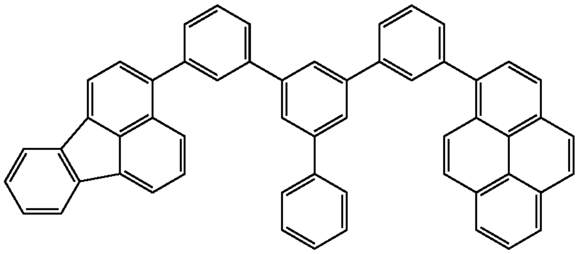
[Formula 72]
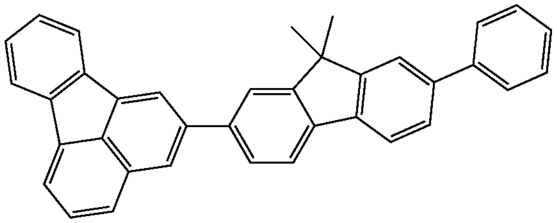
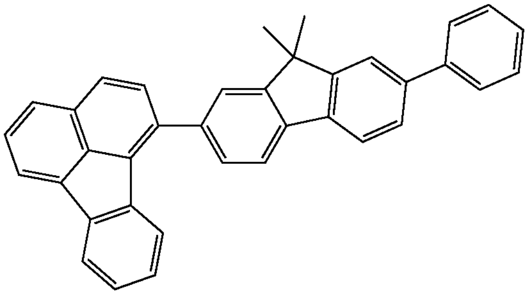
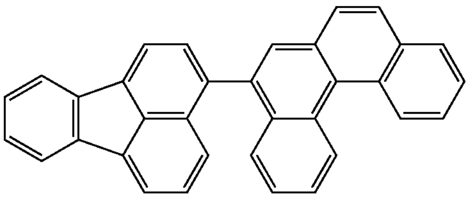

-continued
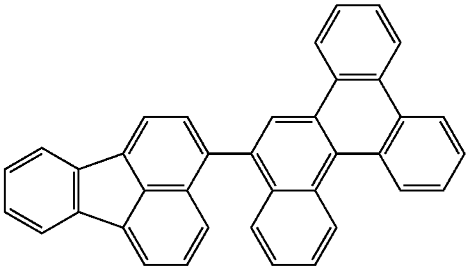
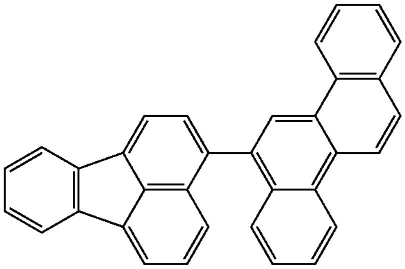
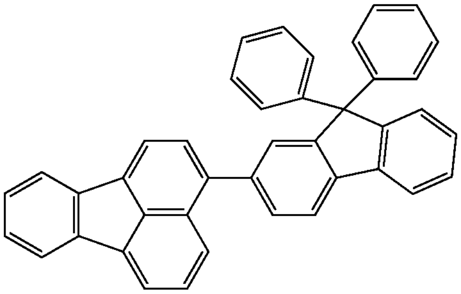
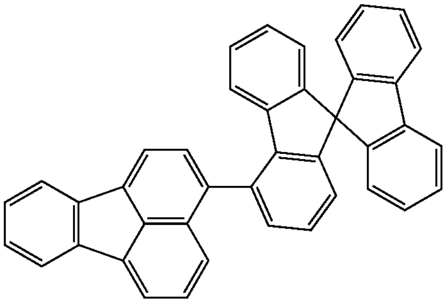
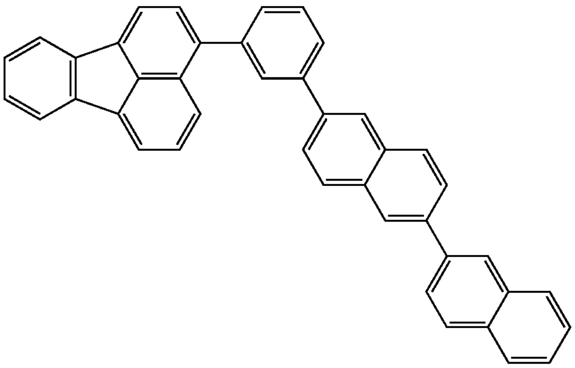
-continued
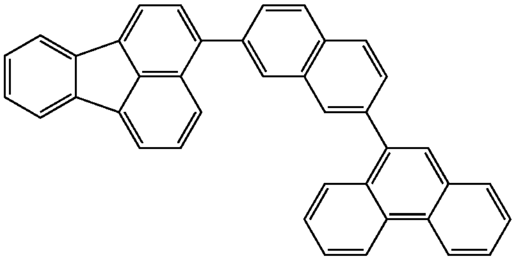
[Formula 73]
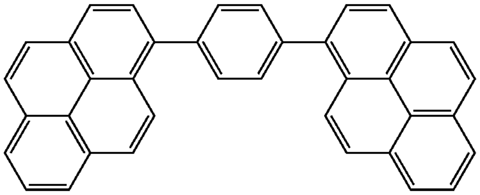
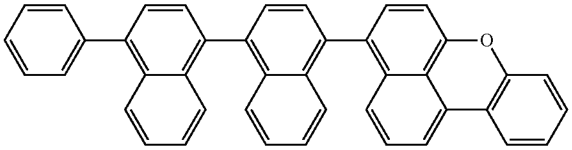
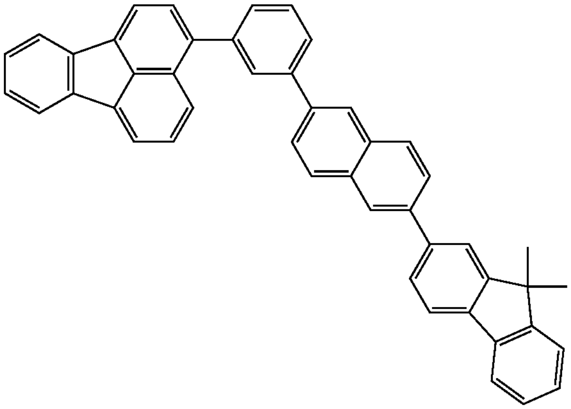
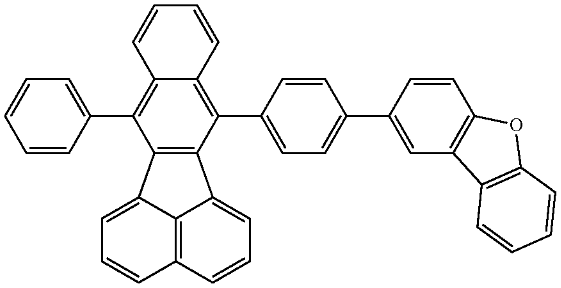
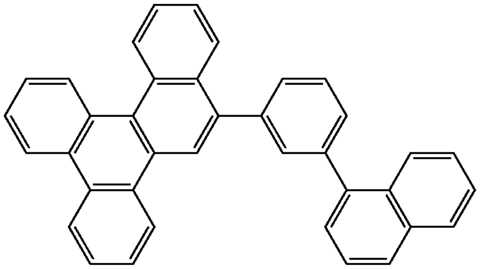 [SMILES: c1cc(-c2cccc3ccccc23)cc(-c2cc3c4ccccc4c4ccccc4c3c3ccccc23)c1]

-continued
[Formula 74]
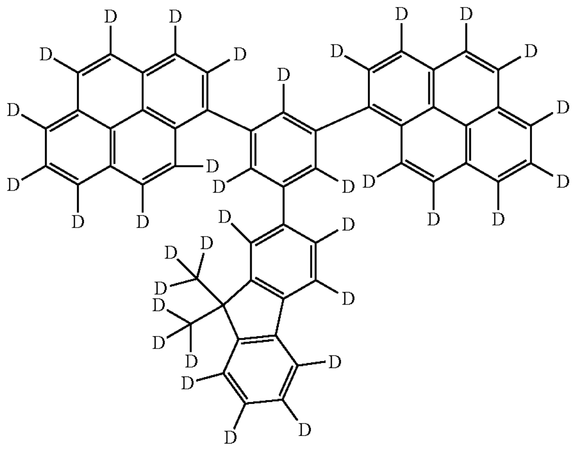
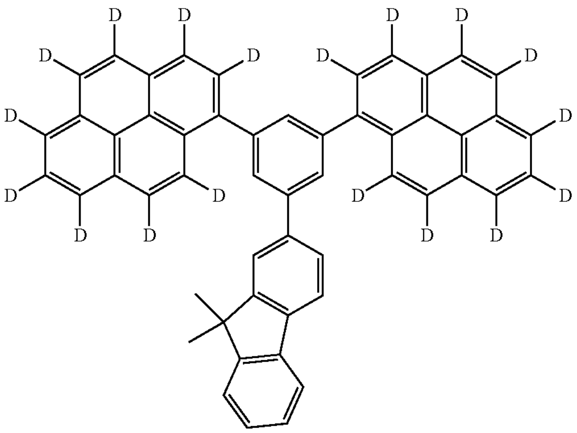
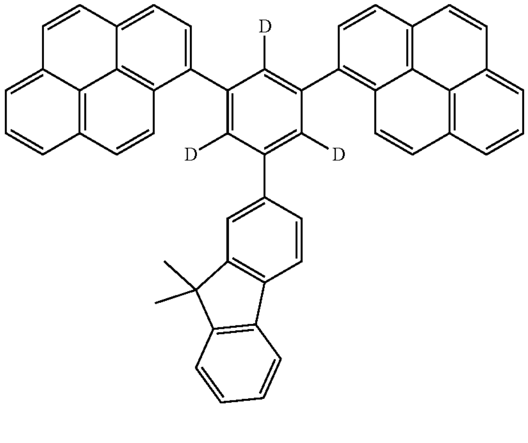
-continued
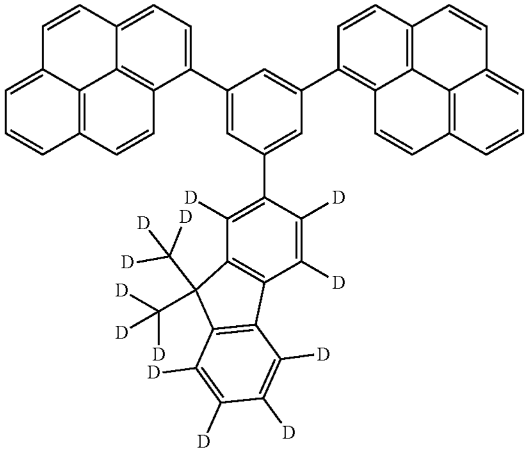
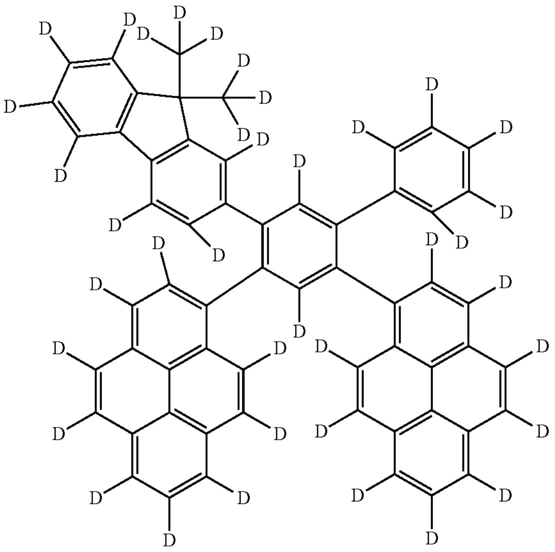
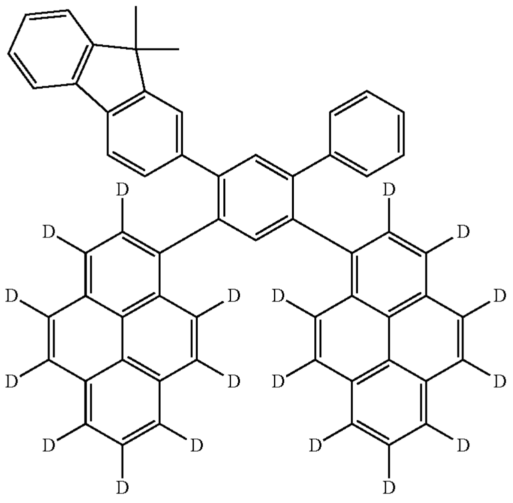

-continued
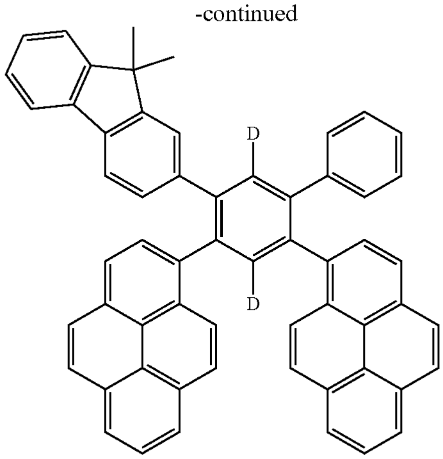
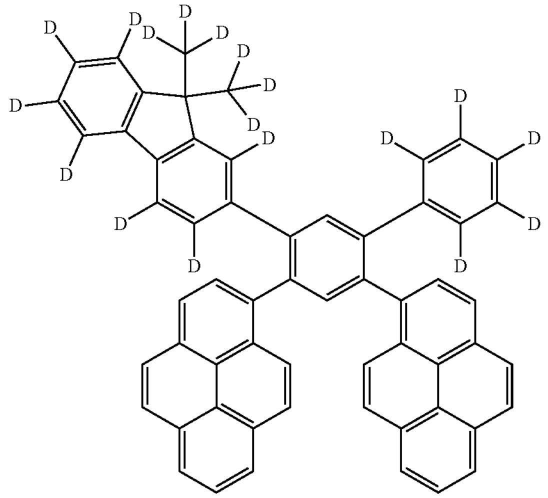
[Formula 75]
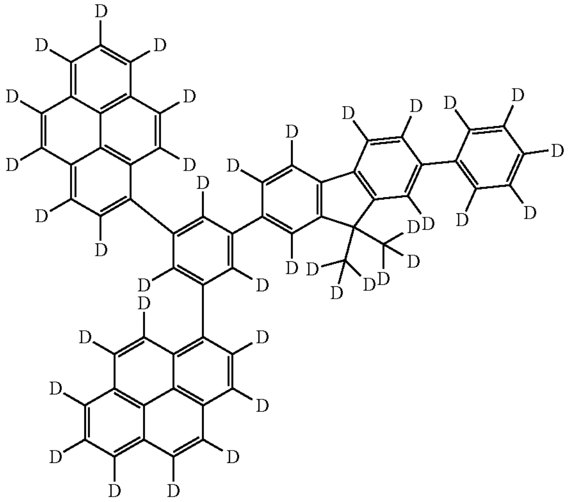
-continued
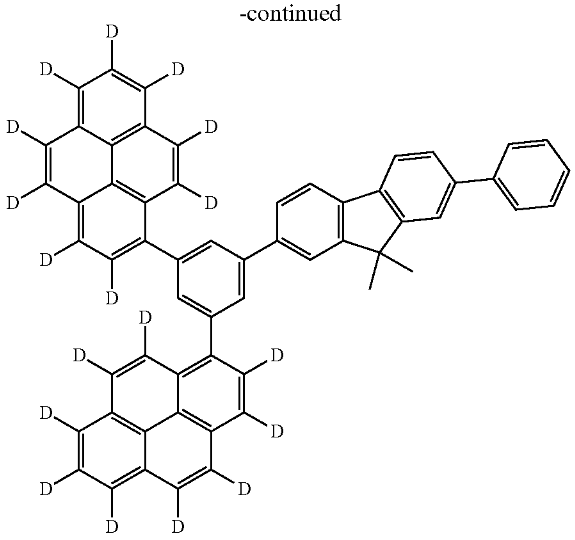
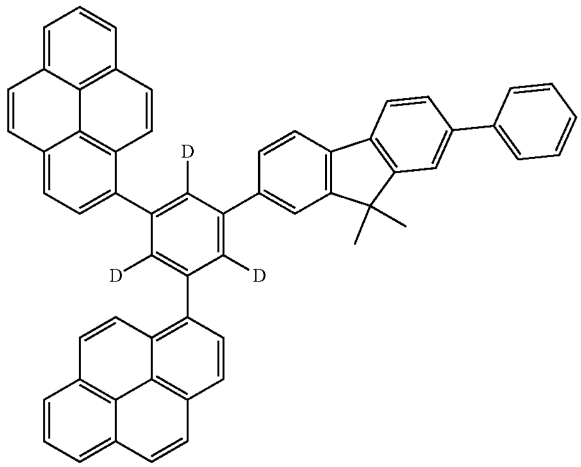
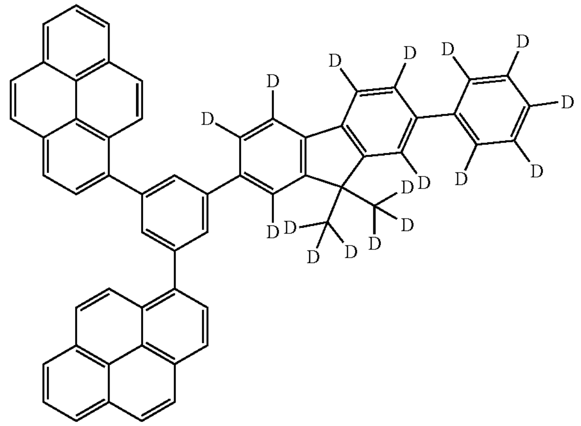

-continued
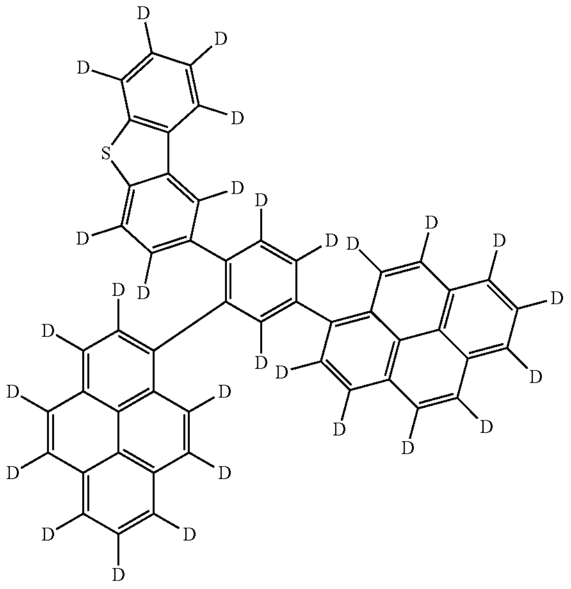
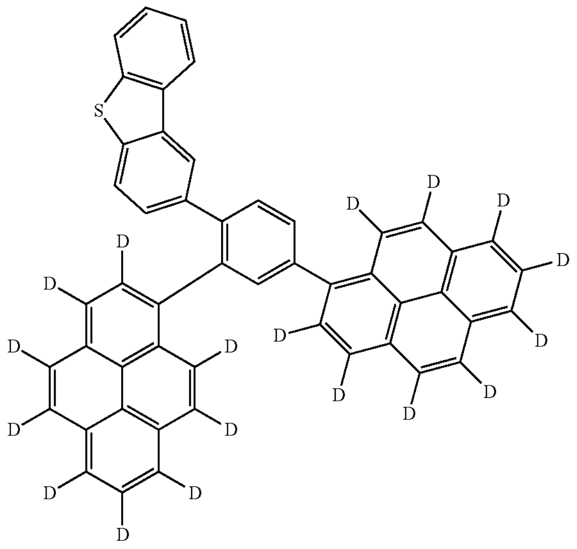
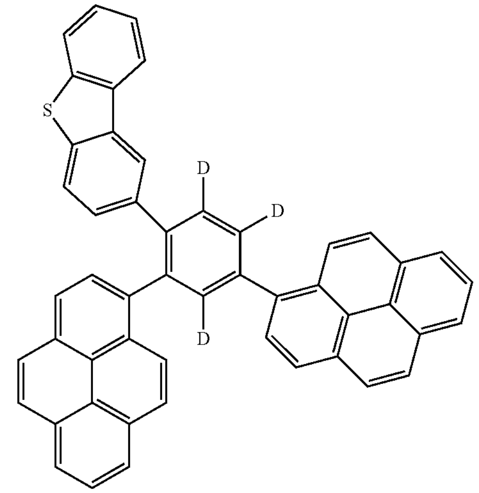
-continued
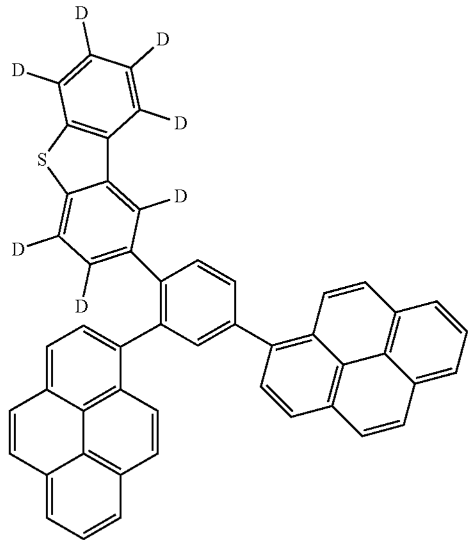
[Formula 76]
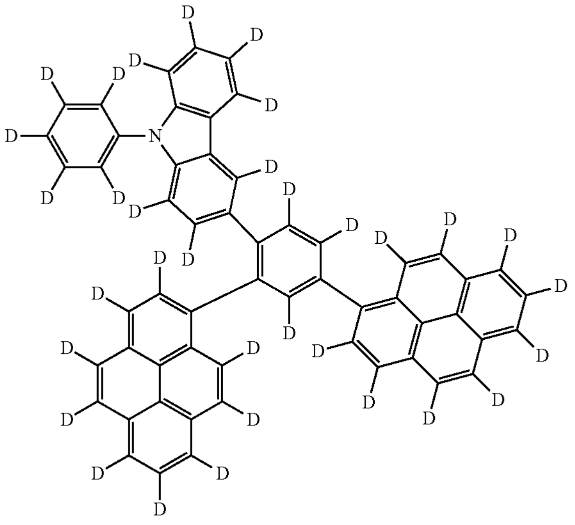
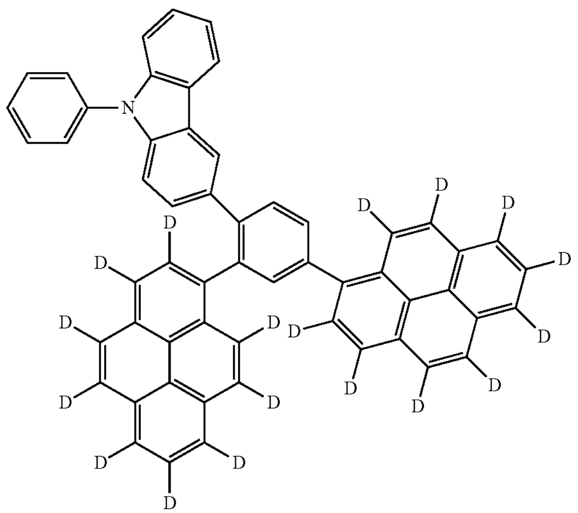

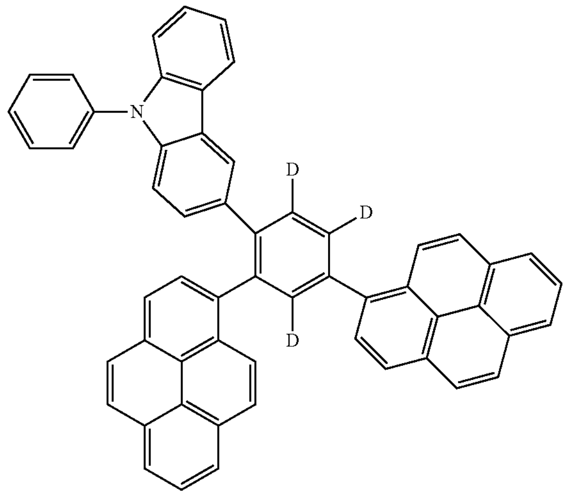
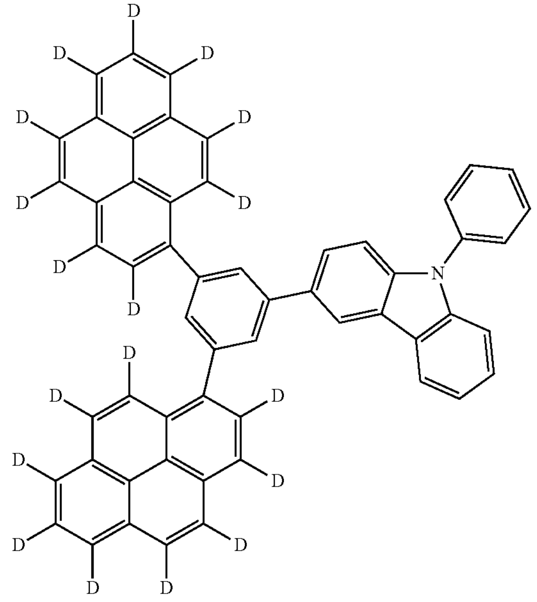
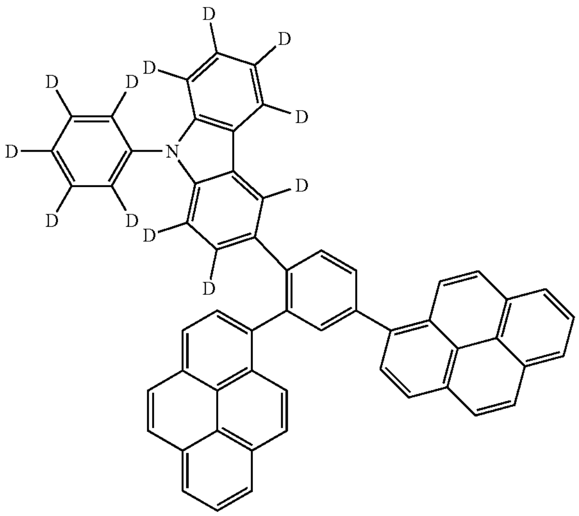
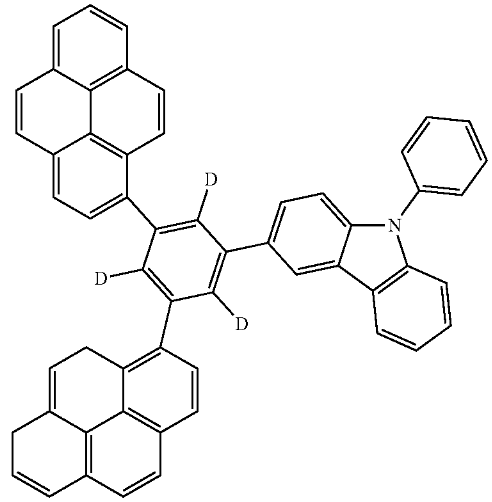
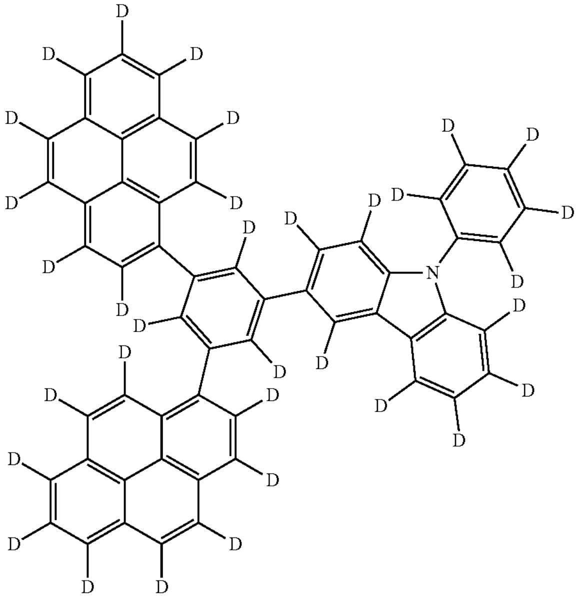
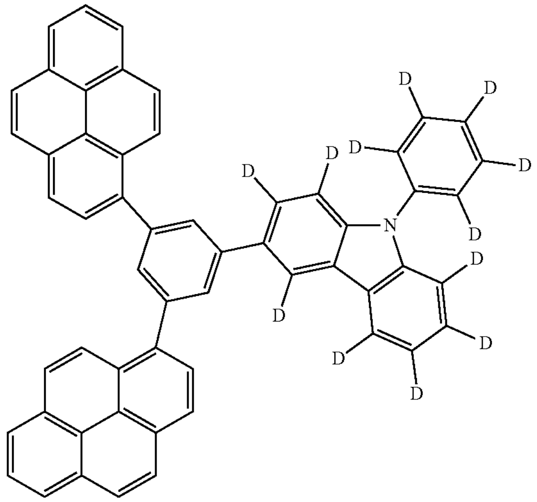

-continued
[Formula 77]
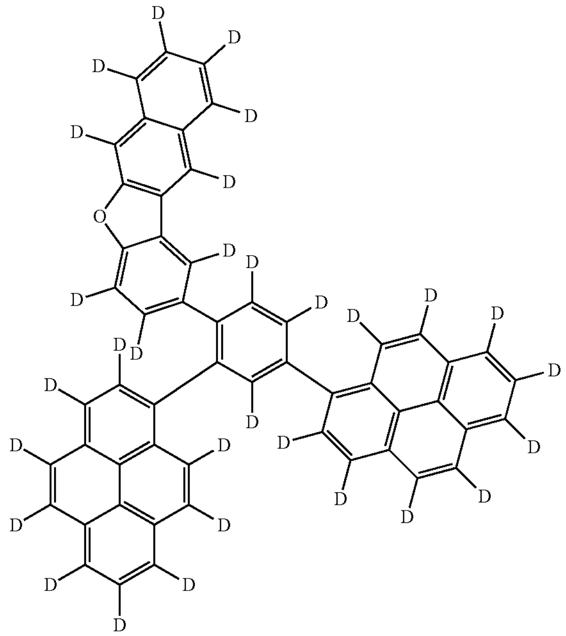
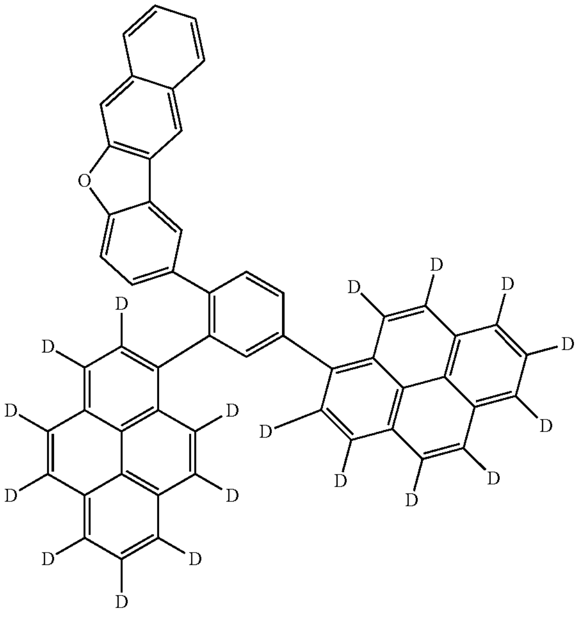
-continued
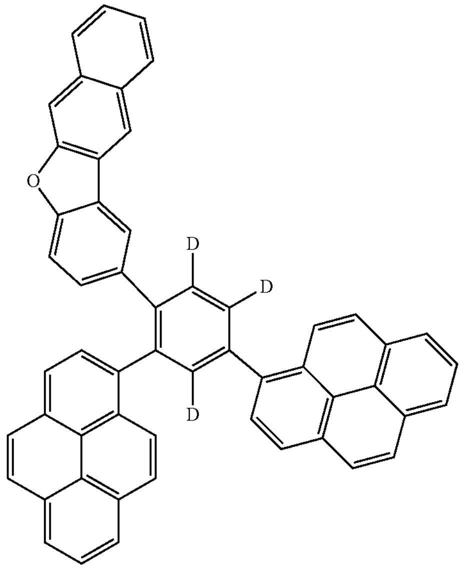
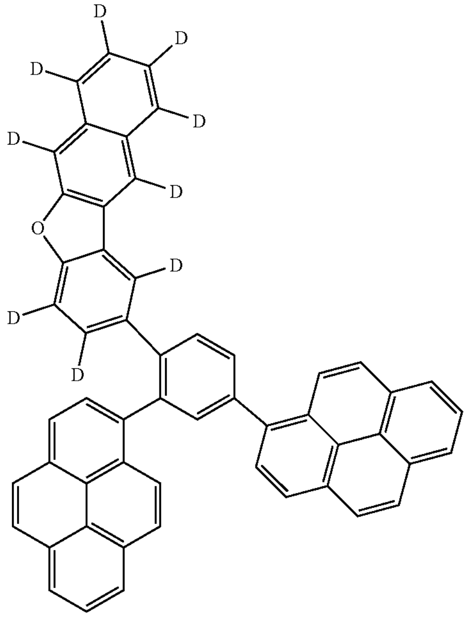
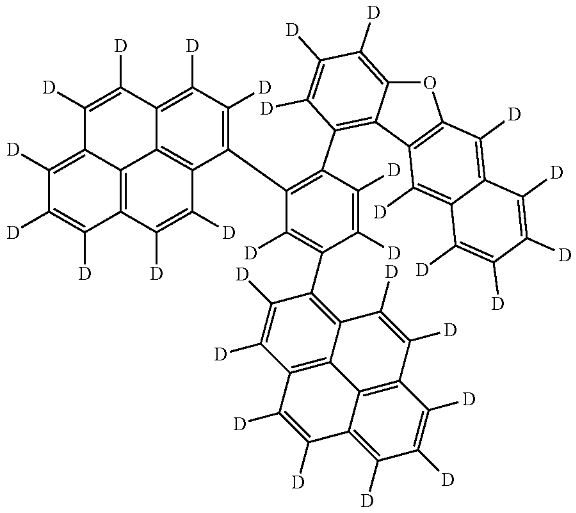

-continued
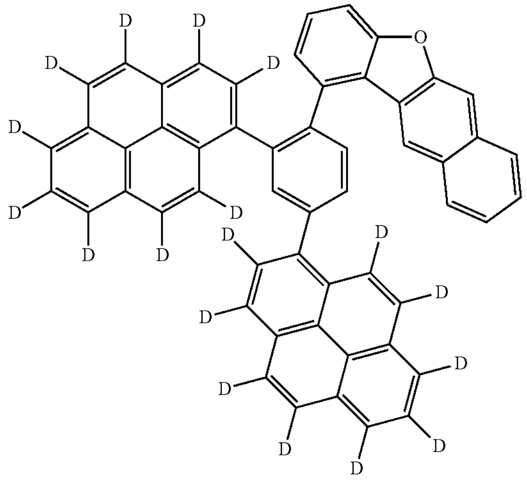
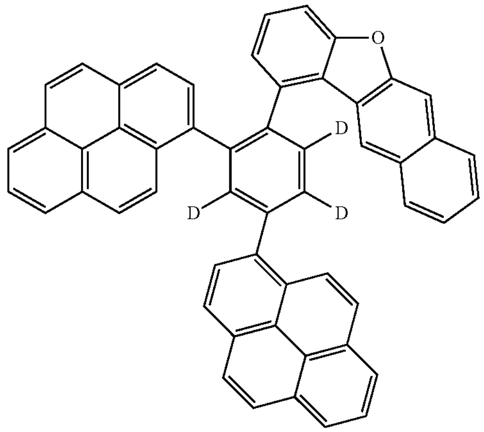
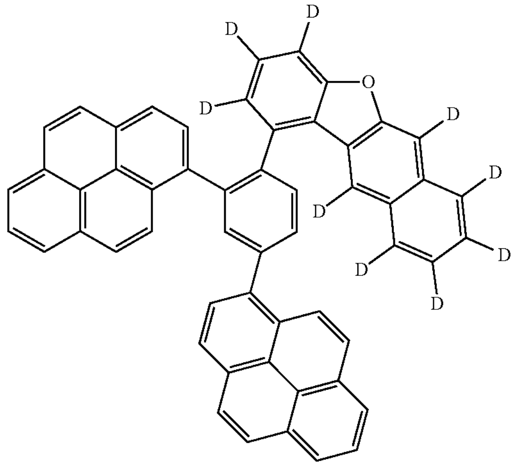 [SMILES: [2H]c1c([2H])c(-c2ccc(-c3ccc4ccc5cccc6ccc3c4c56)cc2-c2ccc3ccc4cccc5ccc2c3c45)c2c(oc3c([2H])c4c([2H])c([2H])c([2H])c([2H])c4c([2H])c32)c1[2H]]
-continued
[Formula 78]
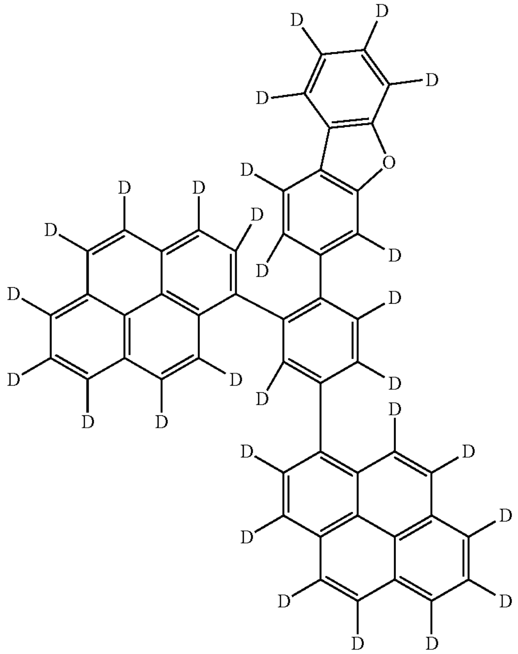
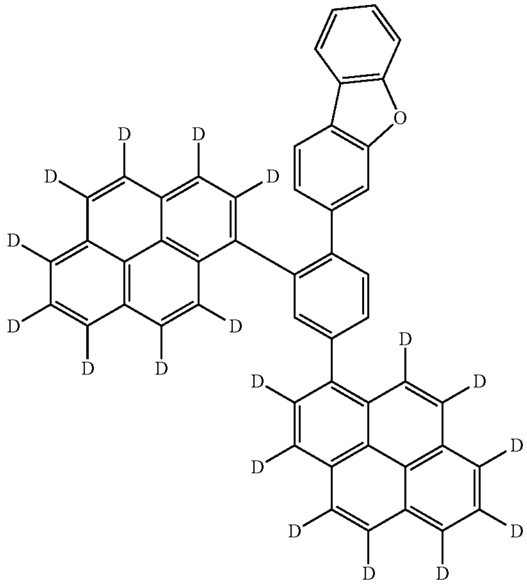

-continued
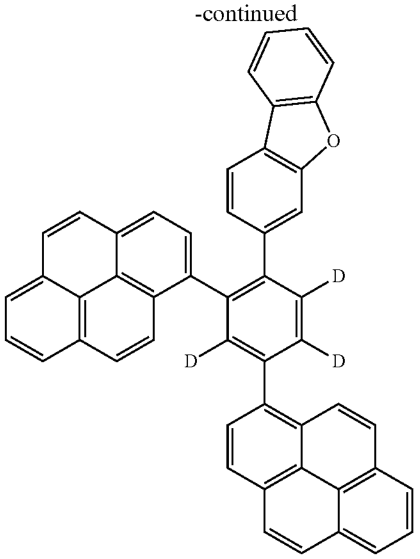
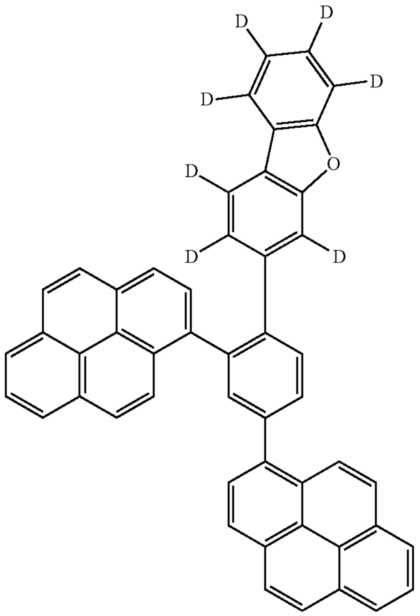
-continued
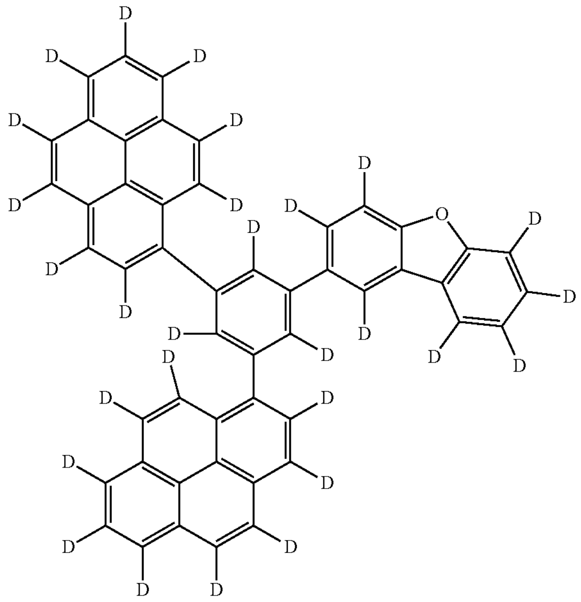
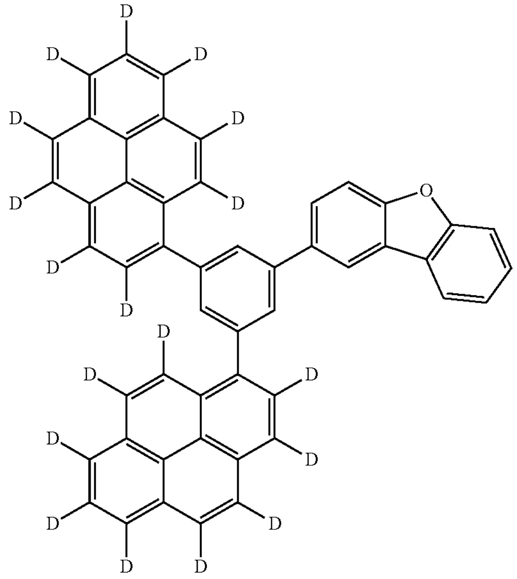
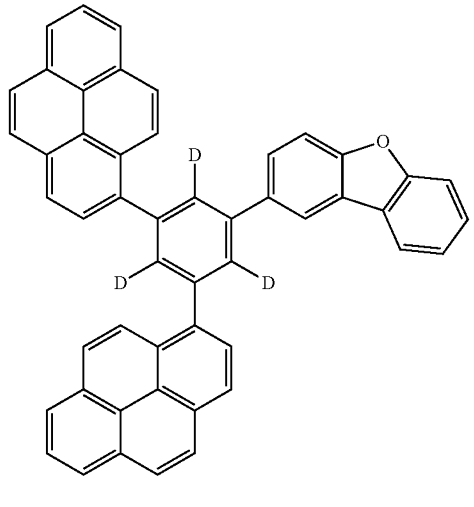

-continued
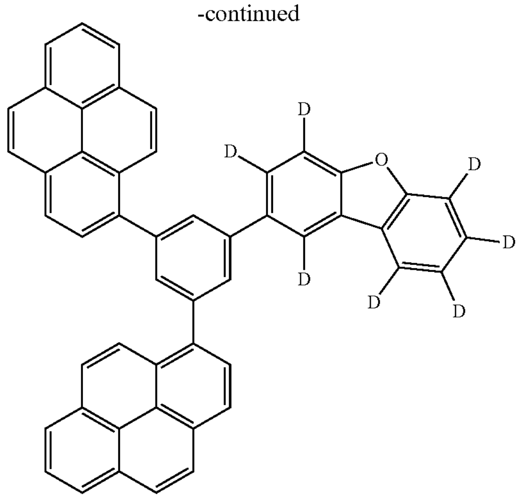
[Formula 79]
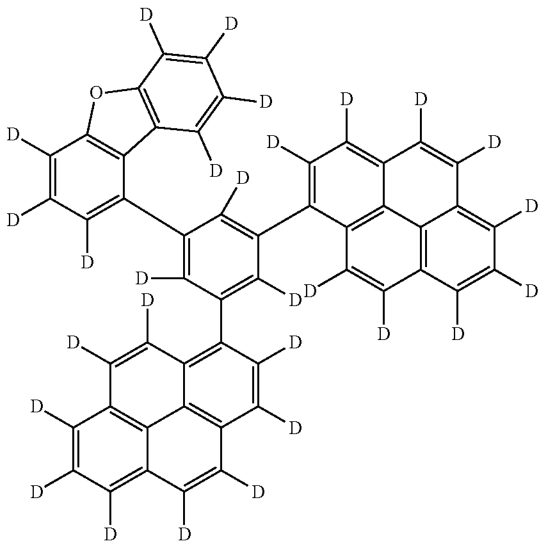
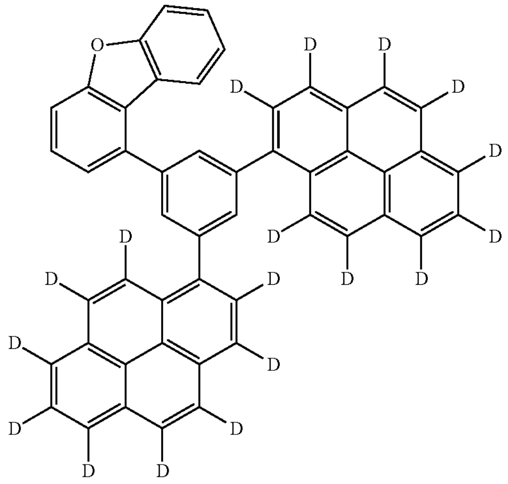
-continued
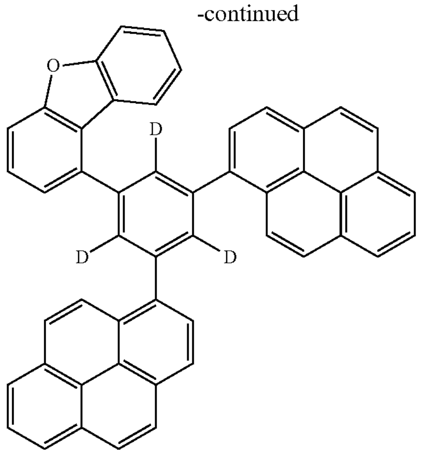
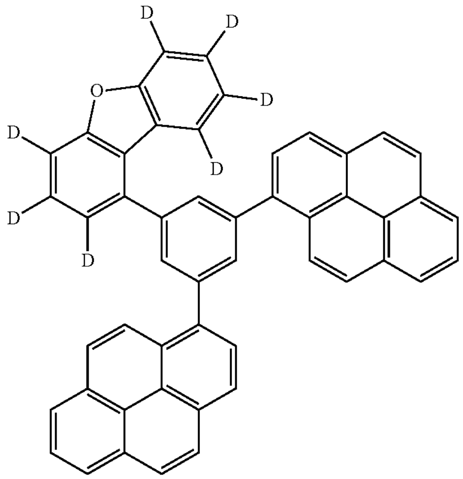
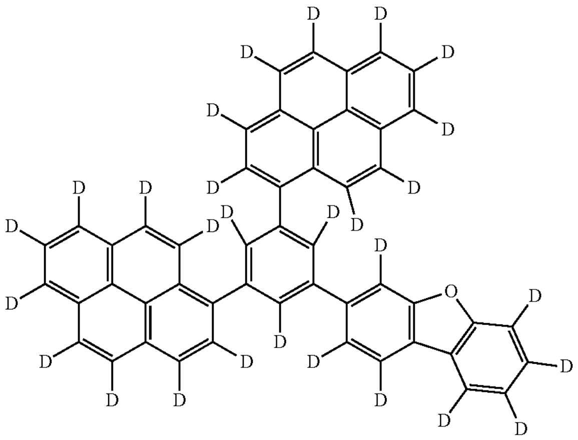

-continued
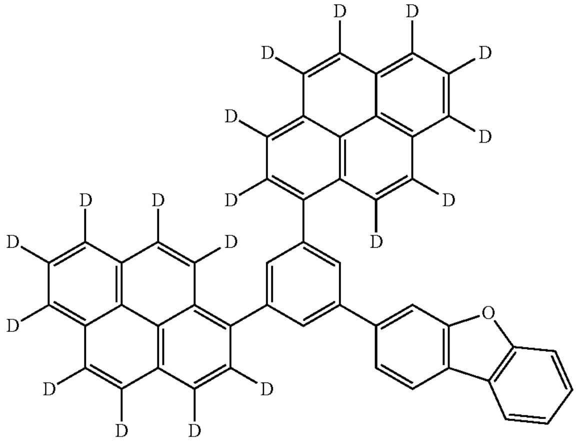
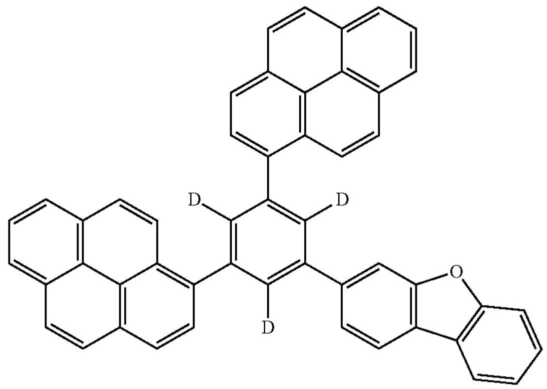
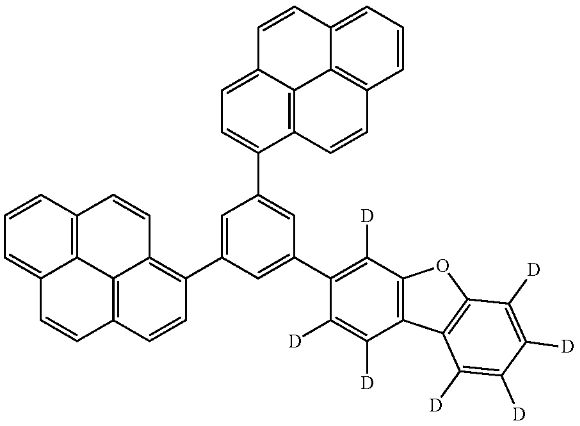
-continued
[Formula 80]
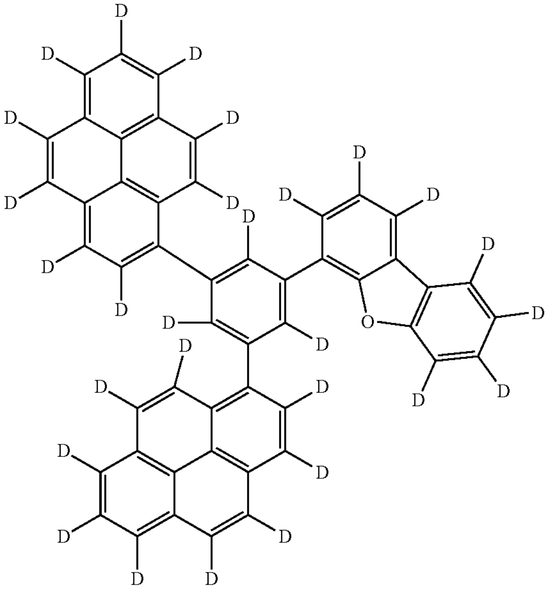
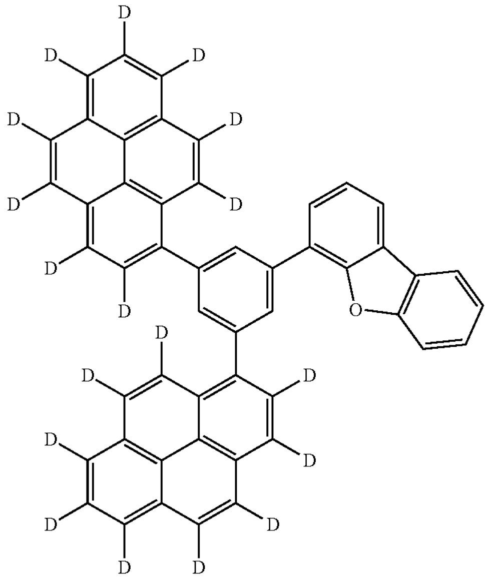
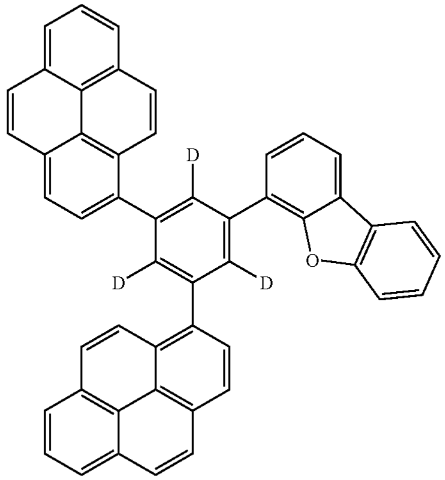

-continued
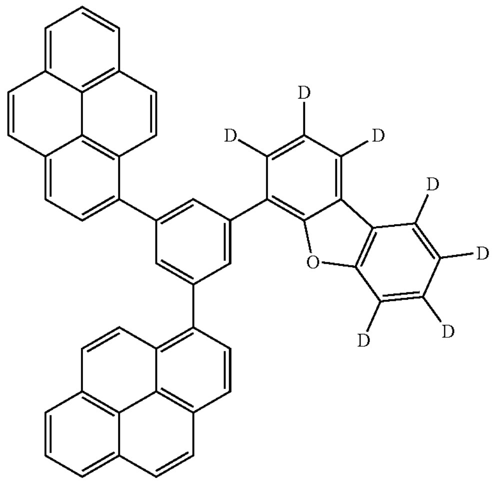
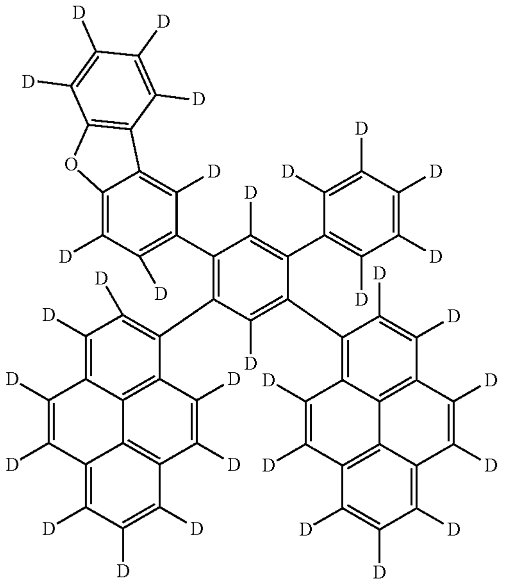
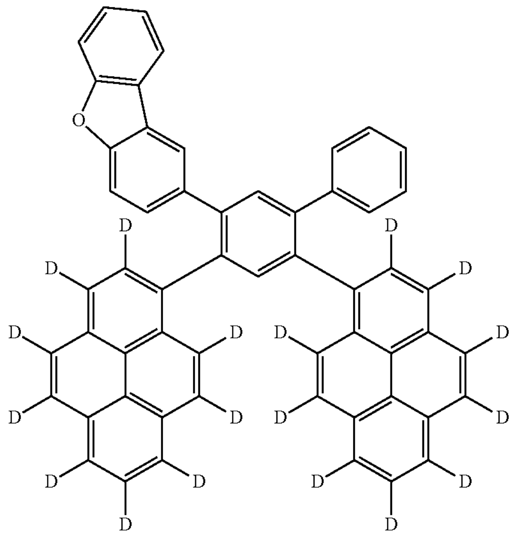
-continued
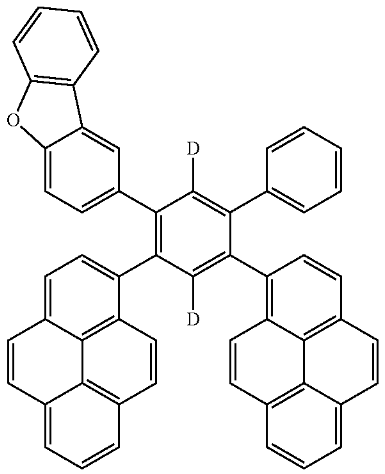
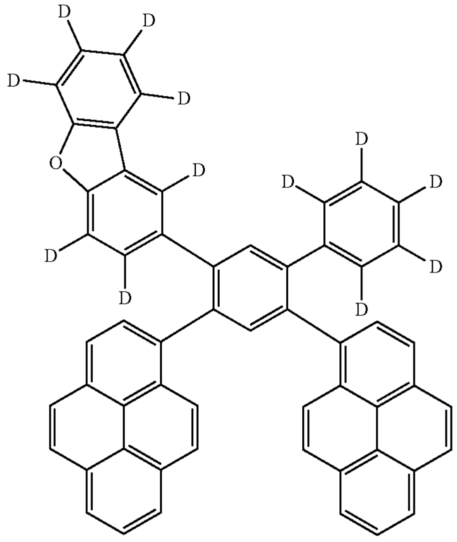
[Formula 81]
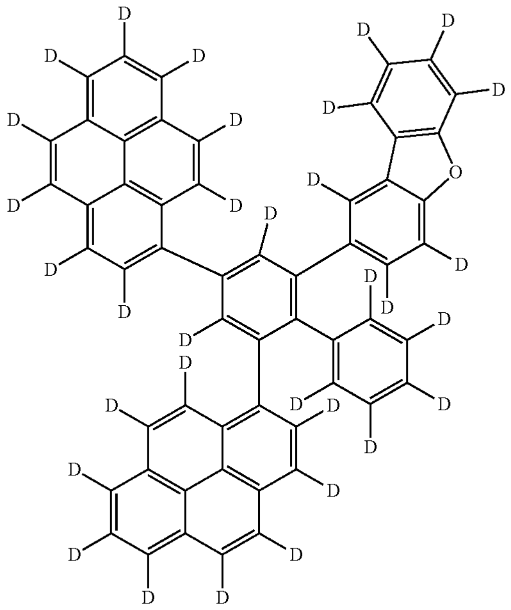

-continued
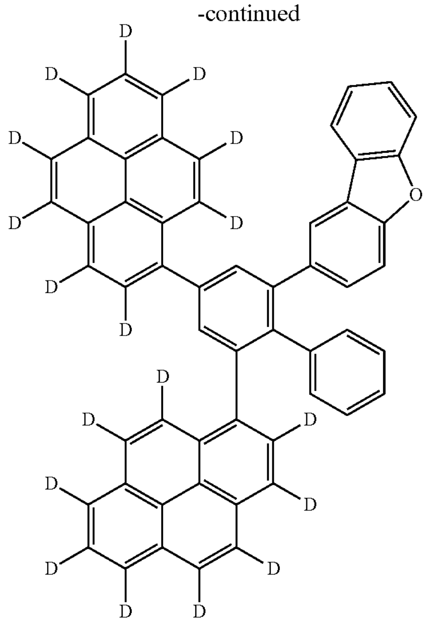
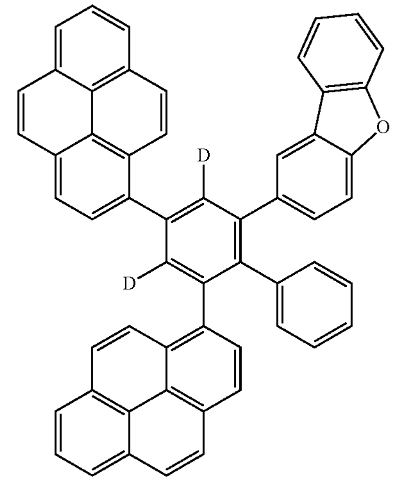
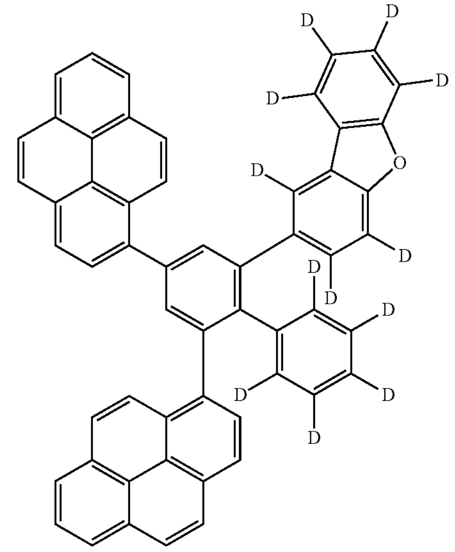
-continued
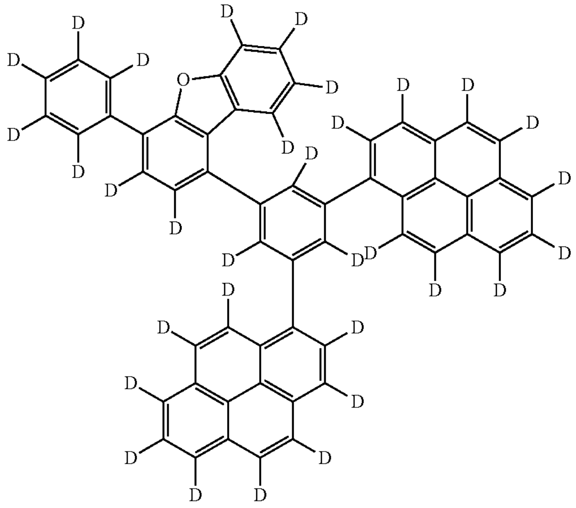
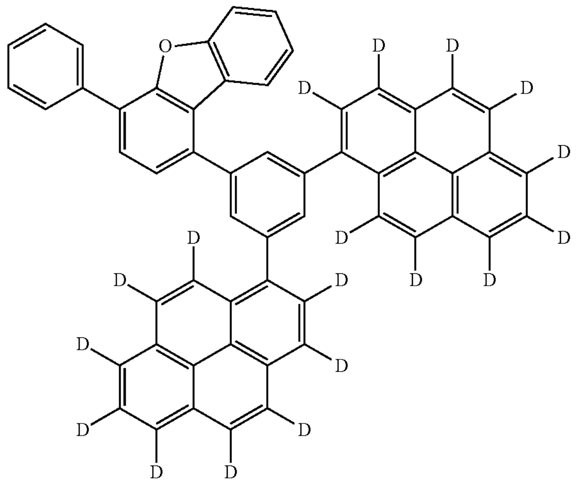
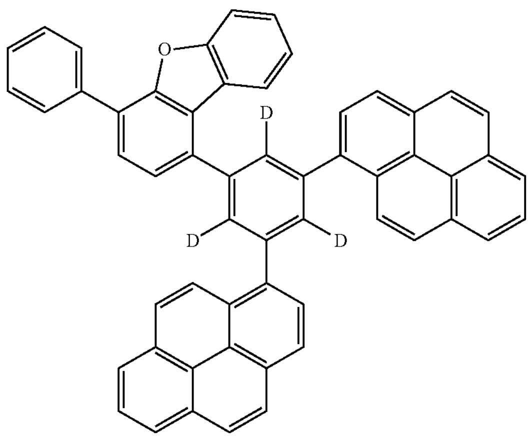

-continued
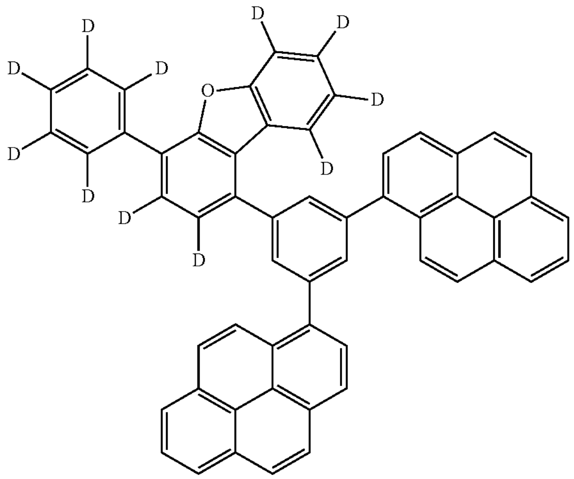 [SMILES: [2H]c1c([2H])c([2H])c(-c2c([2H])c([2H])c(-c3cc(-c4ccc5ccc6cccc7ccc4c5c67)cc(-c4ccc5ccc6cccc7ccc4c5c67)c3)c3c2oc2c([2H])c([2H])c([2H])c([2H])c23)c([2H])c1[2H]]
[Formula 82]
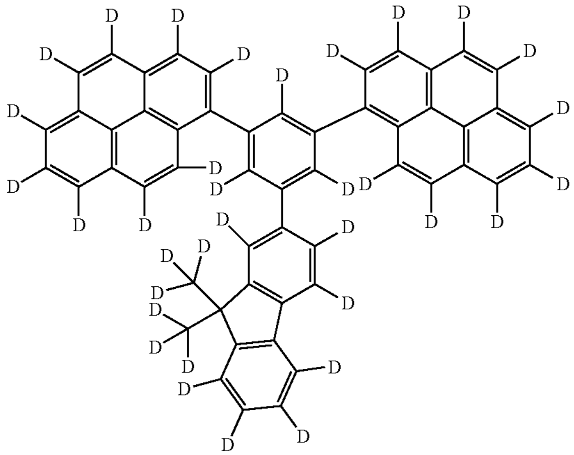
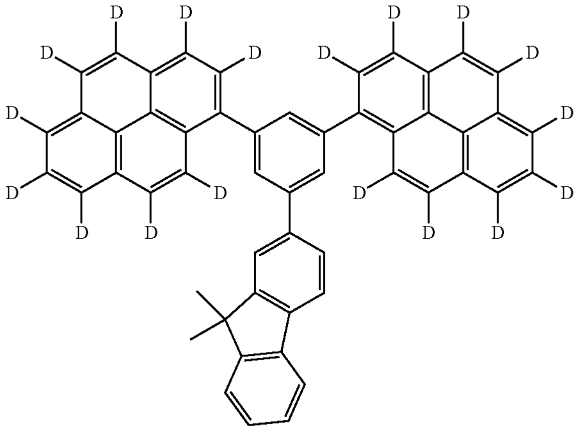
-continued
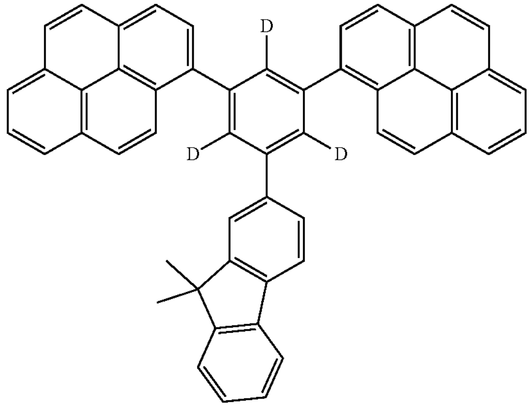
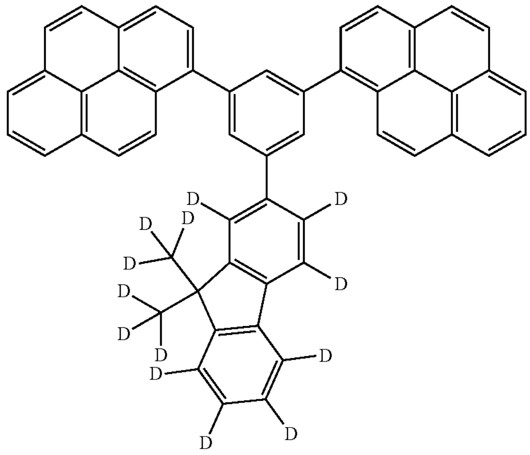
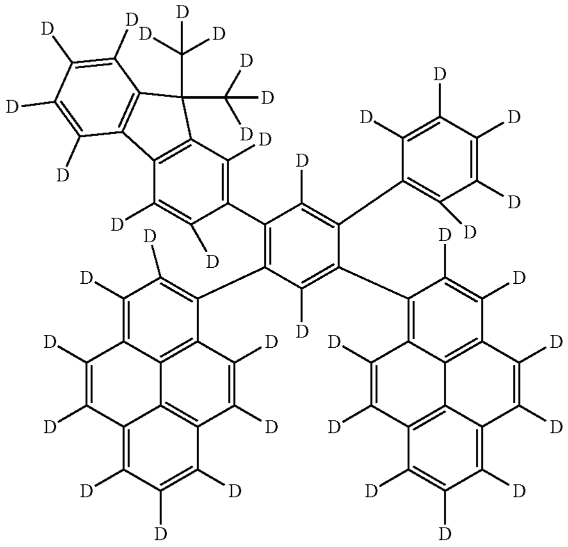

-continued
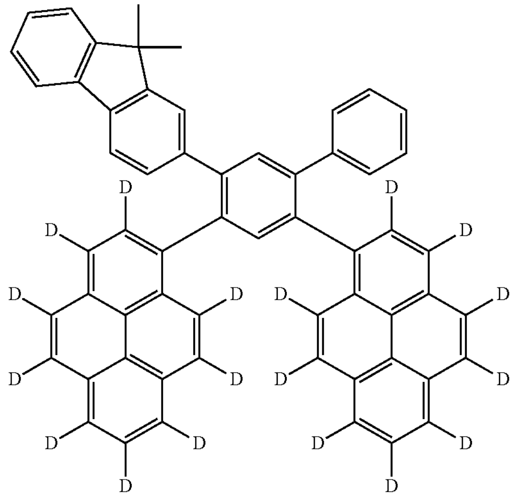
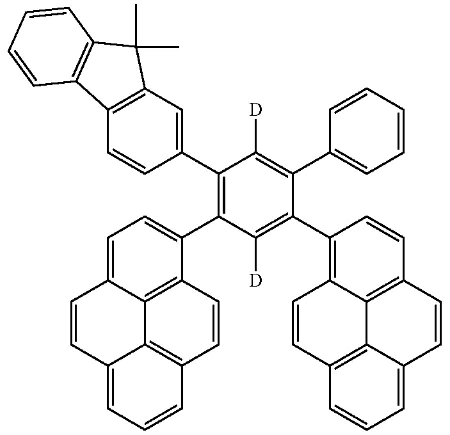
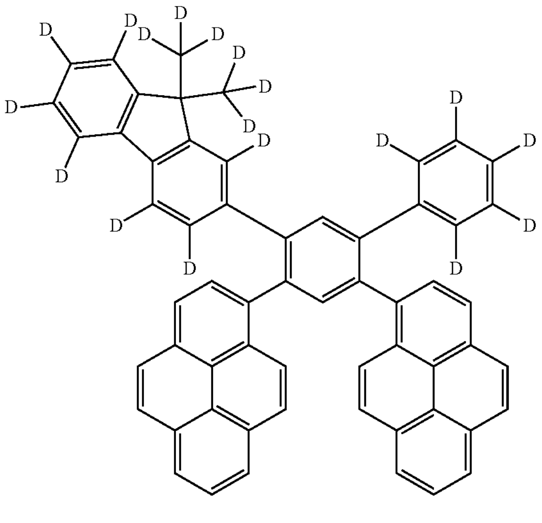
-continued
[Formula 83]
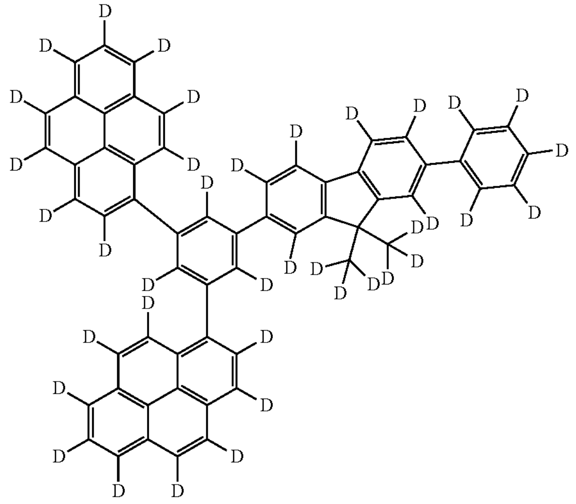
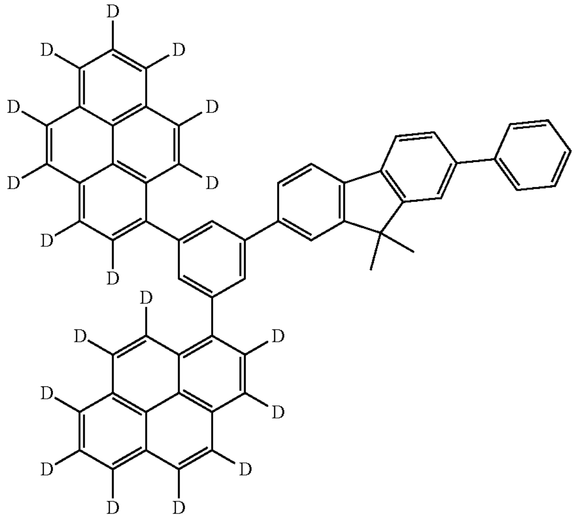
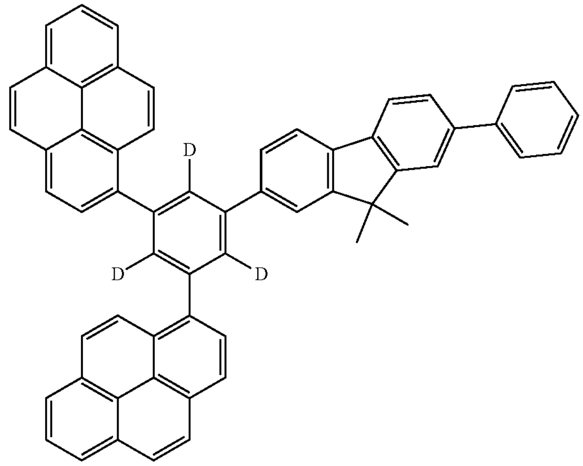

-continued
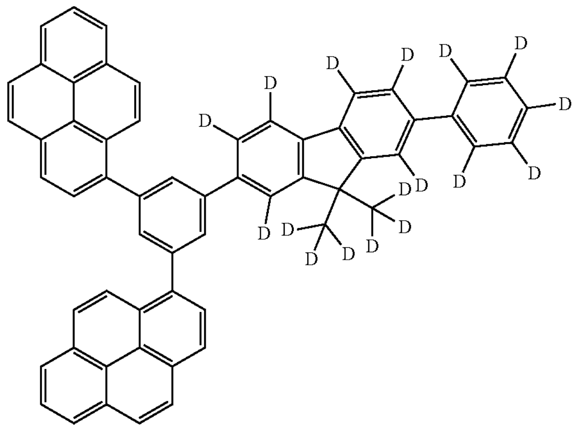
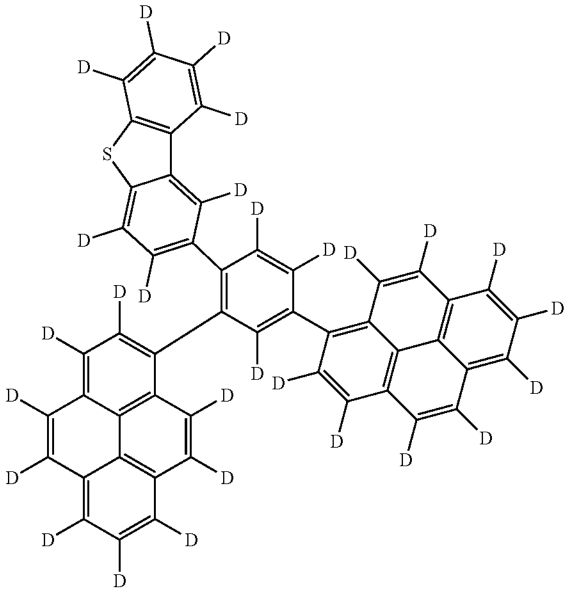
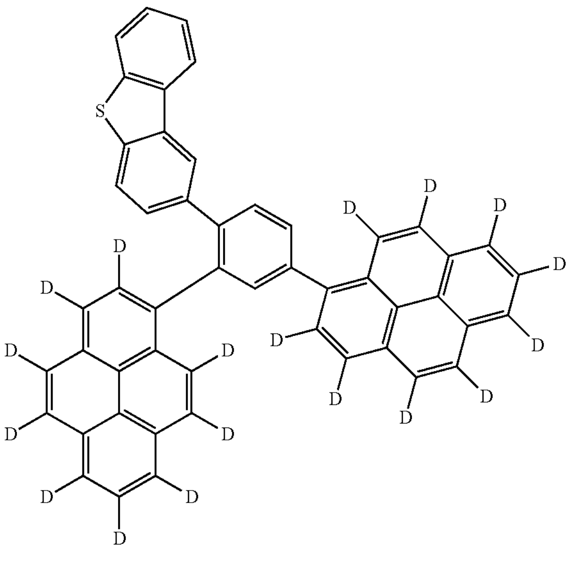
-continued
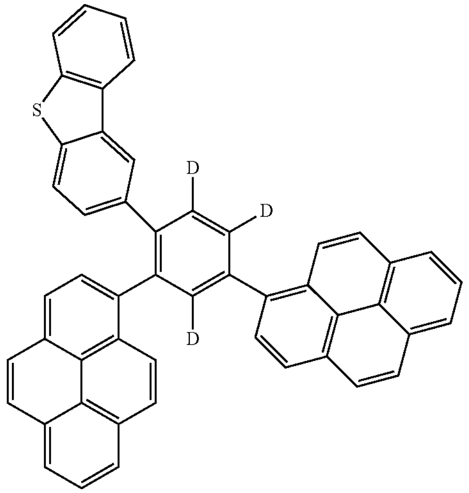
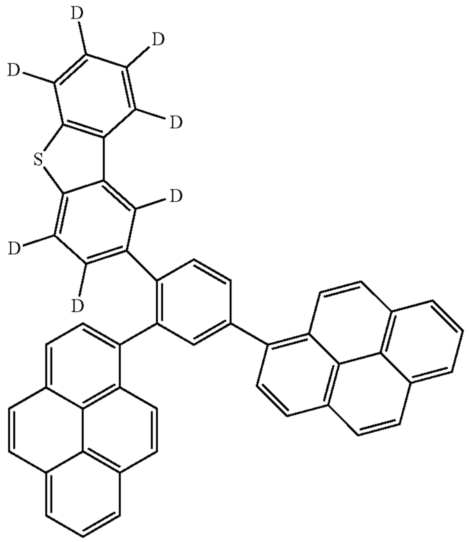

[Formula 84]
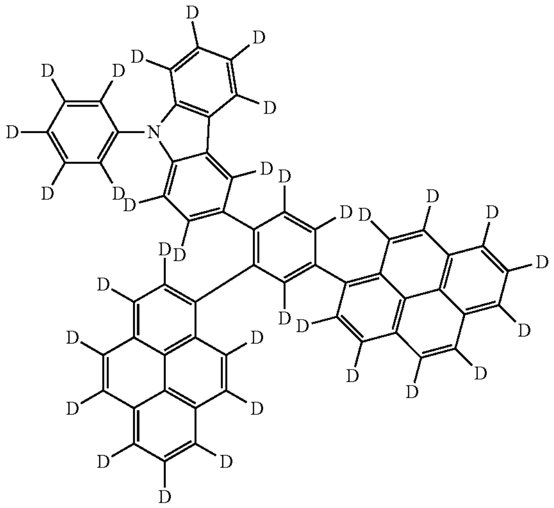
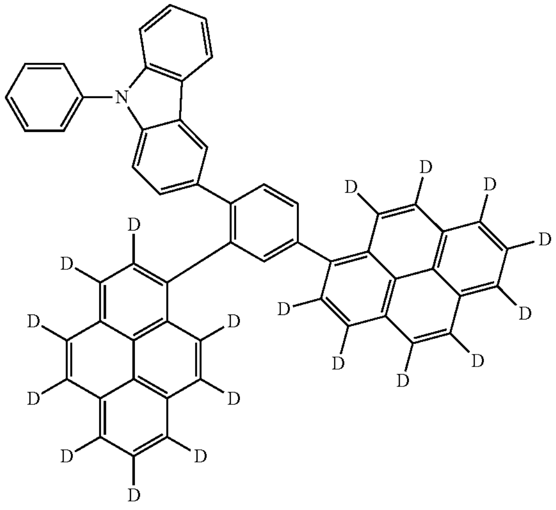
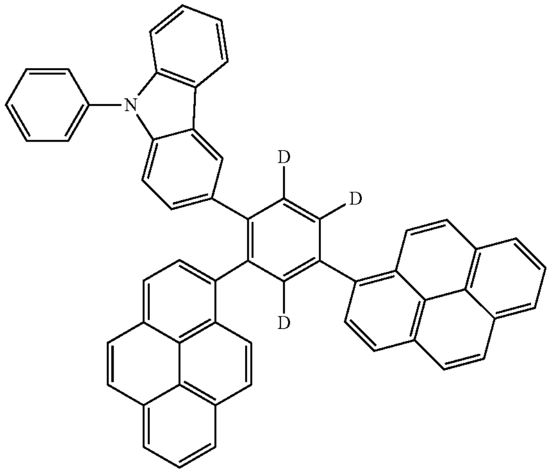
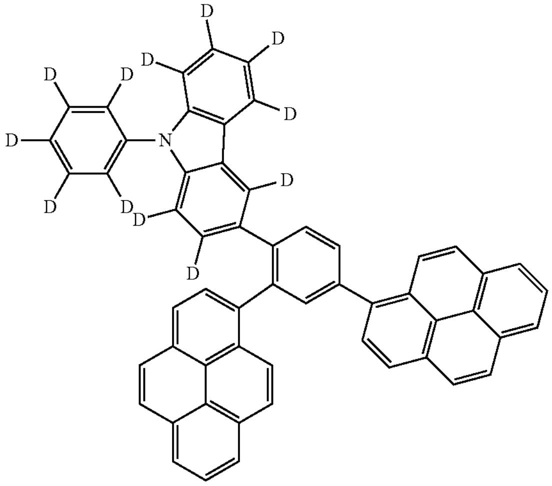
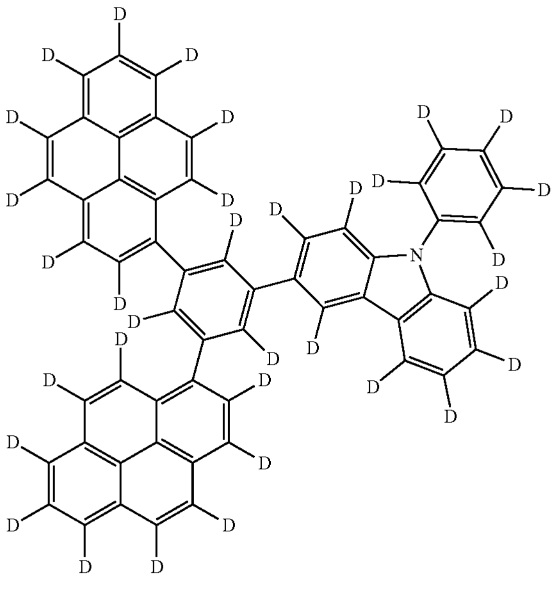
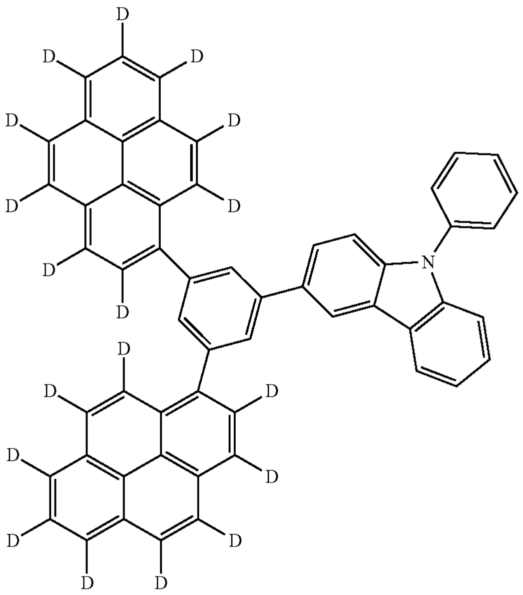

-continued
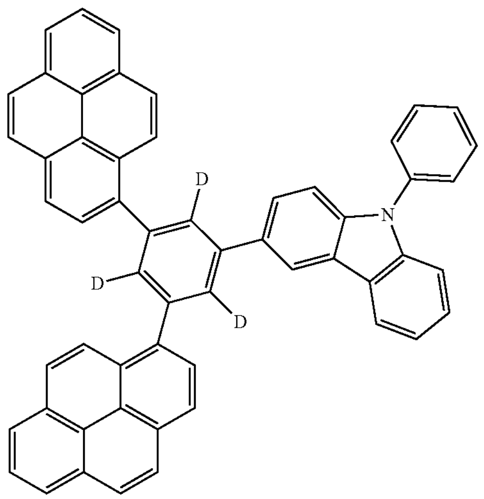
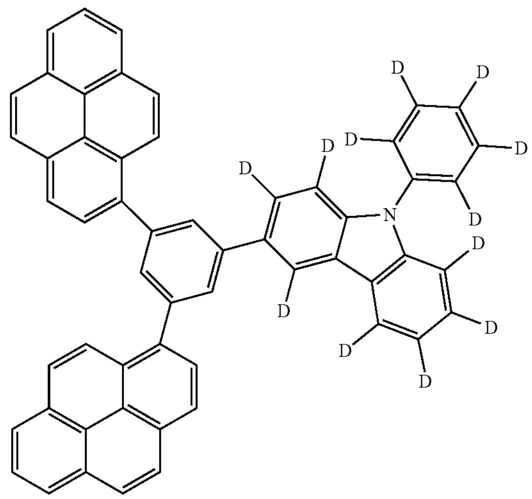
[Formula 85]
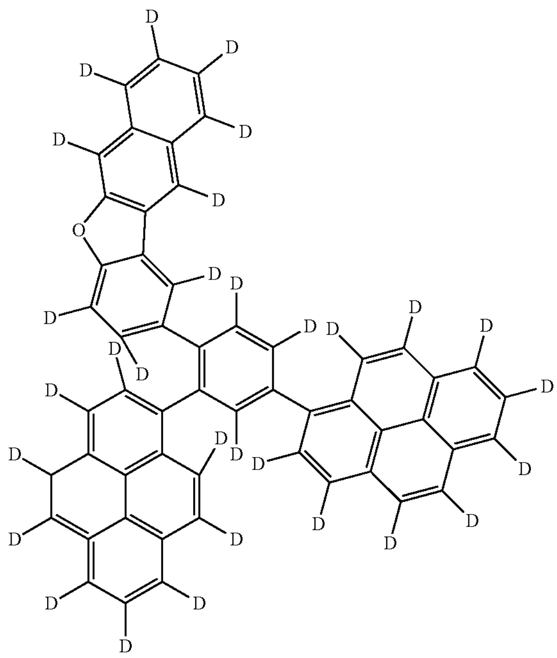
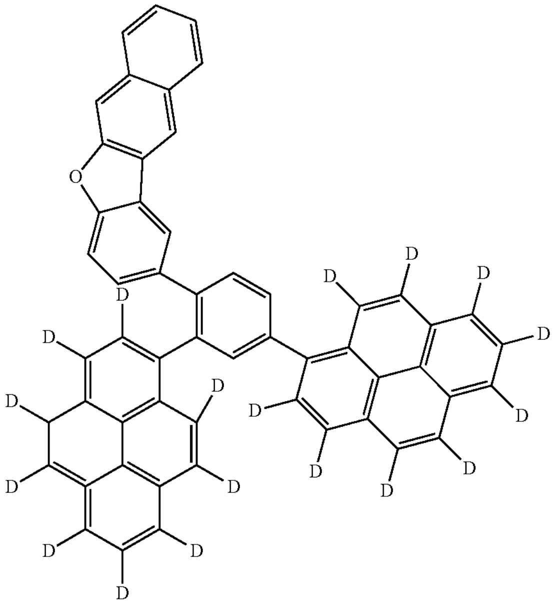

-continued
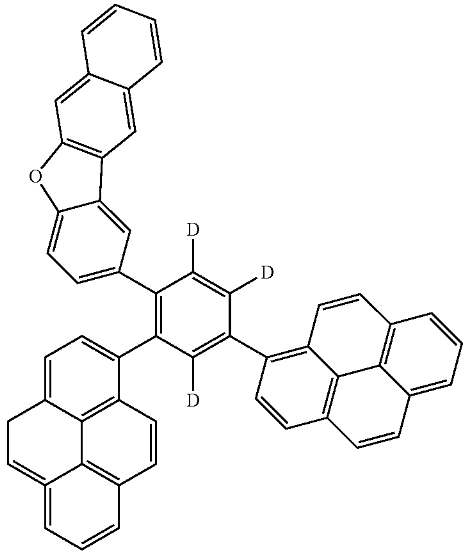
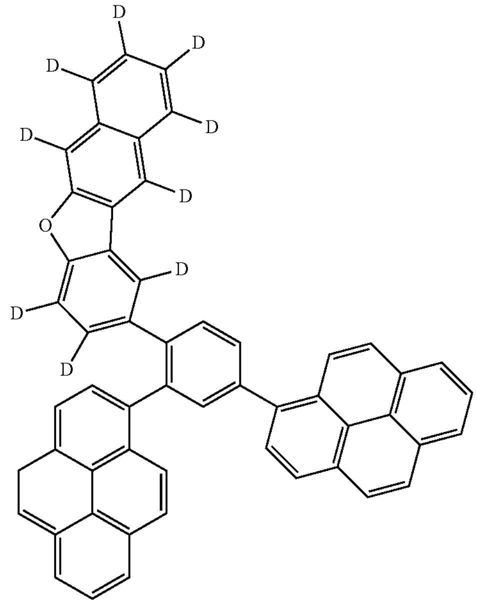
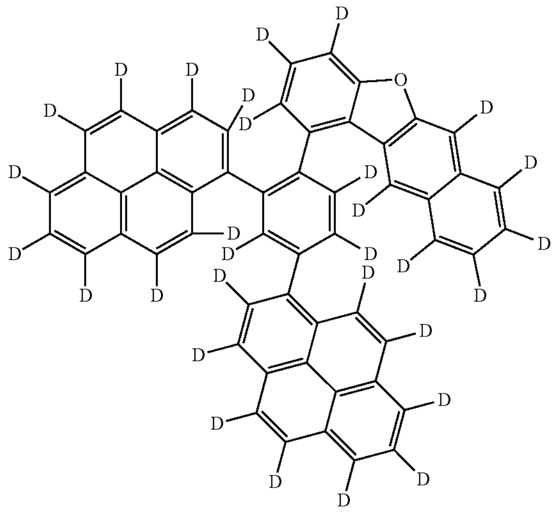
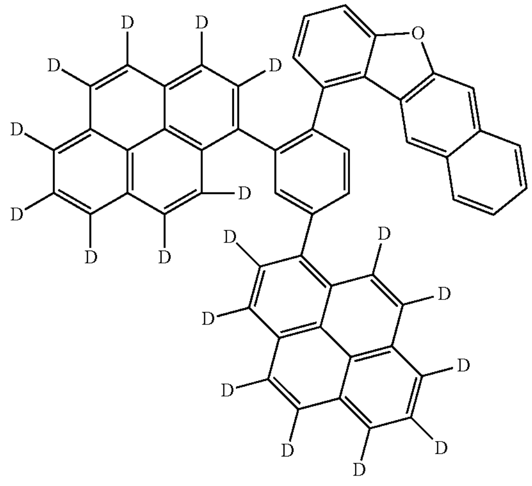
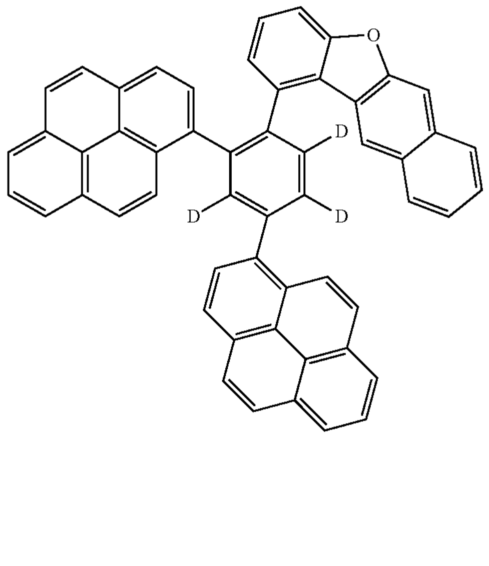
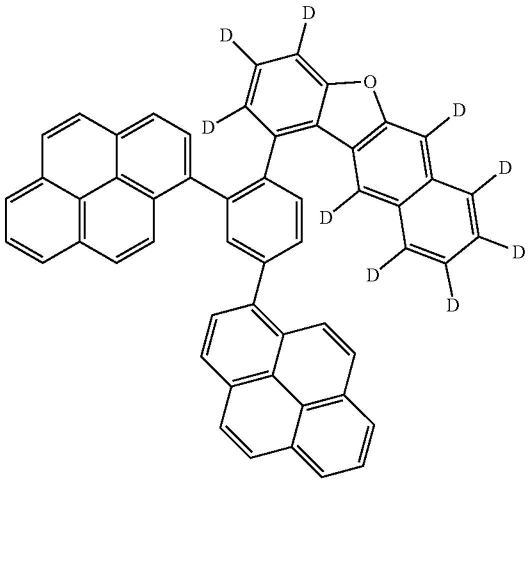

-continued
[Formula 86]
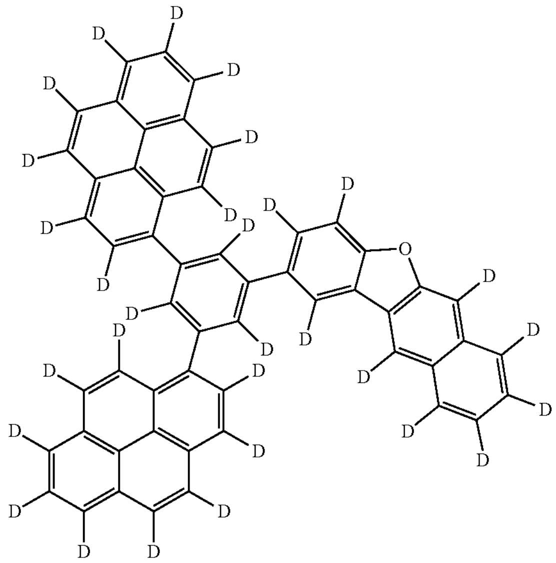
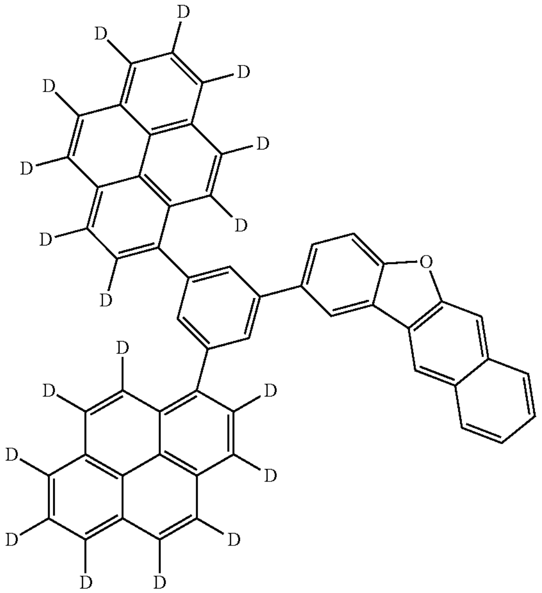
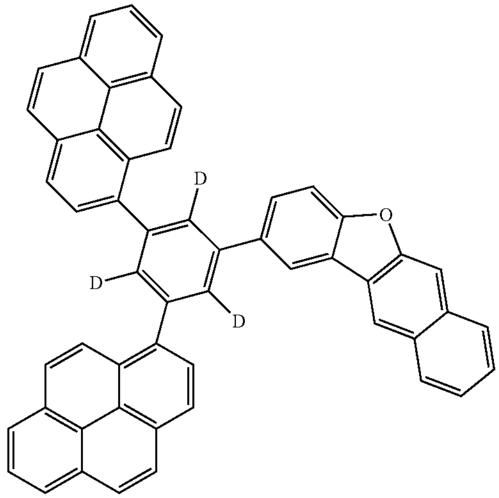
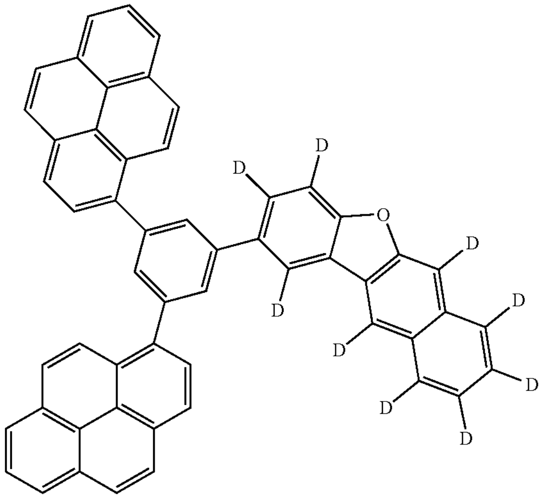
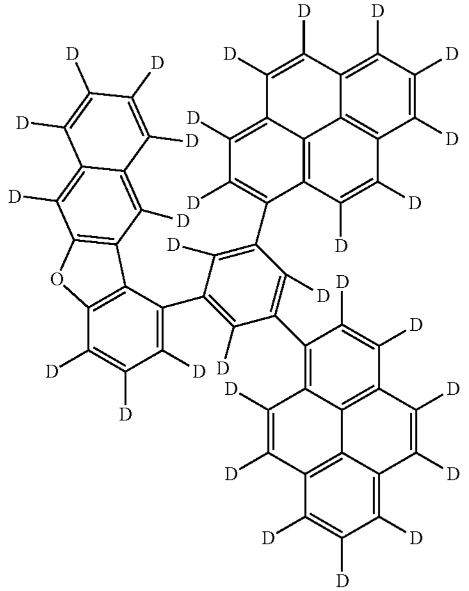
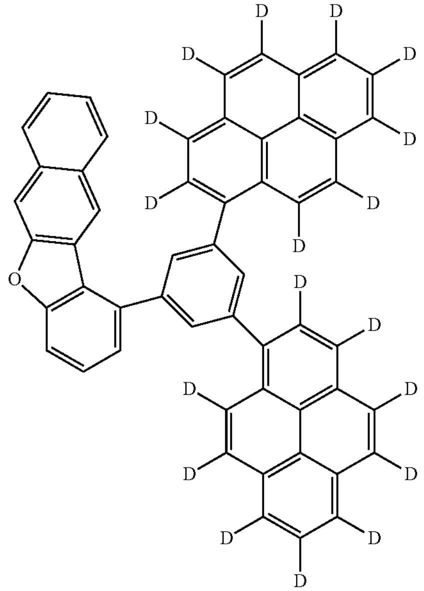

-continued
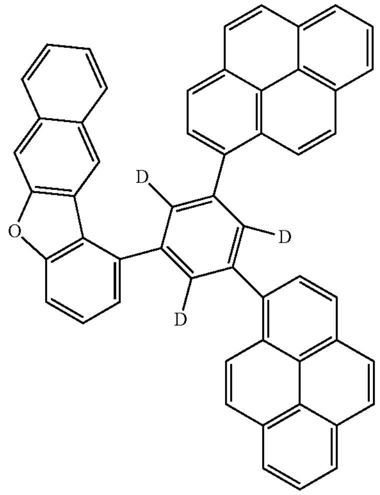
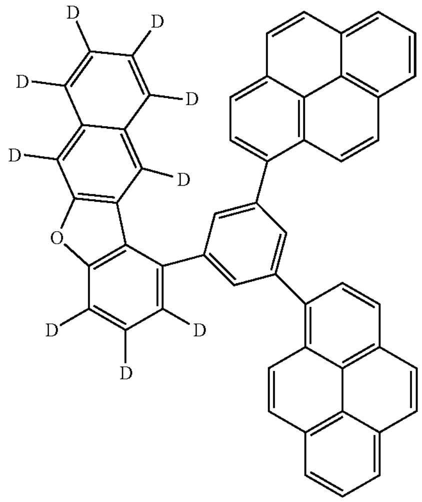
[Formula 87]
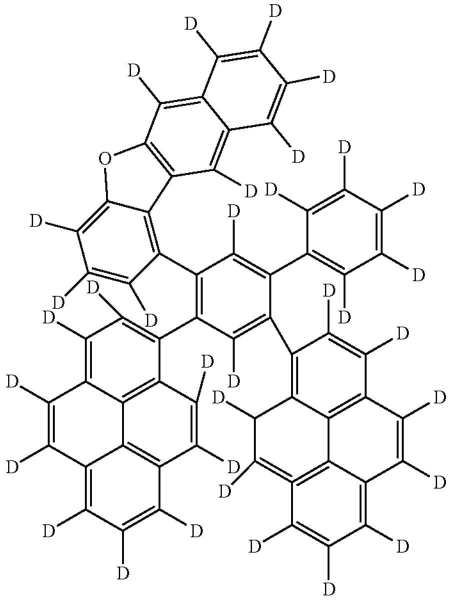
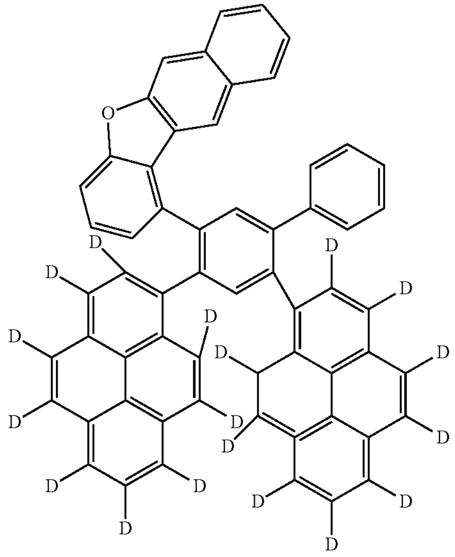
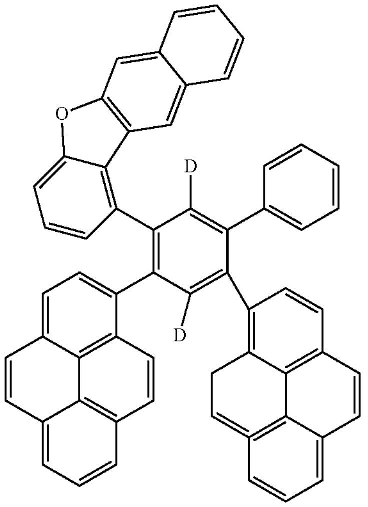
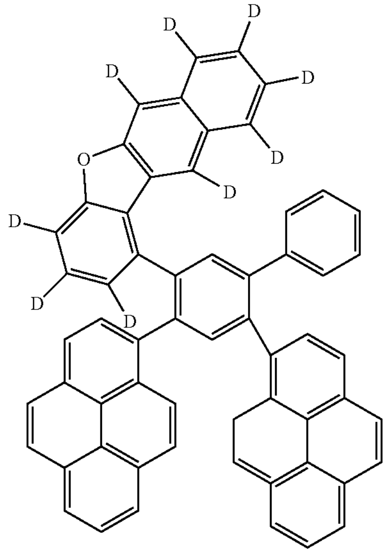

-continued
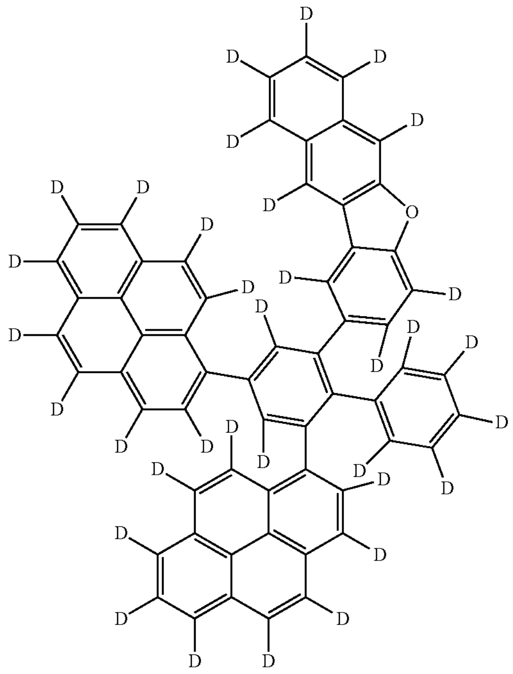
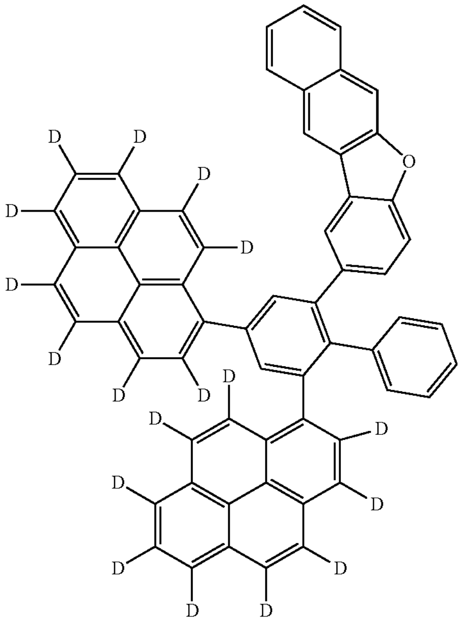
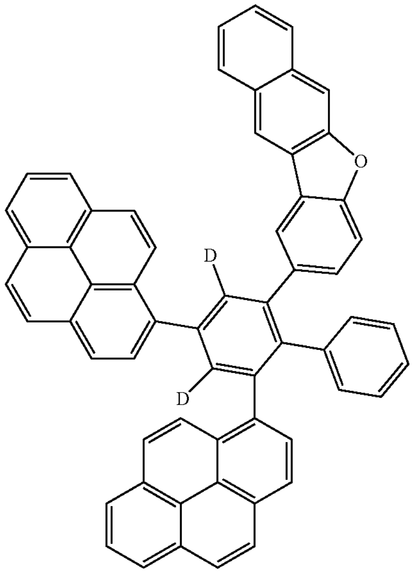
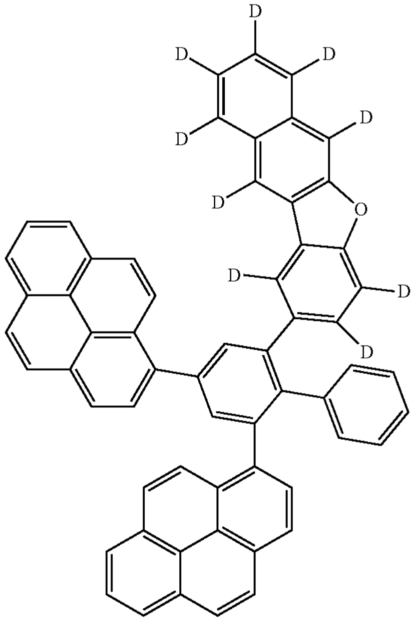

-continued
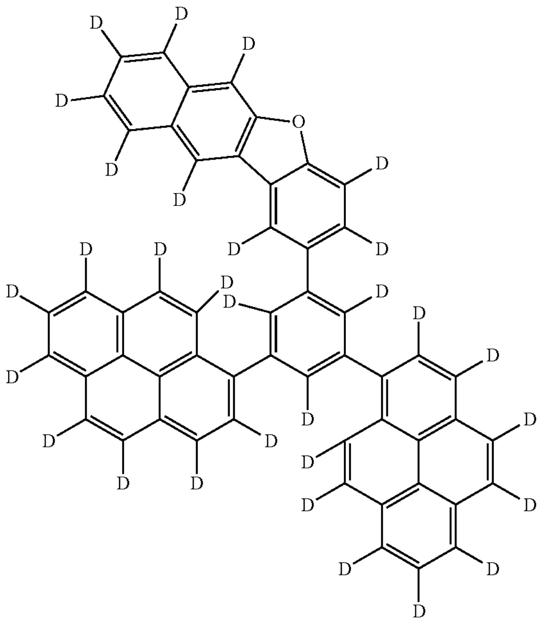
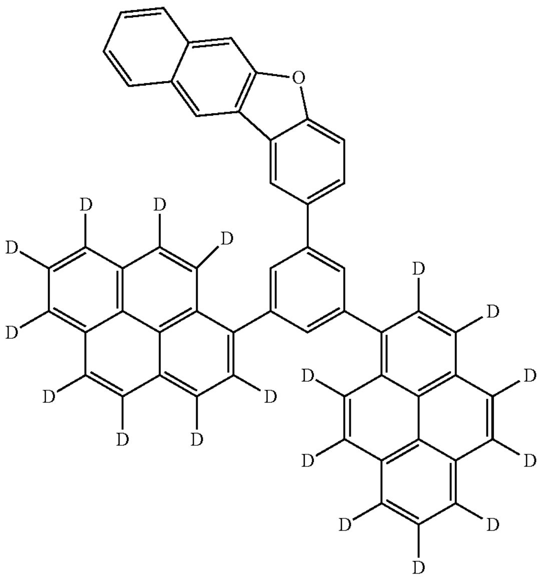
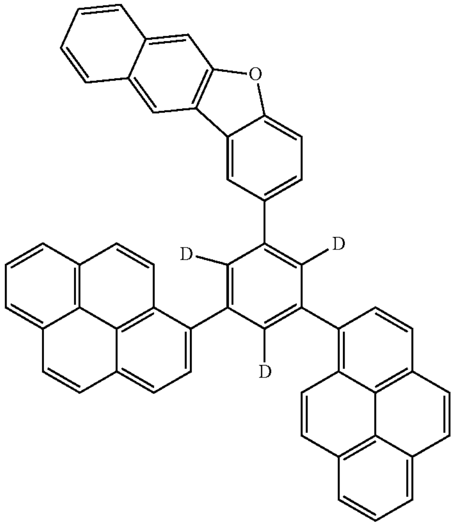
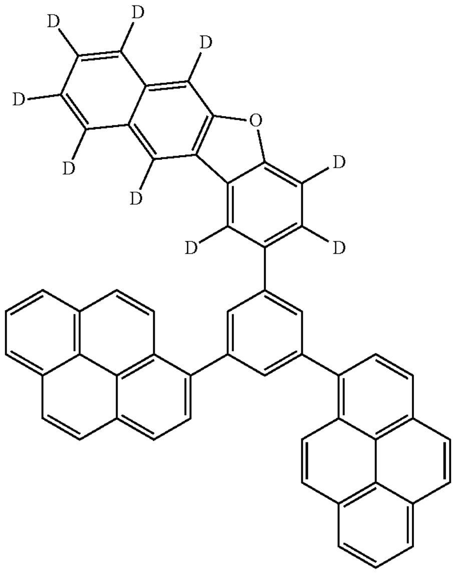

-continued
[Formula 88]
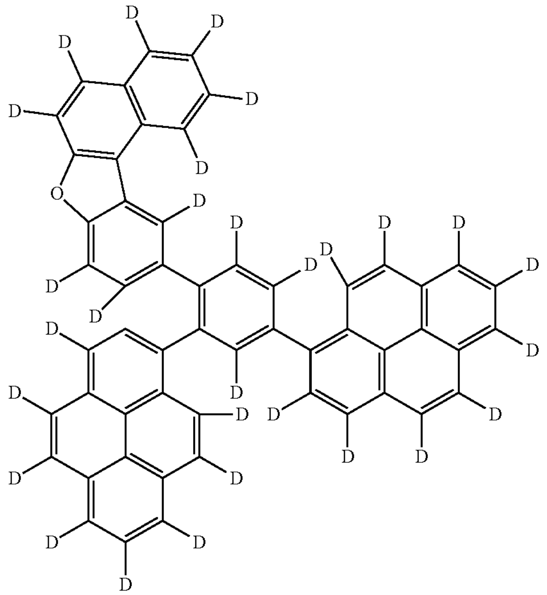
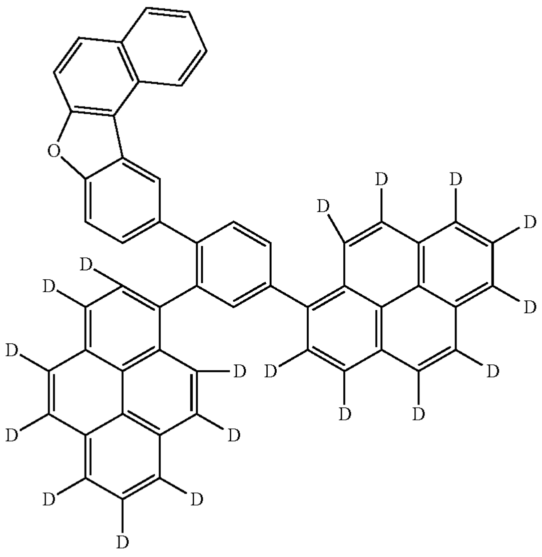
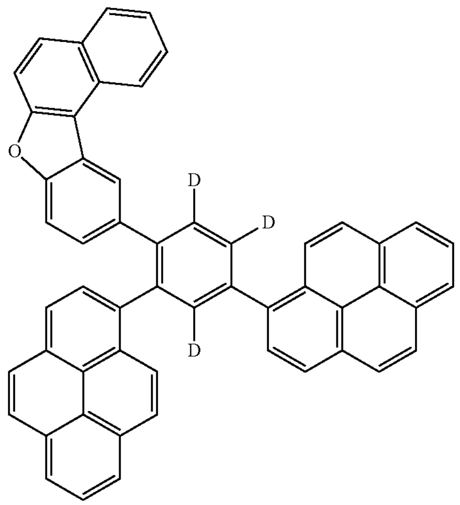
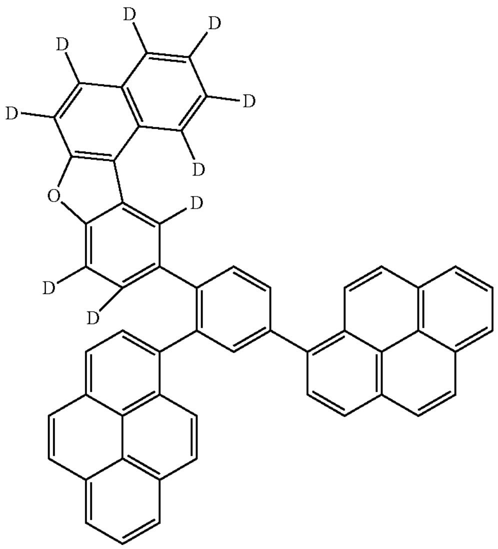

-continued
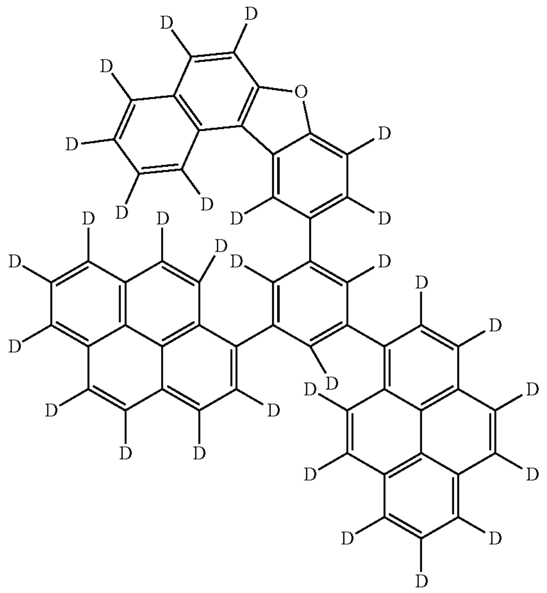
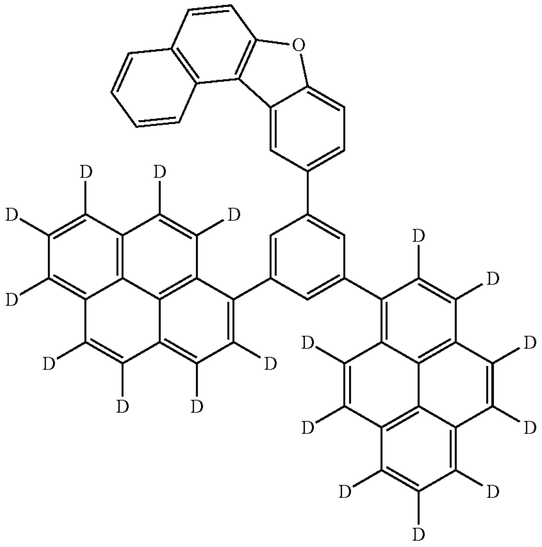
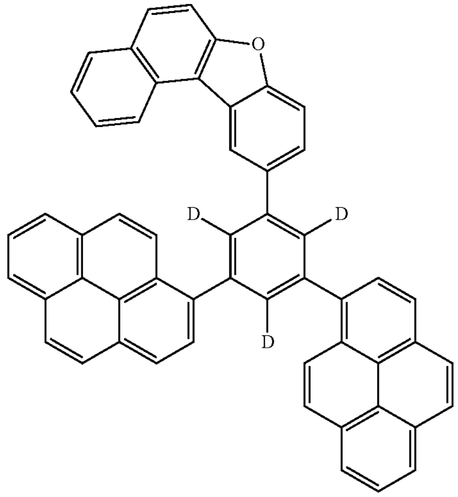
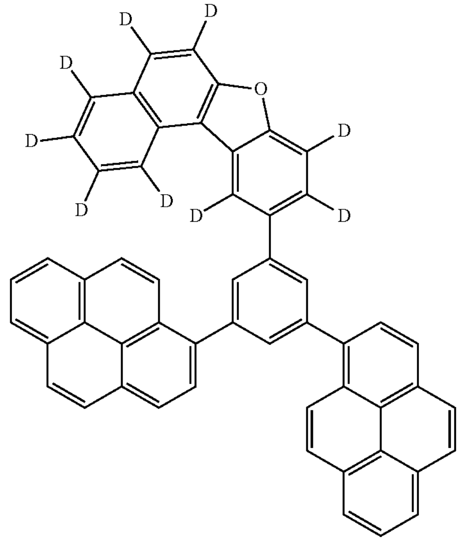

-continued
[Formula 89]
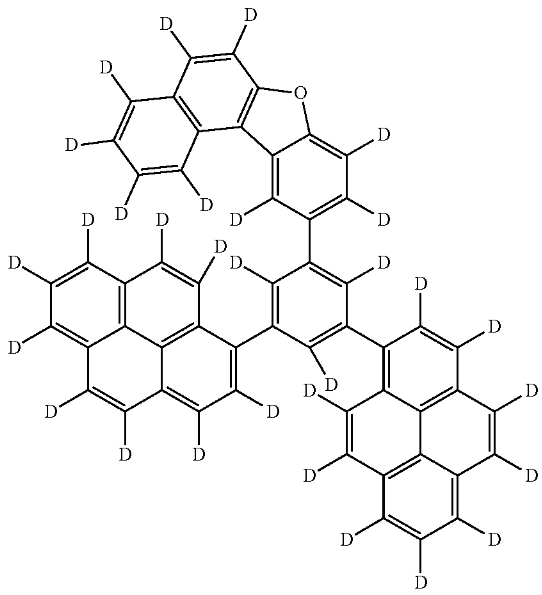
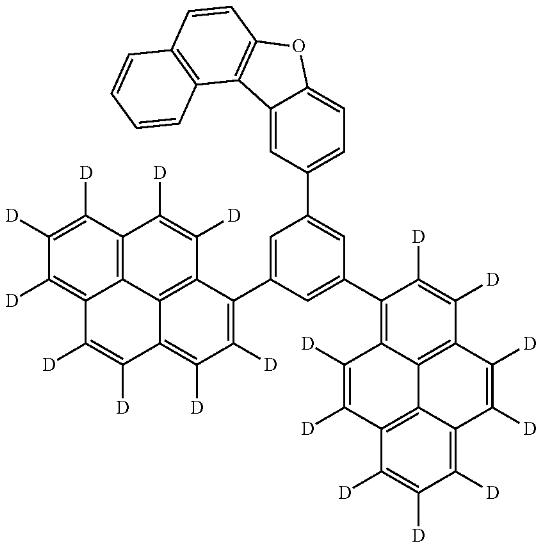
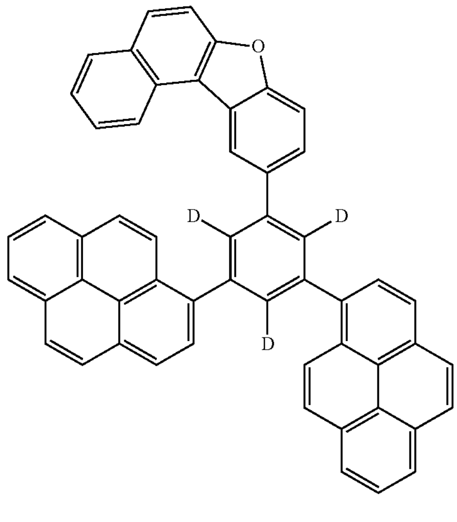
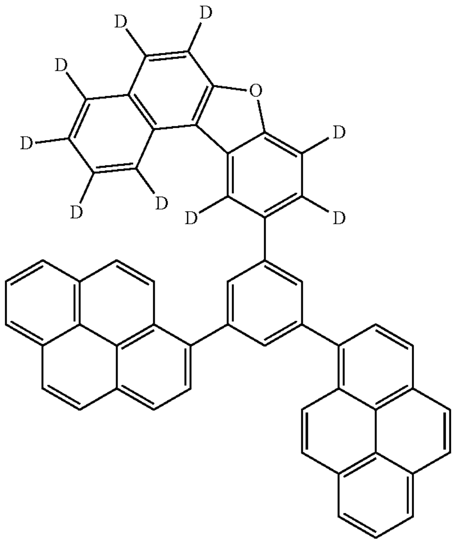

-continued
[Formula 90]
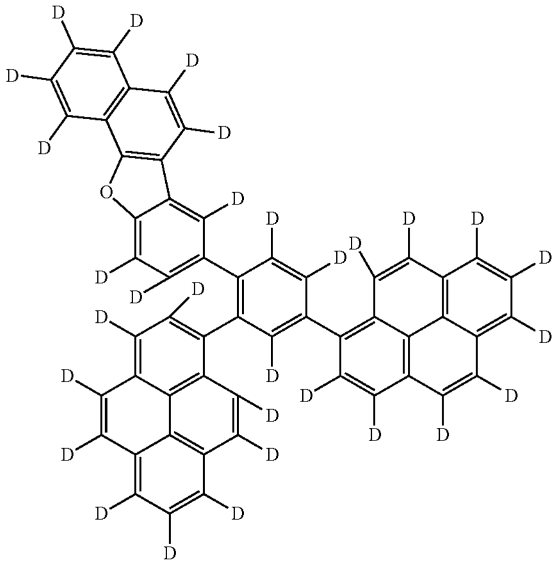
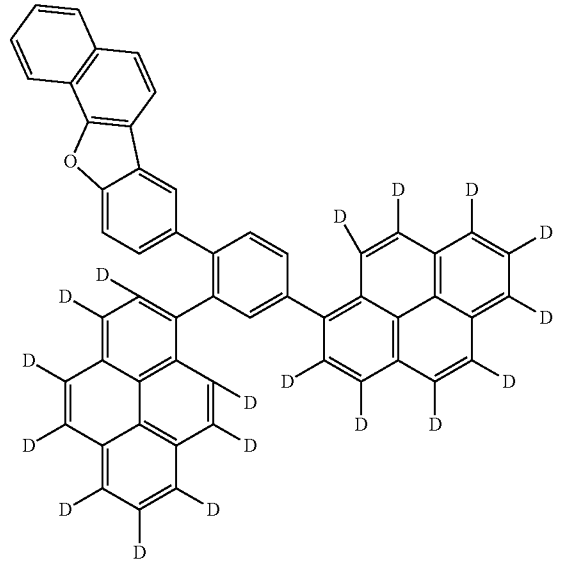
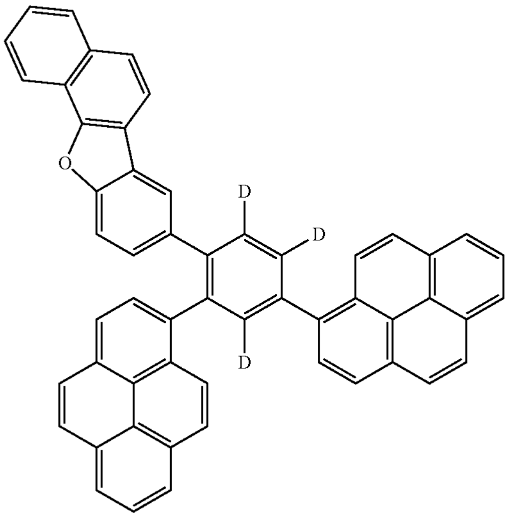
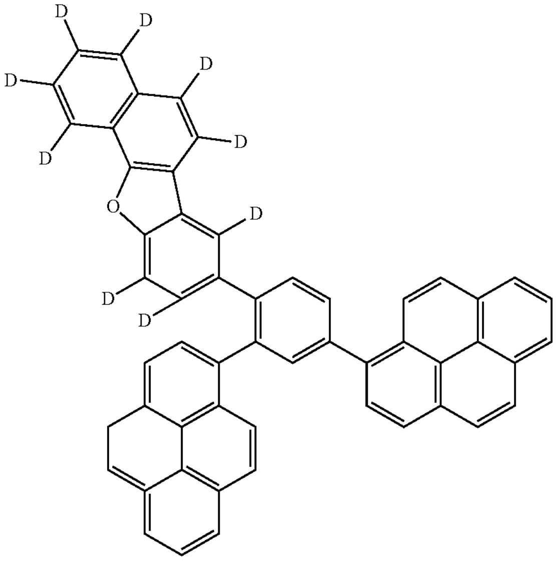

-continued
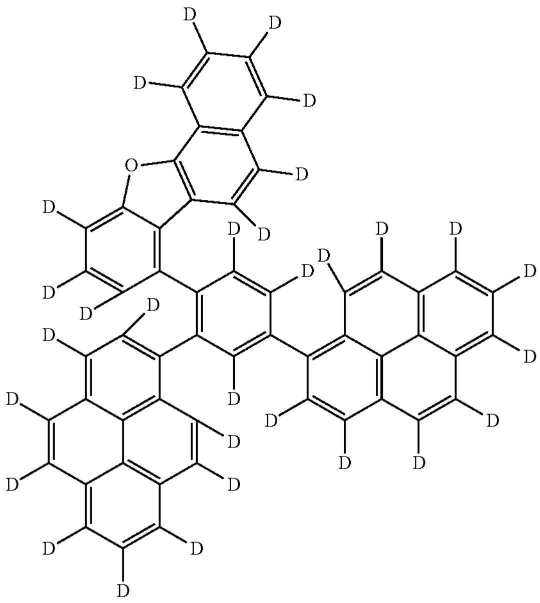
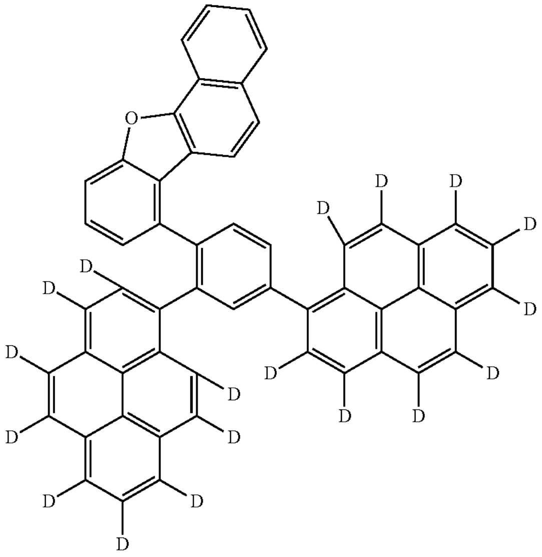
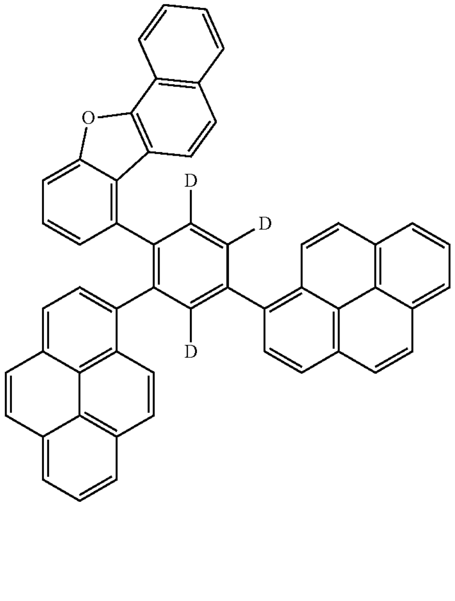
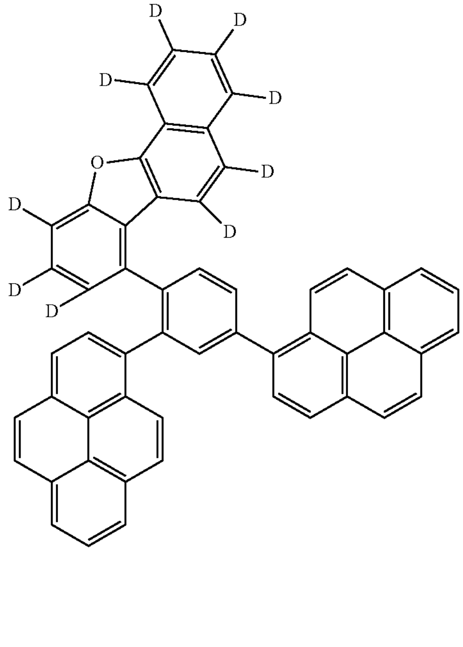

-continued
[Formula 91]
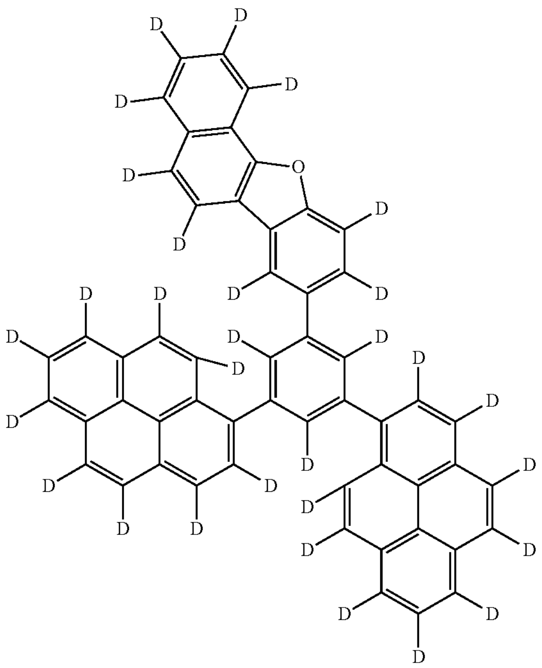
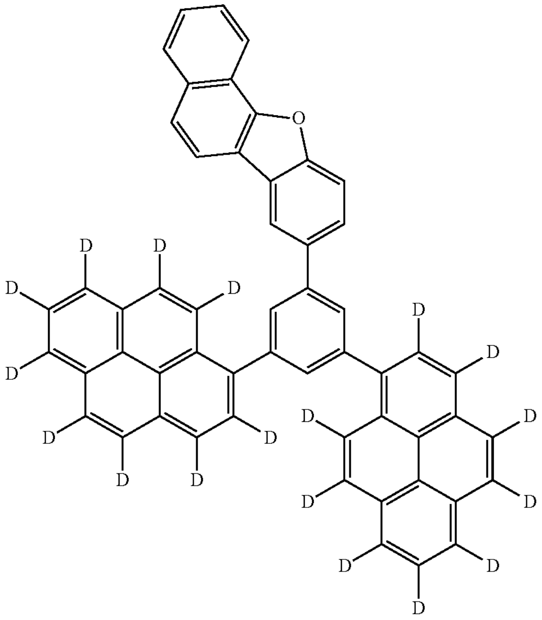
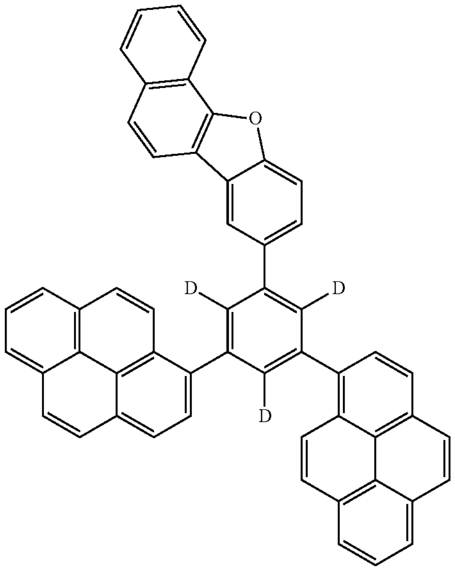
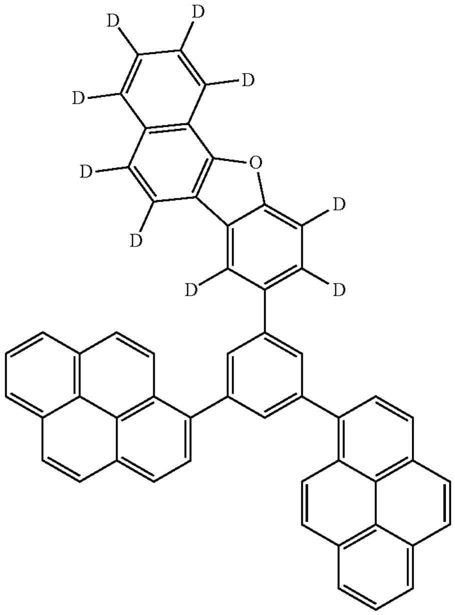

-continued
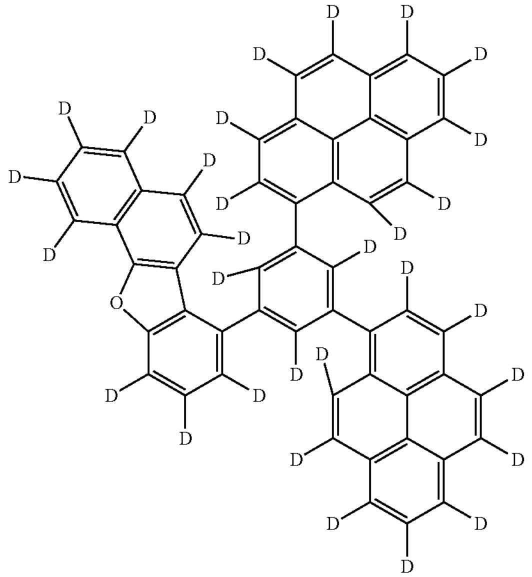
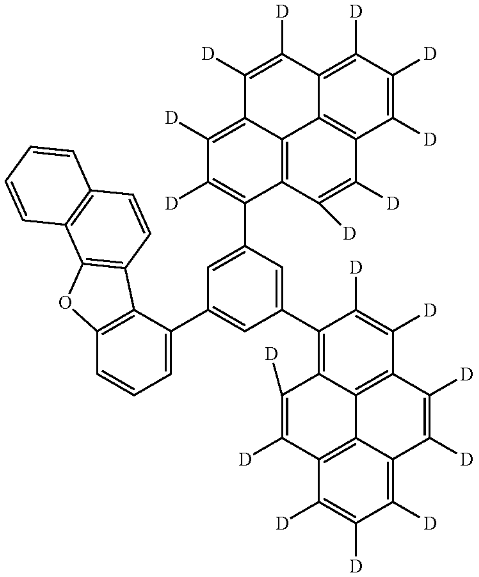
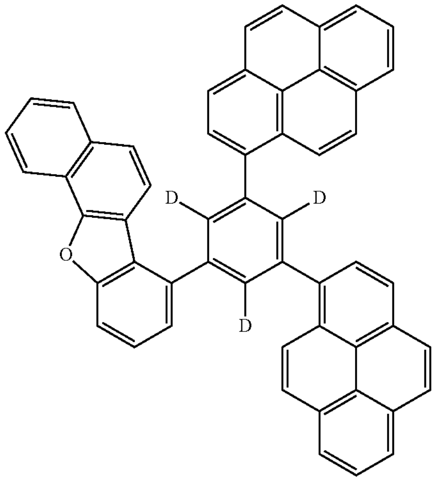
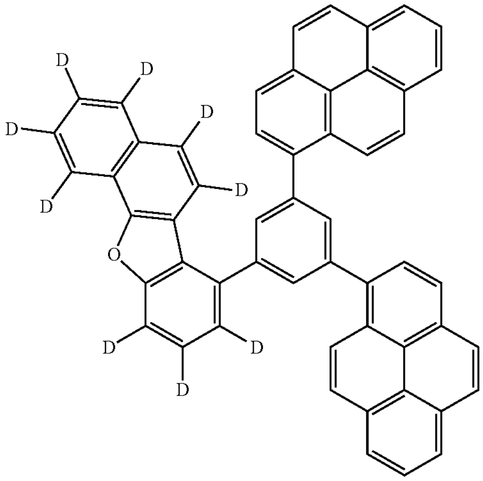
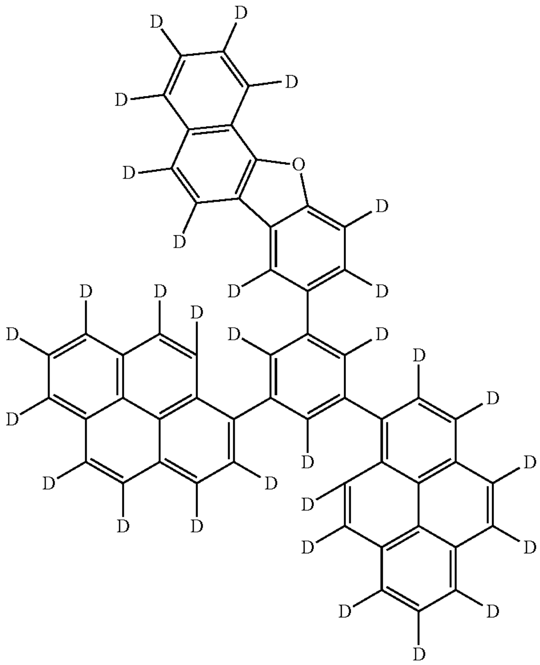
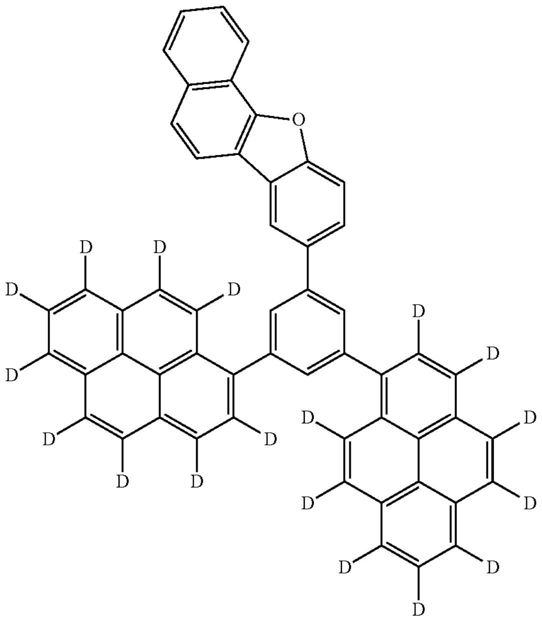

-continued
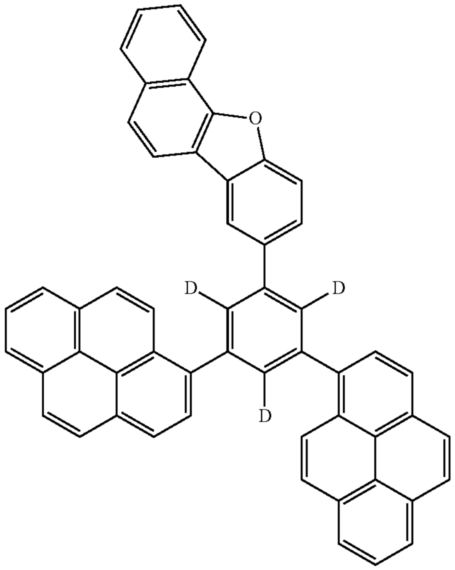
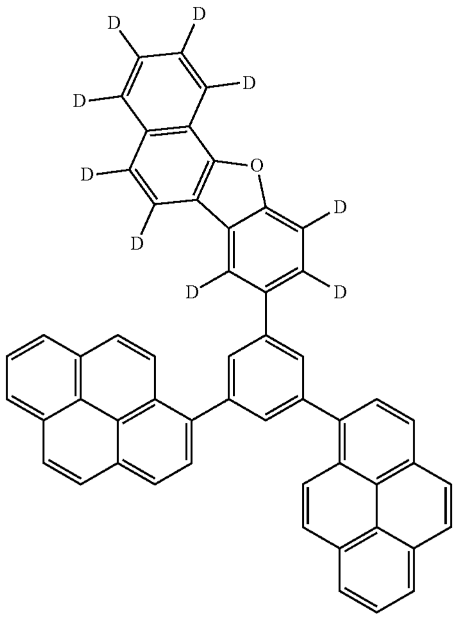
[Formula 92]
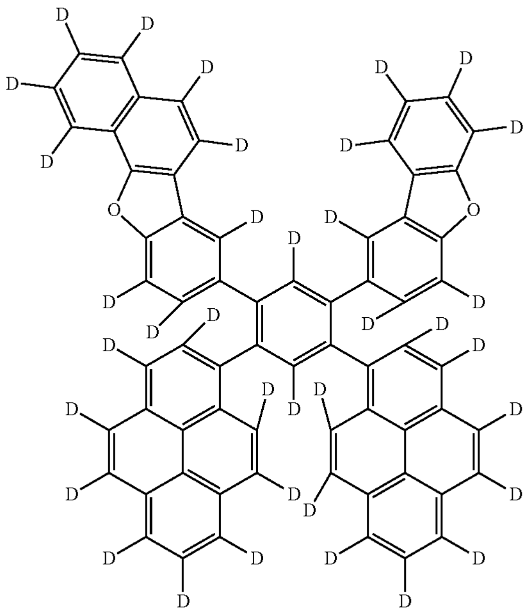
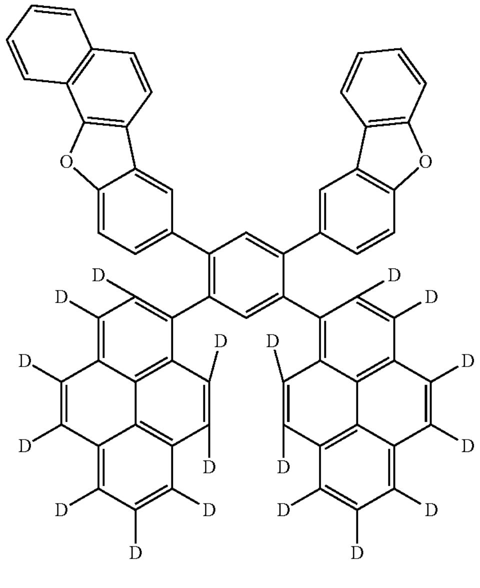

-continued
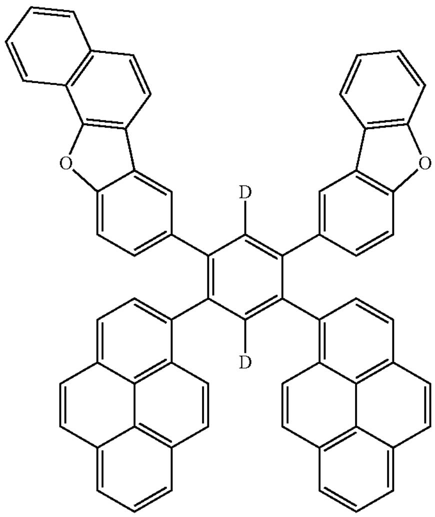
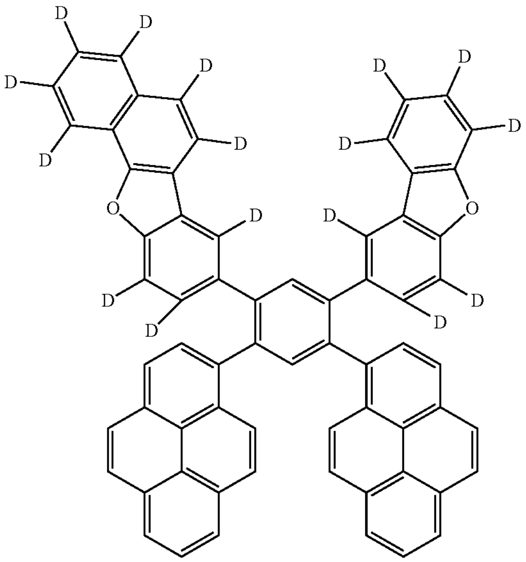
[Formula 93]
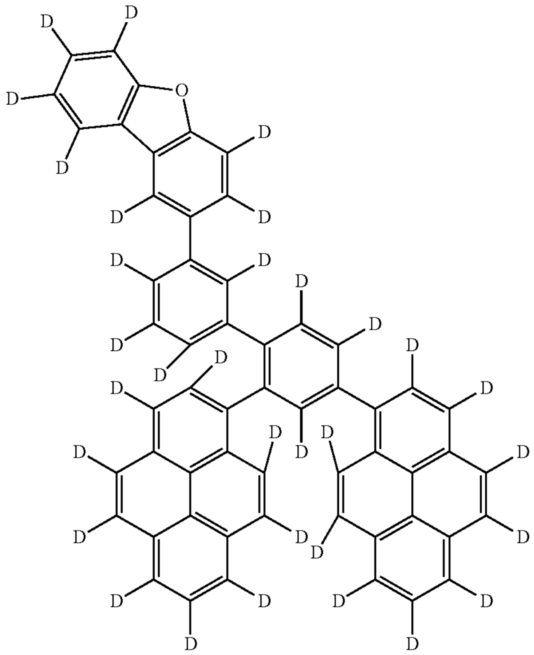
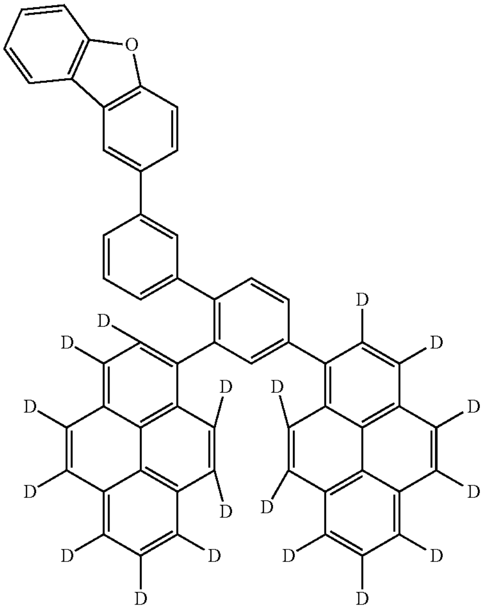

-continued
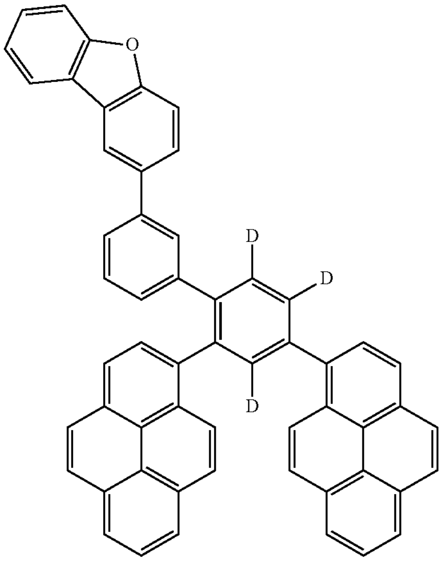
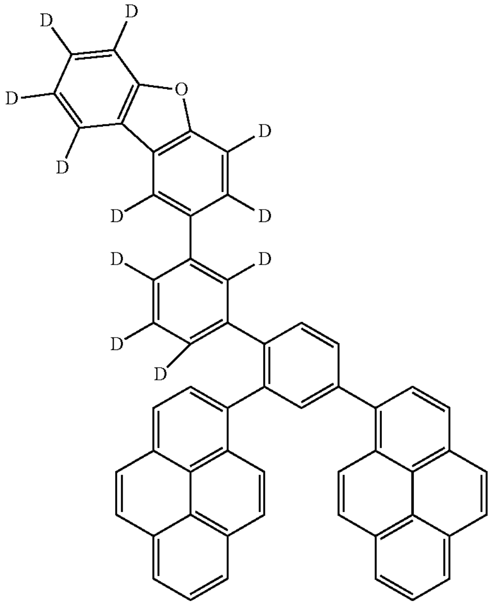
[Formula 94]
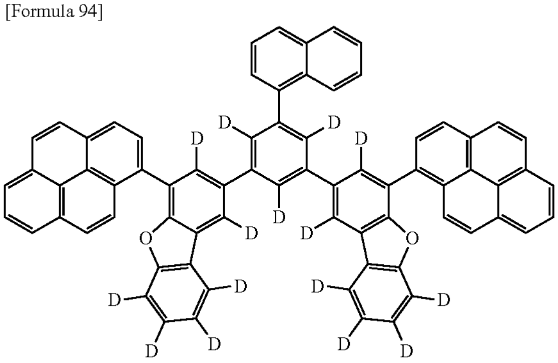
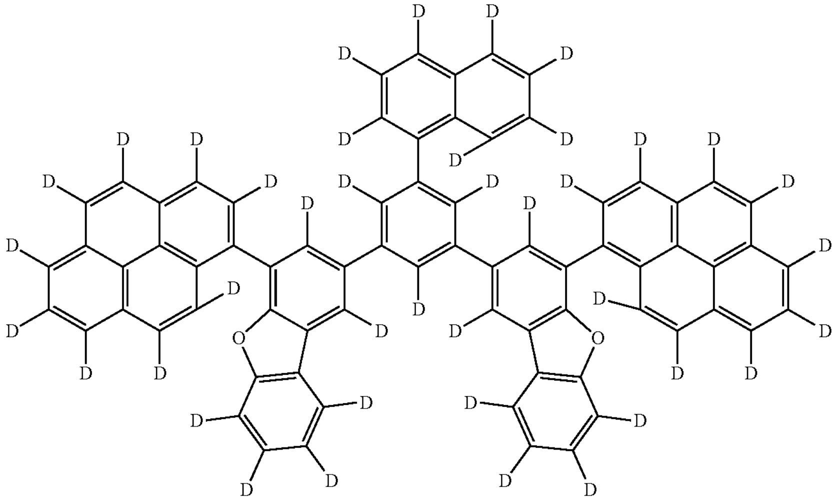

-continued
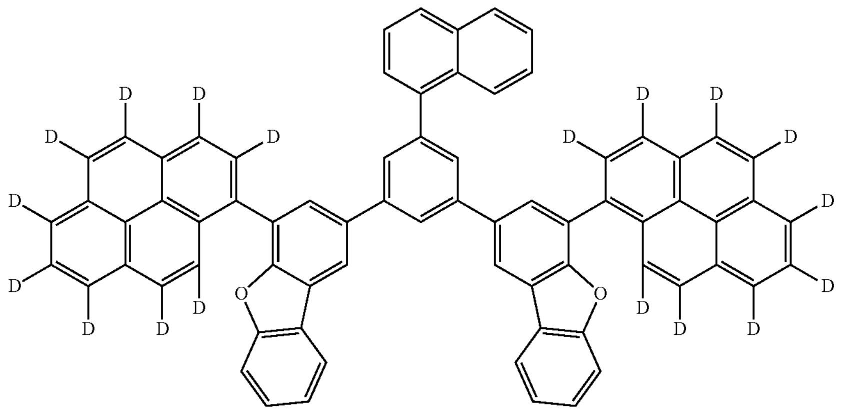
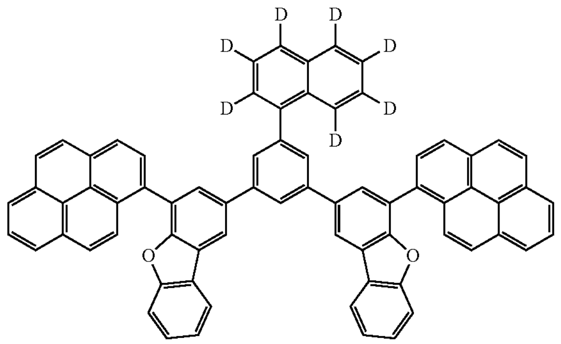
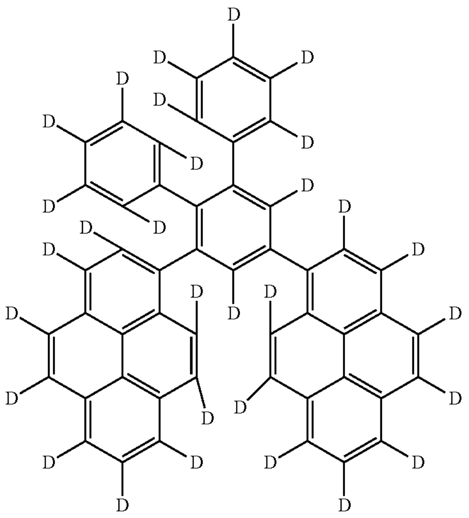
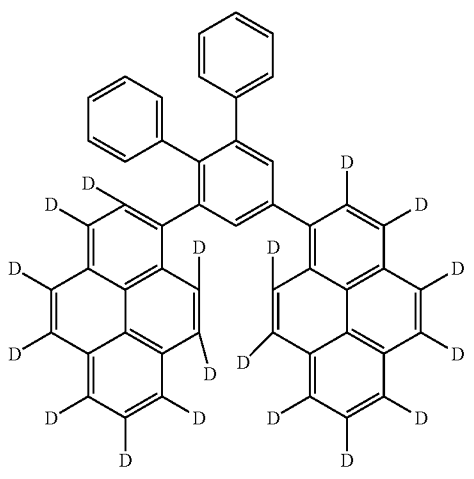
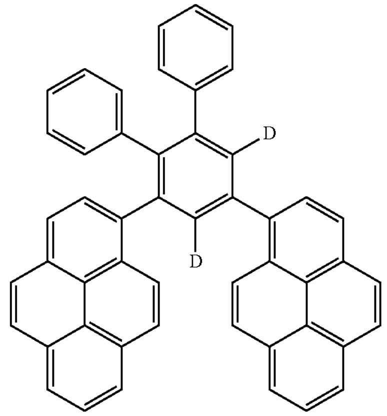

-continued
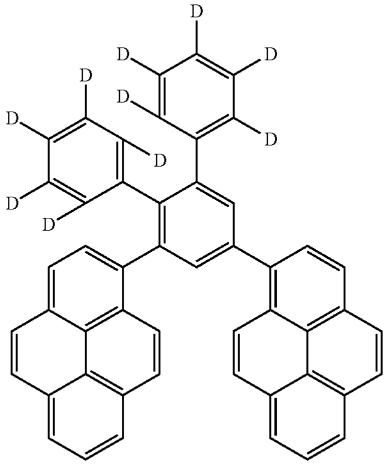
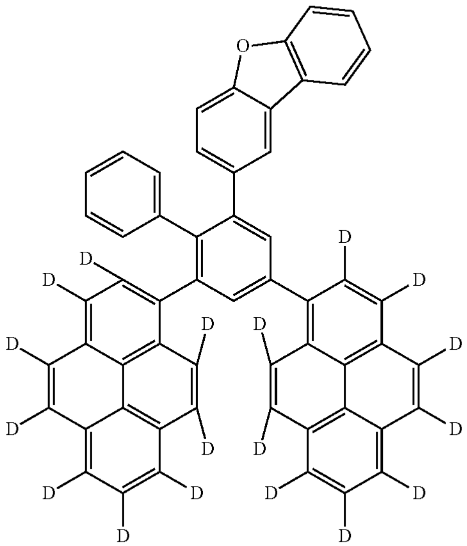
[Formula 95]
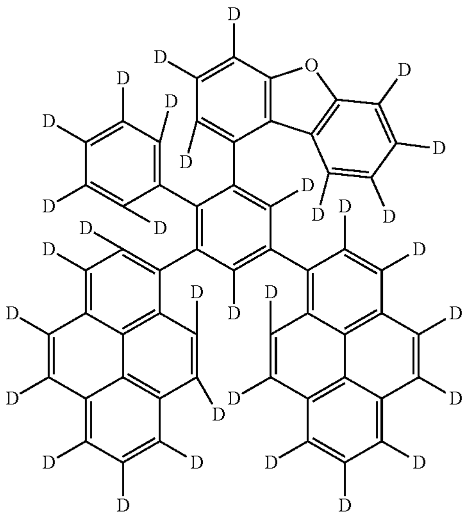
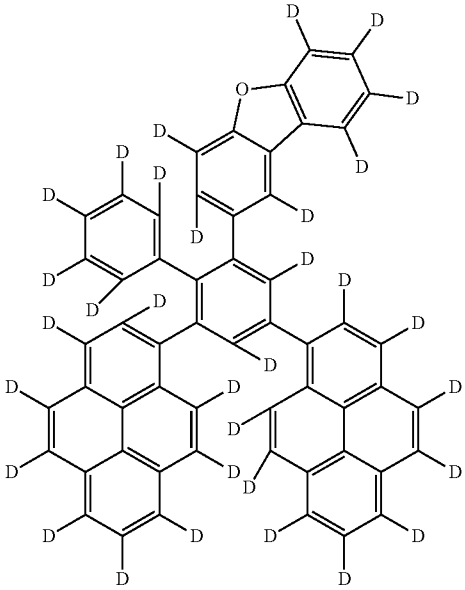
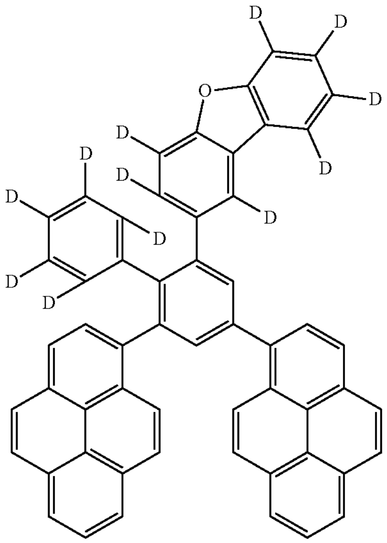
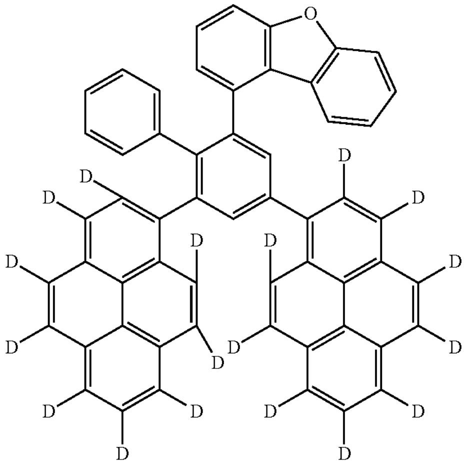

-continued
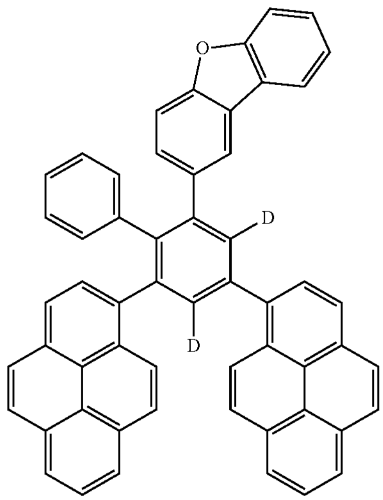
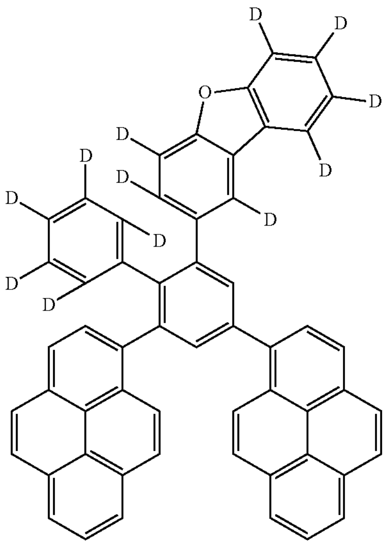
[Formula 96]
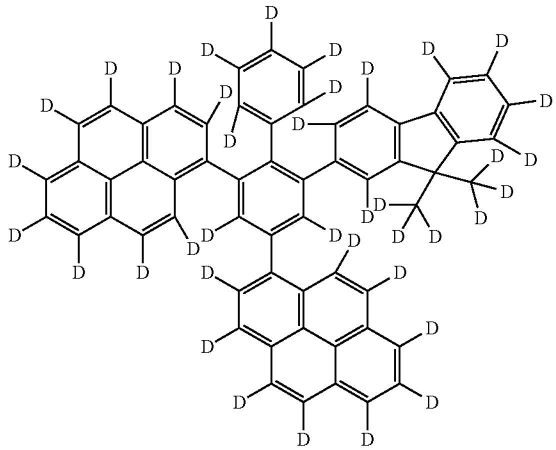
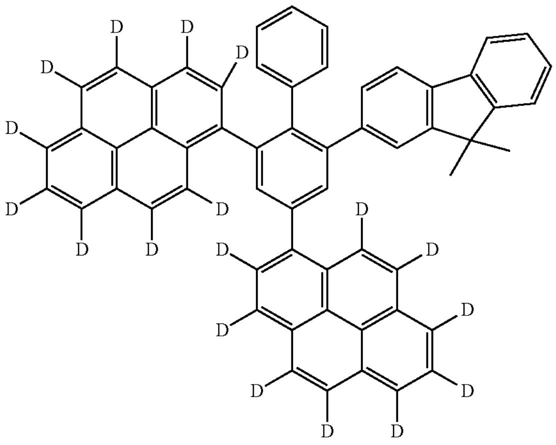
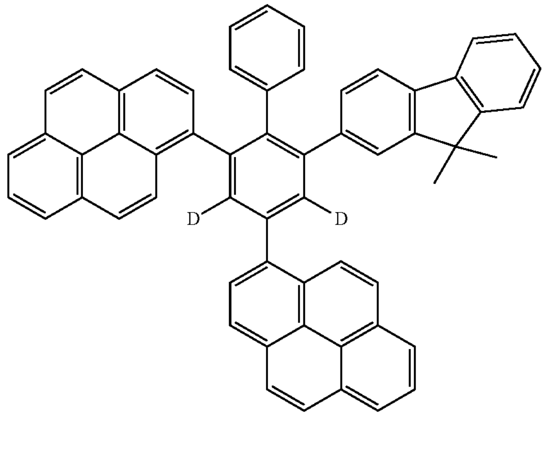
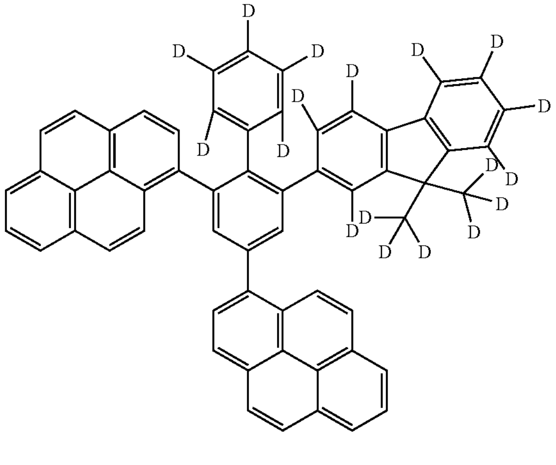

-continued
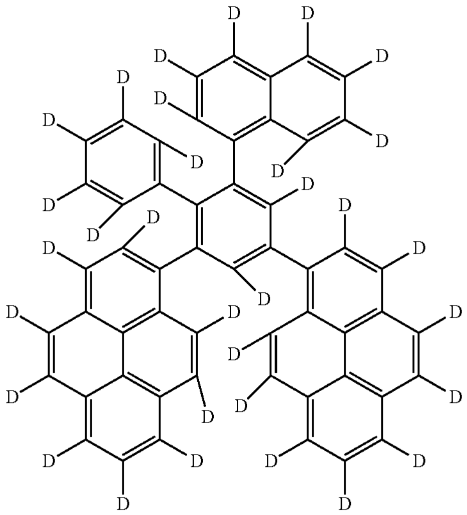
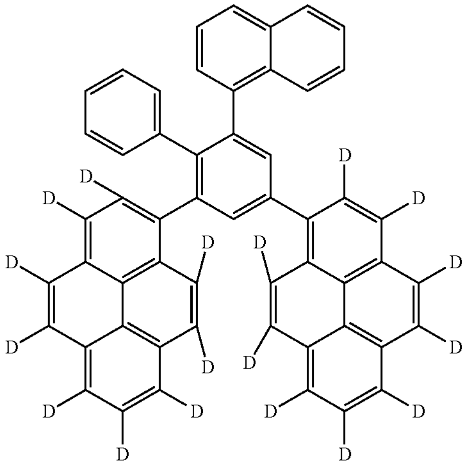
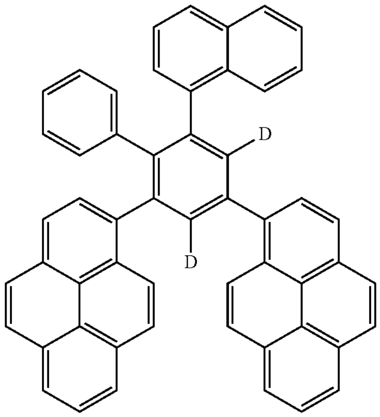
[Formula 97]
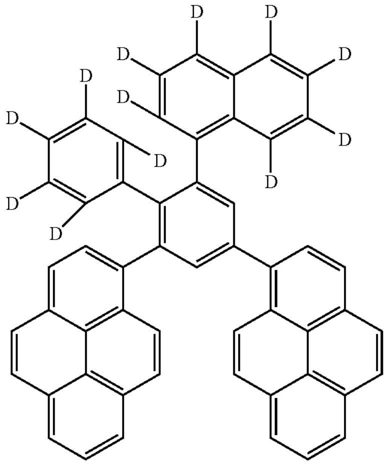

-continued
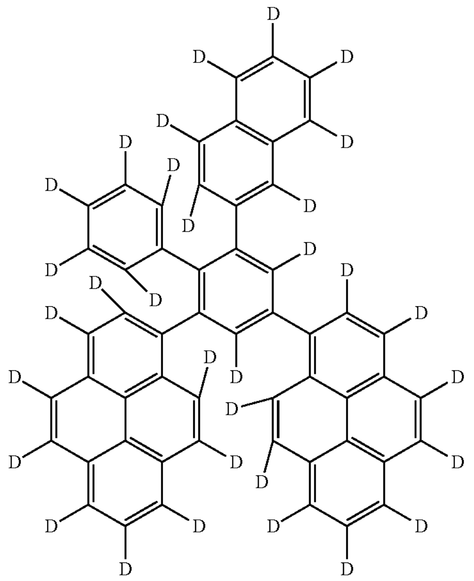
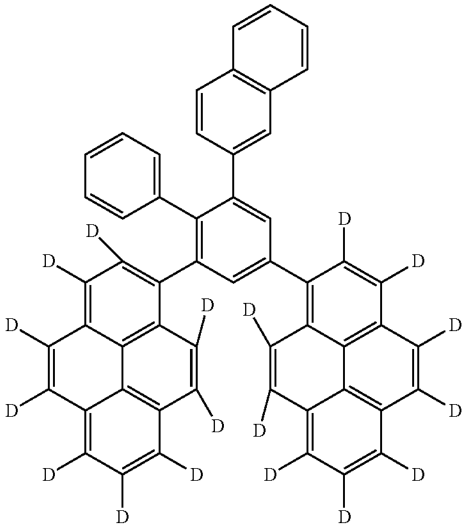
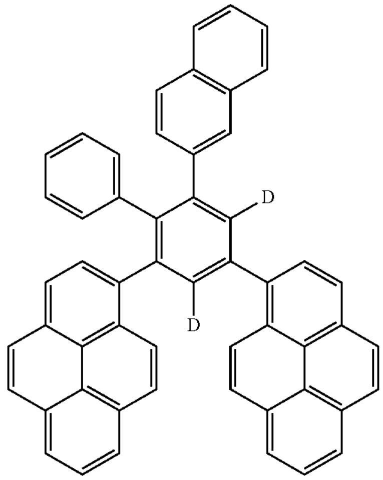
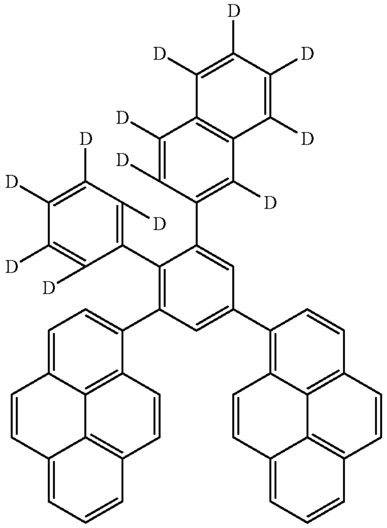
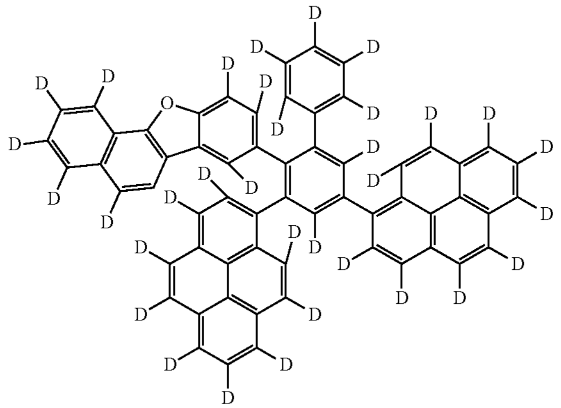
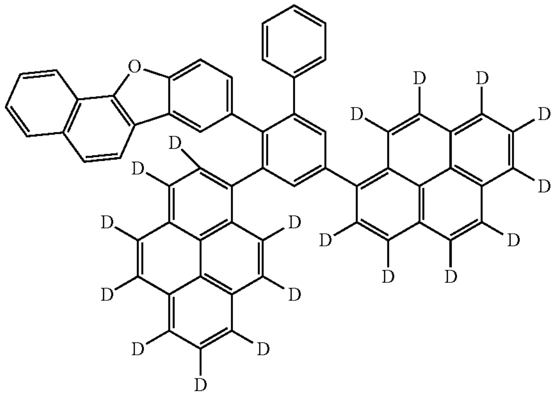

-continued
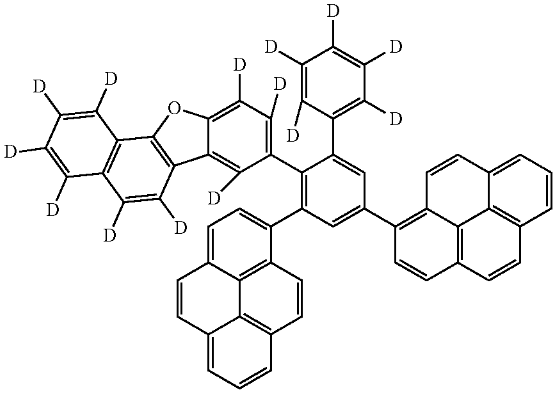 [SMILES: [2H]c1c([2H])c([2H])c(-c2cc(-c3ccc4ccc5cccc6ccc3c4c56)cc(-c3ccc4ccc5cccc6ccc3c4c56)c2-c2c([2H])c([2H])c3oc4c5c([2H])c([2H])c([2H])c([2H])c5c([2H])c([2H])c4c3c2[2H])c([2H])c1[2H]]
[Formula 98]
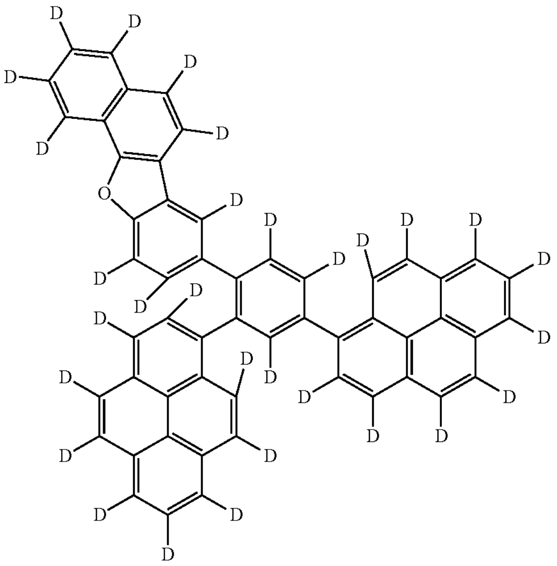
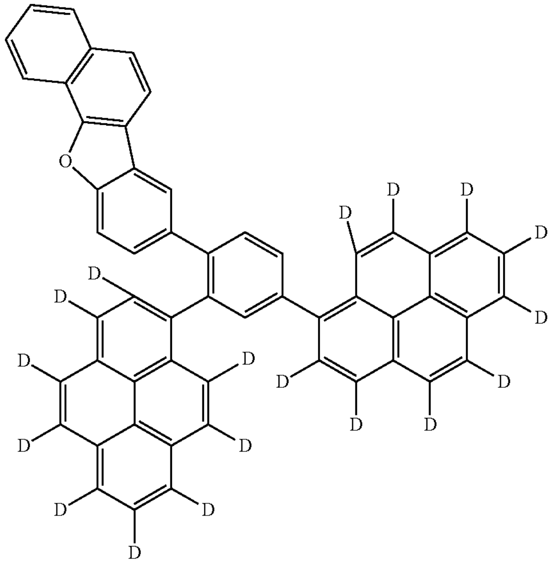
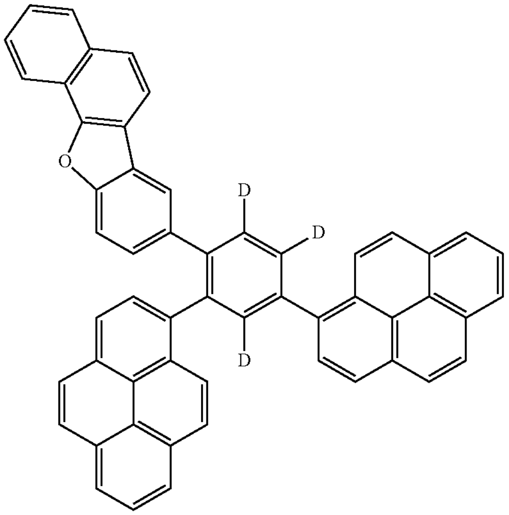
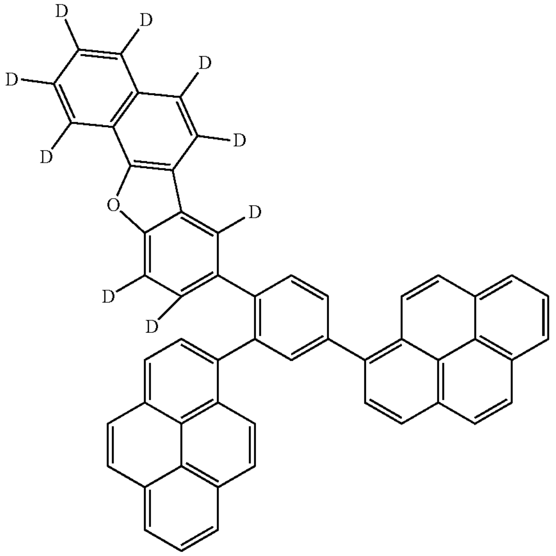

-continued
[Formula 99]
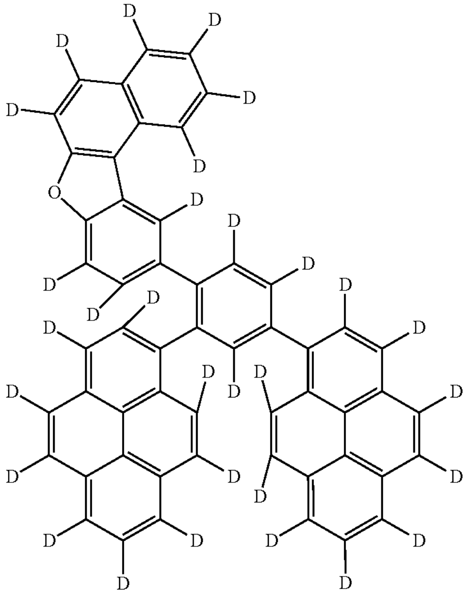
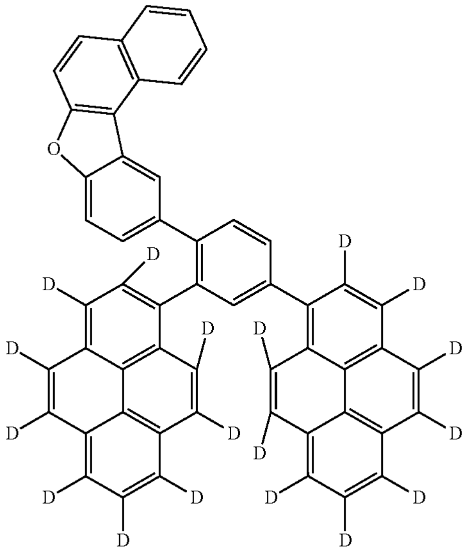
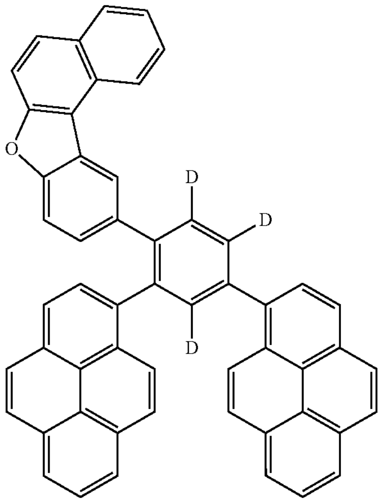

-continued
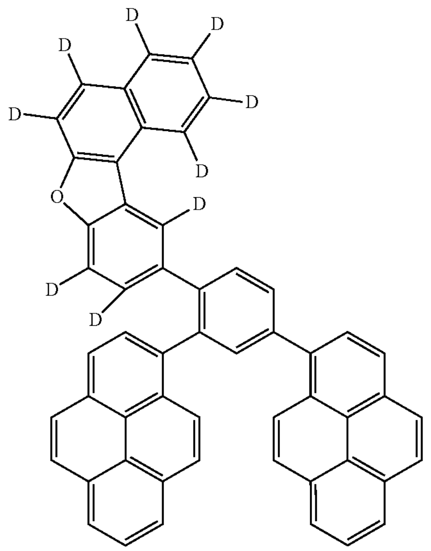
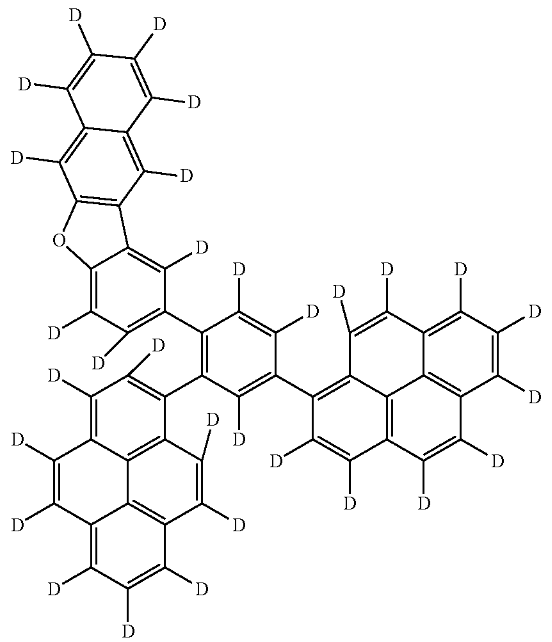
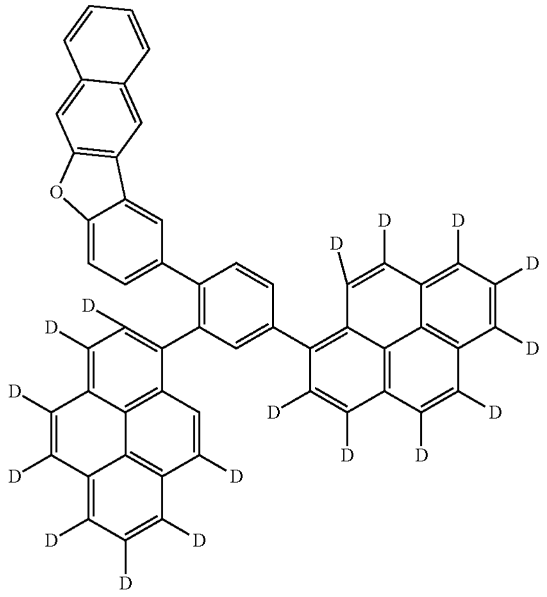
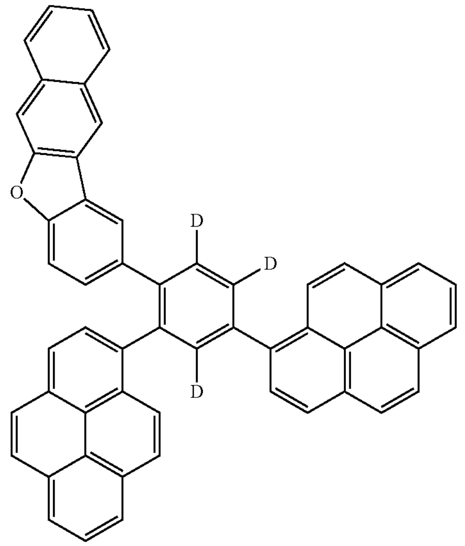

-continued
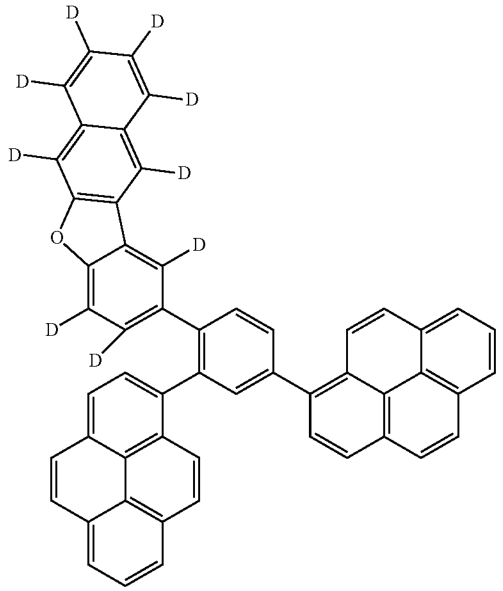 [SMILES: [2H]c1c(-c2ccc(-c3ccc4ccc5cccc6ccc3c4c56)cc2-c2ccc3ccc4cccc5ccc2c3c45)c([2H])c2c(oc3c([2H])c4c([2H])c([2H])c([2H])c([2H])c4c([2H])c32)c1[2H]]
[Formula 100]
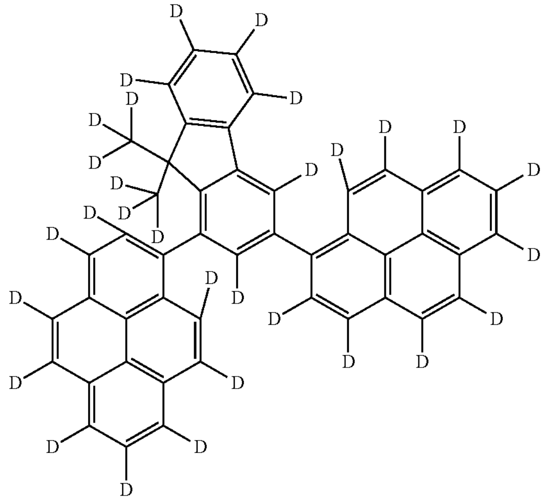
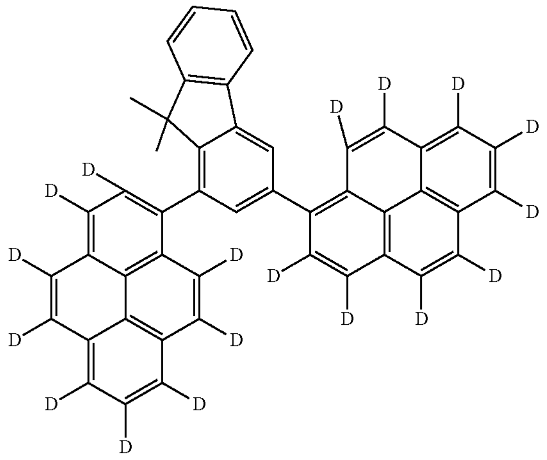
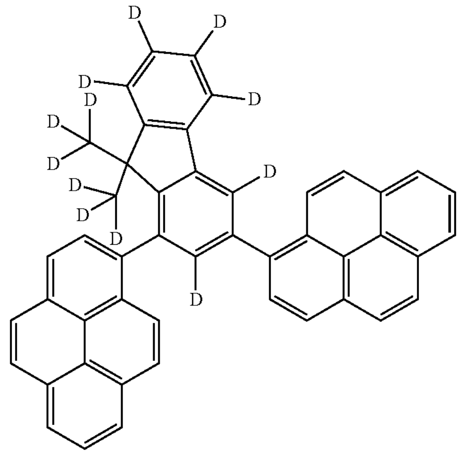

-continued
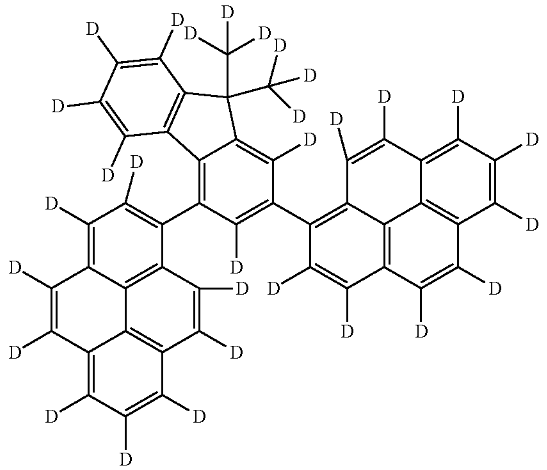
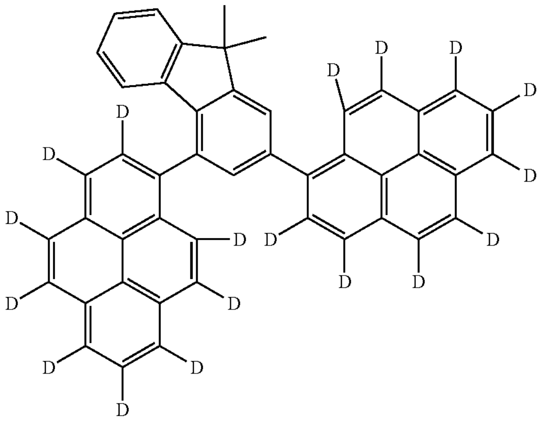
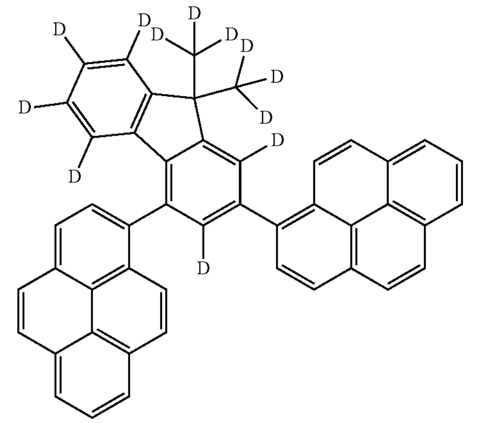
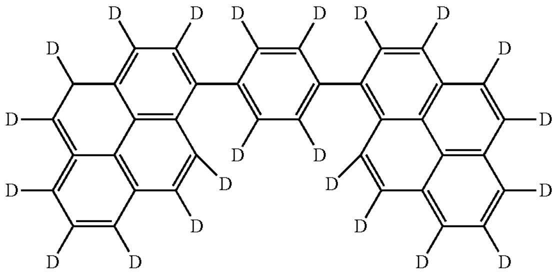
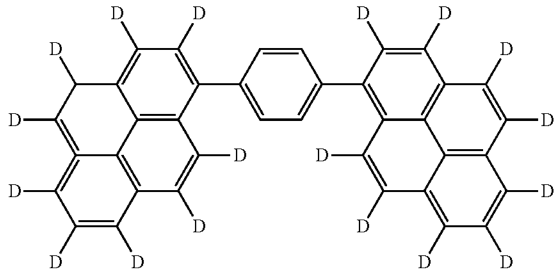
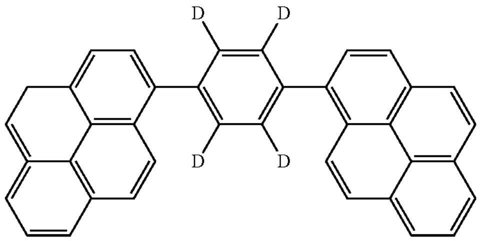

-continued
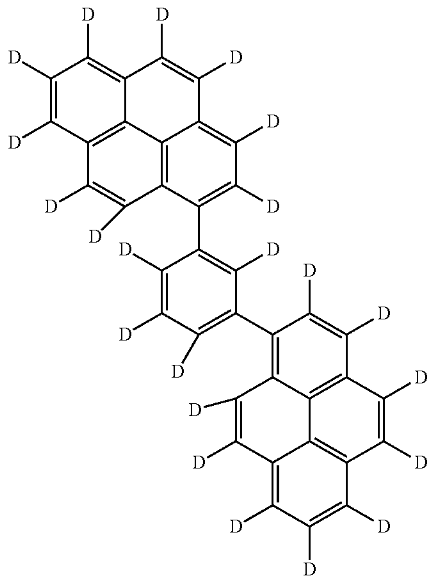
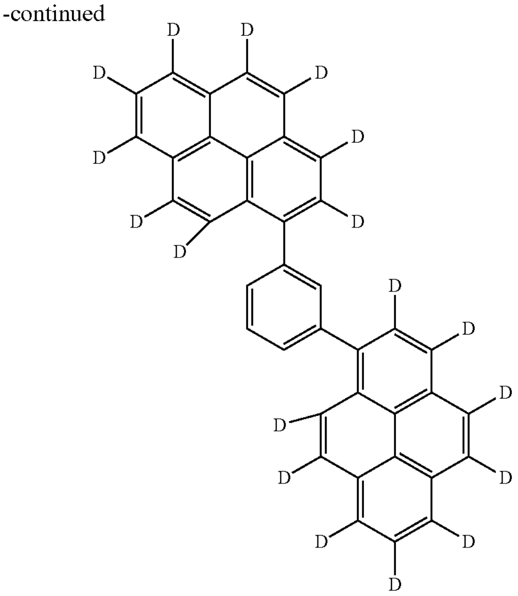
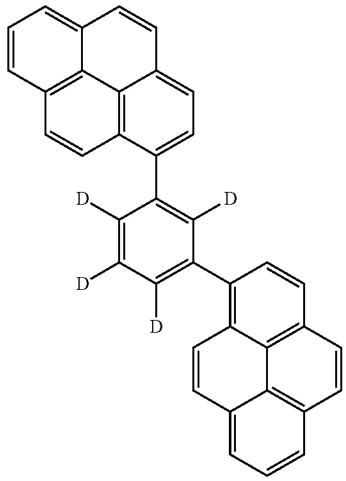

[Formula 101]
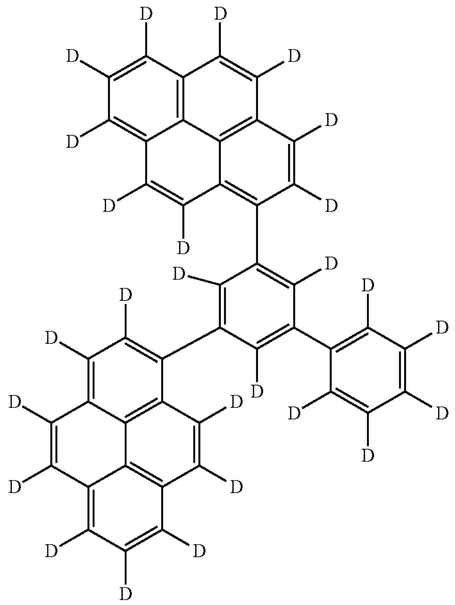
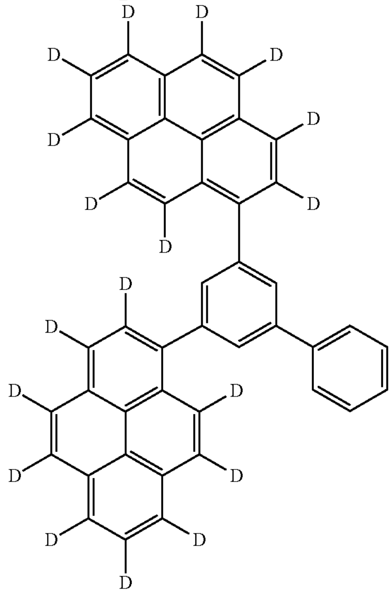
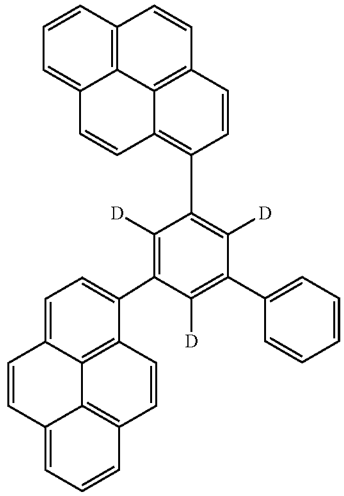
-continued
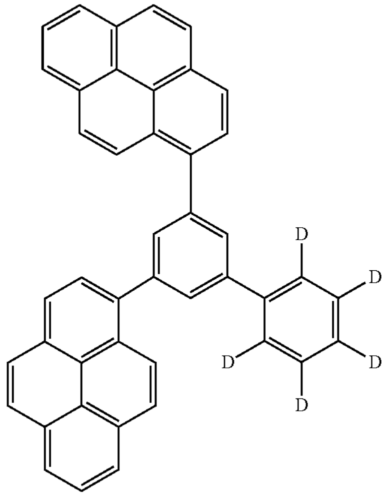
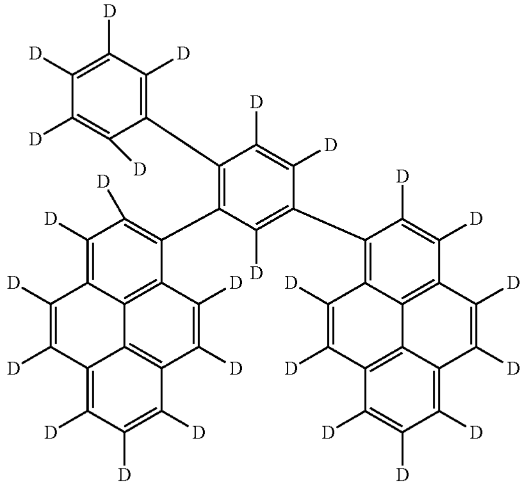
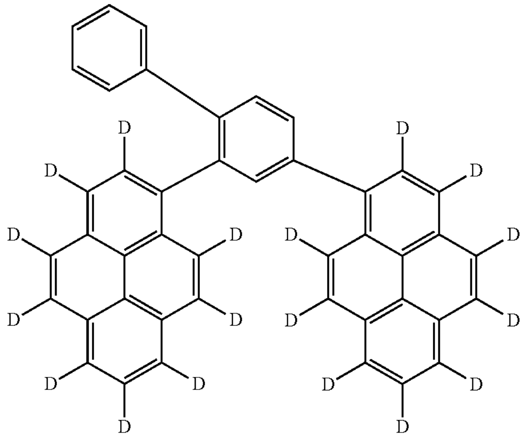

-continued
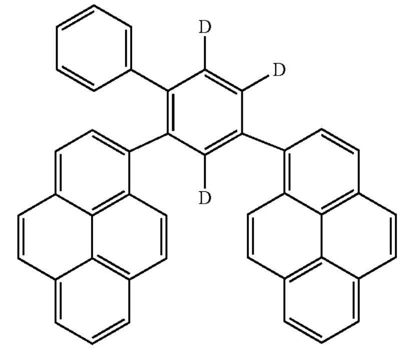
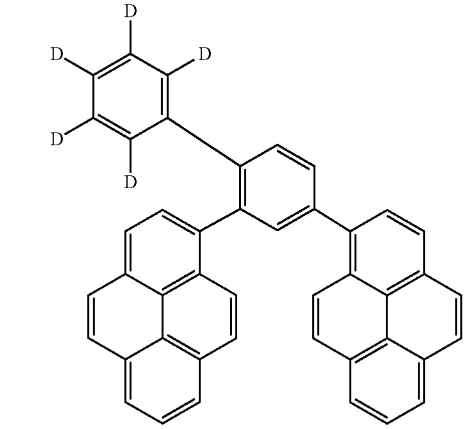
[Formula 102]
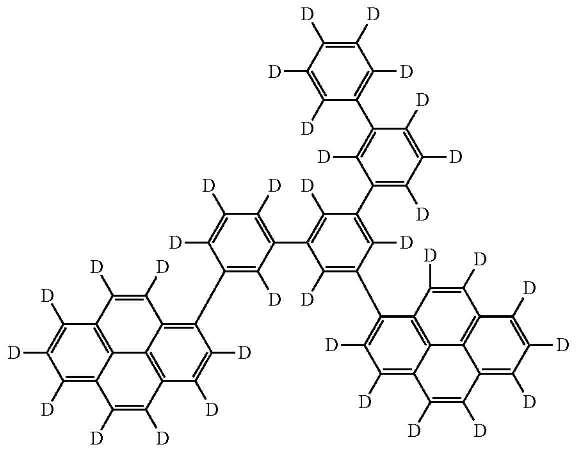
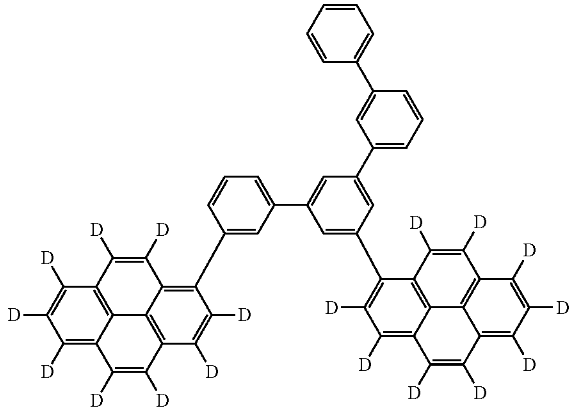
-continued
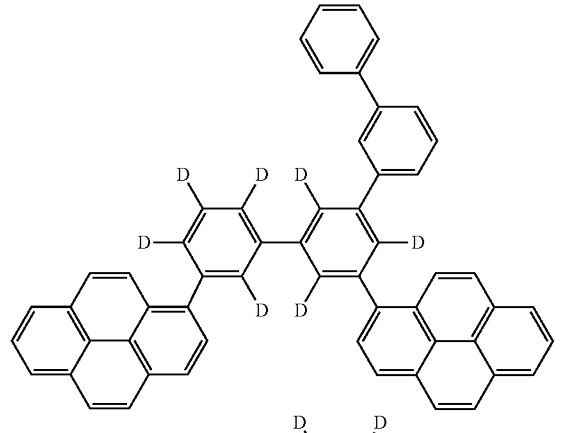
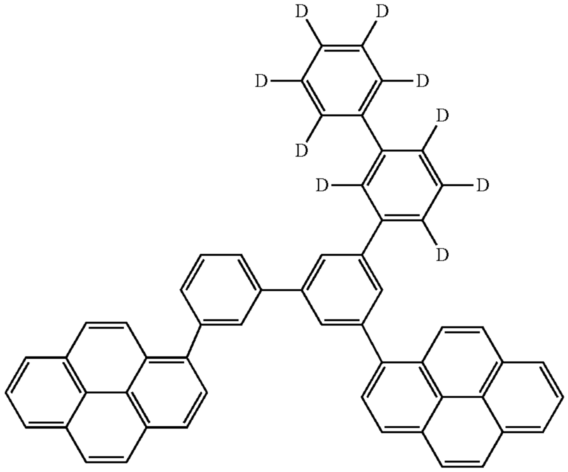
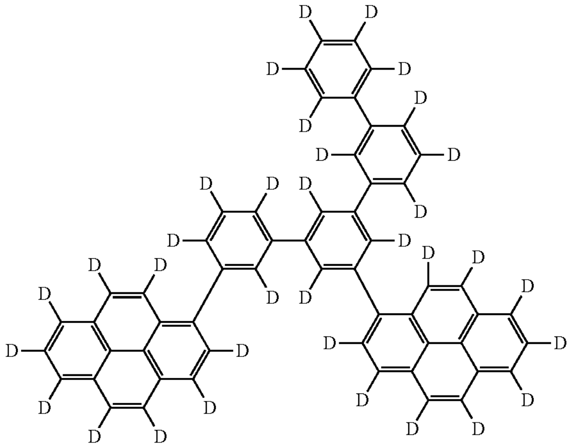
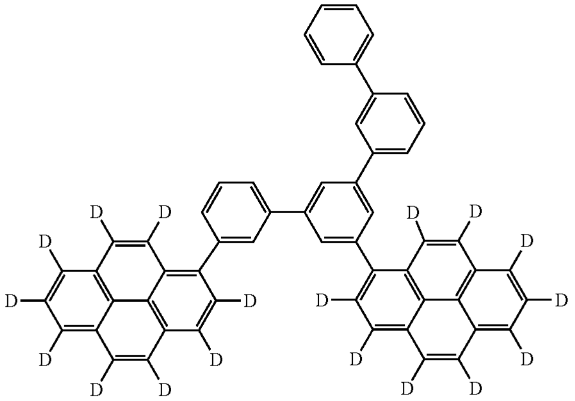

-continued
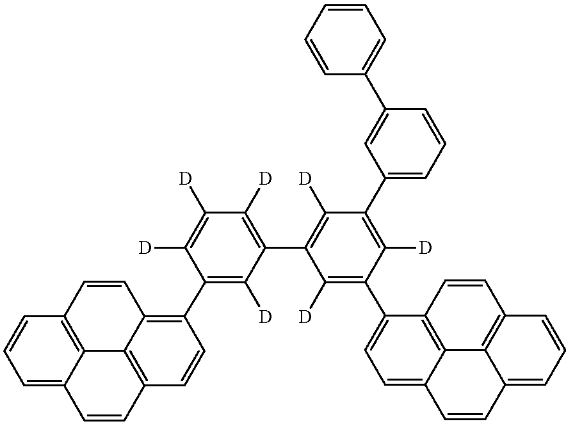
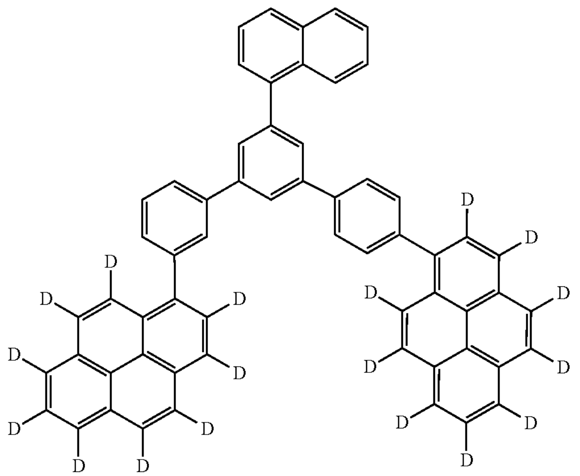
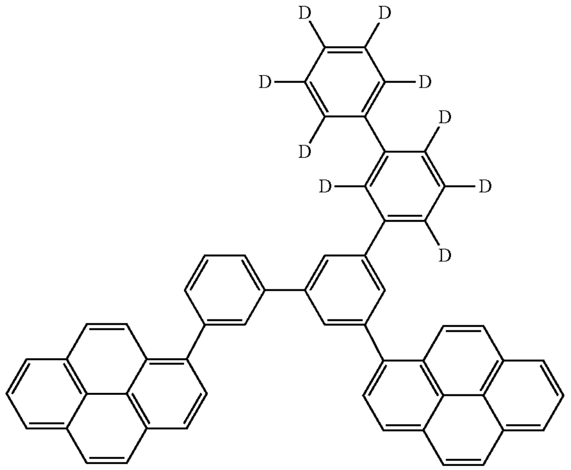
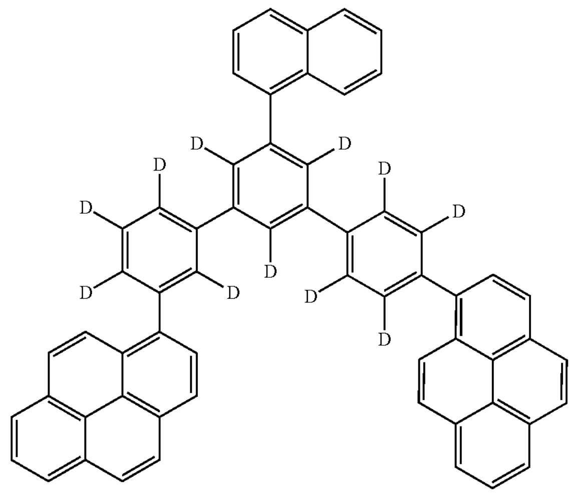
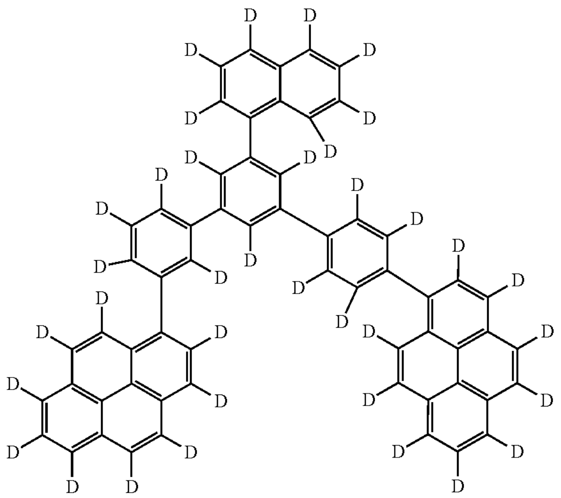
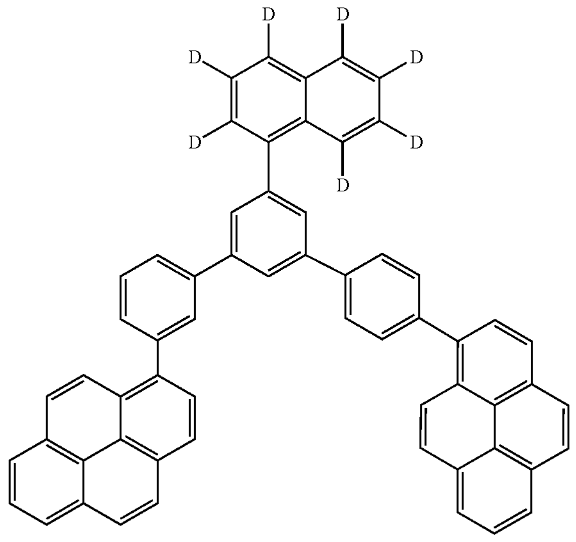
-continued

[Formula 103]
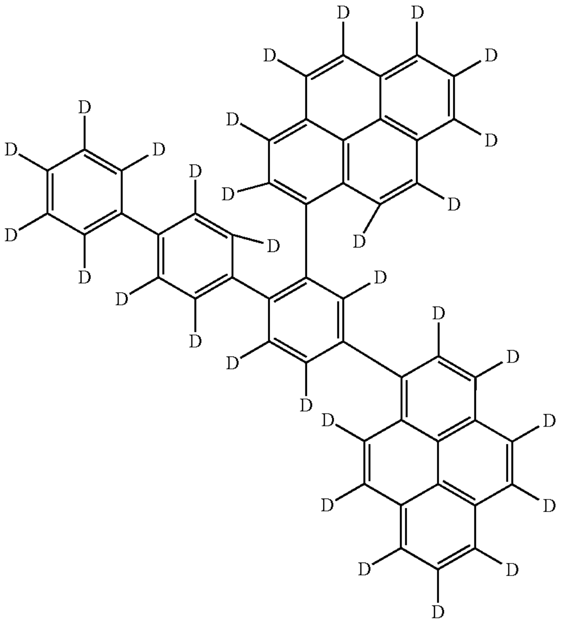
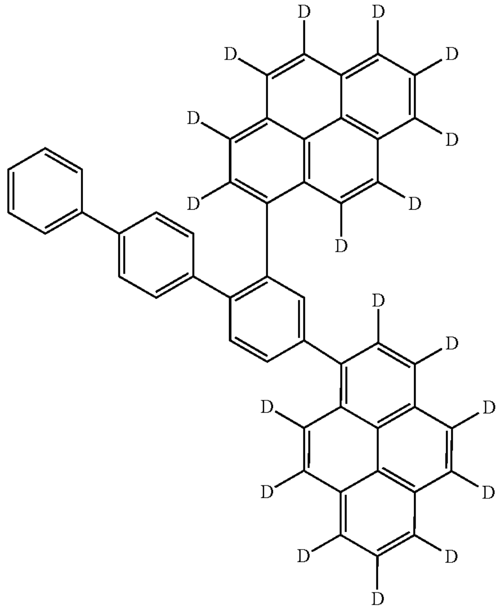
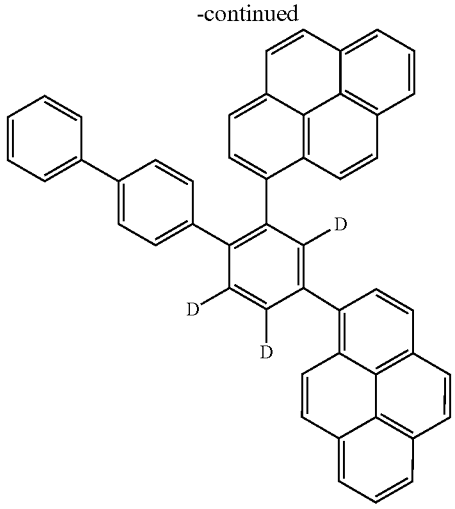
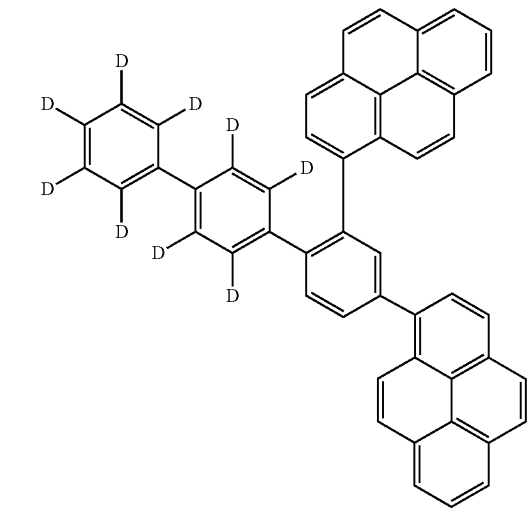
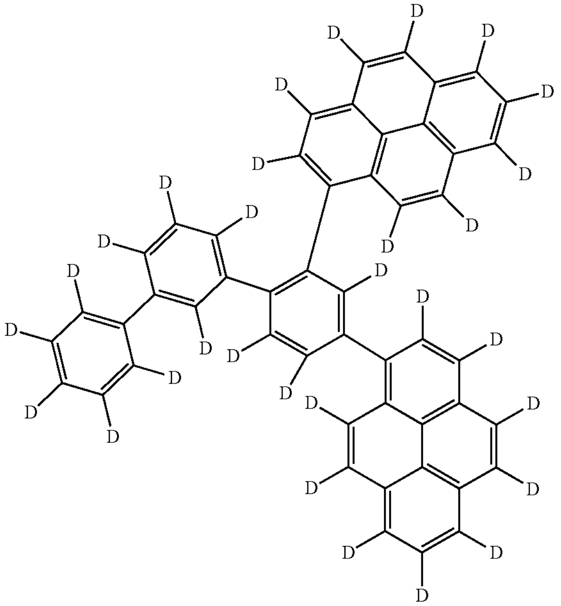

-continued
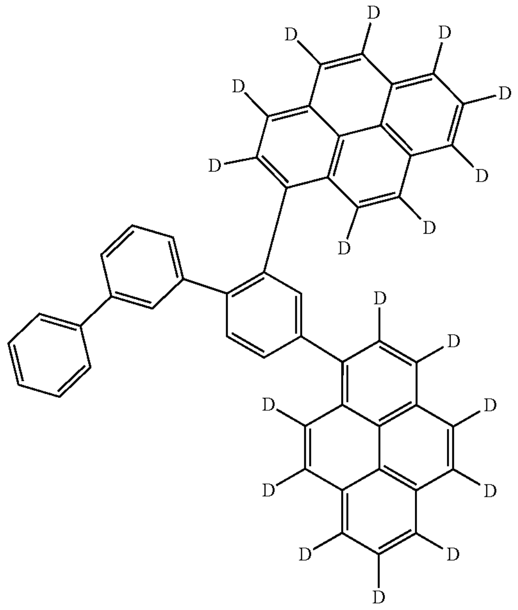
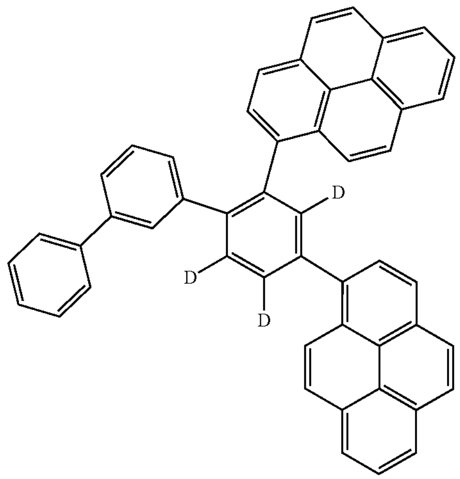
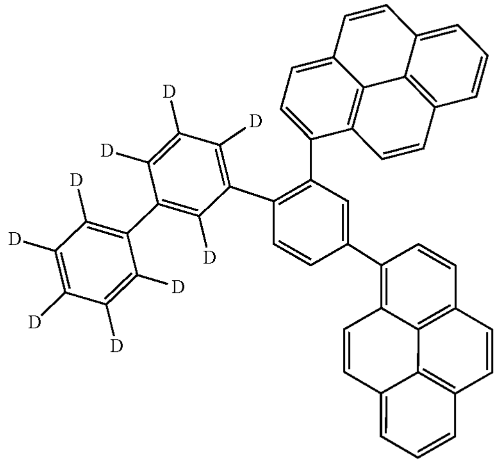
-continued
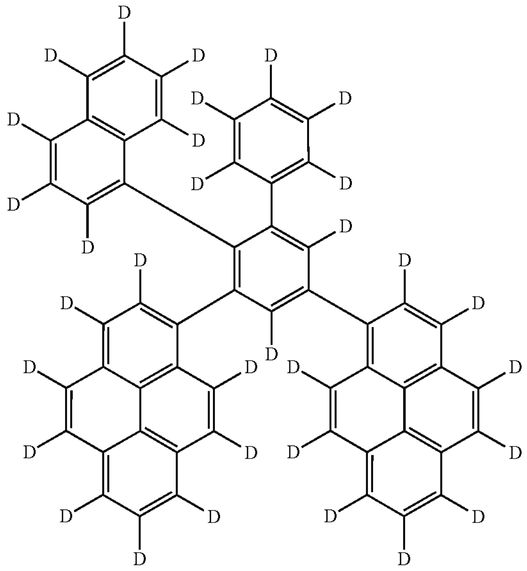
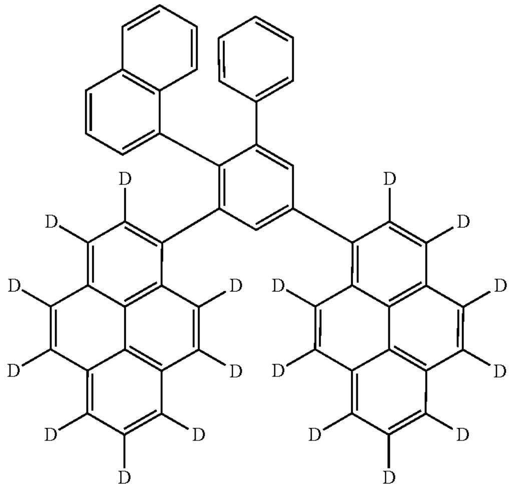
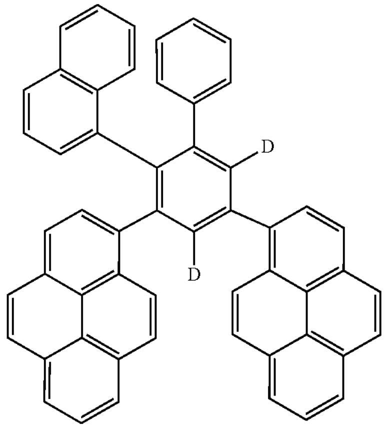

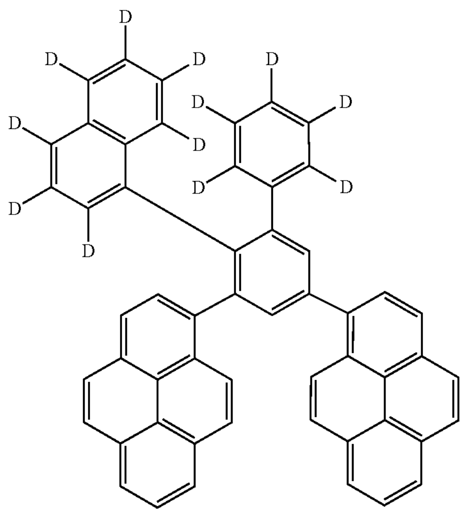
[Formula 104]
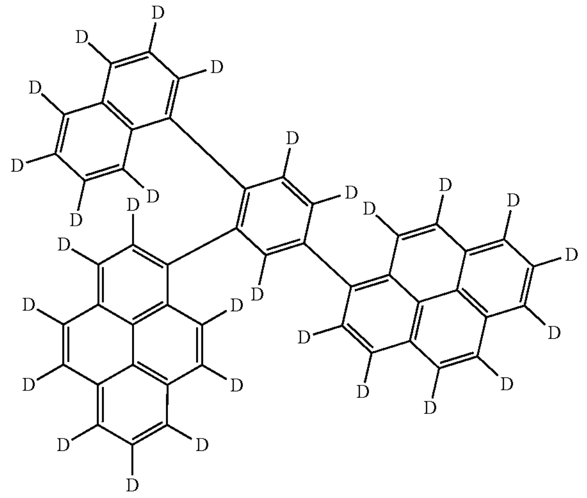
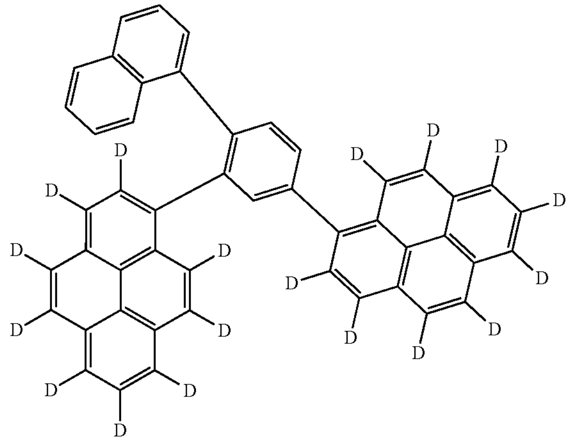
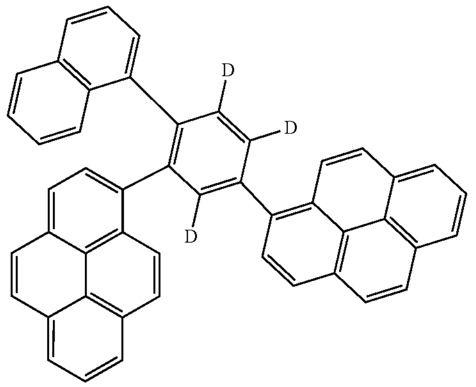
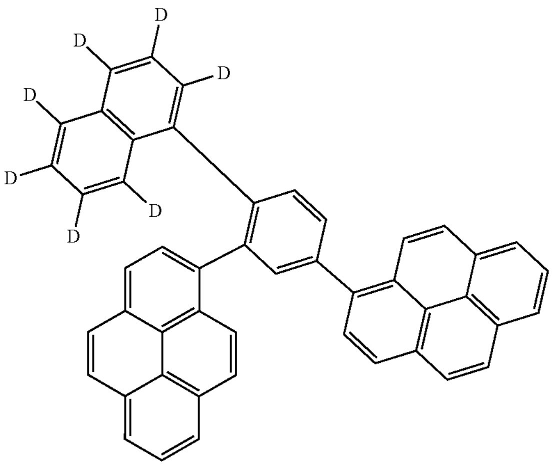
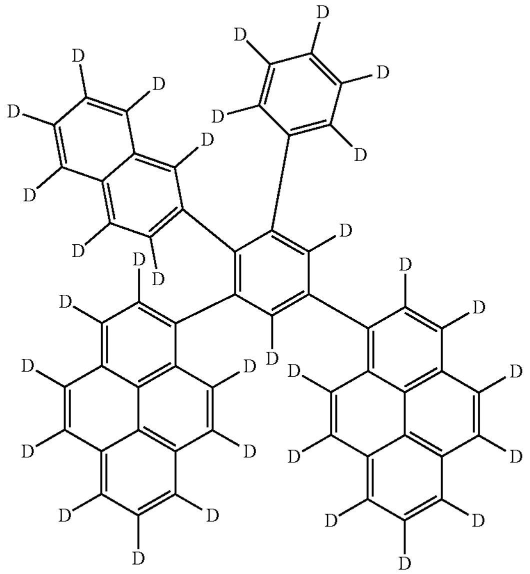

-continued
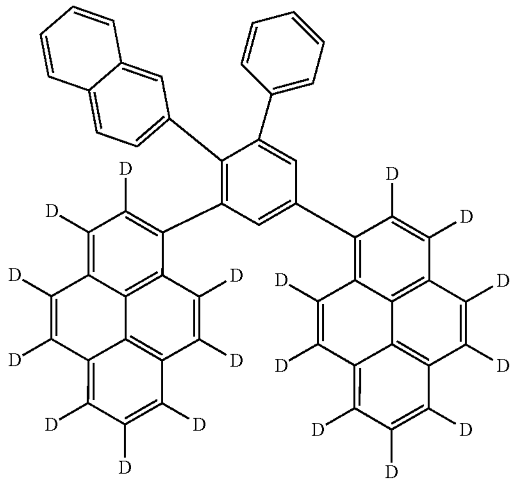
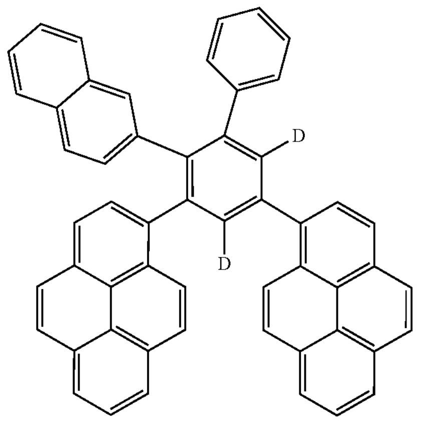
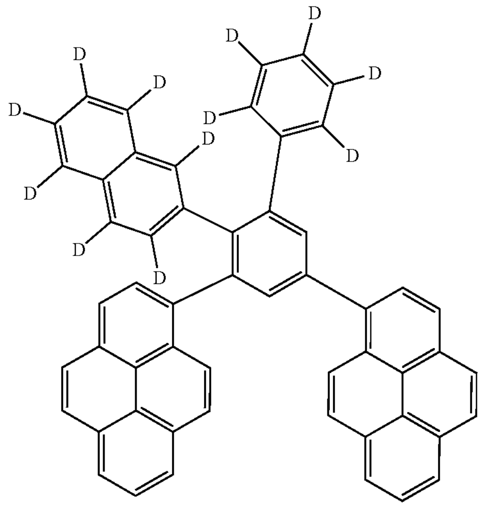
-continued
[Formula 105]
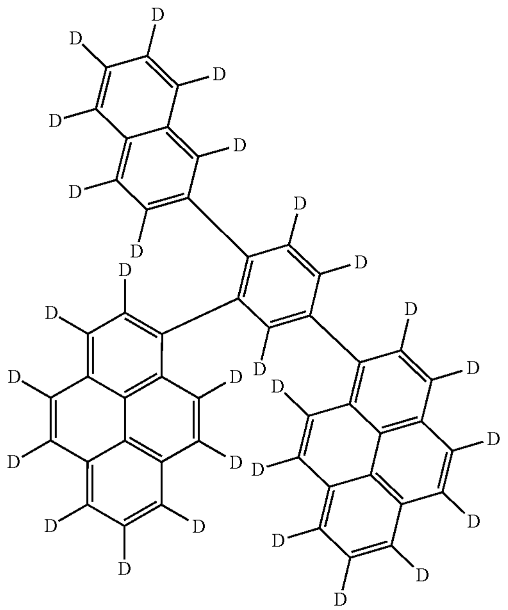
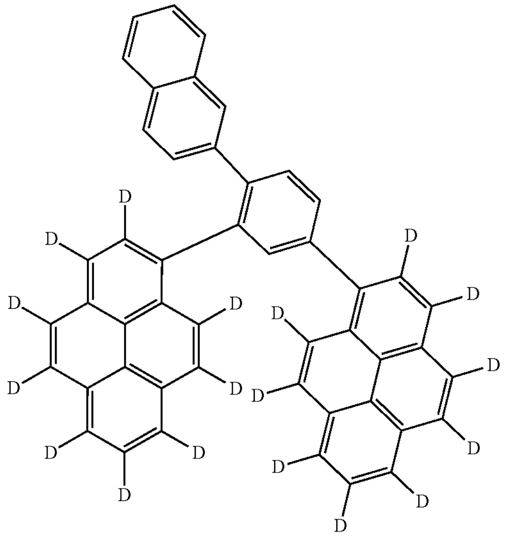
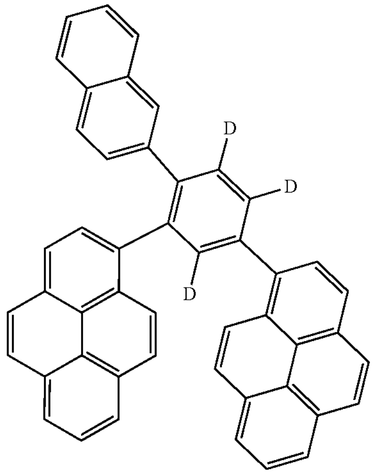

-continued
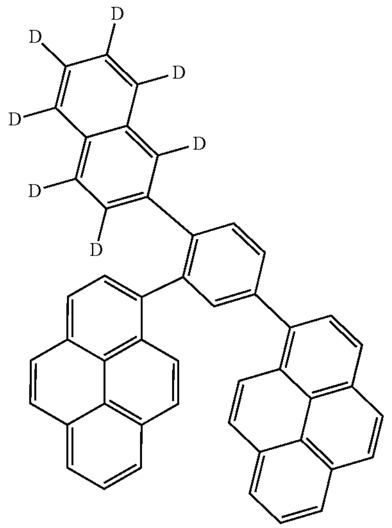
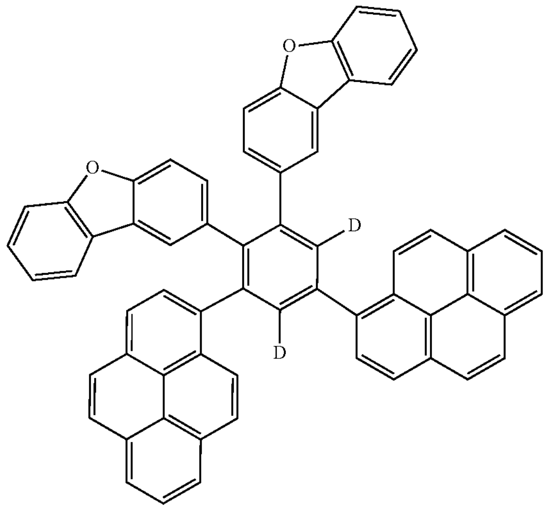
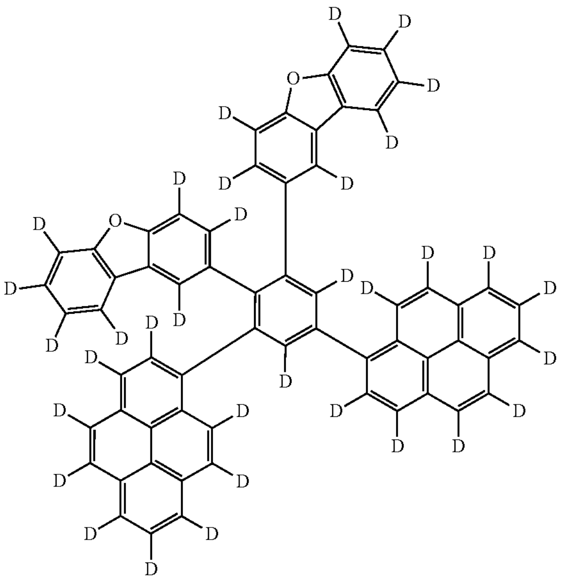
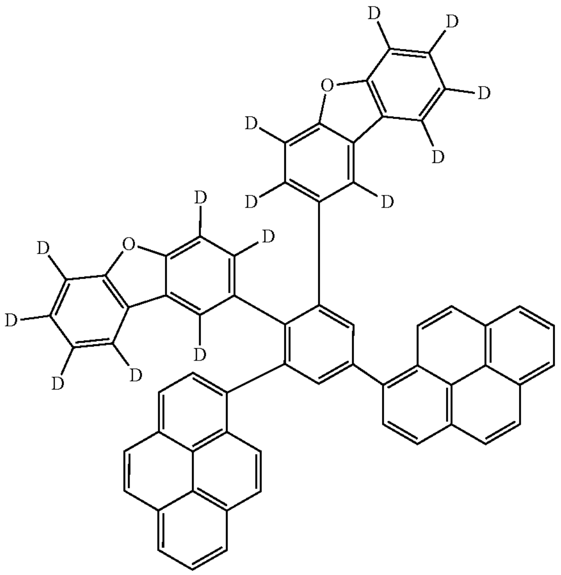
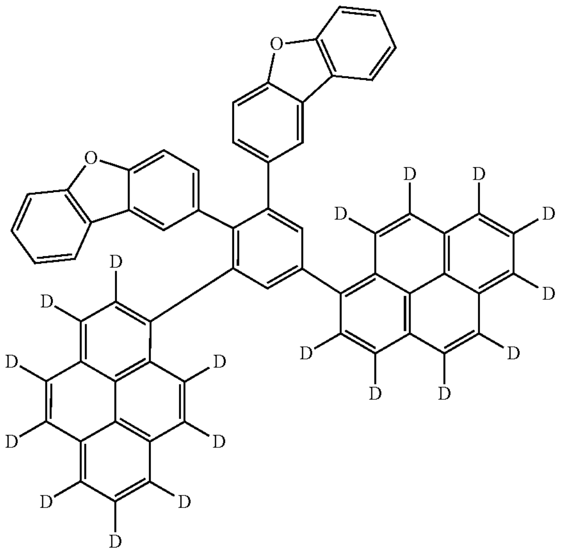
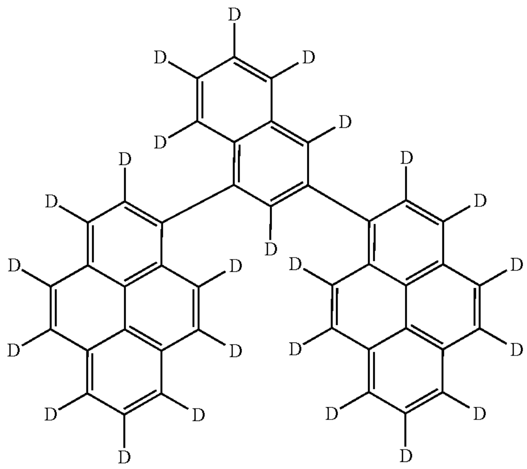
-continued -continued
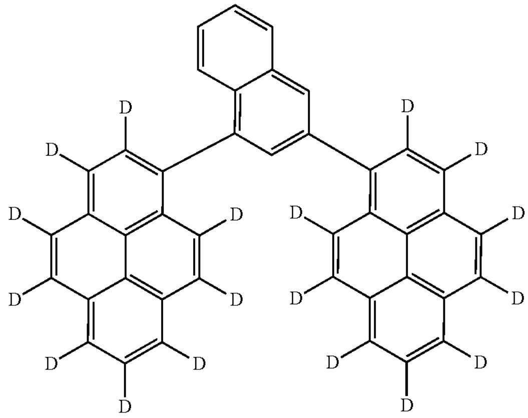
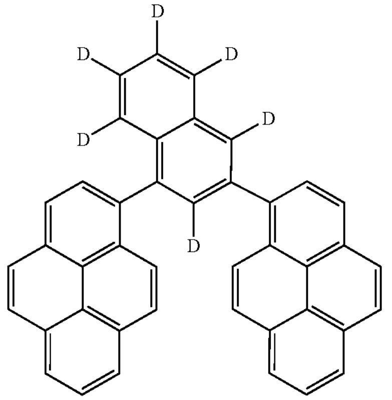
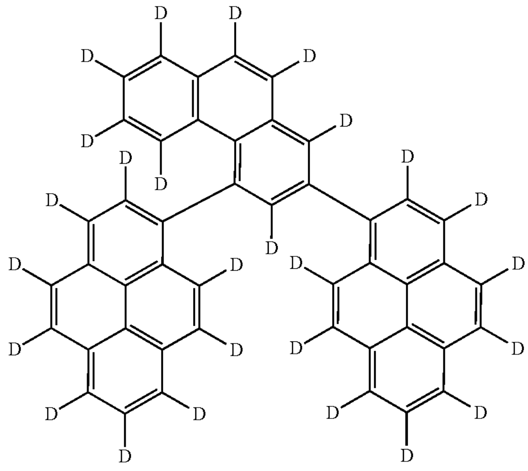
-continued
[Formula 106]
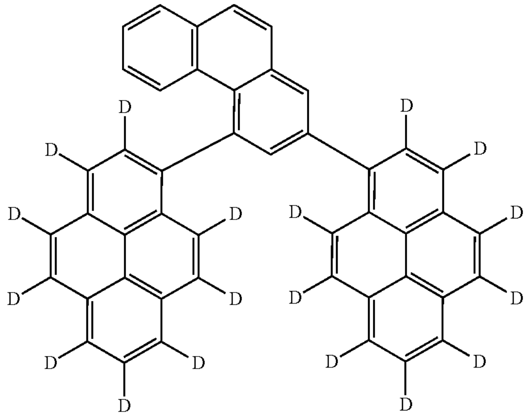
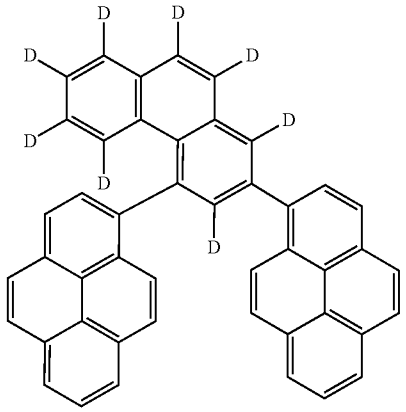
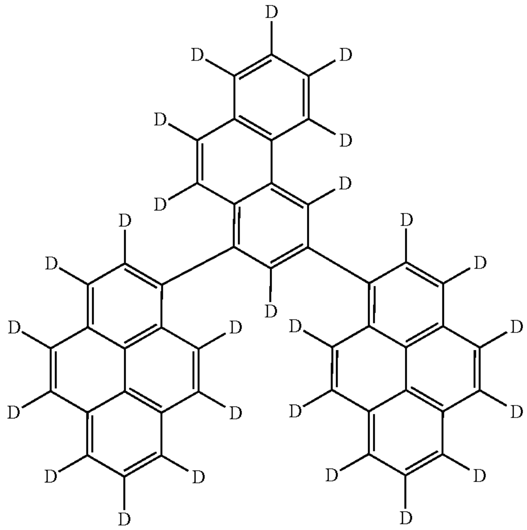

-continued
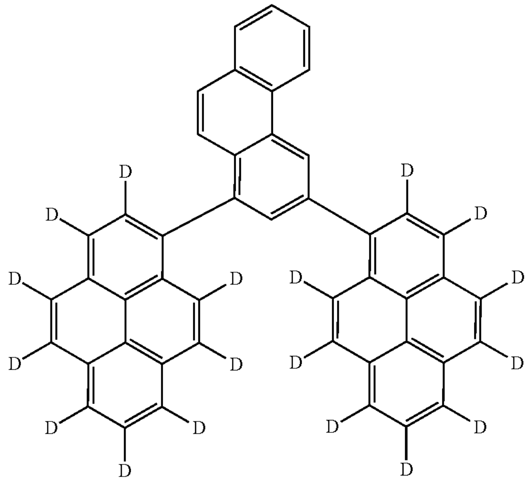
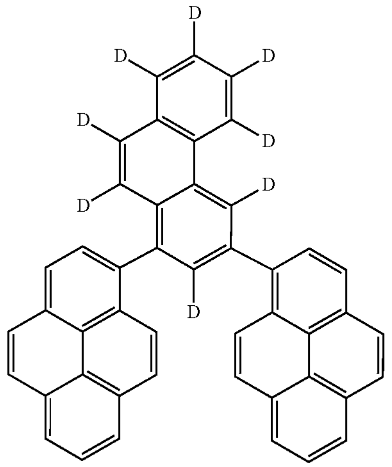
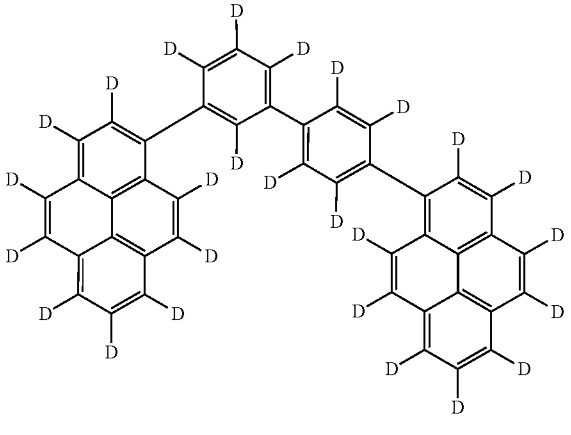
-continued
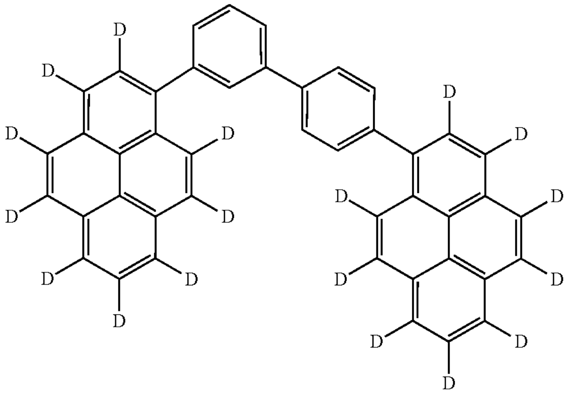
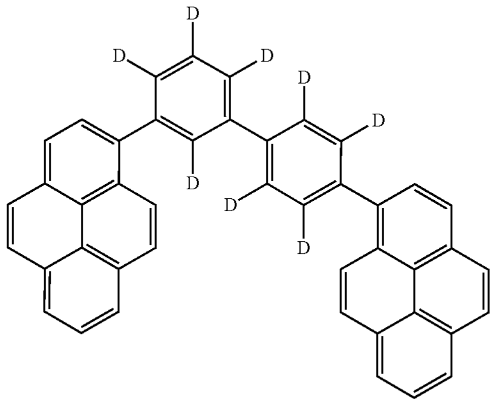
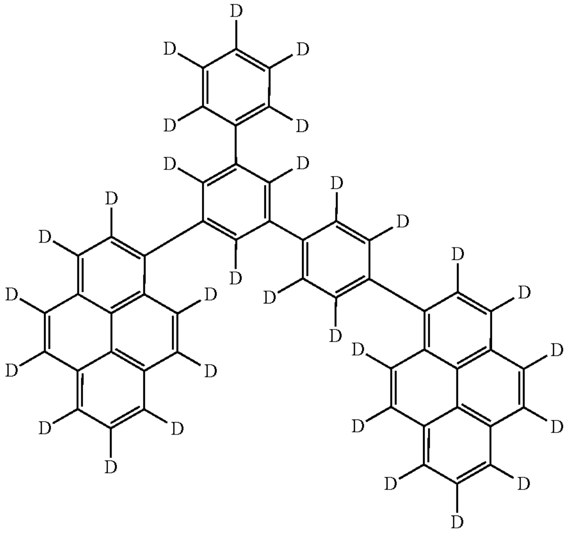

-continued
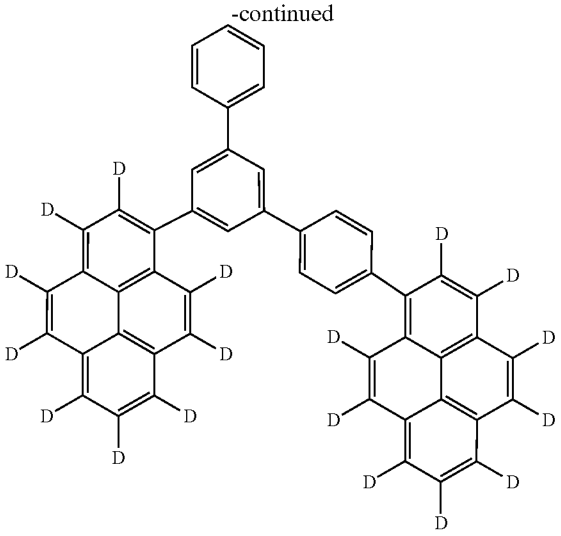
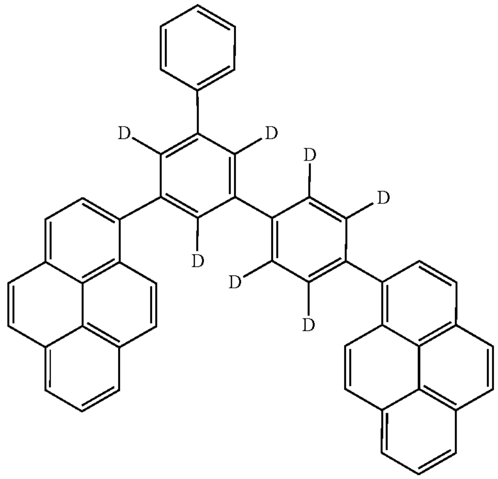
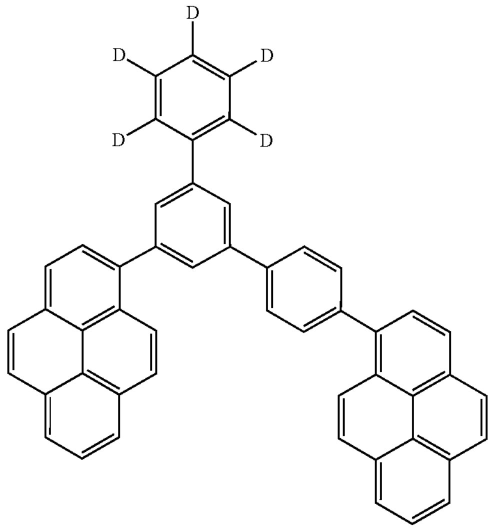
-continued
[Formula 107]
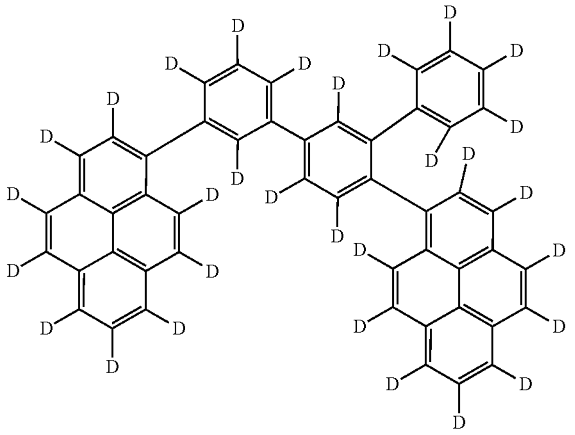
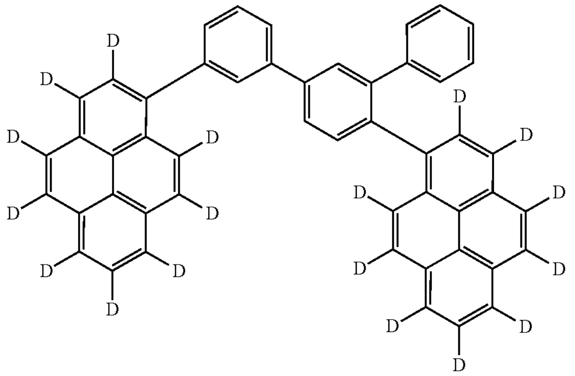
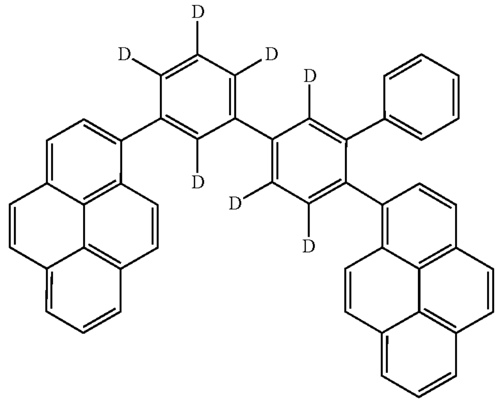
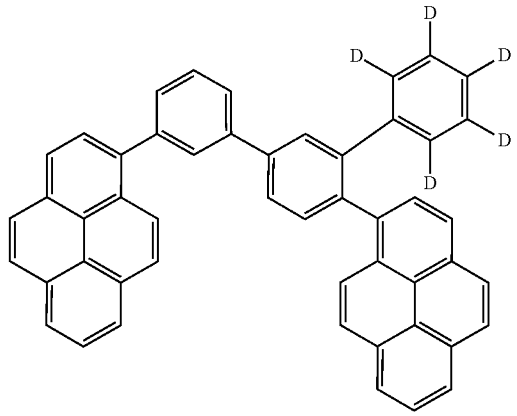

-continued
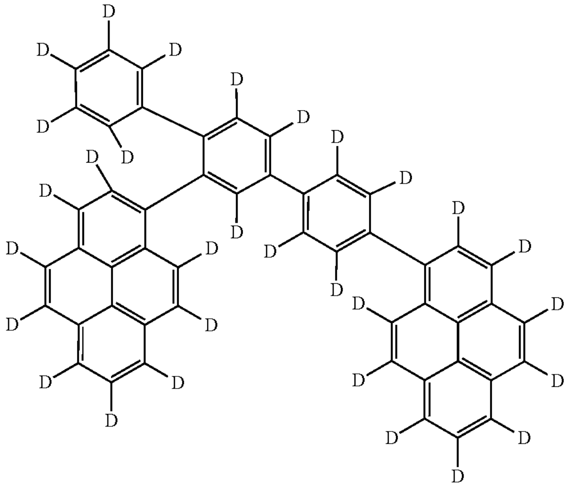
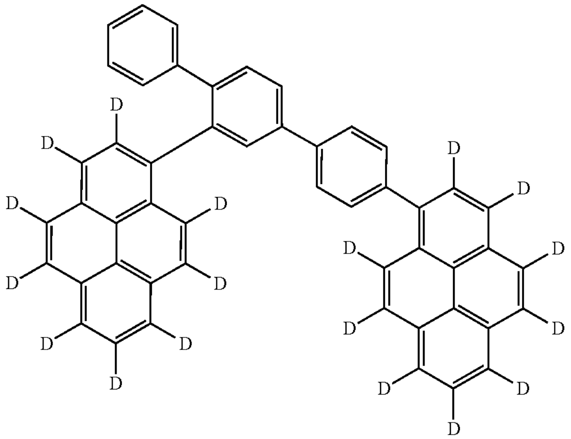
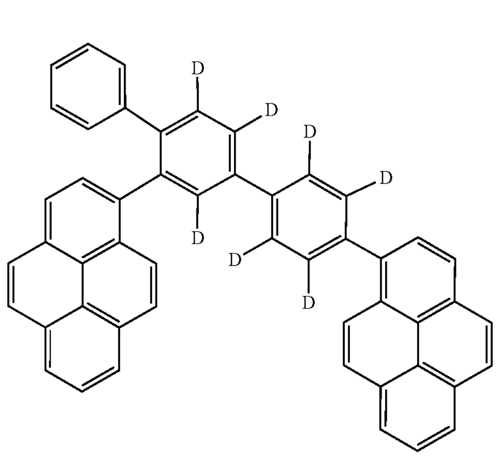
-continued
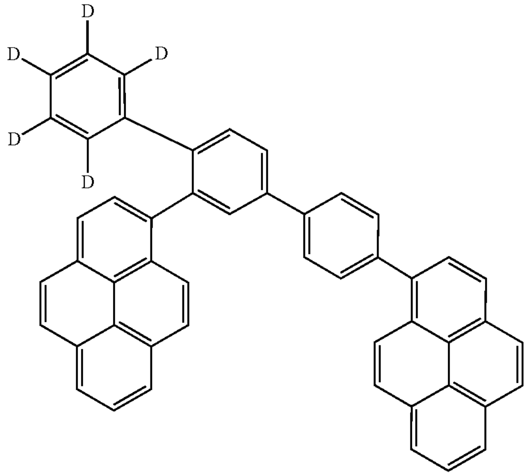
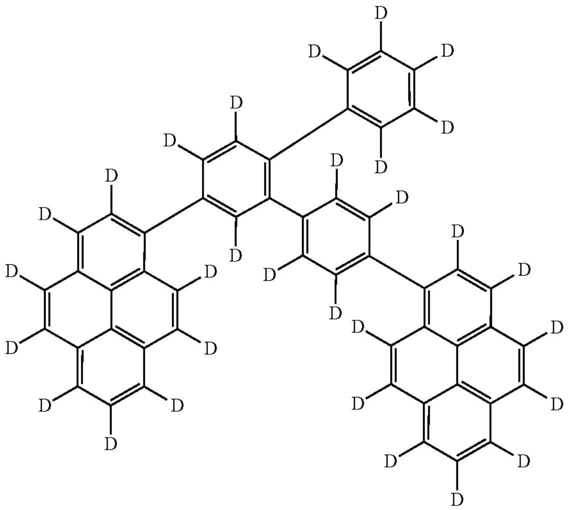
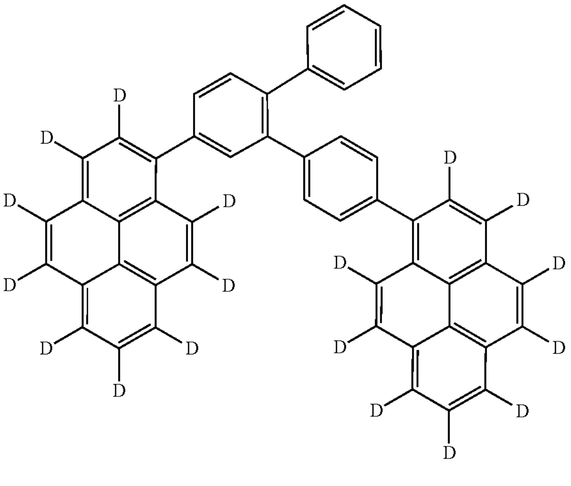

-continued
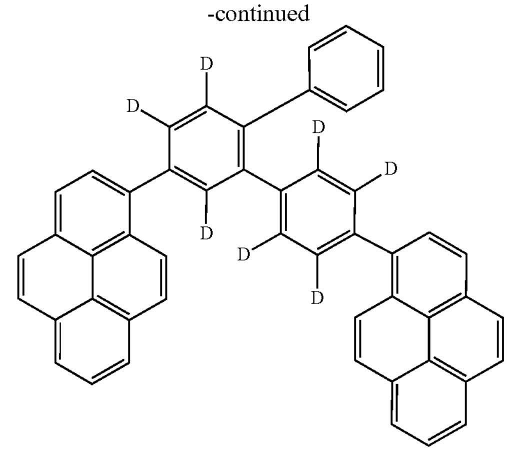
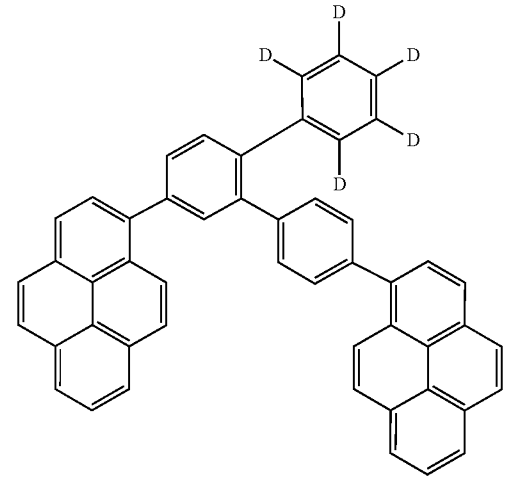
[Formula 108]
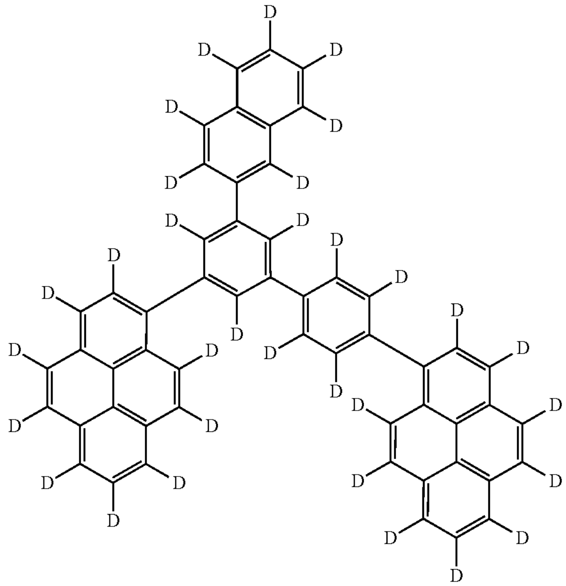
-continued
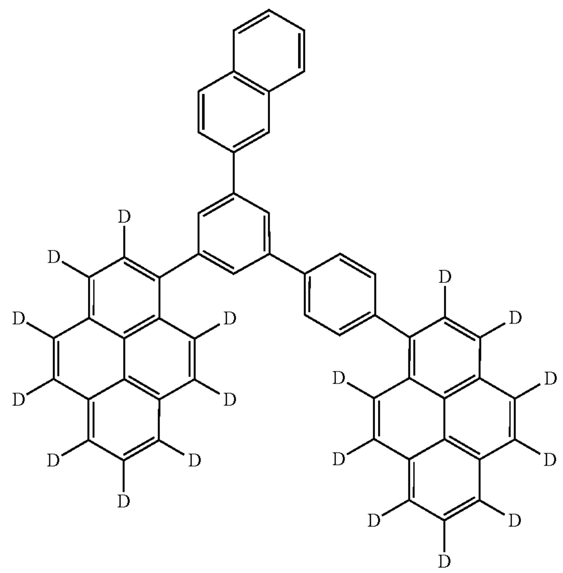
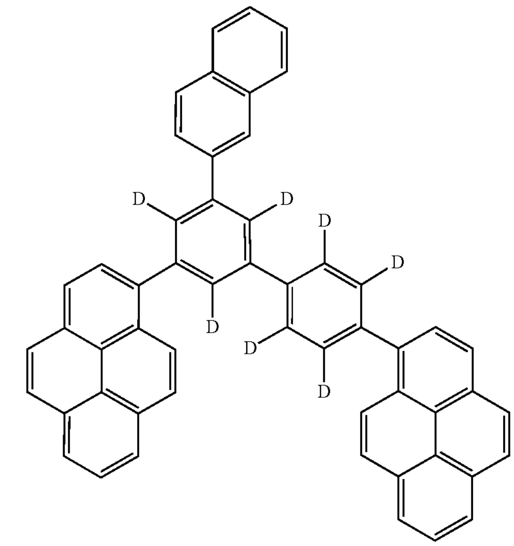
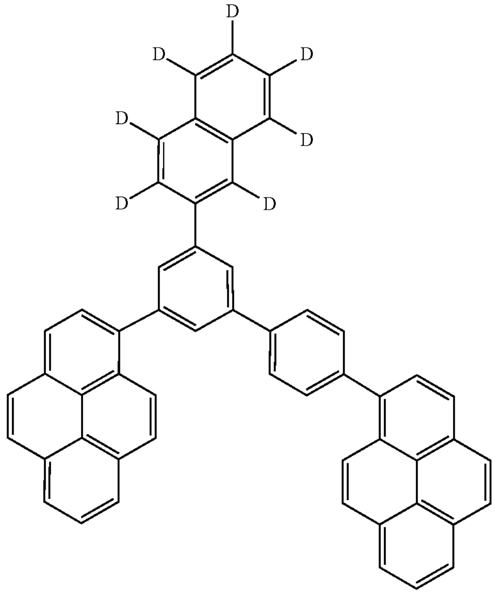

-continued
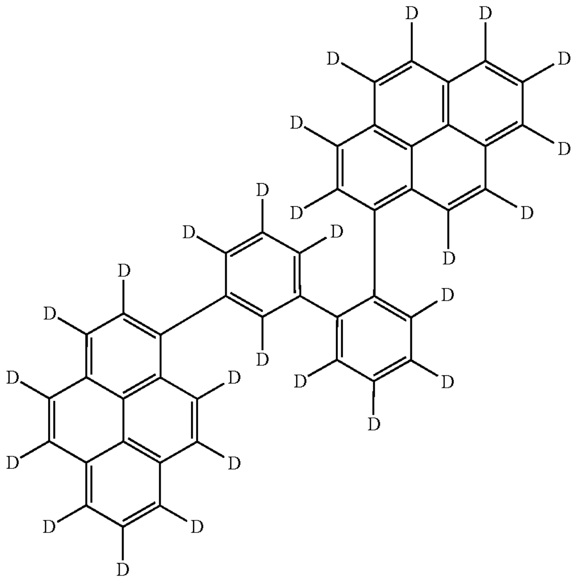
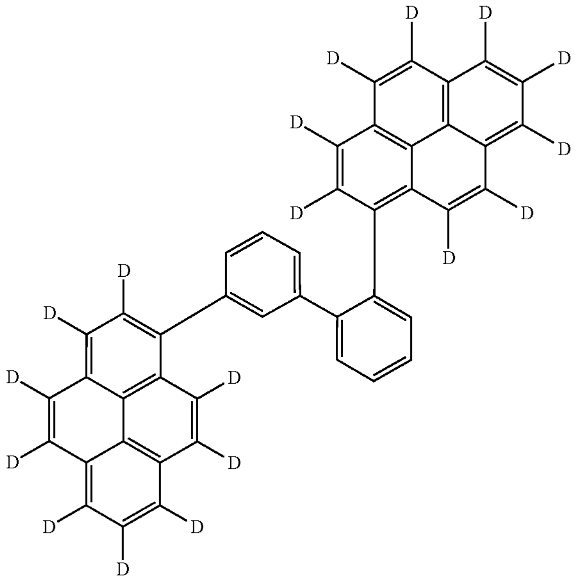
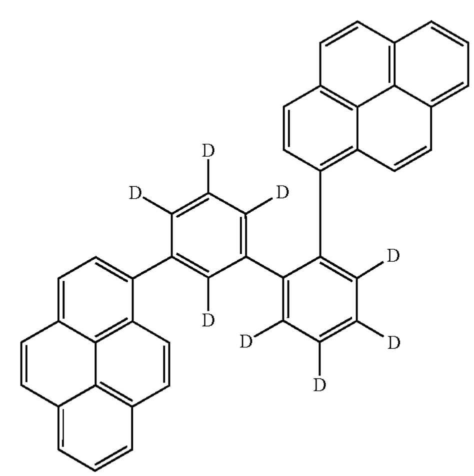
-continued
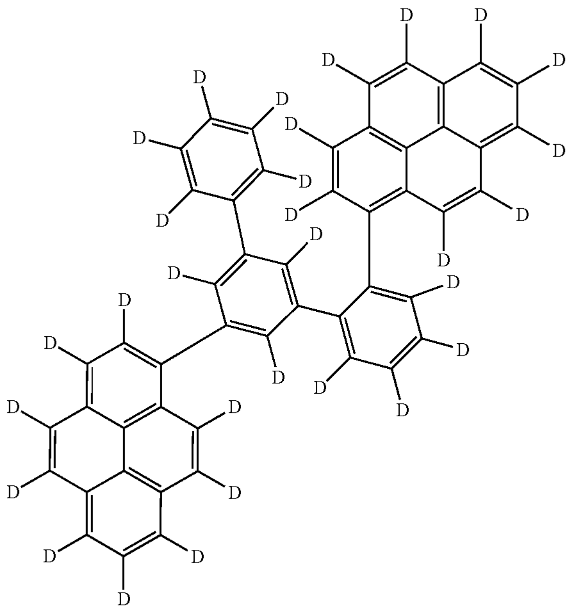
[Formula 109]
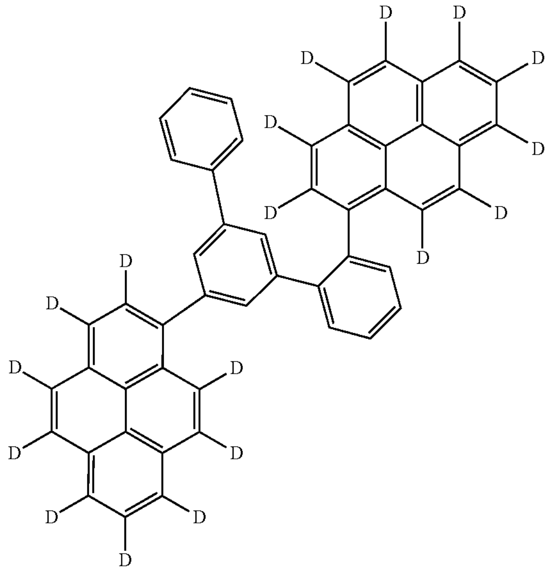
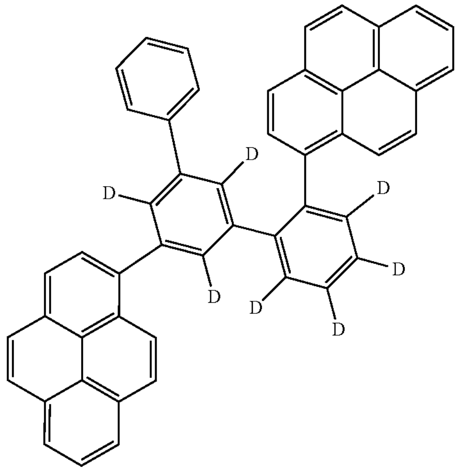

-continued
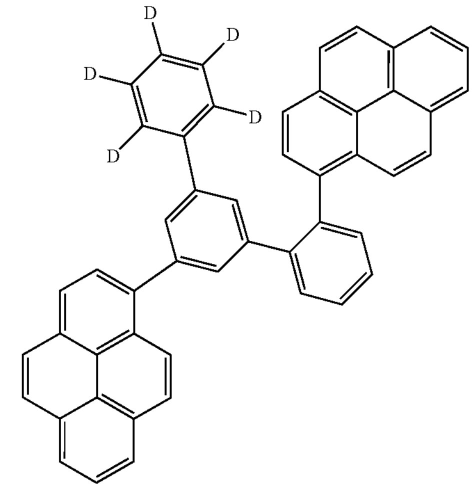
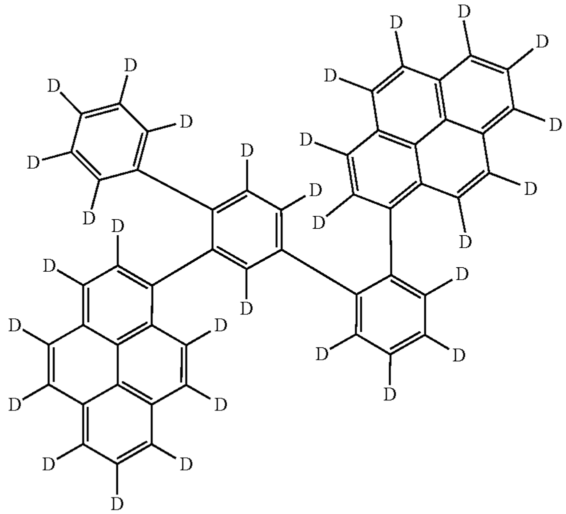
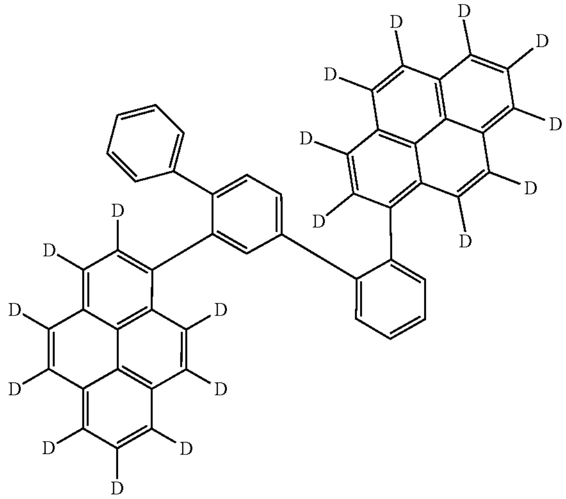
-continued
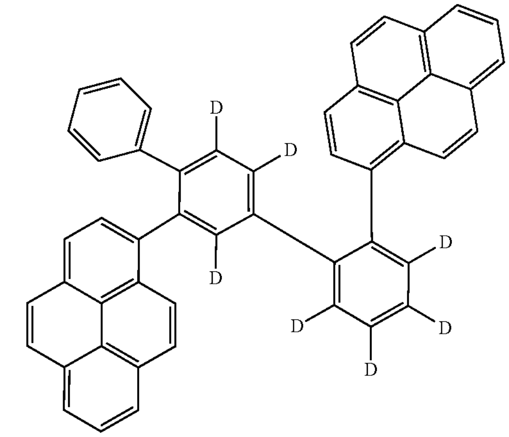
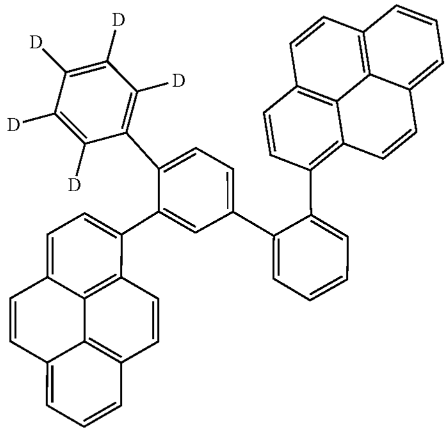
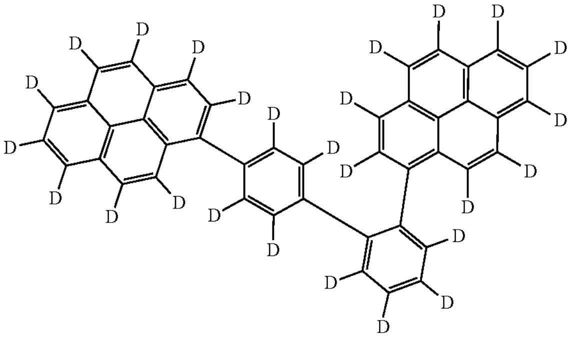
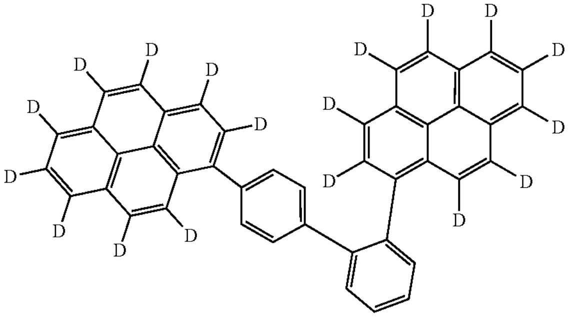

-continued
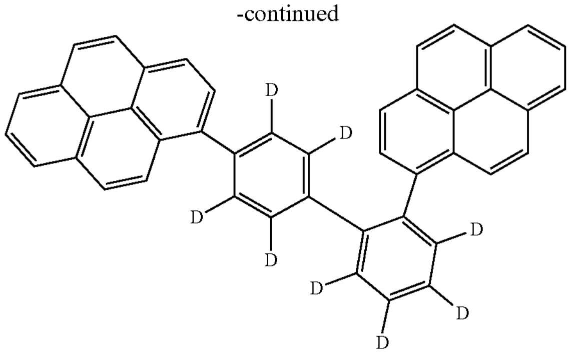
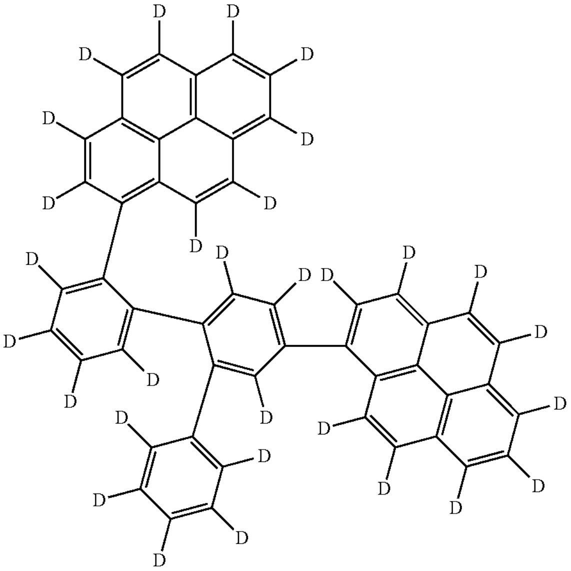
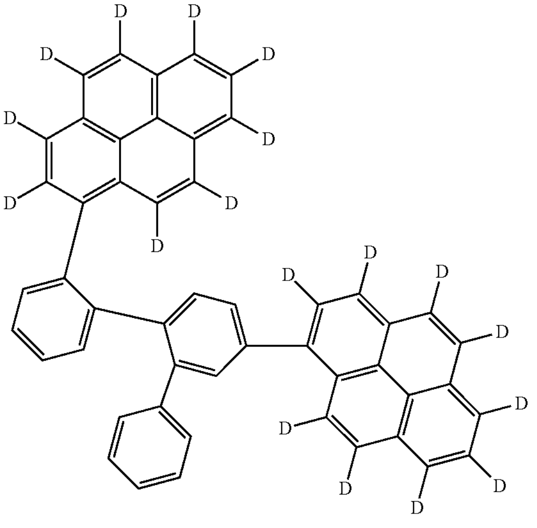
-continued
[Formula 110]
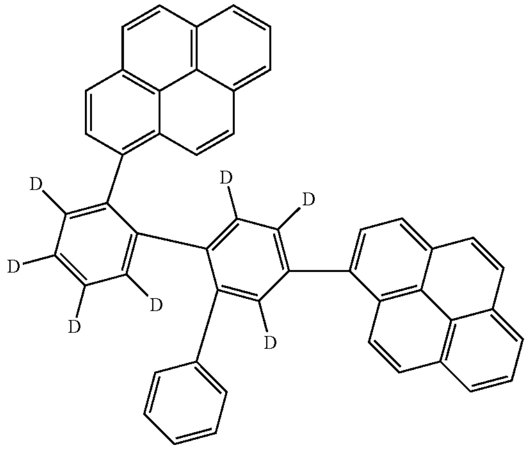
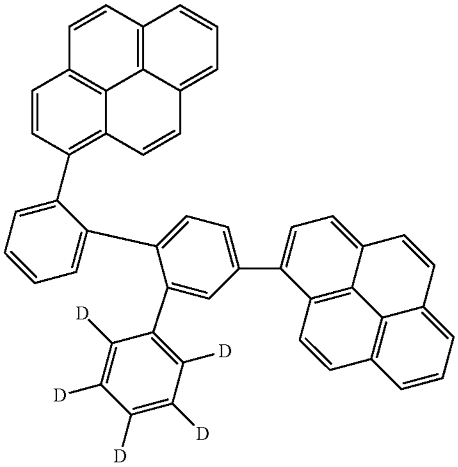
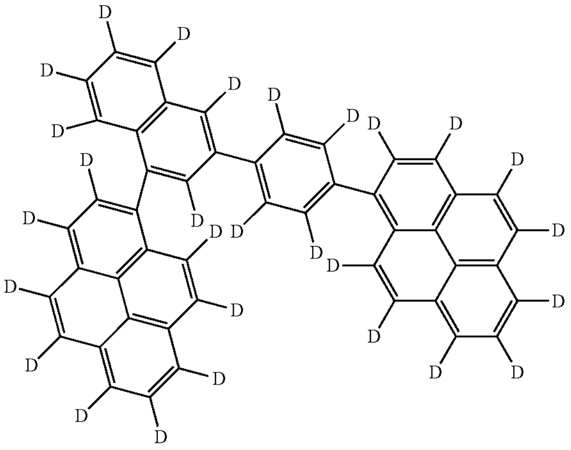

-continued
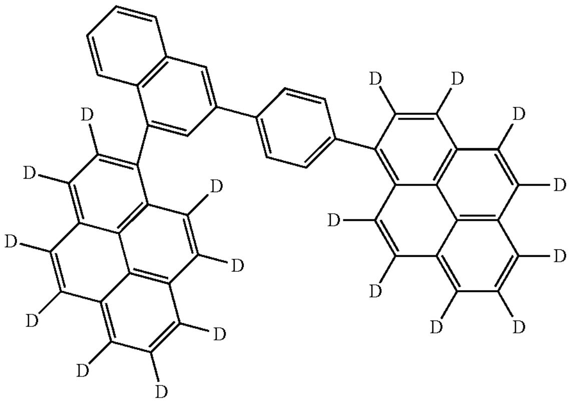
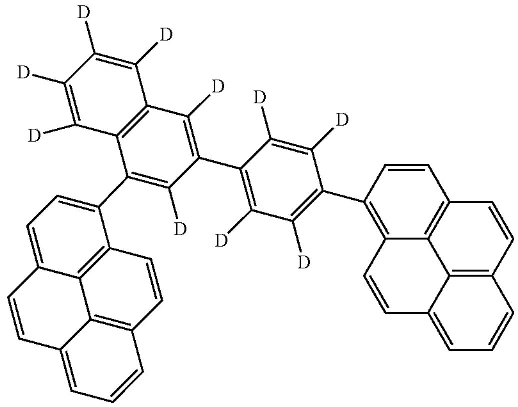
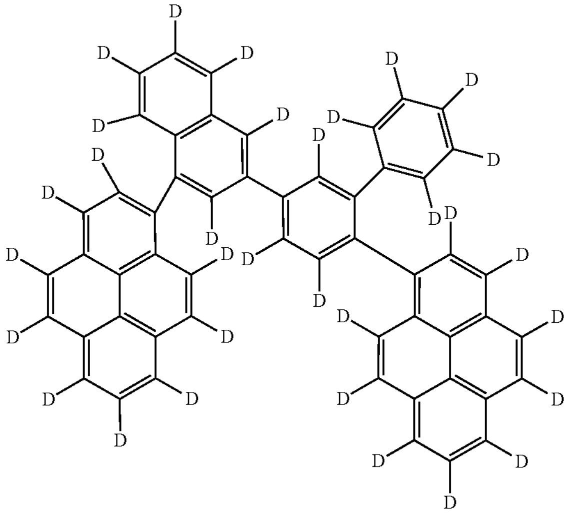
-continued
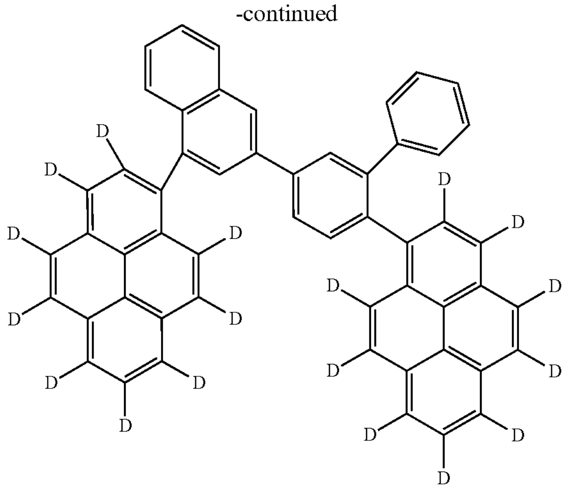
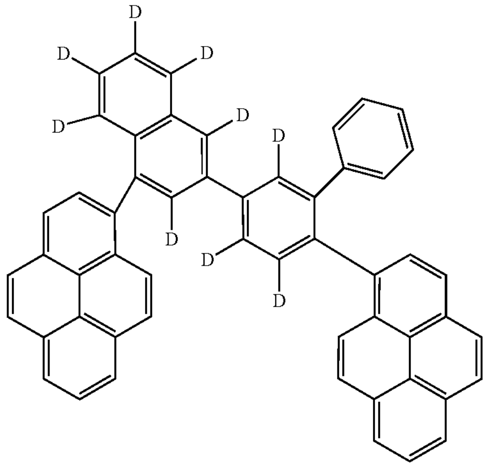
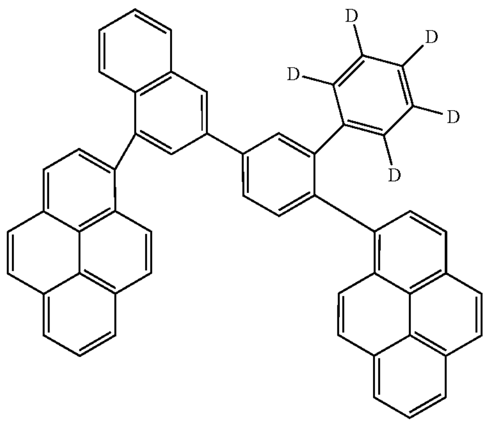

-continued
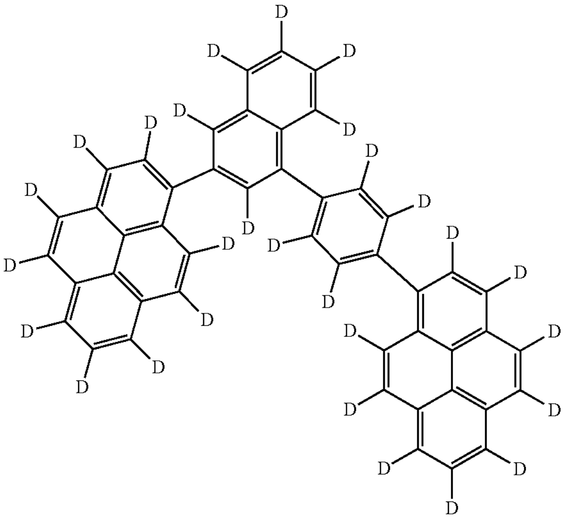
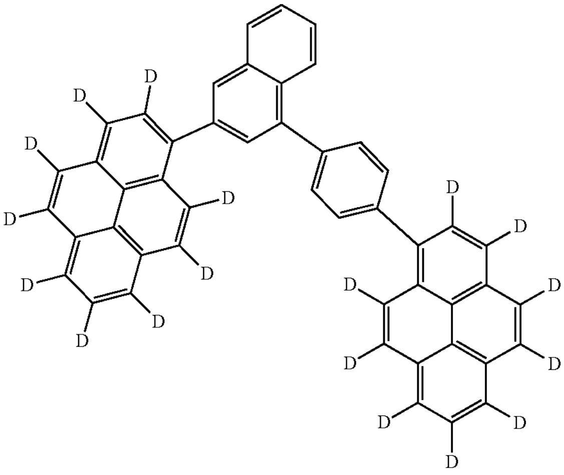
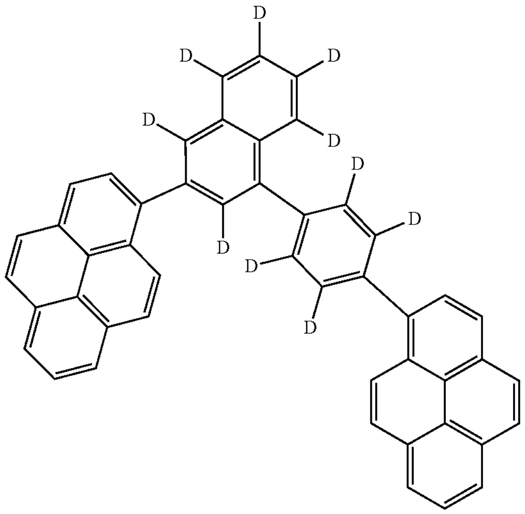
-continued
[Formula 111]
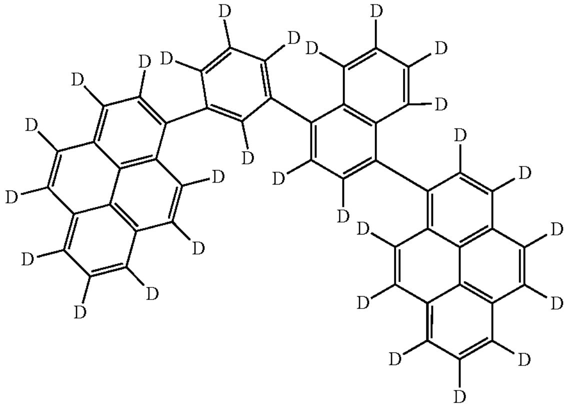
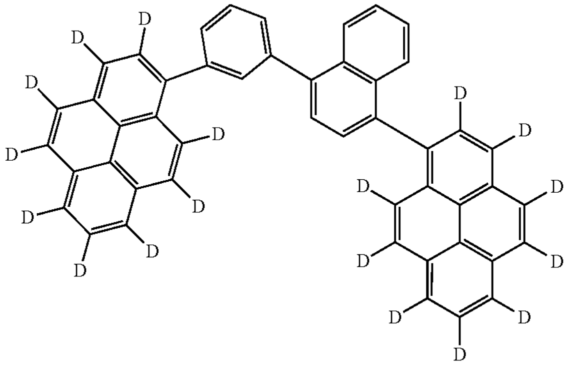
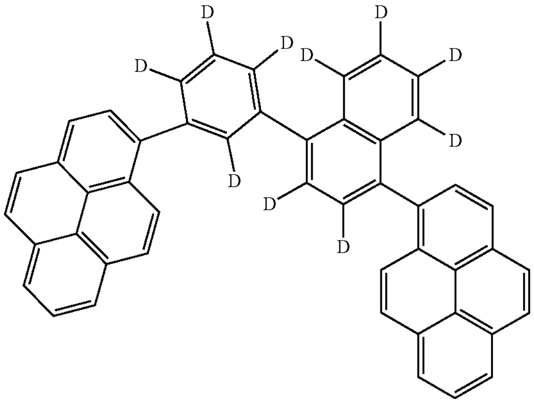

-continued
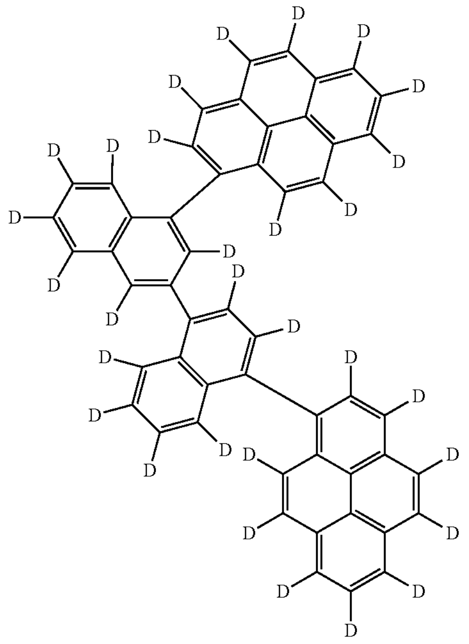
[Formula 112]
-continued
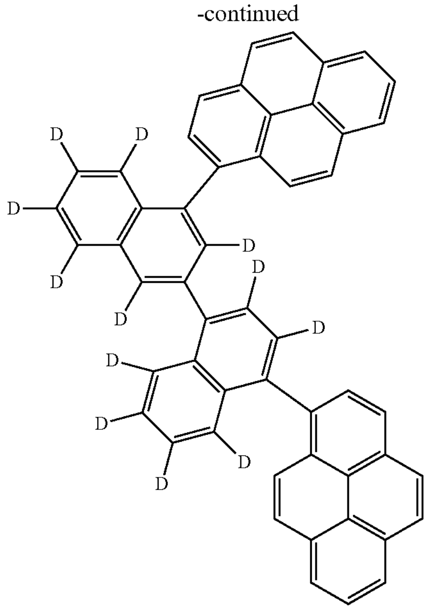
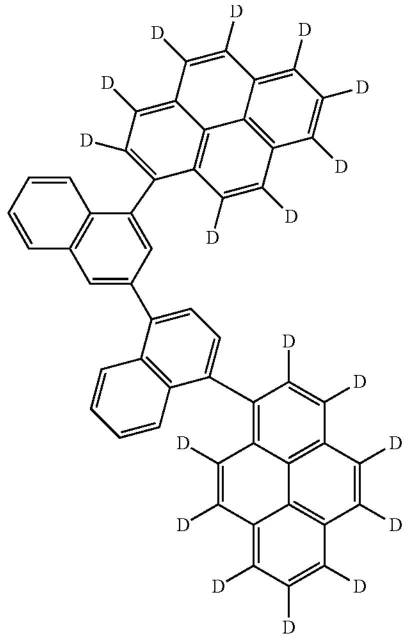
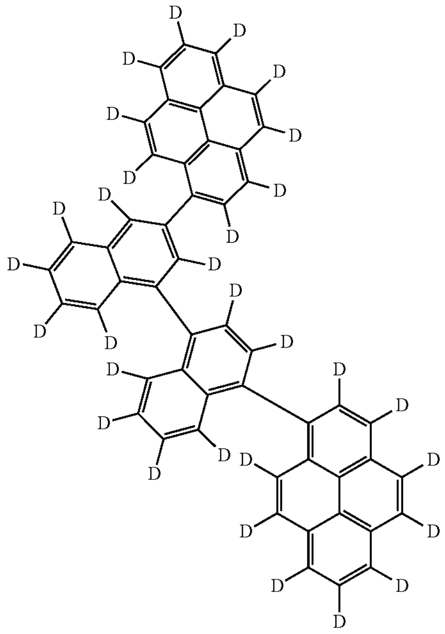

-continued
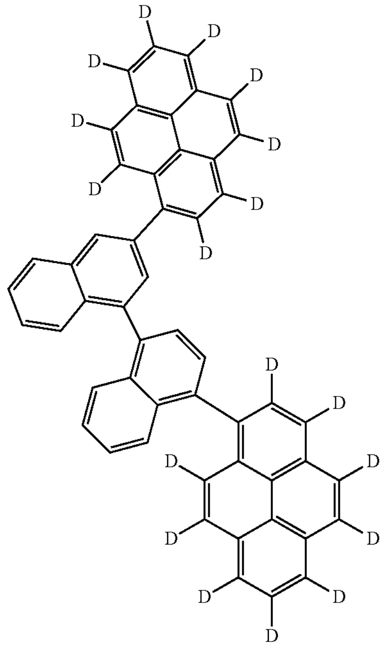
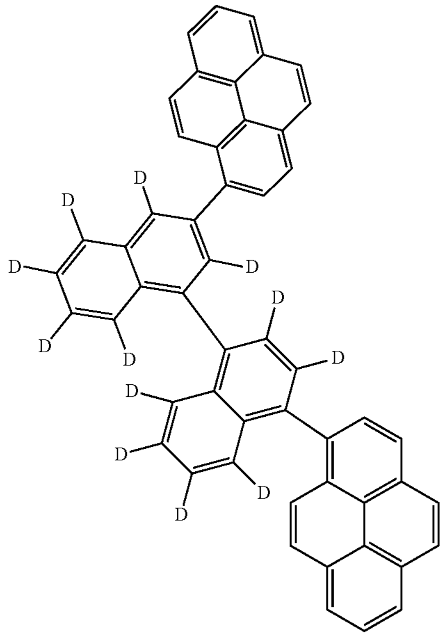
-continued
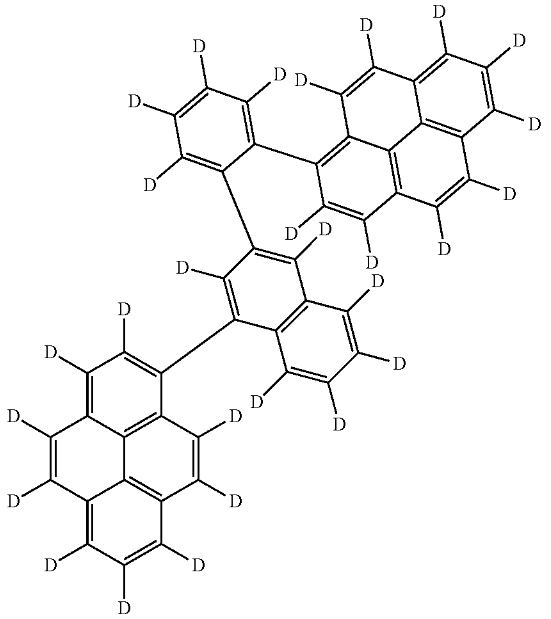
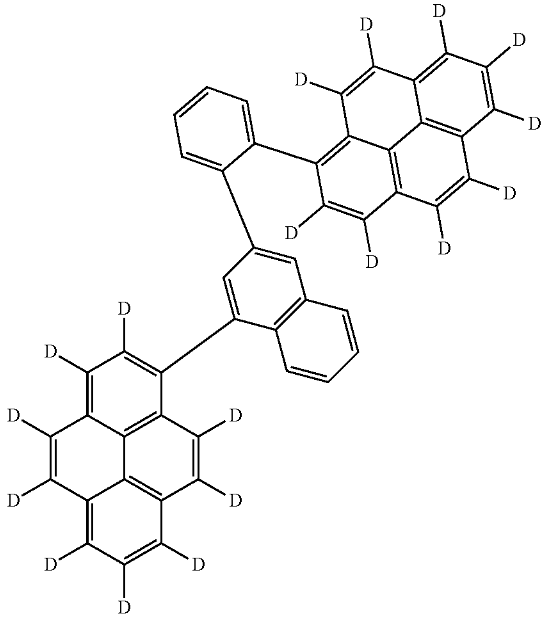

-continued
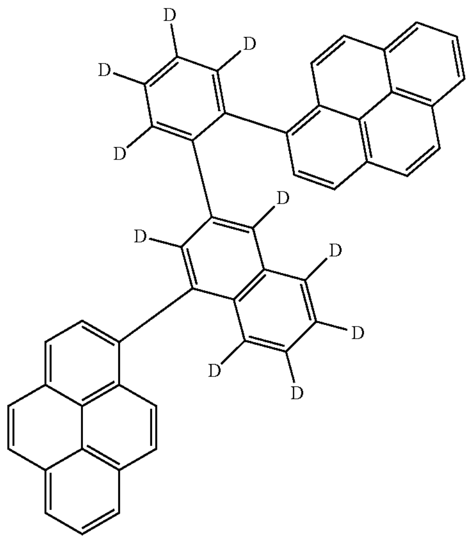
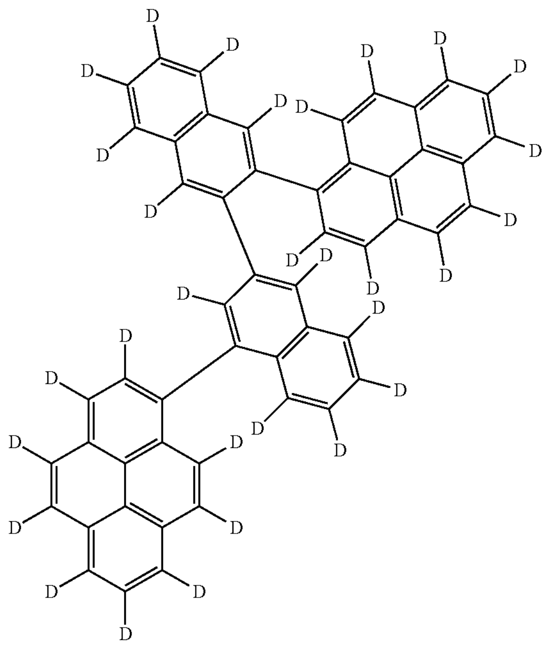
-continued
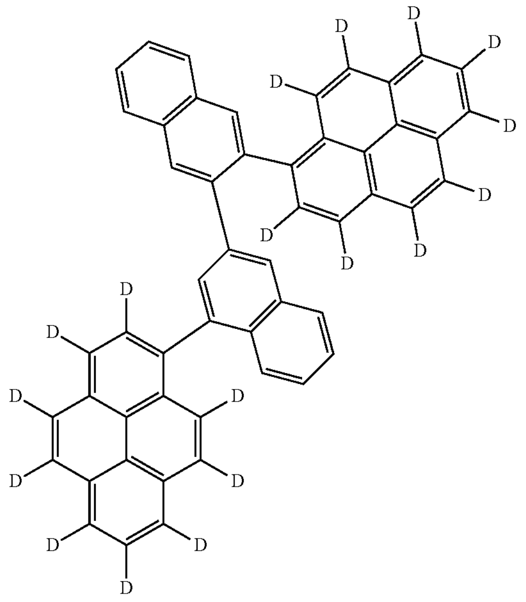
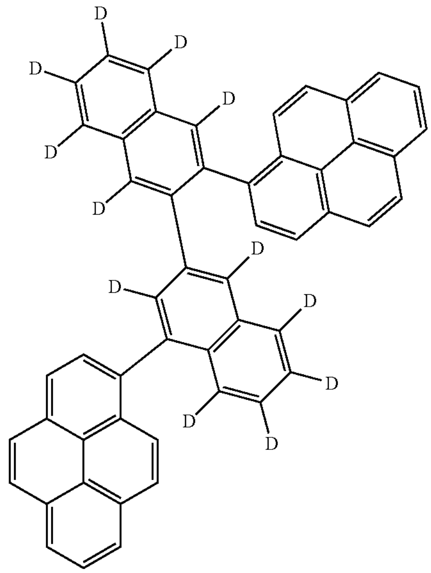
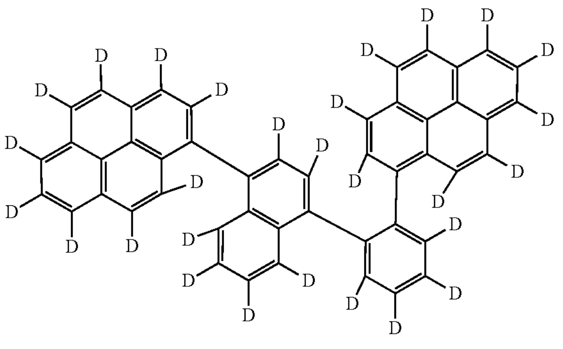

-continued
[Formula 113]
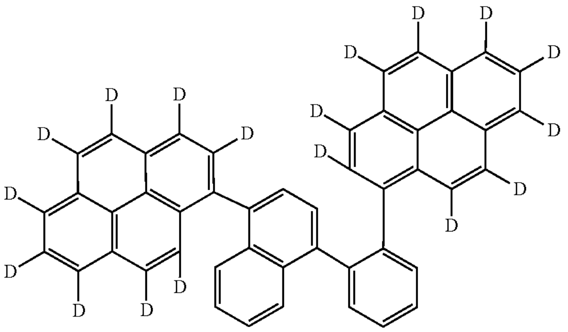
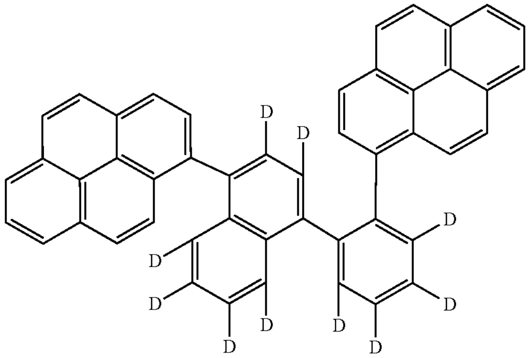
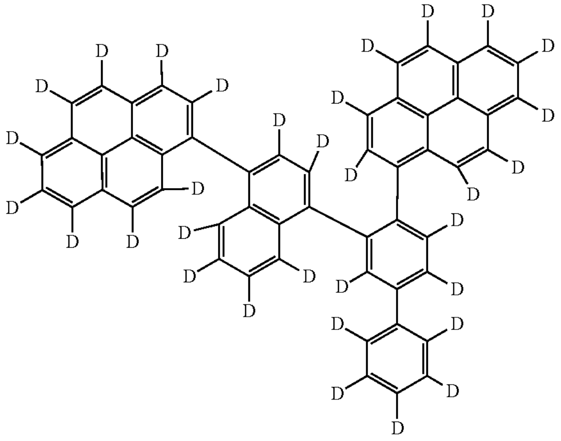
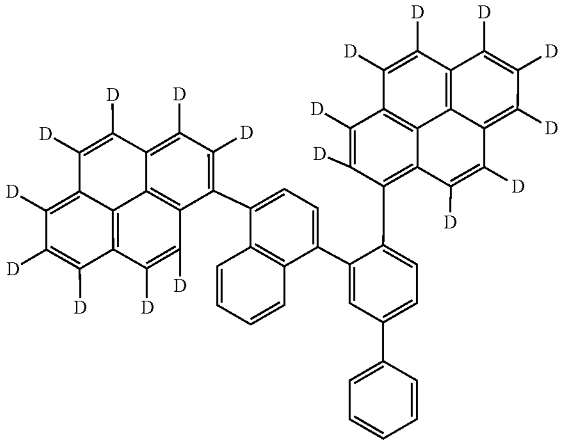
-continued
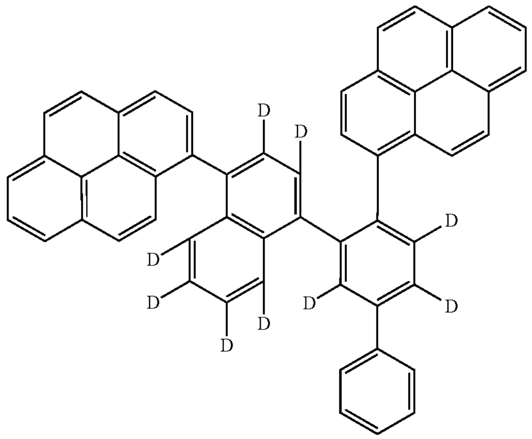
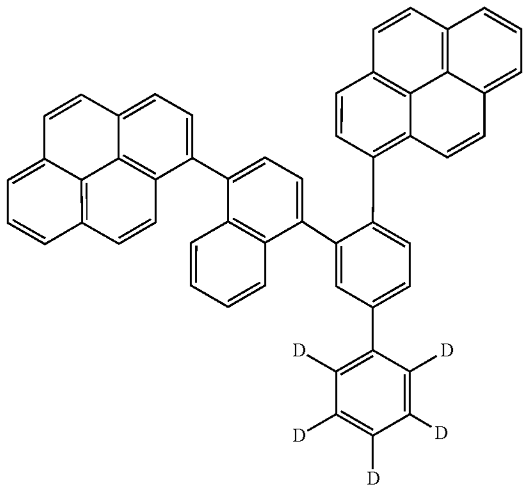
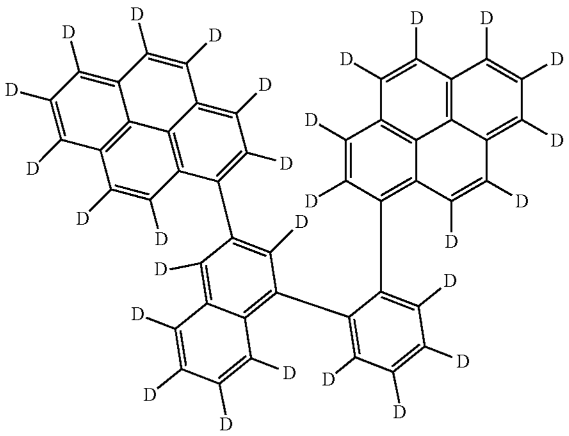

-continued
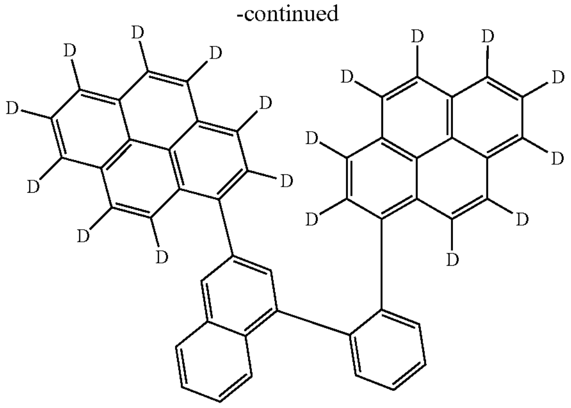
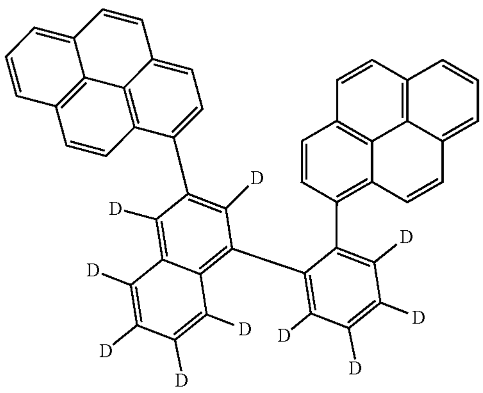
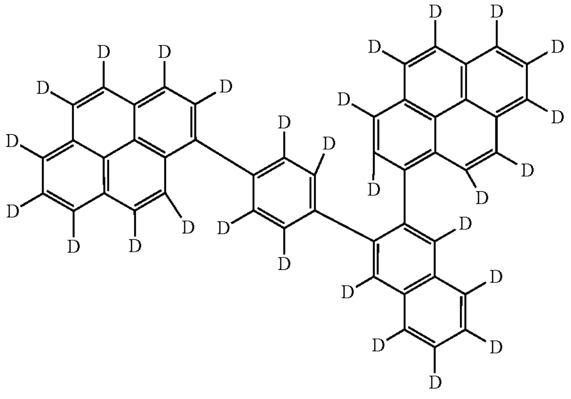
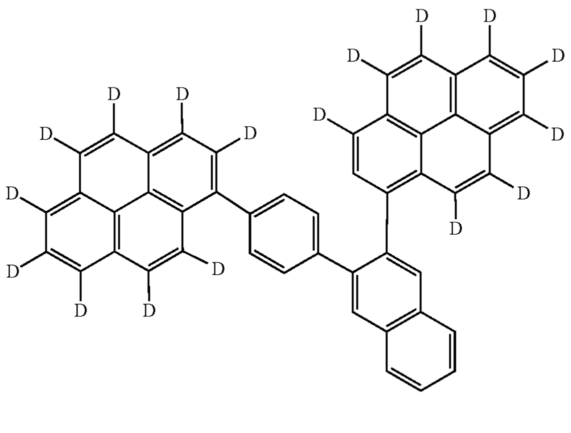
-continued
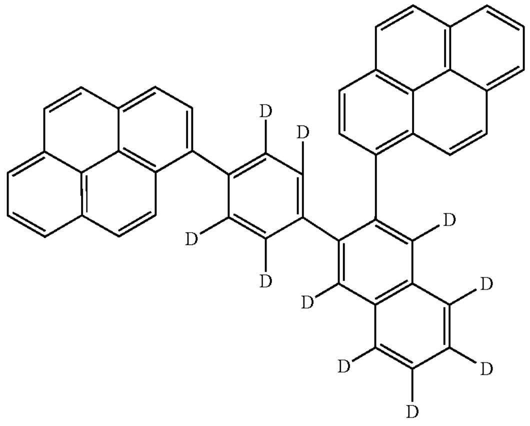
[Formula 114]
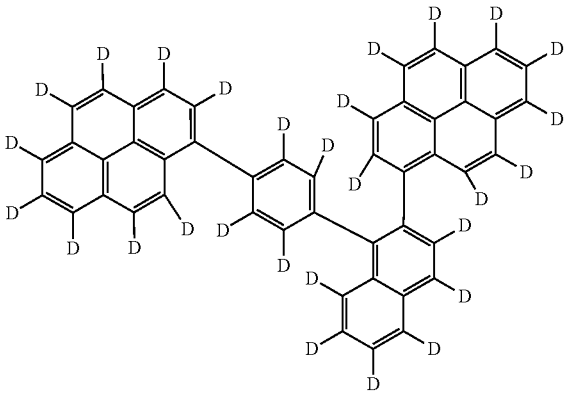
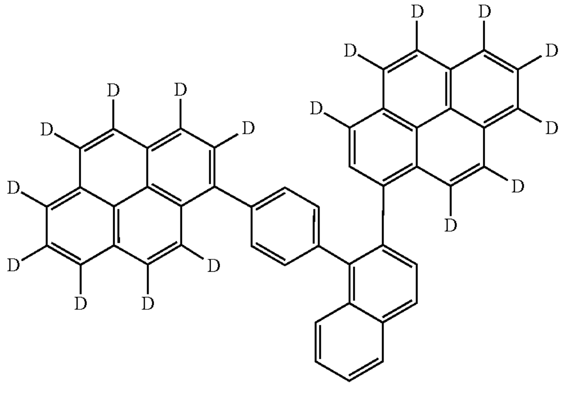
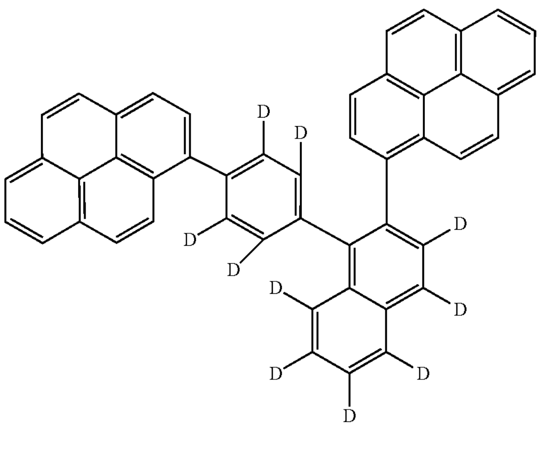

-continued
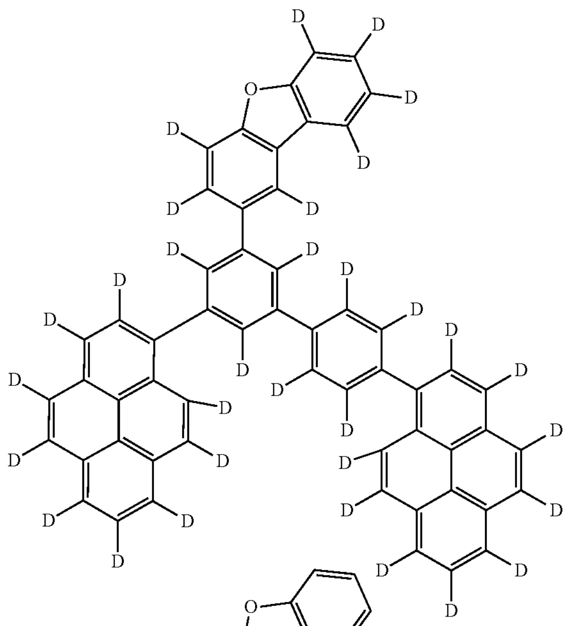
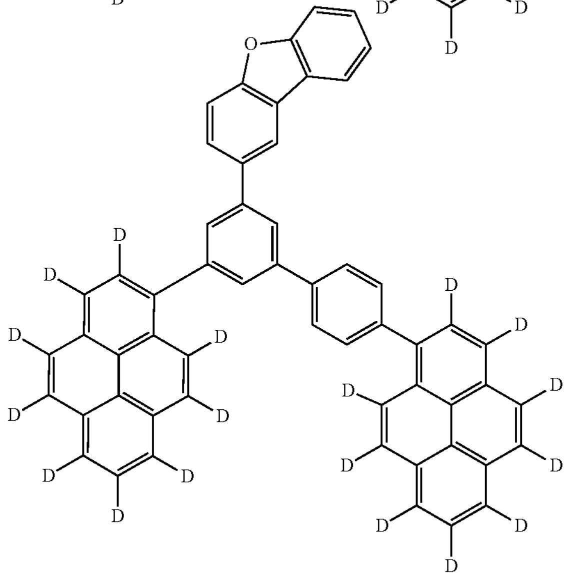
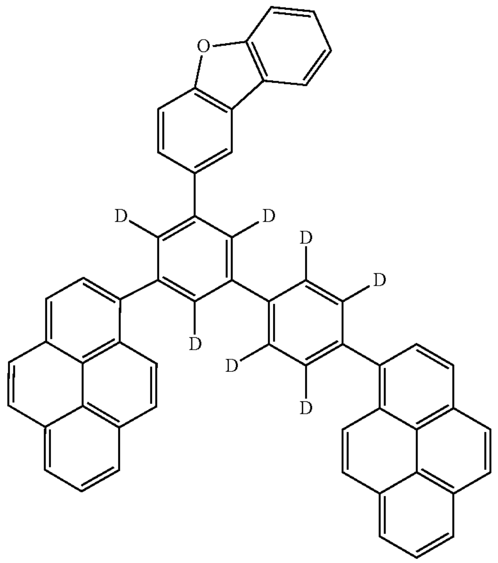
-continued
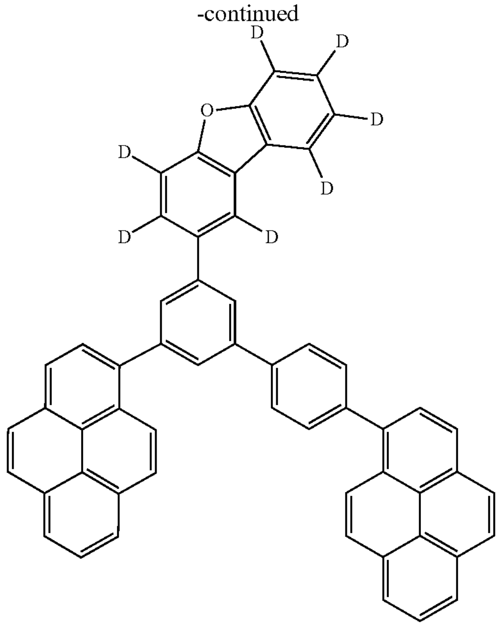
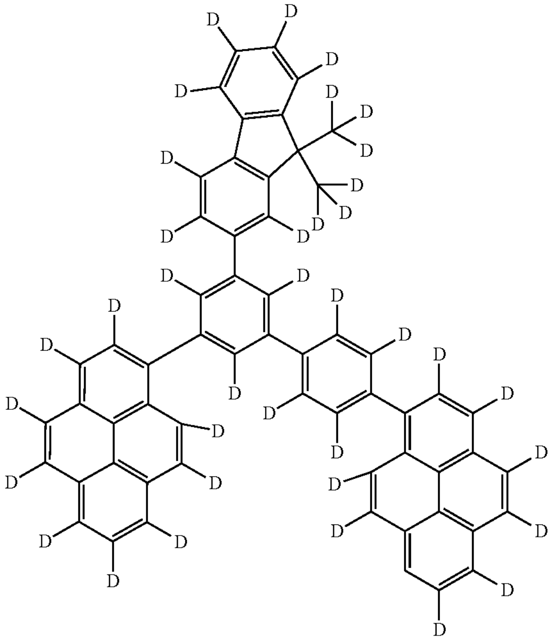

[Formula 115]
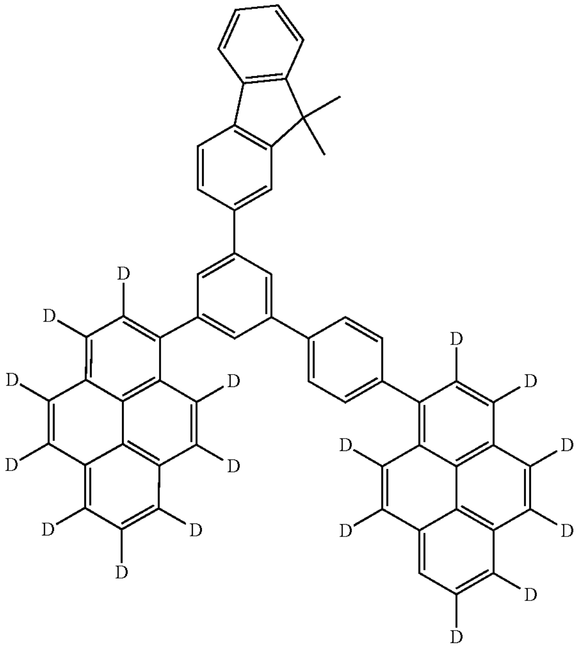
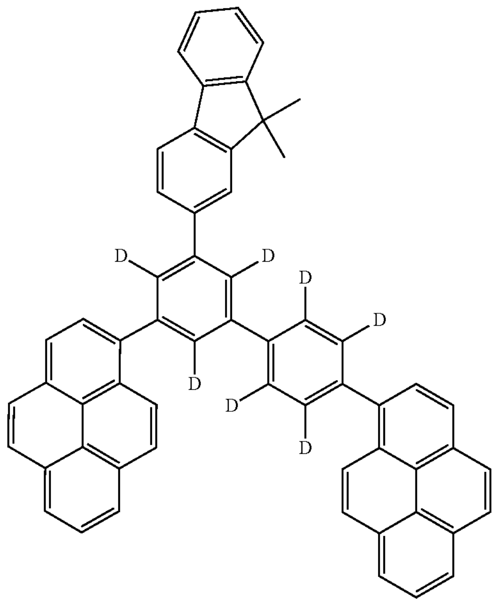
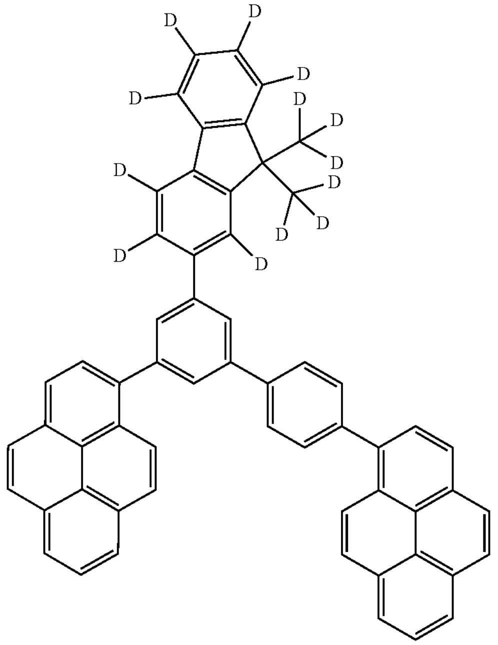
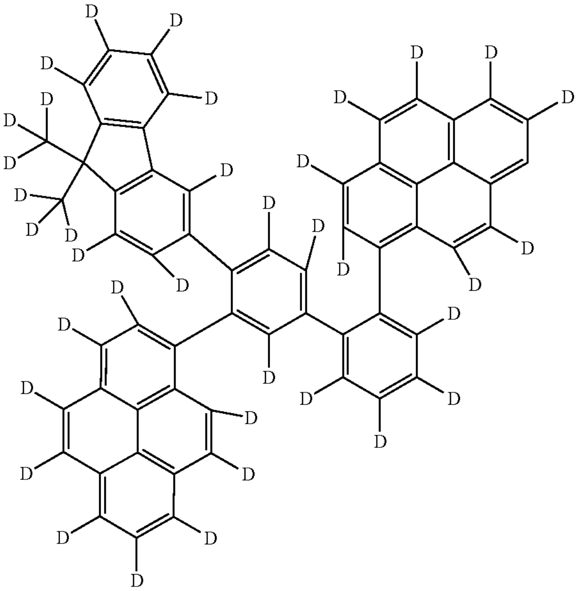

-continued
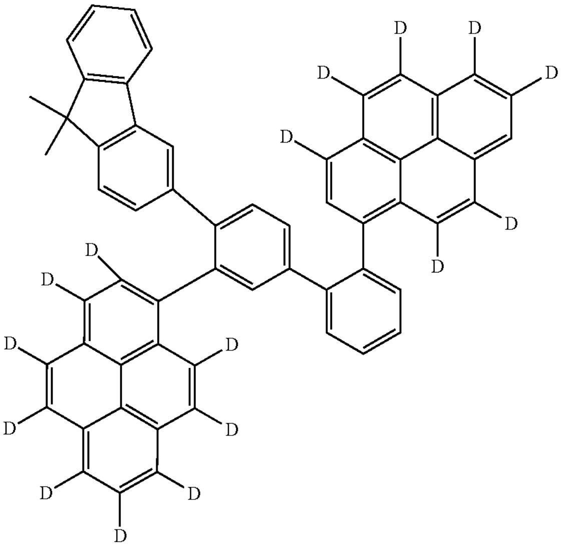
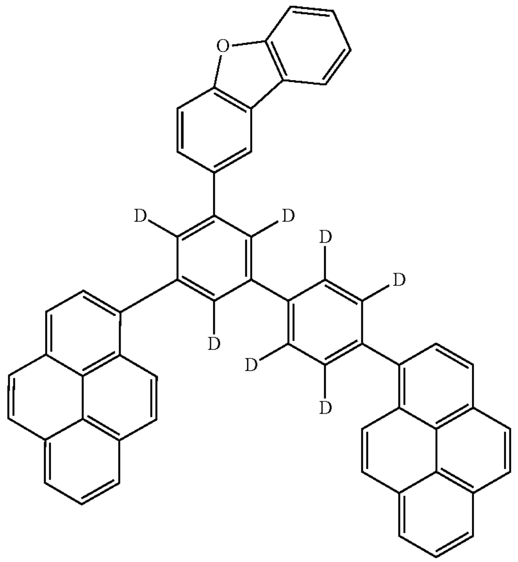
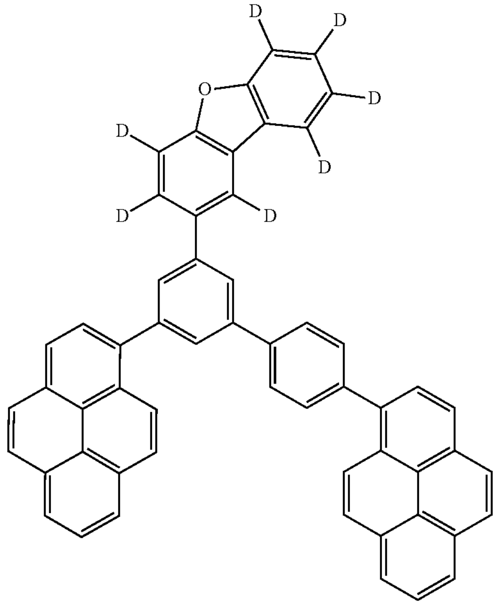
-continued
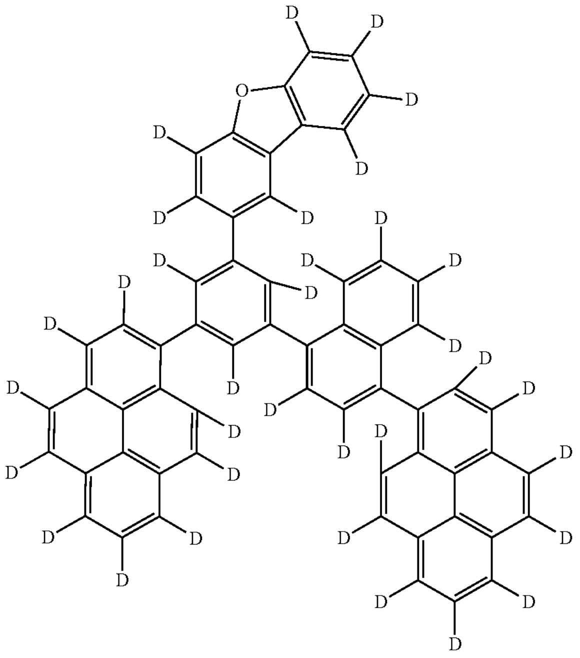
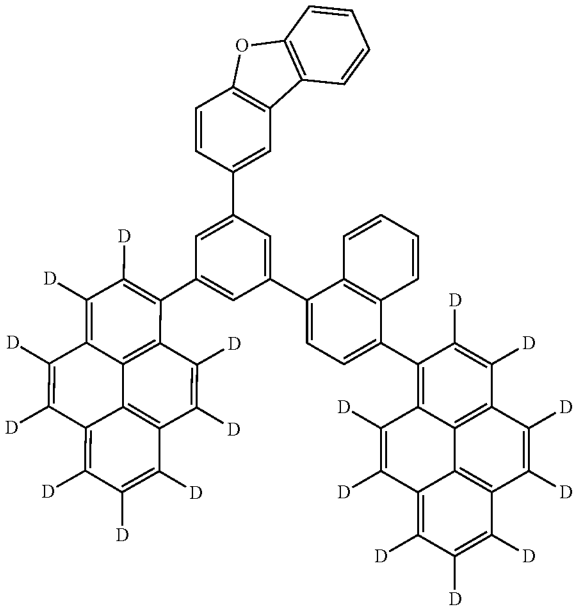

-continued
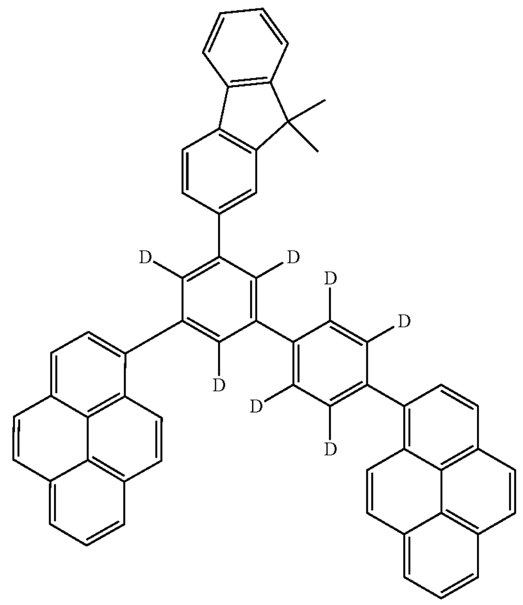
-continued
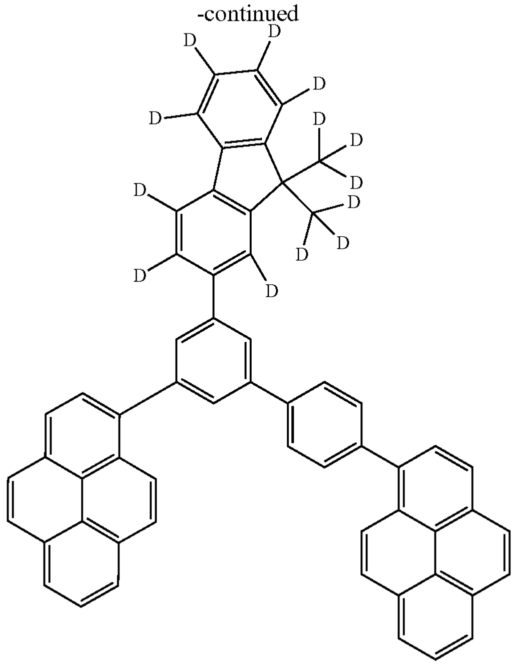
[Formula 116]
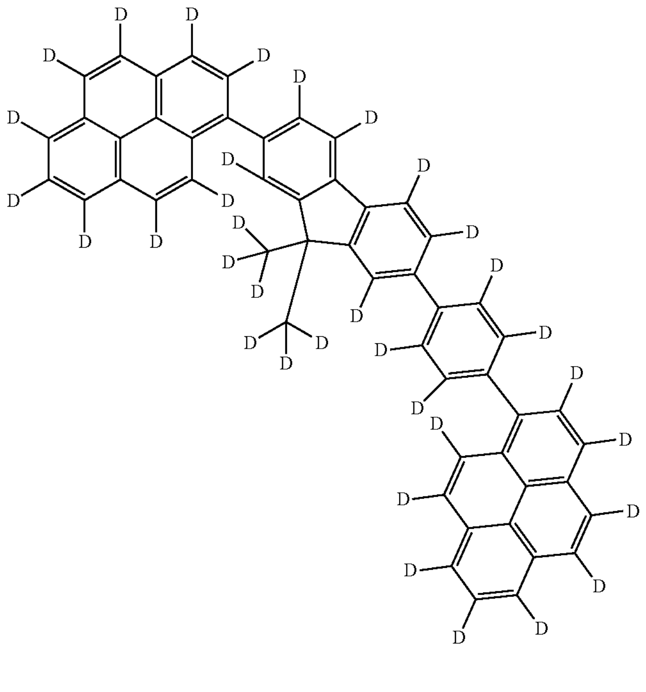

-continued
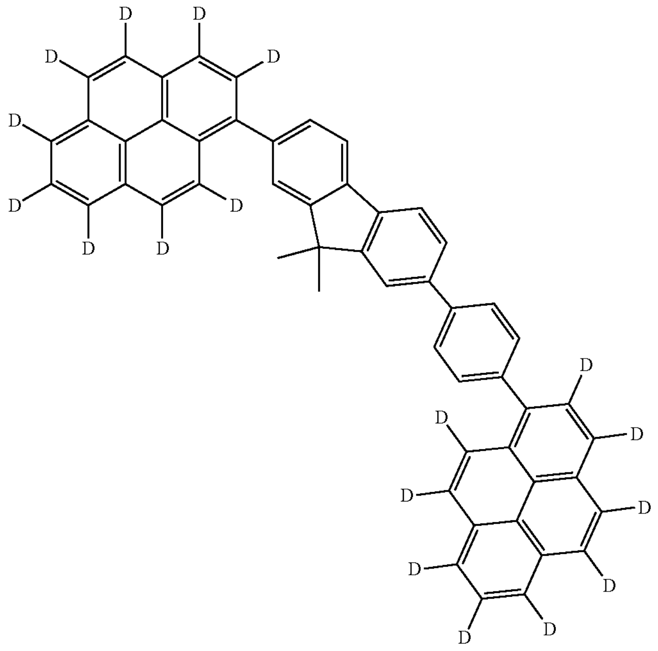
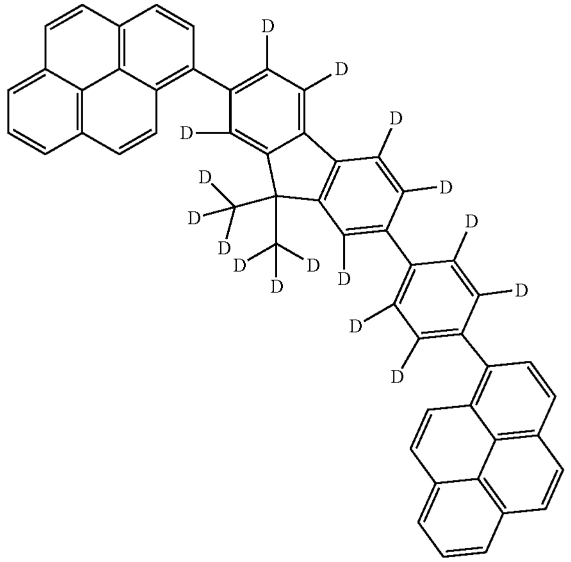
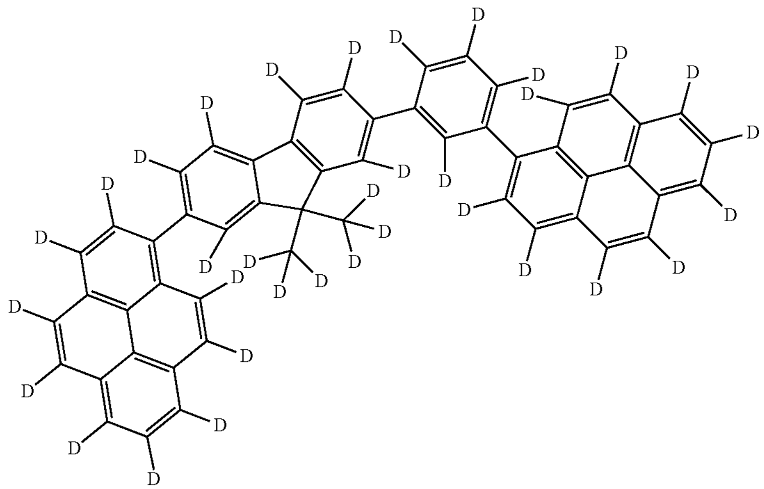

-continued
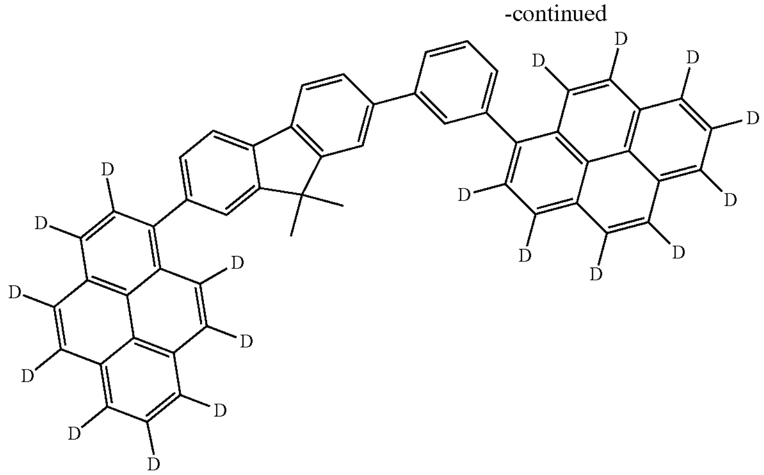
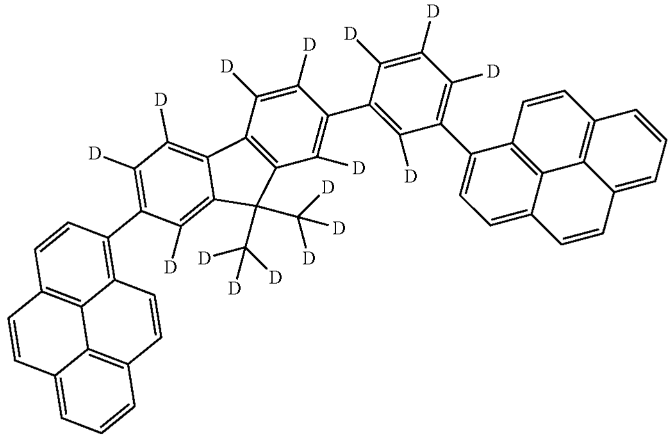
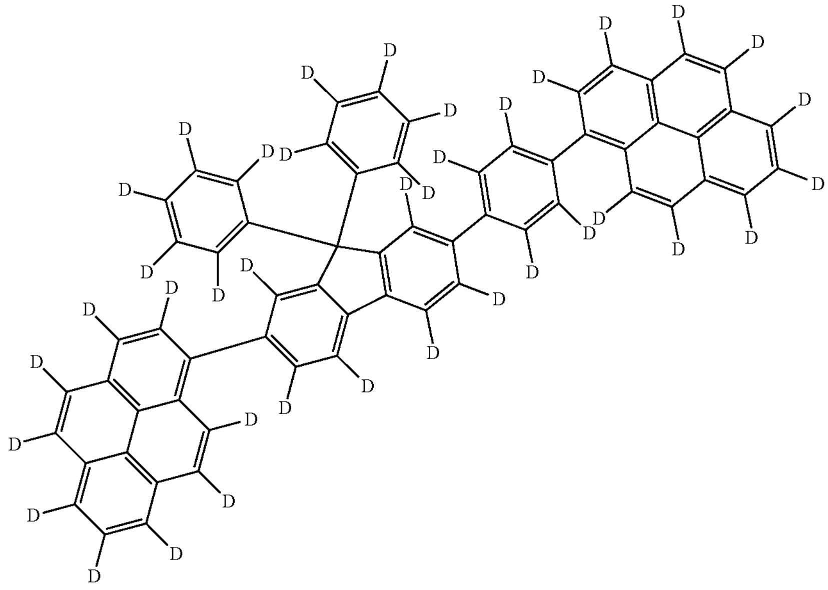

-continued
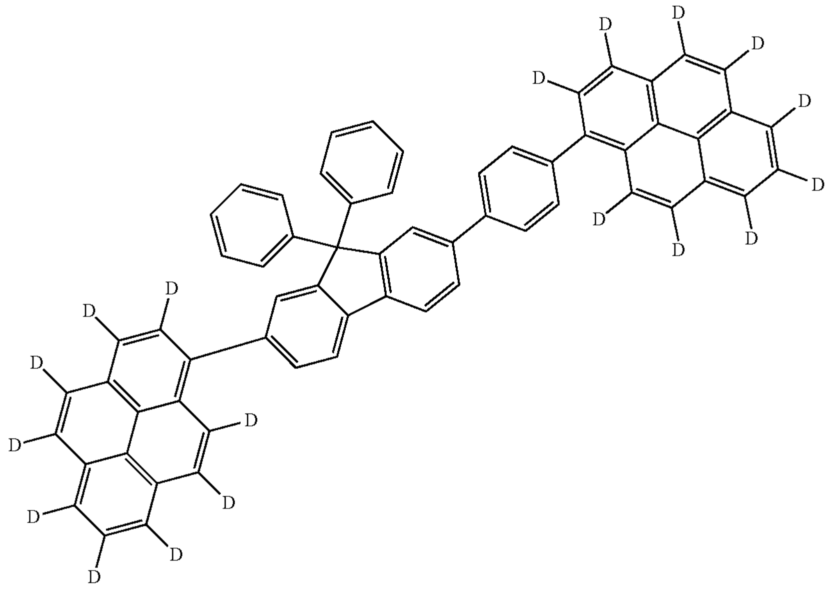
[Formula 117]
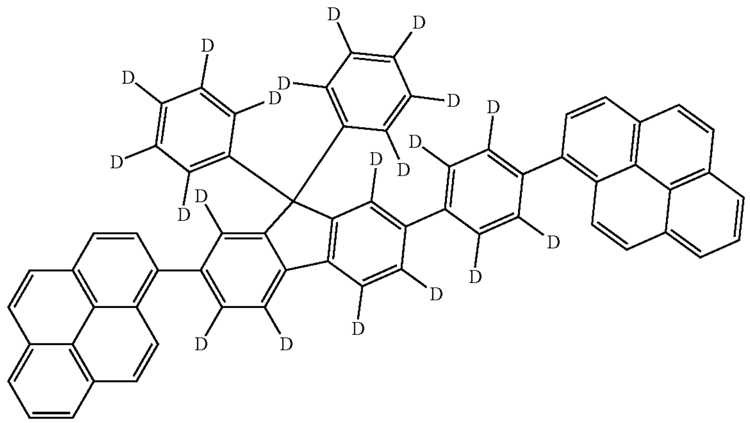
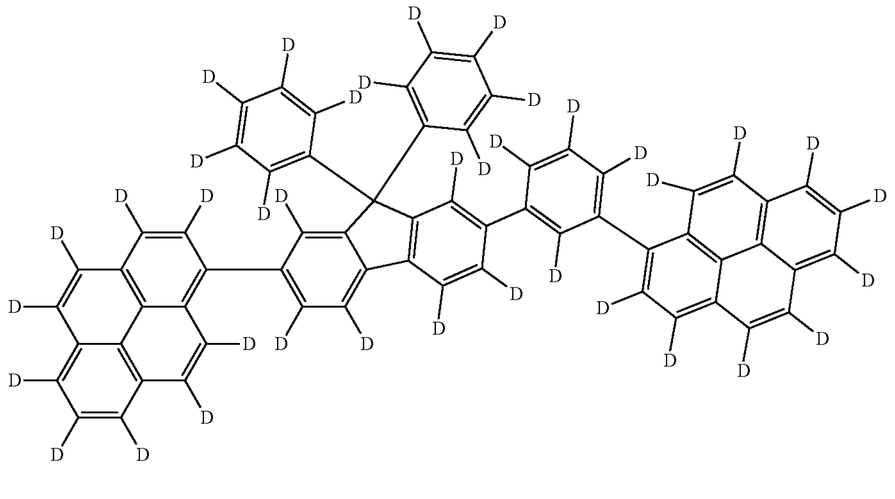

-continued
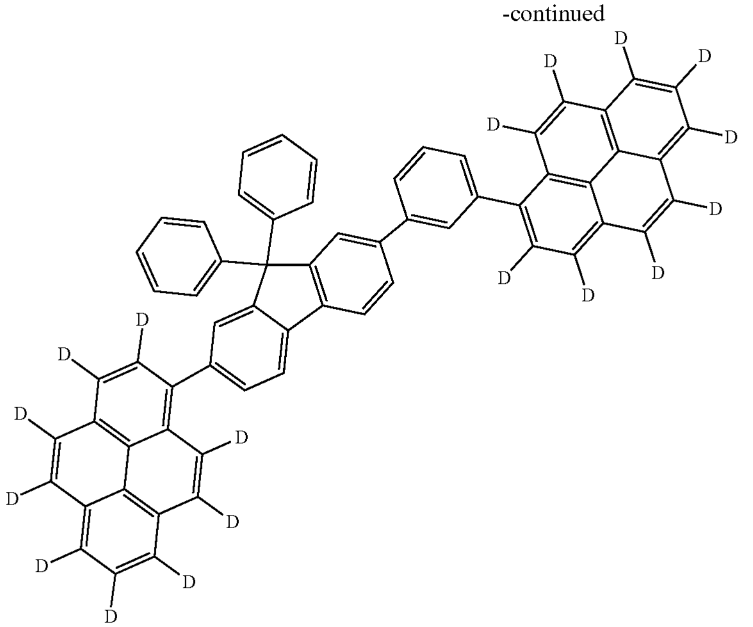
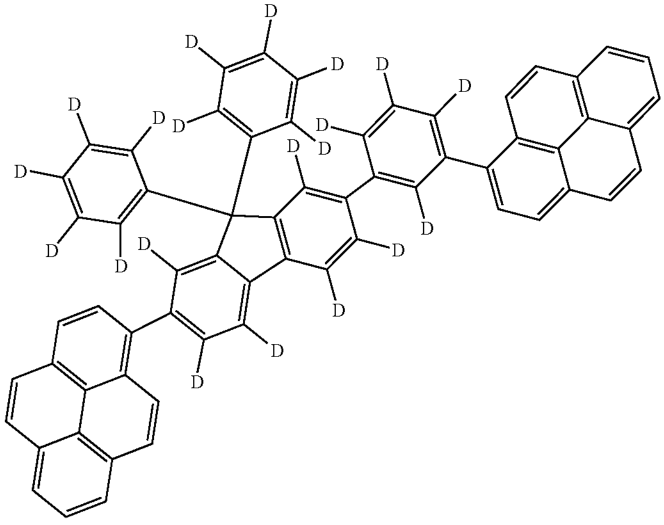
[Formula 118]
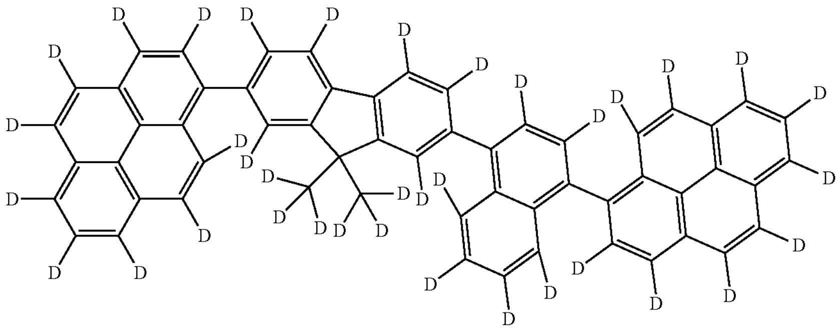

-continued
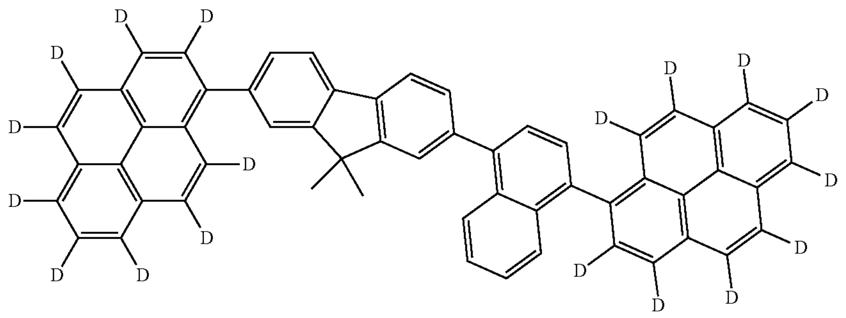
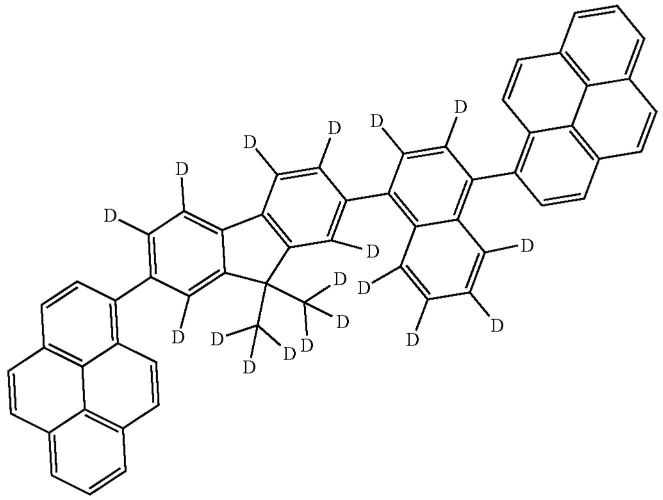
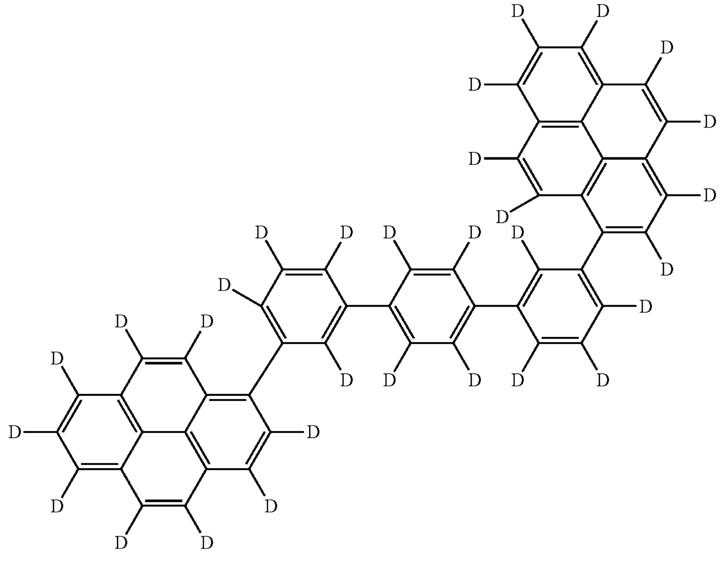

-continued
[Formula 119]
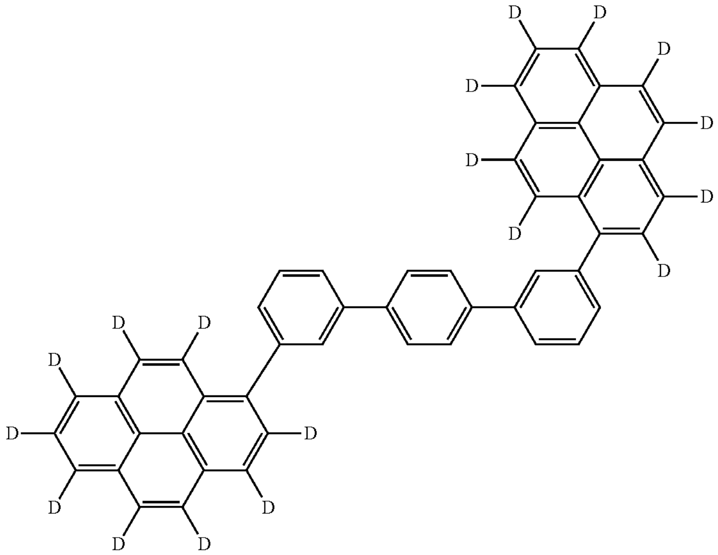
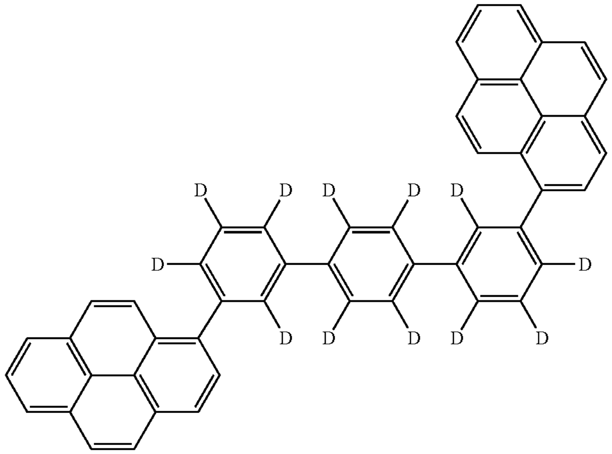
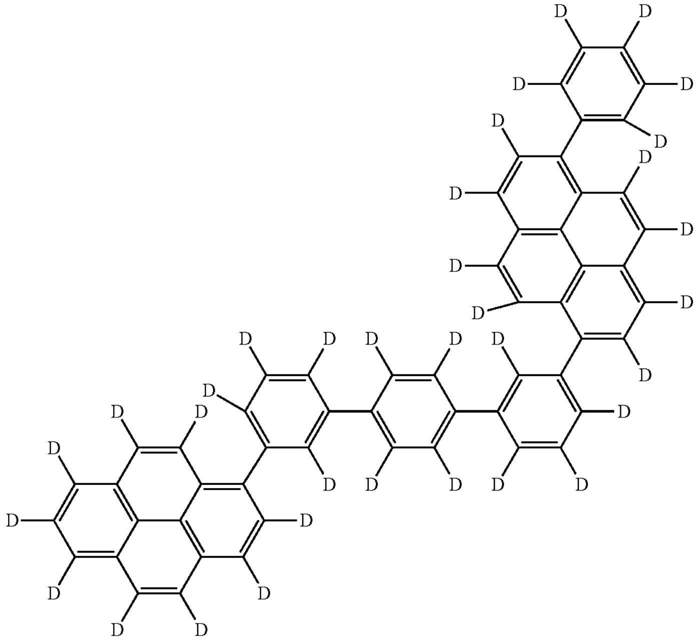

-continued
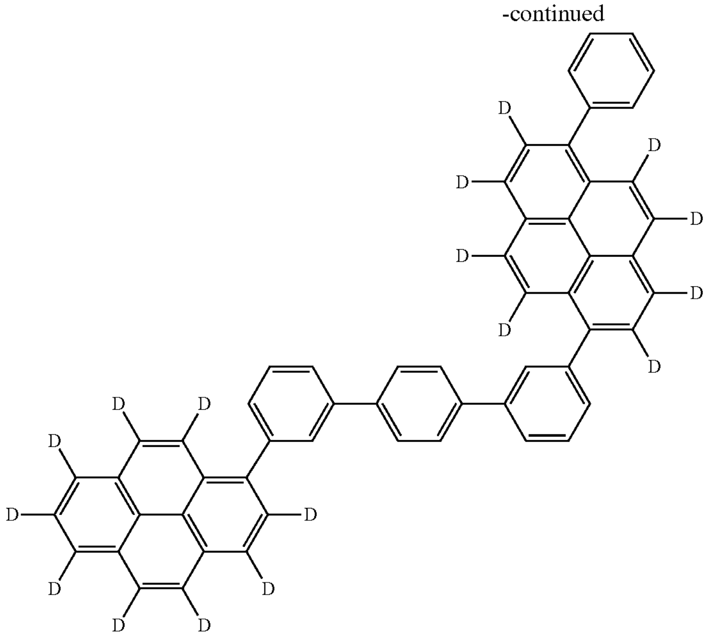
[Formula 120]
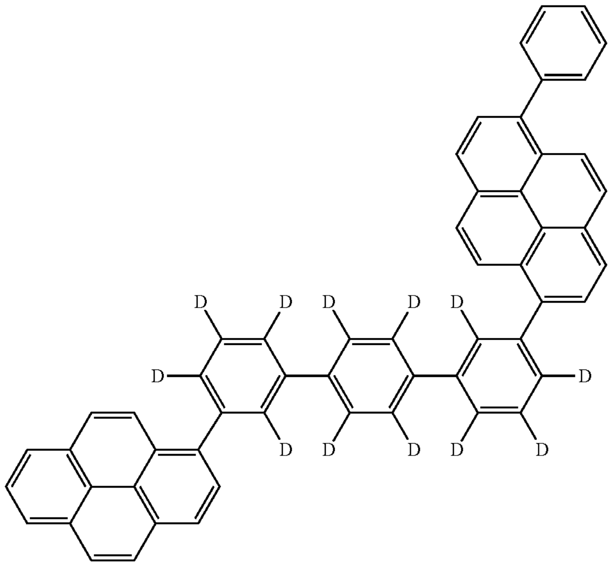

-continued
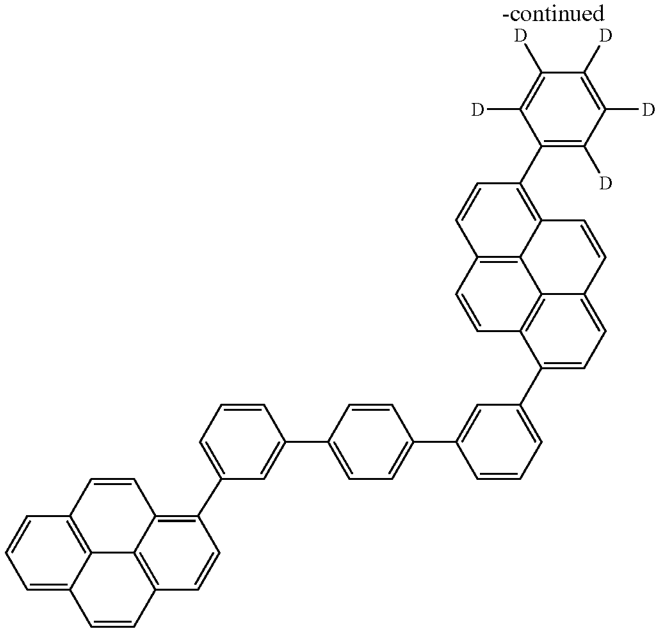
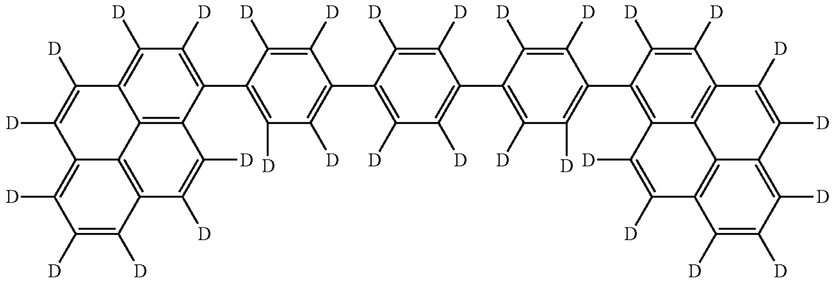
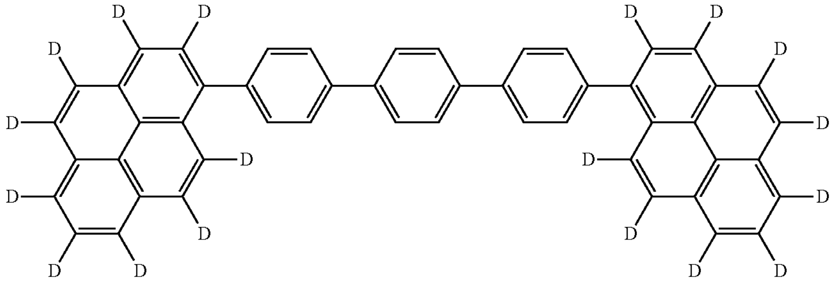
[Formula 121]
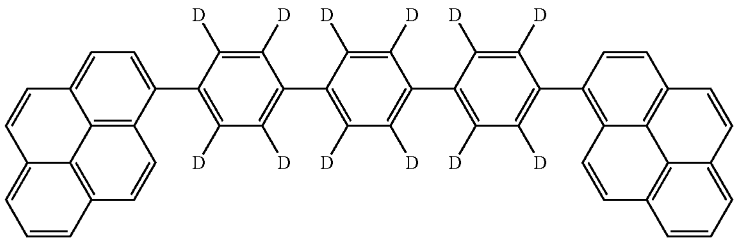

-continued
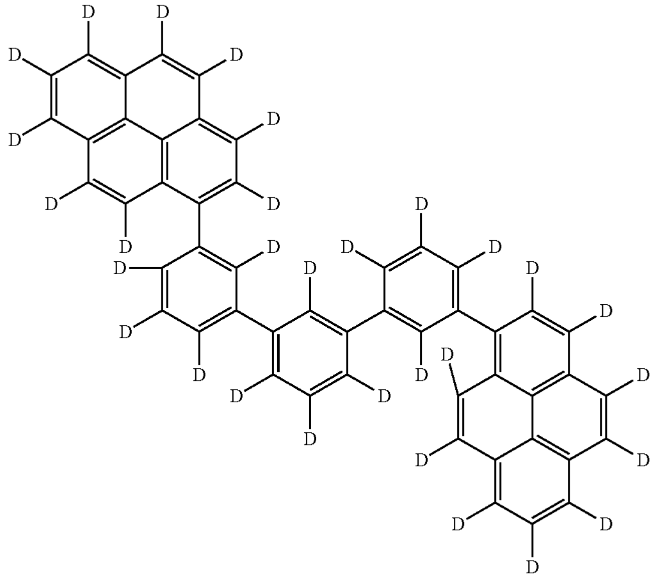
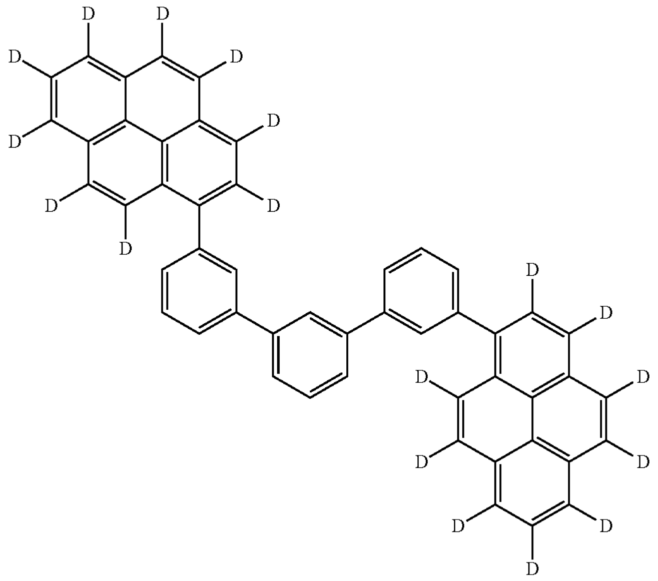
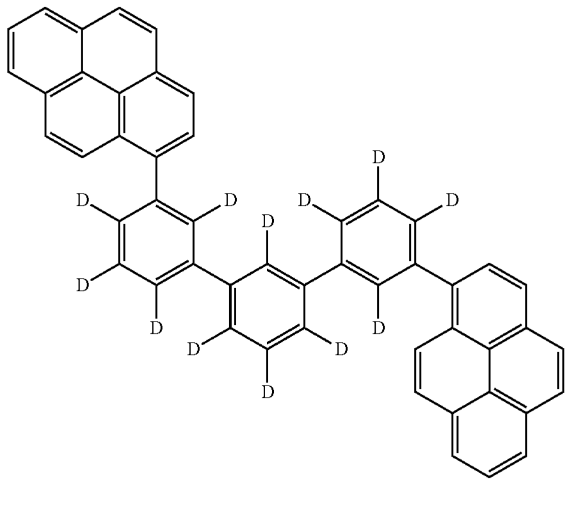

-continued
[Formula 122]
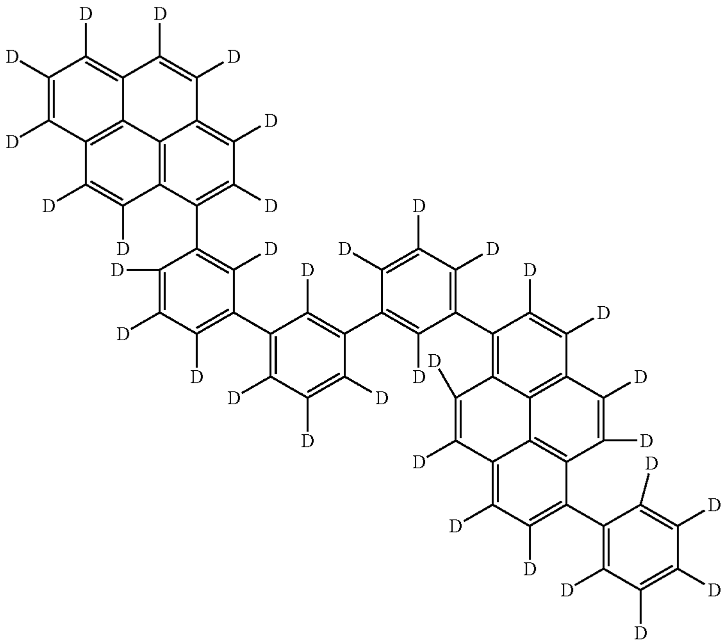
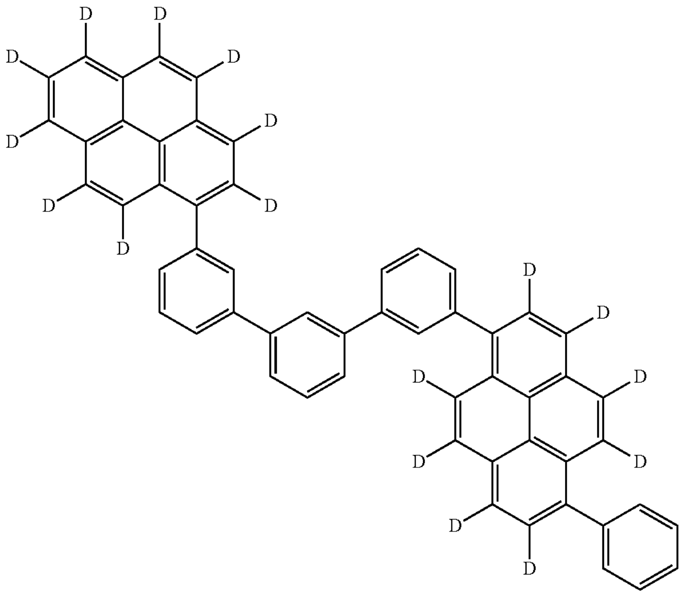

-continued
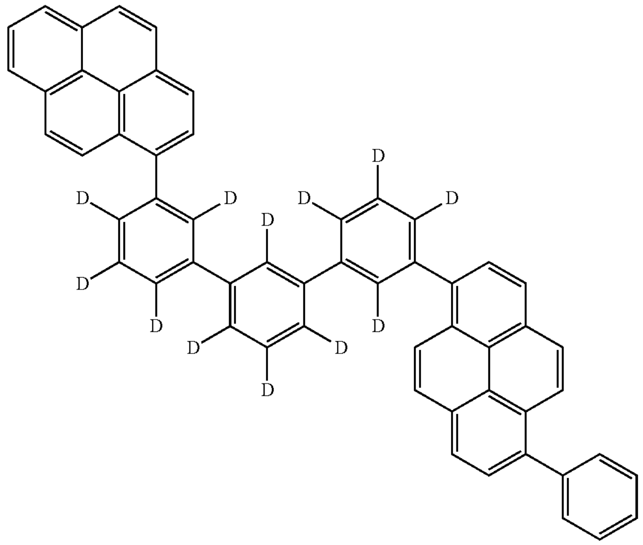
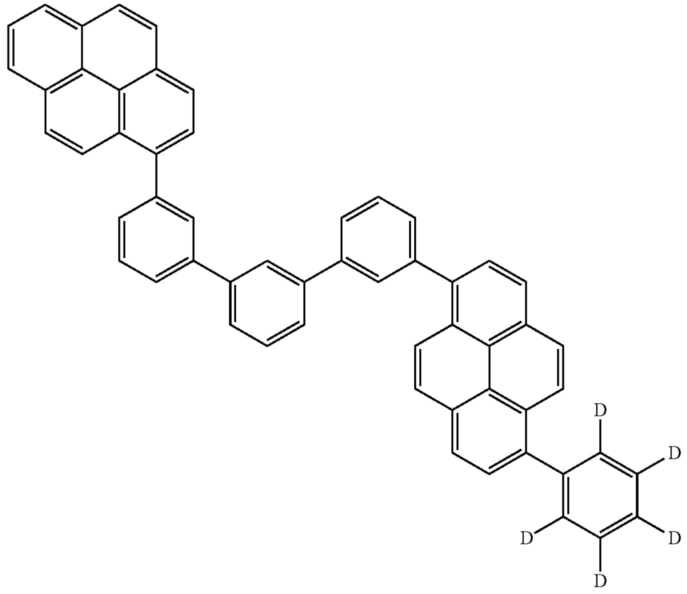
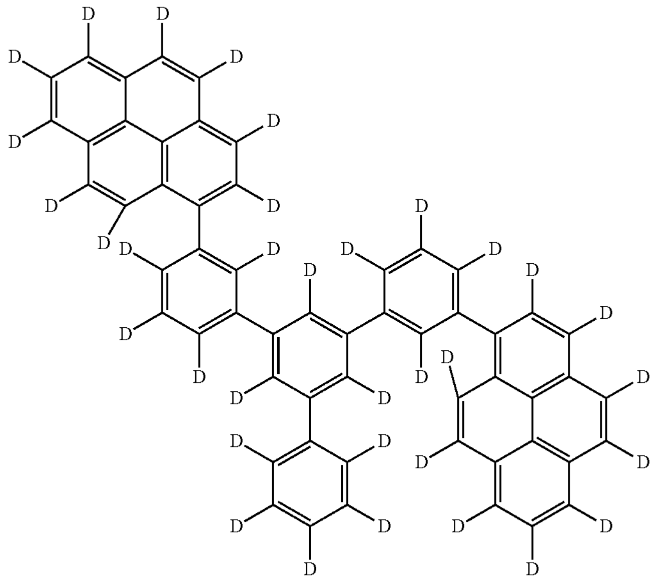

-continued
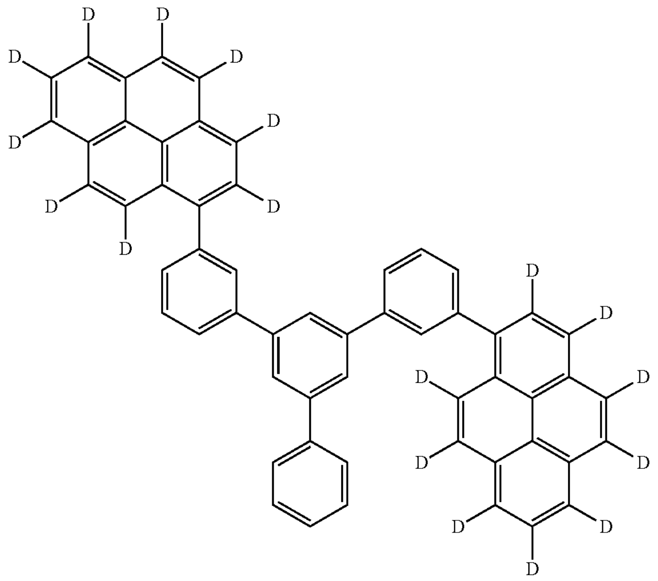
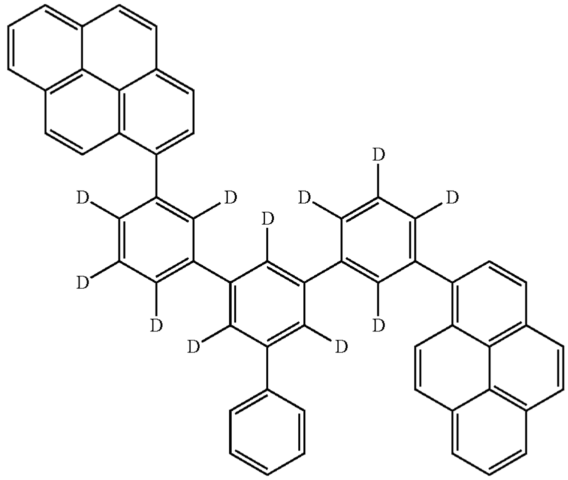
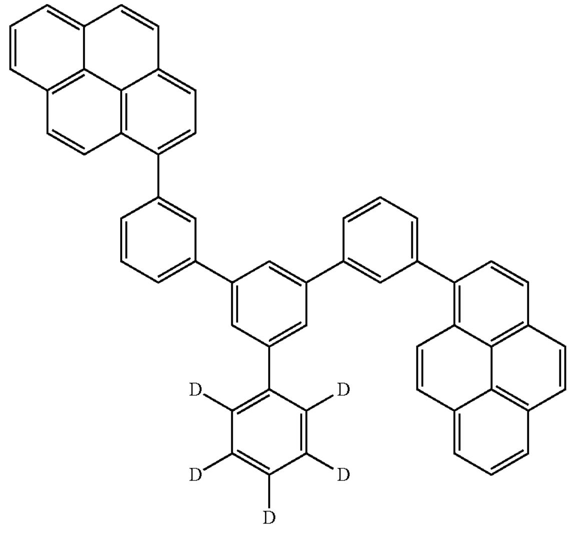

-continued
[Formula 123]
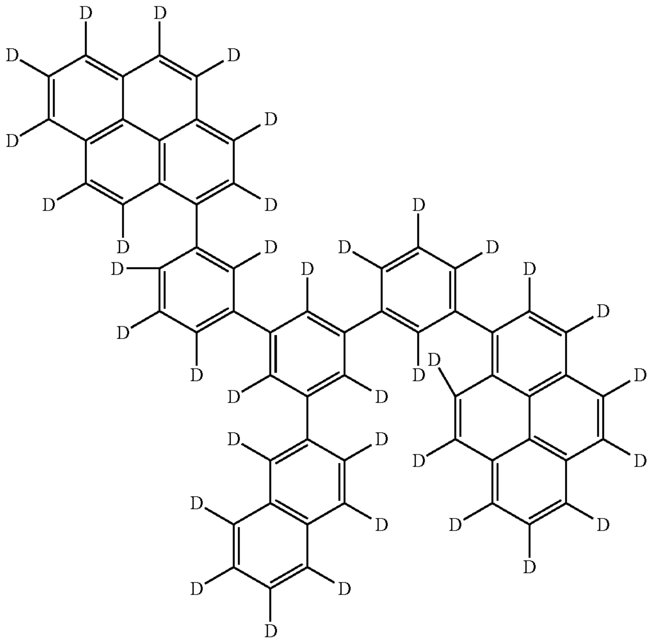
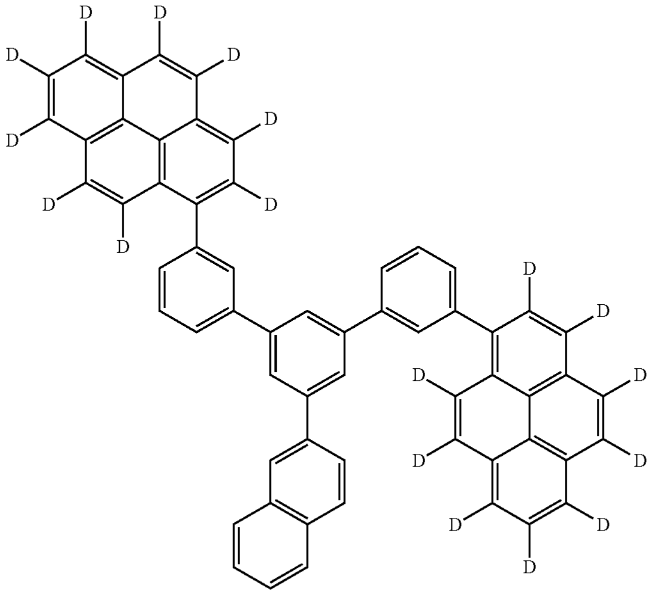

-continued
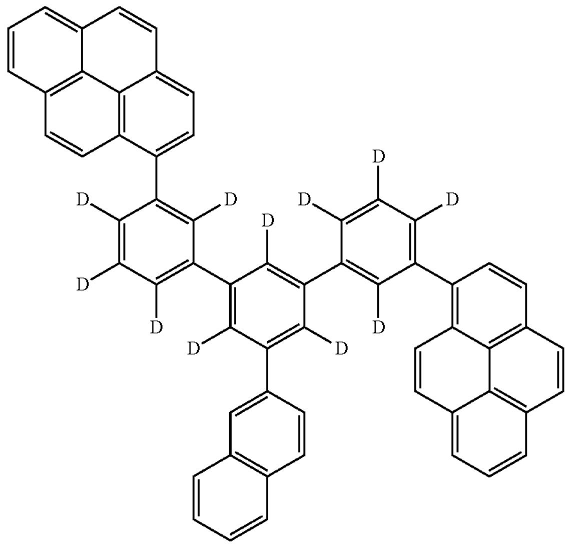
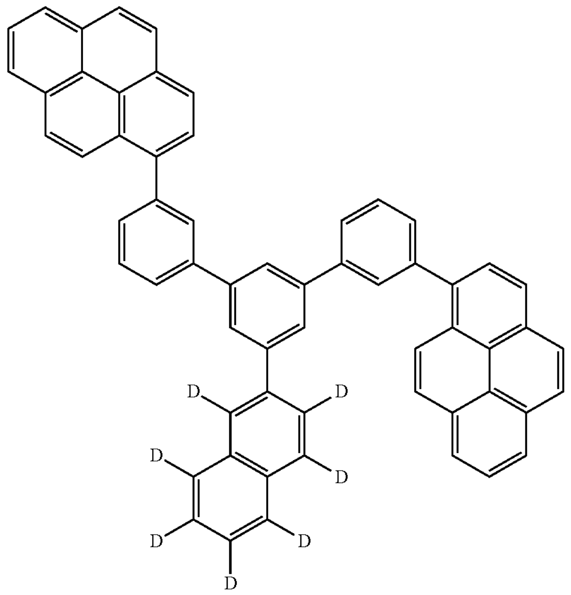
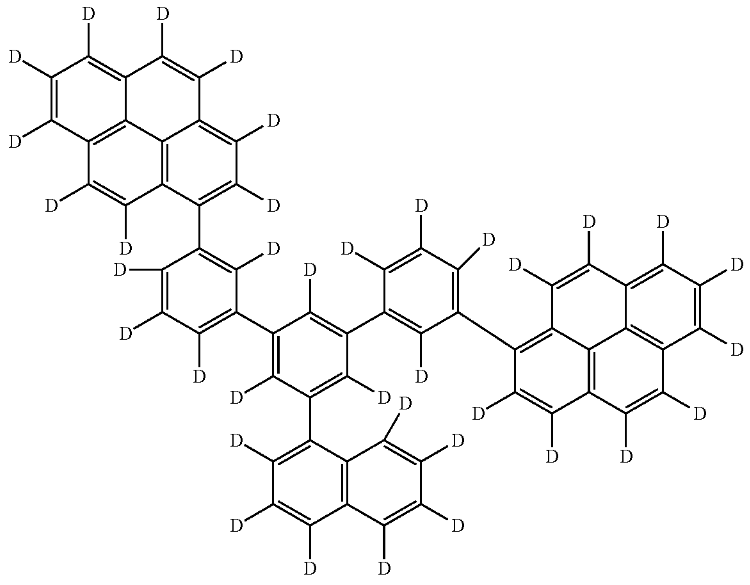

-continued
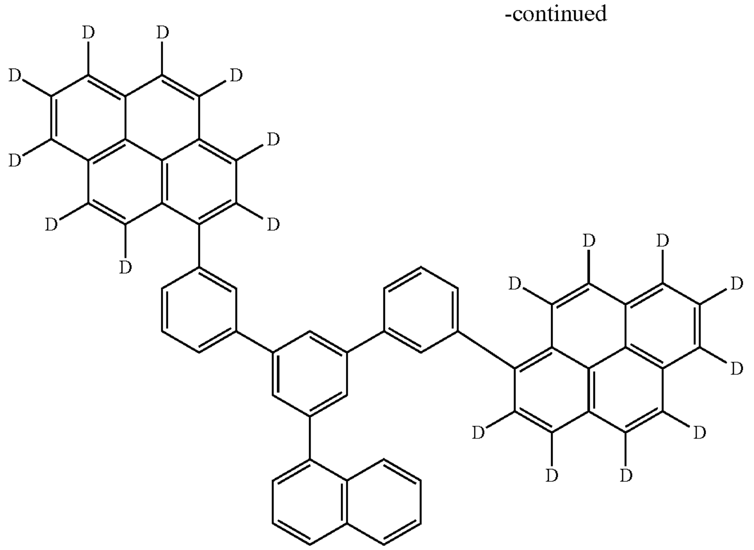
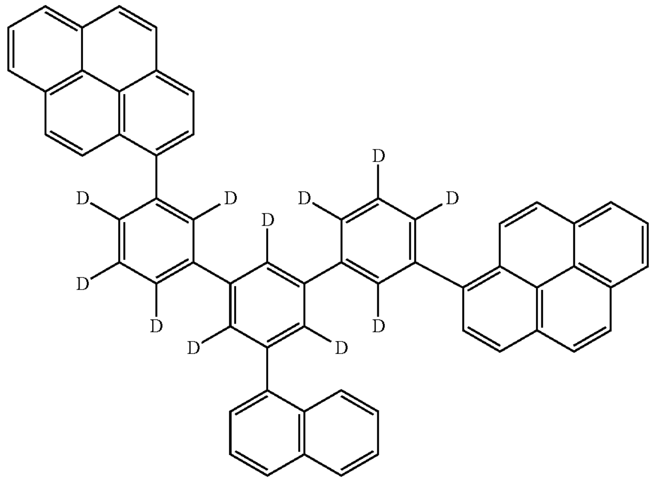
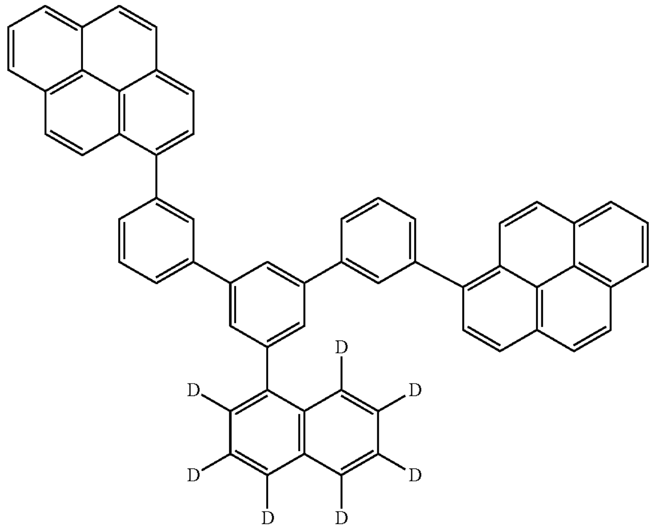

-continued
[Formula 124]
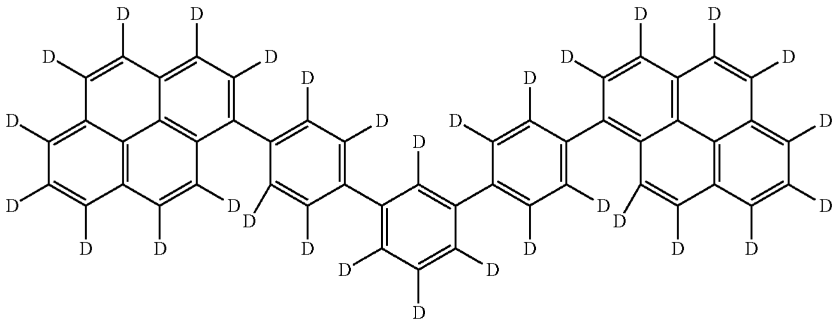
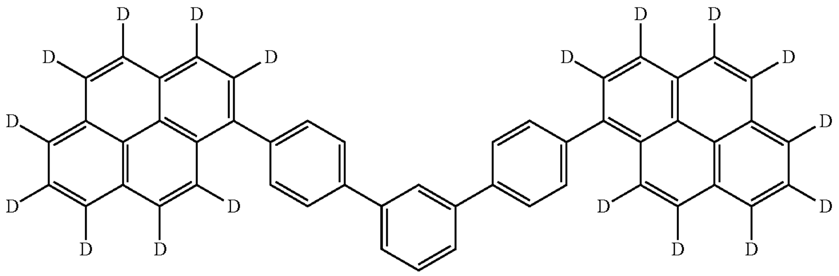
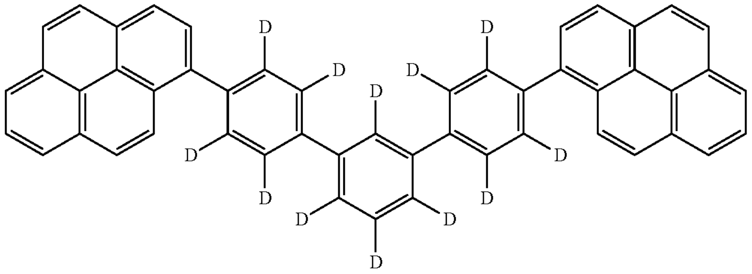
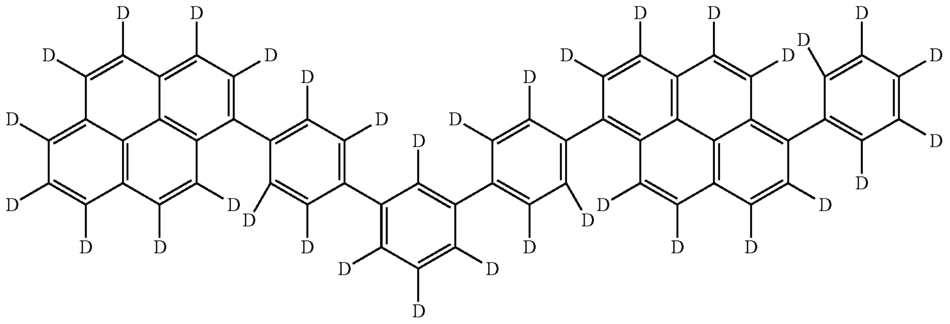
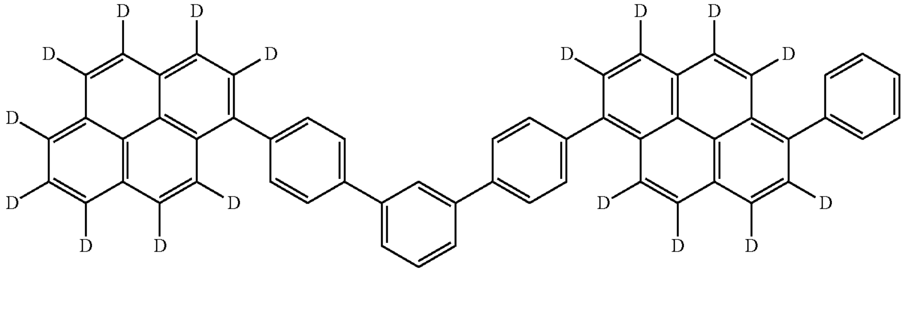

-continued
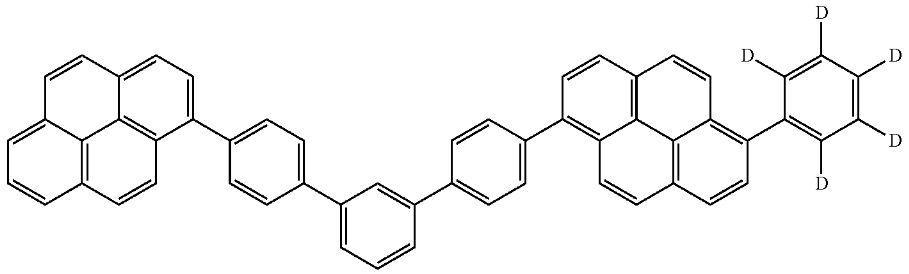
[Formula 125]
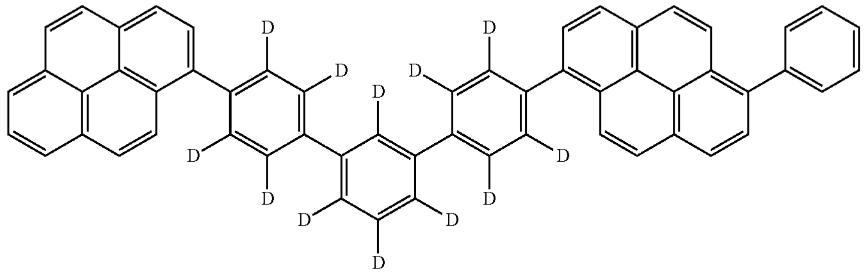
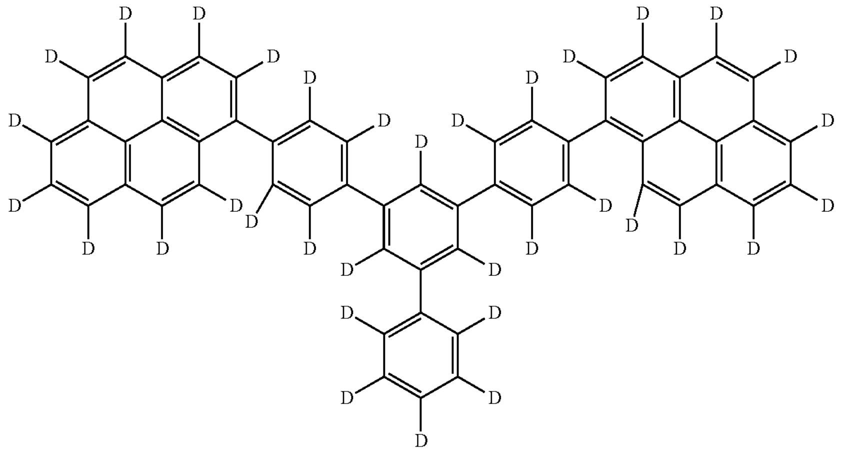
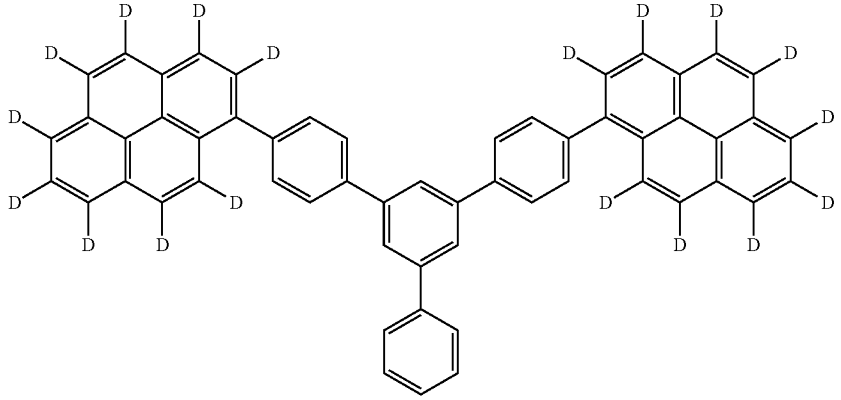

-continued
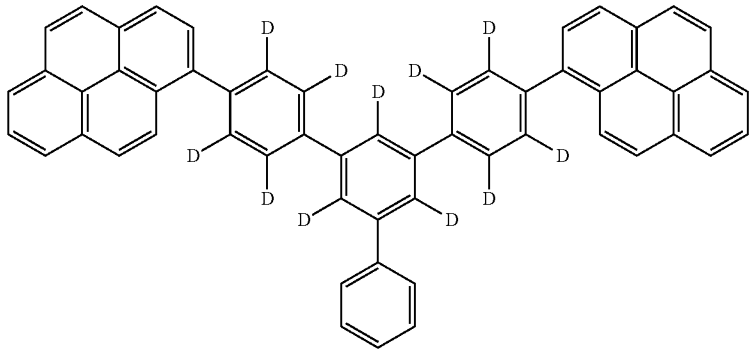
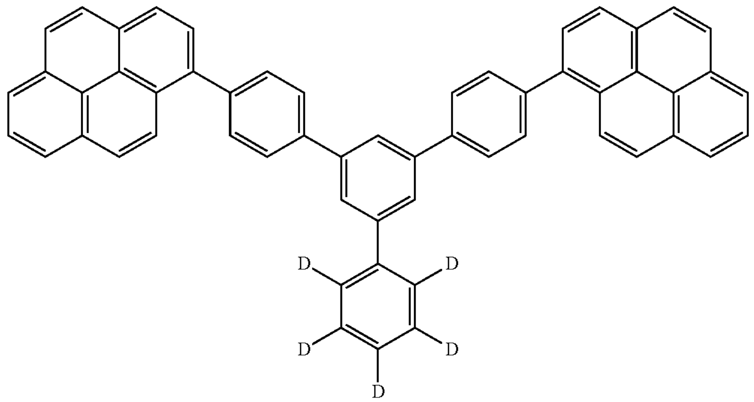
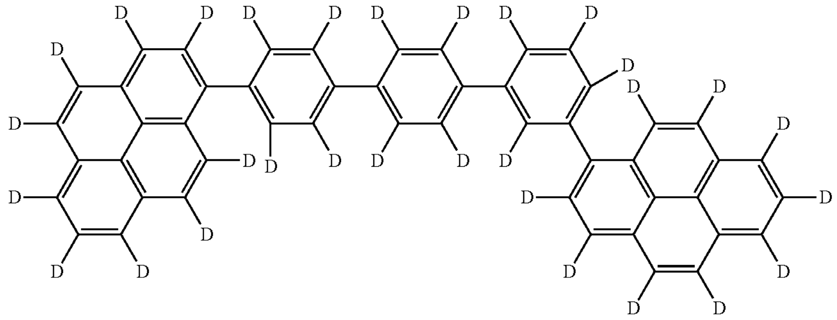
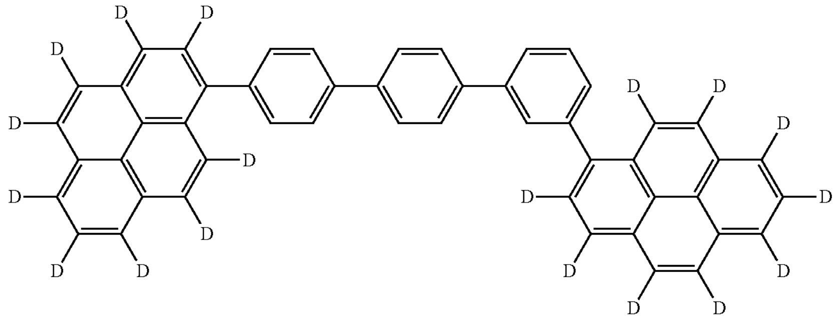
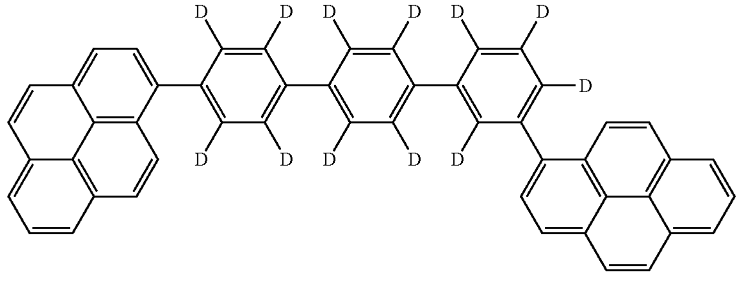

-continued
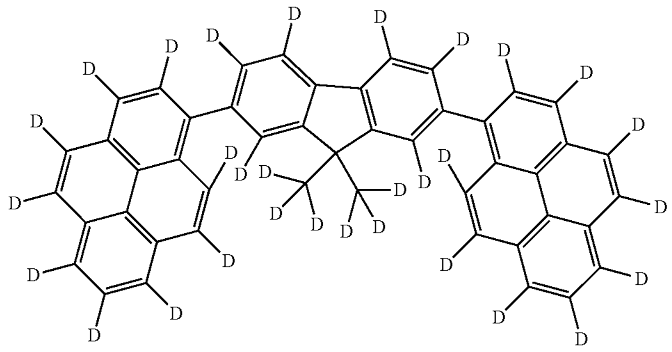
[Formula 126]
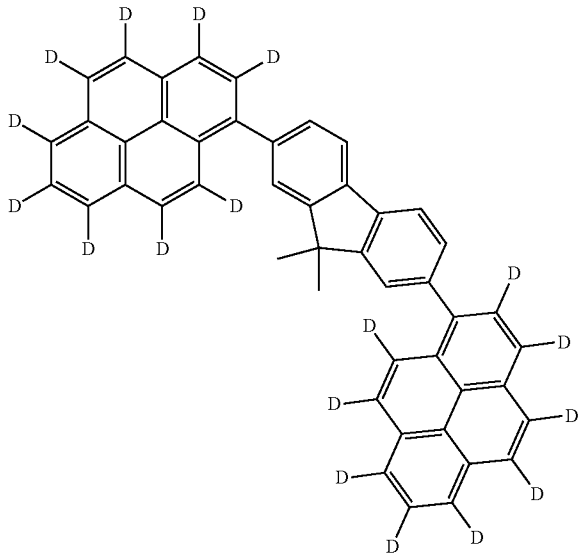
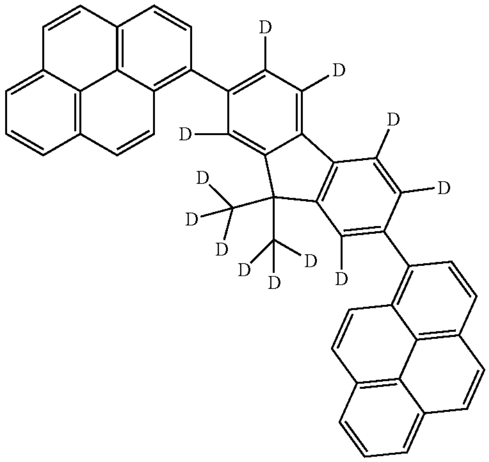
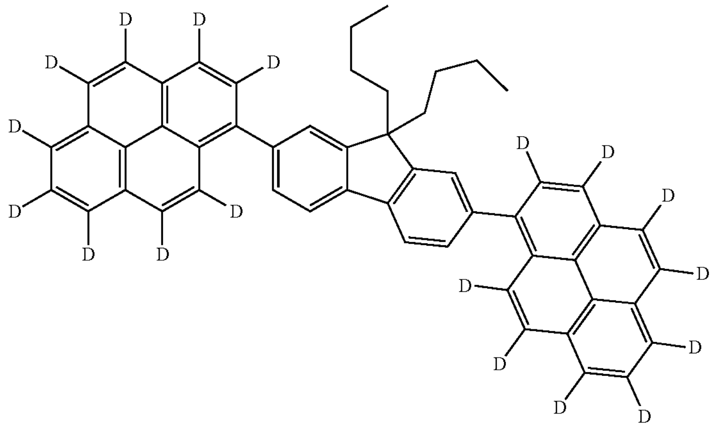

-continued
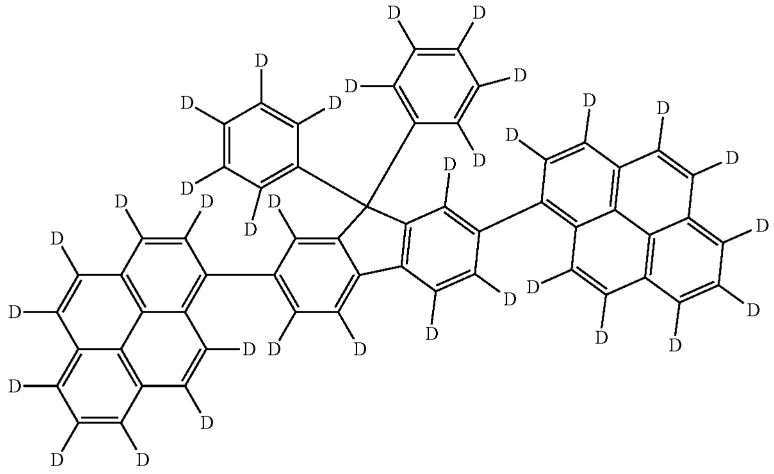
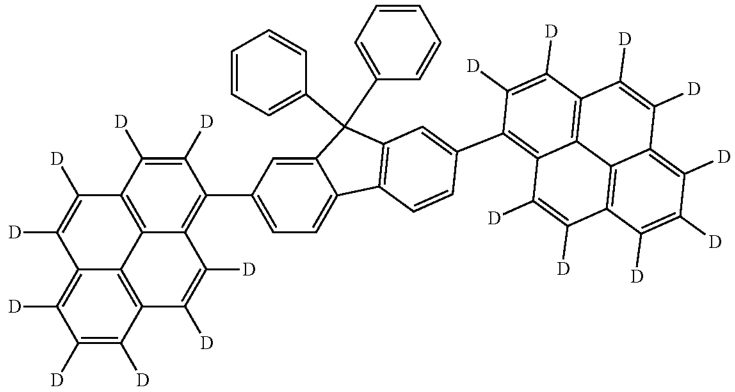
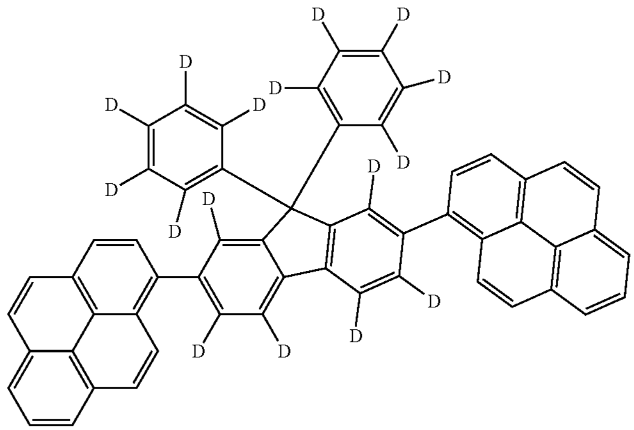

-continued
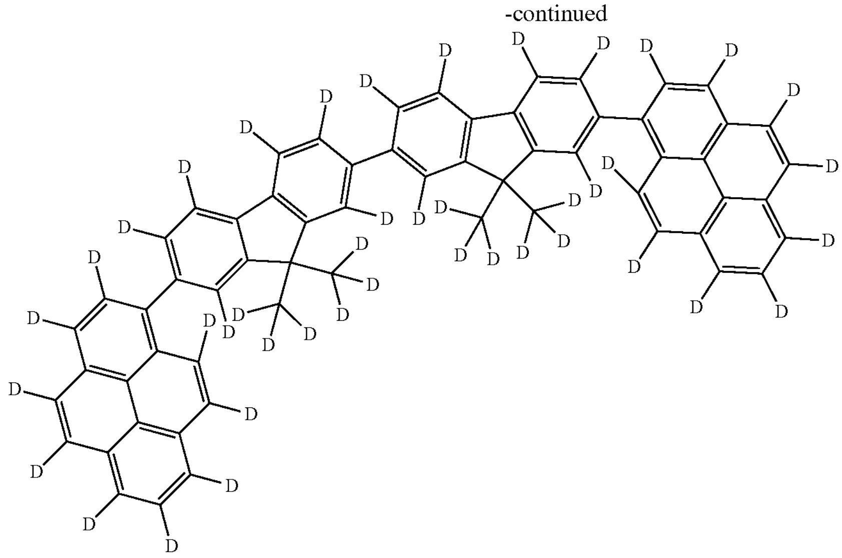
[Formula 127]
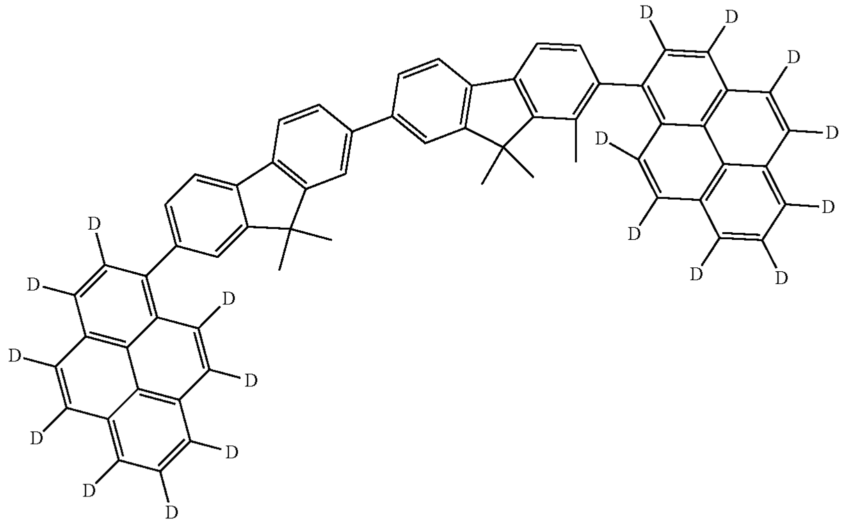
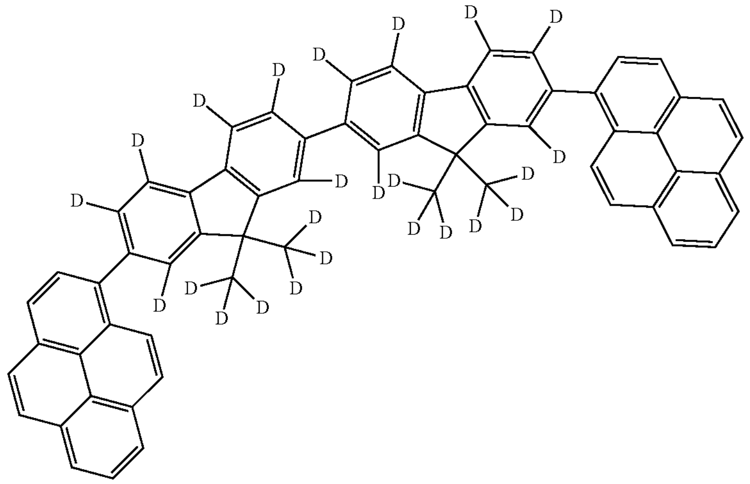

-continued
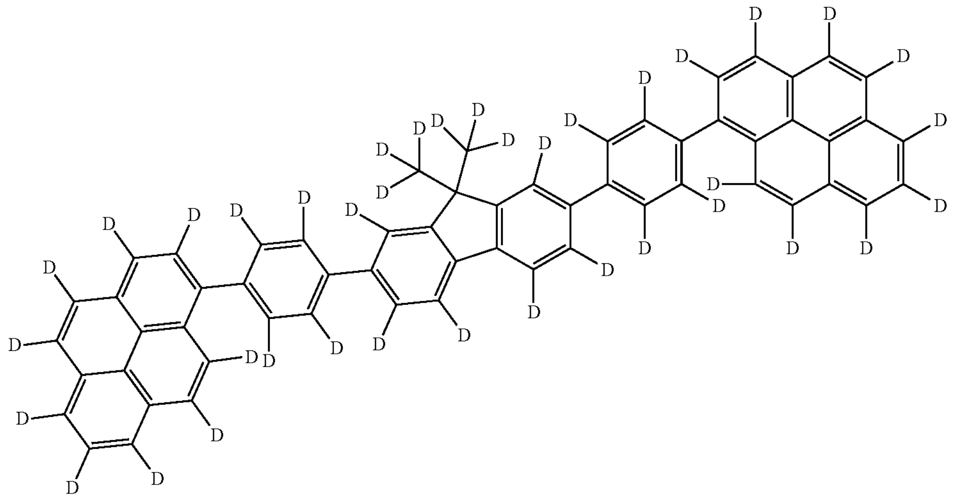
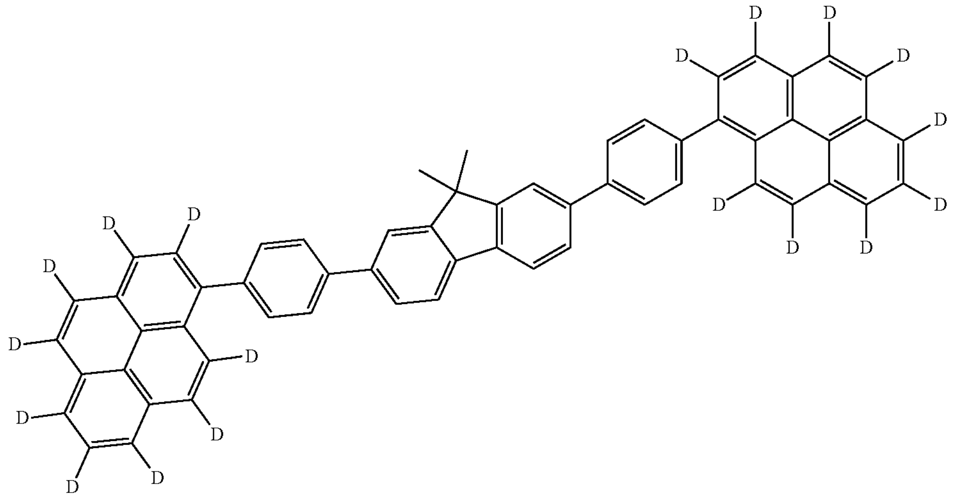
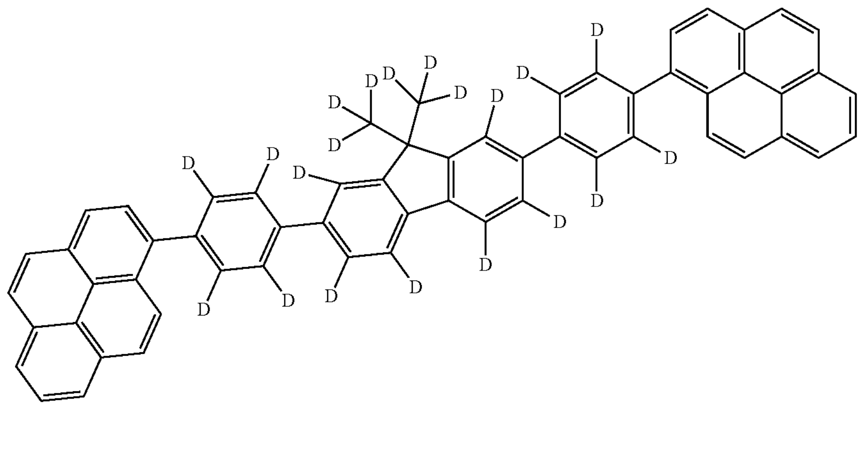

-continued
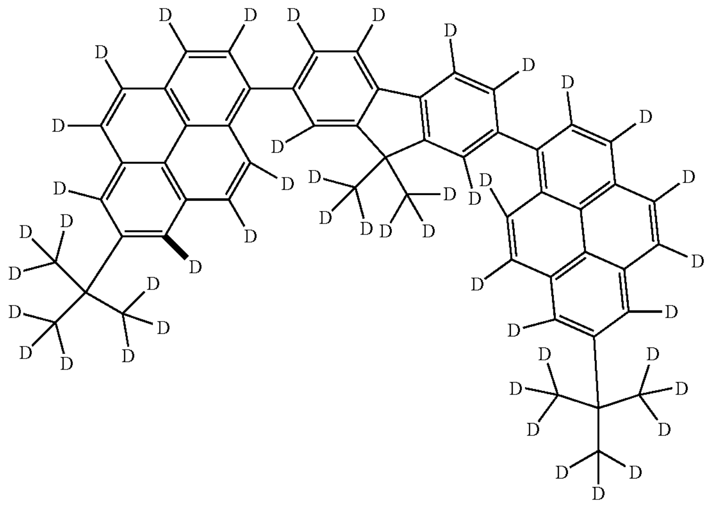
[Formula 128]
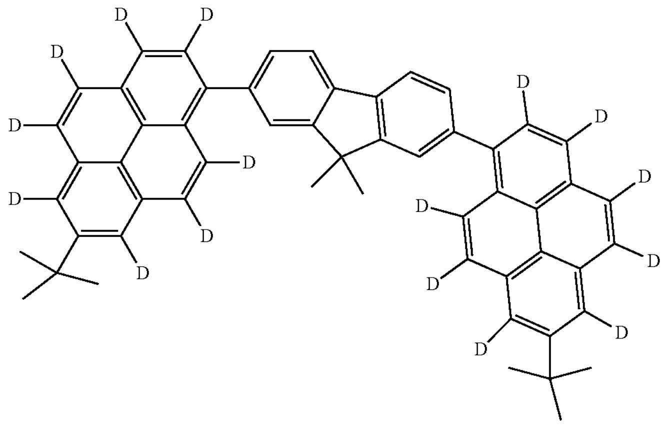
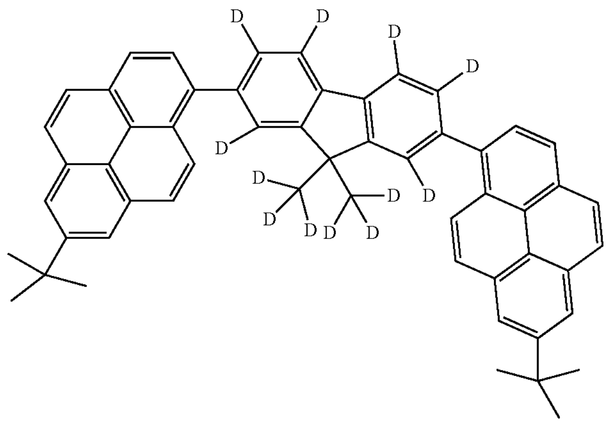

-continued
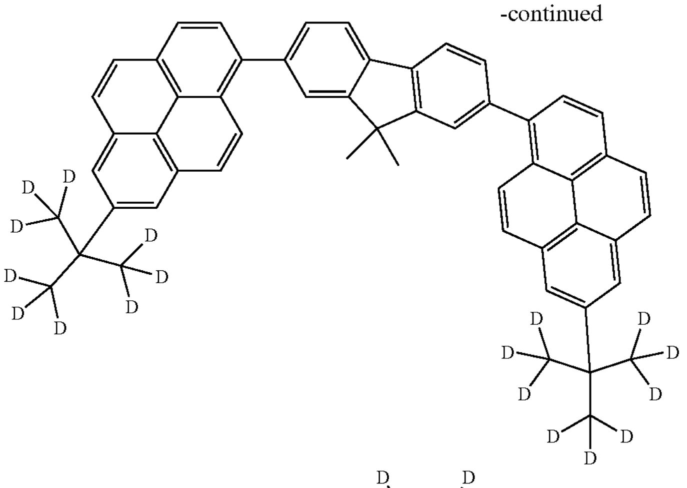
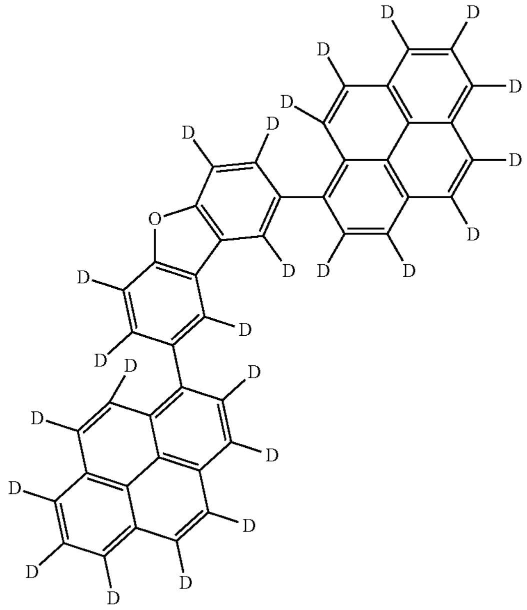
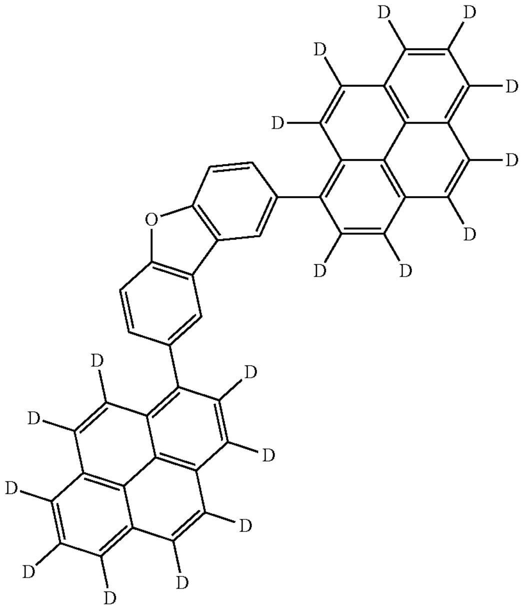
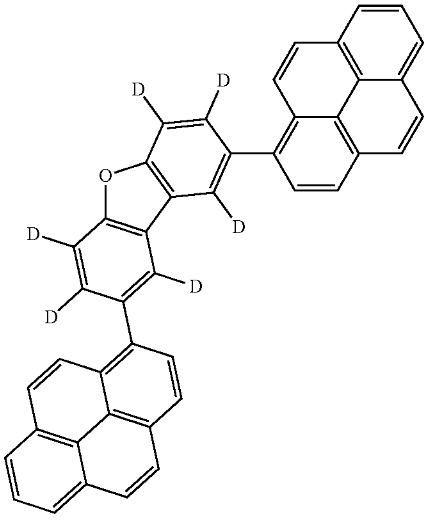
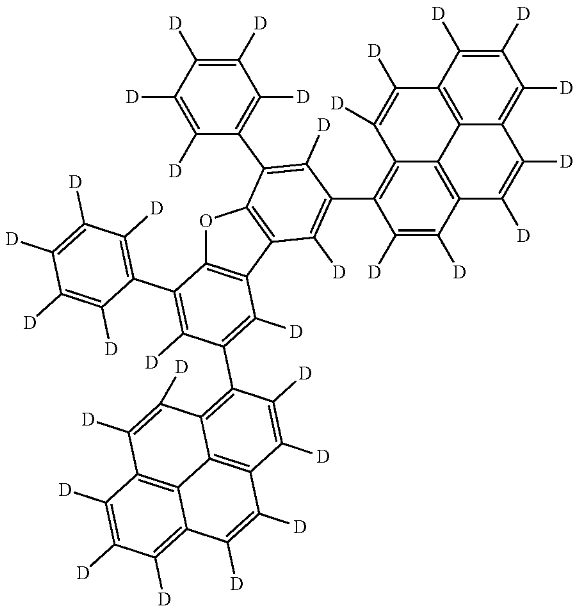

-continued
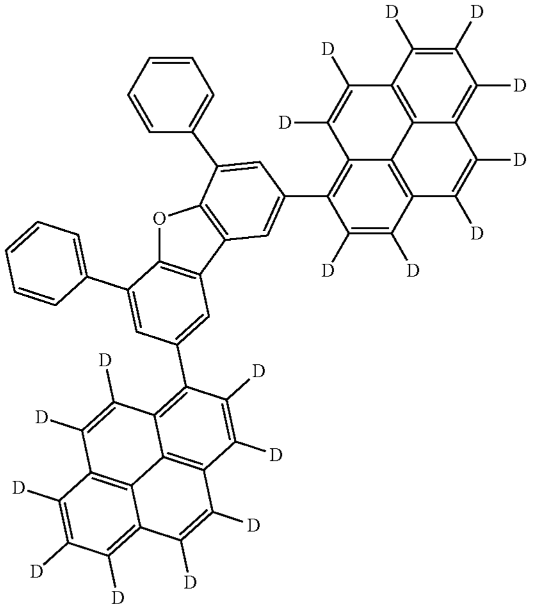
[Formula 129]
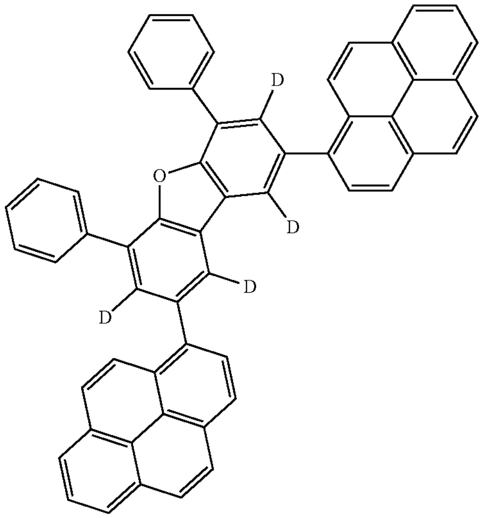
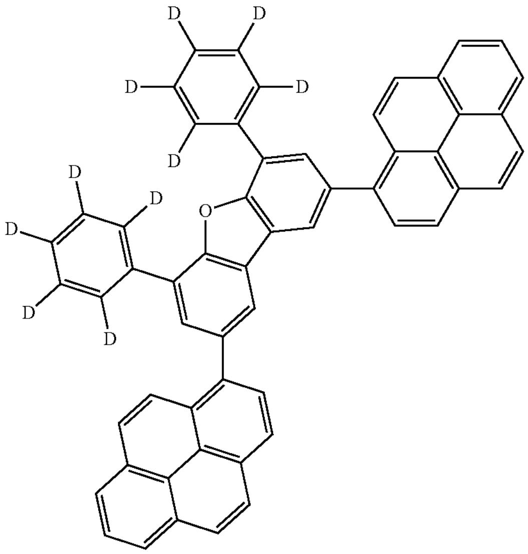
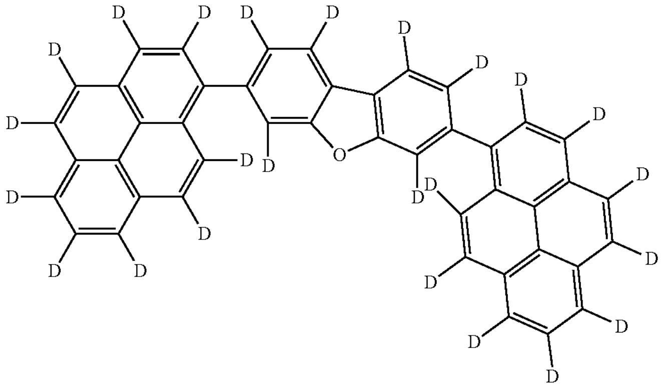

-continued
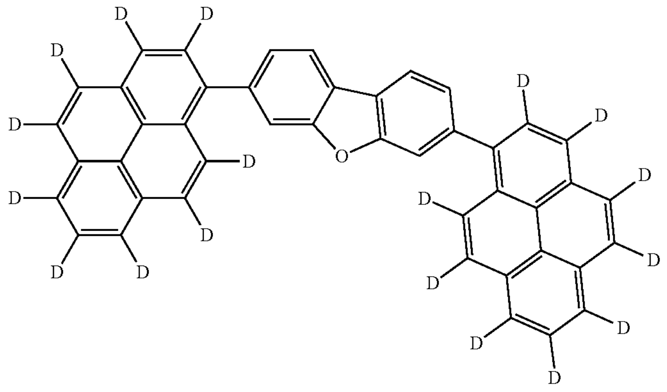
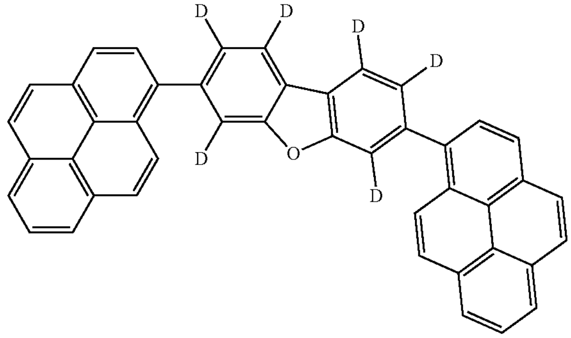
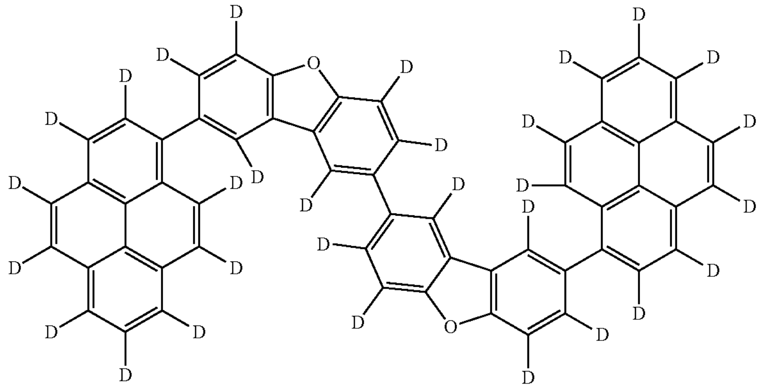
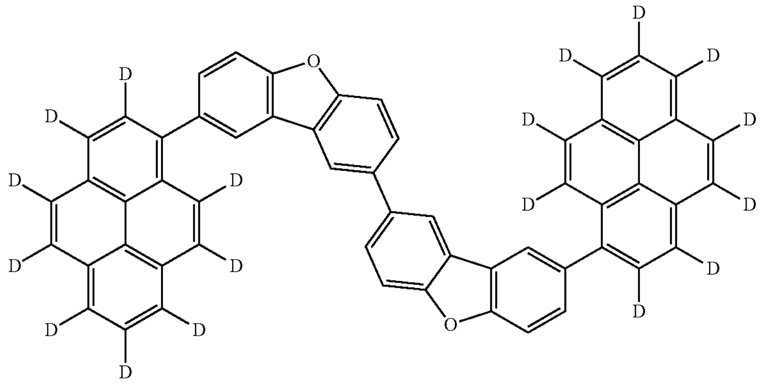

-continued
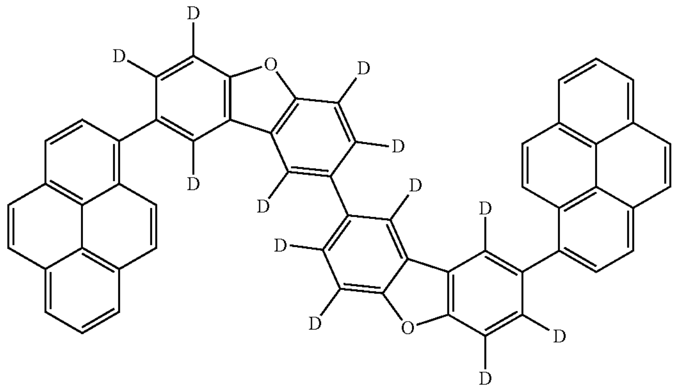
[Formula 130]
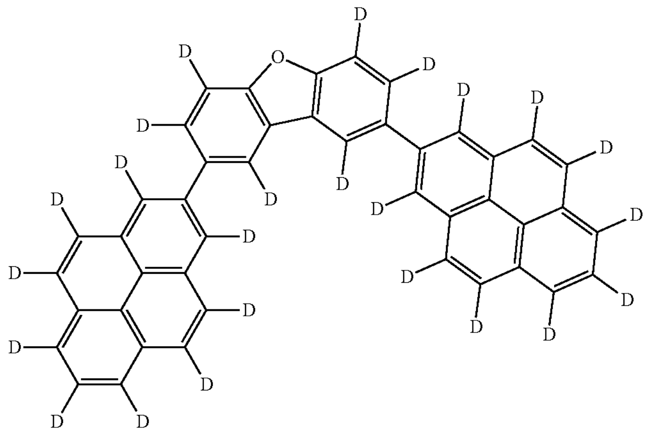
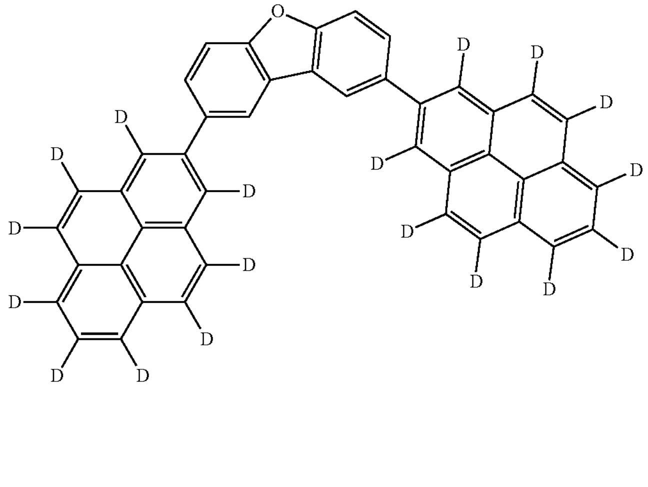
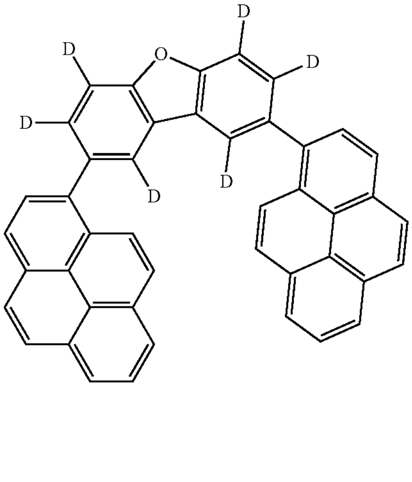

-continued
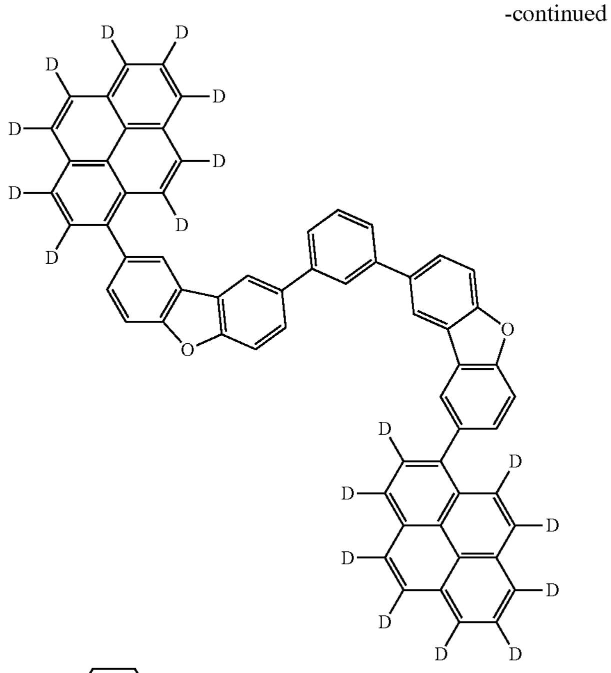
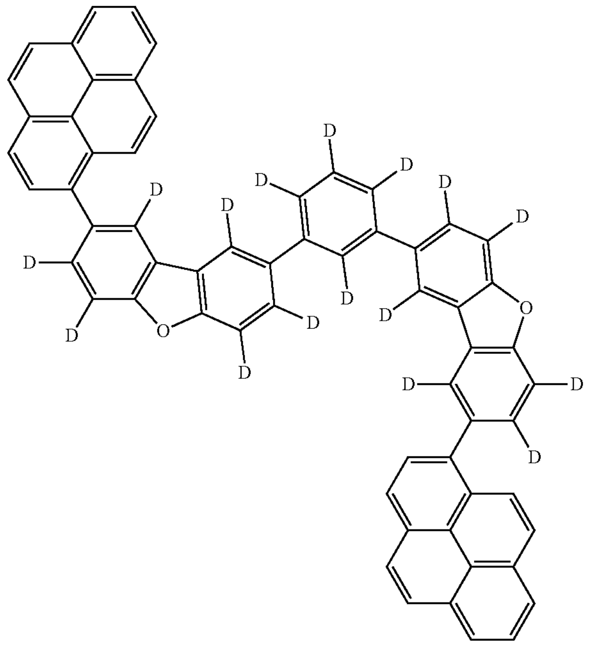
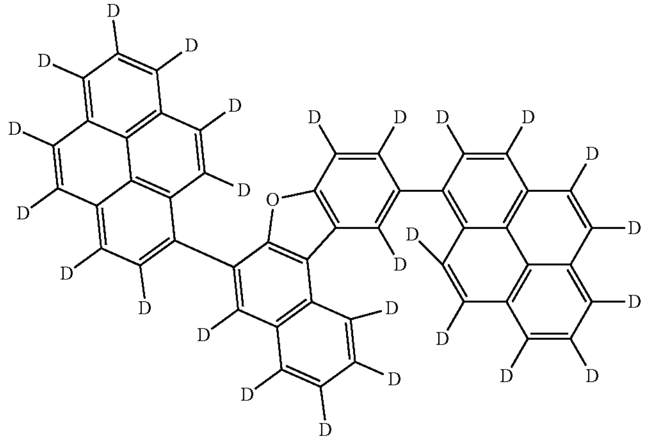

-continued
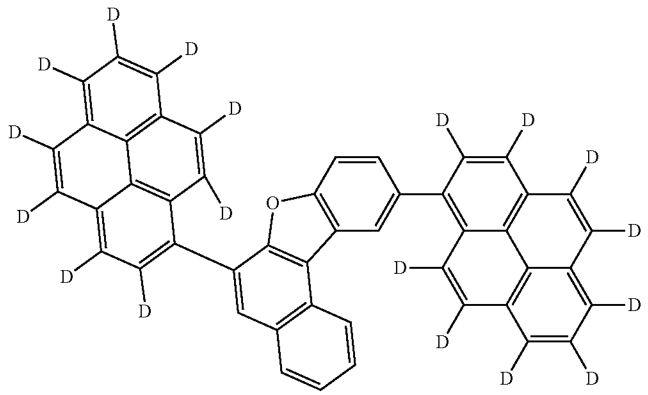
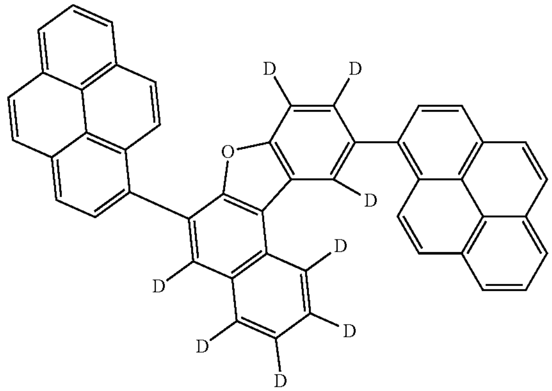
[Formula 131]
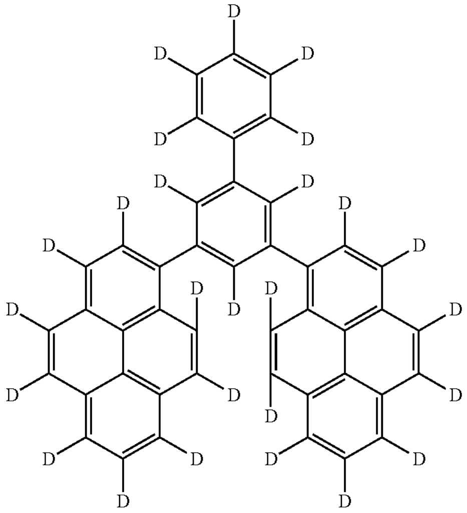
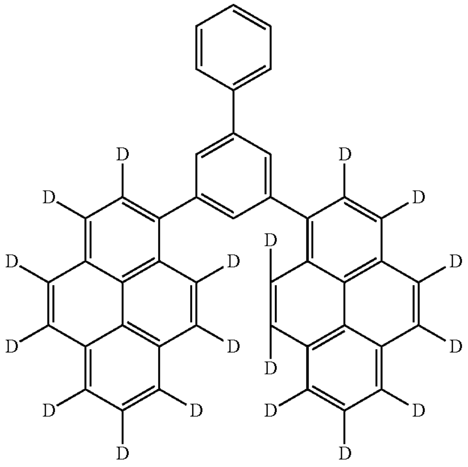

-continued
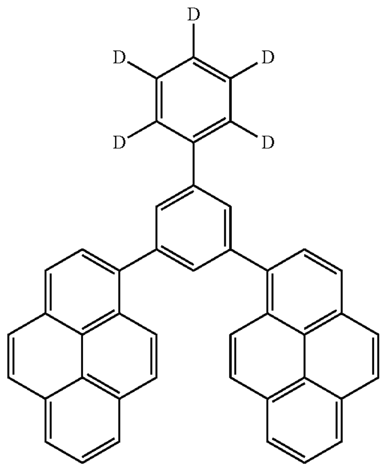
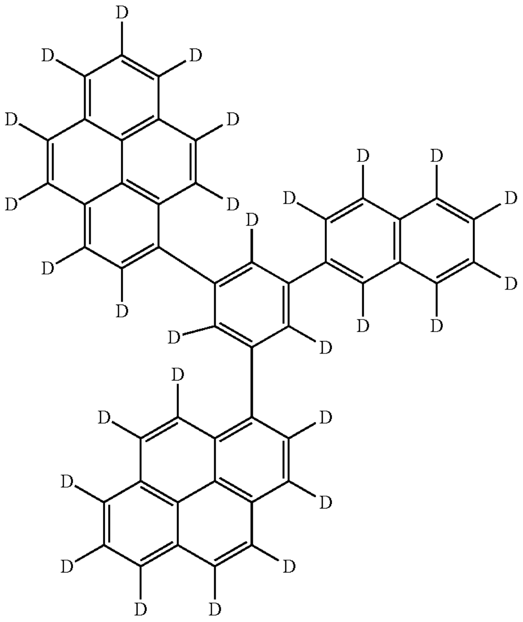
[Formula 132]
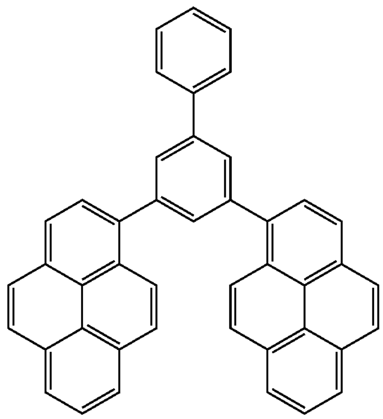
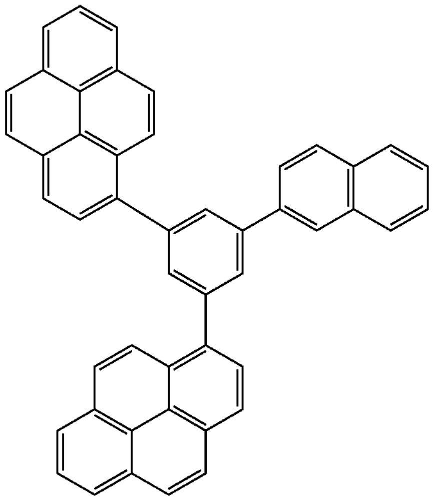
[Formula 133]
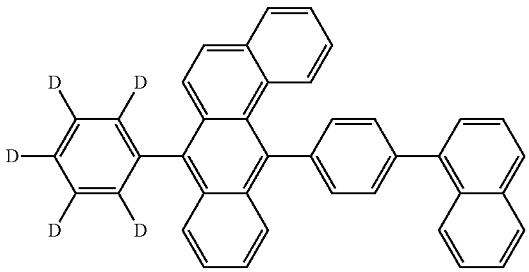
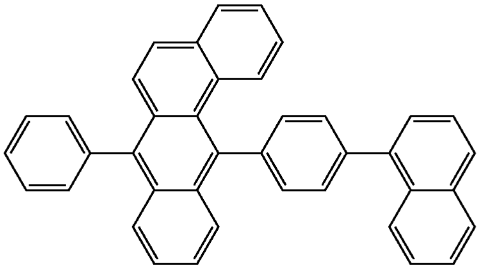

-continued
[Formula 134]
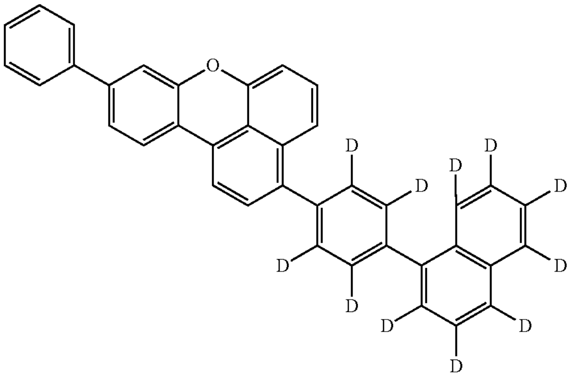
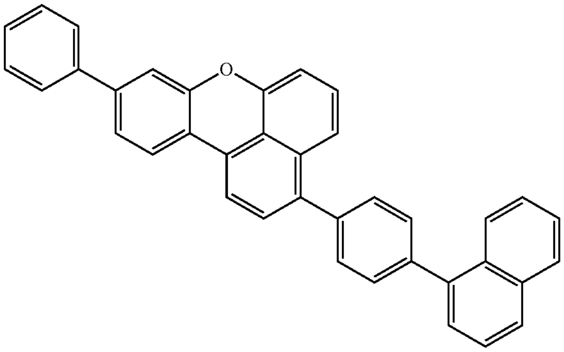
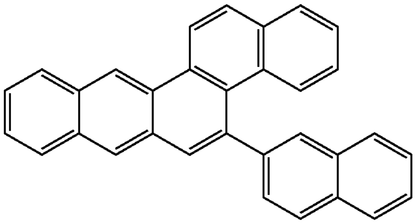
[Formula 135]
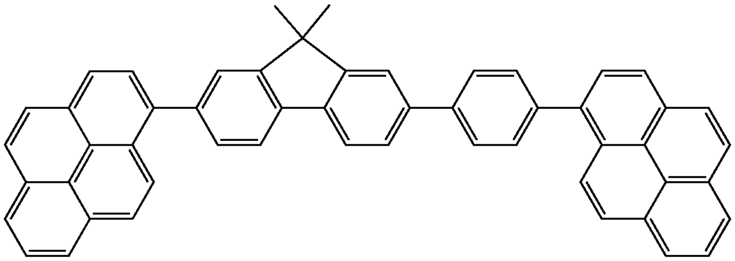
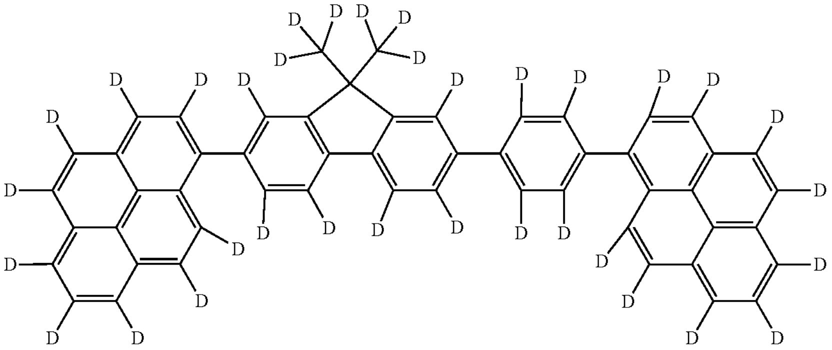
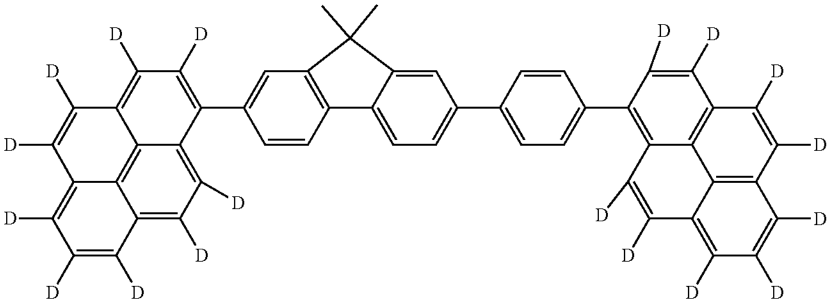

-continued
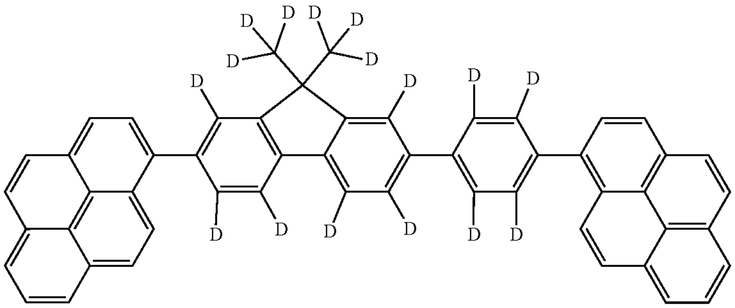
[Formula 136]
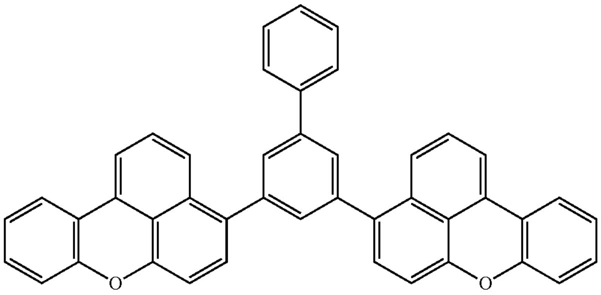
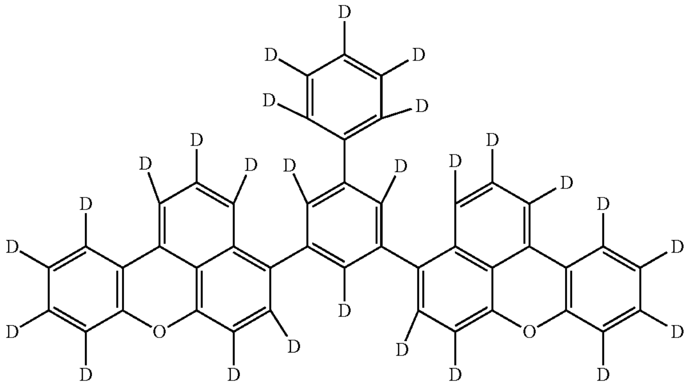
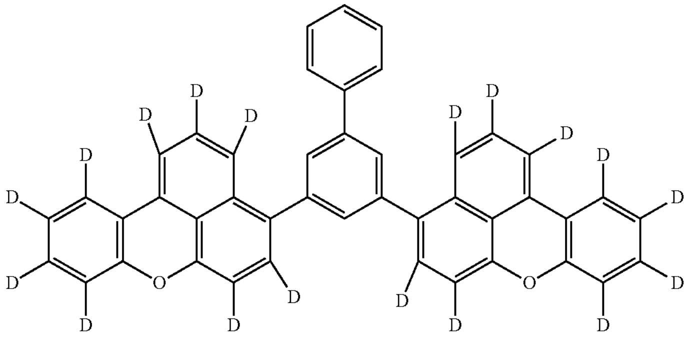
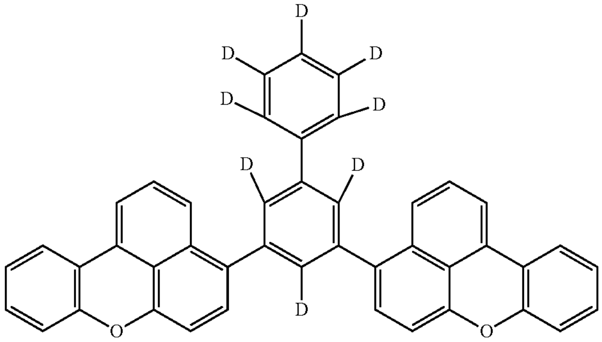

-continued
[Formula 137]
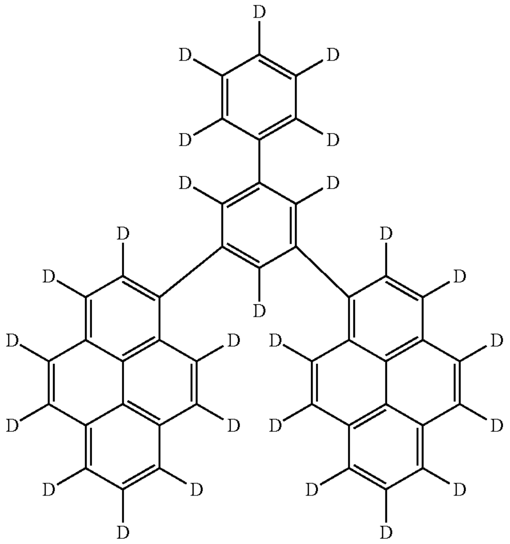
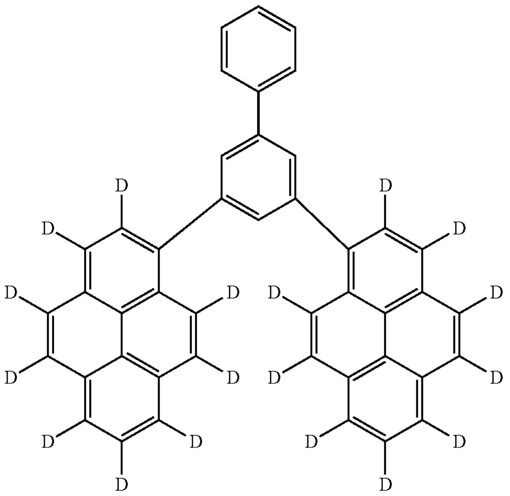
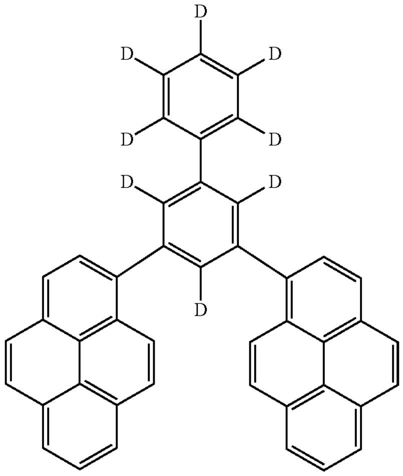
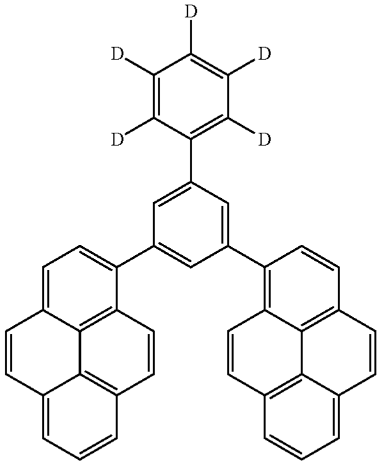
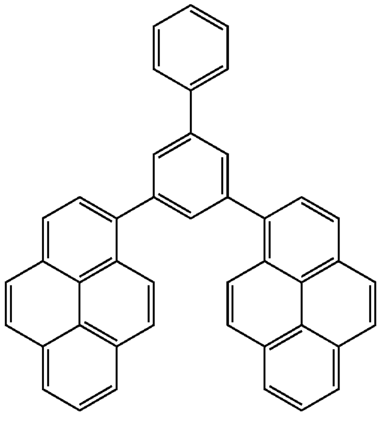

-continued
[Formula 138]
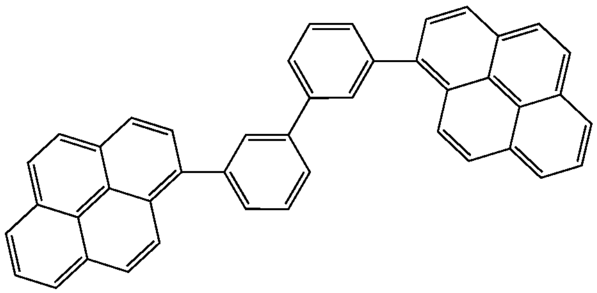
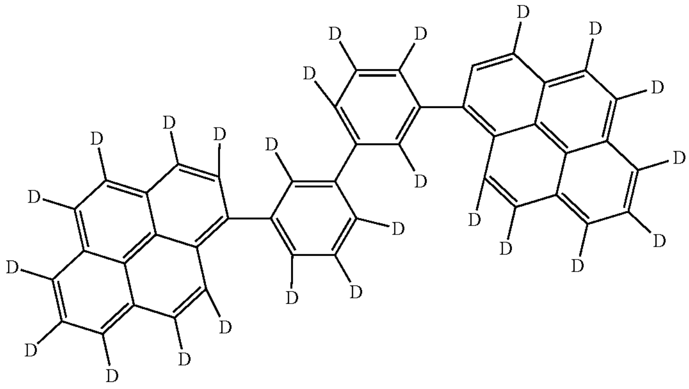
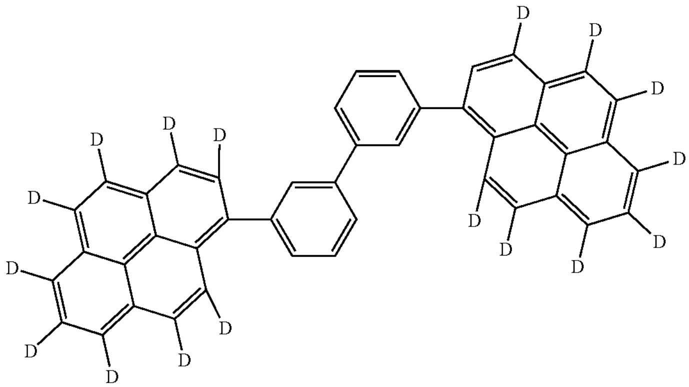
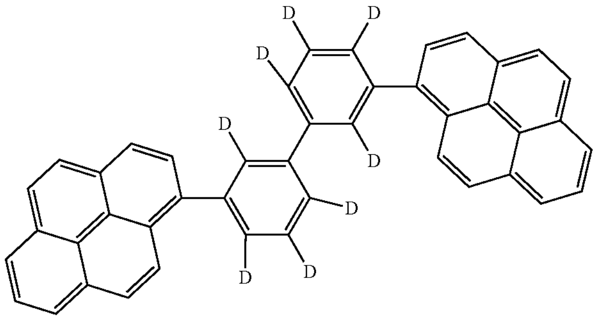
[Formula 139]
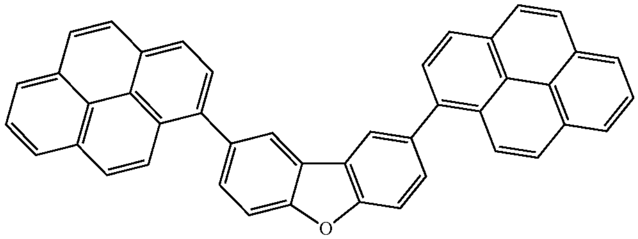

-continued
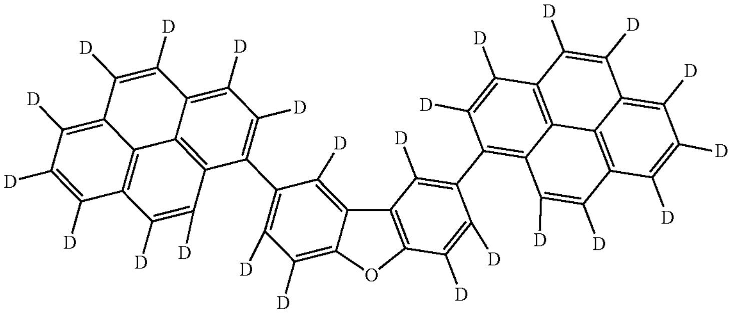
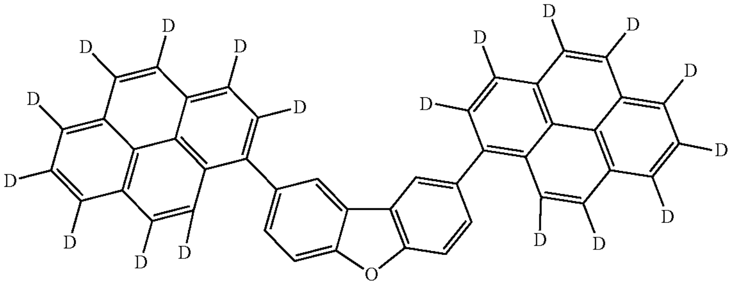
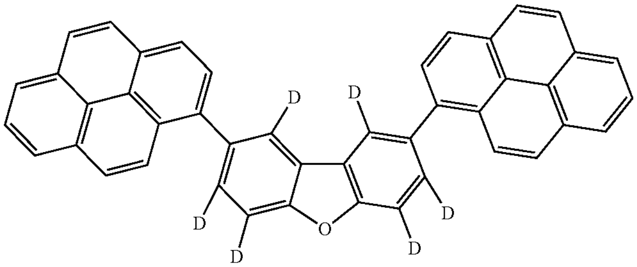
[Formula 140]
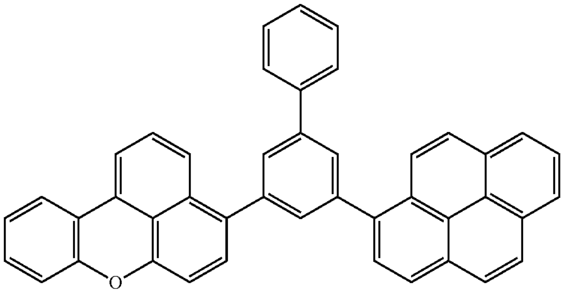
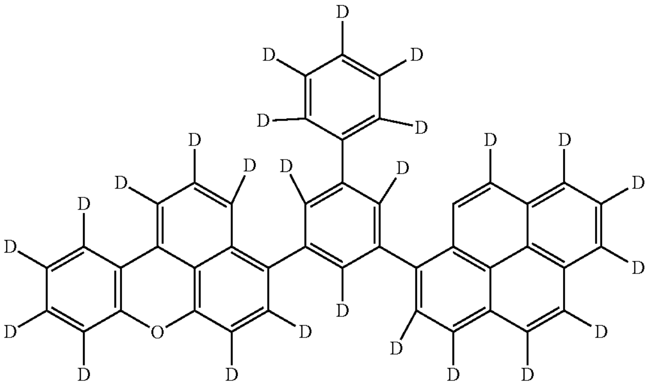

-continued
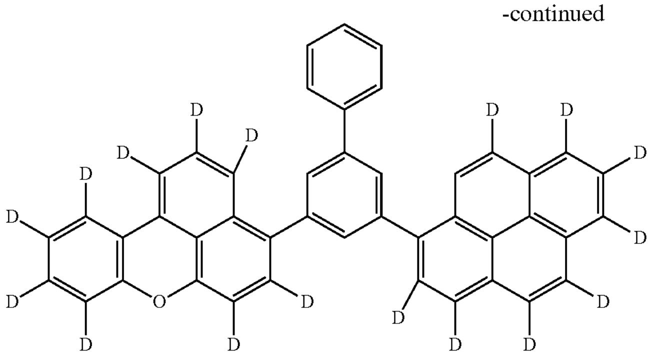
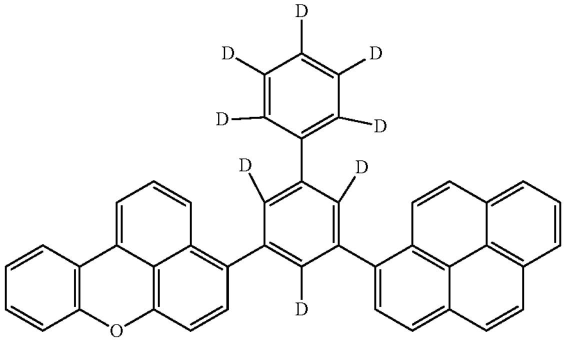
[Formula 141]
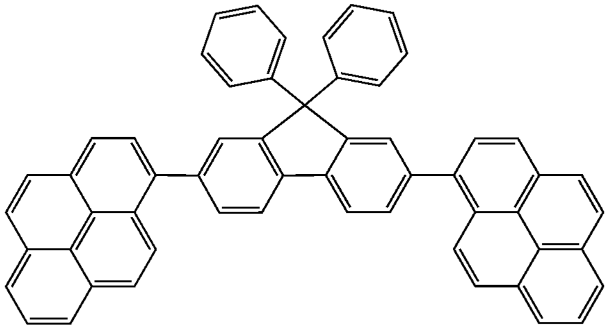
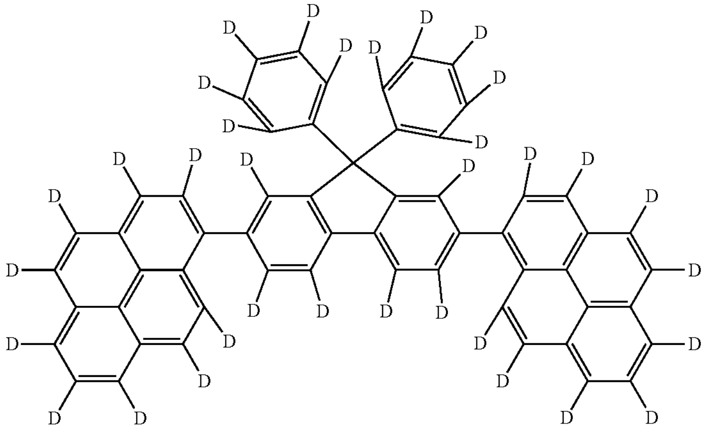

-continued
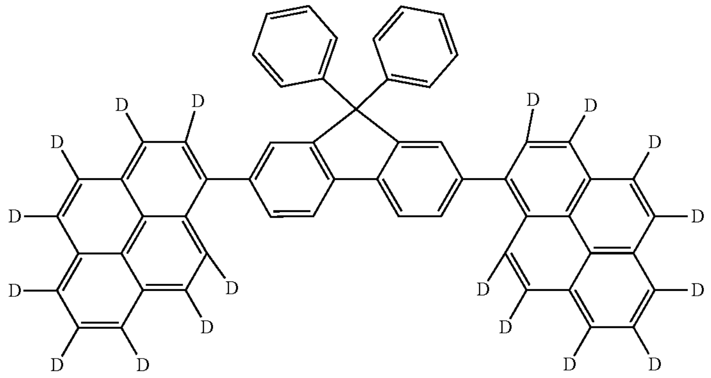
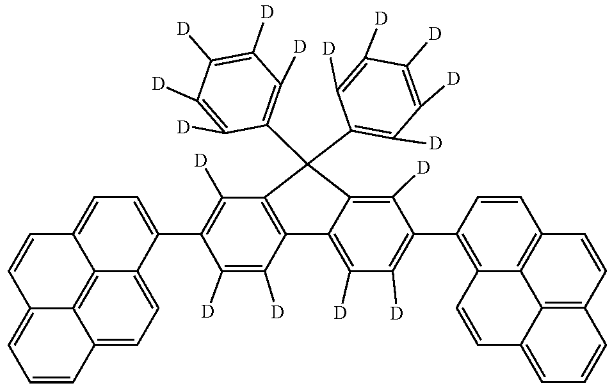
[Formula 142]
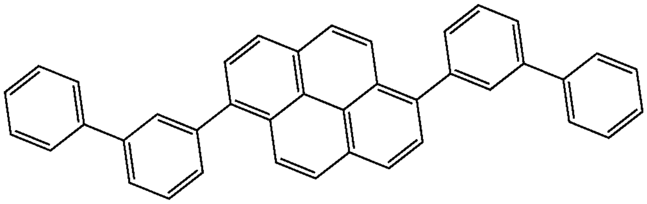
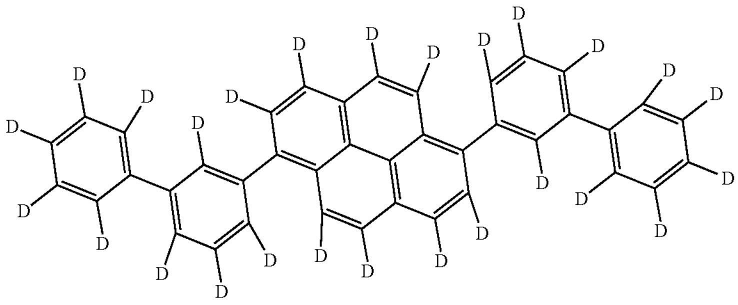
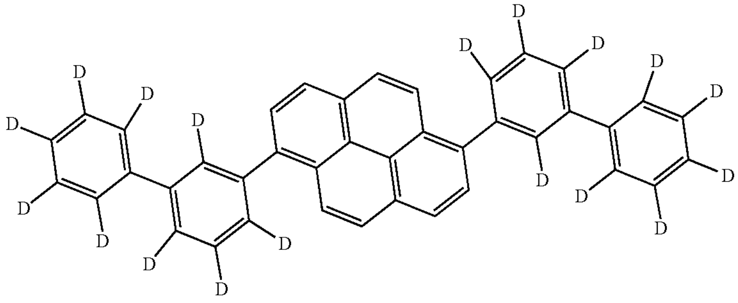

-continued
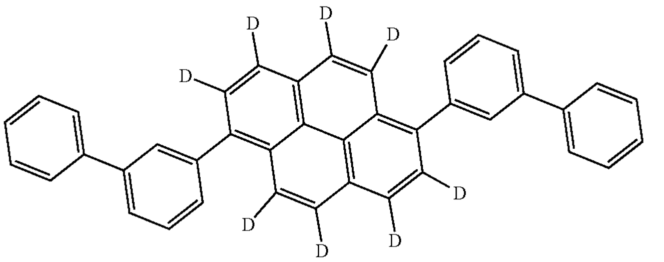
[Formula 143]
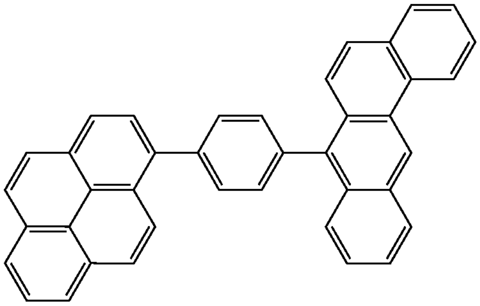
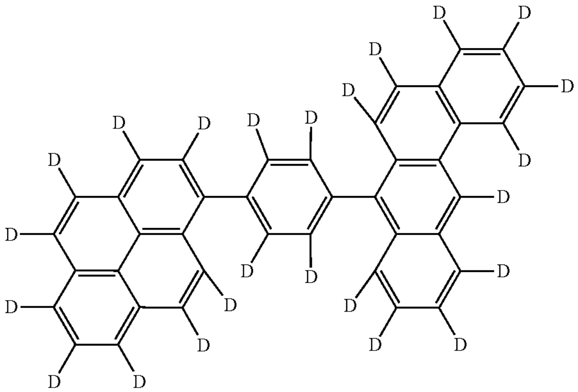
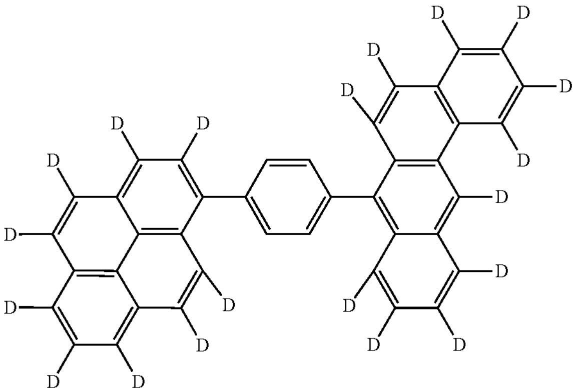
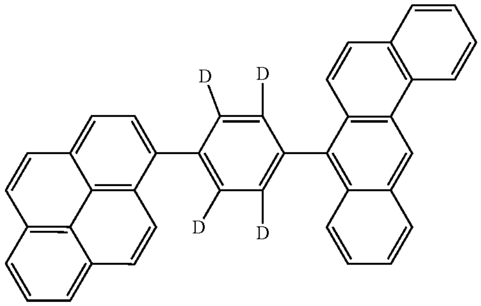
[Formula 144]
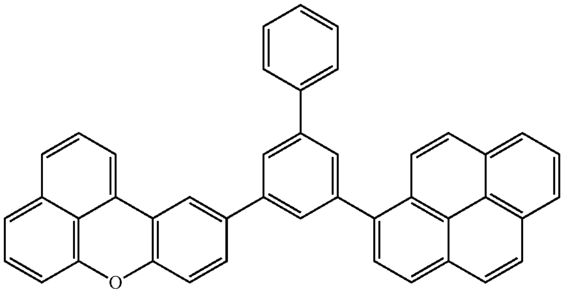

-continued
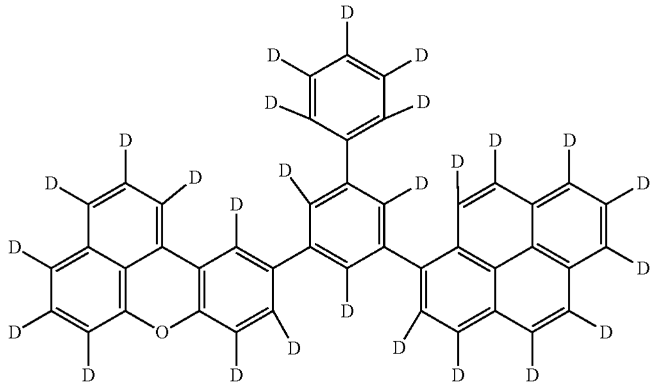
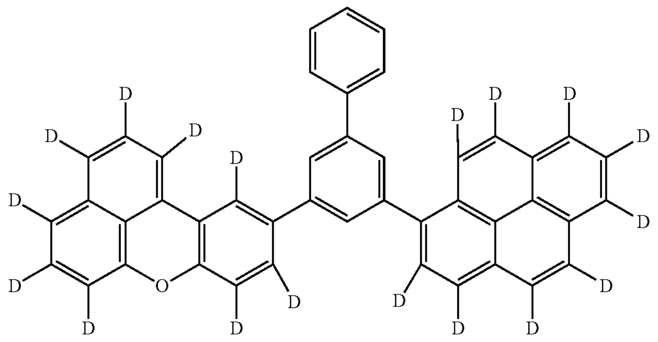
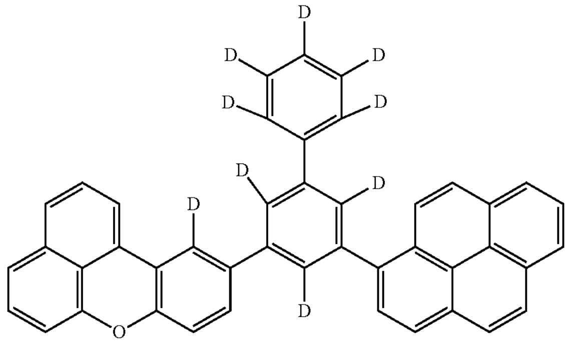
[Formula 145]
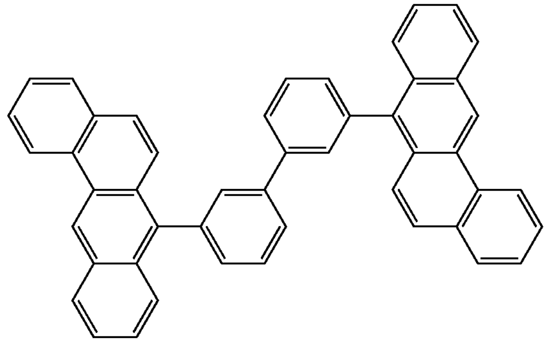

-continued
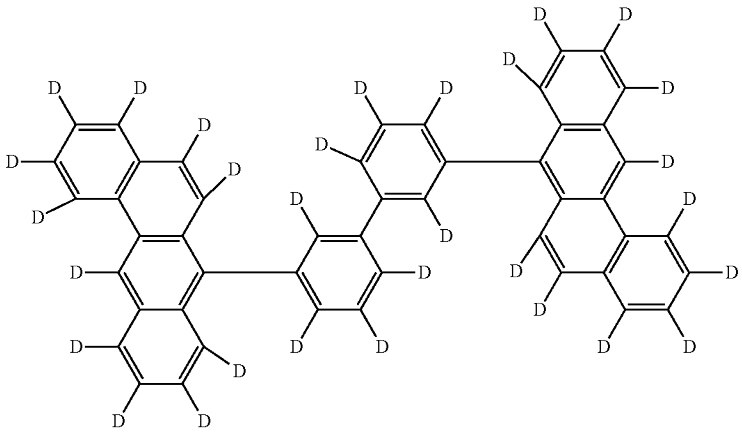
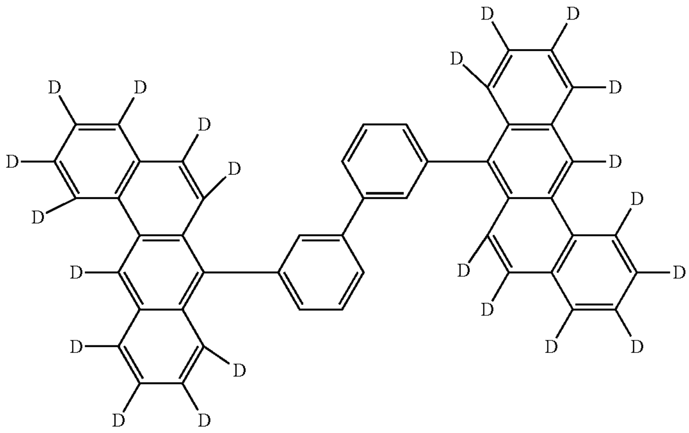
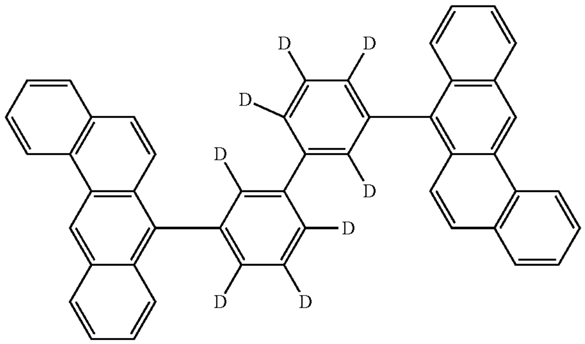
[Formula 146]
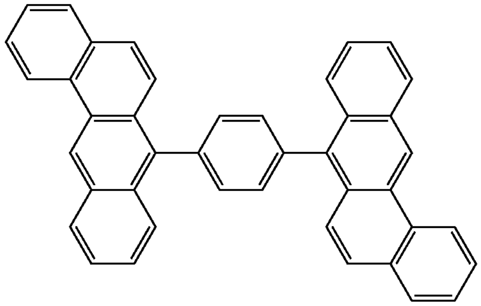
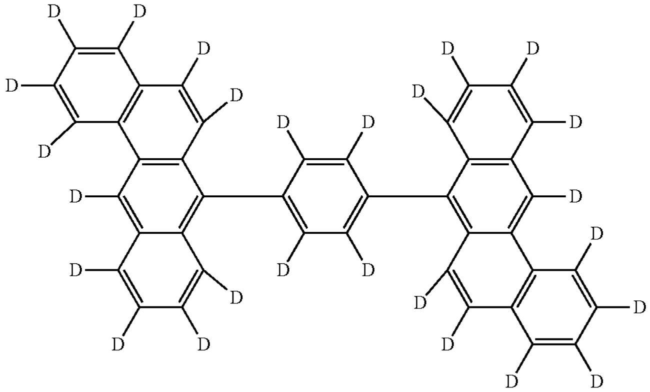

-continued
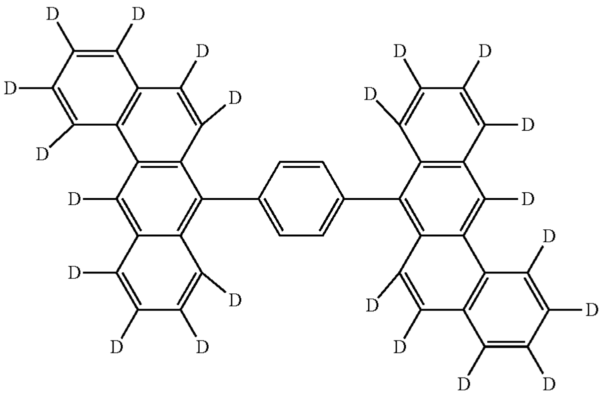
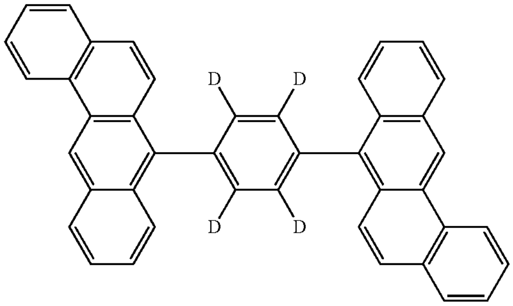
[Formula 147]
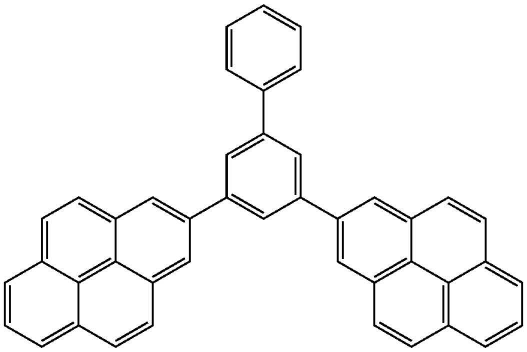
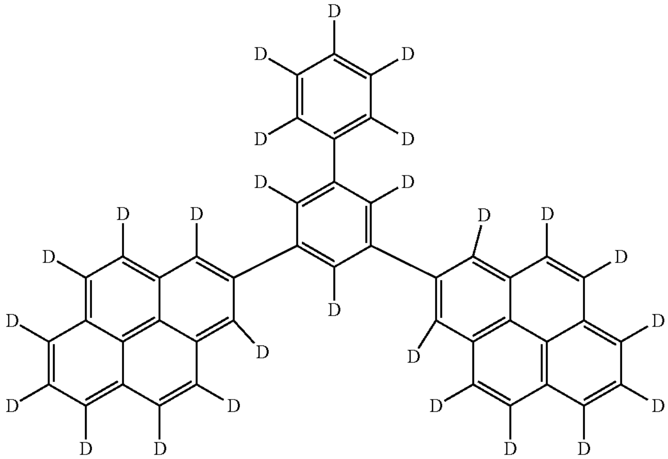
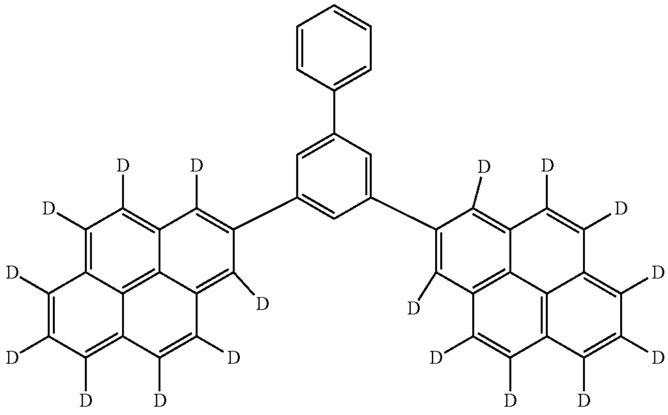

-continued

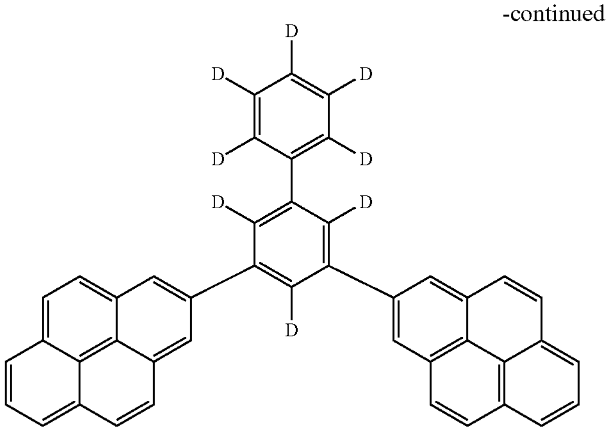

Second Compound

In the organic EL device of the exemplary embodiment, the second compound is a compound represented by the formula (2) below.

[Formula 148]

(2)

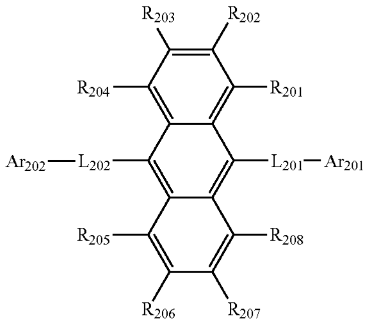

In the formula (2):

$R_{201}$ to $R_{208}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by $—Si(R_{901})(R_{902})(R_{903})$, a group represented by $—O—(R_{904})$, a group represented by $—S—(R_{905})$, a group represented by $—N(R_{906})(R_{907})$, a substituted or unsubstituted aralkyl group having 7 to 50 carbon atoms, a group represented by $—C(═O)R_{801}$, a group represented by $—COOR_{802}$, a halogen atom, a cyano group, a nitro group, a substituted or unsubstituted aryl group having 6 to 50 ring carbon atoms, or a substituted or unsubstituted heterocyclic group having 5 to 50 ring atoms, $L_{201}$ and $L_{202}$ are each independently a single bond, a substituted or unsubstituted arylene group having 6 to 50 ring carbon atoms, or a substituted or unsubstituted divalent heterocyclic group having 5 to 50 ring atoms; and $Ar_{201}$ and $Ar_{202}$ are each independently a substituted or unsubstituted aryl group having 6 to 50 ring carbon atoms, or a substituted or unsubstituted heterocyclic group having 5 to 50 ring atoms.

In the second compound according to the exemplary embodiment: $R_{901}$, $R_{902}$, $R_{903}$, $R_{904}$, $R_{905}$, $R_{906}$, $R_{907}$, $R_{801}$, and $R_{802}$ are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms, when a plurality of $R_{901}$ are present, the plurality of $R_{901}$ are mutually the same or different;

when a plurality of $R_{902}$ are present, the plurality of $R_{902}$ are mutually the same or different;

when a plurality of $R_{903}$ are present, the plurality of $R_{903}$ are mutually the same or different;

when a plurality of $R_{904}$ are present, the plurality of $R_{904}$ are mutually the same or different;

when a plurality of $R_{905}$ are present, the plurality of $R_{905}$ are mutually the same or different;

when a plurality of $R_{906}$ are present, the plurality of $R_{906}$ are mutually the same or different;

when a plurality of $R_{907}$ are present, the plurality of $R_{907}$ are mutually the same or different;

when a plurality of $R_{801}$ are present, the plurality of $R_{801}$ are mutually the same or different; and when a plurality of $R_{802}$ are present, the plurality of $R_{802}$ are mutually the same or different.

In the organic EL device according to the exemplary embodiment, preferably, $R_{201}$ to $R_{208}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by $—Si(R_{901})(R_{902})(R_{903})$, a group represented by $—O—(R_{904})$, a group represented by $—S—(R_{905})$, a group represented by $—N(R_{906})(R_{907})$, a substituted or unsubstituted aralkyl group having 7 to 50 carbon atoms, a group represented by $—C(═O)R_{801}$, a group represented by $—COOR_{802}$, a halogen atom, a cyano group, or a nitro group;

$L_{201}$ and $L_{202}$ are each independently a single bond, a substituted or unsubstituted arylene group having 6 to 50 ring carbon atoms, or a substituted or unsubstituted divalent heterocyclic group having 5 to 50 ring atoms; and $Ar_{201}$ and $Ar_{202}$ are each independently a substituted or unsubstituted aryl group having 6 to 50 ring carbon atoms, or a substituted or unsubstituted heterocyclic group having 5 to 50 ring atoms.

In the organic EL device according to the exemplary embodiment, preferably, $L_{201}$ and $L_{202}$ are each independently a single bond, or a substituted or unsubstituted arylene group having 6 to 50 ring carbon atoms; and $Ar_{201}$ and $Ar_{202}$ are each independently a substituted or unsubstituted aryl group having 6 to 50 ring carbon atoms.

In the organic EL device according to the exemplary embodiment, Arm and $Ar_{202}$ are preferably each independently a phenyl group, naphthyl group, phenanthryl group, biphenyl group, terphenyl group, diphenylfluorenyl group, dimethylfluorenyl group, benzodiphenylfluorenyl group, benzodimethylfluorenyl group, dibenzofuranyl group, dibenzothienyl group, naphthobenzofuranyl group, or naphthobenzothienyl group.

In the organic EL device according to the exemplary embodiment, the second compound represented by the formula (2) is preferably a compound represented by a formula (201), a formula (202), a formula (203), a formula (204), a formula (205), a formula (206), a formula (207), a formula (208), or a formula (209) below.

[Formula 149]

(201)

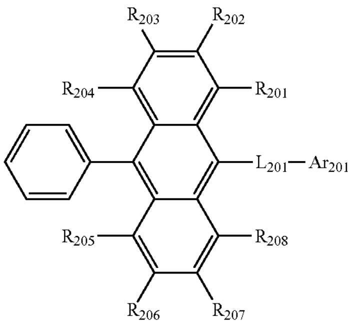

[Formula 150]

(202)

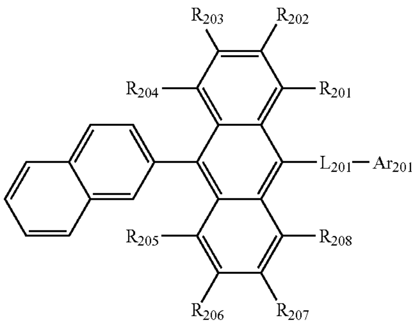

-continued

[Formula 151]

(203)

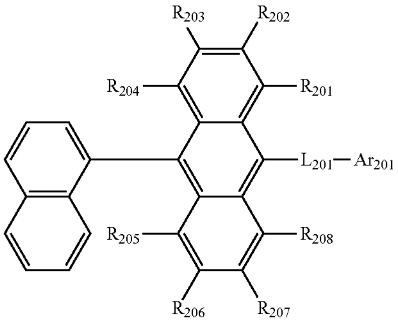

[Formula 152]

(204)

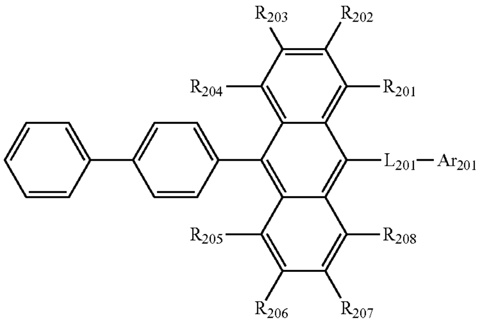

[Formula 153]

(205)

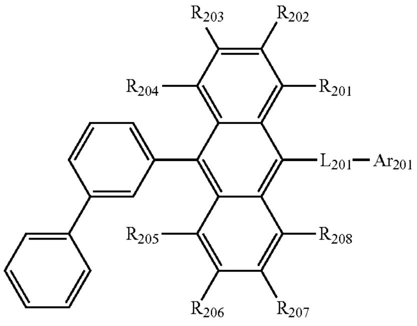

[Formula 154]

(206)

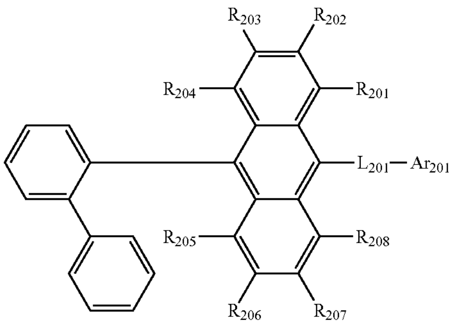

-continued

[Formula 155]

(207)

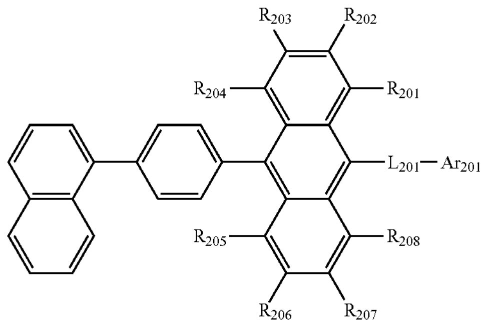

[Formula 156]

(208)

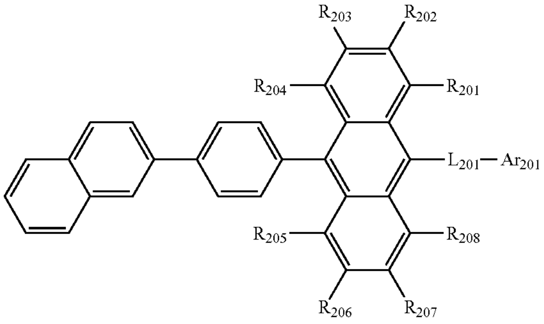

[Formula 157]

(209)

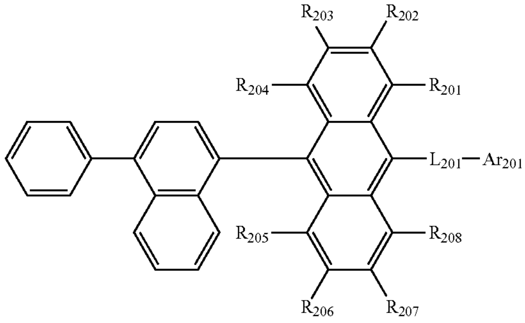

In the formulae (201) to (209):

$L_{201}$ and Arm represent the same as $L_{201}$ and Arm in the formula (2); and $R_{201}$ to $R_{208}$ each independently represent the same as $R_{201}$ to $R_{208}$ in the formula (2).

The second compound represented by the formula (2) is also preferably a compound represented by a formula (221), a formula (222), a formula (223), a formula (224), a formula (225), a formula (226), a formula (227), a formula (228), or a formula (229) below.

[Formula 158]

(221)

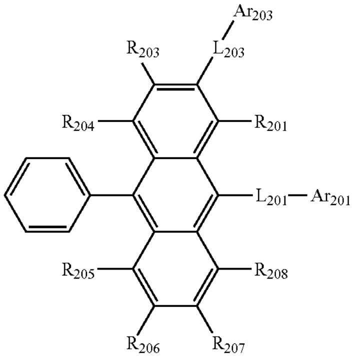

[Formula 159]

(222)

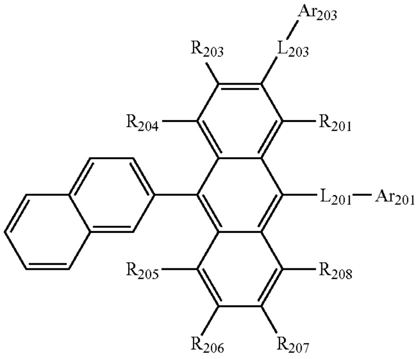

[Formula 160]

(223)

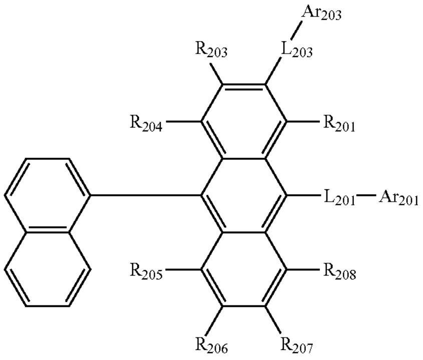

[Formula 161]

(224)

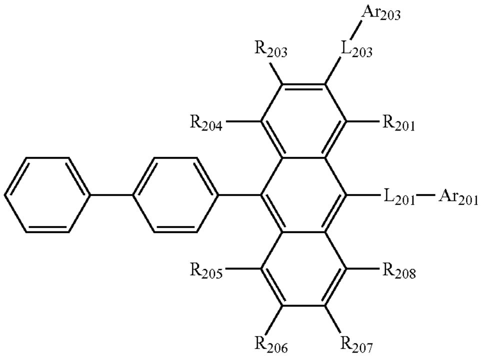

-continued

[Formula 162]

(225)

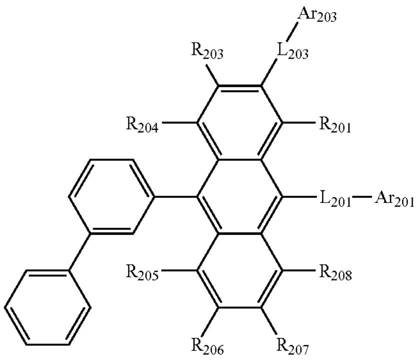

[Formula 163]

(226)

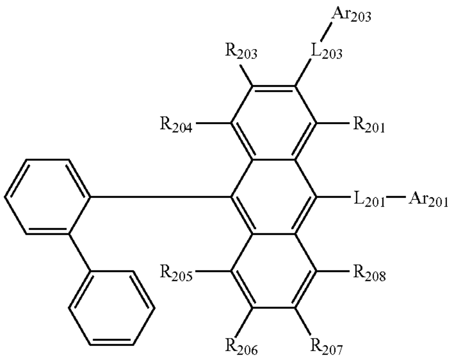

[Formula 164]

(227)

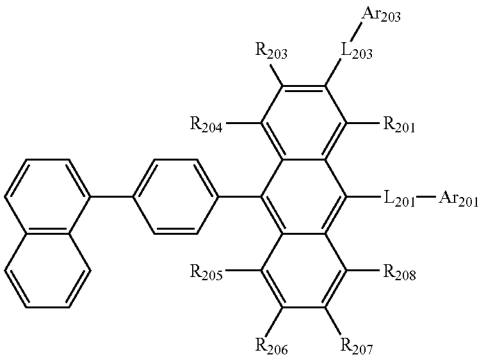

[Formula 165]

(228)

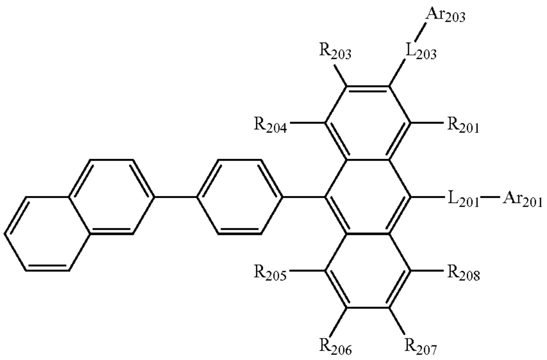

-continued

[Formula 166]

(229)

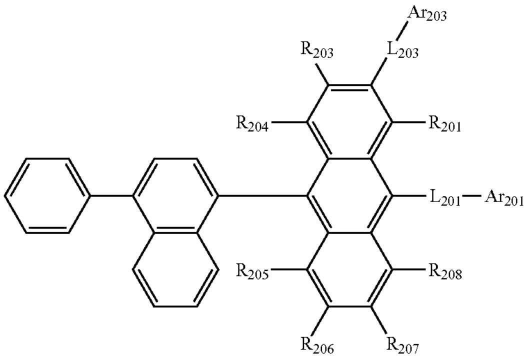

In the formulae (221), (222), (223), (224), (225), (226), (227), (228) and (229):

$R_{201}$ and $R_{203}$ to $R_{208}$ each independently represent the same as $R_{201}$ and $R_{203}$ to $R_{208}$ in the formula (2);

$L_{201}$ and Arm respectively represent the same as $L_{201}$ and Arm in the formula (2);

$L_{203}$ represents the same as $L_{201}$ in the formula (2);

$L_{203}$ and $L_{201}$ are mutually the same or different;

$Ar_{203}$ represents the same as Arm in the formula (2); and $Ar_{203}$ and Arm are mutually the same or different.

The second compound represented by the formula (2) is also preferably a compound represented by a formula (241), a formula (242), a formula (243), a formula (244), a formula (245), a formula (246), a formula (247), a formula (248), or a formula (249) below.

[Formula 167]

(241)

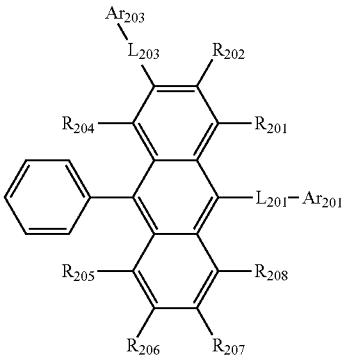

-continued
[Formula 168]
(242)
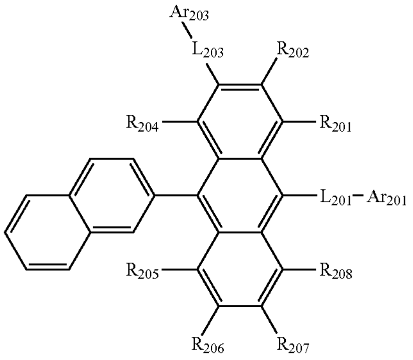
[Formula 169]
(243)
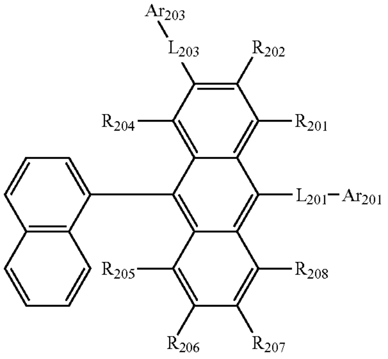
[Formula 170]
(244)
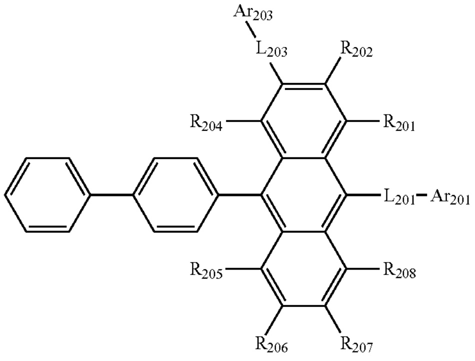
[Formula 171]
(245)
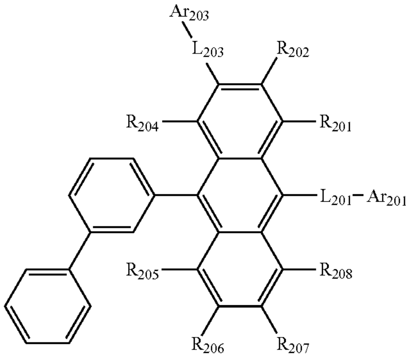
-continued
[Formula 172]
(246)
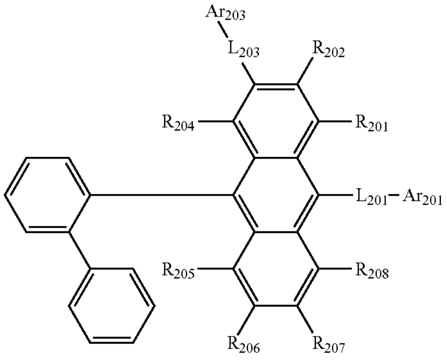
[Formula 173]
(247)
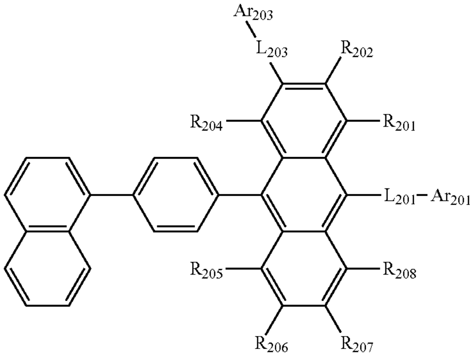
[Formula 174]
(248)
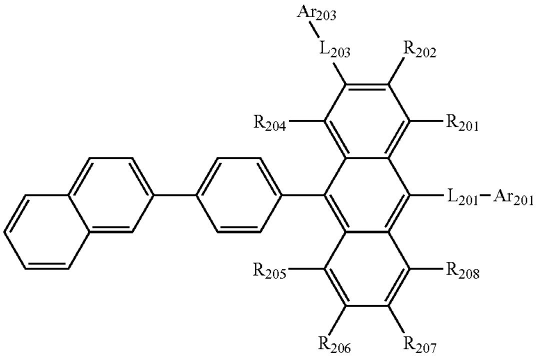
[Formula 175]
(249)
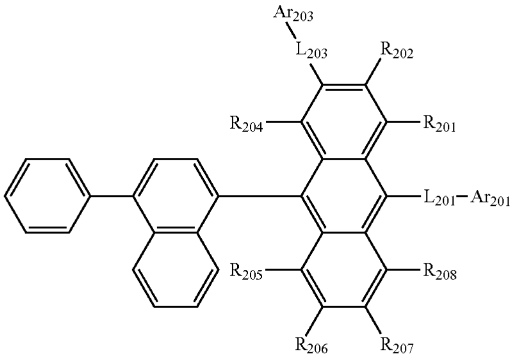

In the formulae (241), (242), (243), (244), (245), (246), (247), (248) and (249):

$R_{201}$, $R_{202}$ and $R_{204}$ to $R_{208}$ each independently represent the same as $R_{201}$, $R_{202}$ and $R_{204}$ to $R_{208}$ in the formula (2);

$L_{201}$ and $Ar_{201}$ respectively represent the same as $L_{201}$ and Arm in the formula (2);

$L_{203}$ represents the same as $L_{201}$ in the formula (2);

$L_{203}$ and $L_{201}$ are mutually the same or different;

$Ar_{203}$ represents the same as $Ar_{201}$ in the formula (2); and $Ar_{203}$ and $Ar_{201}$ are mutually the same or different.

In the second compound represented by the formula (2), $R_{201}$ to $R_{208}$ not being the group represented by the formula (21) are preferably each independently a hydrogen atom, a substituted or unsubstituted alkyl group having 1 to 50 carbon atoms, a substituted or unsubstituted cycloalkyl group having 3 to 50 ring carbon atoms, or a group represented by —Si($R_{901}$)($R_{902}$)($R_{903}$).

Preferably, $L_{101}$ is a single bond, or an unsubstituted arylene group having 6 to 22 ring carbon atoms; and $Ar_{101}$ is a substituted or unsubstituted aryl group having 6 to 22 ring carbon atoms.

In the organic EL device according to the exemplary embodiment, $R_{201}$ to $R_{208}$ that are substituents of an anthracene skeleton in the second compound represented by the formula (2) are preferably hydrogen atoms in terms of preventing inhibition of intermolecular interaction and inhibiting decrease in electron mobility. However, $R_{201}$ to $R_{208}$ may be a substituted or unsubstituted aryl group having 6 to 50 ring carbon atoms or a substituted or unsubstituted heterocyclic group having 5 to ring atoms.

Assuming that $R_{201}$ to $R_{208}$ each are a bulky substituent such as an alkyl group and a cycloalkyl group, intermolecular interaction may be inhibited to decrease the electron mobility of the second compound relative to that of the first host material, so that the relationship of $\mu_{E2}>\mu_{E1}$ shown by the numerical formula (Numerical Formula 16) may not be satisfied. When the second compound is used in the second emitting layer, it can be expected that satisfying the relationship of $\mu_{E2}>\mu_{E1}$ inhibits a decrease in a recombination ability between holes and electrons in the first emitting layer and a decrease in luminous efficiency. It should be noted that substituents, namely, a haloalkyl group, alkenyl group, alkynyl group, group represented by —Si($R_{901}$)($R_{902}$)($R_{903}$), group represented by —O—($R_{904}$), group represented by —S—($R_{905}$), group represented by —N($R_{906}$)($R_{907}$), aralkyl group, group represented by —C(=O)$R_{801}$, group represented by —COO$R_{802}$, halogen atom, cyano group, and nitro group are likely to be bulky, and an alkyl group and cycloalkyl group are likely to be further bulky.

In the second compound represented by the formula (2), $R_{201}$ to $R_{208}$, which are the substituents on the anthracene skeleton, are each preferably not a bulky substituent and preferably not an alkyl group and cycloalkyl group. More preferably, $R_{201}$ to $R_{208}$ are each not an alkyl group, cycloalkyl group, haloalkyl group, alkenyl group, alkynyl group, group represented by —Si($R_{901}$)($R_{902}$)($R_{903}$), group represented by —O—($R_{904}$), group represented by —S—($R_{905}$), group represented by —N($R_{906}$)($R_{907}$), aralkyl group, group represented by —C(=O)$R_{801}$, group represented by —COO$R_{802}$, halogen atom, cyano group, and nitro group.

In the organic EL device according to the exemplary embodiment, also preferably, $R_{201}$ to $R_{208}$ in the second compound represented by the formula (2) are each independently a hydrogen atom, a substituted or unsubstituted alkyl group having 1 to 50 carbon atoms, a substituted or unsubstituted cycloalkyl group having 3 to 50 ring carbon atoms, or a group represented by —Si($R_{901}$)($R_{902}$)($R_{903}$).

In the organic EL device according to the exemplary embodiment, $R_{201}$ to $R_{208}$ in the second compound represented by the formula (2) are each preferably a hydrogen atom.

In the second compound, examples of the substituent for the "substituted or unsubstituted" group on $R_{201}$ to $R_{208}$ also preferably do not include the above-described substituent that is likely to be bulky, especially a substituted or unsubstituted alkyl group and a substituted or unsubstituted cycloalkyl group. When examples of the substituent for the "substituted or unsubstituted" group on $R_{201}$ to $R_{208}$ do not include a substituted or unsubstituted alkyl group and a substituted or unsubstituted cycloalkyl group, inhibition of intermolecular interaction to be caused by presence of a bulky substituent such as an alkyl group and a cycloalkyl group can be prevented, thereby preventing a decrease in the electron mobility. Moreover, when the second compound described above is used in the second emitting layer, a decrease in a recombination ability between holes and electrons in the first emitting layer and a decrease in the luminous efficiency can be inhibited.

Further preferably, $R_{201}$ to $R_{208}$ that are the substituents on the anthracene skeleton are not bulky substituents and $R_{201}$ to $R_{208}$ as substituents are unsubstituted. Assuming that $R_{201}$ to $R_{208}$ that are the substituents on the anthracene skeleton are not bulky substituents and substituents are bonded to $R_{201}$ to $R_{208}$ that are not bulky substituents, the substituents bonded to $R_{201}$ to $R_{208}$ are preferably not bulky substituents; and the substituents bonded to $R_{201}$ to $R_{208}$ serving as substituents are preferably not an alkyl group and cycloalkyl group, more preferably not an alkyl group, cycloalkyl group, haloalkyl group, alkenyl group, alkynyl group, group represented by —Si($R_{901}$)($R_{902}$)($R_{903}$), group represented by —O—($R_{904}$), group represented by —S—($R_{905}$), group represented by —N($R_{906}$)($R_{907}$), aralkyl group, group represented by —C(=O)$R_{801}$, group represented by —COO$R_{802}$, halogen atom, cyano group, and nitro group.

In the second compound, the groups specified to be "substituted or unsubstituted" are each preferably an "unsubstituted" group.

Method of Producing Second Compound

The second compound can be produced by a known method. The second compound can also be produced based on a known method through a known alternative reaction using a known material(s) tailored for the target compound.

Specific Examples of Second Compound

Specific examples of the second compound include the following compounds. It should however be noted that the invention is not limited to the specific examples of the second compound.

[Formula 176]
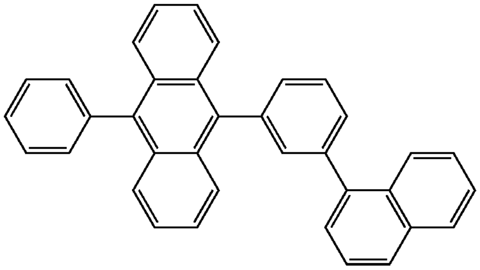
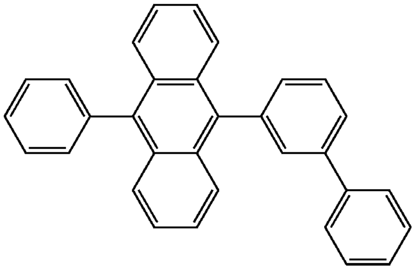
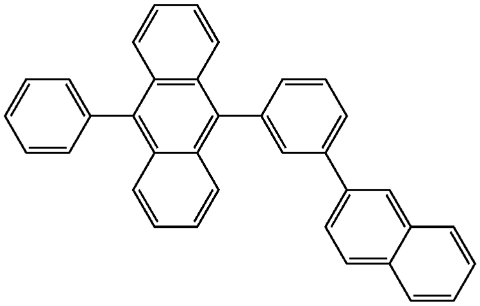
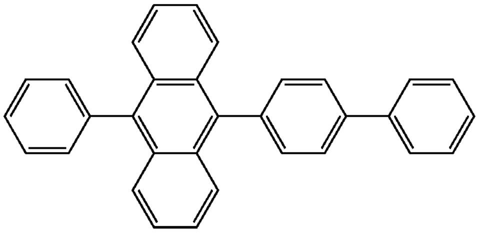
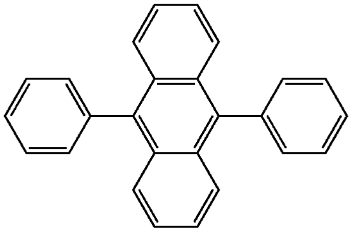
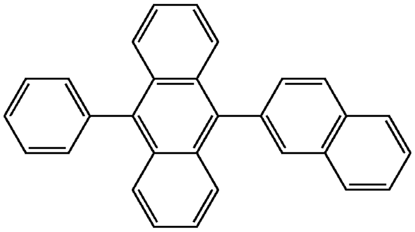
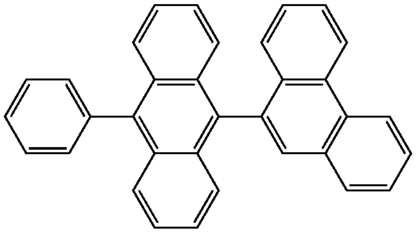
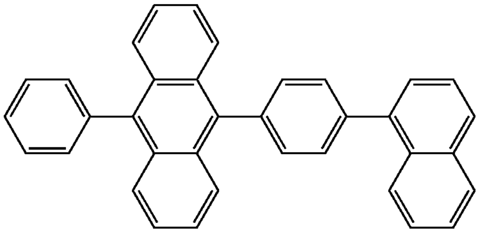
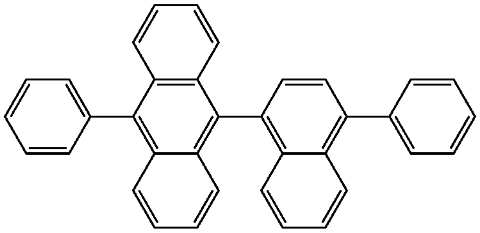
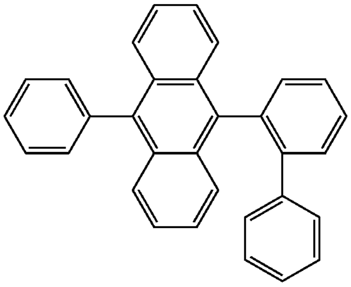
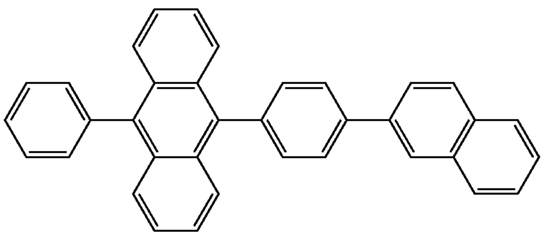
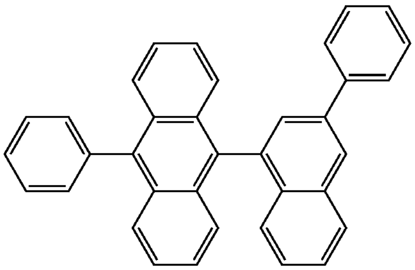

-continued
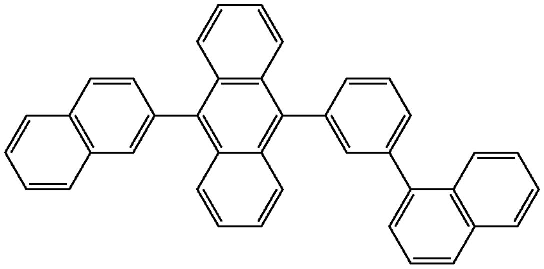
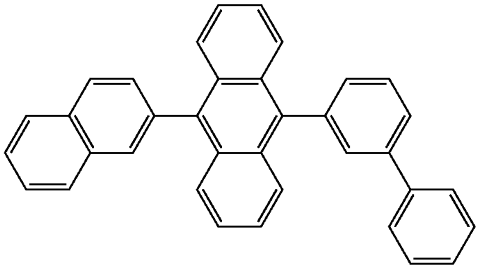
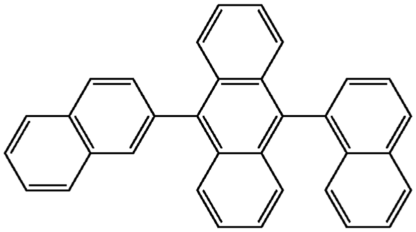
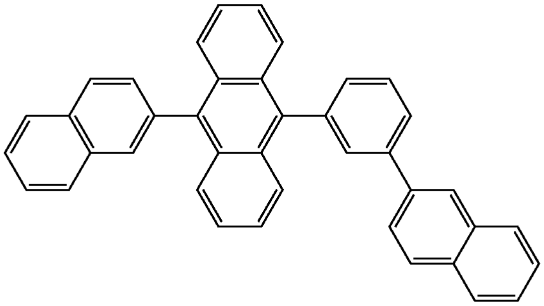
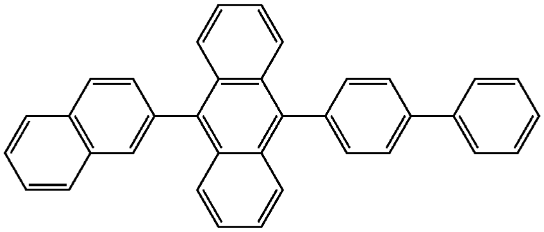
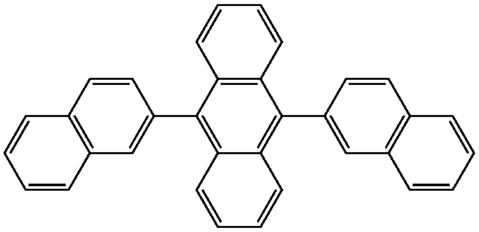
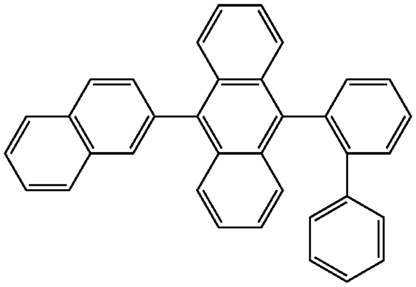
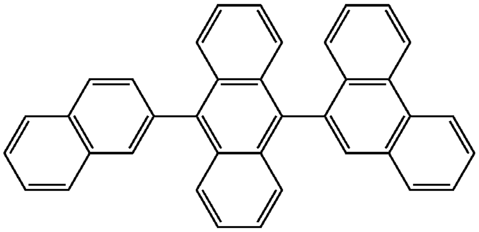
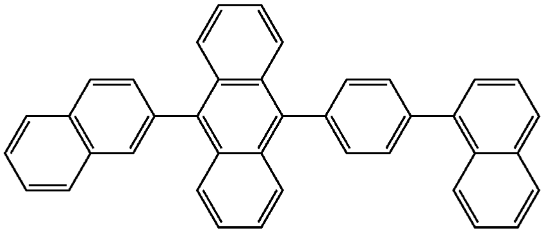
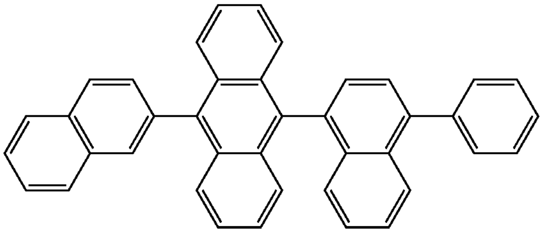
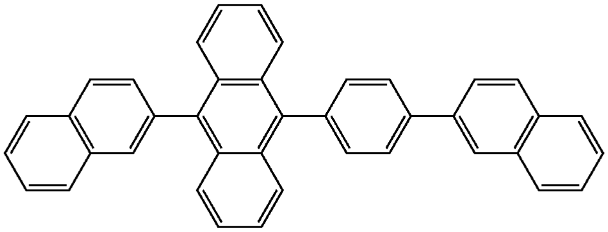
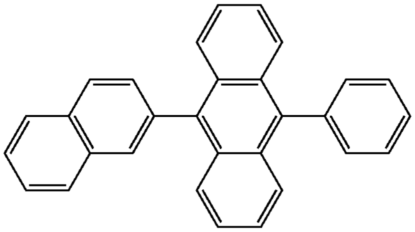

-continued
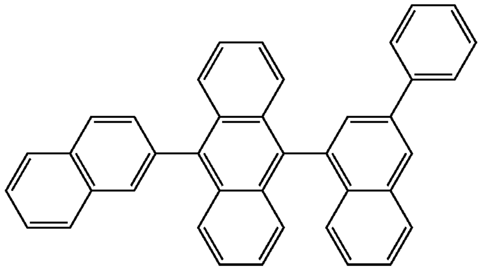
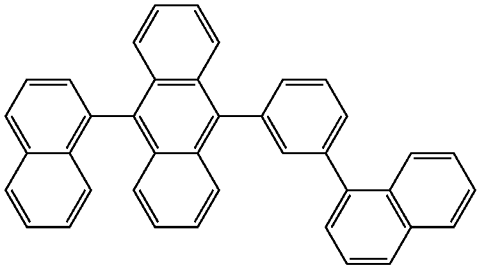
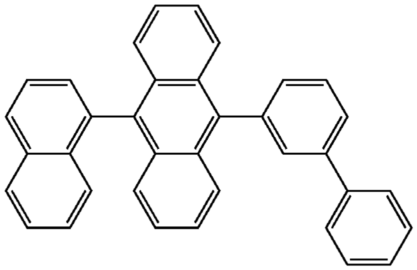
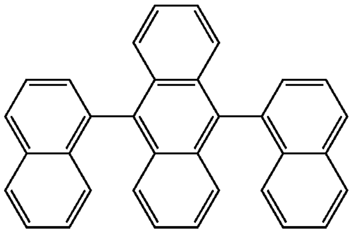
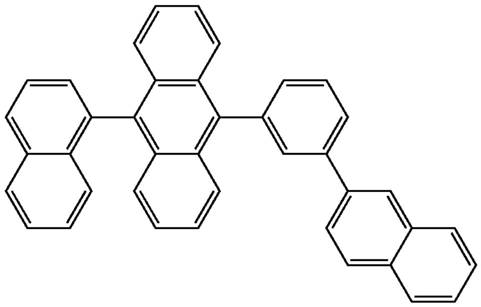
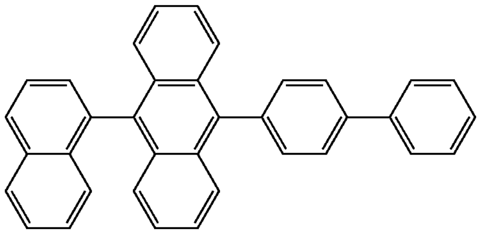
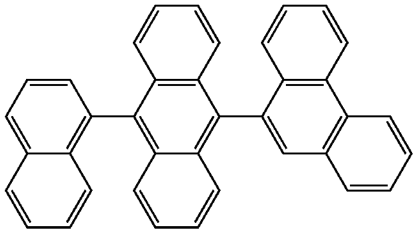
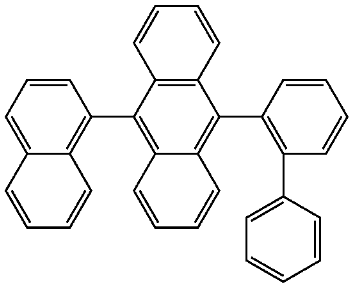
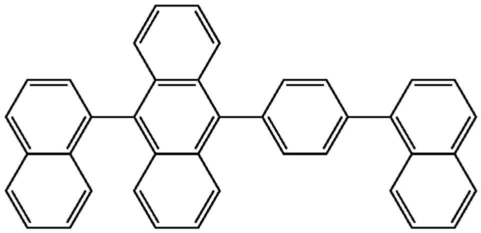
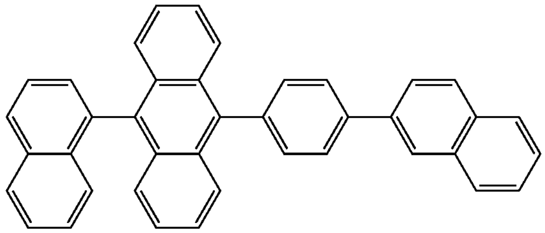
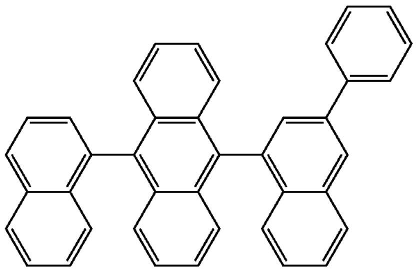
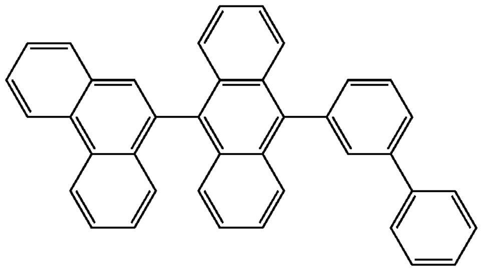

-continued
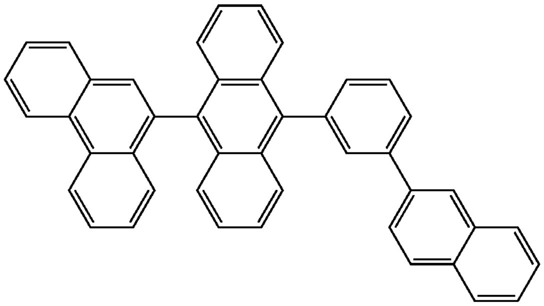
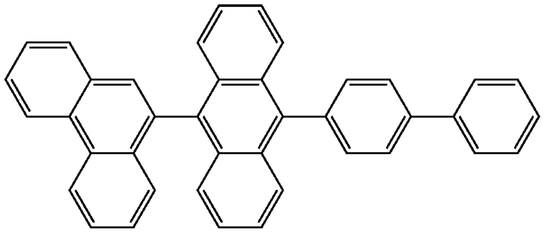
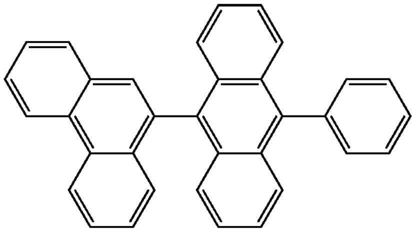
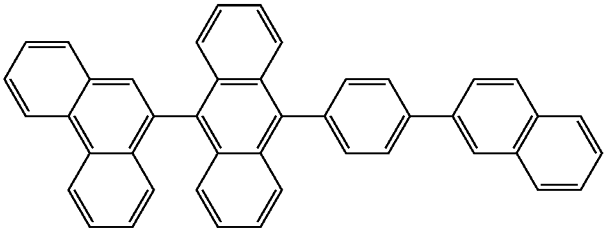
[Formula 177]
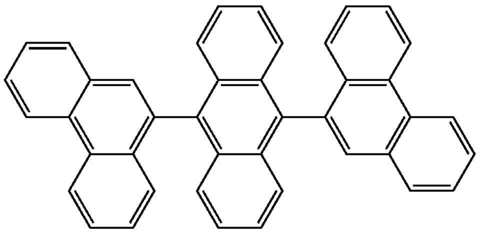
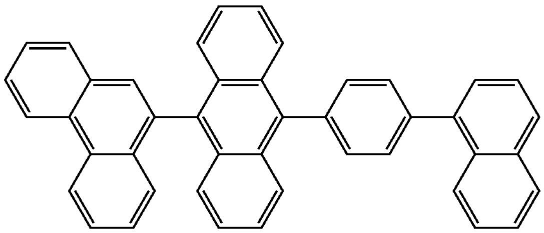
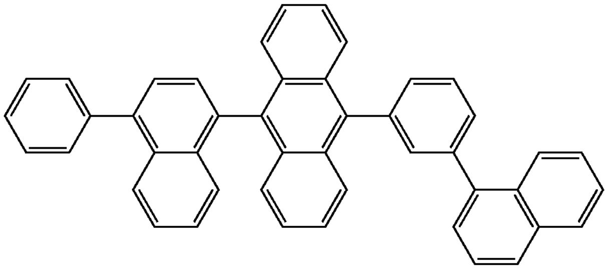
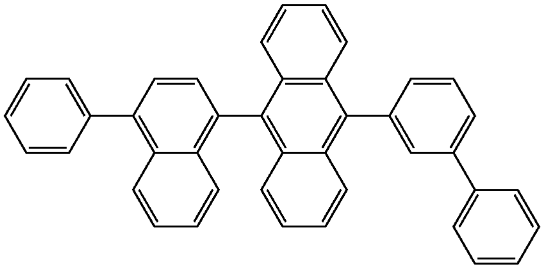
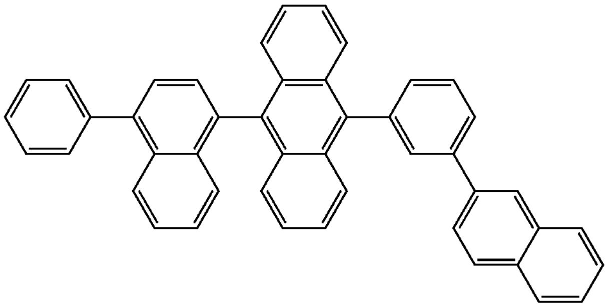
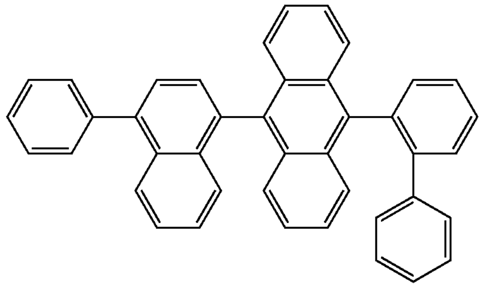

-continued
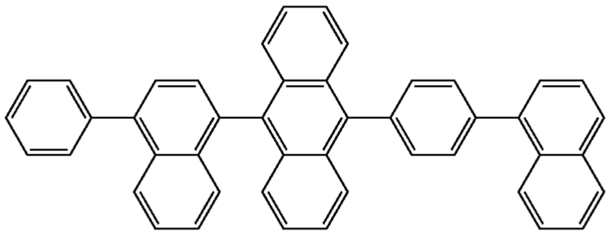
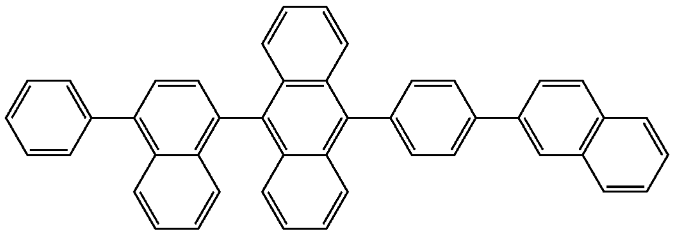
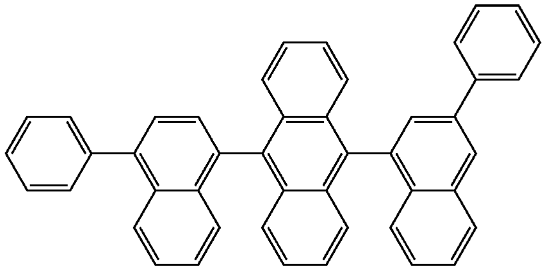
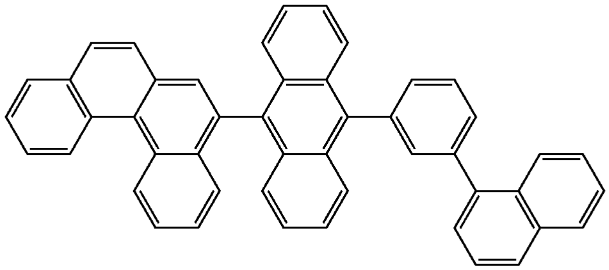
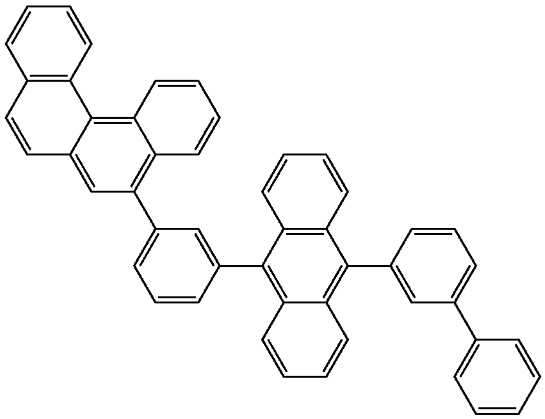
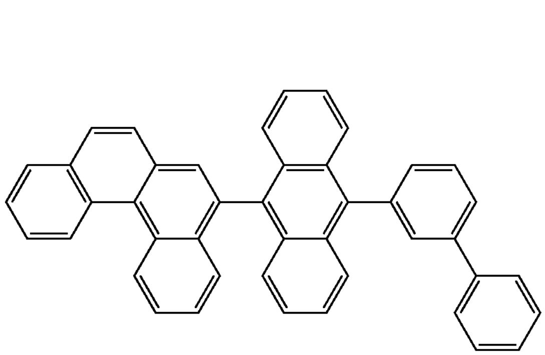

-continued
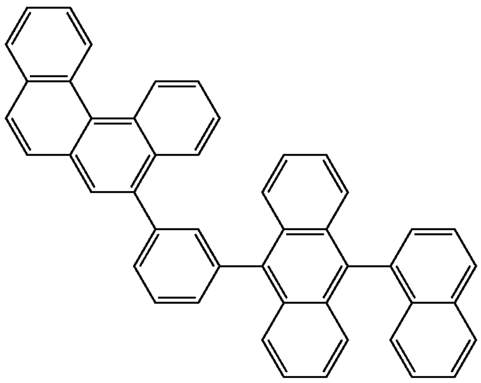
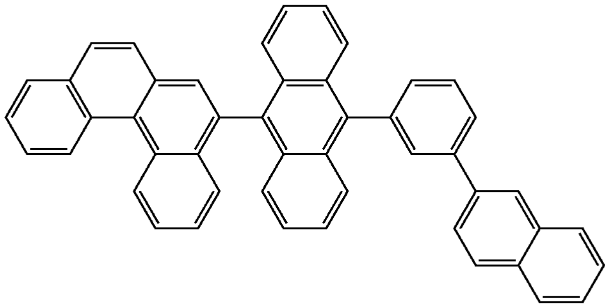
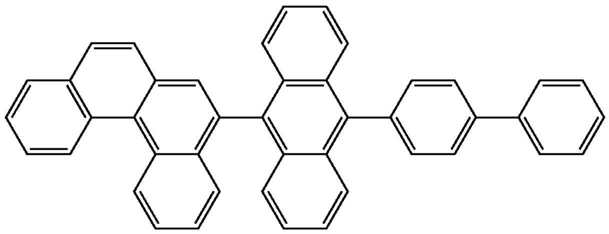
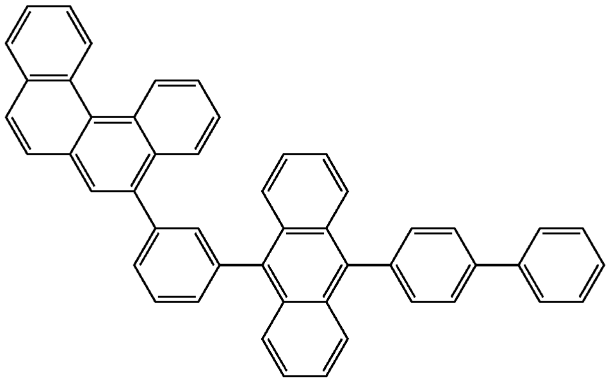
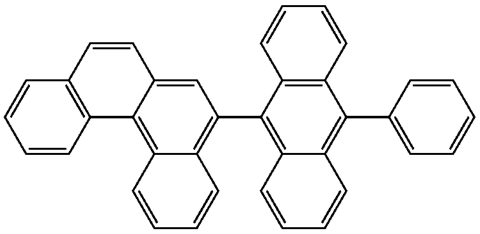
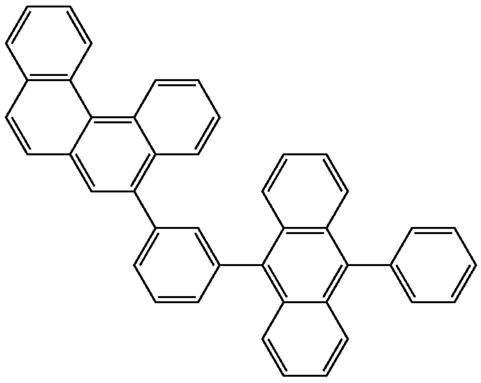
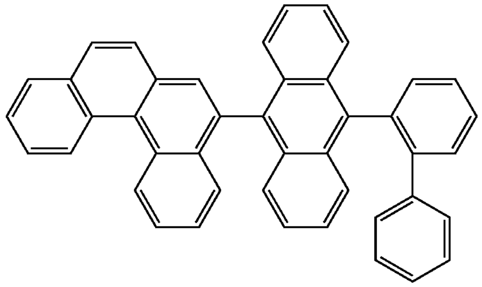

-continued
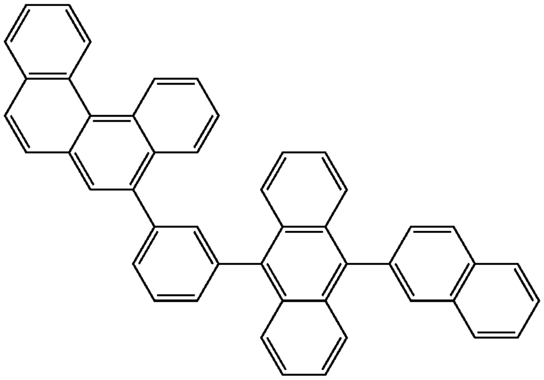
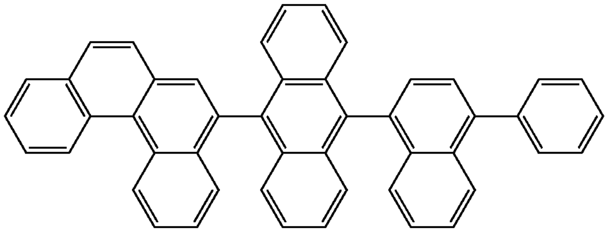
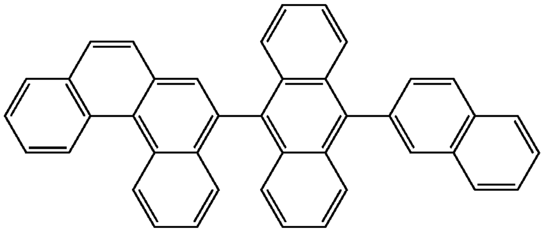
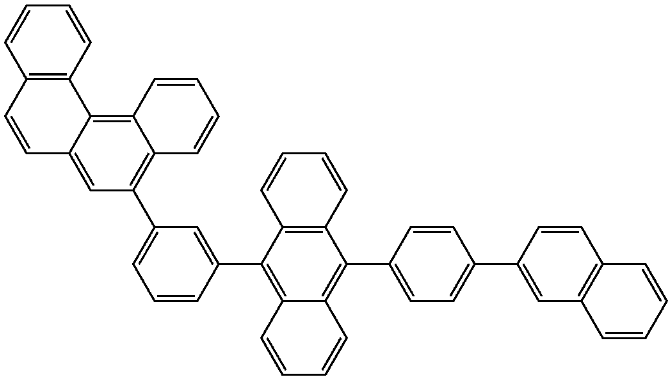
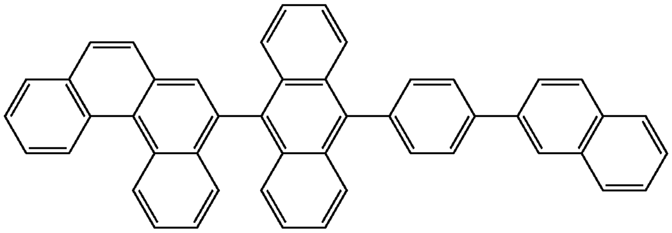
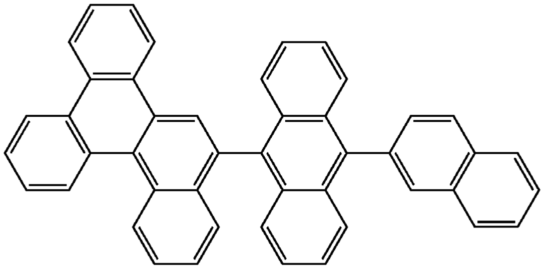
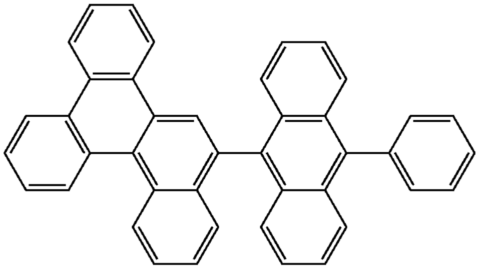

-continued
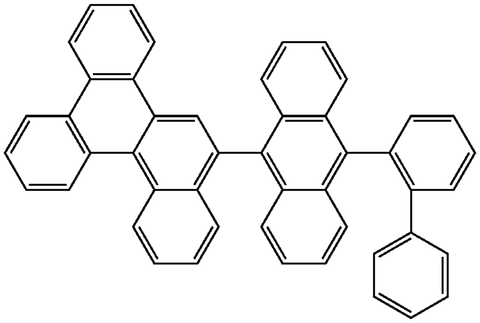
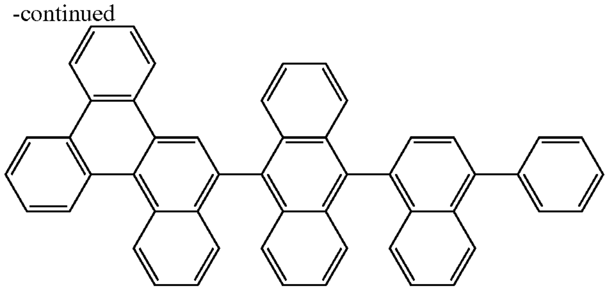
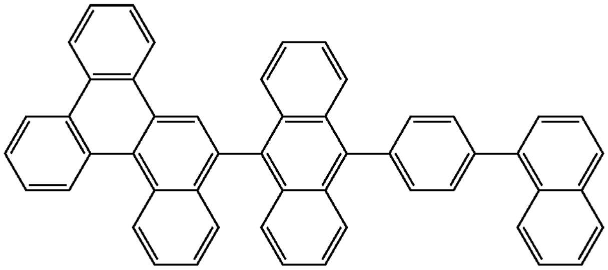
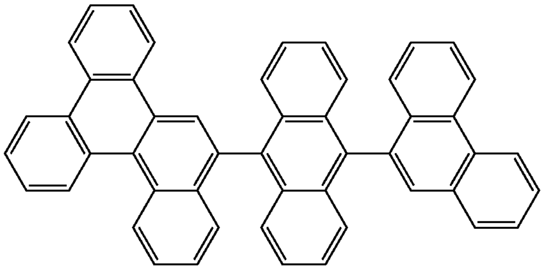
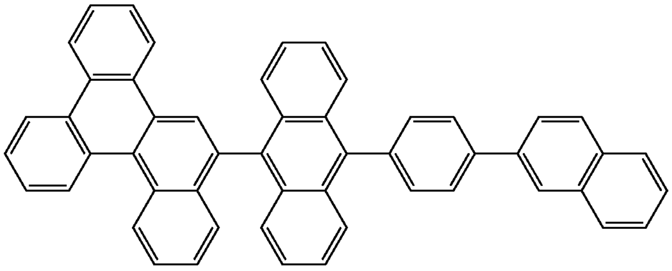
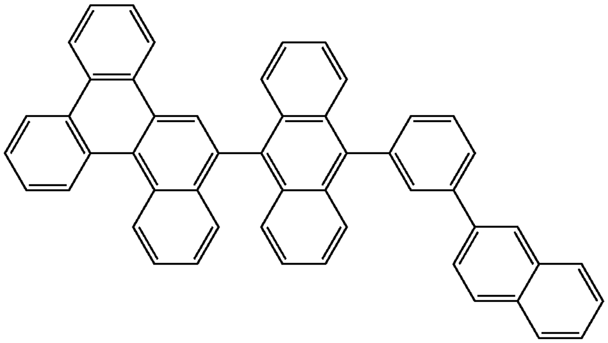

-continued
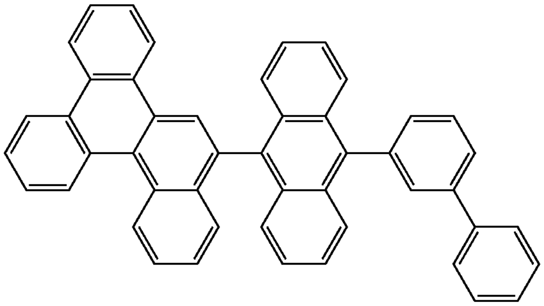
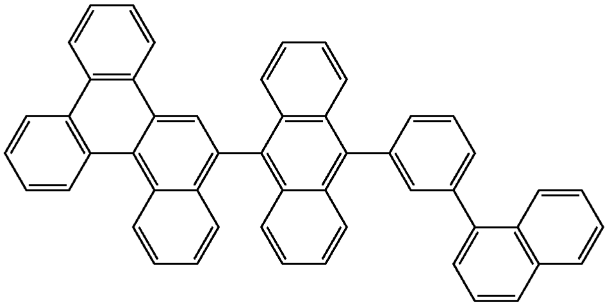
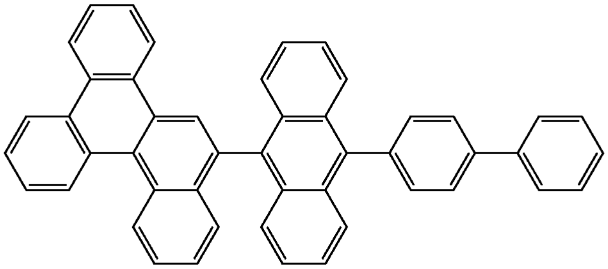
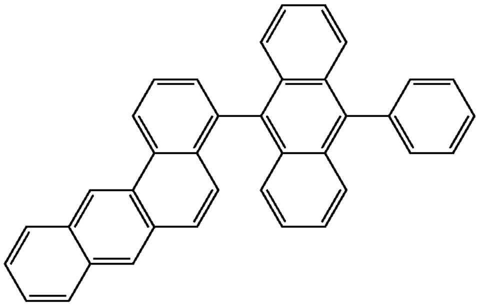
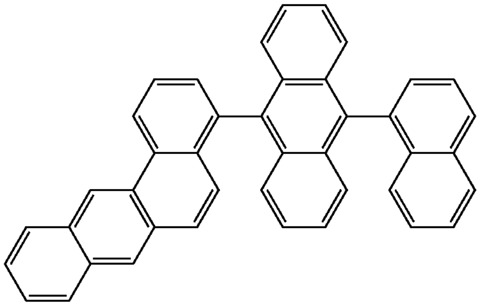
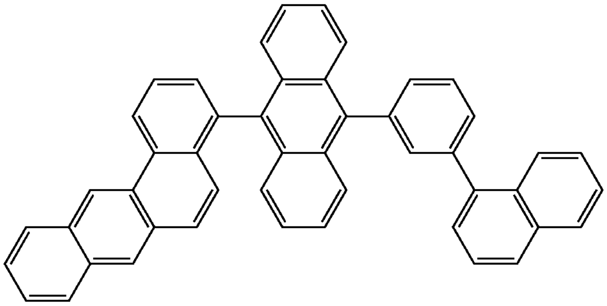
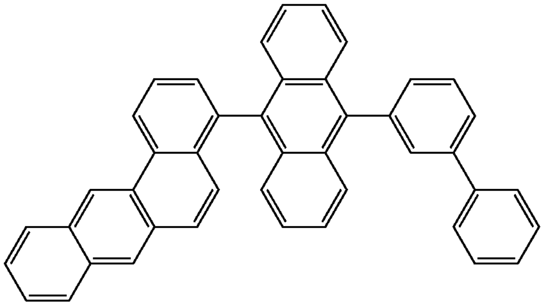
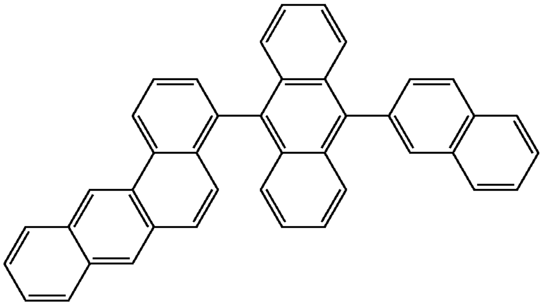

-continued
[Formula 178]
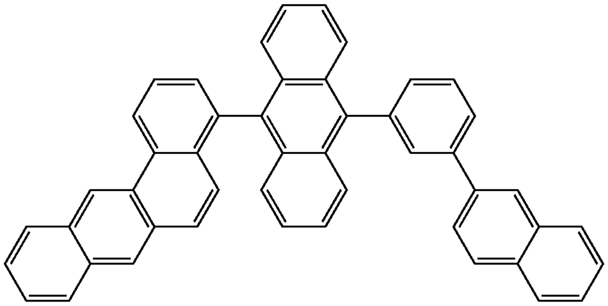
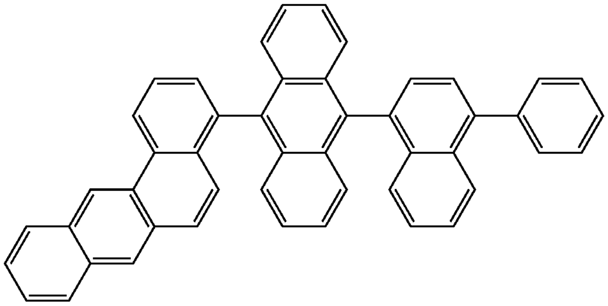
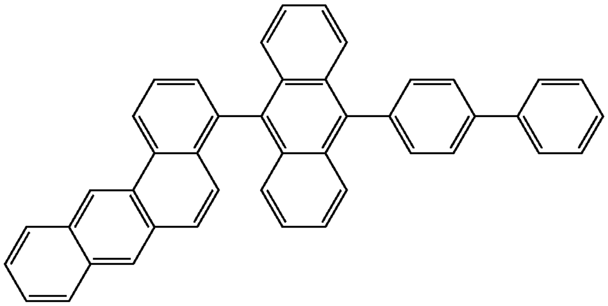
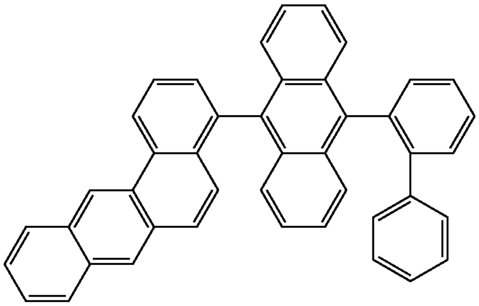
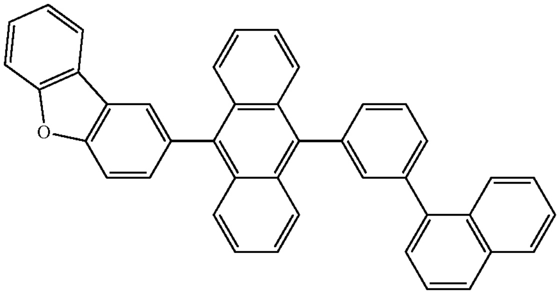
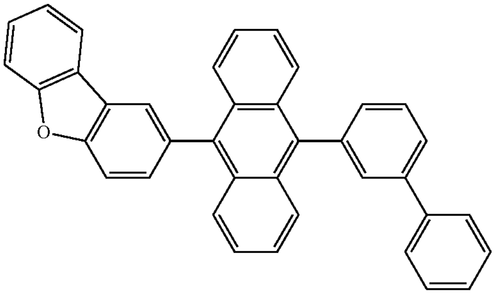
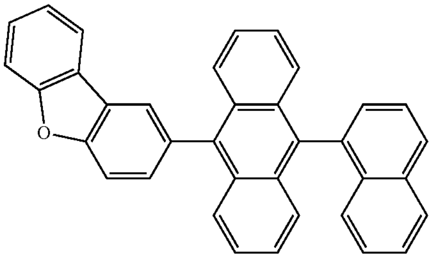
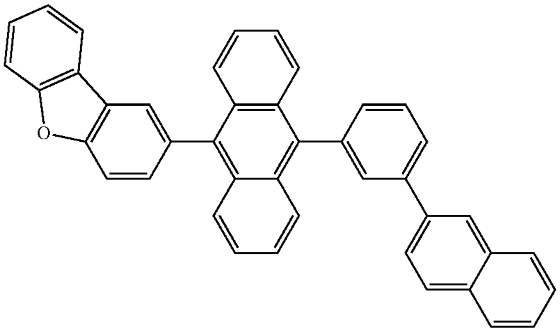

-continued
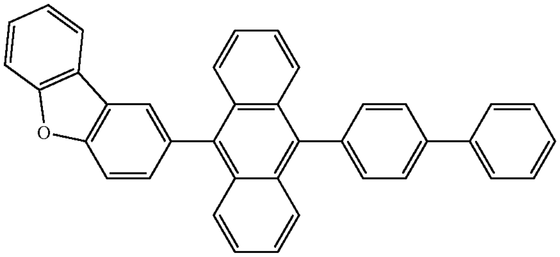
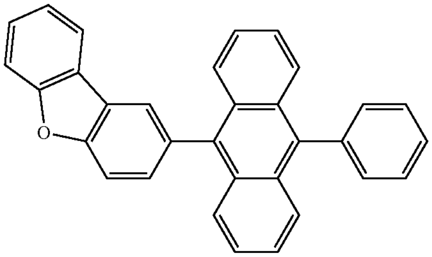
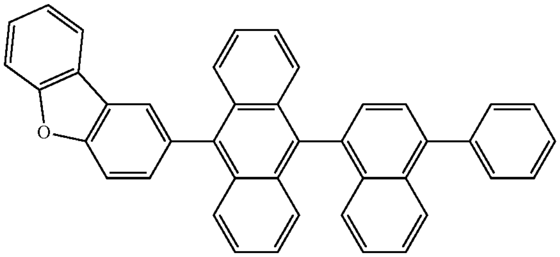
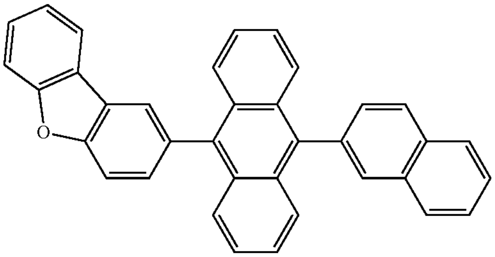
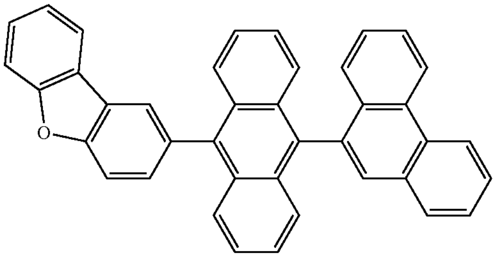
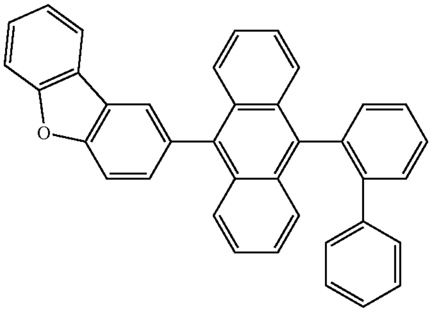
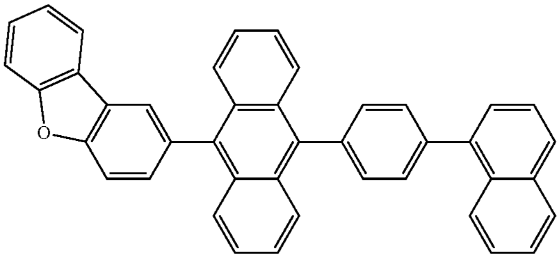
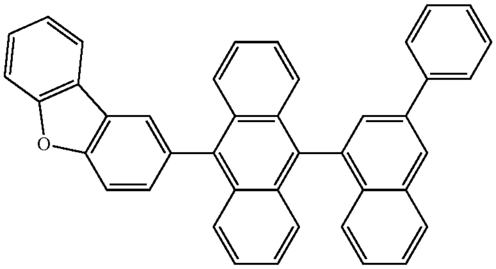
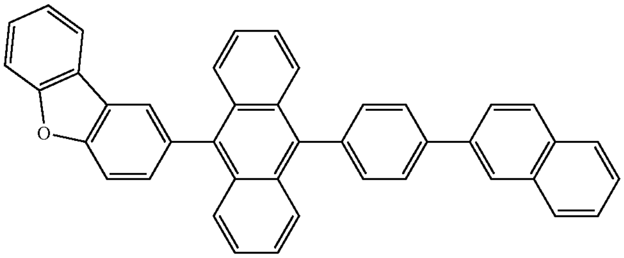
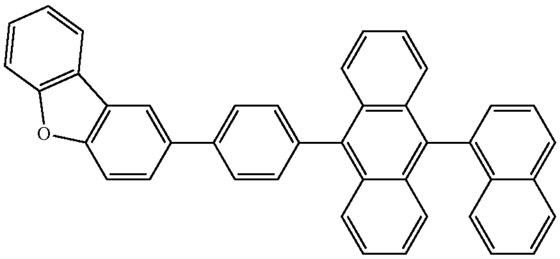
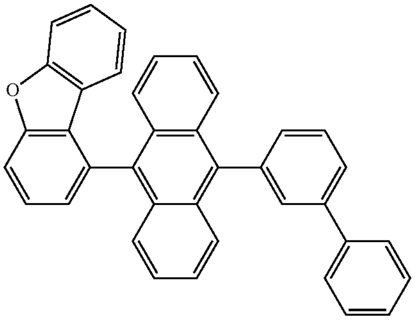

-continued
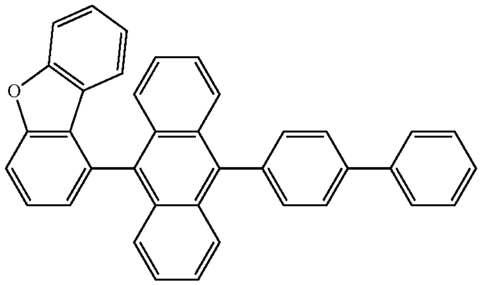
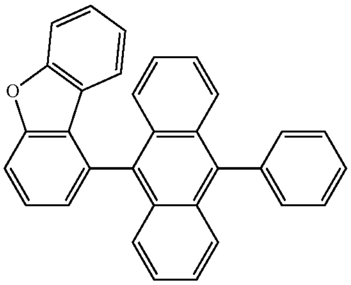
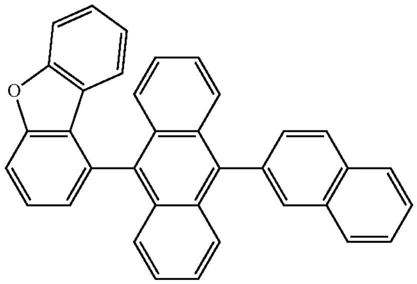
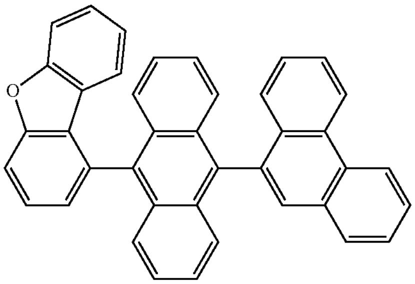
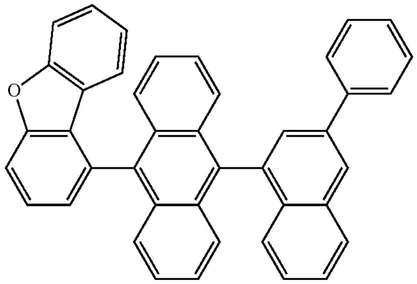
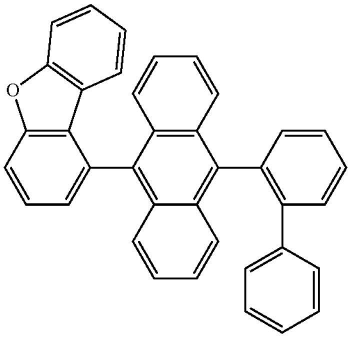
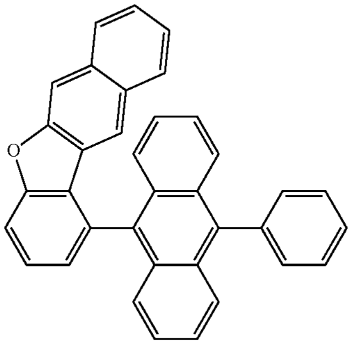
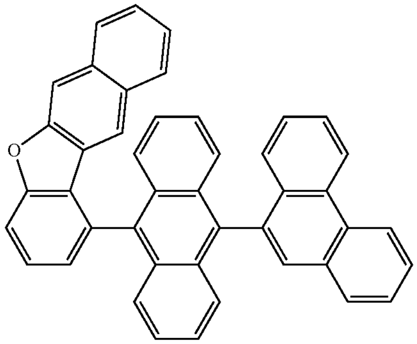
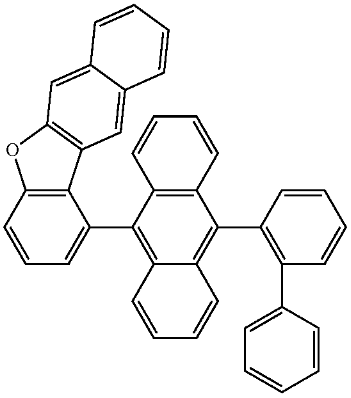

-continued
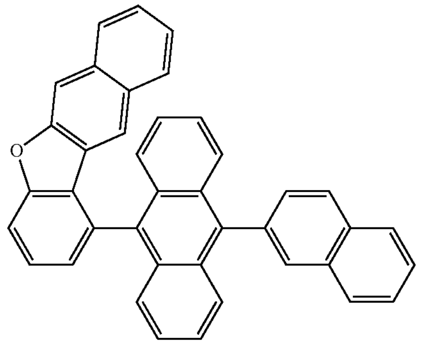
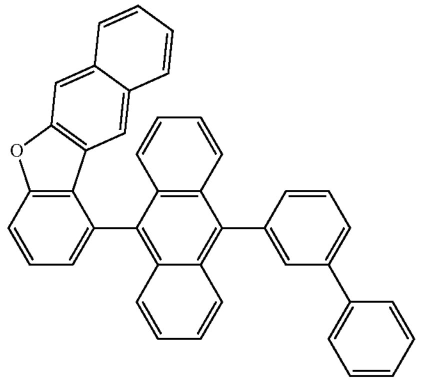
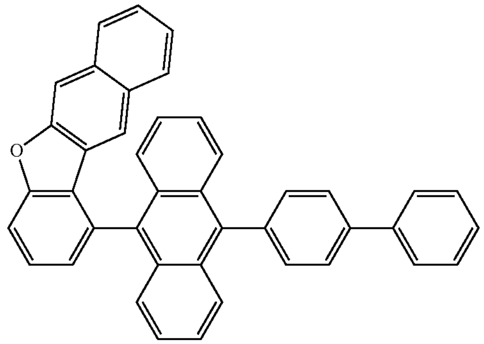
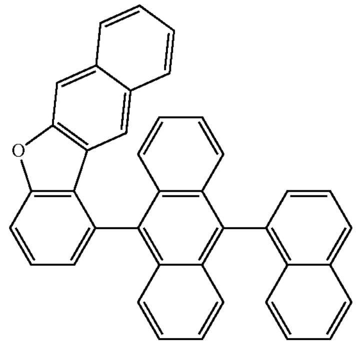
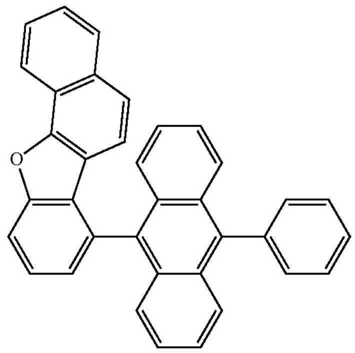
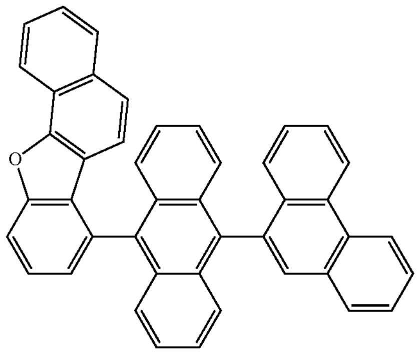
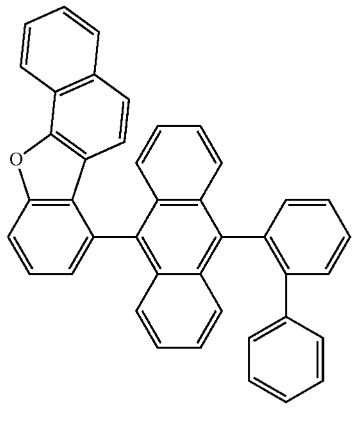
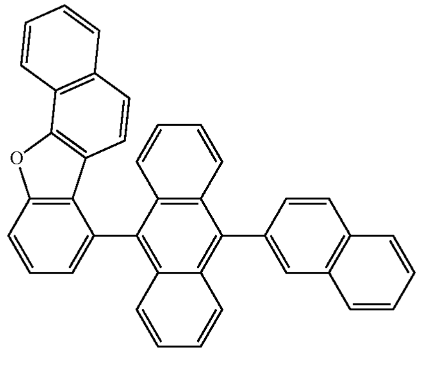
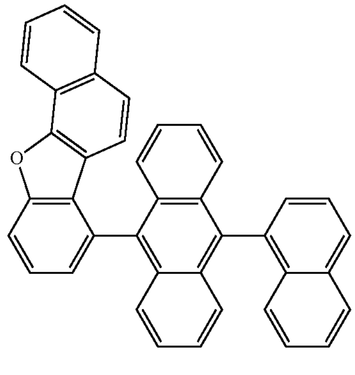

-continued
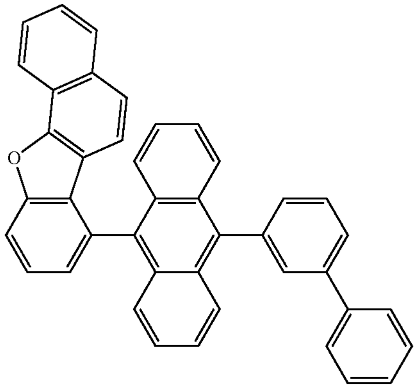
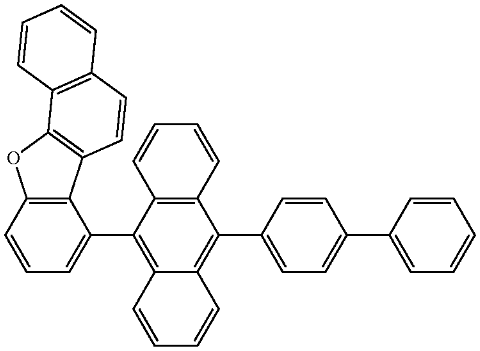
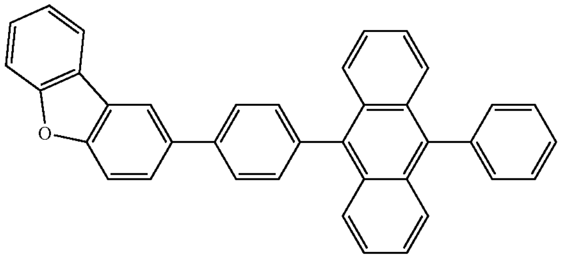
[Formula 179]
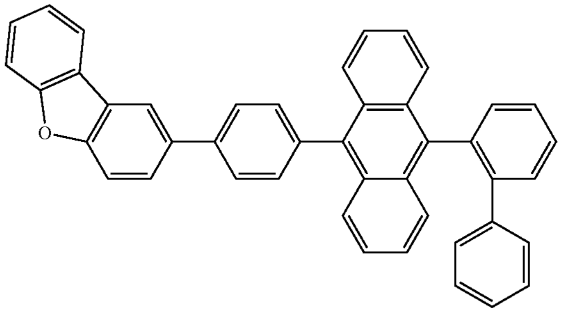
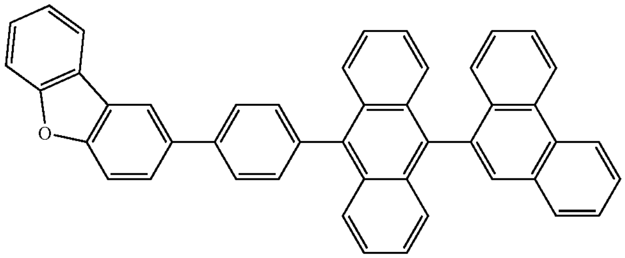
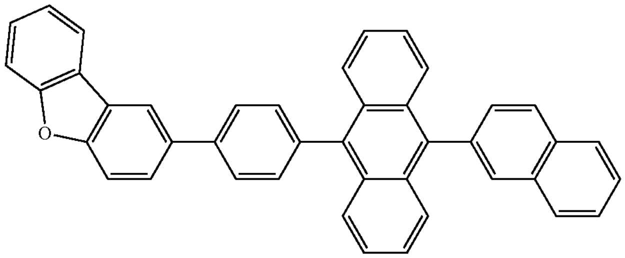

-continued
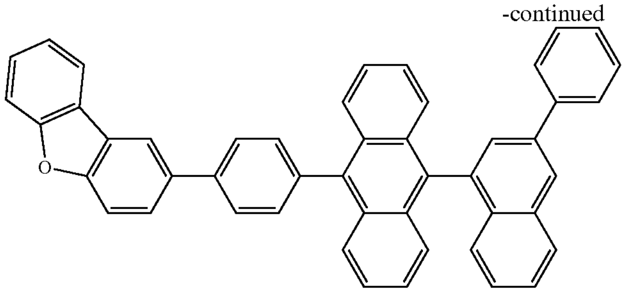
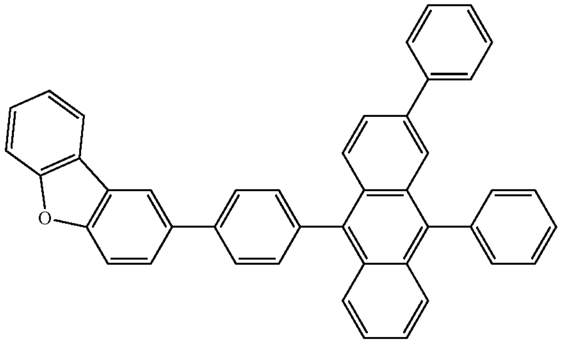
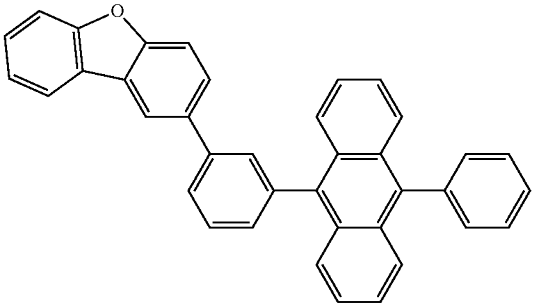
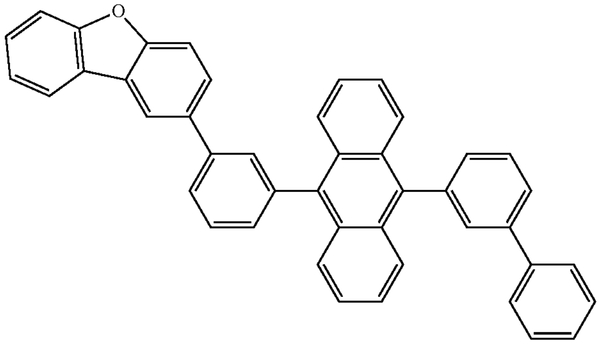
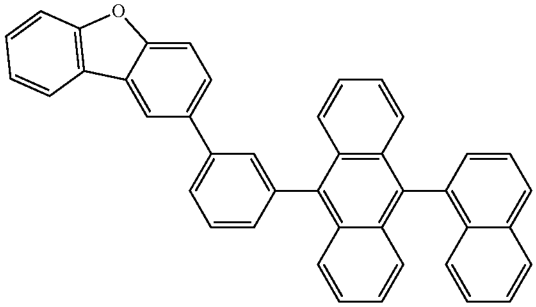
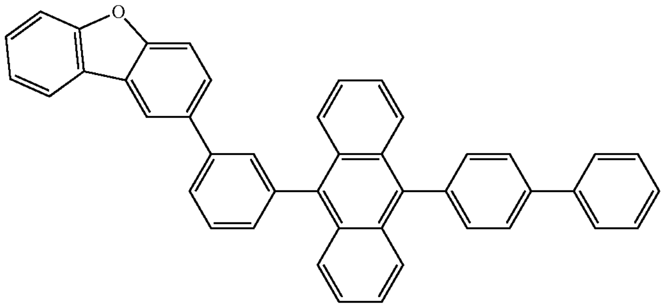
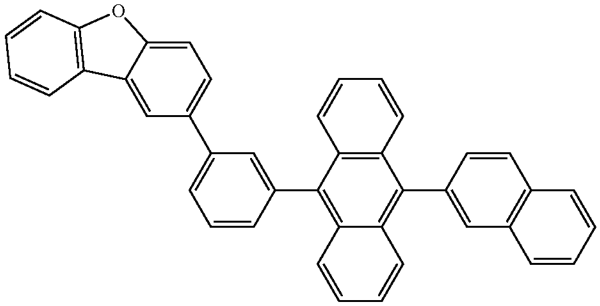

-continued
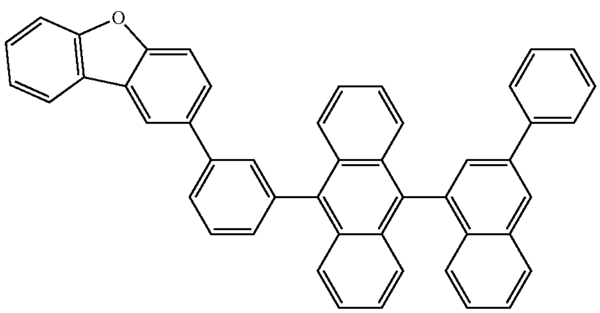
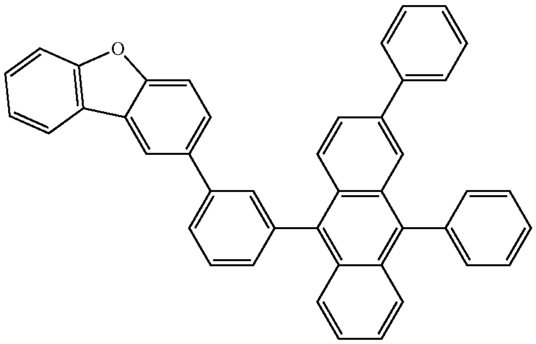
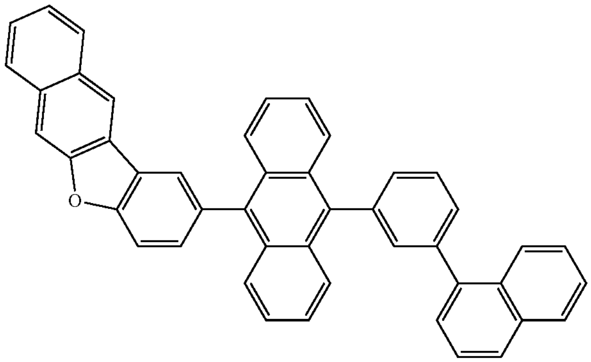
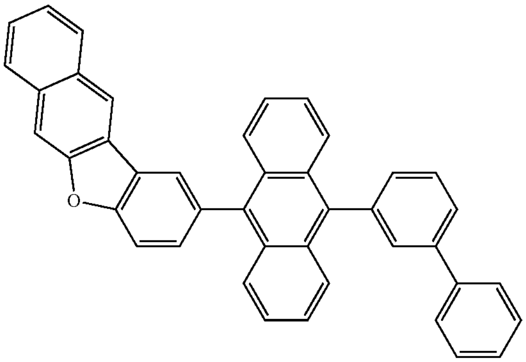
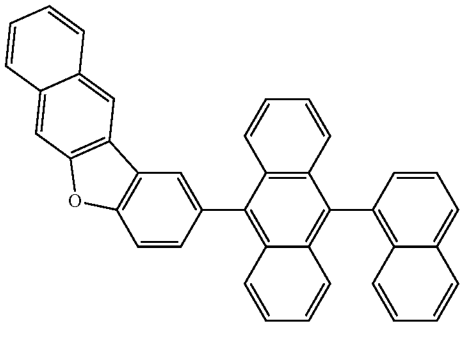
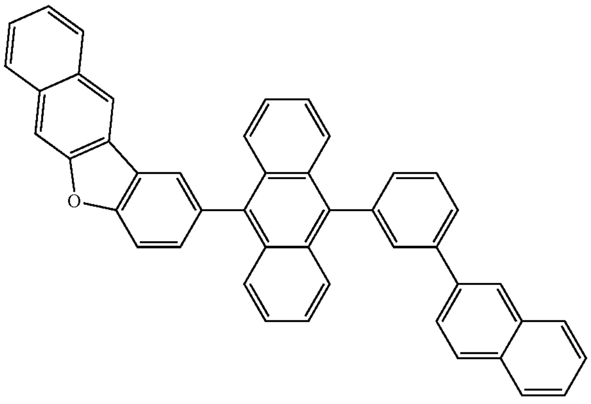
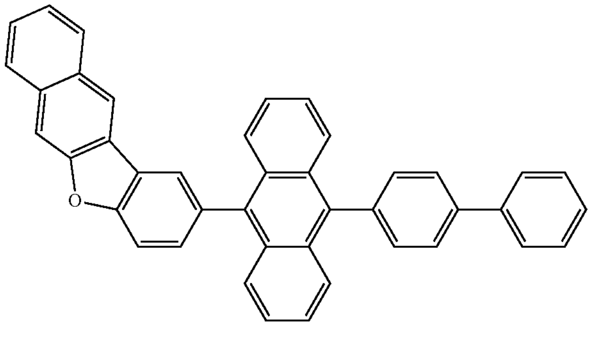
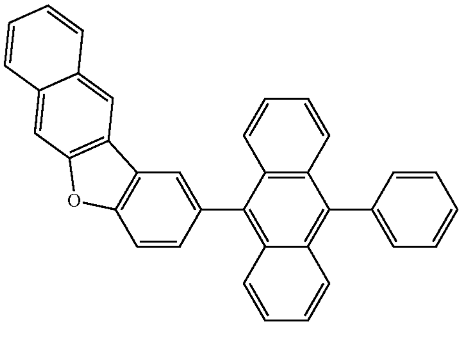

-continued
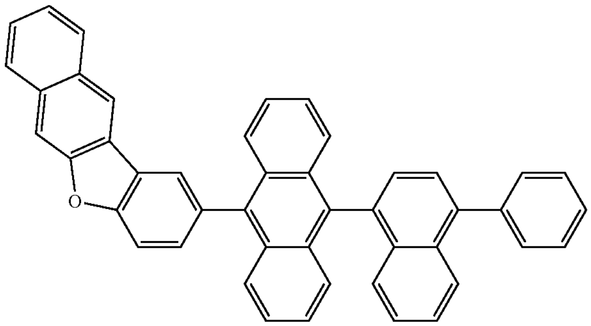
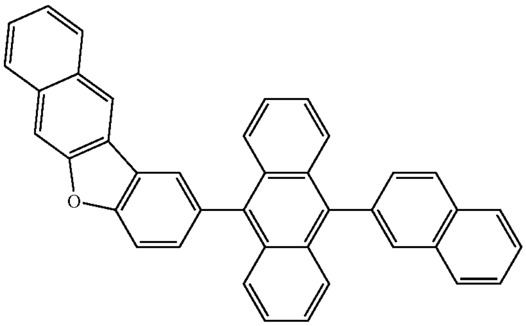
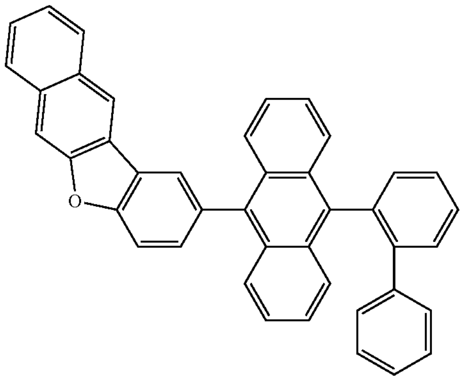
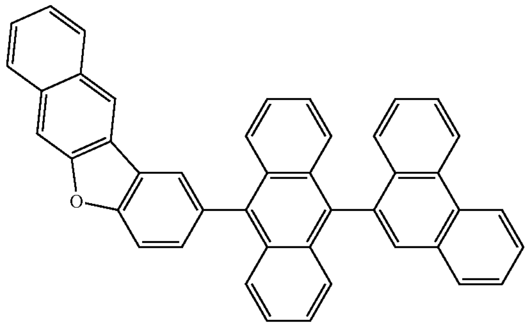
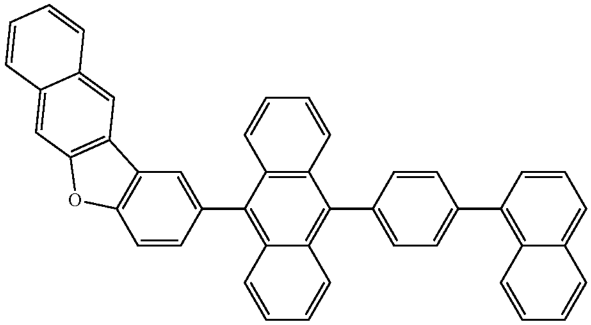
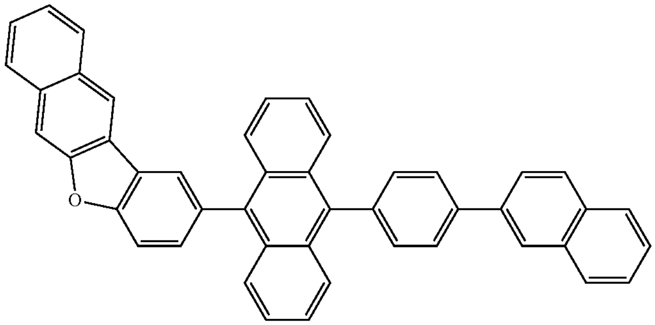
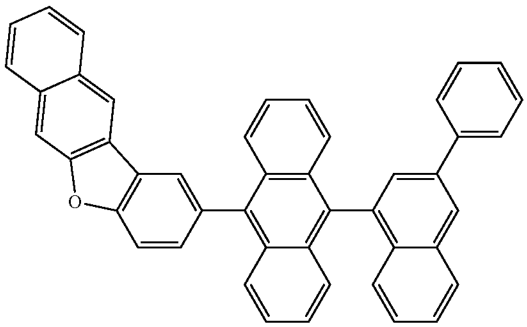

-continued
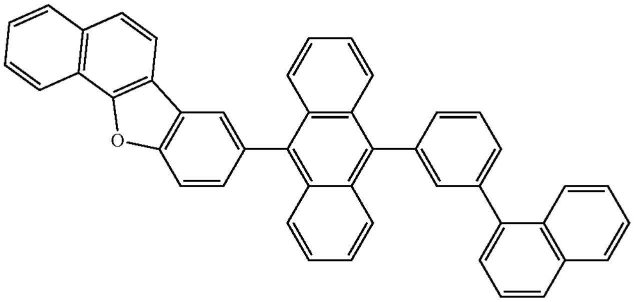
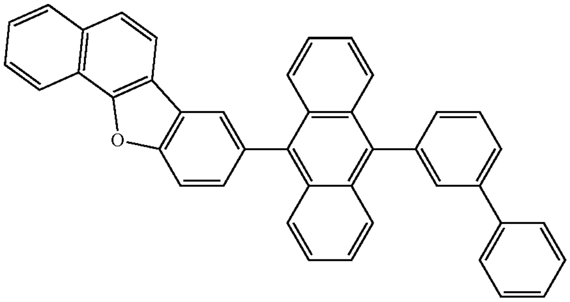
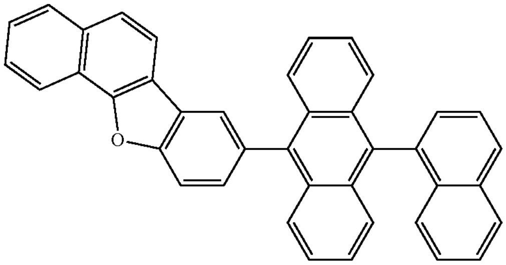
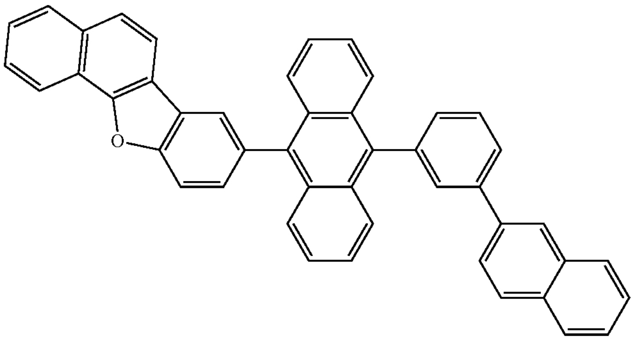
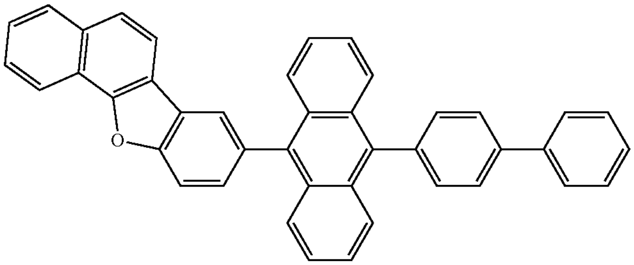
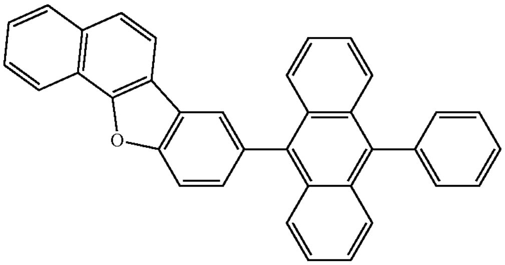
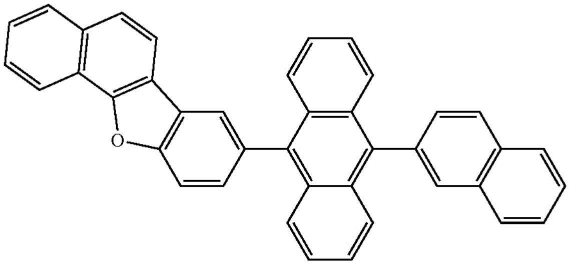
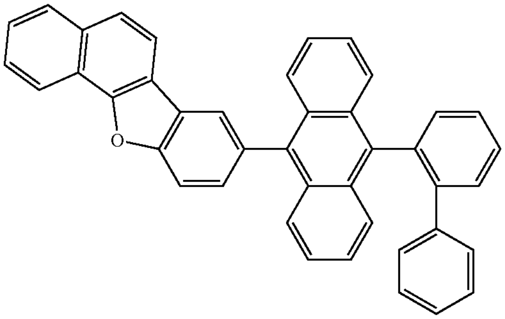

-continued
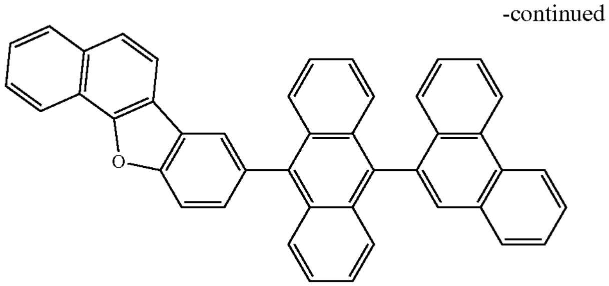
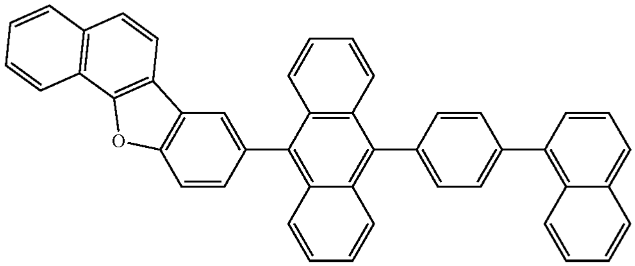
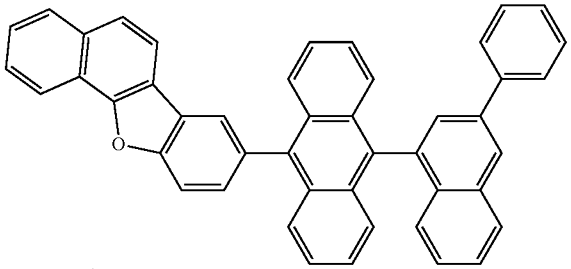
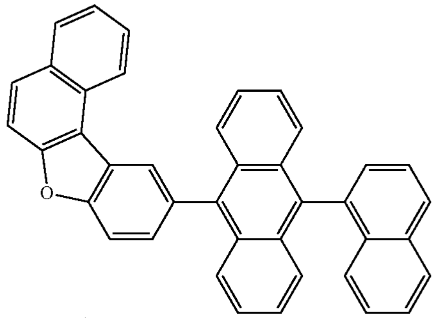
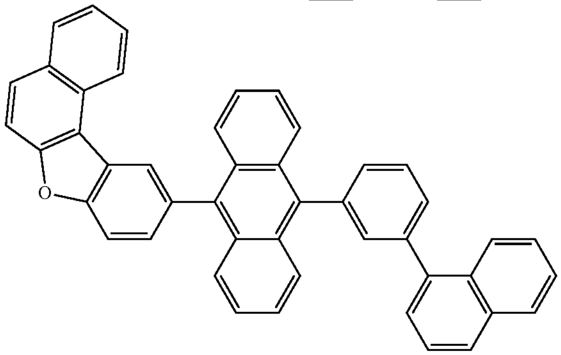
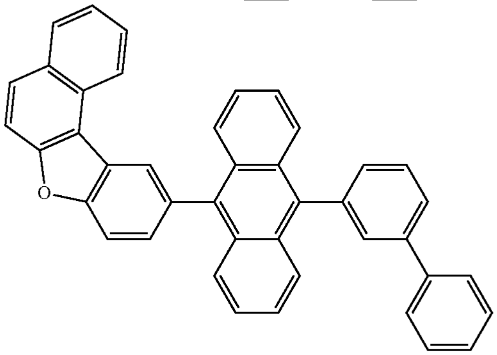
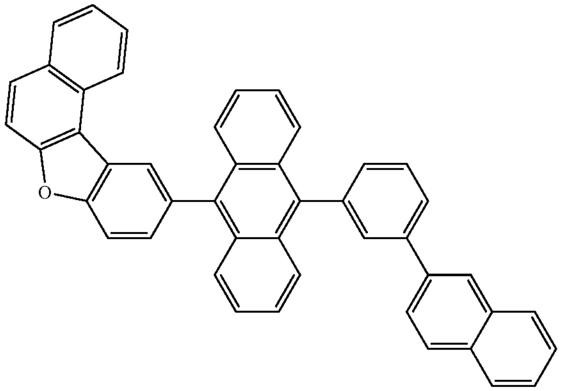

-continued
[Formula 180]
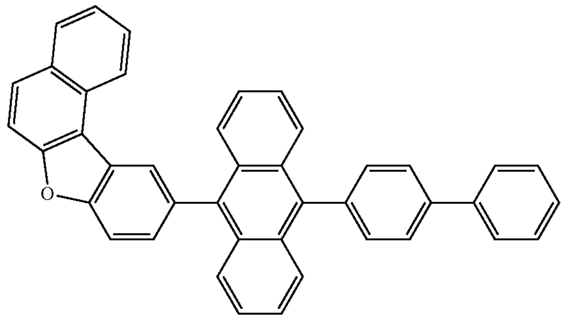
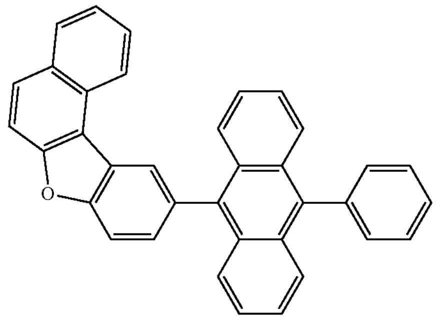
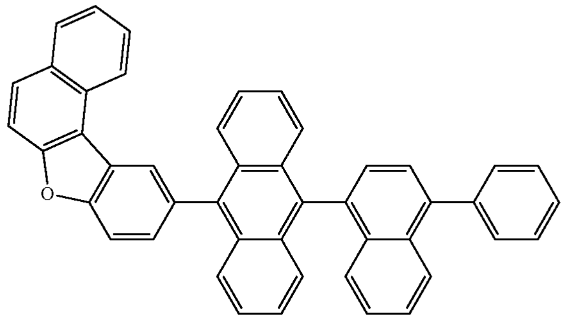
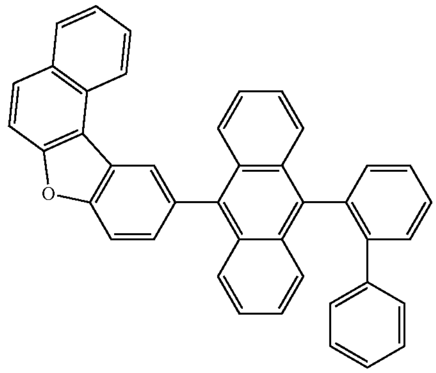
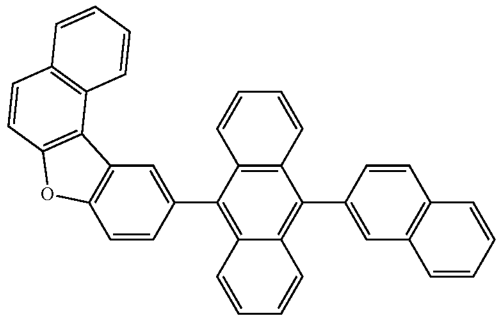
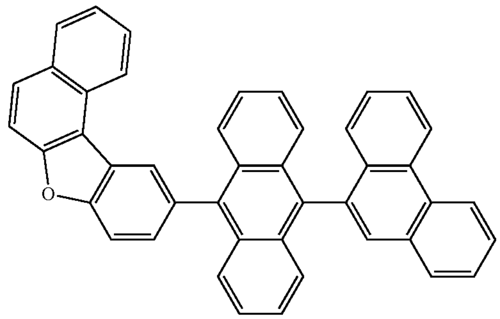
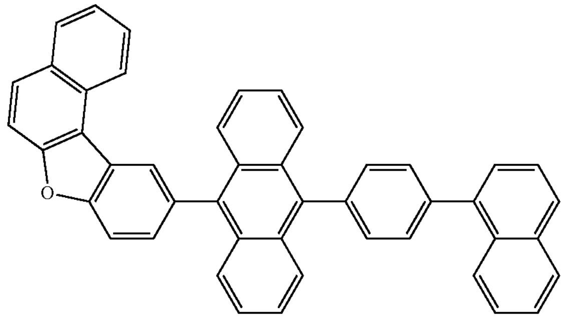
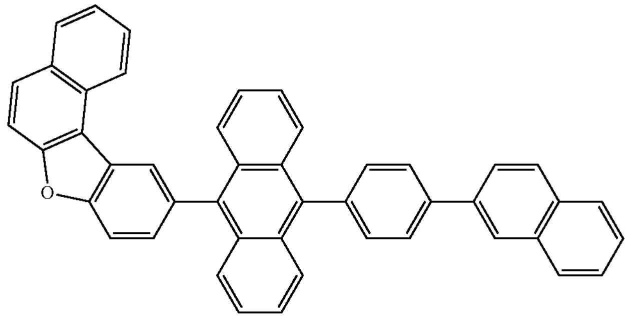

-continued
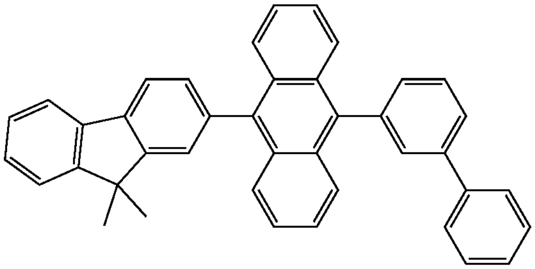
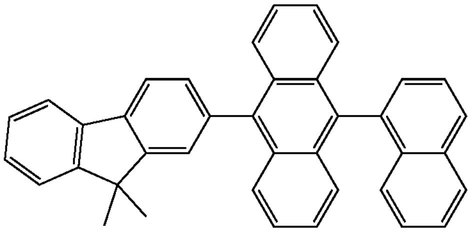
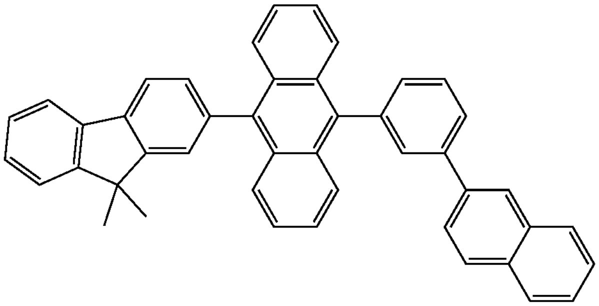
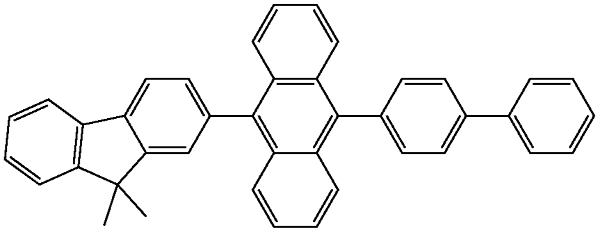
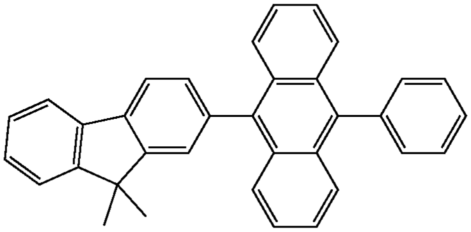
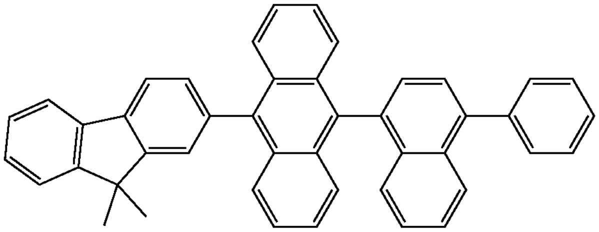
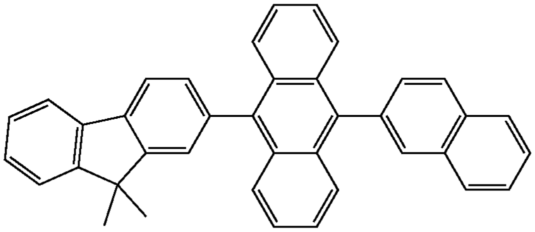
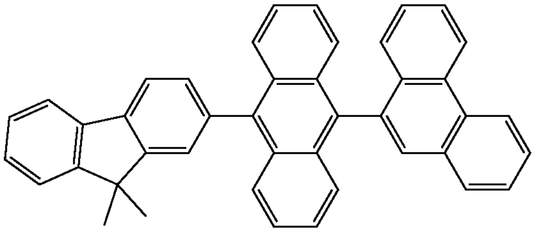
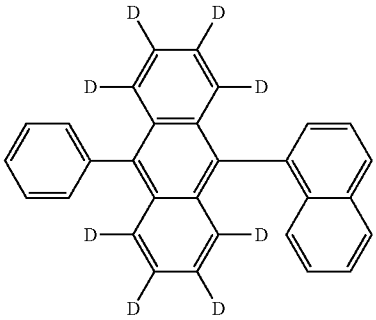
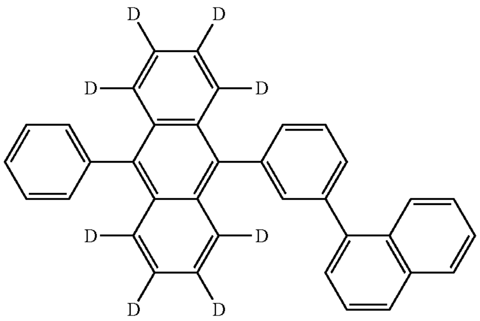
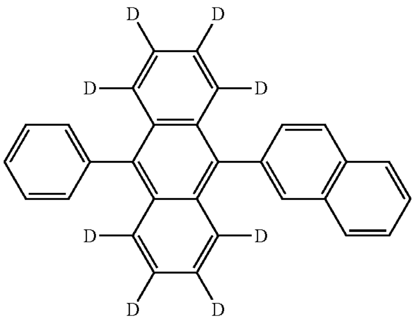

-continued
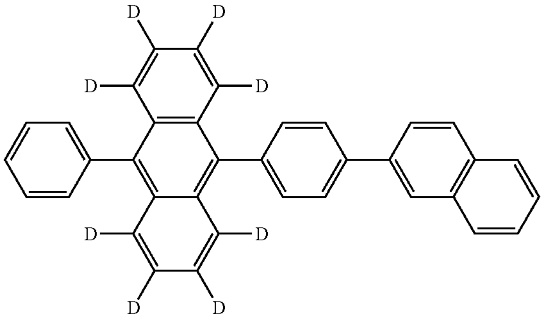
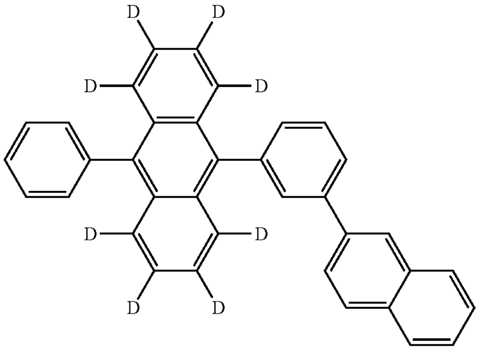
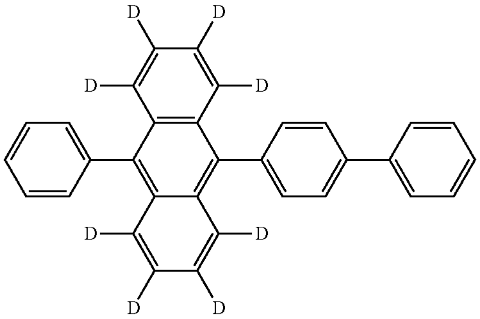
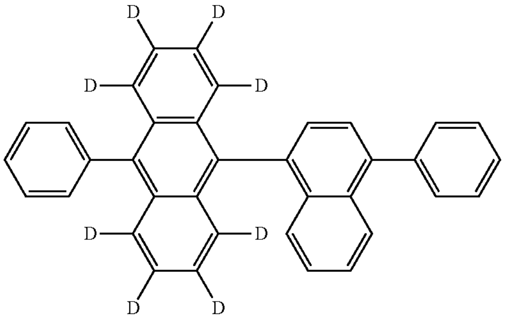
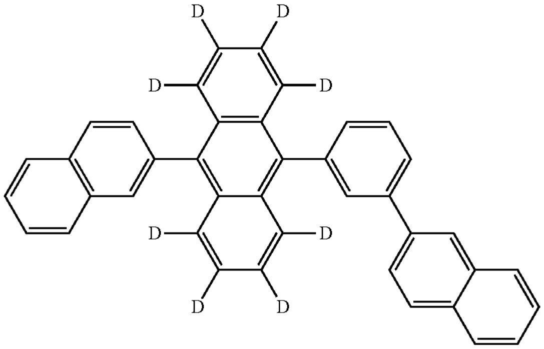
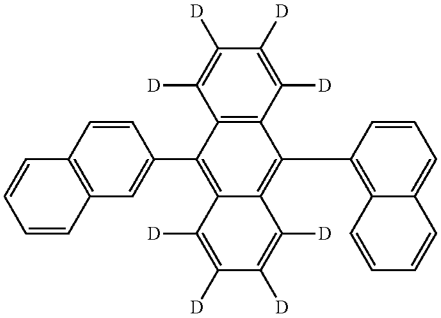
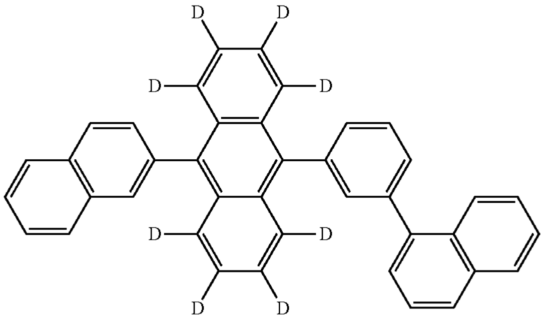
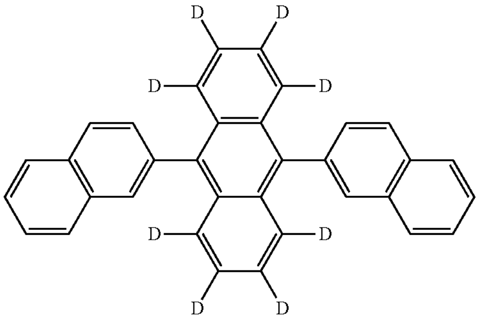
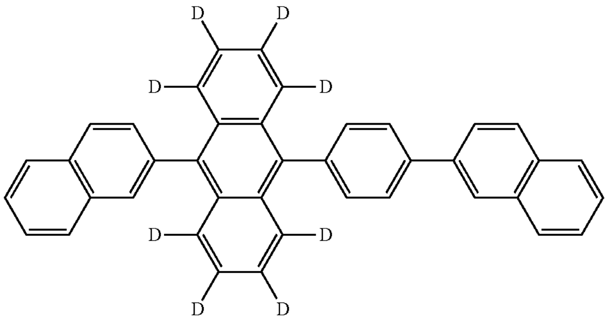

-continued
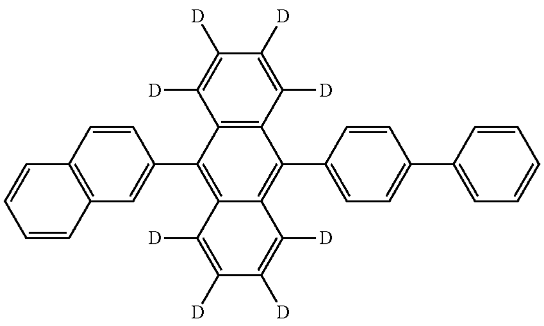
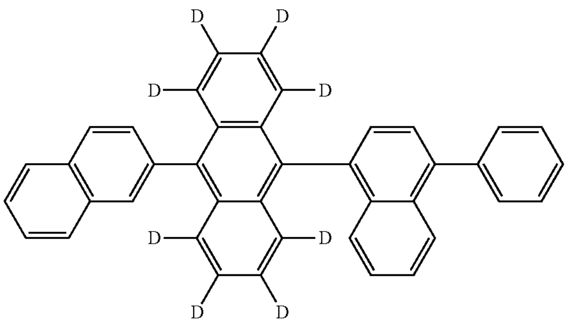
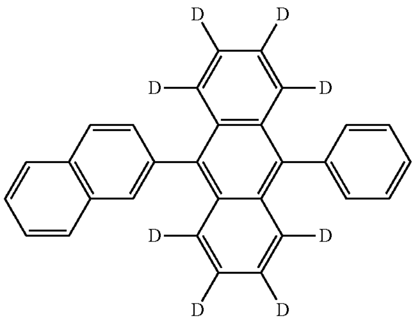
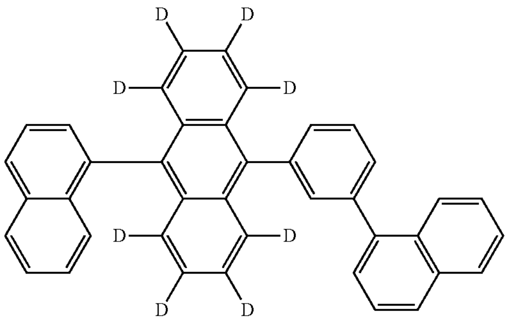
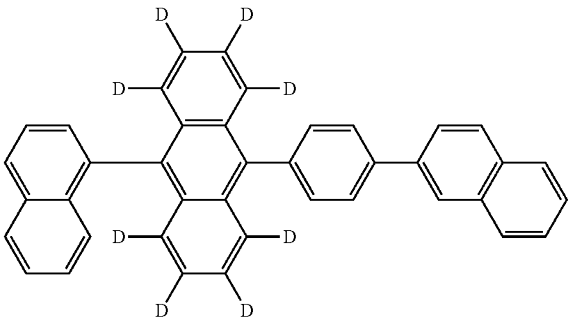
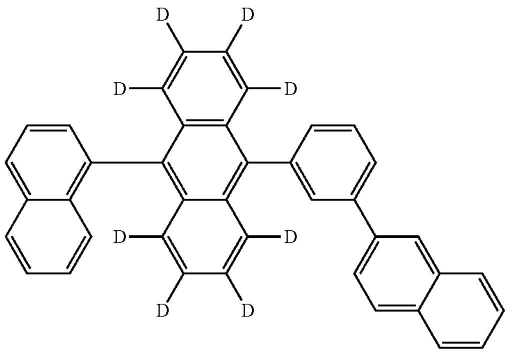
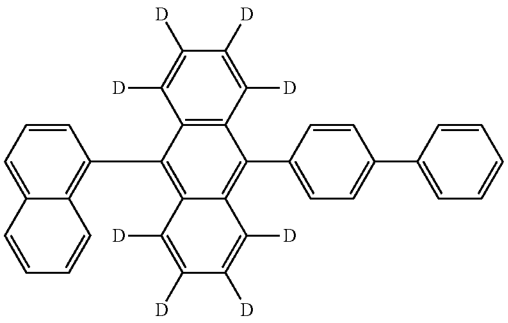
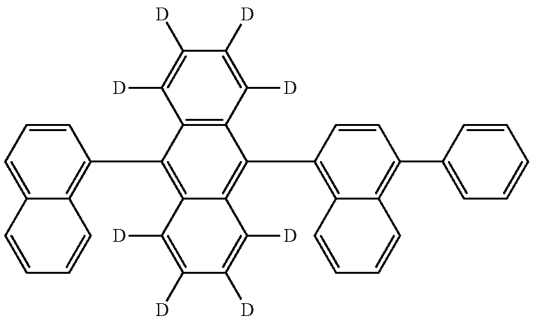
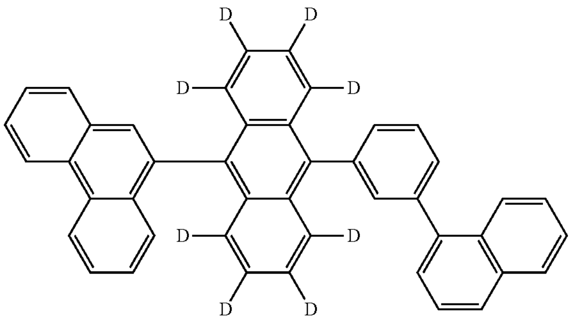
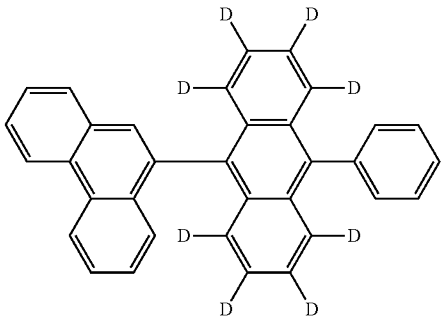

-continued
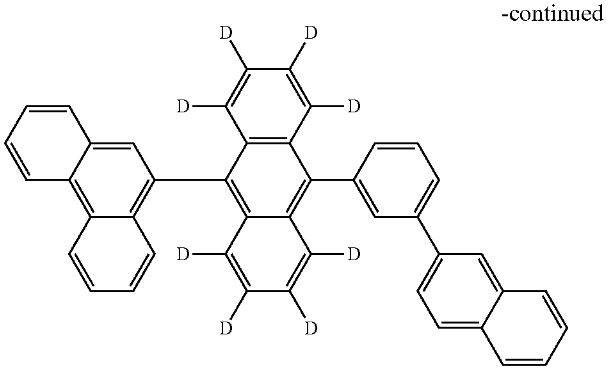
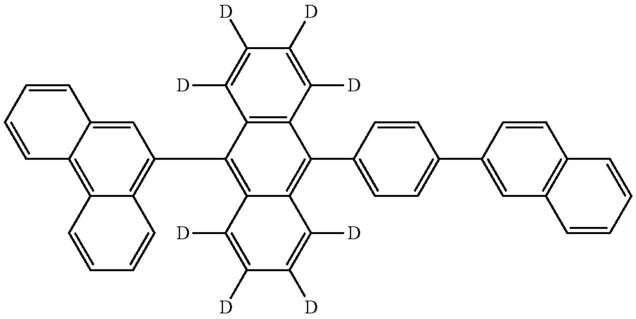
[Formula 181]
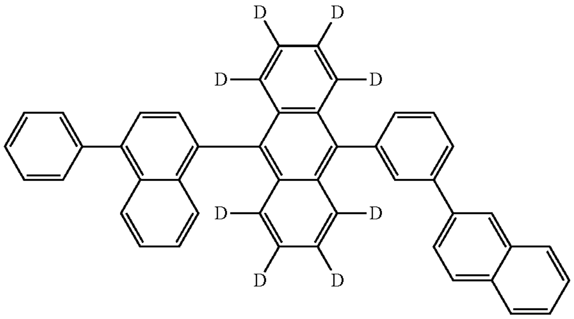
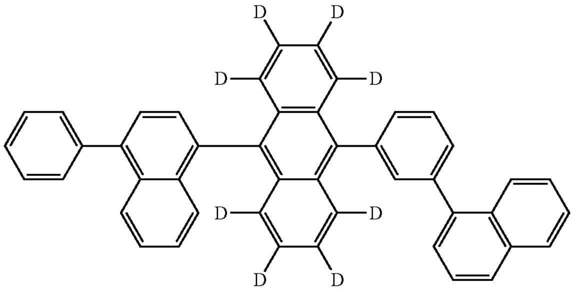
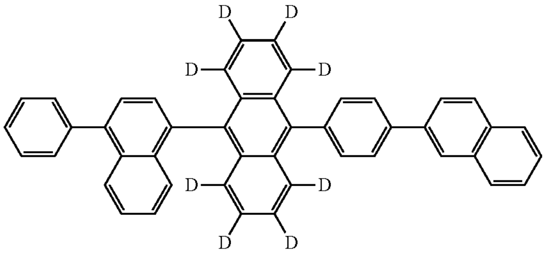
-continued
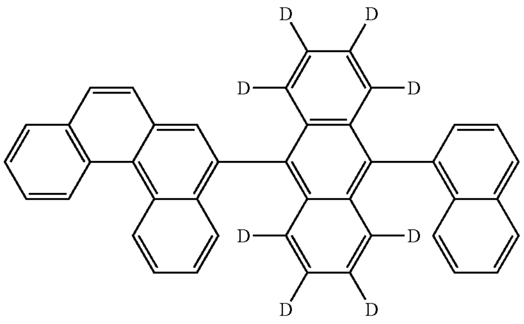
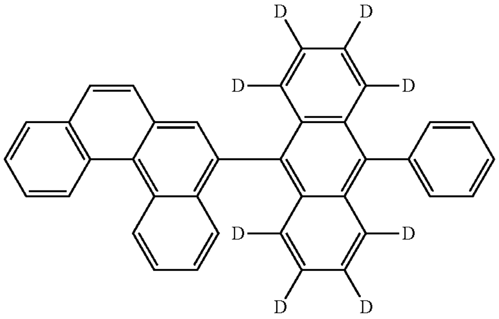

-continued
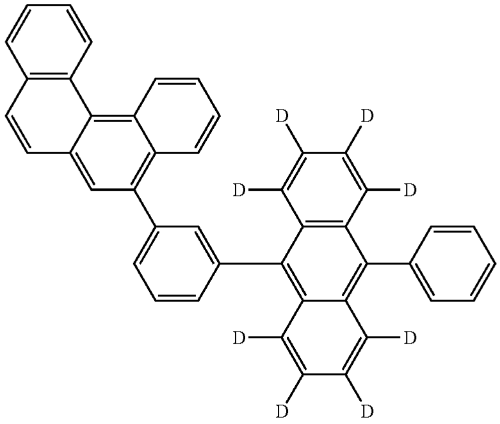
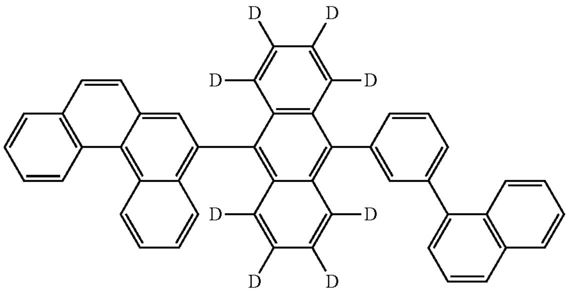
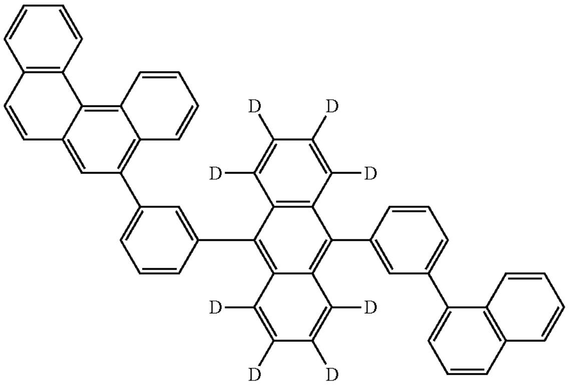
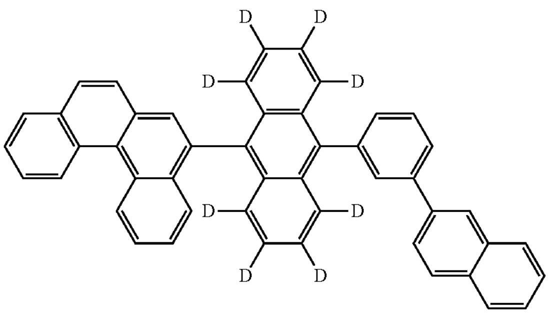
-continued
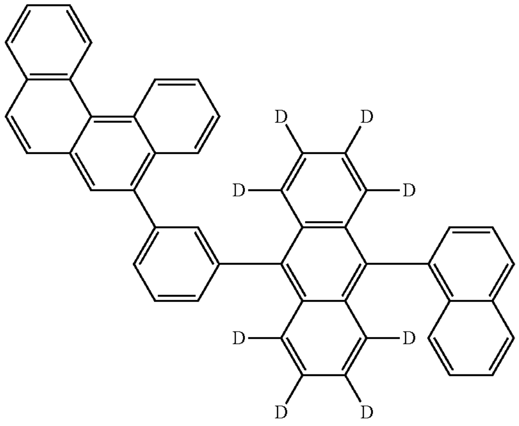
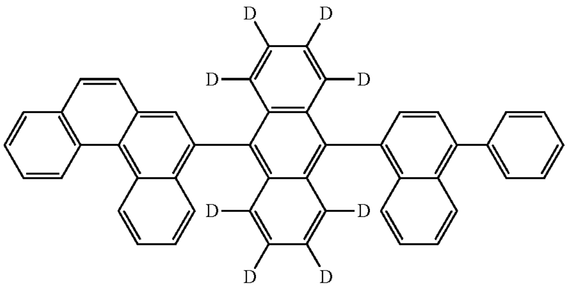
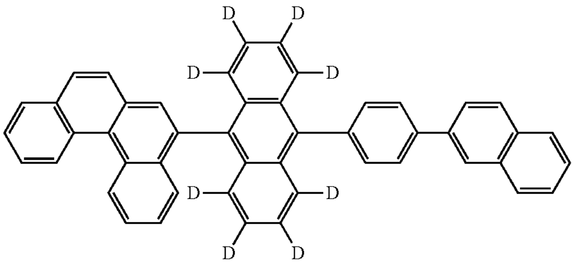
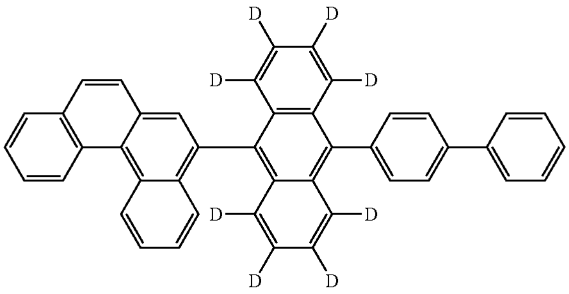
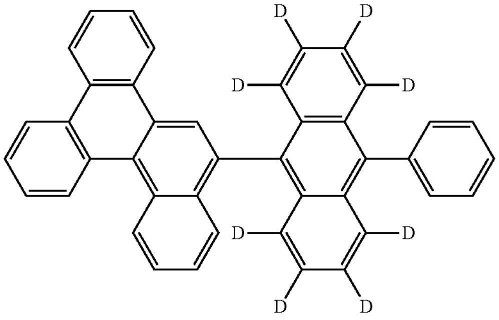

-continued
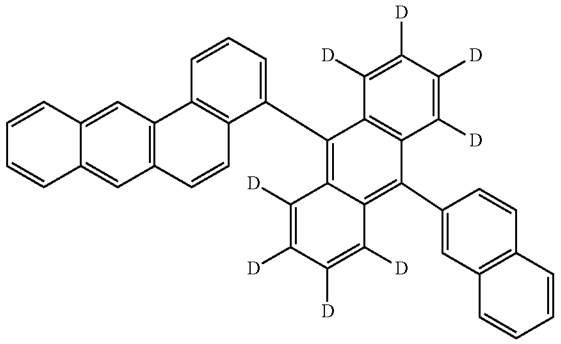
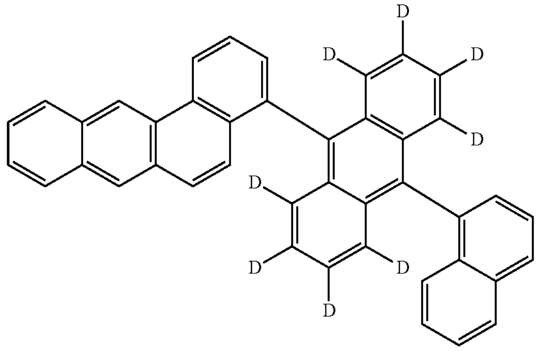
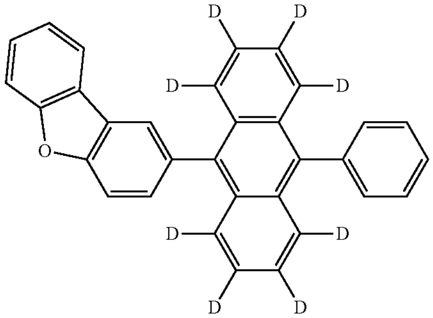
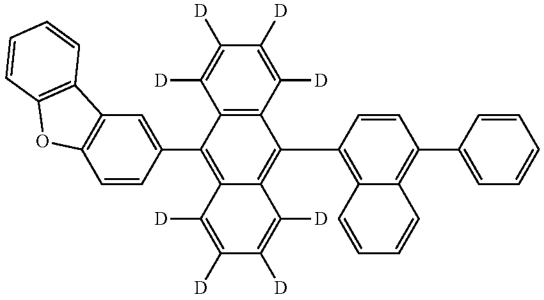
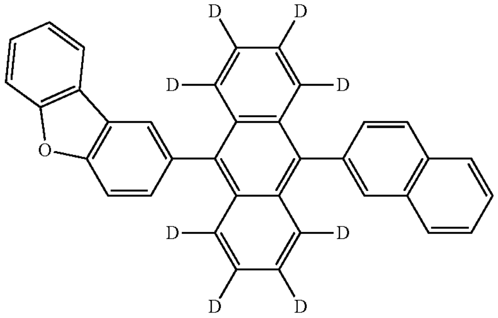
-continued
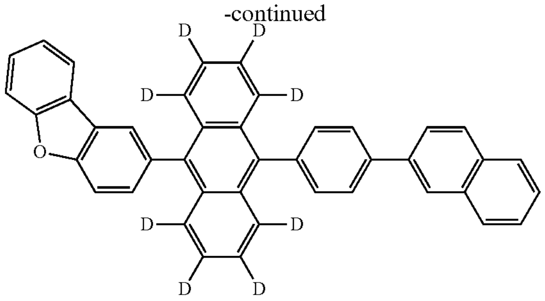
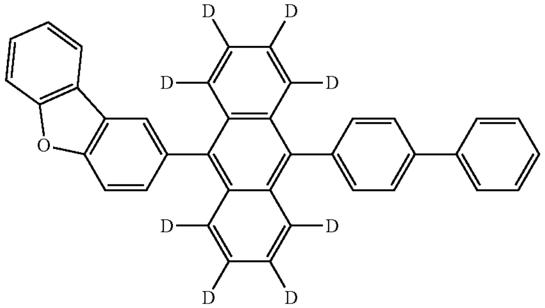
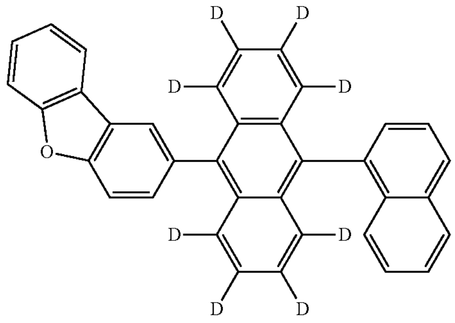
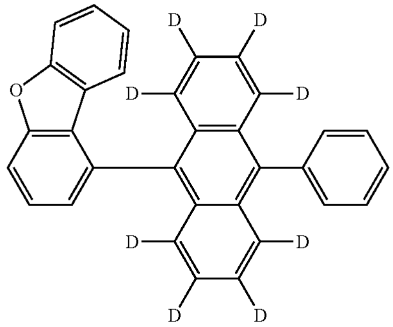
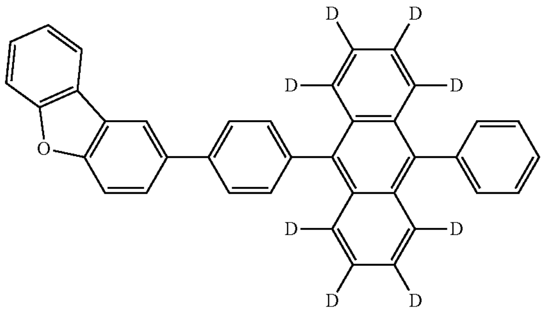

-continued
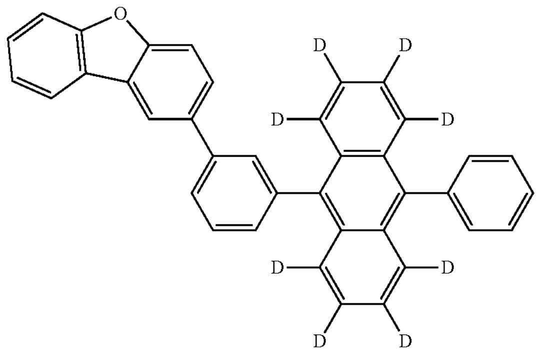
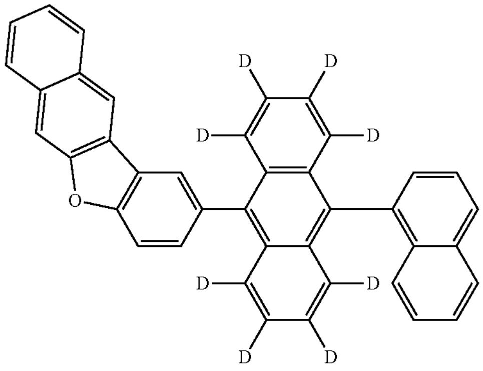
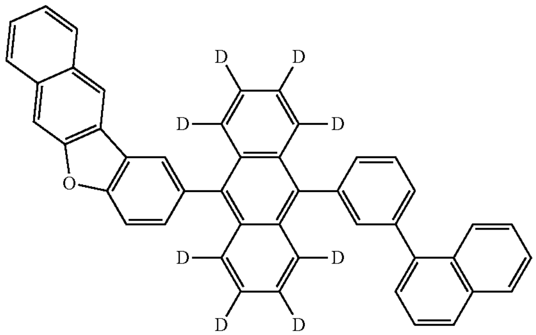
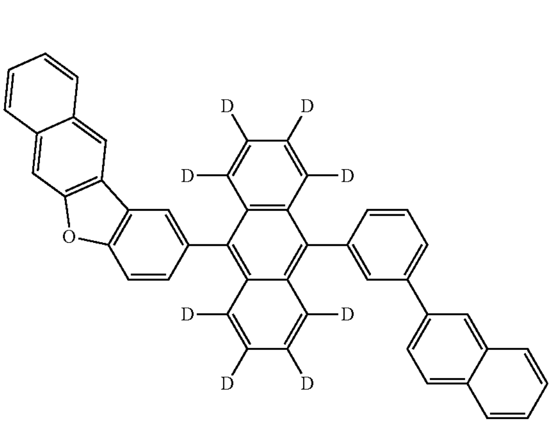
-continued
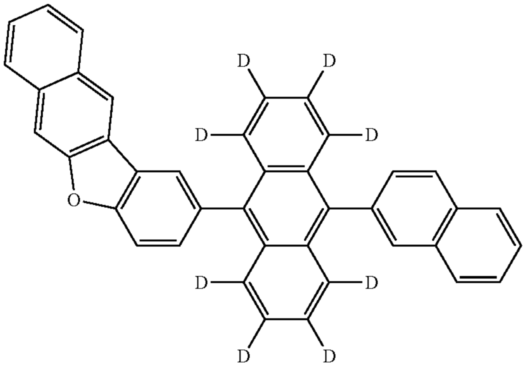
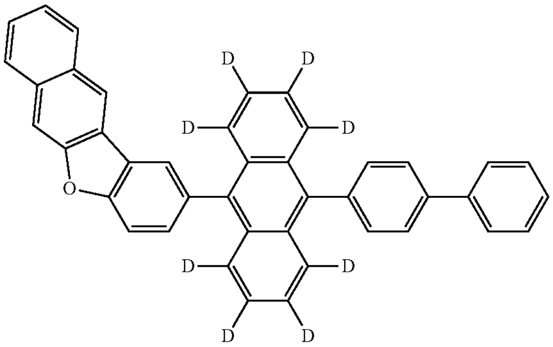
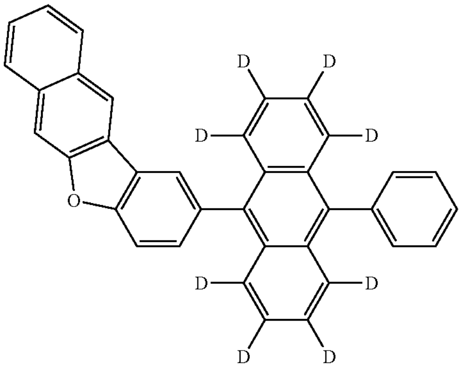
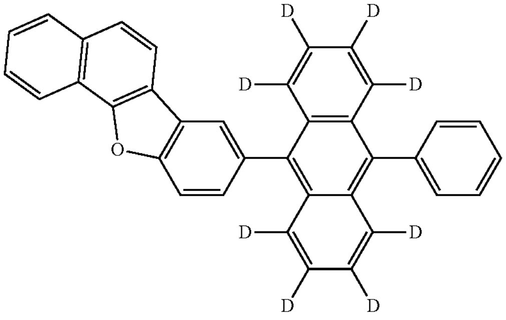
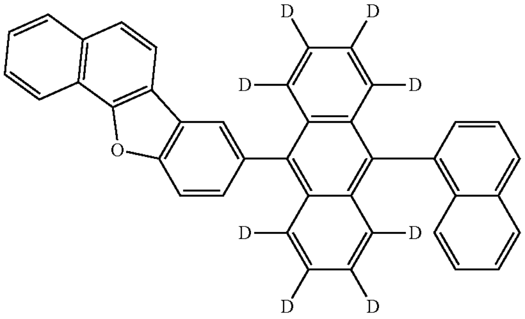

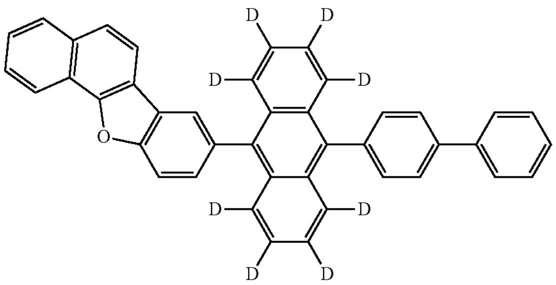
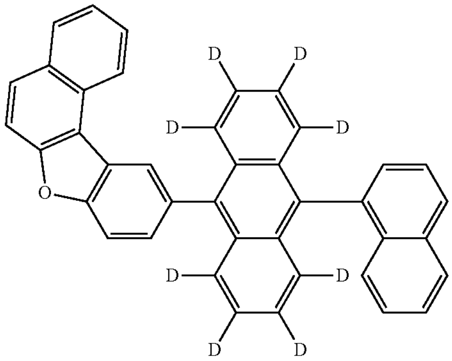
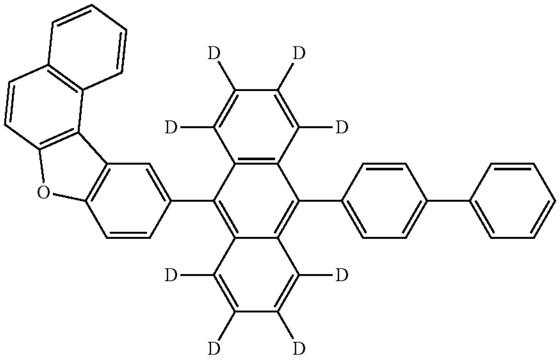
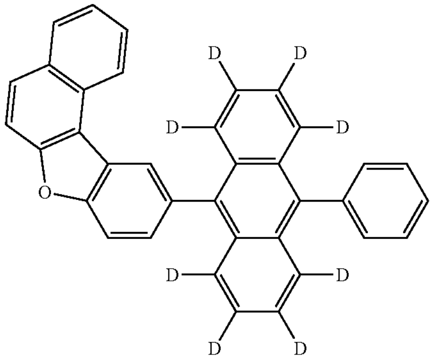
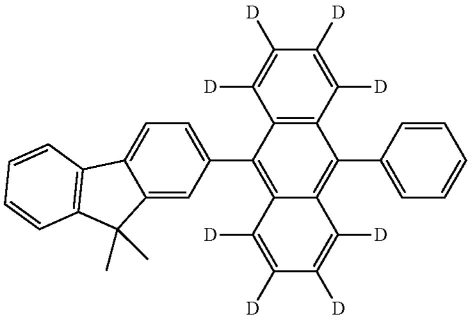
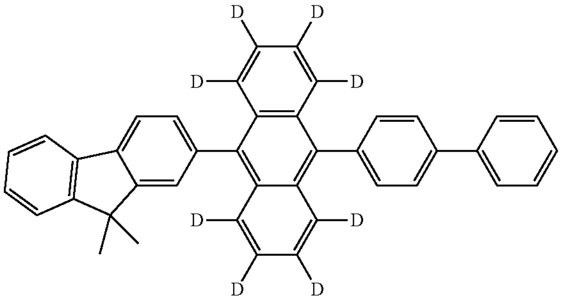
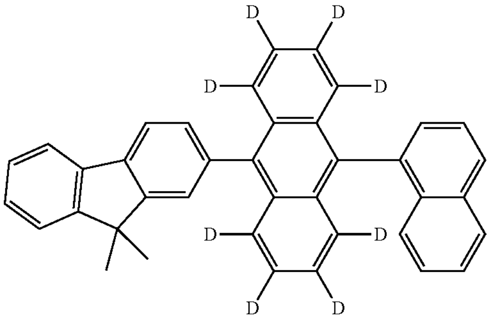
[Formula 182]
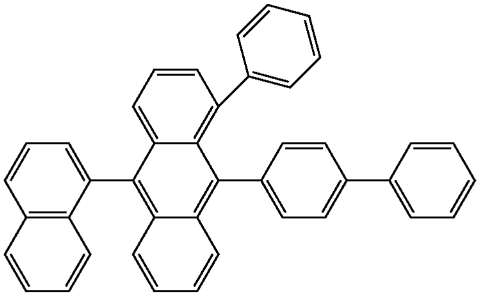
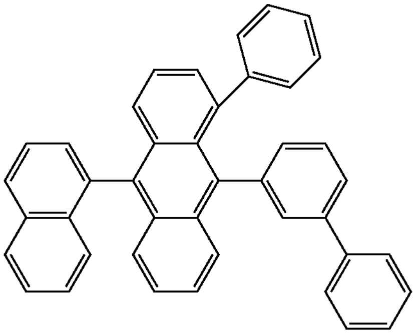
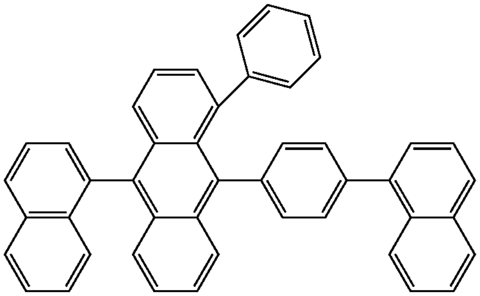

-continued
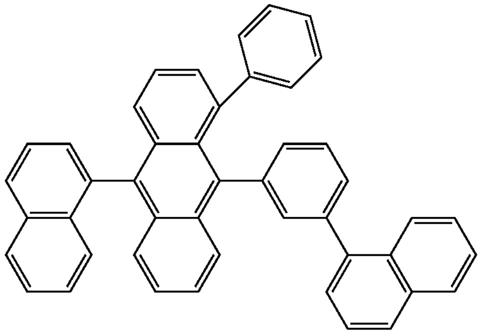
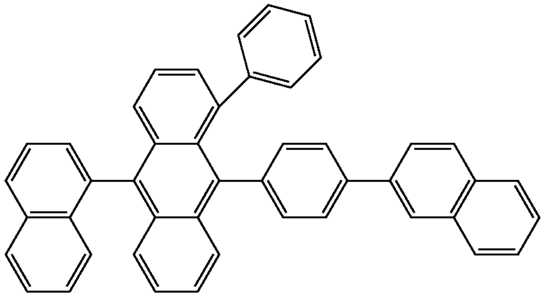
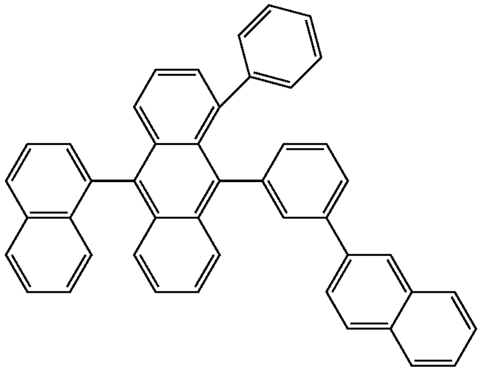
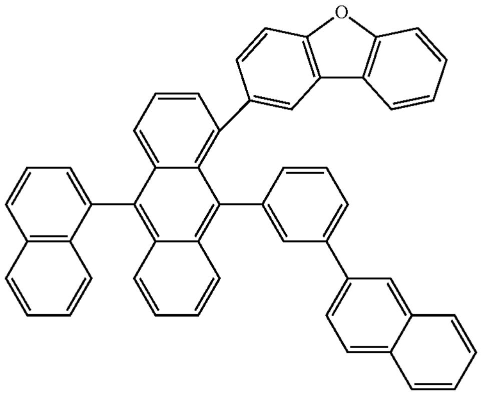
-continued
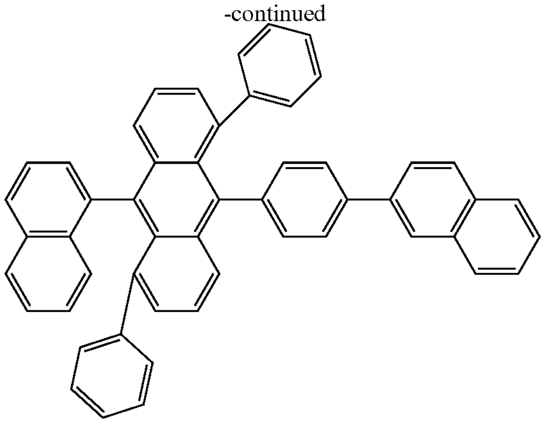
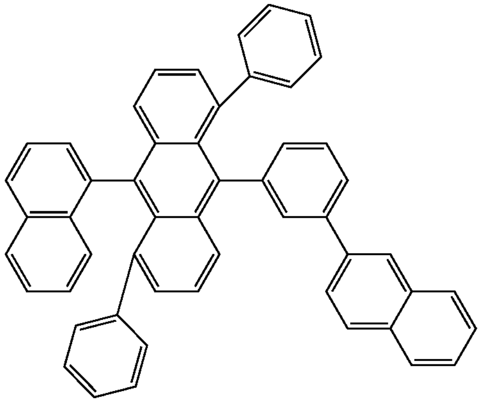
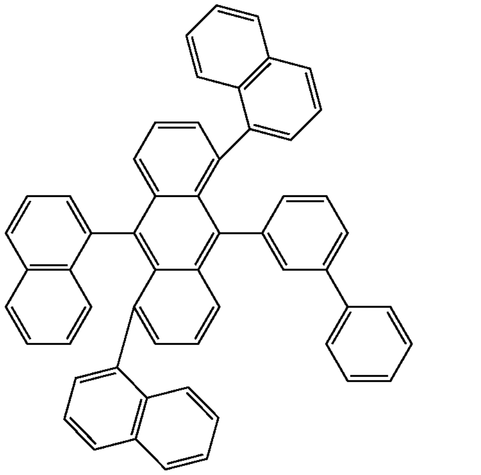

-continued
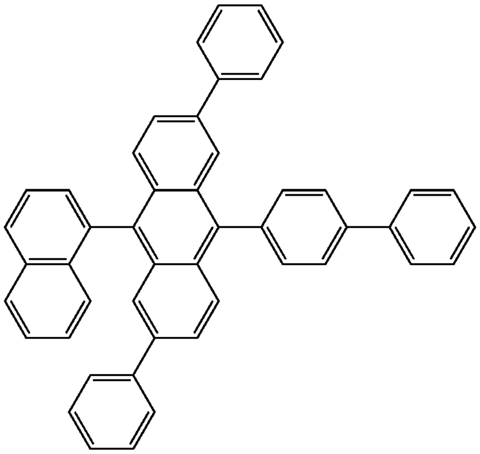
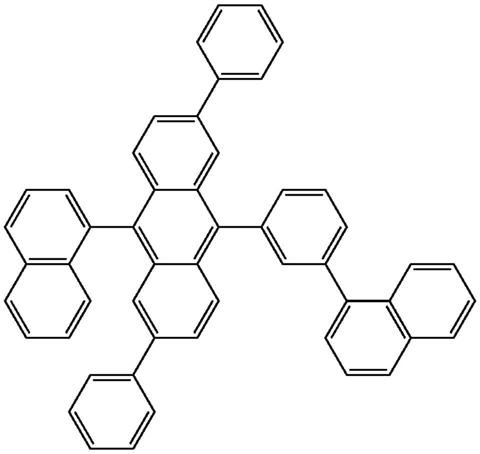
[Formula 183]
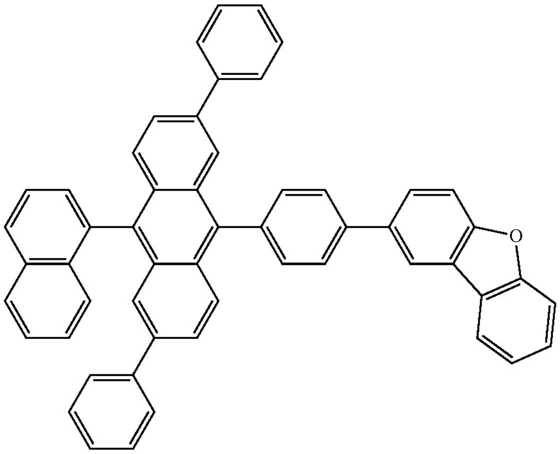
-continued
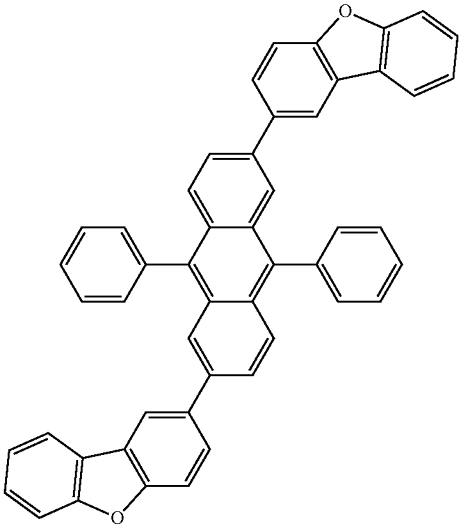
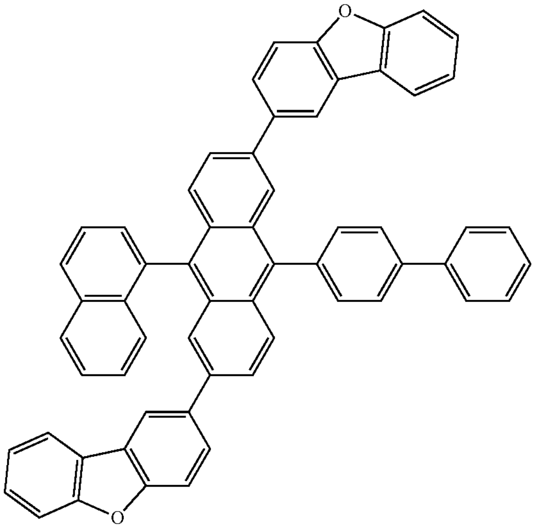
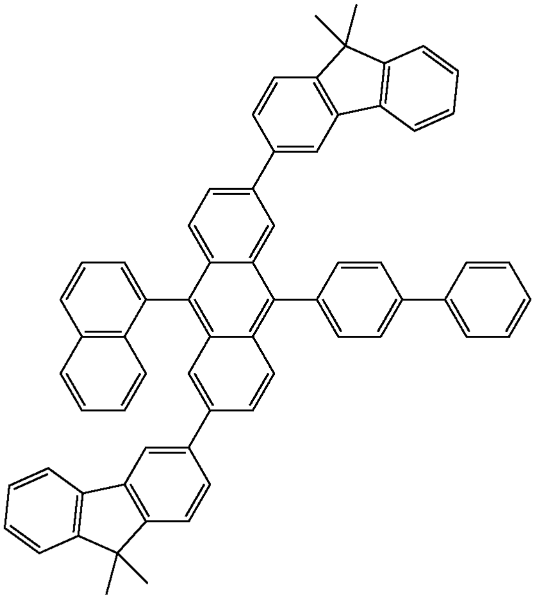

-continued
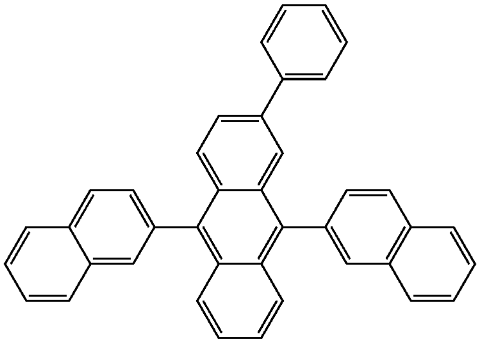
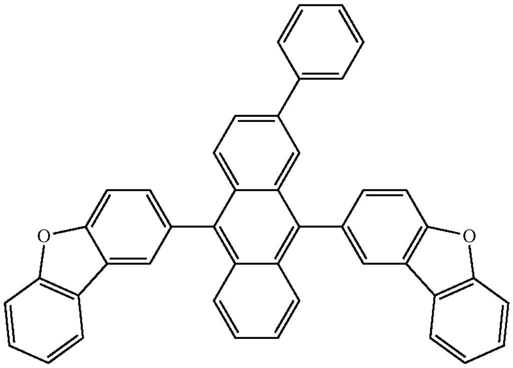
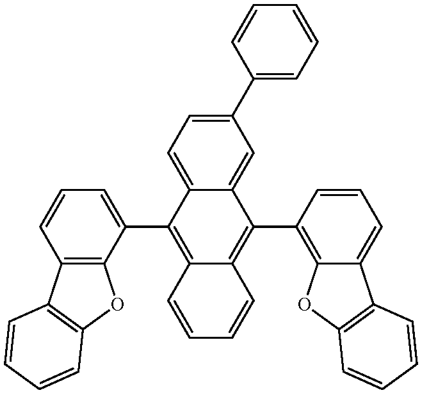
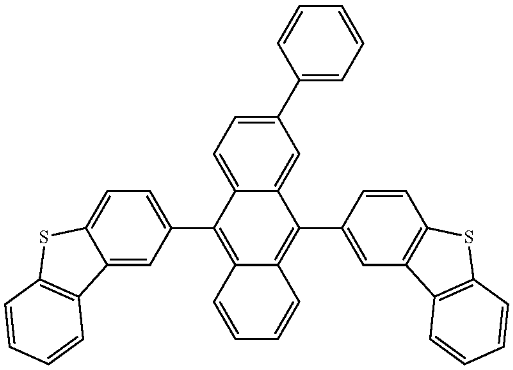
-continued
[Formula 184]
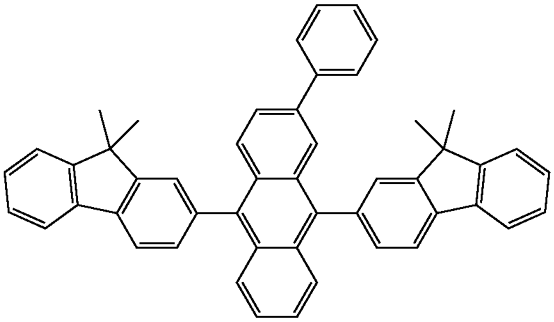
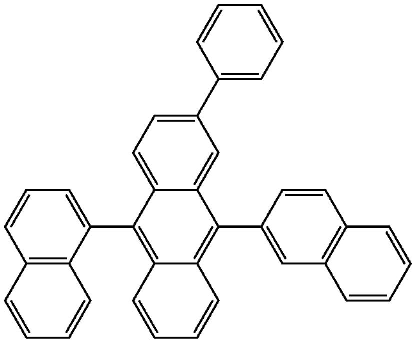
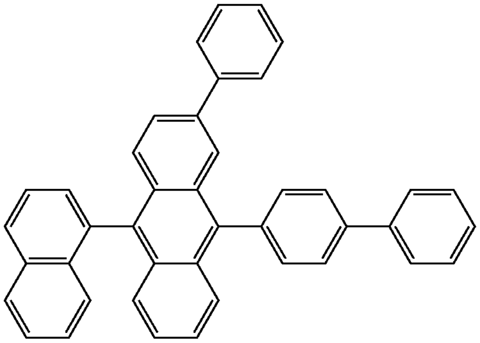
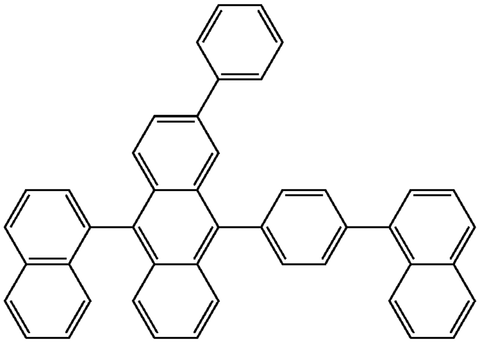
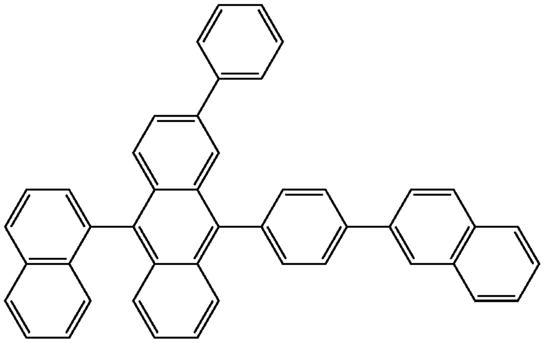

-continued
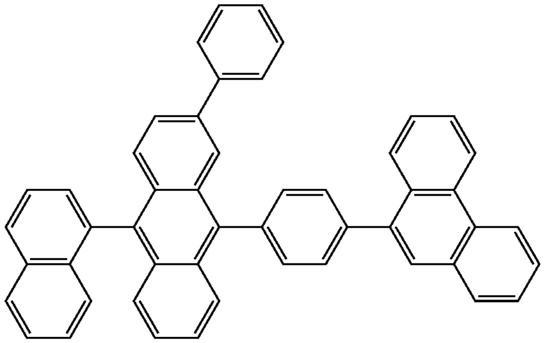
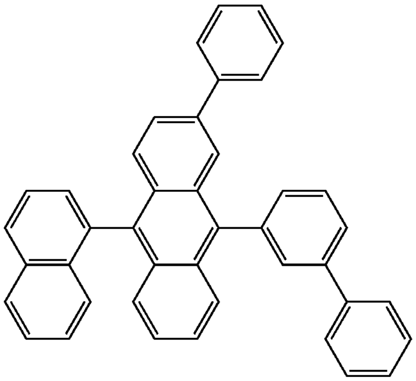
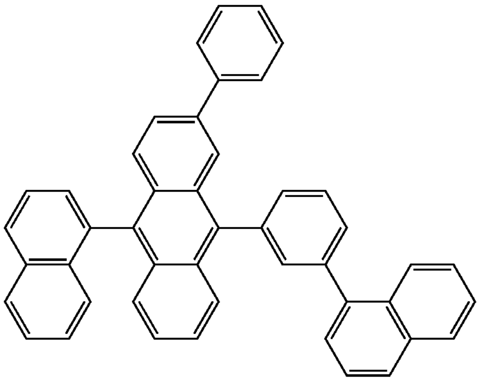
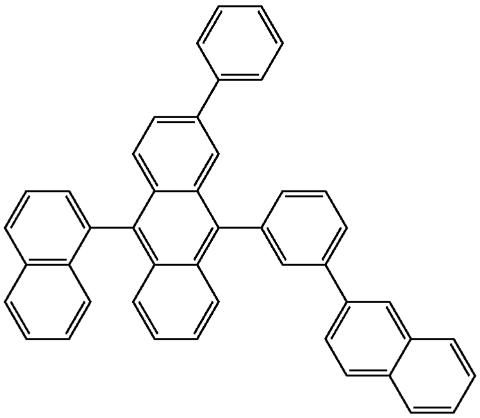
-continued
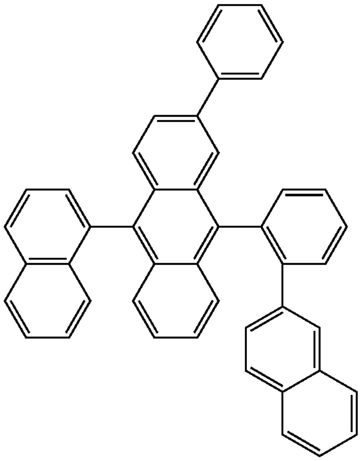
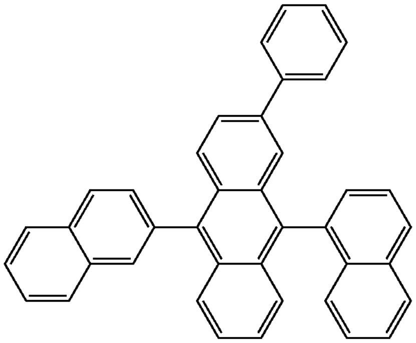
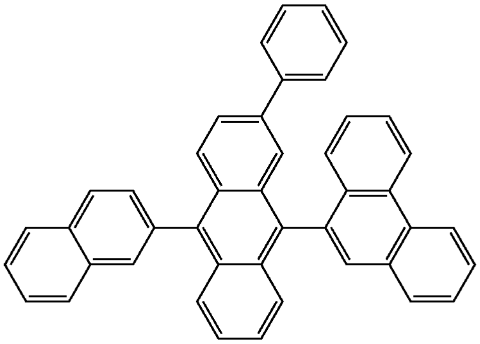
[Formula 185]
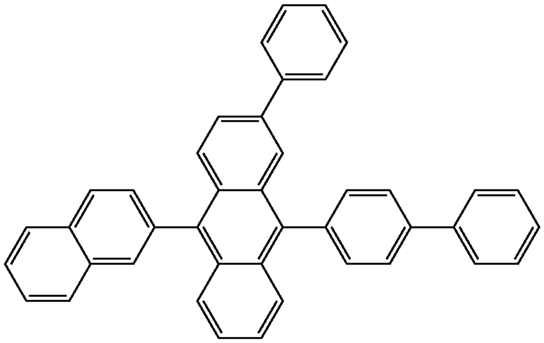

-continued
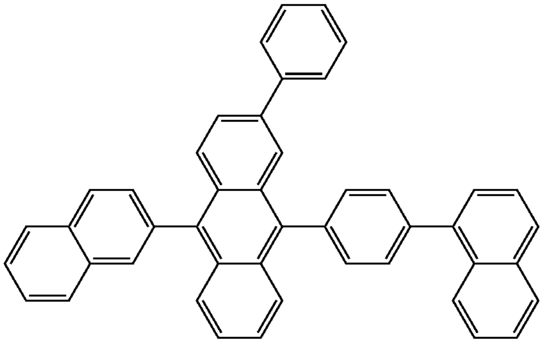
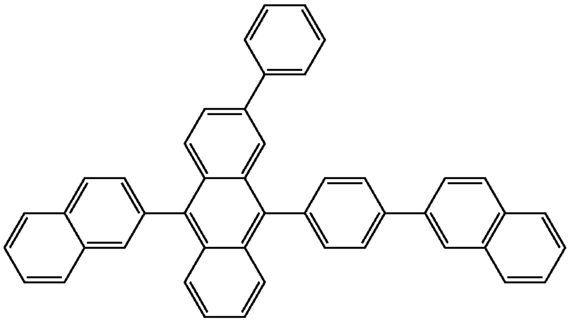
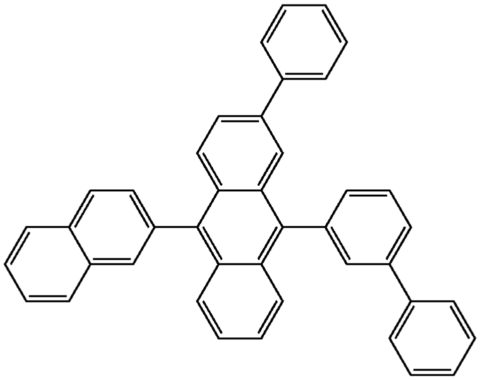
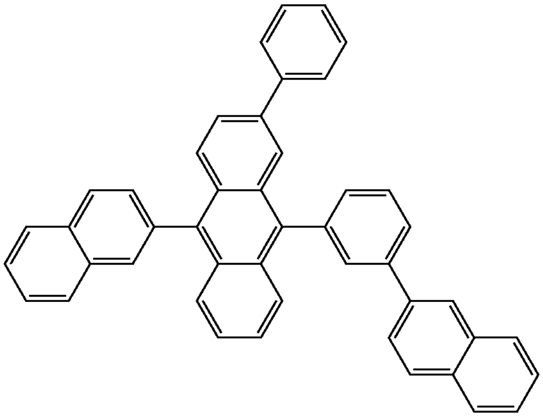
-continued
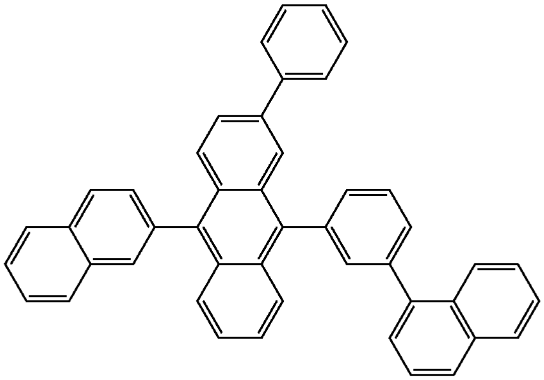
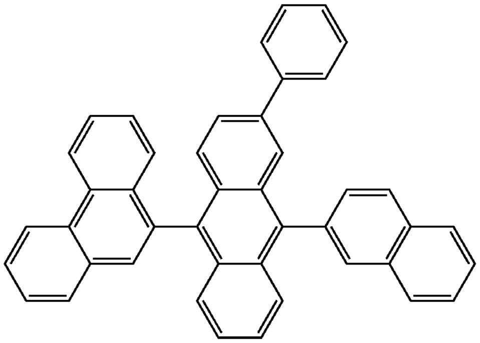
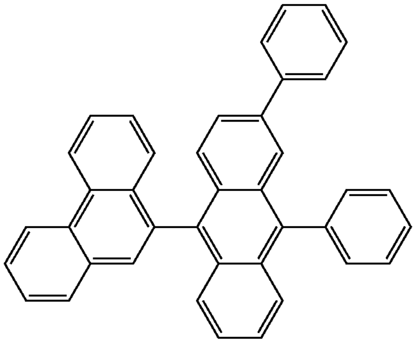
[Formula 186]
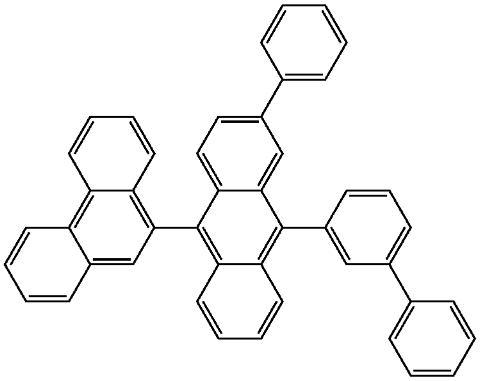

-continued
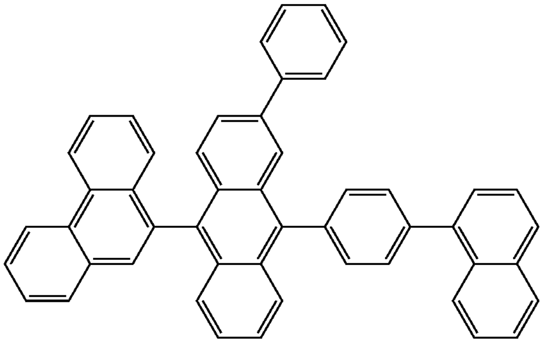
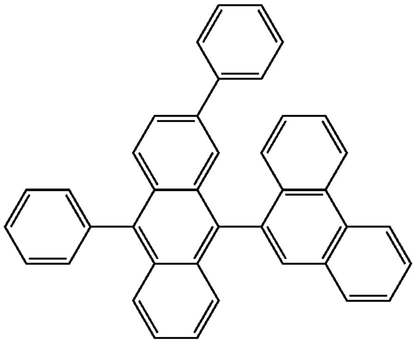
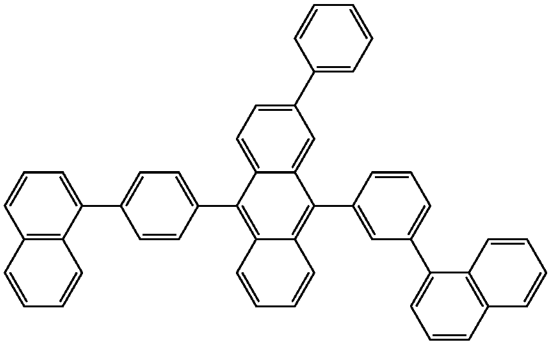
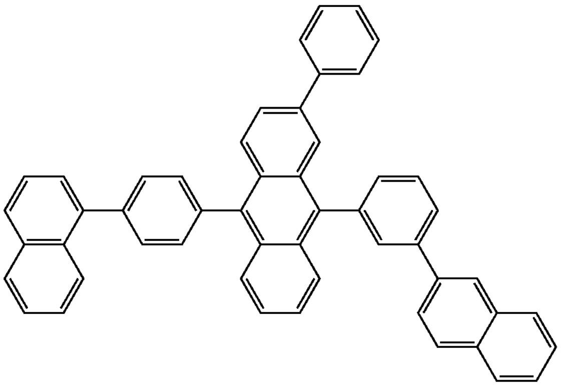
-continued
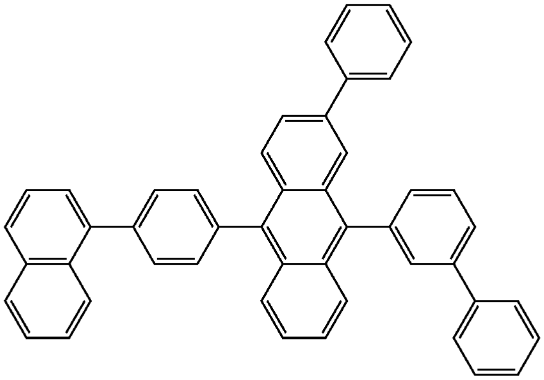
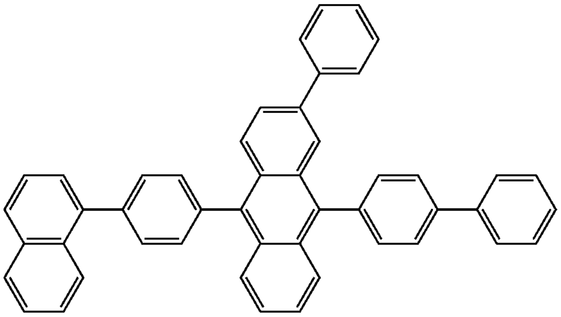
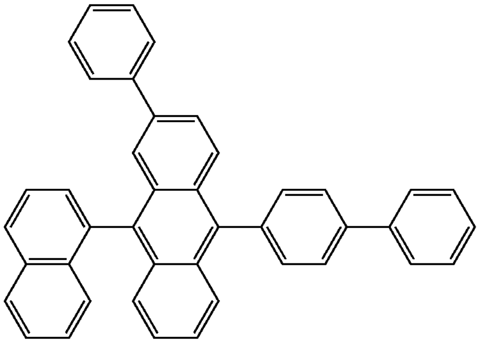
[Formula 187]
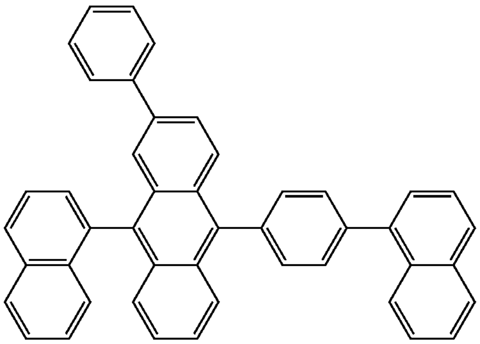

-continued
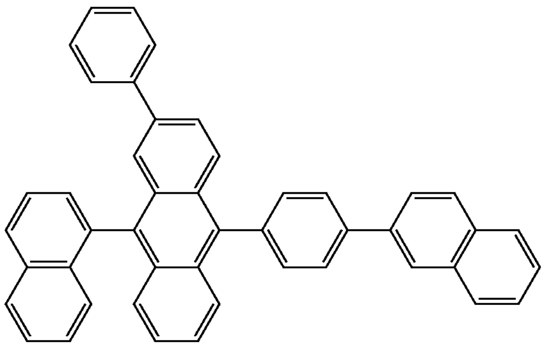
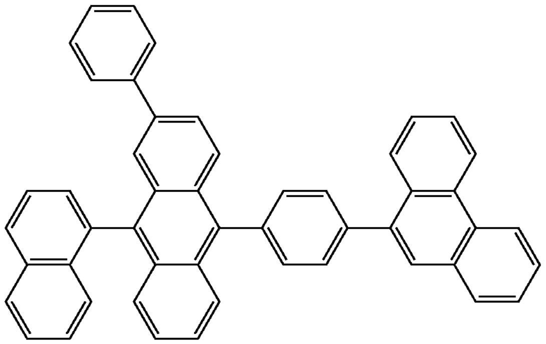
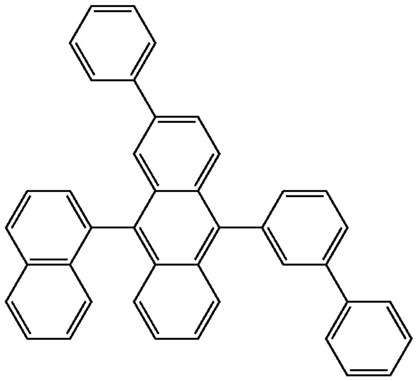
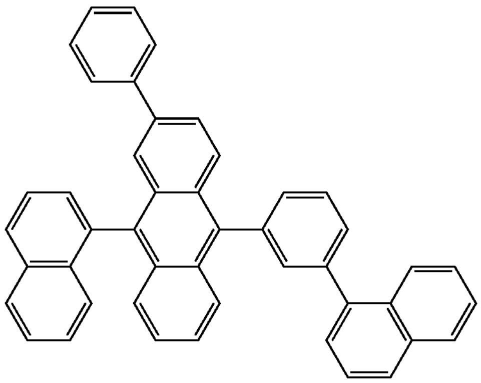
-continued
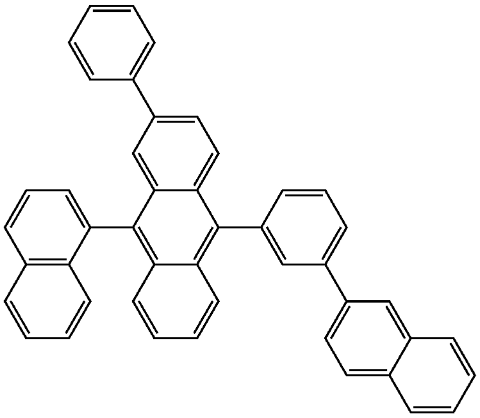
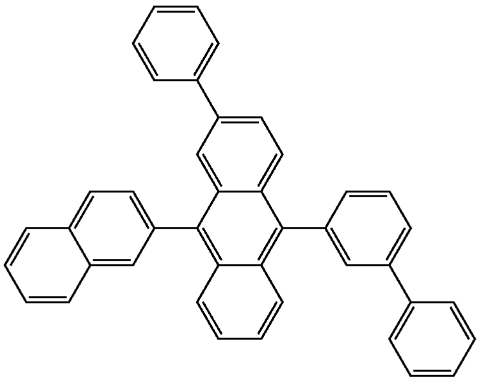
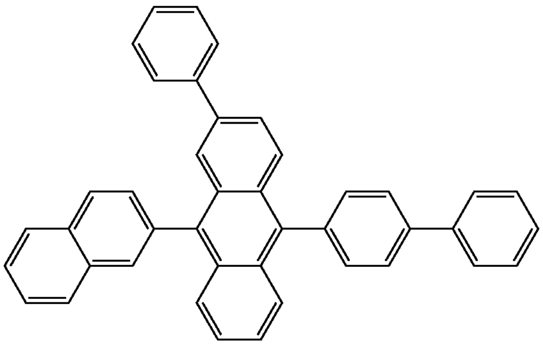
[Formula 188]
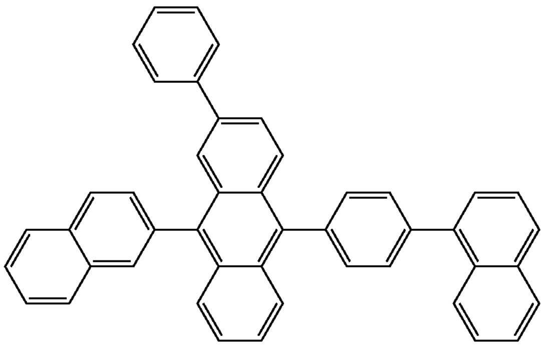

-continued
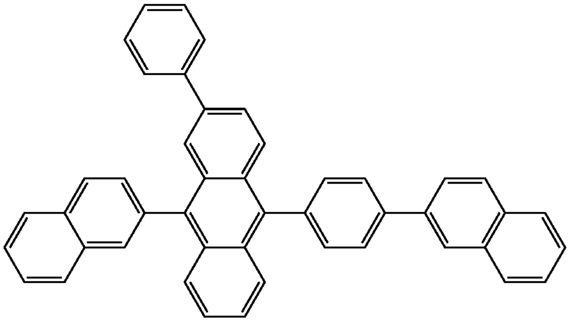
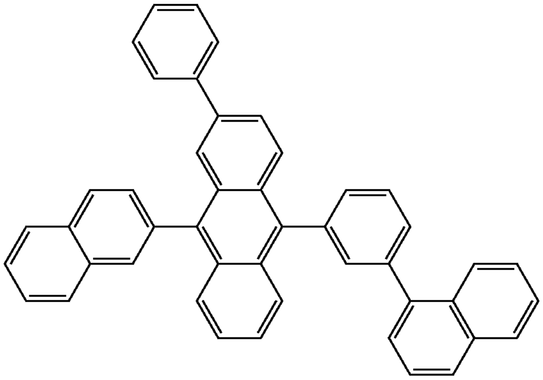
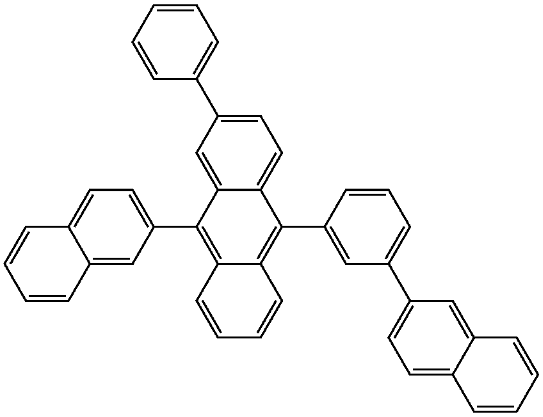
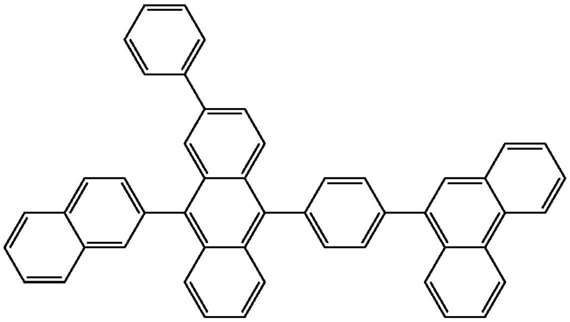
-continued
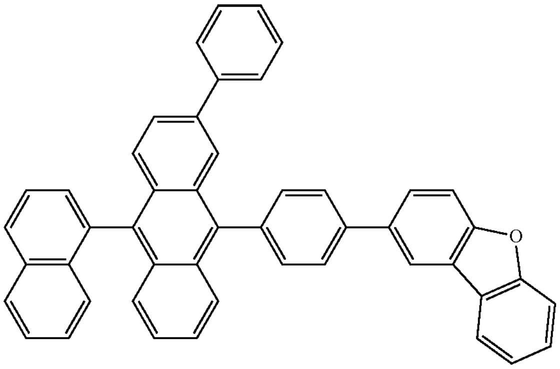
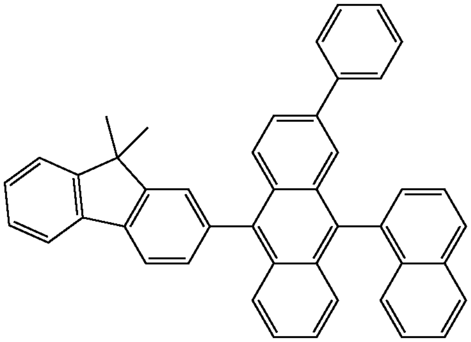
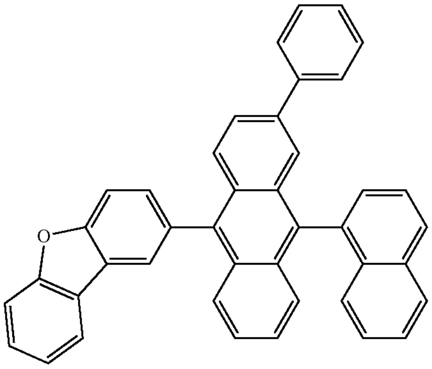
[Formula 189]
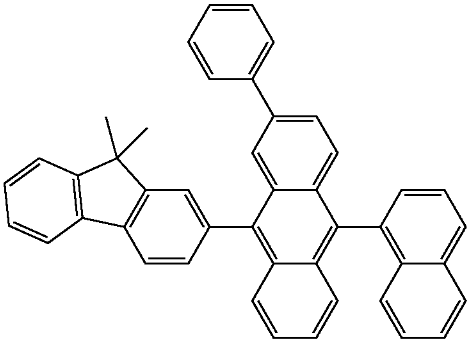

-continued
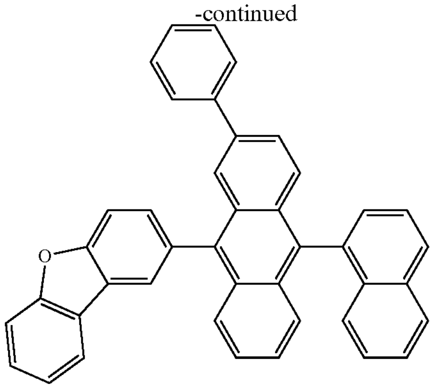
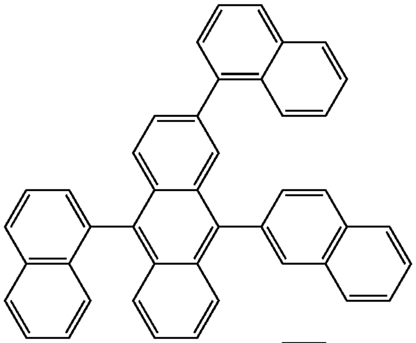
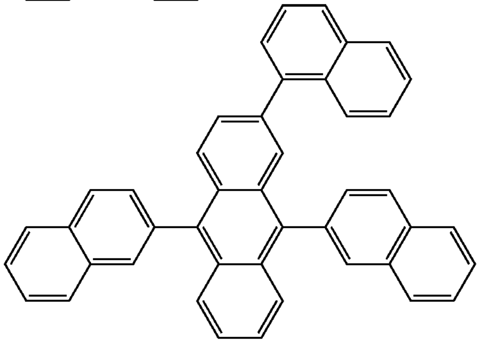
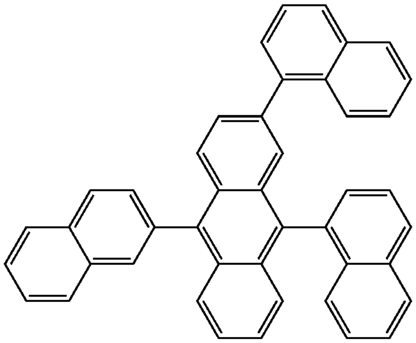
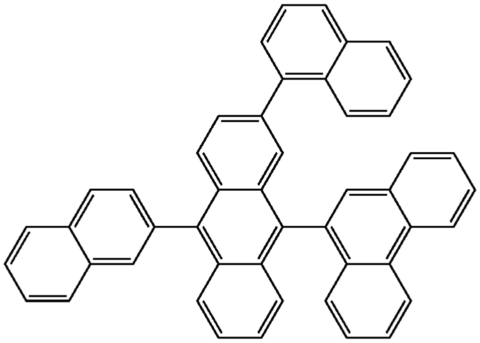
-continued
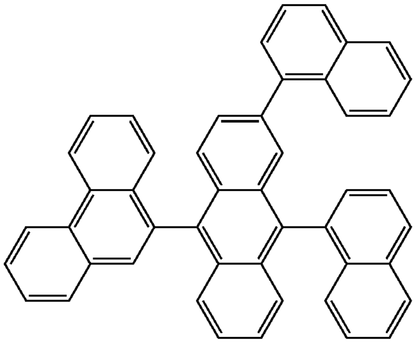
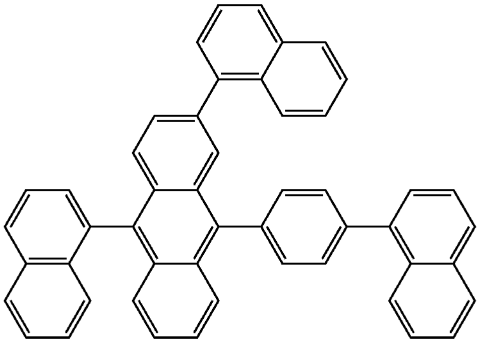
[Formula 190]
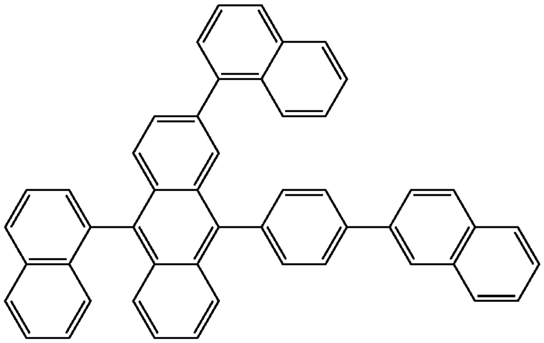
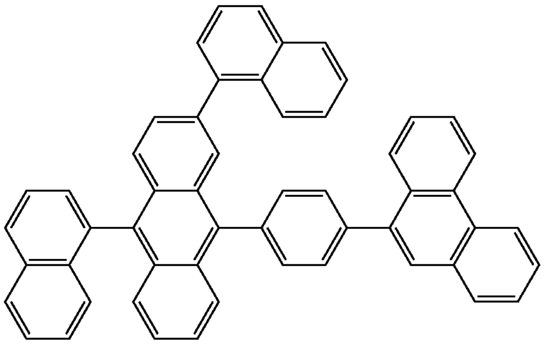

-continued
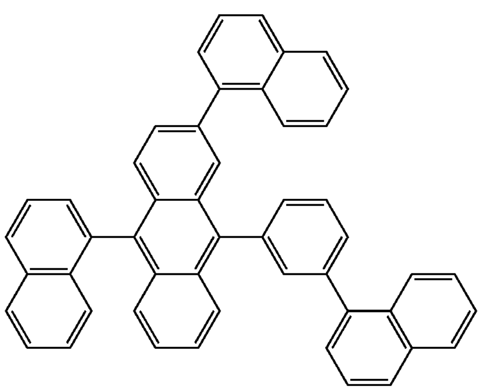
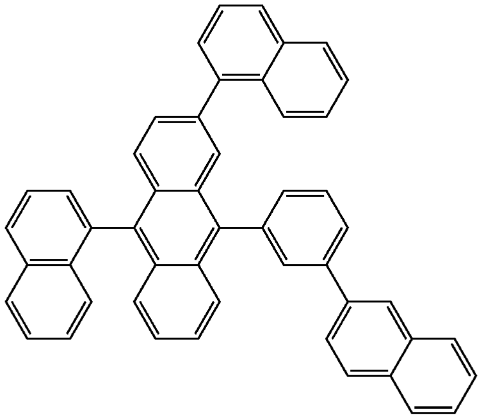
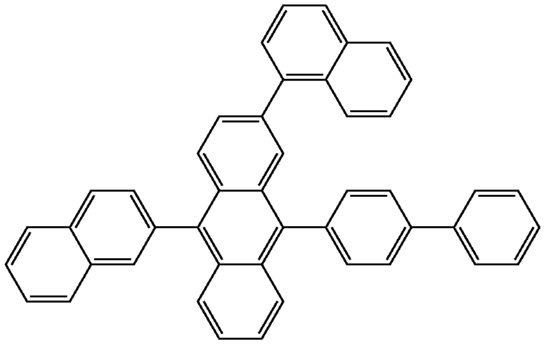
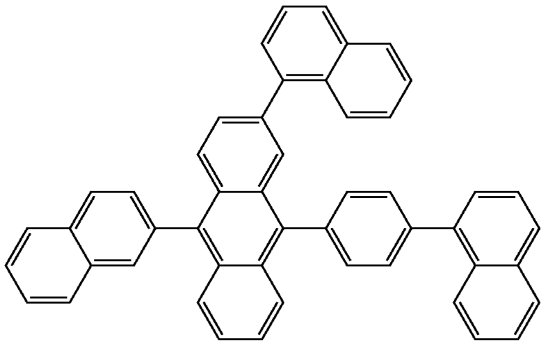
-continued
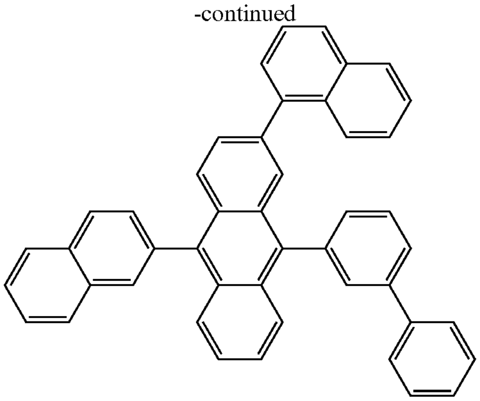
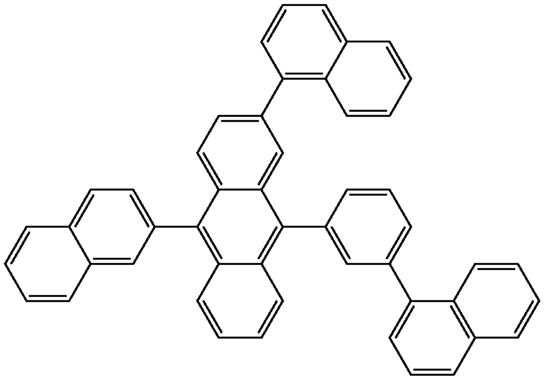
[Formula 191]
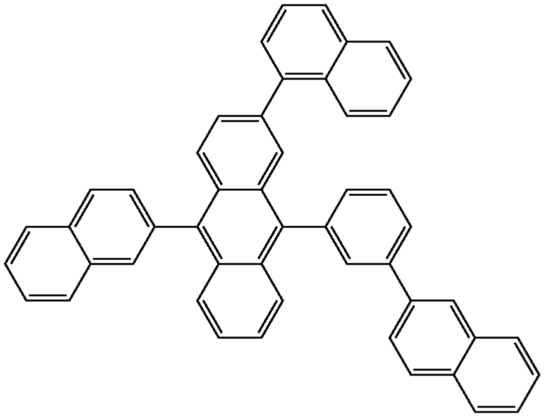
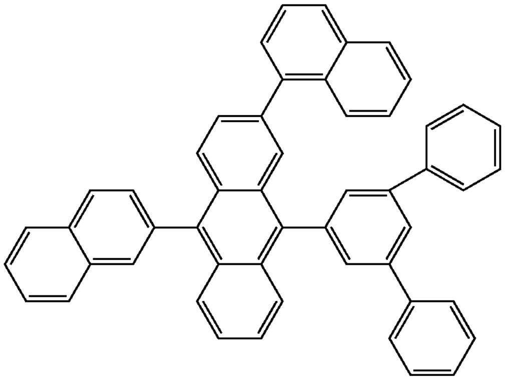

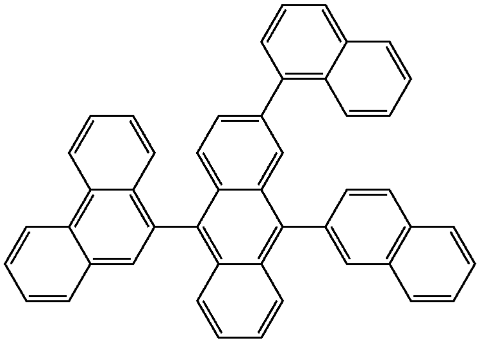
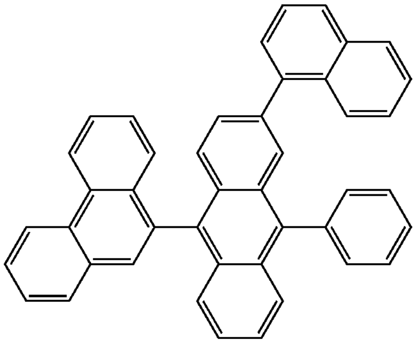
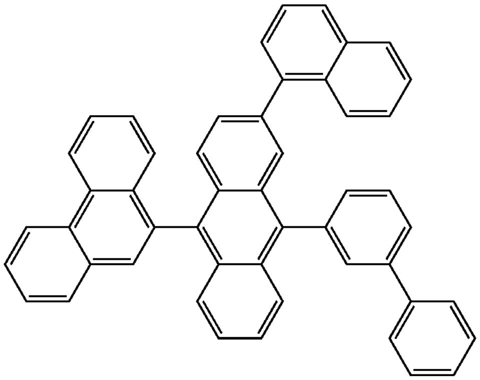
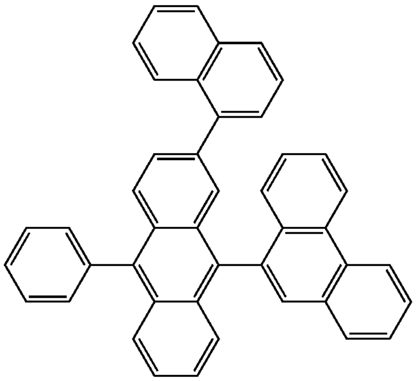
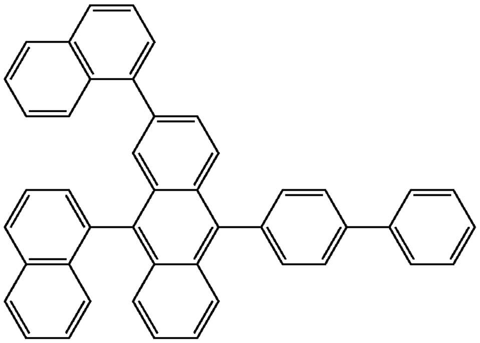
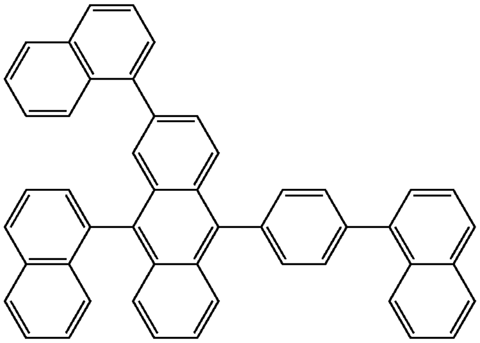
[Formula 192]
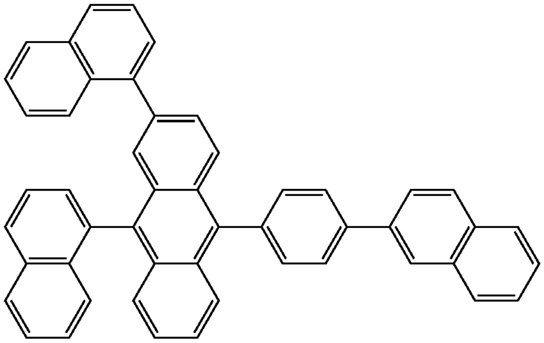
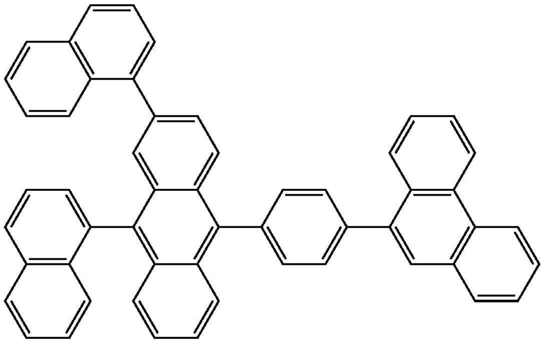

-continued
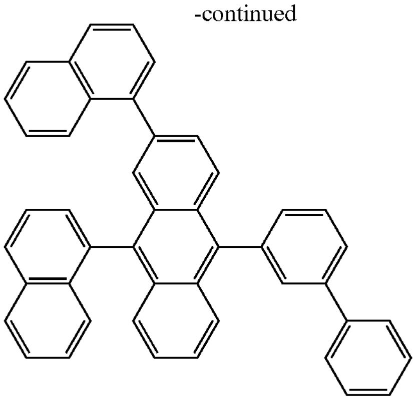
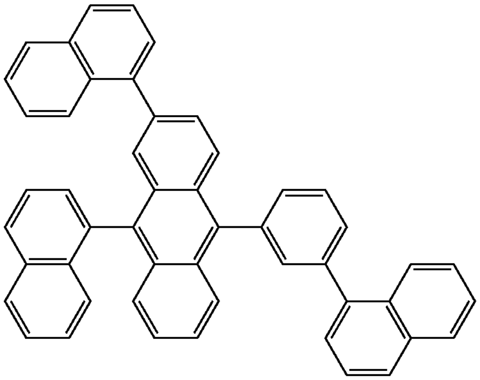
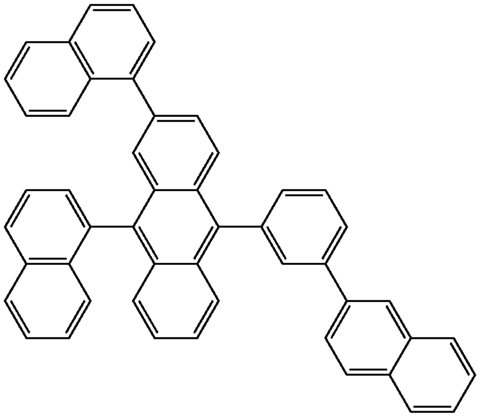
-continued
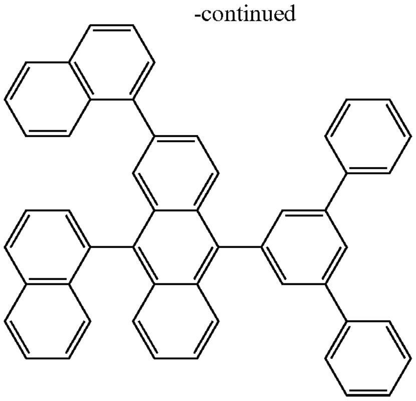
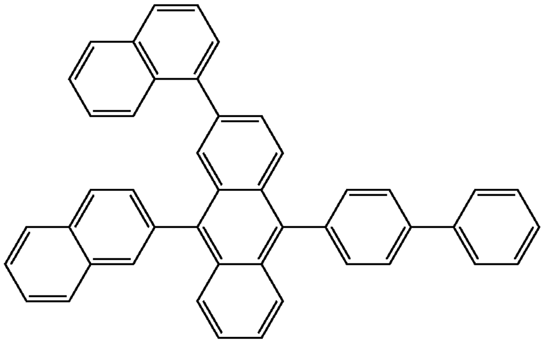
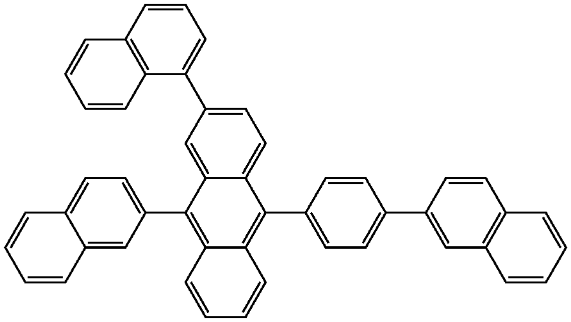
[Formula 193]
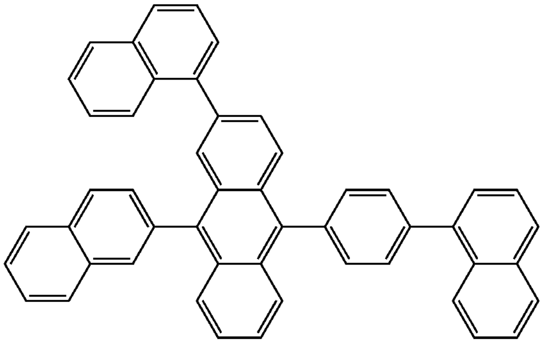
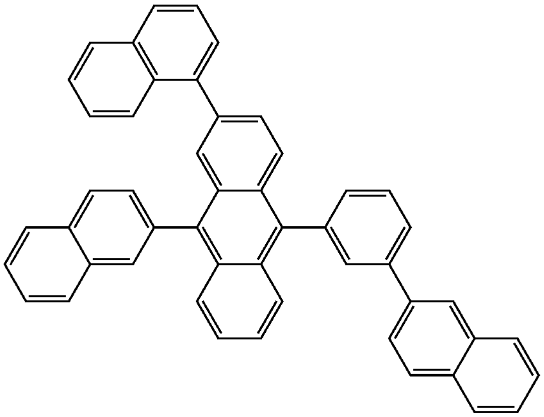

-continued
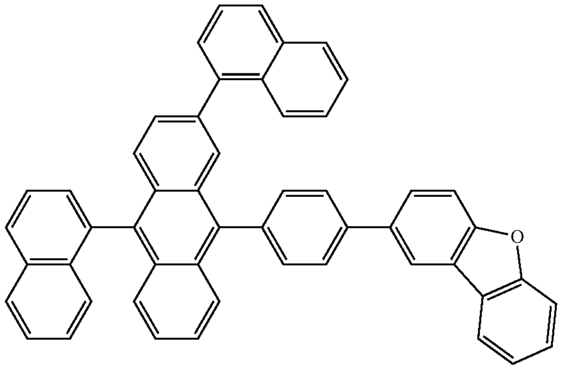
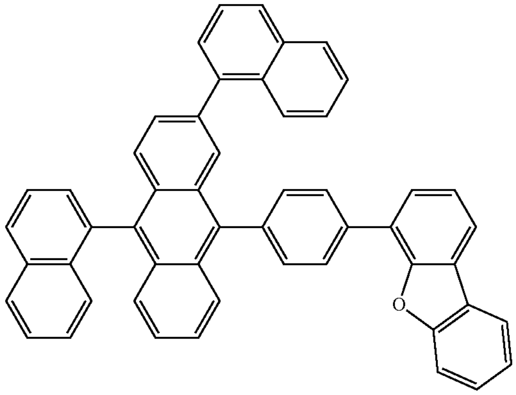
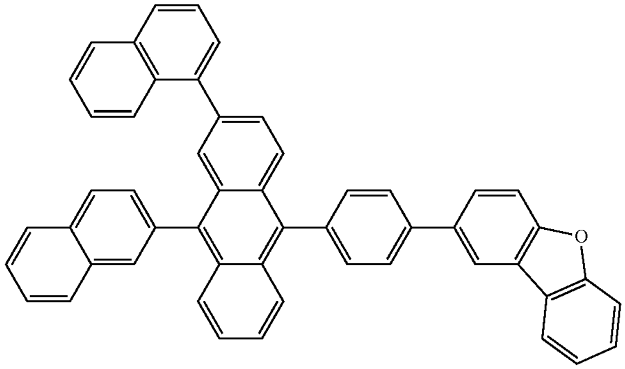
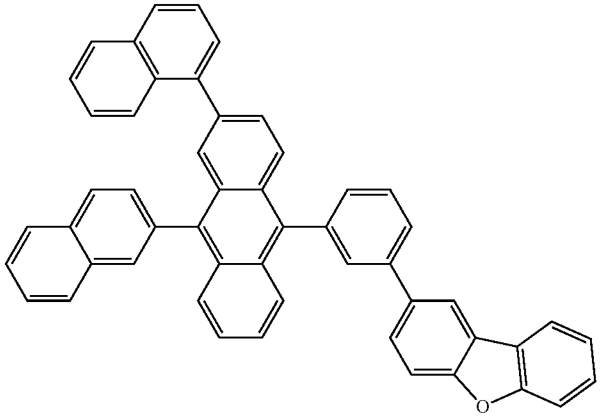
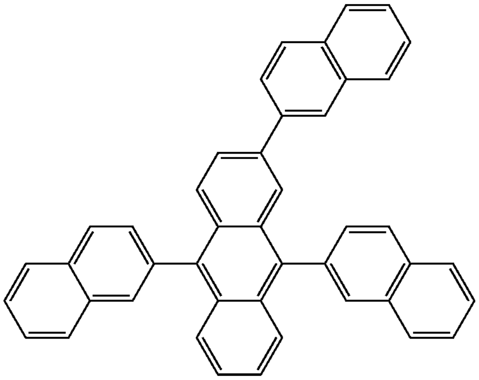
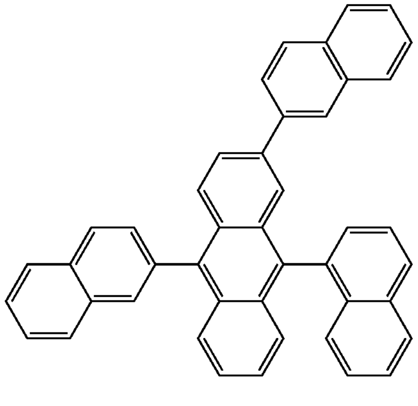

-continued
[Formula 194]
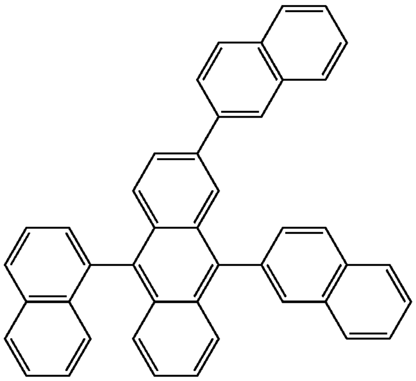
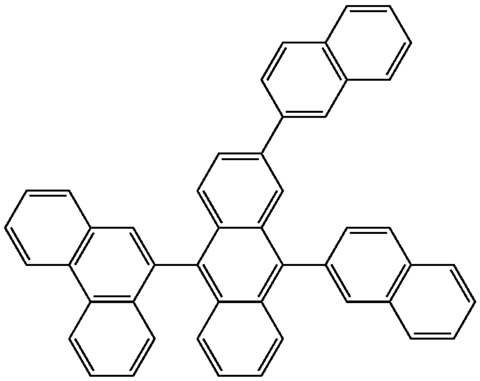
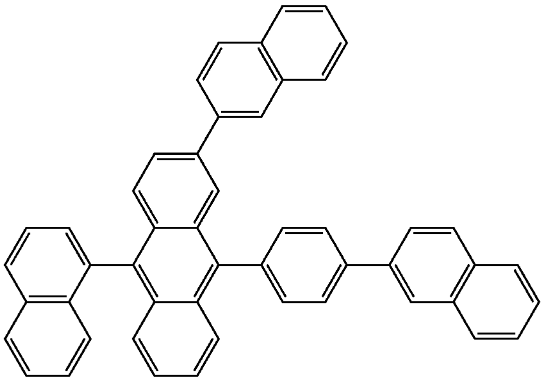
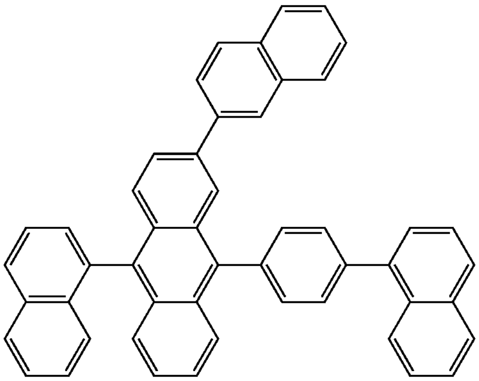
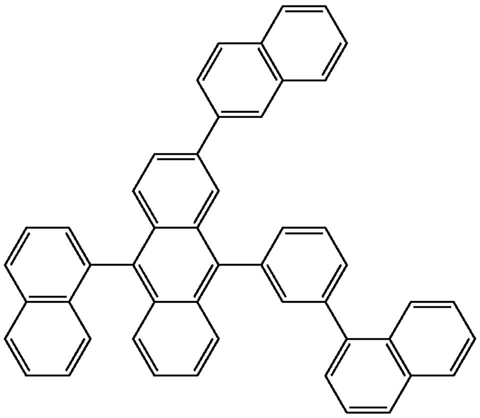
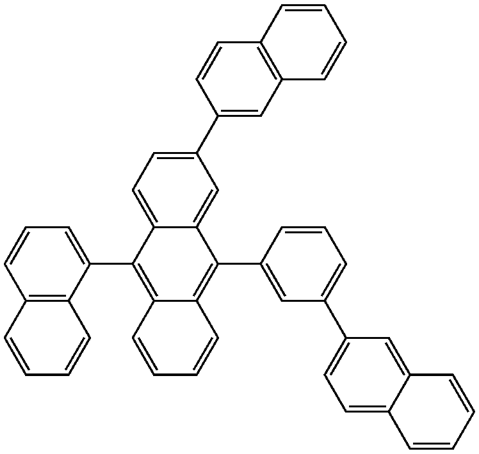
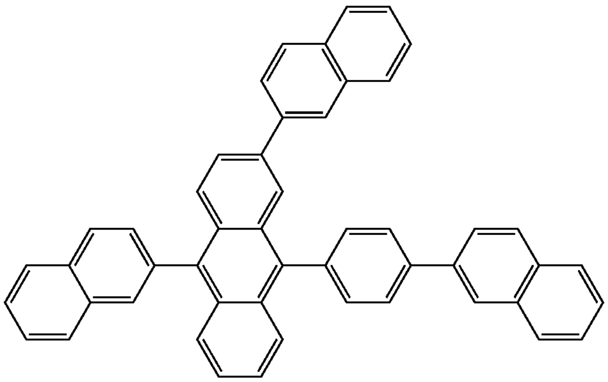

-continued
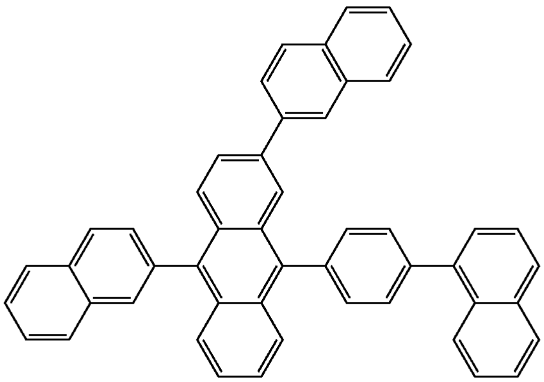
[Formula 195]
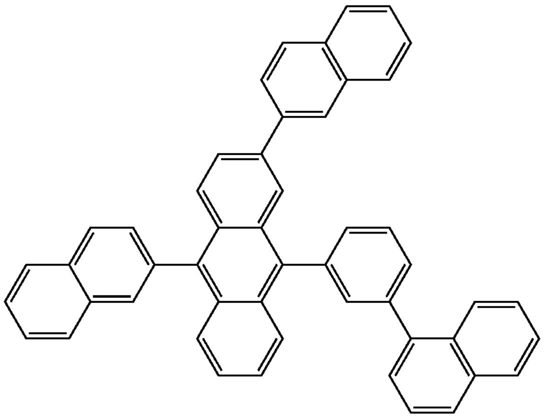
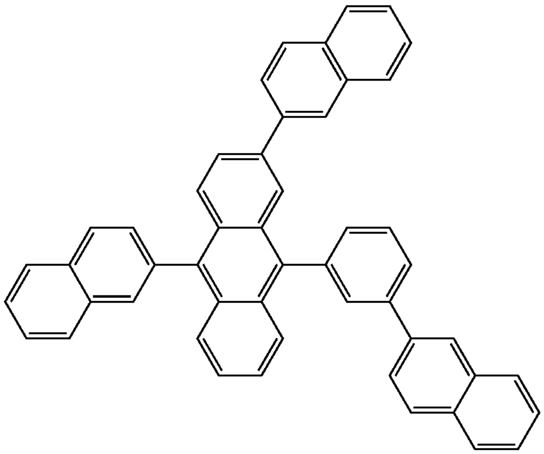
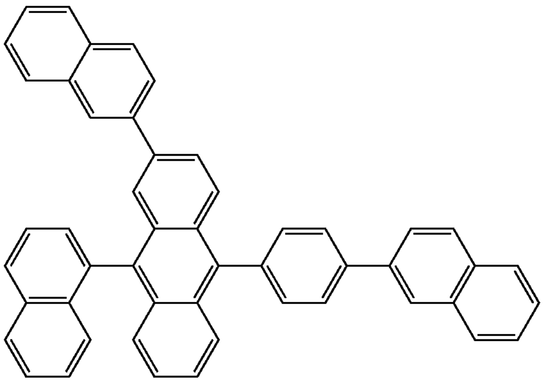
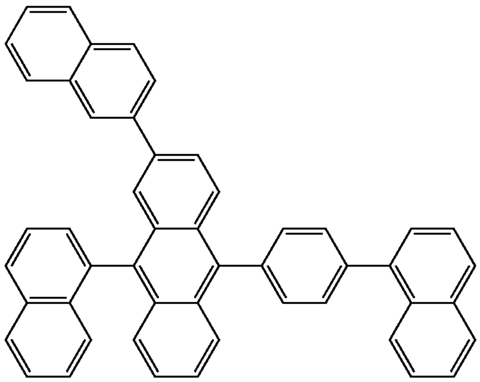
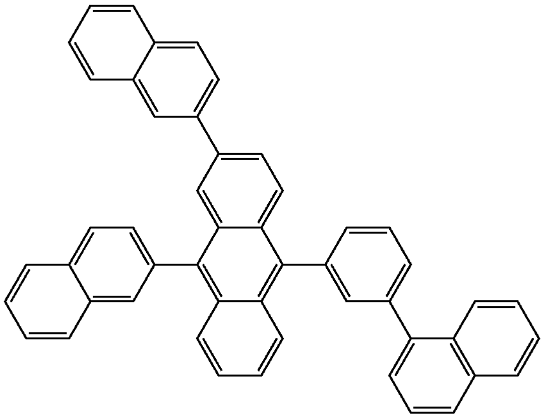
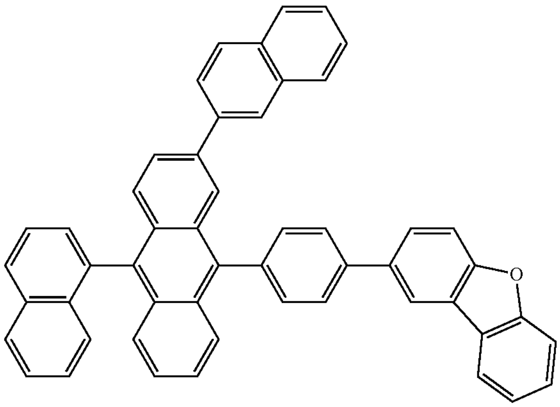

-continued
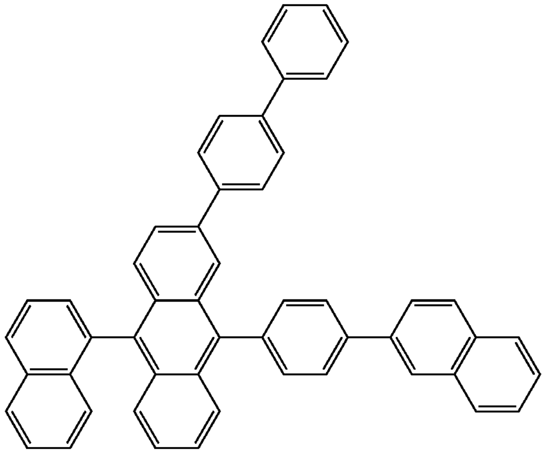
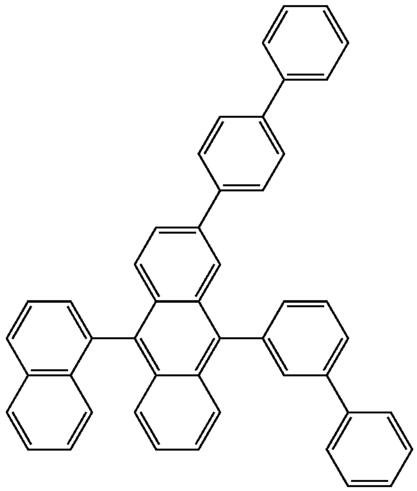
[Formula 196]
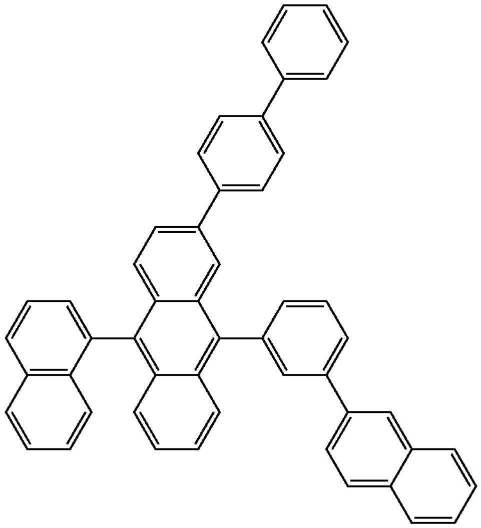
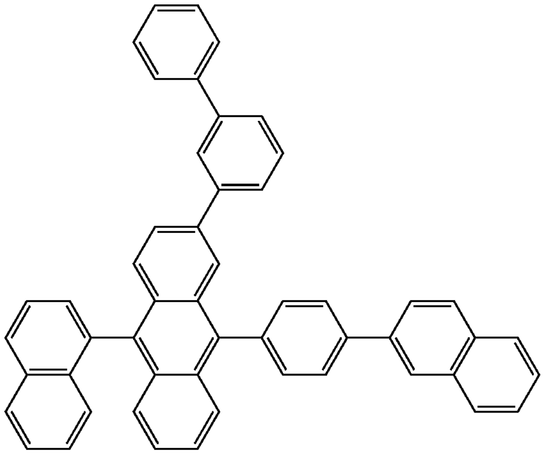
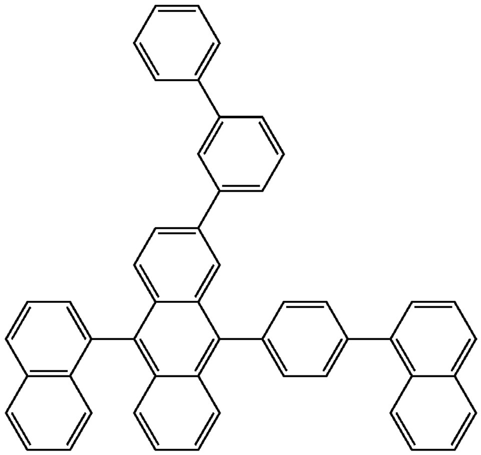
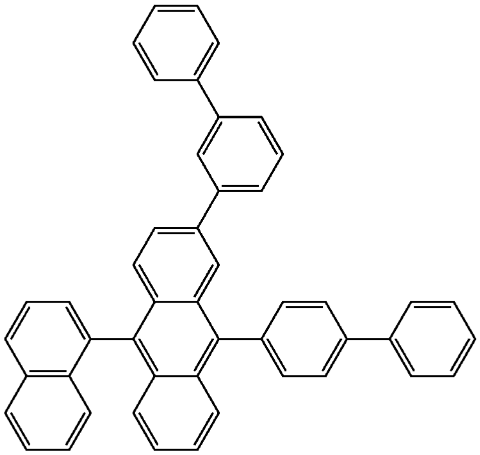

-continued
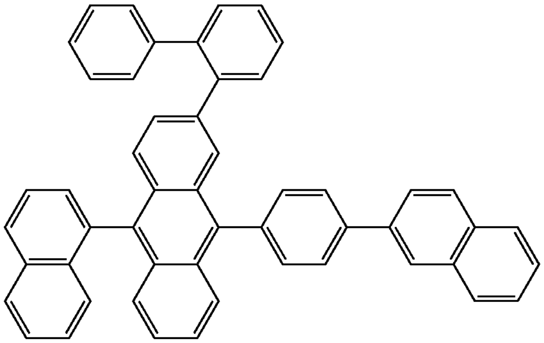
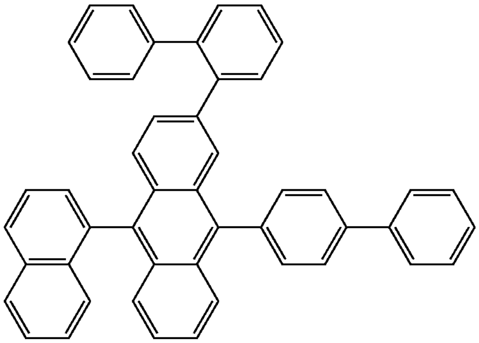
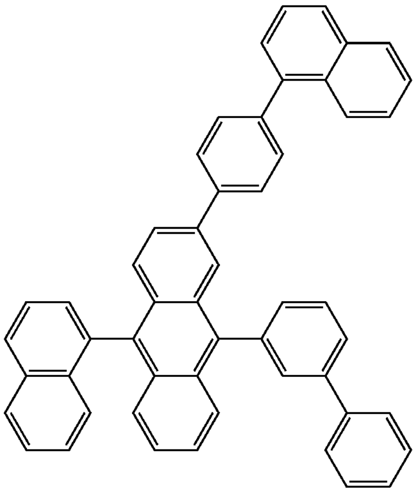
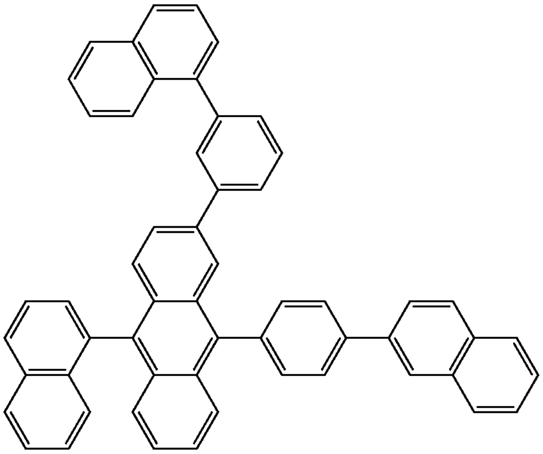
[Formula 197]
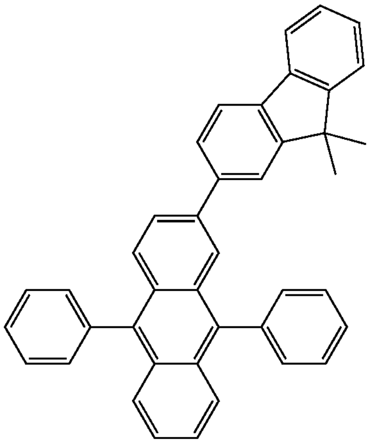
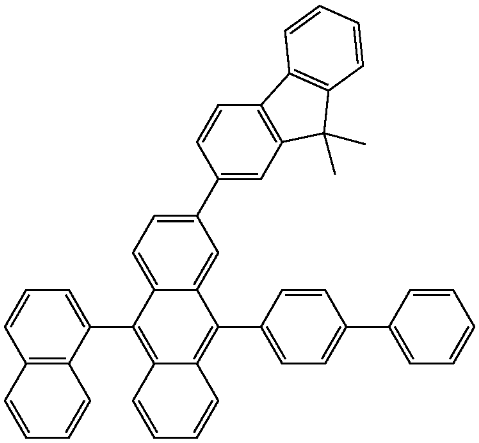

-continued
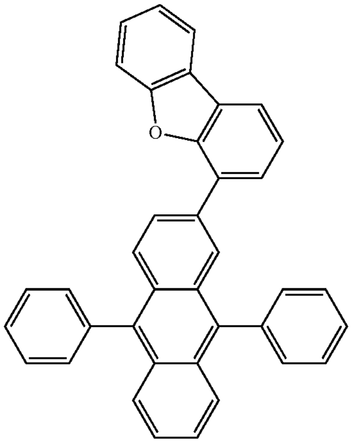
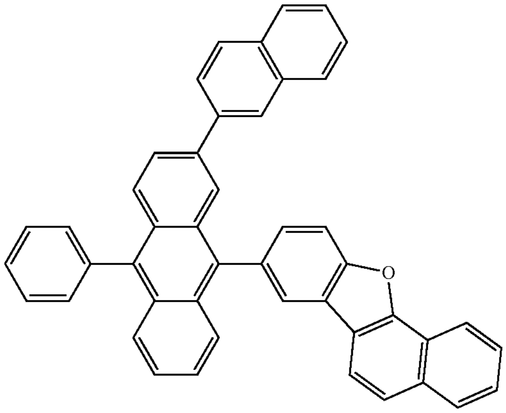
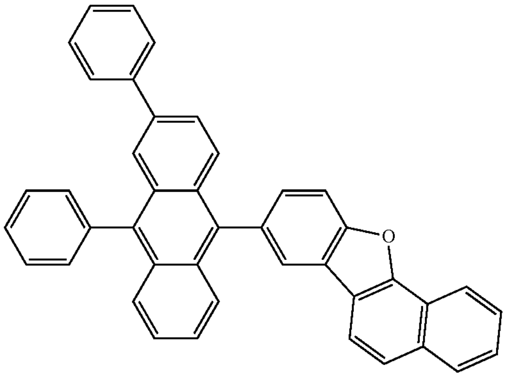
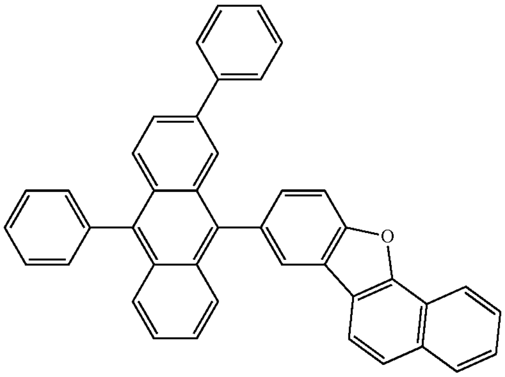
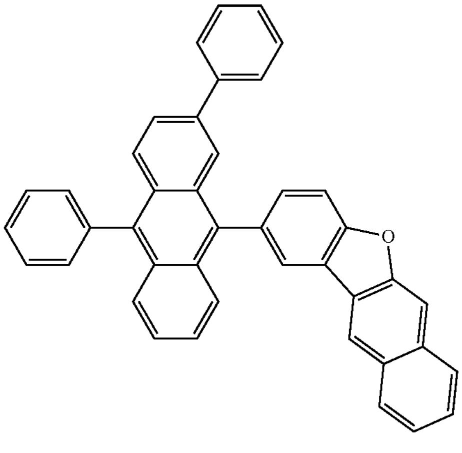
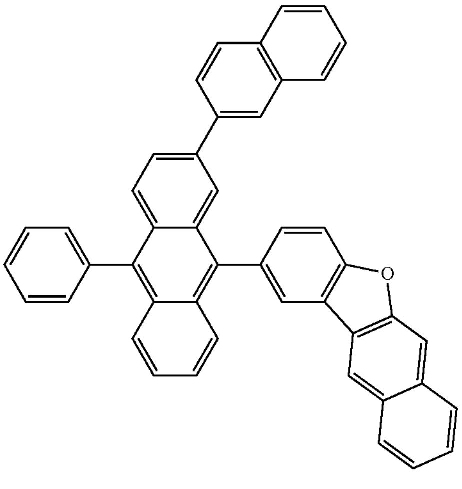

-continued
[Formula 198]
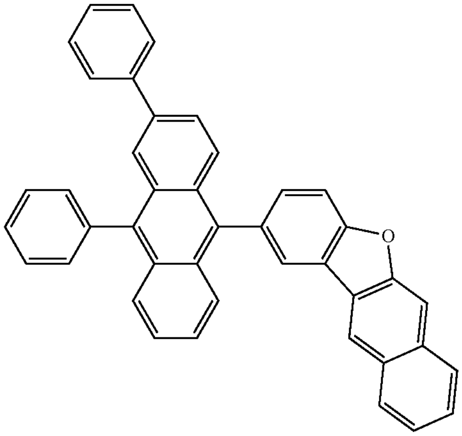
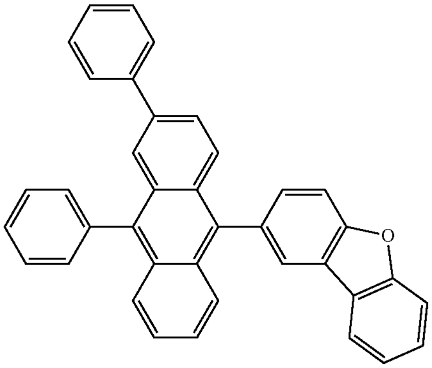
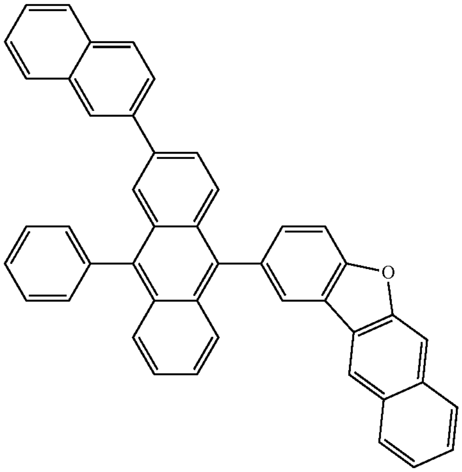
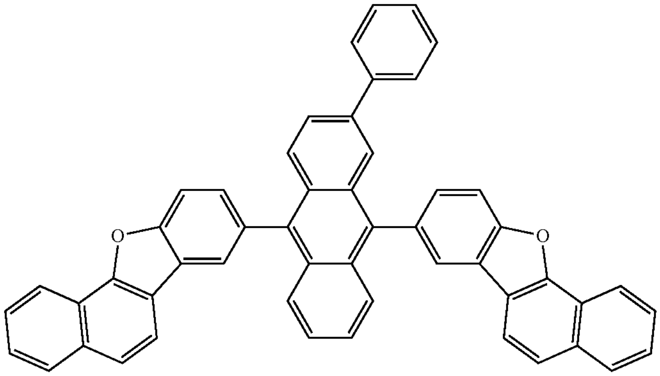
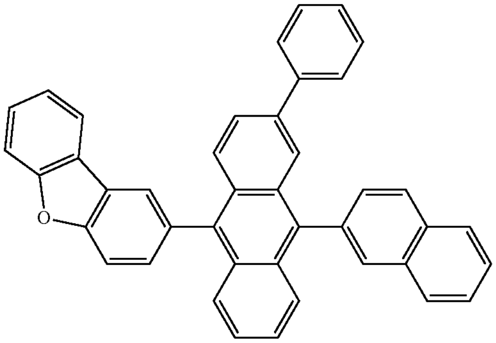
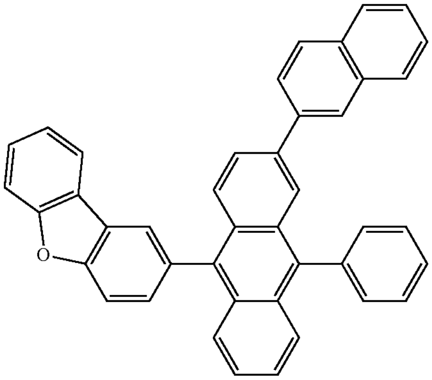
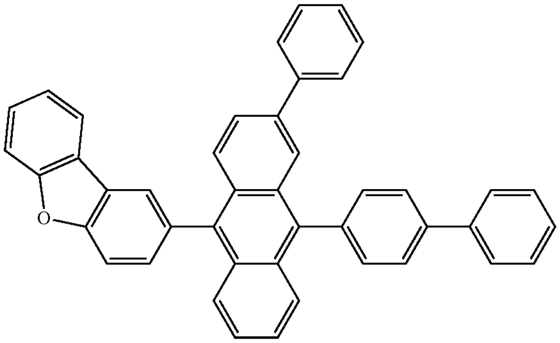
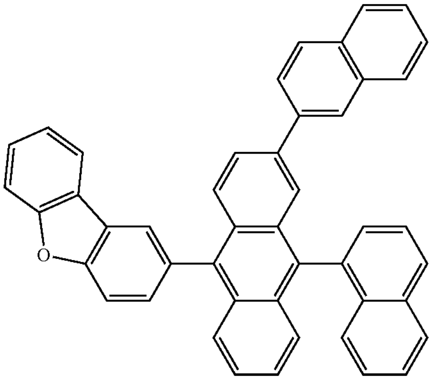

-continued
[Formula 199]
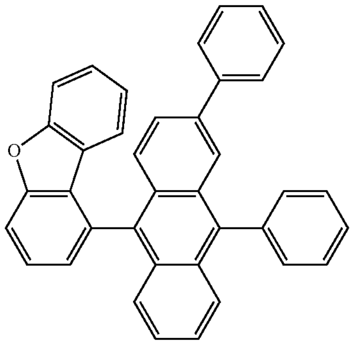
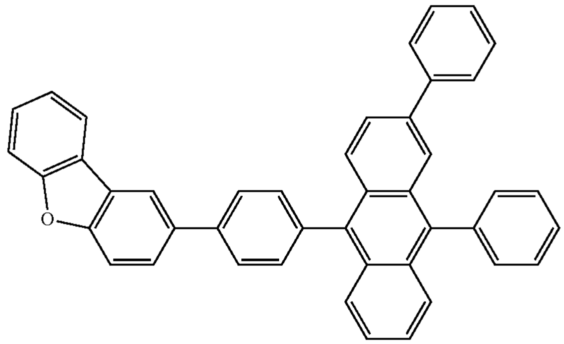
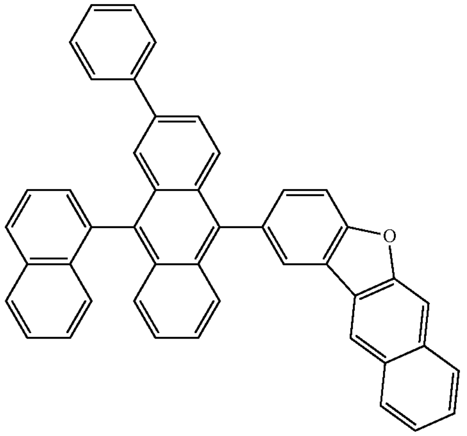
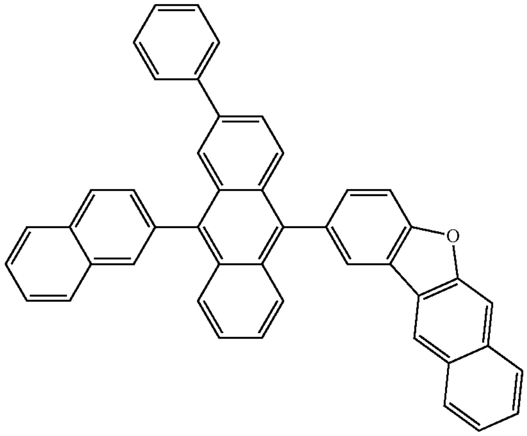
[Formula 200]
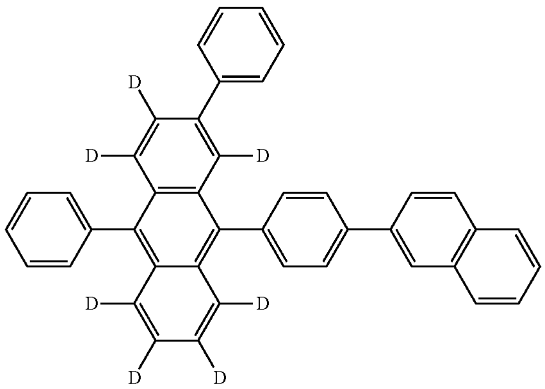
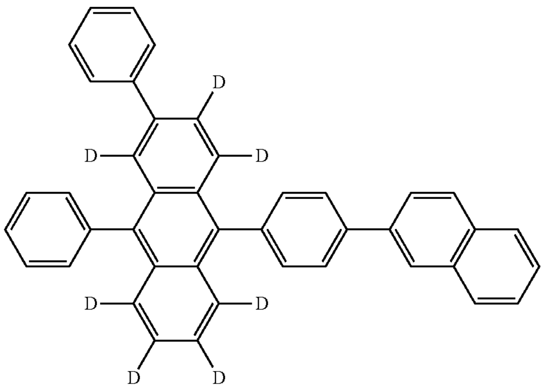
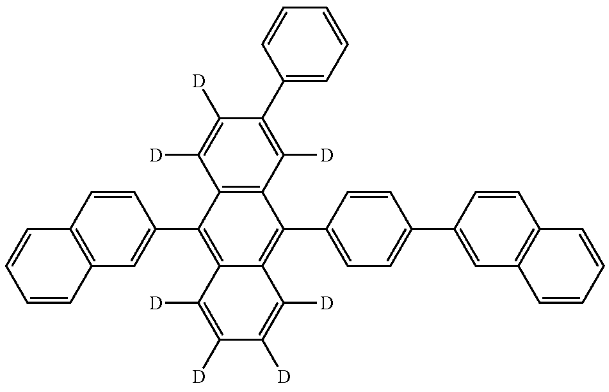

-continued
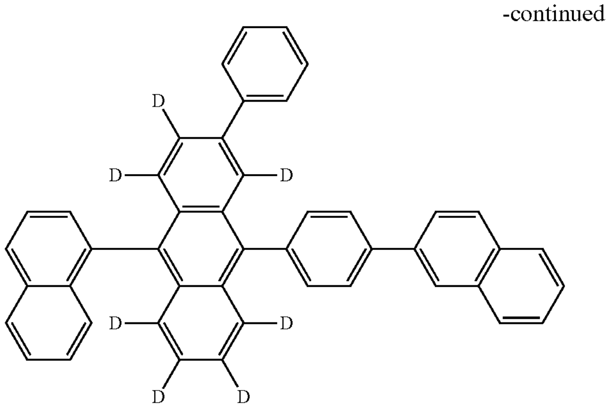
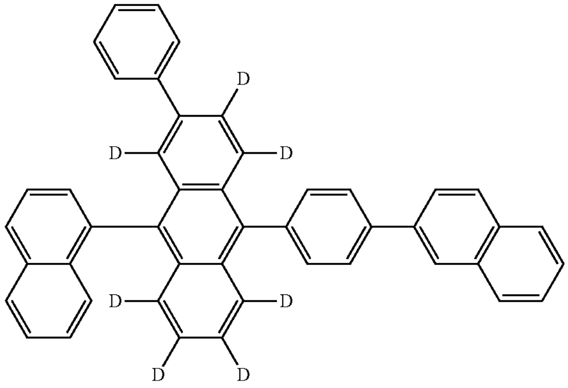
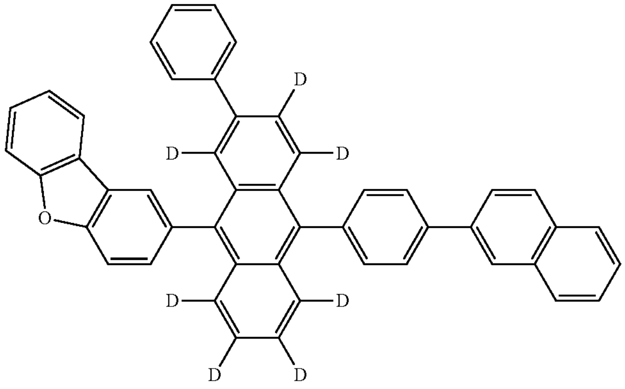
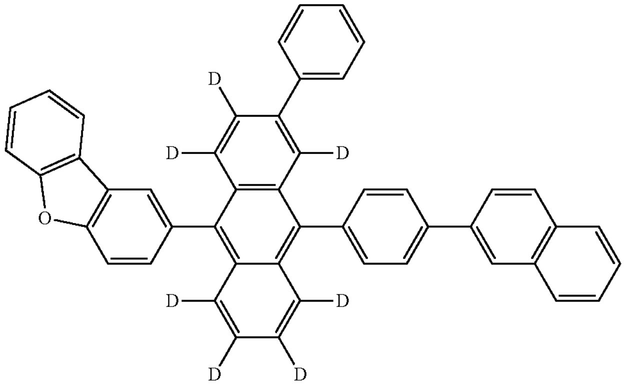

-continued
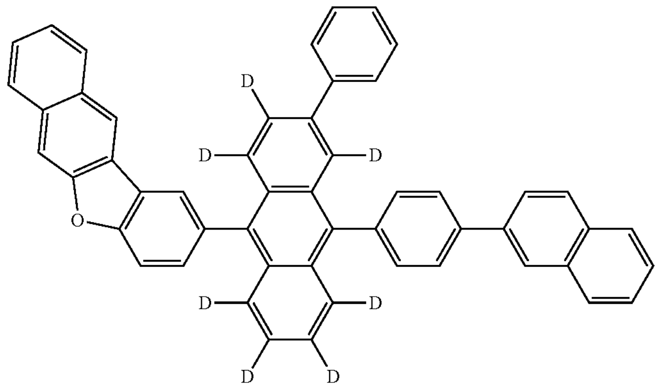
[Formula 201]
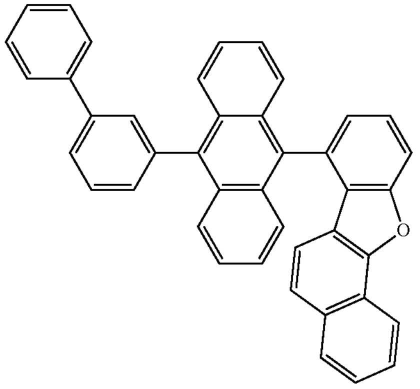
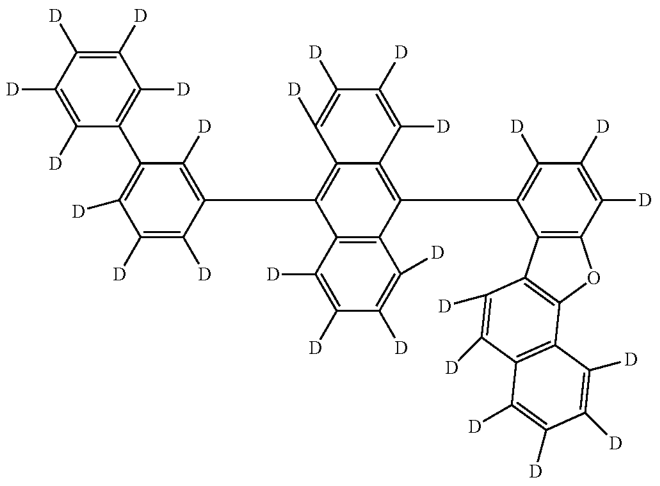
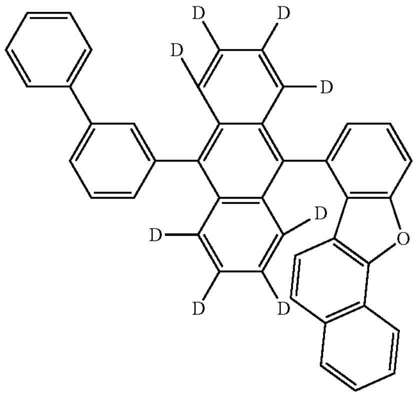
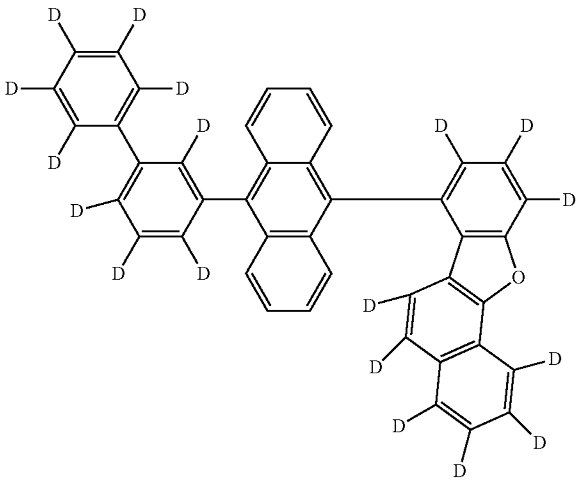

-continued
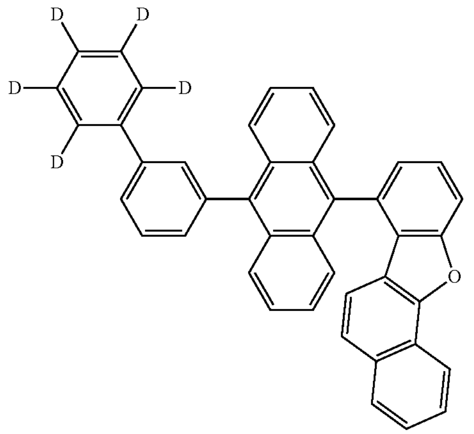
[Formula 202]
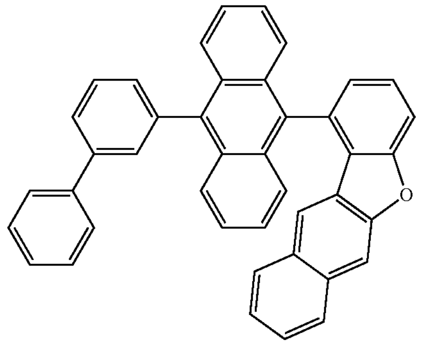
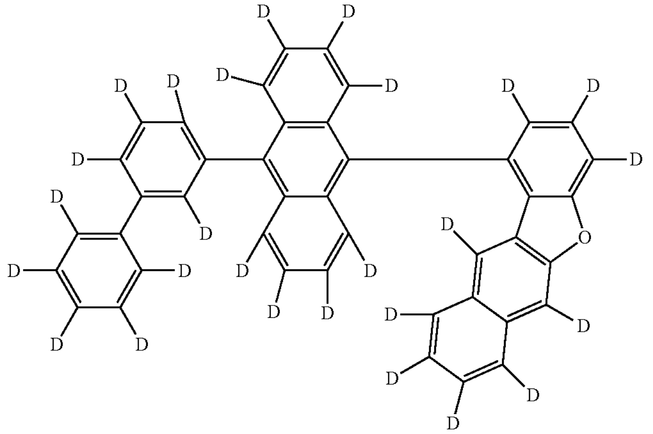
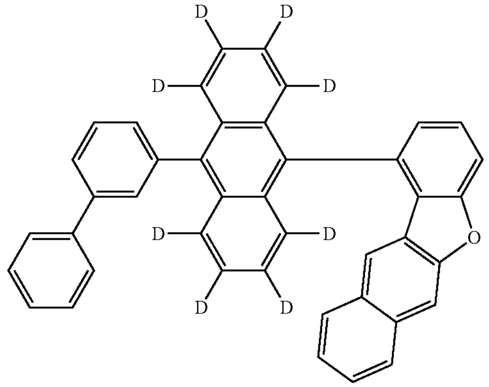
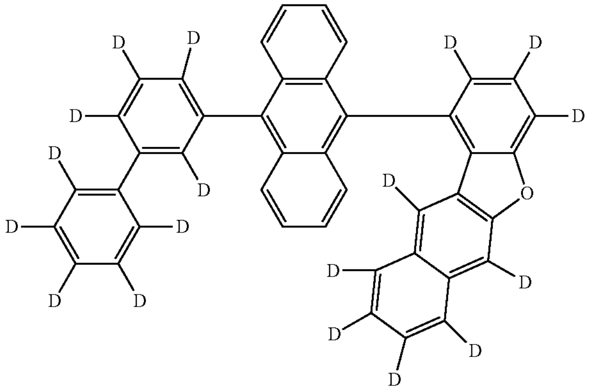
[Formula 203]
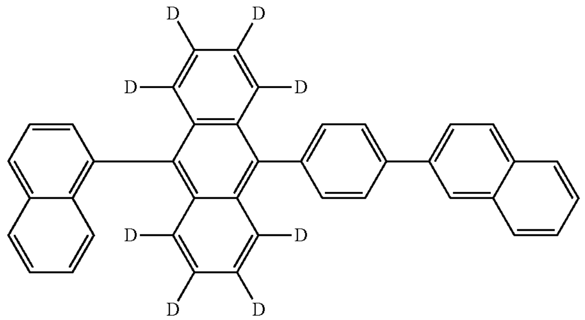

-continued
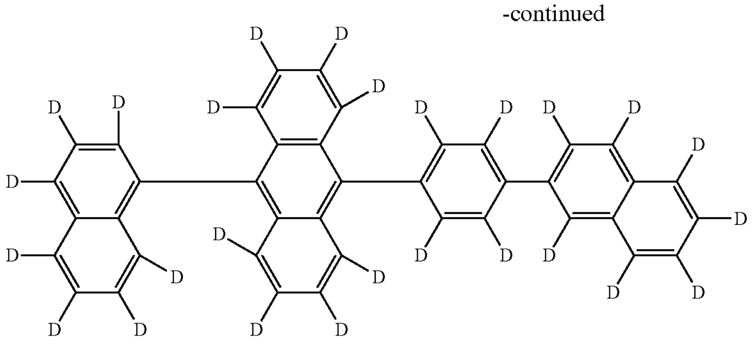
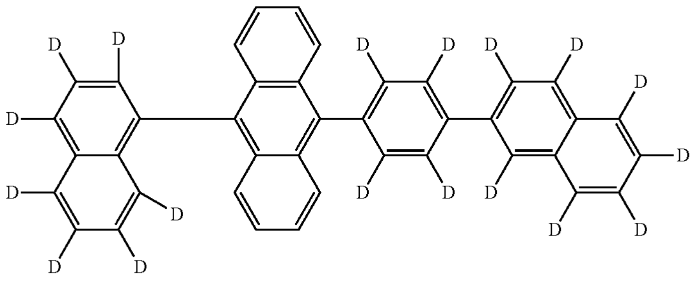
[Formula 204]
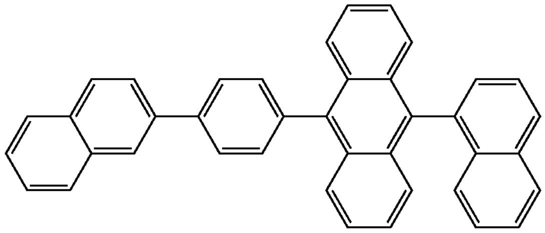
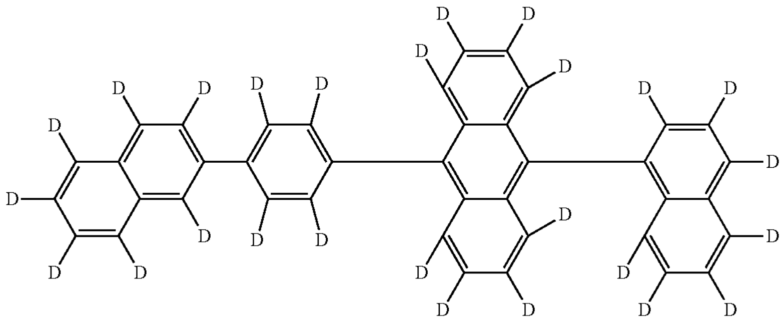
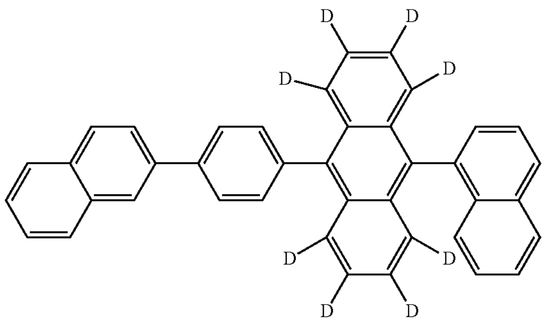

-continued
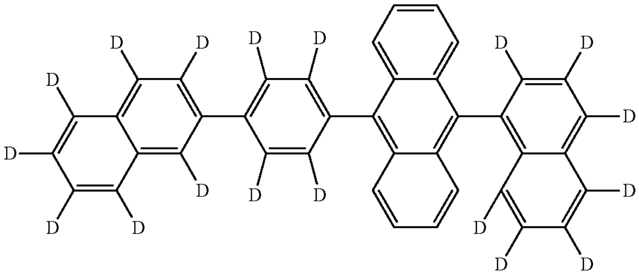
[Formula 205]
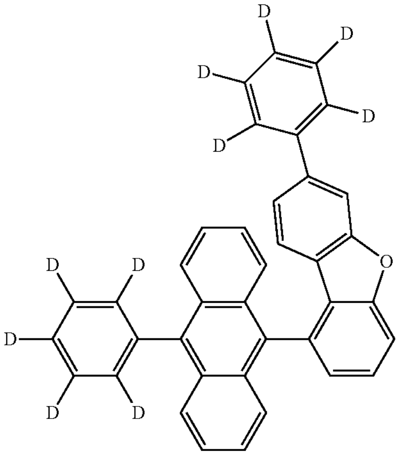
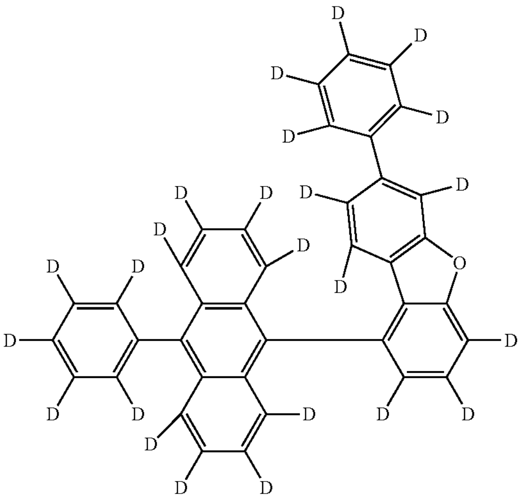
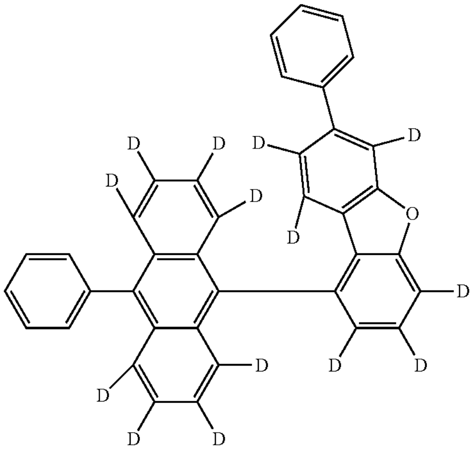
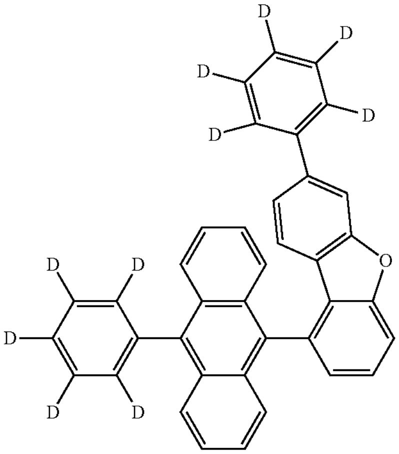
[Formula 206]
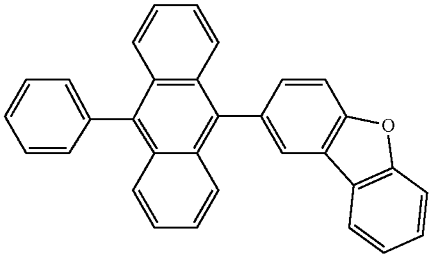
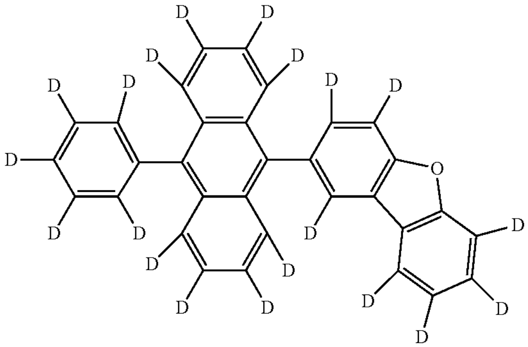

-continued
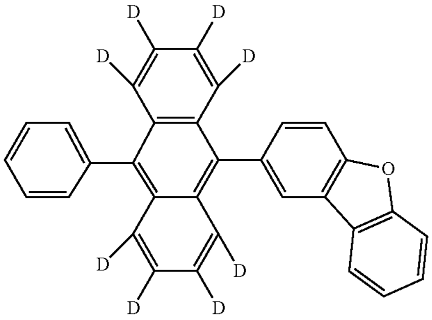
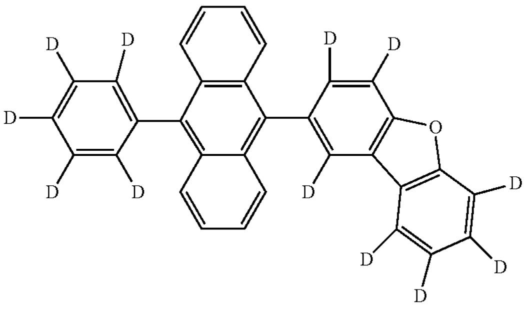
[Formula 207]
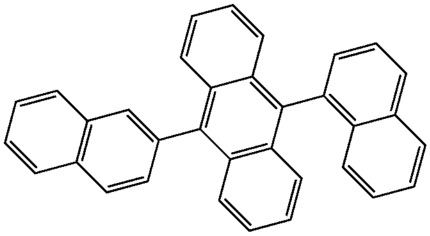
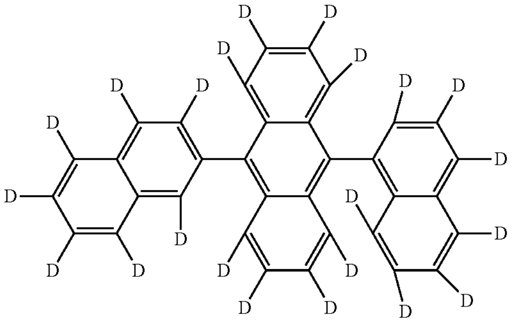
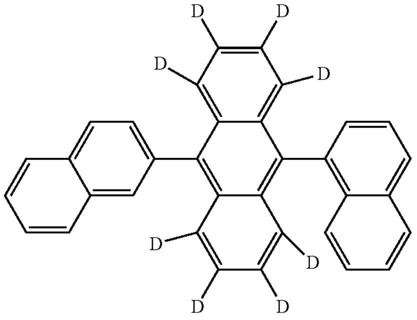
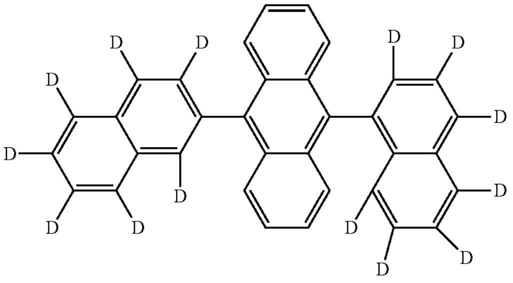
[Formula 208]
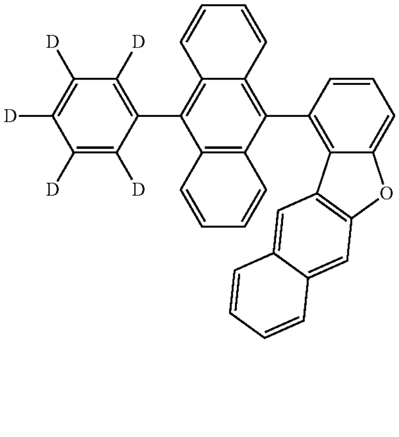
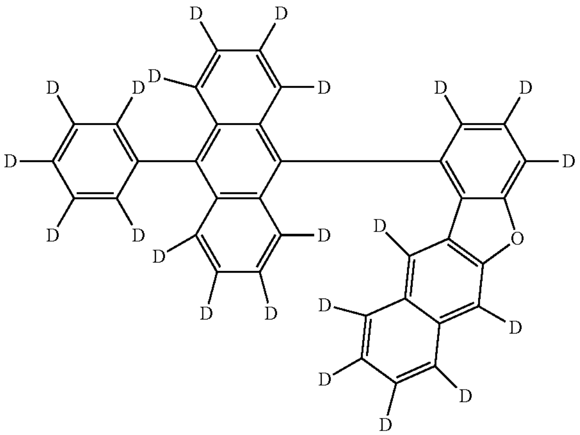

-continued

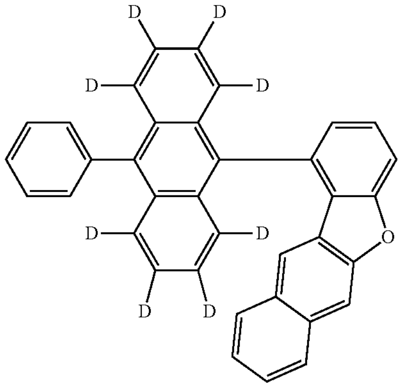

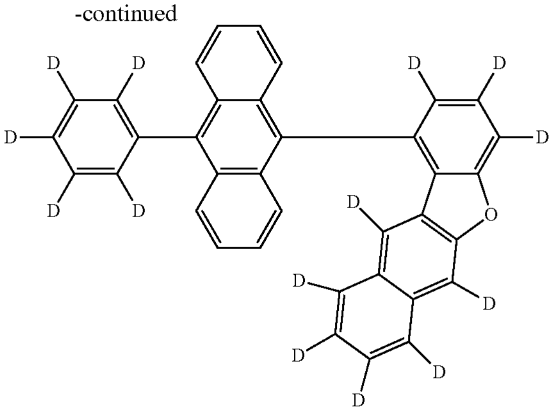

First Emitting Material and Second Emitting Material

In the organic EL device according to the exemplary embodiment, the first emitting material and the second emitting material are not particularly limited, provided that the emitting materials satisfy (a) relationships of Numerical Formulae and 30 or (b) the requirement "an overlap integral of the photoluminescence spectra of 99.0% or more". For instance, at least one compound selected from the group consisting of a compound represented by a formula (5) below and a compound represented by a formula (6) below is suitably usable.

The third emitting material is not particularly limited. For instance, a compound represented by the formula (5) or a compound represented by the formula (6) is usable.

Compound Represented by Formula (5)

The compound represented by the formula (5) will be described.

[Formula 209]

(5)

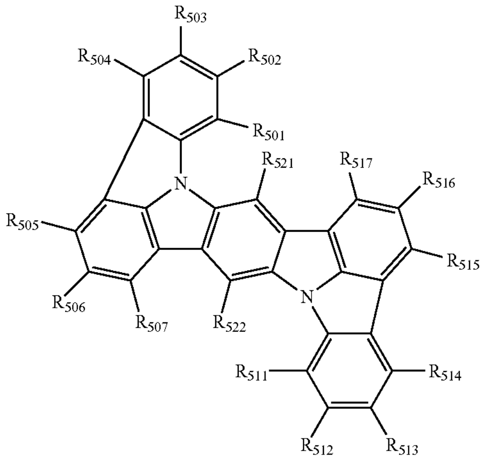

In the formula (5):

at least one combination of adjacent two or more of $R_{501}$ to $R_{507}$ and $R_{511}$ to $R_{517}$ are mutually bonded to form a substituted or unsubstituted monocyclic ring, mutually bonded to form a substituted or unsubstituted fused ring, or not mutually bonded;

$R_{501}$ to $R_{507}$ and $R_{511}$ to $R_{517}$ forming neither the monocyclic ring nor the fused ring are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a halogen atom, a cyano group, a nitro group, a substituted or unsubstituted aryl group having 6 to 50 ring carbon atoms, or a substituted or unsubstituted heterocyclic group having 5 to 50 ring atoms;

$R_{521}$ and $R_{522}$ are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a halogen atom, a cyano group, a nitro group, a substituted or unsubstituted aryl group having 6 to 50 ring carbon atoms, or a substituted or unsubstituted heterocyclic group having 5 to 50 ring atoms.

"A combination of adjacent two or more of $R_{501}$ to $R_{507}$ and $R_{511}$ to $R_{517}$" refers to, for instance, a combination of $R_{501}$ and $R_{502}$, a combination of $R_{502}$ and $R_{503}$, a combination of $R_{503}$ and $R_{504}$, a combination of $R_{505}$ and $R_{506}$, a combination of $R_{506}$ and $R_{507}$, and a combination of $R_{501}$, $R_{502}$, and $R_{503}$.

In an exemplary embodiment, at least one, preferably two of $R_{501}$ to $R_{507}$ or $R_{511}$ to $R_{517}$ are each a group represented by —N($R_{906}$)($R_{907}$).

In an exemplary embodiment, $R_{501}$ to $R_{507}$ and $R_{511}$ to $R_{517}$ are each independently a hydrogen atom, a substituted or unsubstituted aryl group having 6 to 50 ring carbon atoms, or a substituted or unsubstituted heterocyclic group having to 50 ring atoms.

In an exemplary embodiment, the compound represented by the formula (5) is a compound represented by a formula (52) below.

[Formula 210]

(52)

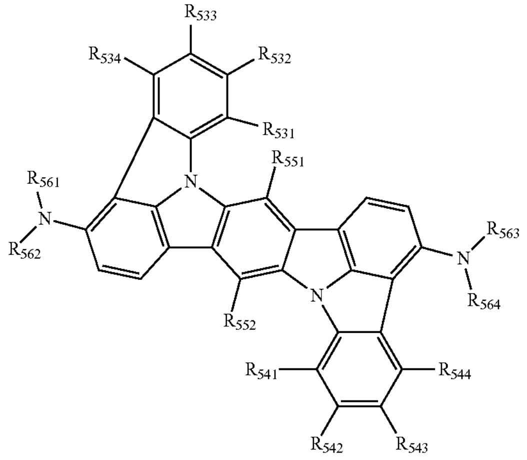

In the formula (52):

at least one combination of adjacent two or more of $R_{531}$ to $R_{534}$ and $R_{541}$ to $R_{544}$ are mutually bonded to form a substituted or unsubstituted monocyclic ring, mutually bonded to form a substituted or unsubstituted fused ring, or not mutually bonded;

$R_{531}$ to $R_{534}$, $R_{541}$ to $R_{544}$ forming neither the monocyclic ring nor the fused ring, and $R_{551}$ and $R_{552}$ are each independently a hydrogen atom, a substituted or unsubstituted aryl group having 6 to 50 ring carbon atoms, or a substituted or unsubstituted heterocyclic group having 5 to 50 ring atoms; and $R_{561}$ to $R_{564}$ are each independently a substituted or unsubstituted aryl group having 6 to 50 ring carbon atoms, or a substituted or unsubstituted heterocyclic group having 5 to 50 ring atoms.

In an exemplary embodiment, the compound represented by the formula (5) is a compound represented by a formula (53) below.

[Formula 211]

(53)

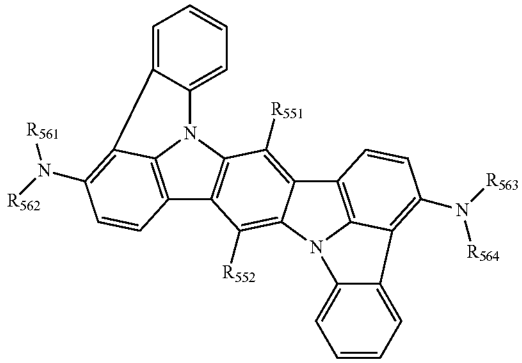

In the formula (53), $R_{551}$, $R_{552}$ and $R_{561}$ to $R_{564}$ each independently represent the same as $R_{551}$, $R_{552}$ and $R_{561}$ to $R_{564}$ in the formula (52).

In an exemplary embodiment, $R_{561}$ to $R_{564}$ in the formulae (52) and (53) are each independently a substituted or unsubstituted aryl group having 6 to 50 ring carbon atoms (preferably a phenyl group).

In an exemplary embodiment, $R_{521}$ and $R_{522}$ in the formula (5) and $R_{551}$ and $R_{552}$ in the formulae (52) and (53) are each a hydrogen atom.

In an exemplary embodiment, the substituent for the "substituted or unsubstituted" group in the formulae (5), (52) and (53) is a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms.

Specific Examples of Compound Represented by Formula (5)

Specific examples of the compound represented by the formula (5) include compounds shown below.

[Formula 212]

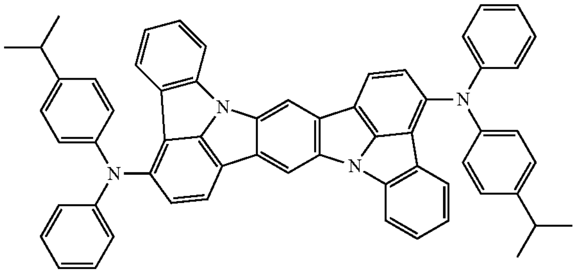

-continued

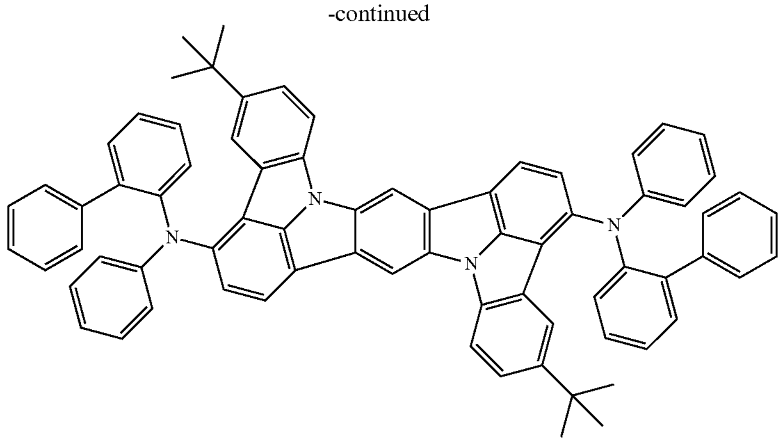

Compound Represented by Formula (6)

The compound represented by the formula (6) will be described.

[Formula 213]

(6)

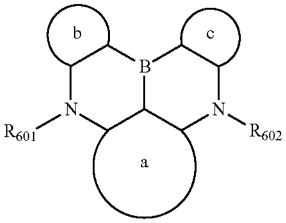

In the formula (6):

a ring a, a ring b and a ring c are each independently a substituted or unsubstituted aromatic hydrocarbon ring having 6 to 50 ring carbon atoms, or a substituted or unsubstituted heterocycle having 5 to 50 ring atoms;

$R_{601}$ and $R_{602}$ are each independently bonded to the ring a, ring b or ring c to form a substituted or unsubstituted heterocycle, or not bonded thereto to form no substituted or unsubstituted heterocycle; and $R_{601}$ and $R_{602}$ not forming the substituted or unsubstituted heterocycle are each independently a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms.

The ring a, ring b and ring c are each a ring (a substituted or unsubstituted aromatic hydrocarbon ring having 6 to 50 ring carbon atoms, or a substituted or unsubstituted heterocycle having 5 to 50 ring atoms) fused with a fused bicyclic structure formed of a boron atom and two nitrogen atoms at the center of the formula (6).

The "aromatic hydrocarbon ring" for the rings a, b, and c has the same structure as a compound formed by introducing a hydrogen atom to the "aryl group" described above.

Ring atoms of the "aromatic hydrocarbon ring" for the ring a include three carbon atoms on the fused bicyclic structure at the center of the formula (6).

Ring atoms of the "aromatic hydrocarbon ring" for the rings b and c include two carbon atoms on the fused bicyclic structure at the center of the formula (6).

Specific examples of the "substituted or unsubstituted aromatic hydrocarbon ring having 6 to 50 ring carbon atoms" include a compound formed by introducing a hydrogen atom to the "aryl group" described in the specific example group G1.

The "heterocycle" for the rings a, b, and c has the same structure as a compound formed by introducing a hydrogen atom to the "heterocyclic group" described above.

Ring atoms of the "heterocycle" for the ring a include three carbon atoms on the fused bicyclic structure at the center of the formula (6). Ring atoms of the "heterocycle" for the rings b and c include two carbon atoms on the fused bicyclic structure at the center of the formula (6). Specific examples of the "substituted or unsubstituted heterocycle having 5 to 50 ring atoms" include a compound formed by introducing a hydrogen atom to the "heterocyclic group" described in the specific example group G2.

$R_{601}$ and $R_{602}$ may be each independently bonded with the ring a, ring b, or ring c to form a substituted or unsubstituted heterocycle. The "heterocycle" in this arrangement includes a nitrogen atom on the fused bicyclic structure at the center of the formula (6). The heterocycle in the above arrangement optionally includes a hetero atom other than the nitrogen atom. $R_{601}$ and $R_{602}$ being bonded with the ring a, ring b, or ring c specifically means that atoms forming $R_{601}$ and $R_{602}$ are bonded with atoms forming the ring a, ring b, or ring c. For instance, $R_{601}$ may be bonded with the ring a to form a bicyclic (or tri-or-more cyclic) fused nitrogen-containing heterocycle, in which the ring including $R_{601}$ and the ring a are fused. Specific examples of the nitrogen-containing heterocycle include a compound corresponding to the nitrogen-containing bi (or-more)cyclic fused heterocyclic group in the specific example group G2.

The same applies to $R_{601}$ bonded with the ring b, $R_{602}$ bonded with the ring a, and $R_{602}$ bonded with the ring c.

In an exemplary embodiment, the ring a, ring b and ring c in the formula (6) are each independently a substituted or unsubstituted aromatic hydrocarbon ring having 6 to 50 ring carbon atoms.

In an exemplary embodiment, the ring a, ring b and ring c in the formula (6) are each independently a substituted or unsubstituted benzene ring or a substituted or unsubstituted naphthalene ring.

In an exemplary embodiment, $R_{601}$ and $R_{602}$ in the formula (6) are each independently a substituted or unsubstituted aryl group having 6 to 50 ring carbon atoms, or a substituted or unsubstituted heterocyclic group having 5 to 50 ring atoms, preferably a substituted or unsubstituted aryl group having 6 to 50 ring carbon atoms.

In an exemplary embodiment, the compound represented by the formula (6) is a compound represented by a formula (62) below.

[Formula 214]

(62)

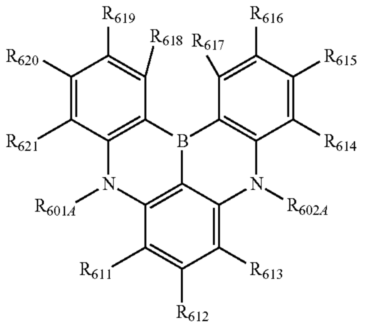

In the formula (62):

$R_{601A}$ is bonded with at least one of $R_{611}$ or $R_{621}$ to form a substituted or unsubstituted heterocycle, or not bonded therewith to form no substituted or unsubstituted heterocycle;

$R_{602A}$ is bonded with at least one of $R_{613}$ or $R_{614}$ to form a substituted or unsubstituted heterocycle, or not bonded therewith to form no substituted or unsubstituted heterocycle;

$R_{601A}$ and $R_{602A}$ not forming the substituted or unsubstituted heterocycle are each independently a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms;

at least one combination of adjacent two or more of $R_{611}$ to $R_{621}$ are mutually bonded to form a substituted or unsubstituted monocyclic ring, mutually bonded to form a substituted or unsubstituted fused ring, or not mutually bonded; and $R_{611}$ to $R_{621}$ not forming the substituted or unsubstituted heterocycle, not forming the monocyclic ring, and not forming the fused ring are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by $-Si(R_{901})(R_{902})(R_{903})$, a group represented by $-O-(R_{904})$, a group represented by $-S-(R_{905})$, a group represented by $-N(R_{906})(R_{907})$, a halogen atom, a cyano group, a nitro group, a substituted or unsubstituted aryl group having 6 to 50 ring carbon atoms, or a substituted or unsubstituted heterocyclic group having 5 to ring atoms.

$R_{601A}$ and $R_{602A}$ in the formula (62) are groups corresponding to $R_{601}$ and $R_{602}$ in the formula (6), respectively.

For instance, $R_{601A}$ and $R_{611}$ are optionally bonded with each other to form a bicyclic (or tri-or-more cyclic) fused nitrogen-containing heterocycle, in which the ring including $R_{601A}$ and $R_{611}$ and a benzene ring corresponding to the ring a are fused. Specific examples of the nitrogen-containing heterocycle include a compound corresponding to the nitrogen-containing bi (or-more)cyclic fused heterocyclic group in the specific example group G2. The same applies to $R_{601A}$ bonded with $R_{621}$, $R_{602A}$ bonded with $R_{613}$, and $R_{602A}$ bonded with $R_{614}$.

At least one combination of adjacent two or more of $R_{611}$ to $R_{621}$ may be mutually bonded to form a substituted or unsubstituted monocyclic ring, or mutually bonded to form a substituted or unsubstituted fused ring.

For instance, $R_{611}$ and $R_{612}$ are optionally mutually bonded to form a structure in which a benzene ring, indole ring, pyrrole ring, benzofuran ring, benzothiophene ring or the like is fused to the six-membered ring bonded with $R_{611}$ and $R_{612}$, the resultant fused ring forming a naphthalene ring, carbazole ring, indole ring, dibenzofuran ring, or dibenzothiophene ring, respectively.

In an exemplary embodiment, $R_{611}$ to $R_{621}$ not contributing to ring formation are each independently a hydrogen atom, a substituted or unsubstituted alkyl group having 1 to 50 carbon atoms, a substituted or unsubstituted aryl group having 6 to 50 ring carbon atoms, or a substituted or unsubstituted heterocyclic group having 5 to 50 ring atoms.

In an exemplary embodiment, $R_{611}$ to $R_{621}$ not contributing to ring formation are each independently a hydrogen atom, a substituted or unsubstituted aryl group having 6 to 50 ring carbon atoms, or a substituted or unsubstituted heterocyclic group having 5 to 50 ring atoms.

In an exemplary embodiment, $R_{611}$ to $R_{621}$ not contributing to ring formation are each independently a hydrogen atom, or a substituted or unsubstituted alkyl group having 1 to 50 carbon atoms.

In an exemplary embodiment, $R_{611}$ to $R_{621}$ not contributing to ring formation are each independently a hydrogen atom, or a substituted or unsubstituted alkyl group having 1 to 50 carbon atoms, and at least one of $R_{611}$ to $R_{621}$ is a substituted or unsubstituted alkyl group having 1 to 50 carbon atoms.

In an exemplary embodiment, the compound represented by the formula (62) is a compound represented by a formula (63) below.

[Formula 215]

(63)

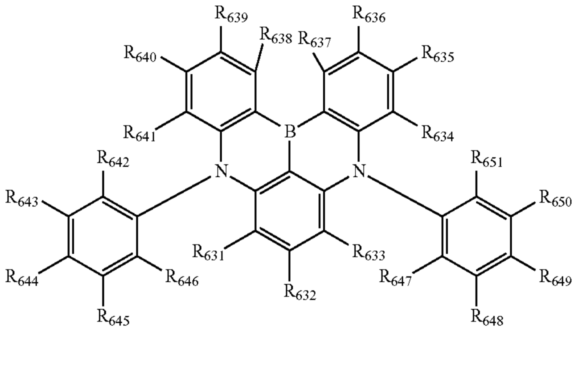

In the formula (63):

$R_{631}$ is bonded with $R_{646}$ to form a substituted or unsubstituted heterocycle, or not bonded therewith to form no substituted or unsubstituted heterocycle;

$R_{633}$ is bonded with $R_{647}$ to form a substituted or unsubstituted heterocycle, or not bonded therewith to form no substituted or unsubstituted heterocycle;

$R_{634}$ is bonded with $R_{651}$ to form a substituted or unsubstituted heterocycle, or not bonded therewith to form no substituted or unsubstituted heterocycle;

$R_{641}$ is bonded with $R_{642}$ to form a substituted or unsubstituted heterocycle, or not bonded therewith to form no substituted or unsubstituted heterocycle;

at least one combination of adjacent two or more of $R_{631}$ to $R_{651}$ are mutually bonded to form a substituted or unsubstituted monocyclic ring, mutually bonded to form a substituted or unsubstituted fused ring, or not mutually bonded; and $R_{631}$ to $R_{651}$ not forming the substituted or unsubstituted heterocycle, not forming the monocyclic ring, and not forming the fused ring are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by $—Si(R_{901})(R_{902})(R_{903})$, a group represented by $—O—(R_{904})$, a group represented by $—S—(R_{905})$, a group represented by $—N(R_{906})(R_{907})$, a halogen atom, a cyano group, a nitro group, a substituted or unsubstituted aryl group having 6 to 50 ring carbon atoms, or a substituted or unsubstituted heterocyclic group having 5 to ring atoms.

$R_{631}$ is optionally bonded with $R_{646}$ to form a substituted or unsubstituted heterocycle. For instance, $R_{631}$ and $R_{646}$ are optionally bonded with each other to form a tri-or-more cyclic fused nitrogen-containing heterocycle, in which a benzene ring bonded with $R_{646}$, a ring including a nitrogen atom, and a benzene ring corresponding to the ring a are fused. Specific examples of the nitrogen-containing heterocycle include a compound corresponding to a nitrogen-containing tri(-or-more)cyclic fused heterocyclic group in the specific example group G2. The same applies to $R_{633}$ bonded with $R_{647}$, $R_{634}$ bonded with $R_{651}$, and $R_{641}$ bonded with $R_{642}$.

In an exemplary embodiment, $R_{631}$ to $R_{651}$ not contributing to ring formation are each independently a hydrogen atom, a substituted or unsubstituted alkyl group having 1 to 50 carbon atoms, a substituted or unsubstituted aryl group having 6 to 50 ring carbon atoms, or a substituted or unsubstituted heterocyclic group having 5 to ring atoms.

In an exemplary embodiment, $R_{631}$ to $R_{651}$ not contributing to ring formation are each independently a hydrogen atom, a substituted or unsubstituted aryl group having 6 to 50 ring carbon atoms, or a substituted or unsubstituted heterocyclic group having 5 to 50 ring atoms.

In an exemplary embodiment, $R_{631}$ to $R_{651}$ not contributing to ring formation are each independently a hydrogen atom, or a substituted or unsubstituted alkyl group having 1 to 50 carbon atoms.

In an exemplary embodiment, $R_{631}$ to $R_{651}$ not contributing to ring formation are each independently a hydrogen atom, or a substituted or unsubstituted alkyl group having 1 to 50 carbon atoms, and at least one of $R_{631}$ to $R_{651}$ is a substituted or unsubstituted alkyl group having 1 to 50 carbon atoms.

In an exemplary embodiment, the compound represented by the formula (63) is a compound represented by a formula (63A) below.

[Formula 216]

(63A)

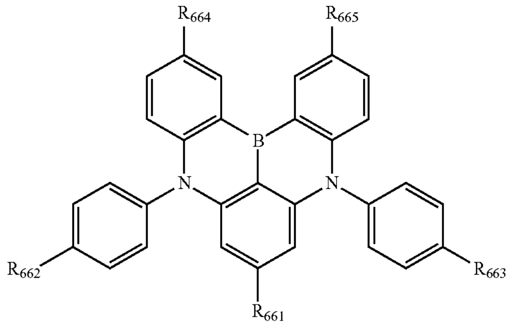

In the formula (63A):

$R_{661}$ is a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, or a substituted or unsubstituted aryl group having 6 to 50 ring carbon atoms;

$R_{662}$ to $R_{665}$ are each independently a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, or a substituted or unsubstituted aryl group having 6 to 50 ring carbon atoms.

In an exemplary embodiment, $R_{661}$ to $R_{665}$ are each independently a substituted or unsubstituted alkyl group having 1 to 50 carbon atoms, or a substituted or unsubstituted aryl group having 6 to 50 ring carbon atoms.

In an exemplary embodiment, $R_{661}$ to $R_{665}$ are each independently a substituted or unsubstituted alkyl group having 1 to 50 carbon atoms.

In an exemplary embodiment, the compound represented by the formula (63) is a compound represented by a formula (63B) below.

[Formula 217]

(63B)

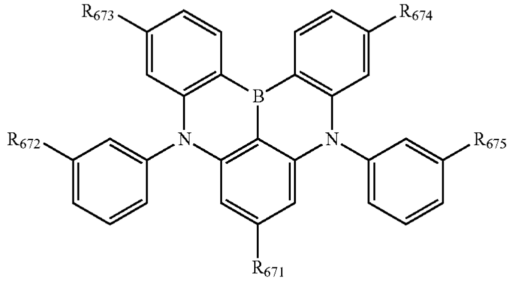

In the formula (63B):

$R_{671}$ and $R_{672}$ are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —N($R_{906}$)($R_{907}$), or a substituted or unsubstituted aryl group having 6 to 50 ring carbon atoms;

$R_{673}$ to $R_{675}$ are each independently a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —N($R_{906}$)($R_{907}$), or a substituted or unsubstituted aryl group having 6 to 50 ring carbon atoms.

In an exemplary embodiment, the compound represented by the formula (63) is a compound represented by a formula (63B') below.

[Formula 218]

(63B')

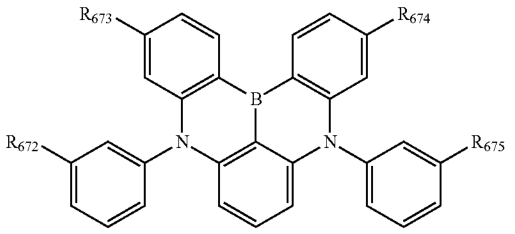

In the formula (63B'), $R_{672}$ to $R_{675}$ each independently represent the same as $R_{672}$ to $R_{675}$ in the formula (63B).

In an exemplary embodiment, at least one of $R_{671}$ to $R_{675}$ is a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —N($R_{906}$)($R_{907}$), or a substituted or unsubstituted aryl group having 6 to 50 ring carbon atoms.

In an exemplary embodiment: $R_{672}$ is a hydrogen atom, a substituted or unsubstituted alkyl group having 1 to 50 carbon atoms, a group represented by —N($R_{906}$)($R_{907}$), or a substituted or unsubstituted aryl group having 6 to 50 ring carbon atoms;

$R_{671}$ and $R_{673}$ to $R_{675}$ are each independently a substituted or unsubstituted alkyl group having 1 to 50 carbon atoms, a group represented by —N($R_{906}$)($R_{907}$), or a substituted or unsubstituted aryl group having 6 to 50 ring carbon atoms.

In an exemplary embodiment, the compound represented by the formula (63) is a compound represented by a formula (63C) below.

[Formula 219]

(63C)

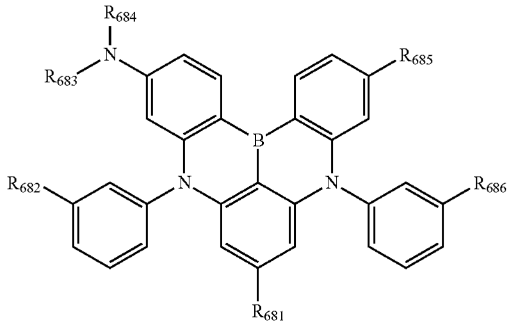

In the formula (63C):

$R_{681}$ and $R_{682}$ are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, or a substituted or unsubstituted aryl group having 6 to 50 ring carbon atoms;

$R_{683}$ to $R_{686}$ are each independently a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, or a substituted or unsubstituted aryl group having 6 to 50 ring carbon atoms.

In an exemplary embodiment, the compound represented by the formula (63) is a compound represented by a formula (63C') below.

[Formula 220]

(63C')

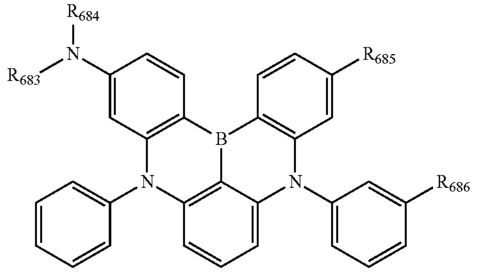

In the formula (63C'), $R_{683}$ to $R_{686}$ each independently represent the same as $R_{683}$ to $R_{686}$ in the formula (63C).

In an exemplary embodiment, $R_{681}$ to $R_{686}$ are each independently a substituted or unsubstituted alkyl group having 1 to 50 carbon atoms, or a substituted or unsubstituted aryl group having 6 to 50 ring carbon atoms.

In an exemplary embodiment, $R_{681}$ to $R_{686}$ are each independently a substituted or unsubstituted aryl group having 6 to 50 ring carbon atoms.

The compound represented by the formula (6) is producible by initially bonding the ring a, ring b and ring c with linking groups (a group including N—$R_{601}$ and a group including N—$R_{602}$) to form an intermediate (first reaction), and bonding the ring a, ring b and ring c with a linking group (a group including a boron atom) to form a final product (second reaction). In the first reaction, an amination reaction (e.g. Buchwald-Hartwig reaction) is applicable. In the second reaction, Tandem Hetero-Friedel-Crafts Reactions or the like is applicable.

Specific Examples of Compound Represented by Formula (6)

Specific examples of the compound represented by the formula (6) are shown below. It should however be noted that these specific examples are merely exemplary and do not limit the compound represented by the formula (6).

[Formula 221]

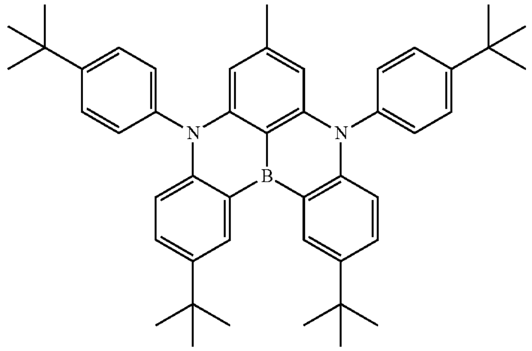

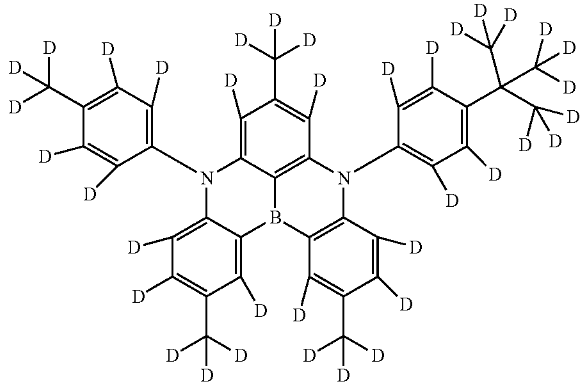

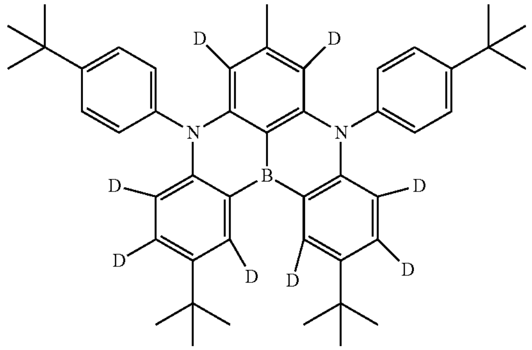

-continued

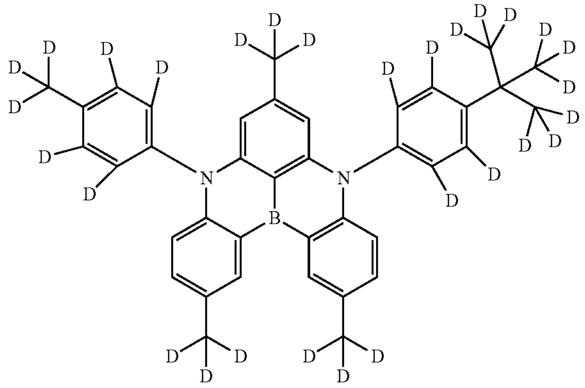

[Formula 222]

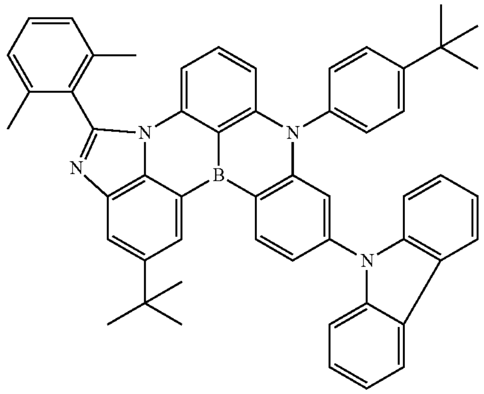

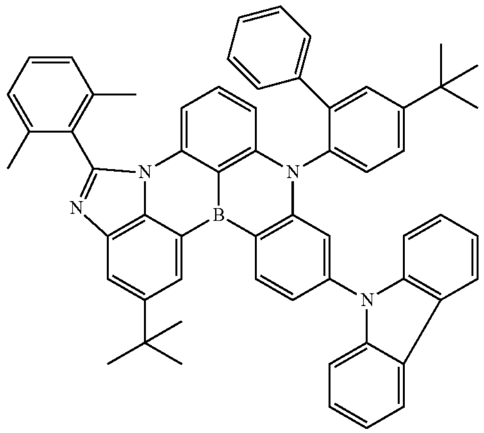

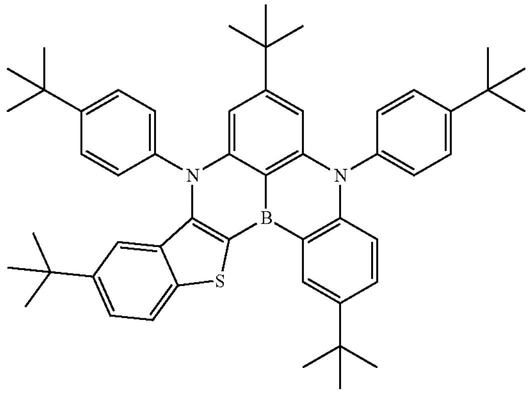

-continued

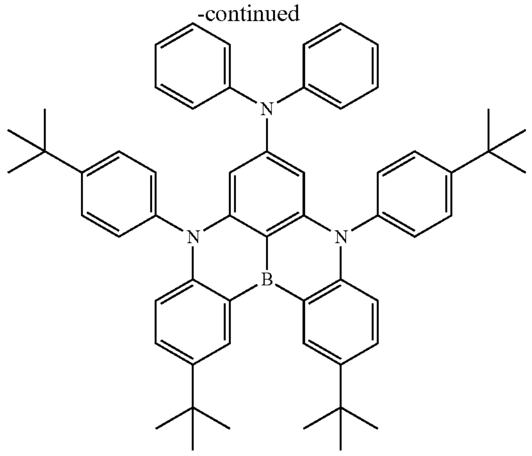

In an exemplary embodiment, a substituent for the "substituted or unsubstituted" group in each of the formulae is an unsubstituted alkyl group having 1 to 50 carbon atoms, an unsubstituted alkenyl group having 2 to 50 carbon atoms, an unsubstituted alkynyl group having 2 to 50 carbon atoms, an unsubstituted cycloalkyl group having 3 to 50 ring carbon atoms, —Si($R_{901a}$)($R_{902a}$)($R_{903a}$), —O—($R_{904a}$), —S—($R_{905a}$), —N($R_{906a}$)($R_{907a}$), a halogen atom, a cyano group, a nitro group, an unsubstituted aryl group having 6 to 50 ring carbon atoms, or an unsubstituted heterocyclic group having 5 to 50 ring atoms;

$R_{901a}$ to $R_{907a}$ are each independently a hydrogen atom, an unsubstituted alkyl group having 1 to 50 carbon atoms, an unsubstituted aryl group having 6 to 50 ring carbon atoms, or an unsubstituted heterocyclic group having 5 to 50 ring atoms;

when two or more $R_{901a}$ are present, the two or more $R_{901a}$ are mutually the same or different;

when two or more $R_{902a}$ are present, the two or more $R_{902a}$ are mutually the same or different;

when two or more $R_{903a}$ are present, the two or more $R_{903a}$ are mutually the same or different;

when two or more $R_{904a}$ are present, the two or more $R_{904a}$ are mutually the same or different;

when two or more $R_{905a}$ are present, the two or more $R_{905a}$ are mutually the same or different;

when two or more $R_{906a}$ are present, the two or more $R_{906a}$ are mutually the same or different; and when two or more $R_{907a}$ are present, the two or more $R_{907a}$ are mutually the same or different.

In an exemplary embodiment, a substituent for the "substituted or unsubstituted" group in each of the formulae is an unsubstituted alkyl group having 1 to 50 carbon atoms, an unsubstituted aryl group having 6 to 50 ring carbon atoms, or an unsubstituted heterocyclic group having 5 to 50 ring atoms.

In an exemplary embodiment, a substituent for the "substituted or unsubstituted" group in each of the formulae is an unsubstituted alkyl group having 1 to 18 carbon atoms, an unsubstituted aryl group having 6 to 18 ring carbon atoms, or an unsubstituted heterocyclic group having 5 to 18 ring atoms.

Sixth Exemplary Embodiment

Organic Electroluminescence Apparatus

An organic EL apparatus according to a sixth exemplary embodiment includes: a first device that is the organic EL device according to any of the first to third exemplary embodiments; a second device that is an organic EL device different from the first device; and a substrate.

As the first device, the organic EL device according to any of the first to third exemplary embodiments is adoptable.

The second device may be a device that fluoresces or a device that phosphoresces. The organic EL device according to any of the first to third exemplary embodiments or an organic EL device different from the above exemplary embodiments is applicable as the second device.

The emission color of the first and second devices is not particularly limited.

FIG. 4 schematically shows an exemplary arrangement of an organic EL apparatus according to the sixth exemplary embodiment.

FIG. 4 shows a case where the organic EL device 1 of the first exemplary embodiment is applied as the first device.

An organic EL apparatus 101 includes a first device 100 (the organic EL device 1 of the first exemplary embodiment), a second device 200 different from the first device 100, the light-transmissive substrate 2, and a color conversion portion. The color conversion portion includes a first color filter 81 and a second color filter 82 arranged near the anode 3. The first device 100 and the second device 200 are arranged in parallel on the substrate 2.

The second device 200 includes a second-device emitting layer 60 as the emitting layer. The second-device emitting layer 60 may be a single layer, a laminate, a fluorescent emitting layer, or a phosphorescent emitting layer.

Light emitted from the first device 100 and the second device 200 is extracted on the side of the organic EL apparatus 101 close to the anode 3, passes through the color conversion portion (first color filter 81 and second color filter 82), and is outputted to the outside of the organic EL apparatus 101.

The organic EL apparatus 101 of the sixth exemplary embodiment is not limited to the arrangement of the organic EL apparatus 101 shown in FIG. 4. As another exemplary arrangement, the organic EL apparatus may include the color conversion portion (first color filter 81 and second color filter 82) between the substrate 2 and the anode 3. As the color conversion portion, a quantum dot may be used.

According to the sixth exemplary embodiment, the organic EL apparatus 101 excellent in luminous efficiency can be provided. The organic EL apparatus 101 according to the sixth exemplary embodiment is usable in an electronic device such as a display device and a light-emitting unit

Seventh Exemplary Embodiment

An arrangement of an organic EL apparatus according to a seventh exemplary embodiment is explained. In the description of the seventh exemplary embodiment, the same components as those in the sixth exemplary embodiment are denoted by the same reference signs and names to simplify or omit explanation of the components.

The organic EL apparatus according to the seventh exemplary embodiment further includes a third device, which is a difference from the organic EL apparatus according to the sixth exemplary embodiment.

The organic EL apparatus according to the seventh exemplary embodiment further includes the third device that is an organic EL device different from the first device and the second device.

The third device may be a device that fluoresces or a device that phosphoresces. The organic EL device according to any of the first to third exemplary embodiments or an organic EL device different from the above exemplary embodiments is applicable as the third device. The emission color of the third device is not particularly limited.

Similar to the sixth exemplary embodiment, the seventh exemplary embodiment is a case where the organic EL device 1 of the first exemplary embodiment is applied as the first device.

FIG. 5 schematically shows an exemplary arrangement of the organic EL apparatus according to the seventh exemplary embodiment.

An organic EL apparatus 102 includes the first device 100 (the organic EL device 1 of the first exemplary embodiment), the second device 200, a third device 300, the light-transmissive substrate 2, and a color conversion portion. The color conversion portion includes the first color filter 81, the second color filter 82, and a third color filter 83 arranged near the anode 3. The first device 100, the second device 200, and the third device 300 are arranged in parallel on the substrate 2.

The third device 300 includes a third-device emitting layer 70 as the emitting layer. The third-device emitting layer 70 may be a single layer, a laminate, a fluorescent emitting layer, or a phosphorescent emitting layer.

Light emitted from the first device 100, the second device 200, and the third device 300 is extracted on the side of the organic EL apparatus 102 close to the anode 3, passes through the color conversion portion (first color filter 81, second color filter 82, and third color filter 83), and is outputted to the outside of the organic EL apparatus 102.

The organic EL apparatus 102 of the seventh exemplary embodiment is not limited to the arrangement of the organic EL apparatus 102 shown in FIG. 5. As another exemplary arrangement, the organic EL apparatus may include the color conversion portion (first color filter 81, second color filter 82, and third color filter 83) between the substrate 2 and the anode 3. As the color conversion portion, a quantum dot may be used.

According to the seventh exemplary embodiment, the organic EL apparatus 102 excellent in luminous efficiency can be provided. The organic EL apparatus 102 according to the seventh exemplary embodiment is usable in an electronic device such as a display device and a light-emitting unit.

Eighth Exemplary Embodiment

Electronic Device

An electronic device according to an eighth exemplary embodiment includes at least one of the organic EL devices according to the first to fifth exemplary embodiments or at least one of the organic EL apparatuses according to the sixth and seventh exemplary embodiments.

Examples of the electronic device include a display device and a light-emitting unit. Examples of the display device include a display component (e.g., an organic EL panel module), TV, mobile phone, tablet and personal computer. Examples of the light-emitting unit include an illuminator and a vehicle light.

Modification of Embodiment(s)

The scope of the invention is not limited to the above-described exemplary embodiments but includes any modification and improvement as long as such modification and improvement are compatible with the invention.

For instance, the number of emitting layers is not limited to two, and more than two emitting layers may be provided and layered with each other. When the organic EL device includes more than two emitting layers, it is only necessary that at least two of the emitting layers should satisfy the requirements mentioned in the above exemplary embodiment. For instance, the rest of the emitting layers may be a fluorescent emitting layer or a phosphorescent emitting layer with use of emission caused by electron transfer from the triplet excited state directly to the ground state.

When the organic EL device includes a plurality of emitting layers, these emitting layers may be mutually adjacently provided, or may form a so-called tandem organic EL device, in which a plurality of emitting units are layered via an intermediate layer.

For instance, a blocking layer may be provided adjacent to at least one of a side of the emitting layer close to the anode or a side of the emitting layer close to the cathode. The blocking layer is preferably provided in contact with the emitting layer to block at least any of holes, electrons, or excitons.

For instance, when the blocking layer is provided in contact with the side of the emitting layer close to the cathode, the blocking layer permits transport of electrons and blocks holes from reaching a layer provided closer to the cathode (e.g., the electron transporting layer) beyond the blocking layer. When the organic EL device includes the electron transporting layer, the blocking layer is preferably interposed between the emitting layer and the electron transporting layer.

When the blocking layer is provided in contact with the side of the emitting layer close to the anode, the blocking layer permits transport of holes and blocks electrons from reaching a layer provided closer to the anode (e.g., the hole transporting layer) beyond the blocking layer. When the organic EL device includes the hole transporting layer, the blocking layer is preferably interposed between the emitting layer and the hole transporting layer.

Alternatively, the blocking layer may be provided adjacent to the emitting layer so that excitation energy does not leak out from the emitting layer toward neighboring layer(s). The blocking layer blocks excitons generated in the emitting layer from being transferred to a layer(s) (e.g., the electron transporting layer and the hole transporting layer) closer to the electrode(s) beyond the blocking layer.

The emitting layer is preferably bonded with the blocking layer.

Specific structure, shape and the like of the components in the invention may be designed in any manner as long as an object of the invention can be achieved.

EXAMPLES

The invention will be described in further detail with reference to Examples. It should be noted that the scope of the invention is by no means limited to Examples.

Structures of compounds used for producing organic EL devices in Example 1 and Comparative 1 are shown below.

[Formula 223]
BH1-4
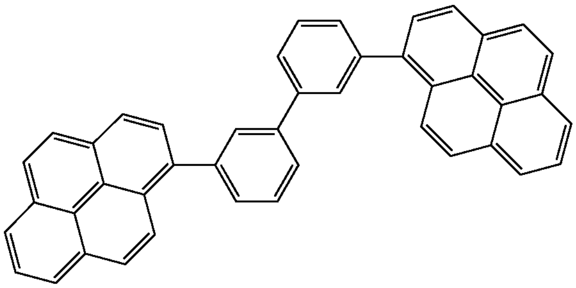
BH1-6
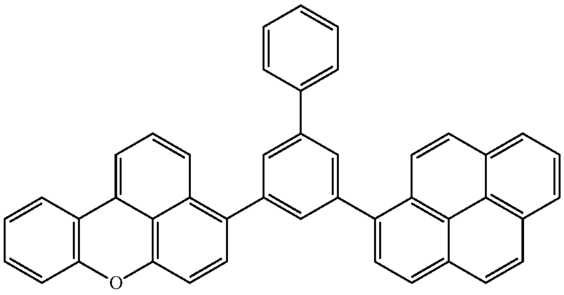
BH2-4
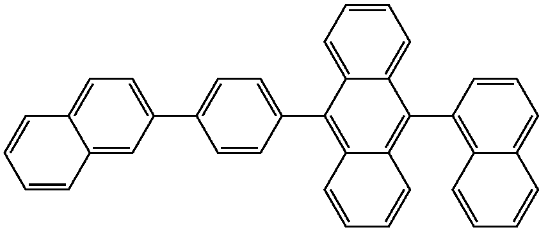
[Formula 224]
BD-2
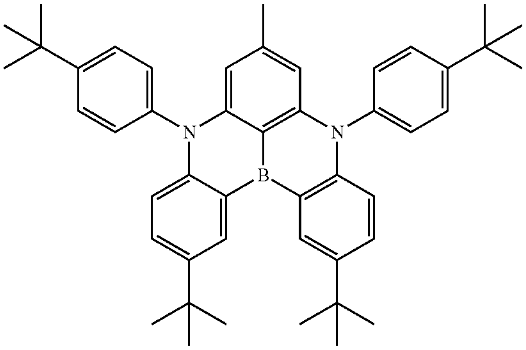
BD-1
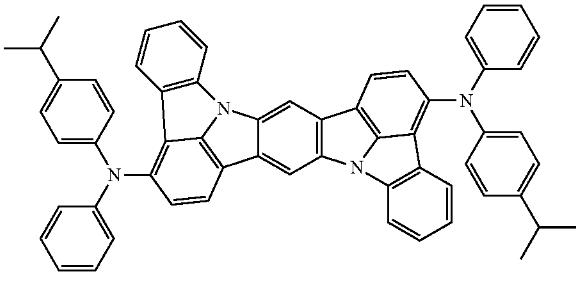
-continued
[Formula 225]
HA10
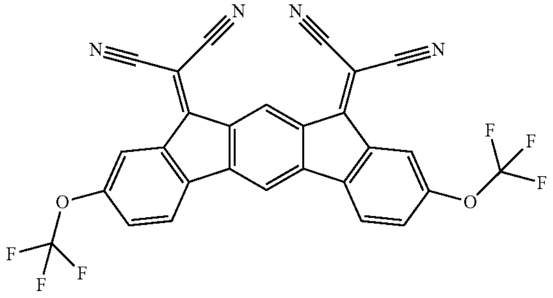
HT10
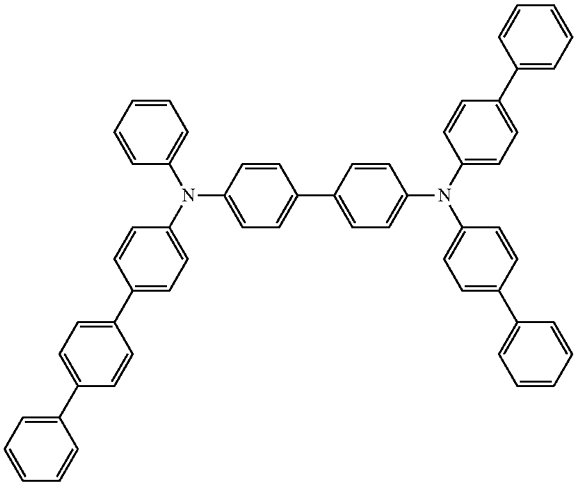
[Formula 226]
HT20
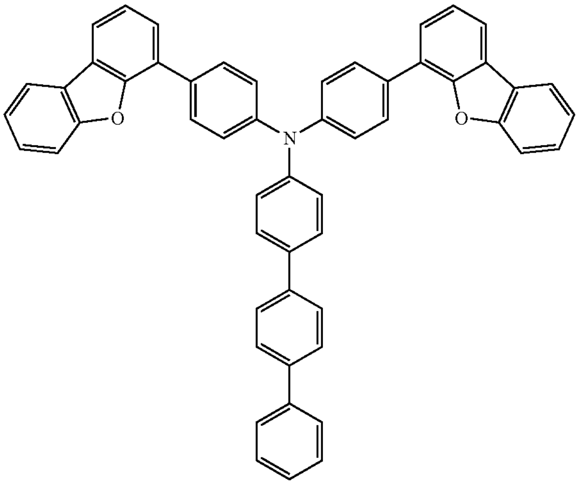

-continued

[Formula 227]

ET10

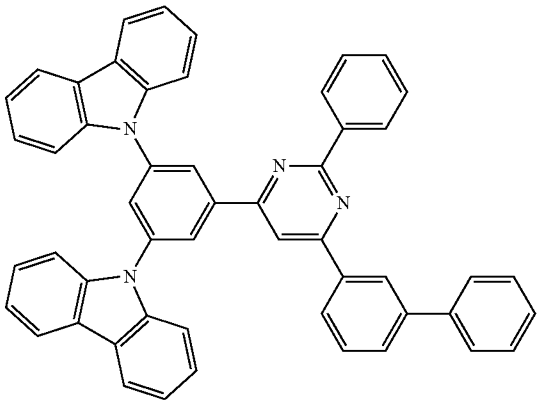

ET20

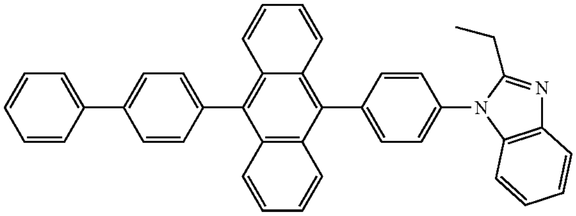

Production 1 of Bottom Emission Type Organic EL Device

Organic EL devices were produced and evaluated as follows.

Example 1

A glass substrate (size: 25 mm×75 mm×1.1 mm thick, produced by Geomatec Co., Ltd.) having an ITO (Indium Tin Oxide) transparent electrode (anode) was ultrasonic-cleaned in isopropyl alcohol for five minutes, and then UV-ozone-cleaned for 30 minutes. A film thickness of the ITO transparent electrode was 130 nm.

After the glass substrate having the transparent electrode line was cleaned, the glass substrate was mounted on a substrate holder of a vacuum evaporation apparatus. First, a compound HA10 was vapor-deposited on a surface of the glass substrate, where the transparent electrode line was provided, to cover the transparent electrode, thereby forming a 5-nm-thick hole injecting layer (HI).

After forming the hole injecting layer, a compound HT10 was vapor-deposited to form an 80-nm-thick first hole transporting layer (HT).

After forming the first hole transporting layer, a compound HT20 was vapor-deposited to form a 10-nm-thick second hole transporting layer (also referred to as an electron blocking layer) (EBL).

A compound BH1-6 (first host material (BH1)) and a compound BD-2 (first emitting material (BD1)) were co-deposited on the second hole transporting layer such that the ratio of the compound BD-2 accounted for 2 mass %, thereby forming a first emitting layer.

A compound BH2-4 (second host material (BH2)) and the compound BD-2 (second emitting material (BD2)) were co-deposited on the first emitting layer such that the ratio of the compound BD-2 accounted for 2 mass %, thereby forming a 20-nm-thick second emitting layer.

A compound ET10 was vapor-deposited on the second emitting layer to form a 10-nm-thick first electron transporting layer (also referred to as a hole blocking layer) (HBL).

A compound ET20 was vapor-deposited on the first electron transporting layer (HBL) to form a 15-nm-thick second electron transporting layer (ET).

LiF was vapor-deposited on the second electron transporting layer to form a 1-nm-thick electron injecting layer.

Metal (Al) was vapor-deposited on the electron injecting layer to form an 80-nm-thick cathode.

A device arrangement of the organic EL device in Example 1 is roughly shown as follows.

ITO (130)/HA10(5)/HT10(80)/HT20(10)/BH1-6:BD-2 (5.98%:2%)/BH2-4:BD-2 (20.98%:2%)/ET10(10)/ET20(15)/LiF(1)/Al(80) Numerals in parentheses represent a film thickness (unit: nm).

The numerals (98%:2%) represented by percentage in the same parentheses indicate a ratio (mass %) between the host material (the compound BH1-6 or the compound BH2-4) and the emitting material (the compound BD-2) in the first emitting layer or the second emitting layer. Similar notations apply to the description below.

Comparative 1

The organic EL device in Comparative 1 was produced in the same manner as in Example 1 except that the compounds BH1-6 and BD-2 in the first emitting layer in Example 1 were replaced by compounds shown in Table 8 and that the compound BD-2 in the second emitting layer in Example 1 was replaced by a compound shown in Table 8.

Evaluation of Organic EL Devices

The organic EL devices produced in Example 1 and Comparative 1 were evaluated as follows. Table 8 shows evaluation results.

External Quantum Efficiency EQE

The organic EL device for which no color filter was attached was measured for the external quantum efficiency EQE (unit: %) according to a method below.

Voltage was applied to the organic EL device so that a current density was 10 mA/cm$^2$, where spectral radiance spectrum was measured by a spectroradiometer (CS-2000 produced by Konica Minolta, Inc.). The external quantum efficiency EQE (unit: %) was calculated based on the obtained spectral-radiance spectra, assuming that the spectra was provided under a Lambertian radiation.

Subsequently, the color filter was attached to the organic EL device using a transparent adhesive.

As the color filter, a gelatin color filter (produced by Edmund Optics Japan, No. 47 deep blue, commodity code #53-700) was used.

Voltage was applied again to the organic EL device with the color filter so that the current density was 10.0 mA/cm$^2$, where the spectral radiance spectrum was measured by the spectroradiometer CS-2000. The external quantum efficiency EQE (unit: %) was calculated based on the obtained spectral-radiance spectra, assuming that the spectra was provided under a Lambertian radiation.

Using a formula (Numerical Formula 101) below, "EQE (%) with the color filter" was determined as "EQE (relative value: %) relative to "EQE (%) without the color filter" defined as 100. In the formula (Numerical Formula 101), each example means Example 1 or Comparative 1.

$$EQE \text{ of each example (relative value: \%)} = (EQE \text{ (\%) of each example with color filter}/EQE \text{ (\%) of each example without color filter}) \times 100 \quad \text{(Numerical Formula 101)}$$

Maximum Peak Wavelength λp of Light Emitted from Device when being Driven

Voltage was applied to the organic EL device so that a current density of the organic EL device was 10 mA/cm$^2$, where spectral radiance spectrum was measured by a spectroradiometer CS-2000 (produced by Konica Minolta, Inc.).

A maximum peak wavelength λp (unit: nm) was calculated from the obtained spectral radiance spectrum.

|λ1−λ2| and |FWHM1−FWHM2|

The first film and the second film were prepared by the above-described method, and measurement was performed for the maximum peak wavelength λ1 and the full width at half maximum FWHM1 of the photoluminescence spectrum of the first film (having the same arrangement as that of the first emitting layer) and the maximum peak wavelength λ2 and the full width at half maximum FWHM2 of the photoluminescence spectrum of the second film (having the same arrangement as that of the second emitting layer).

|λ1−λ2| (unit: nm) and |FWHM1−FWHM2| (unit: nm) were calculated from the obtained values.

-continued

BH1-5

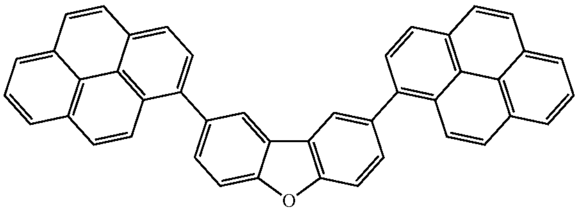

TABLE 8

| | First emitting layer | | | | Second emitting layer | | | | | | EQE without CF | EQE with CF | | |
|---|---|---|---|---|---|---|---|---|---|---|---|---|---|---|
| | First host material | | | First emitting material | Second host material | | | Second emitting material | | | | | | |
| | Name | $S_1$ [ev] | $T_1$ [ev] | | Name | $S_1$ [ev] | $T_1$ [ev] | | Δλ (nm) | ΔFWHM (nm) | (relative value: %) | (relative value: %) | Overlap integral (%) | λp |
| Ex. 1 | BH1-6 | 3.03 | 2.10 | BD-2 | BH2-4 | 3.01 | 1.87 | BD-2 | 1 | 1 | 100 | 58 | 99.7 | 462 |
| Comp. 1 | BH1-4 | 3.34 | 2.10 | BD-1 | BH2-4 | 3.01 | 1.87 | BD-1 | 2 | 4 | 100 | 51 | 97.8 | 462 |

Details of Table 8

CF represents a color filter.

Δλ represents |λ1−λ2|.

ΔFWHM represents |FWHM1−FWHM2|.

The same applies to Tables 9 to 13.

In order to obtain desired chromaticity, the color filter was used in the organic EL device in each of Example 1 and Comparative 1. In the organic EL device with the color filter in Comparative 1, luminous efficiency was greatly reduced. In the organic EL device with the color filter in Example 1, since the spectra of light from the emitting layers when no color filter was used had a short-wavelength, a region where luminous efficiency was reduced was small. As shown in FIG. 8, assuming that EQE without the color filter was defined as 100, EQE was maintained at 58% in Example 1.

The luminous efficiency of Example 1 in which all the relationships of Numeral Formulae 1, 20, and 30 were satisfied was better than that of Comparative 1 in which the relationship of Numerical Formula 30 was not satisfied.

Further, the organic EL device in Example 1 includes the first and second emitting layers that satisfy the relationship of Numerical Formula 1 and have an overlap integral of 99.0% or more.

Structures of compounds used for producing organic EL devices in Examples 2 to 4 and Comparatives 2 to 4 are shown below.

[Formula 228]

BH1-1

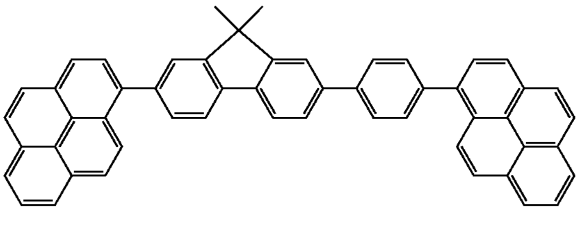

-continued

BH1-8

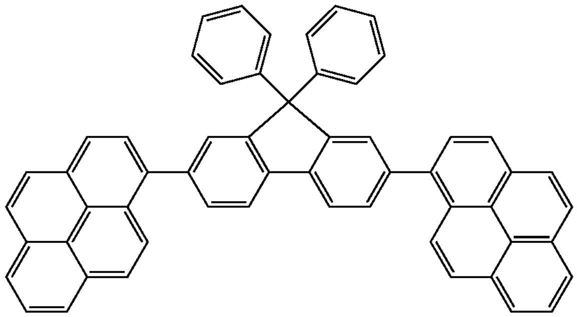

BH1-15

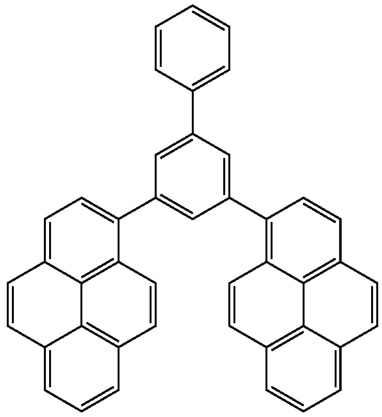

-continued
[Formula 229]
BH2-7
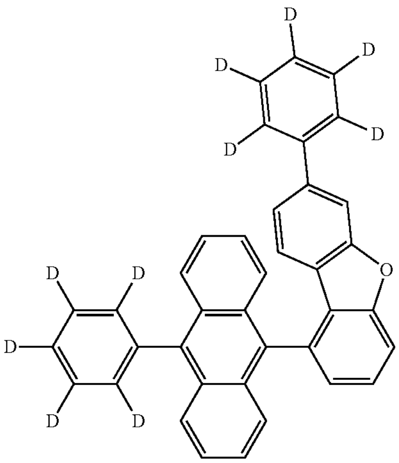
BH2-12
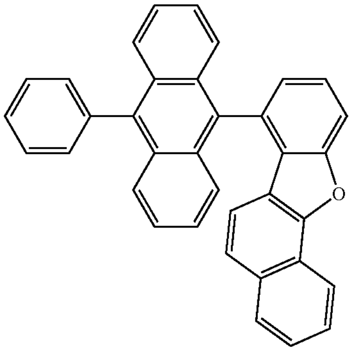
[Formula 230]
BD-2
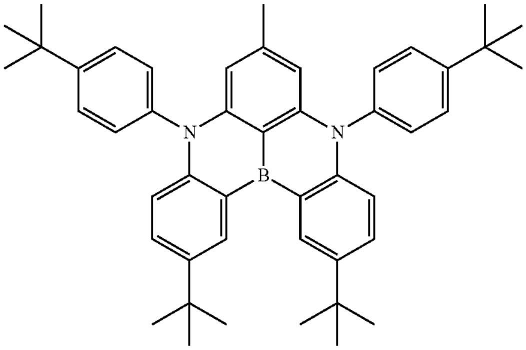
-continued
[Formula 231]
HA1
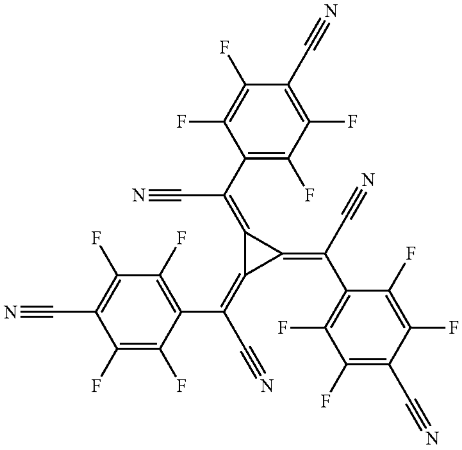
HT1
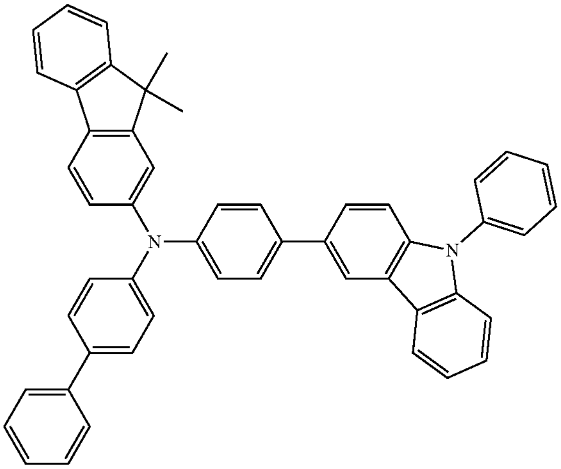
[Formula 232]
EB1
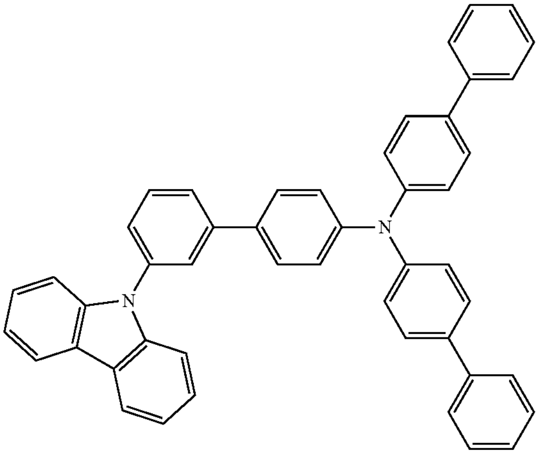

-continued

HB1

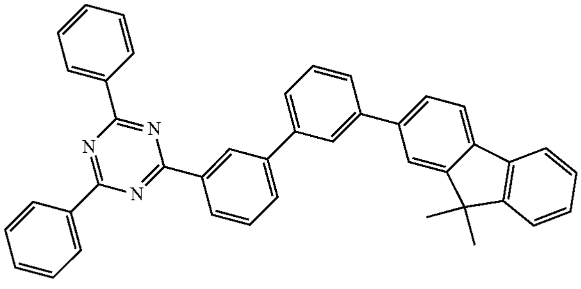

[Formula 233]

ET1

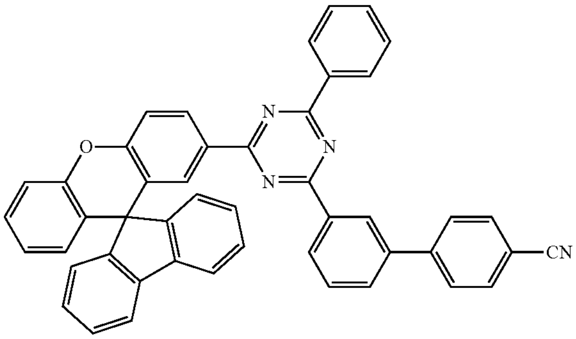

ET3

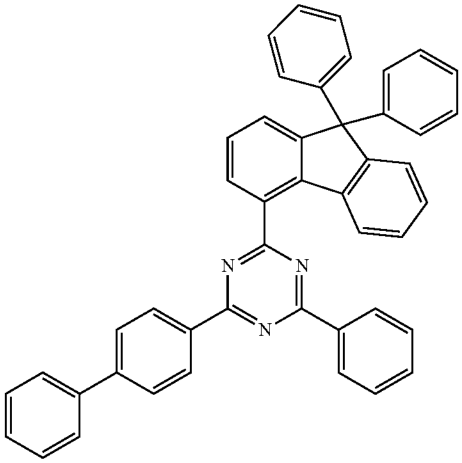

ET2

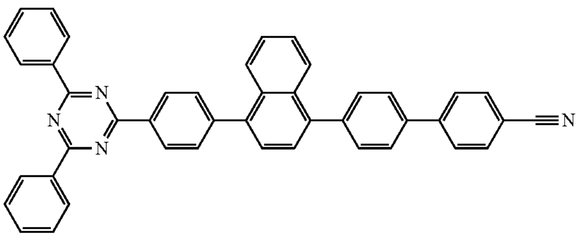

-continued

[Formula 234]

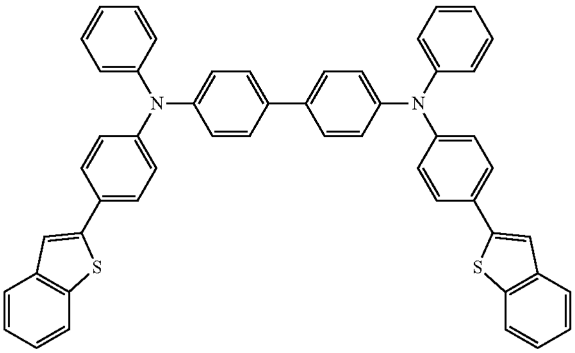

Cap

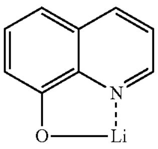

Liq

Production 1 of Top Emission Type Organic EL Device

Organic EL devices were produced and evaluated as follows.

Example 2

On a glass substrate, an APC (Ag—Pd—Cu) layer (light reflection layer) having a film thickness of 100 nm, which was a silver alloy layer, and an indium zinc oxide (IZO) layer (conductive layer) having a thickness of 10 nm were formed in this order by sputtering.

Subsequently, with a normal lithography technique, this conductive material layer including the light reflection layer and the conductive layer was patterned by etching using a resist pattern as a mask to form an anode provided with the light reflection layer. The substrate formed with the lower electrode (anode) was ultrasonic-cleaned in isopropyl alcohol for five minutes, and then UV-ozone-cleaned for 30 minutes.

Next, a compound HT1 and a compound HA1 were co-deposited by vacuum deposition to form a hole injecting layer having a film thickness of 10 nm. The concentrations of the compound HT1 and the compound HA1 in the hole injecting layer were 97 mass % and 3 mass %, respectively.

Next, the compound HT1 was vapor-deposited on the hole injecting layer to form a 114-nm-thick first hole transporting layer (HT).

A compound EB1 was vapor-deposited on the first hole transporting layer to form a 5-nm-thick second hole transporting layer (also referred to as an electron blocking layer) (EBL).

A compound BH1-5 (first host material (BH1)) and the compound BD-2 (first emitting material (BD1)) were co-deposited on the second hole transporting layer such that the ratio of the compound BD-2 accounted for 1 mass %, thereby forming a first emitting layer.

A compound BH2-7 (second host material (BH2)) and the compound BD-2 (second emitting material (BD2)) were co-deposited on the first emitting layer such that the ratio of the compound BD-2 accounted for 1 mass %, thereby forming a 15-nm-thick second emitting layer.

A compound HB1 was vapor-deposited on the second emitting layer to form a 5-nm-thick first electron transporting layer (also referred to as a hole blocking layer) (HBL).

A compound ET1 and a compound Liq were co-deposited on the first electron transporting layer (HBL) to form a 25-nm-thick second electron transporting layer (ET). The ratios of the compound ET1 and the compound Liq in the second electron transporting layer (ET) were both 50 mass %. Liq is an abbreviation of (8-quinolinolato)lithium ((8-Quinolinolato)lithium).

Yb (ytterbium) was vapor-deposited on the second electron transporting layer to form a 1-nm-thick electron injecting layer.

Mg and Ag were vapor-deposited on the electron injecting layer to form a 12-nm-thick cathode formed of a semi-transmissive MgAg alloy. The concentrations of Mg and Ag in the cathode were 10 mass % and 90 mass %, respectively. Cap was used to form a film on the cathode by vacuum deposition to form a 65-nm capping layer.

A device arrangement of the organic EL device in Example 2 is roughly shown as follows.

APC(100)/IZO(10)/HT1:HA1(10.97/0:3%)/HT1(114)/EB1(5)/BH1-5:BD-2(5.99%:1%)/BH2-7:BD-2(15.99%:1%)/HB1(5)/ET1:Liq(25.50V0:50%)/Yb(1)/Mg:Ag(12.10%:90%)/Cap(65)

Numerals in parentheses represent a film thickness (unit: nm).

The numerals (97%:3%) represented by percentage in the same parentheses indicate a ratio (mass %) between the compound HT1 and the compound HA1 in the hole injecting layer. The numerals (99%:1%) represented by percentage in the same parentheses indicate a ratio (mass %) between the host material (BH1 or BH2) and the emitting material (BD1 or BD2) in the first emitting layer or the second emitting layer. The numerals (50%:50%) represented by percentage in the same parentheses indicate a ratio (mass %) between the compound ET1 and the compound Liq in the second electron transporting layer (ET).

Comparative Example 2

The organic EL device in Comparative 2 was produced in the same manner as in Example 2 except that the compound BH1-5 in the first emitting layer in Example 2 was replaced by a compound shown in Table 9.

Evaluation of Organic EL Devices

The organic EL devices produced in Example 2 and Comparative 2 were evaluated as follows. Table 9 shows evaluation results.

Current Efficiency L/J and "L/J/CIEy" Value

Voltage was applied to the organic EL device such that a current density became 10 mA/cm$^2$, where spectral radiance spectrum was measured by a spectroradiometer CS-1000 (manufactured by Konica Minolta, Inc.). Chromaticities CIEx, CIEy, and a current efficiency (unit: cd/A) were calculated from the obtained spectral radiance spectrum.

A value of "L/J/CIEy" was calculated by dividing a value of the current efficiency L/J by a value of CIEy. In this evaluation, the value of "L/J/CIEy" was used as an index of luminous efficiency.

Maximum Peak Wavelength λp of Light Emitted from Device When Being Driven

Voltage was applied to the organic EL device so that a current density of the organic EL device was 10 mA/cm$^2$, where spectral radiance spectrum was measured by a spectroradiometer CS-2000 (produced by Konica Minolta, Inc.). A maximum peak wavelength λp (unit: nm) was calculated from the obtained spectral radiance spectrum.

|λ1−λ2| and |FWHM1−FWHM2|

The first film and the second film were prepared by the above-described method, and measurement was performed for the maximum peak wavelength λ1 and the full width at half maximum FWHM1 of the photoluminescence spectrum of the first film (having the same arrangement as that of the first emitting layer) and the maximum peak wavelength λ2 and the full width at half maximum FWHM2 of the photoluminescence spectrum of the second film (having the same arrangement as that of the second emitting layer).

|λ1−λ2| (unit: nm) and |FWHM1−FWHM2| (unit: nm) were calculated from the obtained values.

FIG. 6 shows photoluminescence spectra of a film (first film) formed from the compounds BH1-5 and BD-2, a film (first film) formed from the compounds BH1-15 and BD-2, a film (first film) formed from the compounds BH1-1 and BD-2, a film formed from the compounds BH1-8 and BD-2, a film (second film) formed from the compounds BH2-7 and BD-2, and a film (second film) formed from the compounds BH2-12 and BD-2, those of the films having the same arrangements as those of the emitting layers used in the respective examples.

TABLE 9

| | First emitting layer | | | | Second emitting layer | | | | | | | | |
|---|---|---|---|---|---|---|---|---|---|---|---|---|---|
| | First host material | | | First | Second host material | | | Second | | | | Overlap | |
| | Name | $S_1$ [ev] | $T_1$ [ev] | emitting material | Name | $S_1$ [ev] | $T_1$ [ev] | emitting material | Δλ (nm) | ΔFWHM (nm) | L/J/CIEy | integral (%) | λp |
| Ex. 2 | BH1-5 | 3.32 | 2.10 | BD-2 | BH2-7 | 3.01 | 1.87 | BD-2 | 2 | 1 | 200 | 99.6 | 460 |
| Comp. 2 | BH1-8 | 3.09 | 2.10 | BD-2 | BH2-7 | 3.01 | 1.87 | BD-2 | 2 | 4 | 187 | 94.9 | 460 |

The luminous efficiency of Example 2 in which all the relationships of Numeral Formulae 1, 20, and 30 were satisfied was better than that of Comparative 2 in which the relationship of Numerical Formula 30 was not satisfied.

Further, the organic EL device in Example 2 includes the first and second emitting layers that satisfy the relationship of Numerical Formula 1 and have an overlap integral of 99.0% or more.

As shown in FIG. 6, the overlap integral of the first film having the same arrangement as that of the first emitting layer in Example 2 (film formed from the compounds BH1-5 and BD-2) and the second film having the same arrangement as that of the second emitting layer in Example 2 (film formed from the compounds BH2-7 and BD-2) was 99.6%. The overlap integral of the film having the same arrangement as that of the first emitting layer in Comparative 2 (film formed from the compounds BH1-8 and BD-2) and the film having the same arrangement as that of the second emitting layer in Comparative 2 (film formed from the compounds BH2-7 and BD-2) was 94.9%.

Production 2 of Top Emission Type Organic EL Device

Example 3 and Comparative 3

The organic EL devices in Example 3 and Comparative 3 were each produced in the same manner as in Example 2 except that the compound BH1-5 in the first emitting layer in Example 2 was replaced by a compound shown in Table 10, the compound BH2-7 in the second emitting layer in Example 2 was replaced by a compound shown in Table 10, and the compound ET1 in the second electron transporting layer in Example 2 was replaced by a compound ET2.

Evaluation of Organic EL Devices

The organic EL devices produced in Example 3 and Comparative 3 were evaluated in the same manner as in Example 1. Table 10 shows evaluation results.

TABLE 10

| | First emitting layer | | | | Second emitting layer | | | | | | | | |
|---|---|---|---|---|---|---|---|---|---|---|---|---|---|
| | First host material | | | First emitting material | Second host material | | | Second emitting material | Δλ (nm) | ΔFWHM (nm) | L/J/CIEy | Overlap integral (%) | λp |
| | Name | $S_1$ [ev] | $T_1$ [ev] | | Name | $S_1$ [ev] | $T_1$ [ev] | | | | | | |
| Ex. 3 | BH1-15 | 3.31 | 2.10 | BD-2 | BH2-12 | 3.01 | 1.87 | BD-2 | 2 | 1 | 189 | 99.3 | 461 |
| Comp. 3 | BH1-8 | 3.09 | 2.10 | BD-2 | BH2-12 | 3.01 | 1.87 | BD-2 | 2 | 4 | 177 | 94.9 | 461 |

The luminous efficiency of Example 3 in which all the relationships of Numeral Formulae 1, 20, and 30 were satisfied was better than that of Comparative 3 in which the relationship of Numerical Formula 30 was not satisfied.

Further, the organic EL device in Example 3 includes the first and second emitting layers that satisfy the relationship of Numerical Formula 1 and have an overlap integral of 99.0% or more.

As shown in FIG. 6, the overlap integral of the first film having the same arrangement as that of the first emitting layer in Example 3 (film formed from the compounds BH1-15 and BD-2) and the second film having the same arrangement as that of the second emitting layer in Example 3 (film formed from the compounds BH2-12 and BD-2) was 99.3%. The overlap integral of the film having the same arrangement as that of the first emitting layer in Comparative 3 (film formed from the compounds BH1-8 and BD-2) and the film having the same arrangement as that of the second emitting layer in Comparative 3 (film formed from the compounds BH2-12 and BD-2) was 94.9%.

Production 3 of Top Emission Type Organic EL Device

Example 4 and Comparative 4

The organic EL devices in Example 4 and Comparative 4 were each produced in the same manner as in Example 2 except that the compound BH1-5 in the first emitting layer in Example 2 was replaced by a compound shown in Table 11.

Evaluation of Organic EL Devices

The organic EL devices produced in Example 4 and Comparative 4 were evaluated in the same manner as in Example 2. Table 11 shows evaluation results.

TABLE 11

| | First emitting layer | | | | Second emitting layer | | | | | | | | |
|---|---|---|---|---|---|---|---|---|---|---|---|---|---|
| | First host material | | | First emitting material | Second host material | | | Second emitting material | Δλ (nm) | ΔFWHM (nm) | L/J/CIEy | Overlap integral (%) | λp |
| | Name | $S_1$ [ev] | $T_1$ [ev] | | Name | $S_1$ [ev] | $T_1$ [ev] | | | | | | |
| Ex. 4 | BH1-1 | 3.12 | 2.10 | BD-2 | BH2-7 | 3.01 | 1.87 | BD-2 | 2 | 2 | 176 | 99.0 | 461 |
| Comp. 4 | BH1-8 | 3.09 | 2.10 | BD-2 | BH2-7 | 3.01 | 1.87 | BD-2 | 2 | 4 | 171 | 94.9 | 461 |

The luminous efficiency of Example 4 in which all the relationships of Numeral Formulae 1, 20, and 30 were satisfied was better than that of Comparative 4 in which the relationship of Numerical Formula 30 was not satisfied.

Further, the organic EL device in Example 4 includes the first and second emitting layers that satisfy the relationship of Numerical Formula 1 and have an overlap integral of 99.0% or more.

As shown in FIG. 6, the overlap integral of the first film having the same arrangement as that of the first emitting layer in Example 4 (film formed from the compounds BH1-1 and BD-2) and the second film having the same arrangement as that of the second emitting layer in Example 4 (film formed from the compounds BH2-7 and BD-2) was 99.0%. The overlap integral of the film having the same arrangement as that of the first emitting layer in Comparative 4 (film formed from the compounds BH1-8 and BD-2) and the film having the same arrangement as that of the second emitting layer in Comparative 4 (film formed from the compounds BH2-7 and BD-2) was 94.9%.

Structures of compounds used for producing organic EL devices in Examples to 10 and Comparatives 5 to 10 are shown below.

[Formula 235]

BH1-16

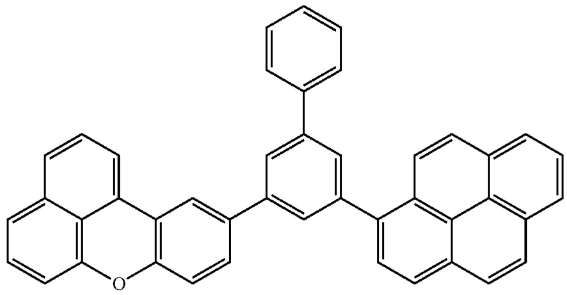

BH1-17

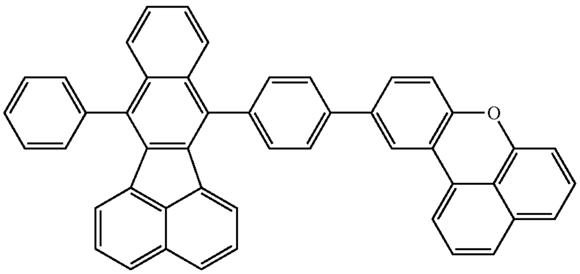

BH1-18

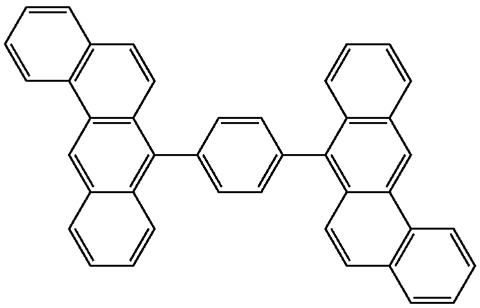

-continued

BH1-19

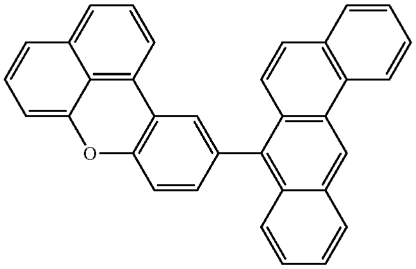

BH1-20

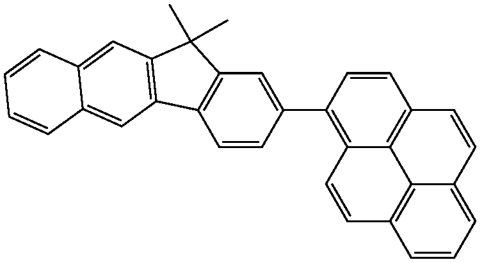

BH1-21

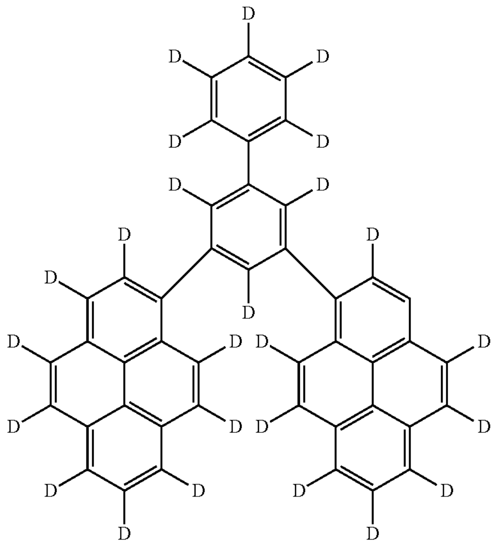

BH1-22

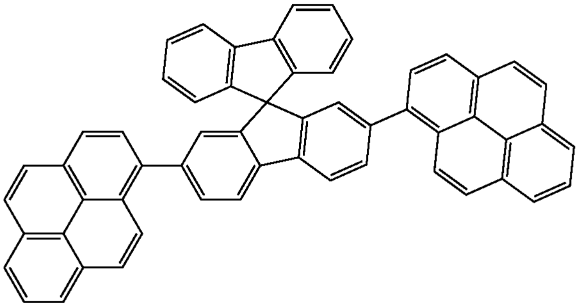

-continued
[Formula 236]
BH2-4
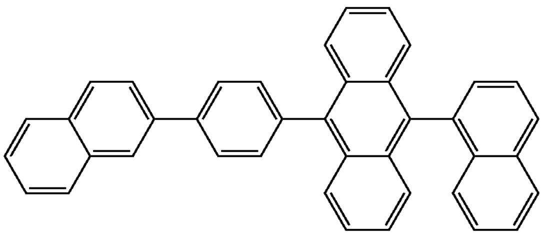
BH2-13
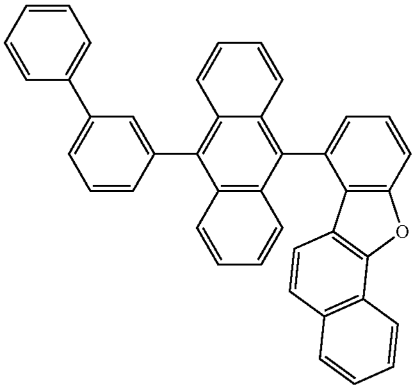
[Formula 237]
BD-2
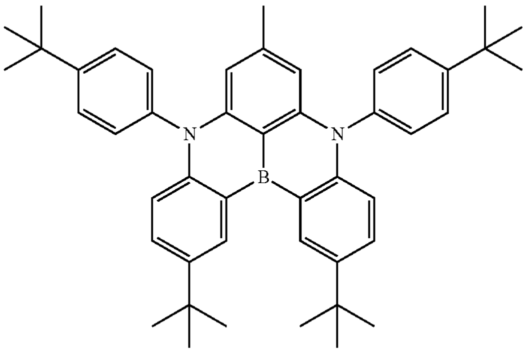
BD-1
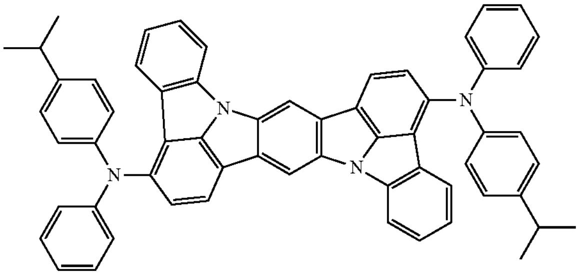
-continued
[Formula 238]
HA1
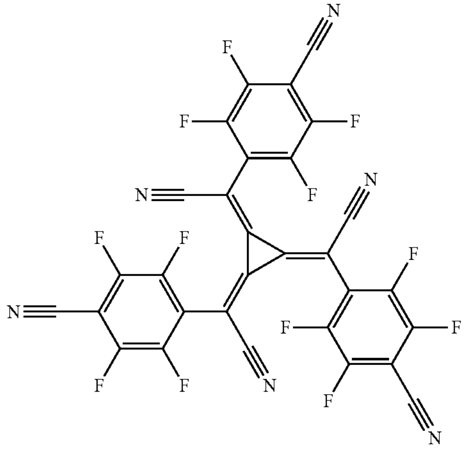
HT2
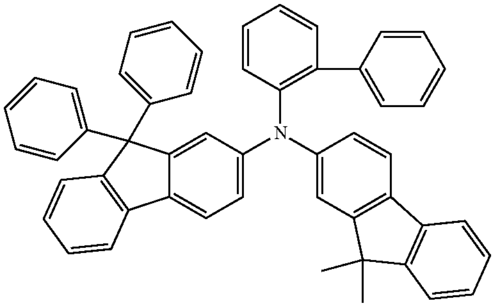
[Formula 239]
HT10
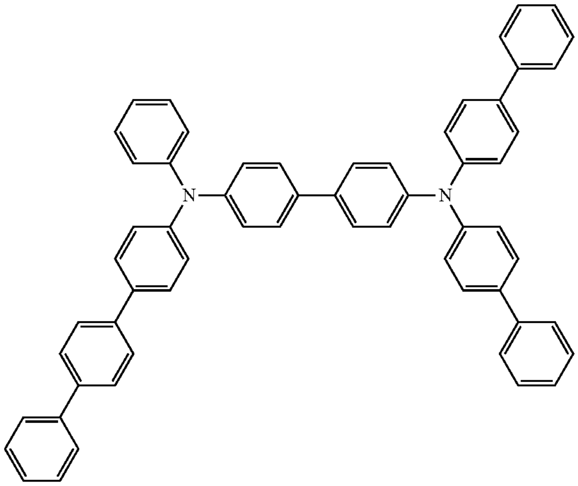

-continued
HT20
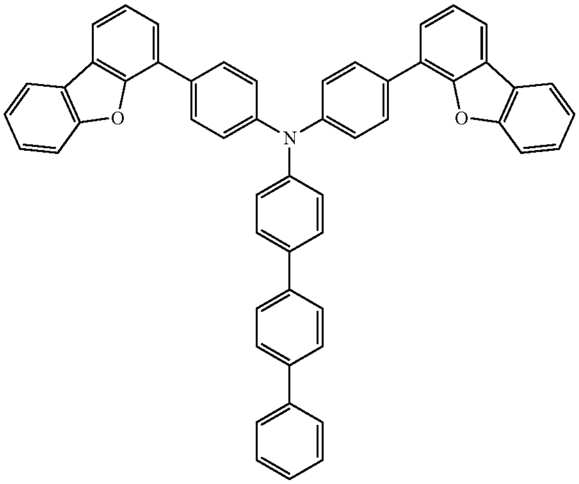
[Formula 240]
EB2
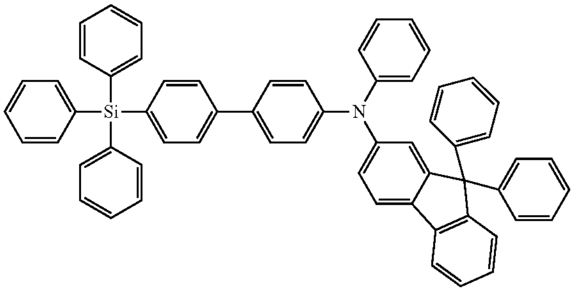
[Formula 241]
ET10
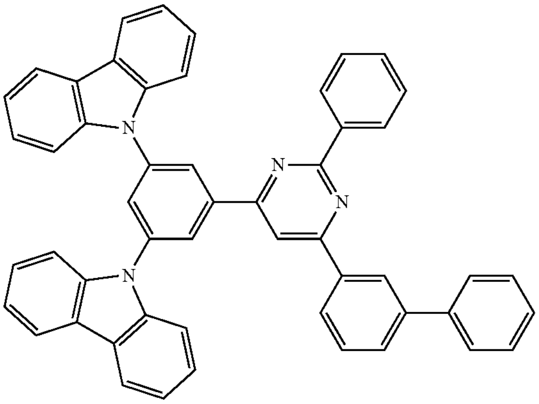
ET20
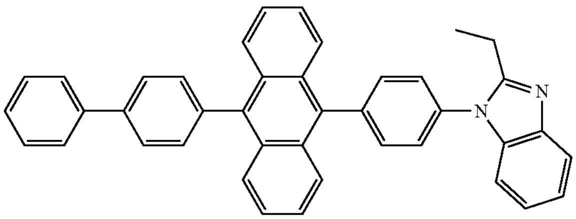
-continued
[Formula 242]
HB1
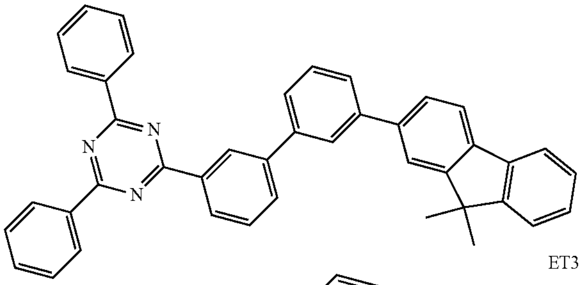
ET3
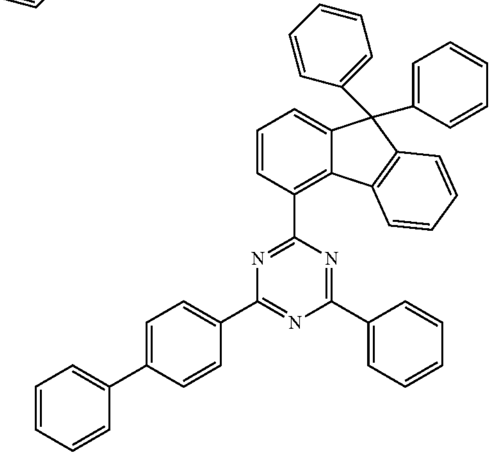
[Formula 243]
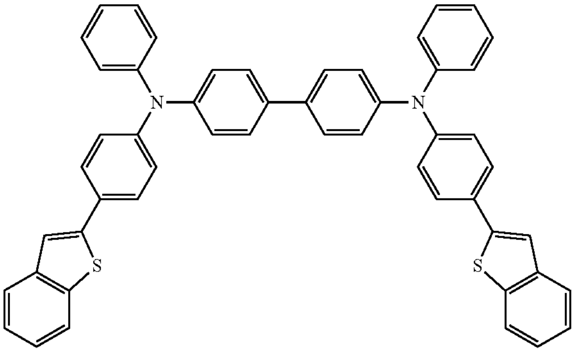
Cap
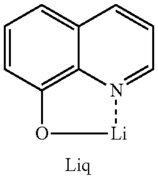
Liq
Production 4 of Top Emission Type Organic EL Device
Organic EL Devices were Produced and Evaluated as Follows
Example 5
On a glass substrate, an APC (Ag—Pd—Cu) layer (light reflection layer) having a film thickness of 100 nm, which was a silver alloy layer, and an indium zinc oxide (IZO)

layer (conductive layer) having a thickness of 10 nm were formed in this order by sputtering.

Subsequently, with a normal lithography technique, this conductive material layer including the light reflection layer and the conductive layer was patterned by etching using a resist pattern as a mask to form an anode provided with the light reflection layer. The substrate formed with the lower electrode (anode) was ultrasonic-cleaned in isopropyl alcohol for five minutes, and then UV-ozone-cleaned for 30 minutes.

Next, the compound HT10 and the compound HA1 were co-deposited by vacuum deposition to form a hole injecting layer having a film thickness of 10 nm. The concentrations of the compound HT10 and the compound HA1 in the hole injecting layer were 97 mass % and 3 mass %, respectively.

Next, the compound HT10 was vapor-deposited on the hole injecting layer to form a 112-nm-thick first hole transporting layer (HT).

Next, the compound HT20 was vapor-deposited on the first hole transporting layer to form a 5-nm-thick second hole transporting layer (also referred to as an electron blocking layer) (EBL).

A compound BH1-16 (first host material (BH1)) and a compound BD-1 (first emitting material (BD1)) were co-deposited on the second hole transporting layer such that the ratio of the compound BD-1 accounted for 2 mass %, thereby forming a first emitting layer.

The compound BH2-4 (second host material (BH2)) and the compound BD-1 (second emitting material (BD2)) were co-deposited on the first emitting layer such that the ratio of the compound BD-1 accounted for 2 mass %, thereby forming a 15-nm-thick second emitting layer.

The compound ET10 was vapor-deposited on the second emitting layer to form a 5-nm-thick first electron transporting layer (also referred to as a hole blocking layer) (HBL).

The compound ET20 and the compound Liq were co-deposited on the first electron transporting layer (HBL) to form a 25-nm-thick second electron transporting layer (ET). The ratios of the compound ET20 and the compound Liq in the second electron transporting layer (ET) were both 50 mass %.

Yb (ytterbium) was vapor-deposited on the second electron transporting layer to form a 1-nm-thick electron injecting layer.

Mg and Ag were vapor-deposited on the electron injecting layer to form a 13-nm-thick cathode formed of a semi-transmissive MgAg alloy. The concentrations of Mg and Ag in the cathode were 10 mass % and 90 mass %, respectively. Cap was used to form a film on the cathode by vacuum deposition to form a 65-nm capping layer.

A device arrangement of the organic EL device in Example 5 is roughly shown as follows.

APC(100)/IZO(10)/HT10:HA1(10.97%:3%)/HT10(112)/HT20(5)/BH1-16:BD-1(5.98%:2%)/BH2-4:BD-1(15.98%:2%)/ET10(5)/ET20:Liq(25.50V0:50%)/Yb(1)/Mg:Ag(13.10%:90%)/Cap(65)

Numerals in parentheses represent a film thickness (unit: nm).

The numerals (97%:3%) represented by percentage in the same parentheses indicate a ratio (mass %) between the compound HT10 and the compound HA1 in the hole injecting layer. The numerals (98%:2%) represented by percentage in the same parentheses indicate a ratio (mass %) between the host material (BH1 or BH2) and the emitting material (BD1 or BD2) in the first emitting layer or the second emitting layer. The numerals (50%:50%) represented by percentage in the same parentheses indicate a ratio (mass %) between the compound ET20 and the compound Liq in the second electron transporting layer (ET).

Examples 6 to 7 and Comparatives 5 to 7

The organic EL devices in Examples 6 to 7 and Comparatives 5 to 7 were each produced in the same manner as in Example 5 except that the compound BH1-16 in the first emitting layer in Example 5 was replaced by a compound shown in Table 12.

Evaluation of Organic EL Devices

The organic EL devices produced in Examples 5 to 7 and Comparatives 5 to 7 were evaluated in the same manner as in Example 2. Table 12 shows evaluation results.

TABLE 12

| | First emitting layer | | | | Second emitting layer | | | | | | | | |
|---|---|---|---|---|---|---|---|---|---|---|---|---|---|
| | First host material | | | First emitting material | Second host material | | | Second emitting material | Δλ (nm) | ΔFWHM (nm) | L/J/CIEy | Overlap integral (%) | λp |
| | Name | $S_1$ [ev] | $T_1$ [ev] | | Name | $S_1$ [ev] | $T_1$ [ev] | | | | | | |
| Ex. 5 | BH1-16 | 3.08 | 2.09 | BD-1 | BH2-4 | 3.01 | 1.85 | BD-1 | 1 | 2 | 198 | 99.7 | 461 |
| Comp. 5 | BH1-22 | 3.09 | 2.08 | BD-1 | BH2-4 | 3.01 | 1.85 | BD-1 | 2 | 5 | 184 | 97.3 | 461 |
| Ex. 6 | BH1-17 | 2.94 | 2.20 | BD-1 | BH2-4 | 3.01 | 1.85 | BD-1 | 0 | 2 | 197 | 99.8 | 461 |
| Comp. 6 | BH1-22 | 3.09 | 2.08 | BD-1 | BH2-4 | 3.01 | 1.85 | BD-1 | 2 | 5 | 184 | 97.3 | 461 |
| Ex. 7 | BH1-18 | 3.11 | 2.08 | BD-1 | BH2-4 | 3.01 | 1.85 | BD-1 | 0 | 2 | 210 | 99.8 | 461 |
| Comp. 7 | BH1-22 | 3.09 | 2.08 | BD-1 | BH2-4 | 3.01 | 1.85 | BD-1 | 2 | 5 | 184 | 97.3 | 461 |

The luminous efficiency of Example 5 in which all the relationships of Numeral Formulae 1, 20, and 30 were satisfied was better than that of Comparative 5 in which the relationship of Numerical Formula 30 was not satisfied.

Similarly, the luminous efficiency of Example 6 was better than that of Comparative 6. The luminous efficiency of Example 7 was better than that of Comparative 7.

Further, the organic EL devices in Examples 5 to 7 each include the first and second emitting layers that satisfy the relationship of Numerical Formula 1 and have an overlap integral of 99.0% or more.

Production 5 of Top Emission Type Organic EL Device

Organic EL devices were produced and evaluated as follows.

Example 8

On a glass substrate, an APC (Ag—Pd—Cu) layer (light reflection layer) having a film thickness of 100 nm, which was a silver alloy layer, and an indium zinc oxide (IZO) layer (conductive layer) having a thickness of 10 nm were formed in this order by sputtering.

Subsequently, with a normal lithography technique, this conductive material layer including the light reflection layer and the conductive layer was patterned by etching using a resist pattern as a mask to form an anode provided with the light reflection layer. The substrate formed with the lower electrode (anode) was ultrasonic-cleaned in isopropyl alcohol for five minutes, and then UV-ozone-cleaned for 30 minutes.

Next, a compound HT2 and the compound HA1 were co-deposited by vacuum deposition to form a hole injecting layer having a film thickness of 10 nm. The concentrations of the compound HT2 and the compound HA1 in the hole injecting layer were 90 mass % and 10 mass %, respectively.

Next, the compound HT2 was vapor-deposited on the hole injecting layer to form a 122-nm-thick first hole transporting layer (HT).

A compound EB2 was vapor-deposited on the first hole transporting layer to form a 5-nm-thick second hole transporting layer (also referred to as an electron blocking layer) (EBL).

A compound BH1-19 (first host material (BH1)) and the compound BD-2 (first emitting material (BD1)) were co-deposited on the second hole transporting layer such that the ratio of the compound BH1-19 accounted for 2 mass %, thereby forming a 10-nm-thick first emitting layer.

A compound BH2-13 (second host material (BH2)) and the compound BD-2 (second emitting material (BD2)) were co-deposited on the first emitting layer such that the ratio of the compound BD-2 accounted for 2 mass %, thereby forming a 10-nm-thick second emitting layer.

A device arrangement of the organic EL device in Example 8 is roughly shown as follows.

APC(100)/IZO(10)/HT2:HA1(10.90%:10%)/HT2(112)/EB2(5)/BH1-19:BD-2(10.98%:2%)/BH2-13:BD-2(10.98%:2%)/HB1(5)/ET3:Liq(25.50%:50%)/Yb(1)/Mg:Ag(13.10%:90%)/Cap(65)

Numerals in parentheses represent a film thickness (unit: nm).

The numerals (90%:10%) represented by percentage in the same parentheses indicate a ratio (mass %) between the compound HT2 and the compound HA1 in the hole injecting layer. The numerals (98%:2%) represented by percentage in the same parentheses indicate a ratio (mass %) between the host material (BH1 or BH2) and the emitting material (BD1 or BD2) in the first emitting layer or the second emitting layer. The numerals (50%:50%) represented by percentage in the same parentheses indicate a ratio (mass %) between the compound ET3 and the compound Liq in the second electron transporting layer (ET).

Examples 9 to 10 and Comparatives 8 to 10

The organic EL devices in Examples 9 to 10 and Comparatives 8 to 10 were each produced in the same manner as in Example 8 except that the compound BH1-19 in the first emitting layer in Example 8 was replaced by a compound shown in Table 13.

Evaluation of Organic EL Devices

The organic EL devices produced in Examples 8 to 10 and Comparatives 8 to 10 were evaluated in the same manner as in Example 2. Table 13 shows evaluation results.

TABLE 13

| | First emitting layer | | | | Second emitting layer | | | | | | | | |
|---|---|---|---|---|---|---|---|---|---|---|---|---|---|
| | First host material | | | First emitting material | Second host material | | | Second emitting material | | | | Overlap integral | |
| | Name | $S_1$ [ev] | $T_1$ [ev] | | Name | $S_1$ [ev] | $T_1$ [ev] | | Δλ (nm) | ΔFWHM (nm) | L/J/CIEy | (%) | λp |
| Ex. 8 | BH1-19 | 3.08 | 2.07 | BD-2 | BH2-13 | 3.01 | 1.87 | BD-2 | 1 | 1 | 199 | 99.9 | 460 |
| Comp. 8 | BH1-22 | 3.09 | 2.08 | BD-2 | BH2-13 | 3.01 | 1.87 | BD-2 | 2 | 3 | 183 | 98.2 | 460 |
| Ex. 9 | BH2-20 | 3.15 | 2.10 | BD-2 | BH2-13 | 3.01 | 1.87 | BD-2 | 0 | 1 | 191 | 99.9 | 460 |
| Comp. 9 | BH1-22 | 3.09 | 2.08 | BD-2 | BH2-13 | 3.01 | 1.87 | BD-2 | 2 | 3 | 183 | 98.2 | 460 |
| Ex. 10 | BH1-21 | 3.31 | 2.10 | BD-2 | BH2-13 | 3.01 | 1.87 | BD-2 | 2 | 1 | 195 | 99.3 | 460 |
| Comp. 10 | BH1-22 | 3.09 | 2.08 | BD-2 | BH2-13 | 3.01 | 1.87 | BD-2 | 2 | 3 | 183 | 98.2 | 460 |

The compound HB1 was vapor-deposited on the second emitting layer to form a 5-nm-thick first electron transporting layer (also referred to as a hole blocking layer) (HBL).

A compound ET3 and the compound Liq were co-deposited on the first electron transporting layer (HBL) to form a 25-nm-thick second electron transporting layer (ET). The ratio of the compound ET3 and the compound Liq in the second electron transporting layer (ET) were both 50 mass %.

Yb (ytterbium) was vapor-deposited on the second electron transporting layer to form a 1-nm-thick electron injecting layer.

Mg and Ag were vapor-deposited on the electron injecting layer to form a 13-nm-thick cathode formed of a semi-transmissive MgAg alloy. The concentrations of Mg and Ag in the cathode were 10 mass % and 90 mass %, respectively. Cap was used to form a film on the cathode by vacuum deposition to form a 65-nm capping layer.

The luminous efficiency of Example 8 in which all the relationships of Numeral Formulae 1, 20, and 30 were satisfied was better than that of Comparative 8 in which the relationship of Numerical Formula 30 was not satisfied.

Similarly, the luminous efficiency of Example 9 was better than that of Comparative 9. The luminous efficiency of Example 10 was better than that of Comparative 10.

Further, the organic EL devices in Examples 8 to 10 each include the first and second emitting layers that satisfy the relationship of Numerical Formula 1 and have an overlap integral of 99.0% or more.

Structures of compounds used for producing organic EL devices in Examples 1-1 to 3-1, Reference Examples 1 to 3, Comparatives 1A to 3A, and Comparatives 1B to 3B are shown below.

[Formula 244]
BH1-1
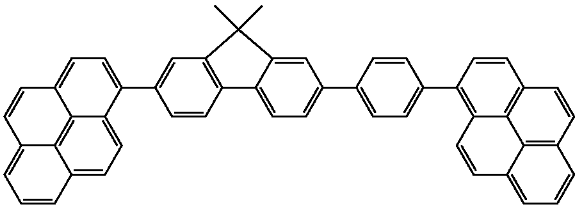
BH1-5
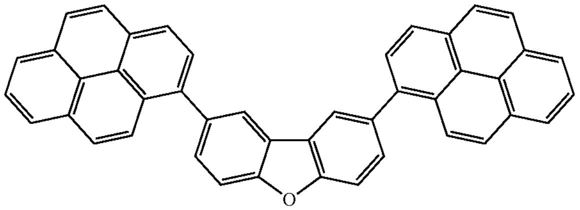
BH1-8
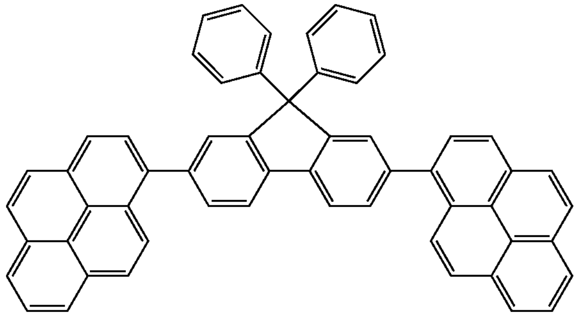
BH1-15
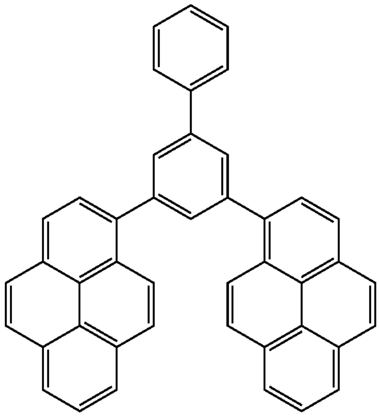
-continued
[Formula 245]
BH2-7
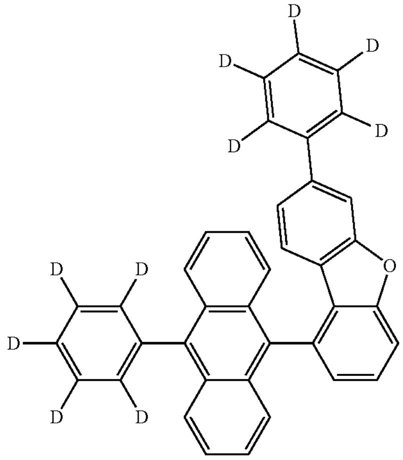
BH2-12
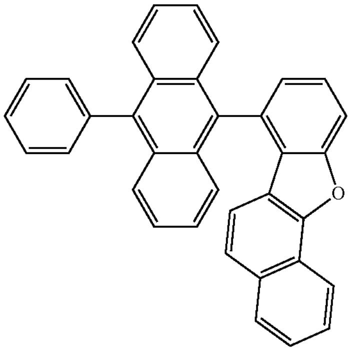
[Formula 246]
BD-2
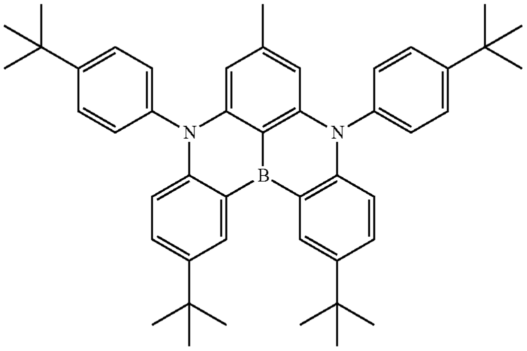

-continued
[Formula 247]
HA1
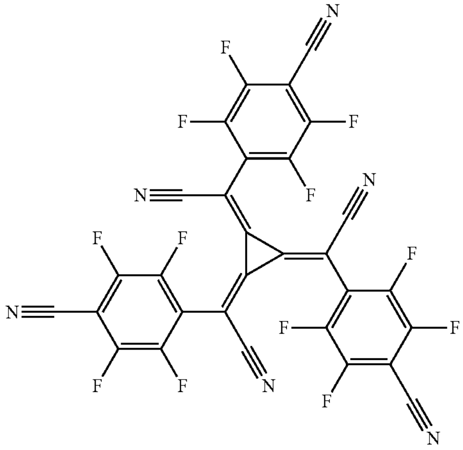
HT1
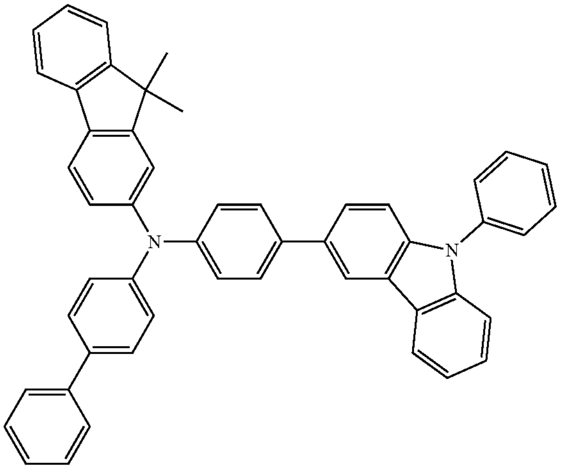
[Formula 248]
EB1
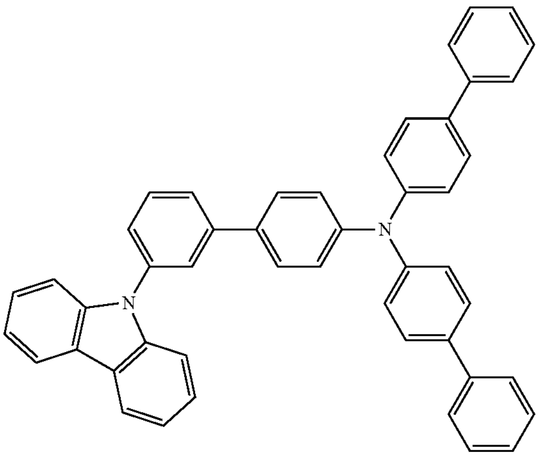
-continued
HB1
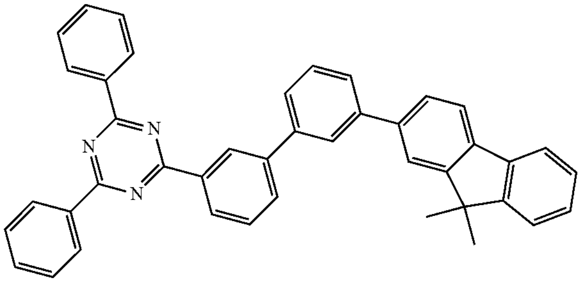
[Formula 249]
ET1
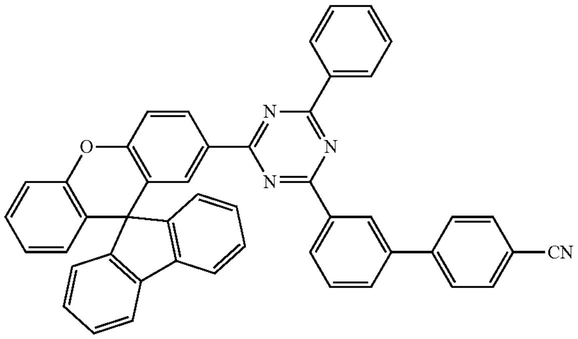
ET3
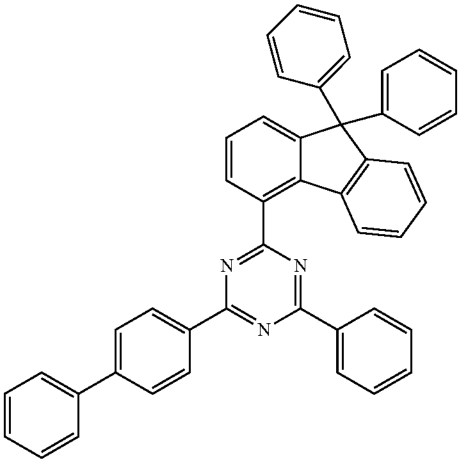
ET2
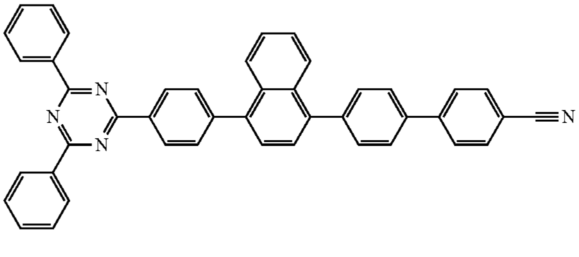

-continued

[Formula 250]

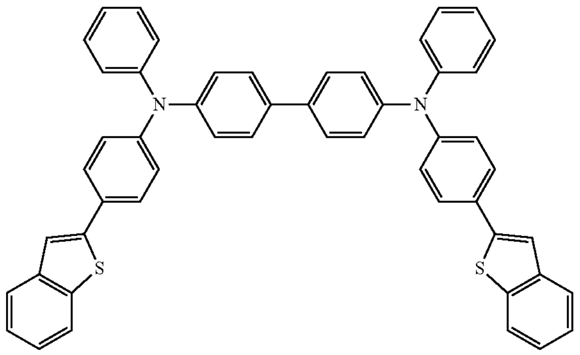

Cap

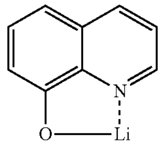

Liq

Production 1-1 of Top Emission Type Organic EL Device

Organic EL devices were produced and evaluated as follows.

Example 1-1

On a glass substrate, an APC (Ag—Pd—Cu) layer (light reflection layer) having a film thickness of 100 nm, which was a silver alloy layer, and an indium zinc oxide (IZO) layer (conductive layer) having a thickness of 10 nm were formed in this order by sputtering.

Subsequently, with a normal lithography technique, this conductive material layer including the light reflection layer and the conductive layer was patterned by etching using a resist pattern as a mask to form an anode provided with the light reflection layer. The substrate formed with the lower electrode (anode) was ultrasonic-cleaned in isopropyl alcohol for five minutes, and then UV-ozone-cleaned for 30 minutes.

Next, the compound HT1 and the compound HA1 were co-deposited by vacuum deposition to form a hole injecting layer having a film thickness of 10 nm. The concentrations of the compound HT1 and the compound HA1 in the hole injecting layer were 97 mass % and 3 mass %, respectively.

Next, the compound HT1 was vapor-deposited on the hole injecting layer to form a 114-nm-thick first hole transporting layer (HT).

The compound EB1 was vapor-deposited on the first hole transporting layer to form a 5-nm-thick second hole transporting layer (also referred to as an electron blocking layer) (EBL).

The compound BH1-5 (first host material (BH1)) and the compound BD-2 (first emitting material (BD1)) were co-deposited on the second hole transporting layer such that the ratio of the compound BD-2 accounted for 1 mass %, thereby forming a 5-nm-thick first emitting layer.

The compound BH2-7 (second host material (BH2)) and the compound BD-2 (second emitting material (BD2)) were co-deposited on the first emitting layer such that the ratio of the compound BD-2 accounted for 1 mass %, thereby forming a 15-nm-thick second emitting layer.

The compound HB1 was vapor-deposited on the second emitting layer to form a 5-nm-thick first electron transporting layer (also referred to as a hole blocking layer) (HBL).

The compound ET1 and the compound Liq were co-deposited on the first electron transporting layer (HBL) to form a 25-nm-thick second electron transporting layer (ET). The ratios of the compound ET1 and the compound Liq in the second electron transporting layer (ET) were both 50 mass %. Liq is an abbreviation of (8-quinolinolato)lithium ((8-Quinolinolato)lithium).

Yb (ytterbium) was vapor-deposited on the second electron transporting layer to form a 1-nm-thick electron injecting layer.

Mg and Ag were vapor-deposited on the electron injecting layer to form a 12-nm-thick cathode formed of a semi-transmissive MgAg alloy. The concentrations of Mg and Ag in the cathode were 10 mass % and 90 mass %, respectively. Cap was used to form a film on the cathode by vacuum deposition to form a 65-nm capping layer.

A device arrangement of the organic EL device in Example 1-1 is roughly shown as follows.

APC(100)/IZO(10)/HT1:HA1(10.97/0:3%)/HT1(114)/EB1(5)/BH1-5:BD-2(5.99%: 1%)/BH2-7:BD-2 (15.99%:1%)/HB1(5)/ET1:Liq(25.50%50%)/Yb(1)/Mg:Ag(12.10%:90%)/Cap(65)

Numerals in parentheses represent a film thickness (unit: nm).

The numerals (97%:3%) represented by percentage in the same parentheses indicate a ratio (mass %) between the compound HT1 and the compound HA1 in the hole injecting layer. The numerals (99%:1%) represented by percentage in the same parentheses indicate a ratio (mass %) between the host material (BH1 or BH2) and the emitting material (BD1 or BD2) in the first emitting layer or the second emitting layer. The numerals (50%:50%) represented by percentage in the same parentheses indicate a ratio (mass %) between the compound ET1 and the compound Liq in the second electron transporting layer (ET).

Comparative 1A

The organic EL device in Comparative 1A was produced in the same manner as in Example 1-1 except that the compound BH1-5 in the first emitting layer in Example 1-1 was replaced by a compound shown in Table 14.

Production 1-1 of Bottom Emission Type Organic EL Device Organic EL devices were produced and evaluated as follows.

Reference Example 1

A glass substrate (size: 25 mm×75 mm×1.1 mm thick, produced by Geomatec Co., Ltd.) having an ITO (Indium Tin Oxide) transparent electrode (anode) was ultrasonic-cleaned in isopropyl alcohol for five minutes, and then UV-ozone-cleaned for 30 minutes. A film thickness of the ITO transparent electrode was 130 nm.

After the glass substrate having the transparent electrode line was cleaned, the glass substrate was mounted on a substrate holder of a vacuum evaporation apparatus. First, the compound HT1 and the compound HA1 were co-deposited on a surface of the glass substrate, where the transparent electrode line was provided, to cover the transparent electrode, thereby forming a 10-nm-thick hole injecting layer (HI). The ratios of the compound HT1 and the compound HA1 in the hole injecting layer were 97 mass % and 3 mass %, respectively.

Next, the compound HT1 was vapor-deposited on the hole injecting layer to form an 85-nm-thick first hole transporting layer (HT).

The compound EB1 was vapor-deposited on the first hole transporting layer to form a 5-nm-thick second hole transporting layer (also referred to as an electron blocking layer) (EBL).

The compound BH1-5 (first host material (BH1)) and the compound BD-2 (first emitting material (BD1)) were co-deposited on the second hole transporting layer such that the ratio of the compound BD-2 accounted for 1 mass %, thereby forming a 5-nm-thick first emitting layer.

The compound BH2-7 (second host material (BH2)) and the compound BD-2 (second emitting material (BD2)) were co-deposited on the first emitting layer such that the ratio of the compound BD-2 accounted for 1 mass %, thereby forming a 15-nm-thick second emitting layer.

The compound HB1 was vapor-deposited on the second emitting layer to form a 5-nm-thick first electron transporting layer (also referred to as a hole blocking layer) (HBL).

The compound ET1 and the compound Liq were co-deposited on the first electron transporting layer (HBL) to form a 25-nm-thick second electron transporting layer (ET). The ratios of the compound ET1 and the compound Liq in the second electron transporting layer (ET) were both 50 mass %.

Liq was vapor-deposited on the second electron transporting layer to form a 1-nm-thick electron injecting layer.

Metal (Al) was vapor-deposited on the electron injecting layer to form an 80-nm-thick cathode.

A device arrangement of the organic EL device of Reference Example 1 is roughly shown as follows.

ITO (130)/HT1:HA1 (10.97/0:3%)/HT1(85)/EB1(5)/BH1-5:BD-2 (5.99%:1%)/BH2-7:BD-2 (15.99%: 1%)/HB1(5)/ET1:Lig (25.50%:50%)/Lig (1)/A1(80)

Numerals in parentheses represent a film thickness (unit: nm).

Comparative 1B

The organic EL device in Comparative 1B was produced in the same manner as in Reference Example 1 except that the compound BH1-5 in the first emitting layer in Reference Example 1 was replaced by a compound shown in Table 14.

Evaluation of Organic EL Devices

The organic EL devices produced in Example 1-1, Reference Example 1, and Comparatives 1A and 1B were evaluated as follows. Table 14 shows evaluation results.

Current Efficiency L/J and "L/J/CIEy" Value

Voltage was applied to the organic EL devices in Example 1-1 and Comparative 1A so that a current density of the organic EL device was 10 mA/cm$^2$, where spectral radiance spectrum was measured by a spectroradiometer CS-1000 (produced by Konica Minolta, Inc.). Chromaticities CIEx, CIEy, and a current efficiency (unit: cd/A) were calculated from the obtained spectral radiance spectrum.

A value of "L/J/CIEy" was calculated by dividing a value of the current efficiency L/J by a value of CIEy. In this evaluation, the value of "L/J/CIEy" was used as an index of luminous efficiency.

External Quantum Efficiency EQE

Voltage was applied to the organic EL devices in Reference Example 1 and Comparative 1B so that a current density of the organic EL device was 10 mA/cm$^2$, where spectral radiance spectrum was measured by a spectroradiometer CS-2000 (produced by Konica Minolta, Inc.). The external quantum efficiency EQE (unit: %) was calculated based on the obtained spectral-radiance spectra, assuming that the spectra was provided under a Lambertian radiation.

Maximum Peak Wavelength λp of Light Emitted from Device When Being Driven

Voltage was applied to the organic EL device so that a current density of the organic EL device was 10 mA/cm$^2$, where spectral radiance spectrum was measured by a spectroradiometer CS-2000 (produced by Konica Minolta, Inc.). A maximum peak wavelength λp (unit: nm) was calculated from the obtained spectral radiance spectrum.

|λ1−λ2| and |FWHM1−FWHM2|

The first film and the second film were prepared by the above-described method, and measurement was performed for the maximum peak wavelength λ1 and the full width at half maximum FWHM1 of the photoluminescence spectrum of the first film (having the same arrangement as that of the first emitting layer) and the maximum peak wavelength λ2 and the full width at half maximum FWHM2 of the photoluminescence spectrum of the second film (having the same arrangement as that of the second emitting layer).

|λ1−λ2| (unit: nm) and |FWHM1−FWHM2| (unit: nm) were calculated from the obtained values.

FIG. 6 shows photoluminescence spectra of a film (first film) formed from the compounds BH1-5 and BD-2, a film (first film) formed from the compounds BH1-15 and BD-2, a film (first film) formed from the compounds BH1-1 and BD-2, a film formed from the compounds BH1-8 and BD-2, a film (second film) formed from the compounds BH2-7 and BD-2, and a film (second film) formed from the compounds BH2-12 and BD-2, those of the films having the same arrangements as those of the emitting layers used in the respective examples.

TABLE 14

| | First emitting layer | | | | Second emitting layer | | | | | | BE | | | |
|---|---|---|---|---|---|---|---|---|---|---|---|---|---|---|
| | First host material | | | First | Second host material | | | Second | | | efficiency | TE | Overlap | |
| | Name | $S_1$ [ev] | $T_1$ ev] | emitting material | Name | $S_1$ [ev] | $T_1$ [ev] | emitting material | Δλ (nm) | ΔFWHM (nm) | EQE (%) | efficiency L/J/CIEy | integral (%) | λp |
| Ex. 1-1 | BH1-5 | 3.32 | 2.10 | BD-2 | BH2-7 | 3.01 | 1.87 | BD-2 | 2 | 1 | — | 200 | 99.6 | 460 |
| Reference Ex. 1 | BH1-5 | 3.32 | 2.10 | BD-2 | BH2-7 | 3.01 | 1.87 | BD-2 | 2 | 1 | 10.5 | — | 99.6 | 460 |
| Comp. 1A | BH1-8 | 3.09 | 2.10 | BD-2 | BH2-7 | 3.01 | 1.87 | BD-2 | 2 | 4 | — | 187 | 94.9 | 460 |
| Comp. 1B | BH1-8 | 3.09 | 2.10 | BD-2 | BH2-7 | 3.01 | 1.87 | BD-2 | 2 | 4 | 10.4 | — | 94.9 | 460 |

Details of Table 14

Δλ represents |λ1−λ2|.

ΔFWHM represents |FWHM1−FWHM2|.

TE represents a top emission type device.

BE represents a bottom emission type device.

The same applies to Tables 15 and 16.

When comparing Example 1-1 with Comparative 1A that were the top emission type devices, the luminous efficiency of Example 1-1 in which all the relationships of Numeral Formulae 1, 20, and 30 were satisfied was better than that of Comparative 1A in which the relationship of Numerical Formula 30 was not satisfied.

When comparing Reference Example 1 with Comparative 1B that were the bottom emission type devices, although Reference Example 1 satisfied all the relationships of Numeral Formulae 1, 20, and 30, the luminous efficiency thereof was equivalent to that of Comparative 1B in which the relationship of Numerical Formula 30 was not satisfied.

Further, the top emission type organic EL device in Example 1-1 include the first and second emitting layers that satisfy the relationship of Numerical Formula 1 and have an overlap integral of 99.0% or more.

As shown in FIG. 6, the overlap integral of the first film having the same arrangement as that of the first emitting layer in Example 1-1 (film formed from the compounds BH1-5 and BD-2) and the second film having the same arrangement as that of the second emitting layer in Example 1-1 (film formed from the compounds BH2-7 and BD-2) was 99.6%. The overlap integral of the film having the same arrangement as that of the first emitting layer in Comparative 1A (film formed from the compounds BH1-8 and BD-2) and the film having the same arrangement as that of the second emitting layer in Comparative 1A (film formed from the compounds BH2-7 and BD-2) was 94.9%.

Production 2-1 of Top Emission Type Organic EL Device

Example 2-1 and Comparative 2A

The organic EL devices in Example 2-1 and Comparative 2A were each produced in the same manner as in Example 1-1 except that the compound BH1-5 in the first emitting layer in Example 1-1 was replaced by a compound shown in Table the compound BH2-7 in the second emitting layer in Example 1-1 was replaced by a compound shown in Table 15, and the compound ET1 in the second electron transporting layer in Example 1-1 was replaced by a compound ET2.

Production 2-1 of Bottom Emission Type Organic EL Device

Reference Example 2 and Comparative 2B

The organic EL devices in Reference Example 2 and Comparative 2B were each produced in the same manner as in Reference Example 1 except that the compound BH1-5 in the first emitting layer in Reference Example 1 was replaced by a compound shown in Table 15, the compound BH2-7 in the second emitting layer in Reference Example 1 was replaced by a compound shown in Table 15, and the compound ET1 in the second electron transporting layer in Reference Example 1 was replaced by the compound ET2.

Evaluation of Organic EL Devices

The organic EL devices produced in Example 2-1, Reference Example 2, and Comparatives 2A and 2B were evaluated as in Example 1-1 and Reference Example 1. Table 15 shows evaluation results.

TABLE 15

| | First emitting layer | | | | Second emitting layer | | | | | | BE | | | |
|---|---|---|---|---|---|---|---|---|---|---|---|---|---|---|
| | First host material | | | First | Second host material | | | Second | | | efficiency | TE | Overlap | |
| | Name | $S_1$ [ev] | $T_1$ [ev] | emitting material | Name | $S_1$ [ev] | $T_1$ [ev] | emitting material | Δλ (nm) | ΔFWHM (nm) | EQE (%) | efficiency L/J/CIEy | integral (%) | λp |
| Ex. 2-1 | BH1-15 | 3.31 | 2.10 | BD-2 | BH2-12 | 3.01 | 1.87 | BD-2 | 2 | 1 | — | 189 | 99.3 | 461 |
| Reference Ex. 2 | BH1-15 | 3.31 | 2.10 | BD-2 | BH2-12 | 3.01 | 1.87 | BD-2 | 2 | 1 | 10.0 | — | 99.3 | 461 |
| Comp. 2A | BH1-8 | 3.09 | 2.10 | BD-2 | BH2-12 | 3.01 | 1.87 | BD-2 | 2 | 4 | — | 177 | 94.9 | 461 |
| Comp. 2B | BH1-8 | 3.09 | 2.10 | BD-2 | BH2-12 | 3.01 | 1.87 | BD-2 | 2 | 4 | 9.9 | — | 94.9 | 461 |

When comparing Example 2-1 with Comparative 2A that were the top emission type devices, the luminous efficiency of Example 2-1 in which all the relationships of Numeral Formulae 1, 20, and 30 were satisfied was better than that of Comparative 2A in which the relationship of Numerical Formula 30 was not satisfied.

When comparing Reference Example 2 with Comparative 2B that were the bottom emission type devices, although Reference Example 2 satisfied all the relationships of Numeral Formulae 1, 20, and 30, the luminous efficiency thereof was equivalent to that of Comparative 2B in which the relationship of Numerical Formula was not satisfied.

Further, the top emission type organic EL device in Example 2-1 include the first and second emitting layers that satisfy the relationship of Numerical Formula 1 and have an overlap integral of 99.0% or more.

As shown in FIG. 6, the overlap integral of the first film having the same arrangement as that of the first emitting layer in Example 2-1 (film formed from the compounds BH1-15 and BD-2) and the second film having the same arrangement as that of the second emitting layer in Example 2-1 (film formed from the compounds BH2-12 and BD-2) was 99.3%. The overlap integral of the film having the same arrangement as that of the first emitting layer in Comparative 2A (film formed from the compounds BH1-8 and BD-2) and the film having the same arrangement as that of the second emitting layer in Comparative 2A (film formed from the compounds BH2-12 and BD-2) was 94.9%.

Production 3-1 of Top Emission Type Organic EL Device

Example 3-1 and Comparative 3A

The organic EL devices in Example 3-1 and Comparative 3A were each produced in the same manner as in Example 1-1 except that the compound BH1-5 in the first emitting layer in Example 1-1 was replaced by a compound shown in Table 16 and the compound ET1 in the second electron transporting layer in Example 1-1 was replaced by the compound ET3.

Production 3-1 of Bottom Emission Type Organic EL Device

Reference Example 3 and Comparative 3B

The organic EL devices in Reference Example 3 and Comparative 3B were each produced in the same manner as in Reference Example 1 except that the compound BH1-5 in the first emitting layer in Reference Example 1 was replaced by a compound shown in Table 16 and the compound ET1 in the second electron transporting layer in Reference Example 1 was replaced by the compound ET3.

Evaluation of Organic EL Devices

The organic EL devices produced in Example 3-1, Reference Example 3, and Comparatives 3A and 3B were evaluated as in Example 1-1 and Reference Example 1. Table 16 shows evaluation results.

Evaluation Method of Compounds

Triplet Energy $T_1$

A measurement target compound was dissolved in EPA (diethylether:isopentane:ethanol=5:5:2 in volume ratio) at a concentration of 10 μmol/L, and the obtained solution was put in a quartz cell to provide a measurement sample. A phosphorescent spectrum (ordinate axis: phosphorescent luminous intensity, abscissa axis: wavelength) of the measurement sample was measured at a low temperature (77K). A tangent was drawn to the rise of the phosphorescent spectrum close to the short-wavelength region. An energy amount was calculated by a conversion equation (F1) below based on a wavelength value $\lambda_{edge}$ [nm] at an intersection of the tangent and the abscissa axis and was defined as triplet energy $T_1$. It should be noted that the triplet energy $T_1$ may have an error of about plus or minus 0.02 eV depending on measurement conditions.

$$T_1\ [\text{eV}]=1239.85/\lambda_{edge} \qquad \text{Conversion Equation (F1):}$$

The tangent to the rise of the phosphorescence spectrum close to the short-wavelength region is drawn as follows. While moving on a curve of the phosphorescence spectrum from the short-wavelength region to the local maximum value closest to the short-wavelength region among the local maximum values of the phosphorescence spectrum, a tangent is checked at each point on the curve toward the long-wavelength of the phosphorescence spectrum. An inclination of the tangent is increased along the rise of the curve (i.e., a value of the ordinate axis is increased). A tangent drawn at a point of the local maximum inclination (i.e., a tangent at an inflection point) is defined as the tangent to the rise of the phosphorescence spectrum close to the short-wavelength region.

A local maximum point where a peak intensity is 15% or less of the maximum peak intensity of the spectrum is not counted as the above-mentioned local maximum peak intensity closest to the short-wavelength region. The tangent drawn at a point that is closest to the local maximum peak intensity closest to the short-wavelength region and where the inclination of the curve is the local maximum is defined as a tangent to the rise of the phosphorescence spectrum close to the short-wavelength region.

For phosphorescence measurement, a spectrophotofluorometer body F-4500 produced by Hitachi High-Technologies Corporation was used.

Singlet Energy $S_1$

A toluene solution in which the measurement target compound was dissolved at a concentration of 10 μmol/L was prepared and was put into a quartz cell to provide a measurement sample. Absorption spectrum (ordinate axis: absorption intensity, abscissa axis: wavelength) of the sample was measured at normal temperature (300K). A tangent was drawn to the fall of the absorption spectrum

TABLE 16

| | First emitting layer | | | | Second emitting layer | | | | | | BE | | | |
|---|---|---|---|---|---|---|---|---|---|---|---|---|---|---|
| | First host material | | | First | Second host material | | | Second | | | efficiency | TE | Overlap | |
| | Name | $S_1$ [ev] | $T_1$ [ev] | emitting material | Name | $S_1$ [ev] | $T_1$ [ev | emitting material | Δλ (nm) | ΔFWHM (nm) | EQE (%) | efficiency L/J/CIEy | integral (%) | λp |
| Ex. 3-1 | BH1-1 | 3.12 | 2.10 | BD-2 | BH2-7 | 3.01 | 1.87 | BD-2 | 2 | 2 | — | 176 | 99.0 | 461 |
| Reference Ex. 3 | BH1-1 | 3.12 | 2.10 | BD-2 | BH2-7 | 3.01 | 1.87 | BD-2 | 2 | 2 | 9.7 | — | 99.0 | 461 |
| Comp. 3A | BH1-8 | 3.09 | 2.10 | BD-2 | BH2-7 | 3.01 | 1.87 | BD-2 | 2 | 4 | — | 171 | 94.9 | 461 |
| Comp. 3B | BH1-8 | 3.09 | 2.10 | BD-2 | BH2-7 | 3.01 | 1.87 | BD-2 | 2 | 4 | 9.7 | — | 94.9 | 461 |

When comparing Example 3-1 with Comparative 3A that were the top emission type devices, the luminous efficiency of Example 3-1 in which all the relationships of Numeral Formulae 1, 20, and 30 were satisfied was better than that of Comparative 3A in which the relationship of Numerical Formula 30 was not satisfied.

When comparing Reference Example 3 with Comparative 3B that were the bottom emission type devices, although Reference Example 3 satisfied all the relationships of Numeral Formulae 1, 20, and 30, the luminous efficiency thereof was equivalent to that of Comparative 3B in which the relationship of Numerical Formula 30 was not satisfied.

Further, the top emission type organic EL device in Example 3-1 includes the first and second emitting layers that satisfy the relationship of Numerical Formula 1 and have an overlap integral of 99.0% or more.

As shown in FIG. 6, the overlap integral of the first film having the same arrangement as that of the first emitting layer in Example 3-1 (film formed from the compounds BH1-1 and BD-2) and the second film having the same arrangement as that of the second emitting layer in Example 3-1 (film formed from the compounds BH2-7 and BD-2) was 99.0%. The overlap integral of the film having the same arrangement as that of the first emitting layer in Comparative 3A (film formed from the compounds BH1-8 and BD-2) and the film having the same arrangement as that of the second emitting layer in Comparative 3A (film formed from the compounds BH2-7 and BD-2) was 94.9%.

close to the long-wavelength region, and a wavelength value λedge (nm) at an intersection of the tangent and the abscissa axis was assigned to a conversion equation (F2) below to calculate the singlet energy.

$$S_1\ [\mathrm{eV}]=1239.85/\lambda_{edge} \qquad \text{Conversion Equation (F2):}$$

A spectrophotometer (U3310 produced by Hitachi, Ltd.) was used for measuring absorption spectrum.

The tangent to the fall of the absorption spectrum close to the long-wavelength region is drawn as follows. While moving on a curve of the absorption spectrum from the local maximum value closest to the long-wavelength region, among the local maximum values of the absorption spectrum, in a long-wavelength direction, a tangent at each point on the curve is checked. An inclination of the tangent is decreased and increased in a repeated manner as the curve falls (i.e., a value of the ordinate axis is decreased). A tangent drawn at a point where the inclination of the curve is the local minimum closest to the long-wavelength region (except when absorbance is 0.1 or less) is defined as the tangent to the fall of the absorption spectrum close to the long-wavelength region.

The local maximum absorbance of 0.2 or less is not counted as the above-mentioned local maximum absorbance closest to the long-wavelength region.

Tables show measurement values of the singlet energy $S_1$ and the triplet energy $T_1$ of the compounds used in the respective examples.

The singlet energy $S_1$ of the compound BD-2 was 2.71 eV.

The triplet energy $T_1$ of the compound BD-2 was 2.60 eV.

The singlet energy $S_1$ of the compound BD-1 was 2.73 eV.

The triplet energy $T_1$ of the compound BD-1 was 2.29 eV.

Preparation of Toluene Solution

The compound BD-2 was dissolved in toluene at a concentration of $4.9\times10^{-6}$ mol/L to prepare a toluene solution of the compound BD-2. Similar to the compound BD-2, a toluene solution of the compound BD-1 was prepared.

Measurement for Maximum Peak Wavelength of Emission Spectrum

Using a fluorescence spectrometer (spectrophotofluorometer F-7000 manufactured by Hitachi High-Tech Science Corporation), the toluene solution of the compound BD-2 was excited at 390 nm, where a maximum peak wavelength was measured. From the fluorescence spectrum measured, the full width at half maximum FWHM (unit: nm) of the maximum peak of the compound BD-2 was measured. Similar to the compound BD-2, the full width at half maximum FWHM (unit: nm) of the maximum peak of the compound BD-1 was measured.

The maximum peak wavelength of the compound BD-2 was 455 nm.

The maximum peak wavelength of the compound BD-1 was 453 nm.

The invention claimed is:

1. An organic electroluminescence device, comprising:

an anode;

an emitting layer; and a cathode, wherein the emitting layer comprises a first emitting layer and a second emitting layer, the first emitting layer comprises a first host material and a first emitting material that emits light having a maximum peak wavelength of 500 nm or less with a mass ratio of the first emitting material to the first host material of from 0.5 mass % to 6 mass %, the second emitting layer comprises a second host material and a second emitting material that emits light having a maximum peak wavelength of 500 nm or less with a mass ratio of the second emitting material to the second host material of from 0.5 mass % to 6 mass %, the first host material and the second host material are mutually different, the first emitting material and the second emitting material are mutually the same or different, a triplet energy of the first host material $T_1(H1)$ and a triplet energy of the second host material $T_1(H2)$ satisfy Numerical Formula 1 below:

$$T_1(H1)>T_1(H2) \qquad \text{(Numerical Formula 1), and}$$

a maximum peak wavelength λ1 and a full width at half maximum FWHM1 of a photoluminescence spectrum of a first film, which has a film thickness of 50 nm and is provided by adding the first emitting material to the first host material with a mass ratio of the first emitting material to the first host material identical to the mass ratio of the first emitting material to the first host material in the first emitting layer, and a maximum peak wavelength λ2 and a full width at half maximum FWHM2 of a photoluminescence spectrum of a second film, which has a film thickness of 50 nm and is provided by adding the second emitting material to the second host material with a mass ratio of the second emitting material to the second host material identical to the mass ratio of the second emitting material to the second host material in the second emitting layer, satisfy Numerical Formula 20 and Numerical Formula 30 below:

$$|\lambda1-\lambda2|\leq 3\ \mathrm{nm} \qquad \text{(Numerical Formula 20)}$$

$$|\mathrm{FWHM1}-\mathrm{FWHM2}|\leq 2\ \mathrm{nm} \qquad \text{(Numerical Formula 30).}$$

2. The organic electroluminescence device according to claim 1, further comprising: a hole transporting zone and an electron transporting zone, wherein the anode is a first electrode, the hole transporting zone is disposed between the first electrode and the emitting layer, the cathode is a second electrode that is semi-transmissive, and the electron transporting zone is disposed between the second electrode and the emitting layer.

3. The organic electroluminescence device according to claim 2, further comprising a light reflection layer, wherein the first electrode is a transparent electrode.

4. The organic electroluminescence device according to claim 1, further comprising a color conversion portion on a side of the organic electroluminescence device through which light is extracted.

5. The organic electroluminescence device according to claim 1, wherein an electron mobility of the first host material $\mu_{E1}$, a hole mobility of the first host material $\mu_{H1}$, an electron mobility of the second host material $\mu_{E2}$, and a hole mobility of the second host material $\mu_{H2}$ satisfy Numerical Formula 15 below:

$$(\mu_{E2}/\mu_{H2})>(\mu_{E1}/\mu_{H1}) \qquad \text{(Numerical Formula 15).}$$

6. The organic electroluminescence device according to claim 1, wherein an electron mobility of the first host material $\mu_{E1}$ and an electron mobility of the second host material $\mu_{E2}$ satisfy Numerical Formula 16 below:

$$\mu_{E2}>\mu_{E1} \qquad \text{(Numerical Formula 16).}$$

7. The organic electroluminescence device according to claim 1, wherein the first emitting material is a compound that emits fluorescence.

8. The organic electroluminescence device according to claim 1, wherein the first emitting material is not a complex.

9. The organic electroluminescence device according to claim 1, wherein the second emitting material is a compound that emits fluorescence.

10. The organic electroluminescence device according to claim 1, wherein the second emitting material is not a complex.

11. The organic electroluminescence device according to claim 1, wherein the first emitting layer and the second emitting layer are in direct contact with each other.

12. The organic electroluminescence device according to claim 1, wherein the first host material comprises, in a molecule, a linking structure comprising a benzene ring and a naphthalene ring linked to each other with a single bond, the benzene ring and the naphthalene ring in the linking structure are each independently fused or not fused with a further monocyclic ring or fused ring, and the benzene ring and the naphthalene ring in the linking structure are further linked to each other by cross-linking at at least one site other than the single bond.

13. The organic electroluminescence device according to claim 12, wherein the cross-linking comprises a double bond.

14. The organic electroluminescence device according to claim 1, wherein the first host material comprises, in a molecule, a biphenyl structure comprising a first benzene ring and a second benzene ring linked to each other with a single bond, and the first benzene ring and the second benzene ring in the biphenyl structure are further linked to each other by cross-linking at at least one site other than the single bond.

15. The organic electroluminescence device according to claim 14, wherein the first benzene ring and the second benzene ring in the biphenyl structure are further linked to each other by the cross-linking at one site other than the single bond.

16. The organic electroluminescence device according to claim 14, wherein the cross-linking comprises a double bond.

17. The organic electroluminescence device according to claim 14, wherein the first benzene ring and the second benzene ring in the biphenyl structure are further linked to each other by the cross-linking at two sites other than the single bond, and the cross-linking comprises no double bond.

18. An organic electroluminescence apparatus, comprising:

a first device that is the organic electroluminescence device according to claim 1; and a second device that is an organic electroluminescence device different from the first device.

19. The organic electroluminescence apparatus according to claim 18, further comprising a third device that is an organic electroluminescence device different from the first device and the second device.

20. An electronic device, comprising the organic electroluminescence apparatus according to claim 18.

21. An electronic device, comprising the organic electroluminescence device according to claim 1.

22. An organic electroluminescence device, comprising:

an anode;

an emitting layer; and a cathode, wherein the emitting layer comprises a first emitting layer and a second emitting layer, the first emitting layer comprises a first host material and a first emitting material that emits light having a maximum peak wavelength of 500 nm or less with a mass ratio of the first emitting material to the first host material of from 0.5 mass % to 6 mass %, the second emitting layer comprises a second host material and a second emitting material that emits light having a maximum peak wavelength of 500 nm or less with a mass ratio of the second emitting material to the second host material of from 0.5 mass % to 6 mass %, the first host material and the second host material are mutually different, the first emitting material and the second emitting material are mutually the same or different, a triplet energy of the first host material $T_1(H1)$ and a triplet energy of the second host material $T_1(H2)$ satisfy Numerical Formula 1 below:

$$T_1(H1)>T_1(H2) \quad \text{(Numerical Formula 1), and}$$

for a photoluminescence spectrum in a range from 400 nm to 600 nm of a first film, which has a film thickness of 50 nm and is provided by adding the first emitting material to the first host material with a mass ratio of the first emitting material to the first host material identical to the mass ratio of the first emitting material to the first host material in the first emitting layer, and a photoluminescence spectrum in a range from 400 nm to 600 nm of a second film, which has a film thickness of 50 nm and is provided by adding the second emitting material to the second host material with a mass ratio of the second emitting material to the second host material identical to the mass ratio of the second emitting material to the second host material in the second emitting layer, an overlap integral of normalized photoluminescence spectra obtained by normalizing the photoluminescence spectrum of the first film and the photoluminescence spectrum of the second film is 99.0% or more.

23. The organic electroluminescence device according to claim 22, further comprising: a hole transporting zone and an electron transporting zone, wherein the anode is a first electrode, the hole transporting zone is disposed between the first electrode and the emitting layer, the cathode is a second electrode that is semi-transmissive, and the electron transporting zone is disposed between the second electrode and the emitting layer.

24. The organic electroluminescence device according to claim 23, further comprising a light reflection layer, wherein the first electrode is a transparent electrode.

25. The organic electroluminescence device according to claim 22, further comprising a color conversion portion on a side of the organic electroluminescence device through which light is extracted.

26. The organic electroluminescence device according to claim 22, wherein the first emitting material is a compound that emits fluorescence.

27. The organic electroluminescence device according to claim 22, wherein the second emitting material is a compound that emits fluorescence.

28. An organic electroluminescence apparatus, comprising:

a first device that is the organic electroluminescence device according to claim 22, and a second device that is an organic electroluminescence device different from the first device.

29. The organic electroluminescence apparatus according to claim 28, further comprising a third device that is an organic electroluminescence device different from the first device and the second device.

30. An electronic device, comprising the organic electroluminescence apparatus according to claim 28.

31. An electronic device, comprising the organic electroluminescence device according to claim 22.

* * * * *